US012435098B2

(12) United States Patent
Kim et al.

(10) Patent No.: US 12,435,098 B2
(45) Date of Patent: Oct. 7, 2025

(54) HETEROCYCLIC COMPOUND AND ORGANIC LIGHT-EMITTING DEVICE COMPRISING SAME

(71) Applicant: LG CHEM, LTD., Seoul (KR)

(72) Inventors: Moung Gon Kim, Daejeon (KR); Wanpyo Hong, Daejeon (KR); Sujeong Geum, Daejeon (KR); Kyunghee Kim, Daejeon (KR); Seonwoo Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 887 days.

(21) Appl. No.: 17/617,101

(22) PCT Filed: Nov. 27, 2020

(86) PCT No.: PCT/KR2020/017145
§ 371 (c)(1),
(2) Date: Dec. 7, 2021

(87) PCT Pub. No.: WO2021/107705
PCT Pub. Date: Jun. 3, 2021

(65) Prior Publication Data

US 2022/0251118 A1 Aug. 11, 2022

(30) Foreign Application Priority Data

Nov. 29, 2019 (KR) ........................ 10-2019-0156695
May 29, 2020 (KR) ........................ 10-2020-0065294

(51) Int. Cl.
*H01L 51/50* (2006.01)
*C07F 5/02* (2006.01)
(Continued)

(52) U.S. Cl.
CPC ........... *C07F 5/027* (2013.01); *H10K 85/615* (2023.02); *H10K 85/626* (2023.02);
(Continued)

(58) Field of Classification Search
None
See application file for complete search history.

(56) References Cited

U.S. PATENT DOCUMENTS

2013/0207046 A1 8/2013 Pflumm et al.
2018/0301629 A1 10/2018 Hatakeyama et al.
(Continued)

FOREIGN PATENT DOCUMENTS

CN 107417715 12/2017
CN 107501311 12/2017
(Continued)

*Primary Examiner* — Gregory D Clark
(74) *Attorney, Agent, or Firm* — Bryan Cave Leighton Paisner LLP

(57) ABSTRACT

Provided is a heterocyclic compound of Chemical Formula 1:

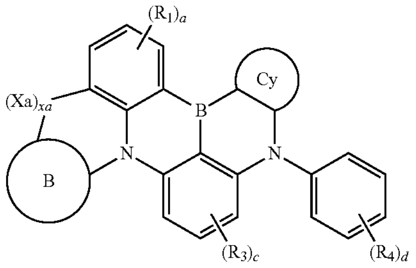

wherein:

$R_1$, $R_3$ and $R_4$ are each independently a hydrogen, deuterium, halogen group, nitrile group, or substituted or unsubstituted: silyl, boron, alkyl, alkenyl, alkynyl, alkoxy, aryloxy, cycloalkyl, aralkyl, aryl, or amine group, or a heteroring, or adjacent groups bond to each other to form a substituted or unsubstituted ring;

(Continued)

Cy is one of a substituted or unsubstituted: aliphatic hydrocarbon ring, aromatic ring, and heteroring, or a substituted or unsubstituted ring having two or more thereof fused therein; and ring B is a substituted or unsubstituted aliphatic hydrocarbon ring;

xa is 0 or 1, when 0 Xa is a direct bond, and when 1 Xa is CRR';

R and R' are each independently hydrogen or a substituted or unsubstituted alkyl group;

a and c are independently 0 to 3; and d is 0 to 5, and an organic light-emitting device comprising same.

10 Claims, 1 Drawing Sheet

(51) Int. Cl.

*H10K 85/60* (2023.01)

*H10K 50/11* (2023.01)

(52) U.S. Cl.

CPC ......... *H10K 85/633* (2023.02); *H10K 85/636* (2023.02); *H10K 85/6572* (2023.02); *H10K 85/6574* (2023.02); *H10K 85/6576* (2023.02); *H10K 85/658* (2023.02); *H10K 50/11* (2023.02)

(56) References Cited

U.S. PATENT DOCUMENTS

| | | | |
|---|---|---|---|
| 2020/0058885 A1 | 2/2020 | Hong et al. | |
| 2020/0066997 A1 | 2/2020 | Huang et al. | |
| 2020/0091431 A1 | 3/2020 | Hatakeyama et al. | |
| 2020/0176679 A1 | 6/2020 | Jeong et al. | |
| 2021/0005826 A1 | 1/2021 | Tasaki et al. | |
| 2021/0036233 A1 | 2/2021 | Joo et al. | |
| 2021/0408390 A1 | 12/2021 | Lee et al. | |
| 2022/0173318 A1 | 6/2022 | Kim et al. | |
| 2022/0352473 A1 * | 11/2022 | Kim .................... | H10K 85/658 |
| 2023/0140927 A1 | 5/2023 | Shim et al. | |

FOREIGN PATENT DOCUMENTS

| | | | |
|---|---|---|---|
| CN | 110407859 | | 11/2019 |
| CN | 111933810 | | 11/2020 |
| CN | 113875033 | | 12/2021 |
| EP | 3901158 | A2 | 10/2021 |
| KR | 10-2017-0130434 | | 11/2017 |
| KR | 10-2018-0122298 | | 11/2018 |
| KR | 10-2018-0127918 | | 11/2018 |
| KR | 10-2019-0132644 | | 11/2019 |
| KR | 10-2019-0156695 | | 11/2019 |
| KR | 10-2020-0004266 | | 1/2020 |
| KR | 10-2020-0065294 | | 5/2020 |
| KR | 20200132752 | A | 11/2020 |
| WO | 2018-095397 | | 5/2018 |
| WO | 2021-020942 | | 2/2021 |

* cited by examiner

【FIG. 1】
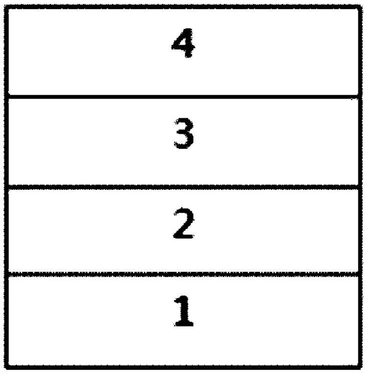
【FIG. 2】
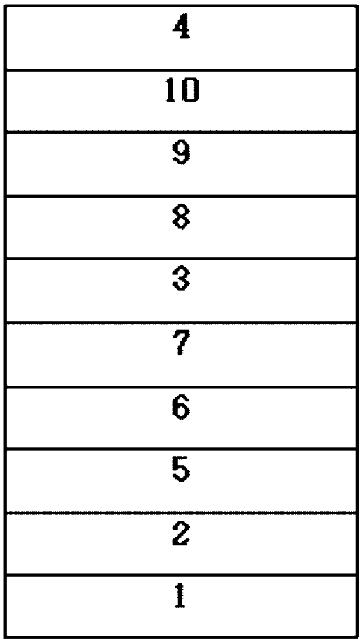

HETEROCYCLIC COMPOUND AND ORGANIC LIGHT-EMITTING DEVICE COMPRISING SAME

CROSS-REFERENCE TO RELATED APPLICATIONS

This application is a National Stage Application of International Application No. PCT/KR2020/017145 filed on Nov. 27, 2020, which claims priority to and the benefits of Korean Patent Application No. 10-2019-0156695, filed with the Korean Intellectual Property Office on Nov. 29, 2019, and Korean Patent Application No. 10-2020-0065294, filed with the Korean Intellectual Property Office on May 29, 2020, the entire contents of which are incorporated herein by reference.

TECHNICAL FIELD

The present specification relates to a heterocyclic compound, and an organic light emitting device including the same.

BACKGROUND

An organic light emitting device in the present specification is a light emitting device using an organic semiconductor material, and requires an exchange of holes and/or electrons between an electrode and the organic semiconductor material. An organic light emitting device can be largely divided into two types as follows depending on the operation principle. The first is a light emitting device type in which excitons are formed in an organic material layer by photons introduced to a device from an external light source, these excitons are separated into electrons and holes, and these electrons and holes are each transferred to different electrodes and used as a current source (voltage source). The second is a light emitting device type in which, by applying a voltage or current to two or more electrodes, holes and/or electrons are injected into an organic semiconductor material layer forming an interface with the electrodes, and the light emitting device is operated by the injected electrons and holes.

An organic light emission phenomenon generally refers to a phenomenon converting electrical energy to light energy using an organic material. An organic light emitting device using an organic light emission phenomenon normally has a structure including an anode, a cathode, and an organic material layer therebetween. Herein, the organic material layer is often formed in a multilayer structure formed with different materials in order to increase efficiency and stability of the organic light emitting device, and for example, can be formed with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.

Development of new materials for such an organic light emitting device has been continuously required.

BRIEF DESCRIPTION

Technical Problem

The present specification is directed to providing a compound, and an organic light emitting device including the same.

Technical Solution

One embodiment of the present disclosure provides a heterocyclic compound of Chemical Formula 1:

<Chemical Formula 1>

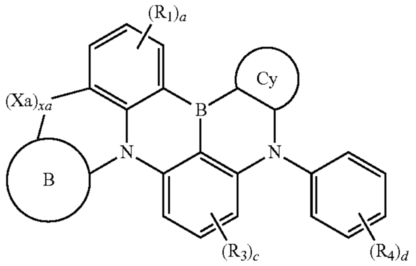

wherein in Chemical Formula 1:

$R_1$, $R_3$ and $R_4$ are the same as or different from each other, and each independently is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aralkyl group, a substituted or unsubstituted aryl group, a substituted or unsubstituted amine group, or a substituted or unsubstituted heteroring, or adjacent groups bond to each other to form a substituted or unsubstituted ring;

Cy is one selected from among a substituted or unsubstituted aliphatic hydrocarbon ring, a substituted or unsubstituted aromatic ring, and a substituted or unsubstituted heteroring, or a substituted or unsubstituted ring having two or more thereof fused therein;

ring B is a substituted or unsubstituted aliphatic hydrocarbon ring;

xa is 0 or 1;

when xa is 0, Xa is a direct bond;

when xa is 1, Xa is CRR';

R and R' are the same as or different from each other, and each independently hydrogen or a substituted or unsubstituted alkyl group;

a is an integer of 0 to 3, and when a is 2 or greater, the $R_1$s are the same as or different from each other;

c is an integer of 0 to 3, and when c is 2 or greater, the $R_3$s are the same as or different from each other; and d is an integer of 0 to 5, and when d is 2 or greater, the $R_4$s are the same as or different from each other.

Advantageous Effects

A compound according to one embodiment of the present specification can be used as a material of an organic material layer of an organic light emitting device, and by using the same, narrow full width at half maximum, enhanced efficiency, low driving voltage and/or enhanced lifetime properties can be obtained in the organic light emitting device.

DESCRIPTION OF THE DRAWINGS

FIG. 1 and FIG. 2 illustrate an organic light emitting device according to one embodiment of the present specification.

REFERENCE NUMERALS

1: Substrate
2: First Electrode
3: Light Emitting Layer
4: Second Electrode
5: Hole Injection Layer
6: Hole Transfer Layer
7: Electron Blocking Layer
8: First Electron Transfer Layer
9: Second Electron Transfer Layer
10: Electron Injection Layer

DETAILED DESCRIPTION

Hereinafter, the present specification will be described in more detail.

One embodiment of the present specification provides a compound of Chemical Formula 1.

A compound having the core structure of the present disclosure is stable by having a low sublimation temperature, and when used in an organic material layer of an organic light emitting device, efficiency and lifetime properties are enhanced in the organic light emitting device.

Examples of substituents in the present specification are described below, however, the substituents are not limited thereto.

The term "substitution" means a hydrogen atom bonding to a carbon atom of a compound being changed to another substituent, and the position of substitution is not limited as long as it is a position at which a hydrogen atom is substituted, that is, a position at which a substituent can substitute, and when two or more substituents substitute, the two or more substituents can be the same as or different from each other.

In the present specification, the term "substituted or unsubstituted" means being substituted with one, two or more substituents selected from the group consisting of deuterium, a nitrile group, a substituted or unsubstituted alkyl group, a substituted or unsubstituted cycloalkyl group, a substituted or unsubstituted silyl group, a substituted or unsubstituted alkoxy group, a substituted or unsubstituted arylamine group, a substituted or unsubstituted aryl group, and a substituted or unsubstituted heterocyclic group, or being substituted with a substituent linking two or more substituents among the substituents illustrated above, or having no substituents. For example, "a substituent linking two or more substituents" can include an aryl group substituted with an aryl group, an aryl group substituted with a heteroaryl group, a heterocyclic group substituted with an aryl group, an aryl group substituted with an alkyl group, and the like.

In the present specification, the alkyl group can be linear or branched, and although not particularly limited thereto, the number of carbon atoms is preferably from 1 to 30. Specifically, the number of carbon atoms is preferably from 1 to 20. More specifically, the number of carbon atoms is preferably from 1 to 10. Specific examples thereof can include a methyl group, an ethyl group, a propyl group, an n-propyl group, an isopropyl group, a butyl group, an n-butyl group, an isobutyl group, a tert-butyl group, a sec-butyl group, a 1-methylbutyl group, a 1-ethylbutyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cyclopentylmethyl group, a cyclohexylmethyl group, an octyl group, an n-octyl group, a tert-octyl group, a 1-methylheptyl group, a 2-ethylhexyl group, a 2-propylpentyl group, an n-nonyl group, a 2,2-dimethylheptyl group, a 1-ethylpropyl group, a 1,1-dimethylpropyl group, an isohexyl group, a 2-methylpentyl group, a 4-methylhexyl group, a 5-methylhexyl group and the like, but are not limited thereto.

In the present specification, the cycloalkyl group is not particularly limited, but preferably has 3 to 30 carbon atoms and more preferably has 3 to 20 carbon atoms. Specific examples thereof can include a cyclopropyl group, a cyclobutyl group, a cyclopentyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, a cyclooctyl group and the like, but are not limited thereto.

In the present specification, the alkoxy group can be linear, branched or cyclic. The number of carbon atoms of the alkoxy group is not particularly limited, but is preferably from 1 to 30. Specifically, the number of carbon atoms is preferably 1 to 20. More specifically, the number of carbon atoms is preferably 1 to 10. Specific examples thereof can include a methoxy group, an ethoxy group, an n-propoxy group, an isopropoxy group, an i-propyloxy group, an n-butoxy group, an isobutoxy group, a tert-butoxy group, a sec-butoxy group, an n-pentyloxy group, a neopentyloxy group, an isopentyloxy group, an n-hexyloxy group, a 3,3-dimethylbutyloxy group, a 2-ethylbutyloxy group, an n-octyloxy group, an n-nonyloxy group, an n-decyloxy group, a benzyloxy group, a p-methylbenzyloxy group and the like, but are not limited thereto.

In the present specification, the amine group can be selected from the group consisting of $-NH_2$, an alkylamine group, an N-alkylarylamine group, an arylamine group, an N-arylheteroarylamine group, an N-alkylheteroarylamine group and a heteroarylamine group, and although not particularly limited thereto, the number of carbon atoms is preferably from 1 to 30. Specific examples of the amine group can include a methylamine group, a dimethylamine group, an ethylamine group, a diethylamine group, a phenylamine group, a naphthylamine group, a biphenylamine group, an anthracenylamine group, a 9-methylanthracenylamine group, a diphenylamine group, an N-phenylnaphthylamine group, a ditolylamine group, an N-phenyltolylamine group, a triphenylamine group, an N-phenylbiphenylamine group, an N-phenylnaphthylamine group, an N-biphenylnaphthylamine group, an N-naphthylfluorenylamine group, an N-phenylphenanthrenylamine group, an N-biphenylphenanthrenylamine group, an N-phenylfluorenylamine group, an N-phenylterphenylamine group, an N-phenanthrenylfluorenylamine group, an N-biphenylfluorenylamine group and the like, but are not limited thereto.

In the present specification, the silyl group can be a chemical formula of —SiRaRbRc, and Ra, Rb and Rc are the same as or different from each other and can be each independently hydrogen, a substituted or unsubstituted alkyl group, or a substituted or unsubstituted aryl group. Specific examples of the silyl group can include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the aryl group is not particularly limited, but preferably has 6 to 30 carbon atoms, and more preferably has 6 to 20 carbon atoms. The aryl group can be monocyclic or polycyclic. When the aryl group is a monocyclic aryl group, the number of carbon atoms is not particularly limited, but is preferably from 6 to 30. More specifically, the number of carbon atoms is preferably from 6 to 20. Specific examples of the monocyclic aryl group can include a phenyl group, a biphenyl group, a terphenyl group and the like, but are not limited thereto. When the aryl group is a polycyclic aryl group, the number of carbon atoms is not particularly limited, but is preferably from 10 to 30, and more specifically, the number of carbon atoms is preferably from 10 to 20. Specific examples of the polycyclic aryl group can include a naphthyl group, an anthracenyl group, a phenanthryl group, a triphenyl group, a pyrenyl group, a phenalenyl group, a perylenyl group, a chrysenyl group, a fluorenyl group and the like, but are not limited thereto.

In the present specification, an "adjacent" group can mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring can be interpreted as groups "adjacent" to each other.

In the present specification, examples of the arylamine group include a substituted or unsubstituted monoarylamine group, a substituted or unsubstituted diarylamine group, or a substituted or unsubstituted triarylamine group. The aryl group in the arylamine group can be a monocyclic aryl group or a polycyclic aryl group. The arylamine group including two or more aryl groups can include monocyclic aryl groups, polycyclic aryl groups, or both monocyclic aryl groups and polycyclic aryl groups. For example, the aryl group in the arylamine group can be selected from among the examples of the aryl group described above.

In the present specification, the heteroaryl group is a group including one or more atoms that are not carbon, that is, heteroatoms, and specifically, the heteroatom can include one or more atoms selected from the group consisting of O, N, Se, S and the like. The number of carbon atoms is not particularly limited, but is preferably from 2 to 30 and more preferably from 2 to 20, and the heteroaryl group can be monocyclic or polycyclic. Examples of the heteroaryl group can include a thiophene group, a furanyl group, a pyrrole group, an imidazolyl group, a thiazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group, an isoxazolyl group, a thiadiazolyl group, a phenothiazinyl group, a dibenzofuranyl group and the like, but are not limited thereto.

In the present specification, the heterocyclic group is a group including one or more atoms that are not carbon, that is, heteroatoms, and specifically, the heteroatom can include one or more atoms selected from the group consisting of O, N, Se, S and the like, and the heterocyclic group includes an aromatic heterocyclic group or an aliphatic heterocyclic group. The aromatic heterocyclic group can be expressed as the heteroaryl group. The aliphatic heterocyclic group refers to, for example, including a heteroatom in the aliphatic hydrocarbon ring such as tetrahydrofuran or pyrrolidine, or including a heteroatom in a ring having a form in which aromatic and aliphatic rings are fused such as isoindoline. The heteroaryl group is included in the scope of the heteroring. The number of carbon atoms of the heterocyclic group is not particularly limited, but is preferably from 2 to 30, and is more preferably from 2 to 20. The heteroaryl group can be monocyclic or polycyclic.

In the present specification, the ring refers to an aliphatic hydrocarbon ring, an aromatic hydrocarbon ring or a heteroring.

In the present specification, the hydrocarbon ring collectively refers to a ring formed with carbon and hydrogen. Types of the hydrocarbon ring can include an aliphatic hydrocarbon ring, an aromatic hydrocarbon ring, or a hydrocarbon ring having a form in which aliphatic and aromatic are fused to each other, but are not limited thereto.

In the present specification, the aromatic hydrocarbon ring has the same definition as the aryl group except for being not monovalent.

In the present specification, the aliphatic hydrocarbon ring includes all of a hydrocarbon ring including a single bond, a hydrocarbon ring including a multiple bond, or a ring having a form in which rings including a single bond and a multiple bond are fused. Accordingly, the ring formed with a single bond of the aliphatic hydrocarbon ring includes the cycloalkyl group. A hydrocarbon ring that includes a single bond and a double bond but is not an aromatic ring such as cyclohexene is also included in the aliphatic hydrocarbon ring.

In the present specification, the heteroring is a ring including one or more atoms that are not carbon, that is, heteroatoms, and specifically, the heteroatom can include one or more atoms selected from the group consisting of O, N, Se, S and the like. The heteroring can be monocyclic or polycyclic, can be aromatic, aliphatic or a fused ring of aromatic and aliphatic, and the aromatic heteroring can be selected from among the examples of the heteroaryl group of the heterocyclic group except for those that are not a monovalent group.

In the present specification, the aliphatic heteroring means an aliphatic ring including one or more of heteroatoms. Examples of the aliphatic heteroring can include oxirane, tetrahydrofuran, 1,4-dioxane, pyrrolidine, piperidine, morpholine, oxepane, azokane, thiokane, tetrahydronaphthothiophene, tetrahydronaphthofuran, tetrahydrobenzothiophene, tetrahydrobenzofuran and the like, but are not limited thereto.

In the present specification, the aliphatic hydrocarbon ring group has the same definition as the aliphatic hydrocarbon ring except for those that are monovalent.

In one embodiment of the present specification, Chemical Formula 1 is a heterocyclic compound of the following Chemical Formula 2:

<Chemical Formula 2>

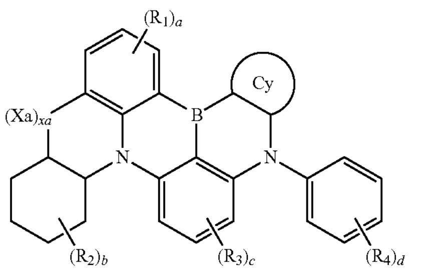

wherein in Chemical Formula 2:

$R_1$, $R_3$, $R_4$, Cy, Xa, xa, a, c and d have the same definitions as in Chemical Formula 1;

$R_2$ is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aralkyl group, a substituted or unsubstituted aryl group, a substituted or unsubstituted amine group, or a substituted or unsubstituted heteroring; and b is an integer of 0 to 8, and when b is 2 or greater, $R_2$s are the same as or different from each other.

In one embodiment of the present specification, Chemical Formula 1 is a heterocyclic compound of one of the following Chemical Formula 1-1 or 1-2:

<Chemical Formula 1-1>

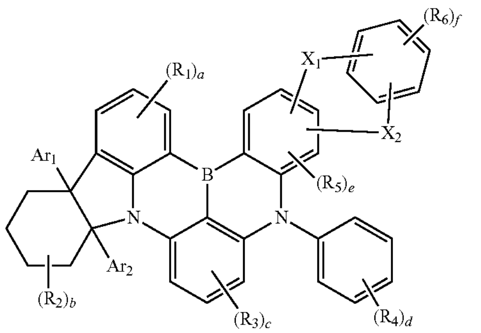

<Chemical Formula 1-2>

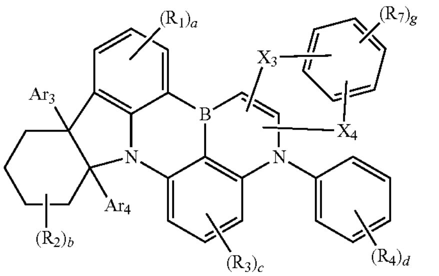

wherein in Chemical Formula 1-1 and Chemical Formula 1-2:

$R_1$, $R_3$, $R_4$, a, c and d have the same definitions as in Chemical Formula 1;

$Ar_1$ to $Ar_4$ are the same as or different from each other, and each independently is hydrogen, deuterium, a halogen group, a substituted or unsubstituted alkyl group, a substituted or unsubstituted cycloalkyl group, a substituted or unsubstituted aryl group, or a substituted or unsubstituted heteroring;

when $X_1$ is a direct bond, $X_2$ is O, S or CRR';

when $X_2$ is a direct bond, $X_1$ is O, S or CRR';

when $X_3$ is a direct bond, $X_4$ is O, S or CRR';

when $X_4$ is a direct bond, $X_3$ is O, S or CRR';

R, R', $R_2$, $R_5$ to $R_7$ are the same as or different from each other, and each independently is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aralkyl group, a substituted or unsubstituted aryl group, a substituted or unsubstituted amine group, or a substituted or unsubstituted heteroring, or adjacent groups bond to each other to form a substituted or unsubstituted aliphatic hydrocarbon ring, a substituted or unsubstituted aromatic ring, a substituted or unsubstituted heteroring, or a substituted or unsubstituted ring having these fused therein;

b is an integer of 0 to 8, and when b is 2 or greater, the $R_2$s are the same as or different from each other;

e is an integer of 0 to 2, and when e is 2, the $R_5$s are the same as or different from each other; and f and g are an integer of 0 to 4, and when f is 2 or greater, the $R_6$s are the same as or different from each other, and when g is 2 or greater, the $R_7$s are the same as or different from each other.

In one embodiment of the present specification, Chemical Formula 1 is a heterocyclic compound of the following Chemical Formula 1-3:

<Chemical Formula 1-3>

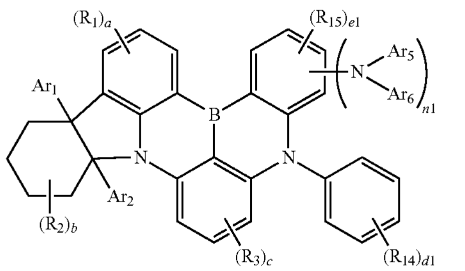

wherein in Chemical Formula 1-3:

$R_1$, $R_3$, a and c have the same definitions as in Chemical Formula 1;

$Ar_1$ and $Ar_2$ are the same as or different from each other, and each independently hydrogen, deuterium, a halogen group, a substituted or unsubstituted alkyl group, a substituted or unsubstituted cycloalkyl group, a substituted or unsubstituted aryl group, or a substituted or unsubstituted heteroring;

$Ar_5$ and $Ar_6$ are the same as or different from each other, and each independently a substituted or unsubstituted aliphatic hydrocarbon ring, a substituted or unsubstituted aryl group, or a substituted or unsubstituted heteroring, or bond to each other to form a substituted or unsubstituted aliphatic hydrocarbon ring, a substituted or unsubstituted aromatic ring, a substituted or unsubstituted heteroring, or a substituted or unsubstituted ring having these fused therein;

$R_2$ and $R_{15}$ are the same as or different from each other, and each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aralkyl group, a substituted or unsubstituted aryl group, a substituted or unsubstituted amine group, or a substituted or unsubstituted heteroring;

d1 is an integer of 2 to 5, and two or more $R_{14}$s bond to adjacent substituents to form a substituted or unsubstituted heteroring or a substituted or unsubstituted fluorene ring, and $R_{14}$ that does not form the ring is hydrogen;

n1 is 0 or 1;

b is an integer of 0 to 8, and when b is 2 or greater, the $R_2$s are the same as or different from each other; and e1 is an integer of 0 to 3, and when e1 is 2 or greater, the $R_{15}$s are the same as or different from each other.

In one embodiment of the present specification, Chemical Formula 1 is any one of the following Chemical Formulae 2-1 to 2-8:

<Chemical Formula 2-1>

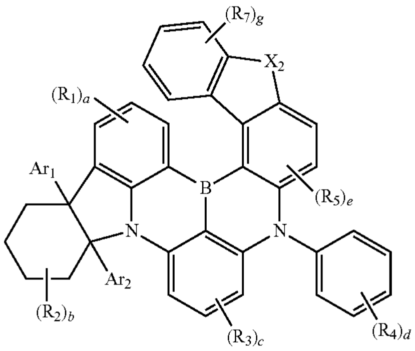

<Chemical Formula 2-2>

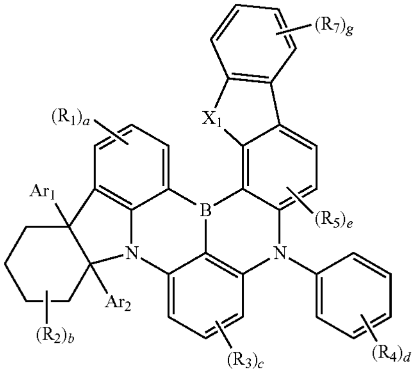

-continued

<Chemical Formula 2-3>

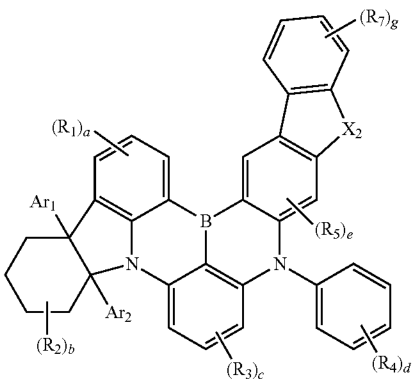

<Chemical Formula 2-4>

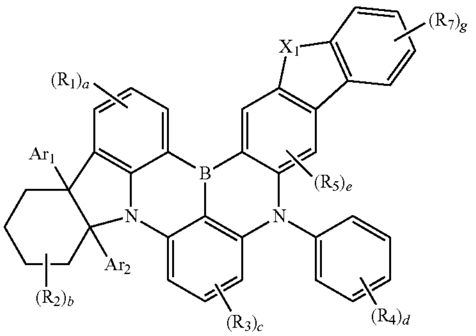

<Chemical Formula 2-5>

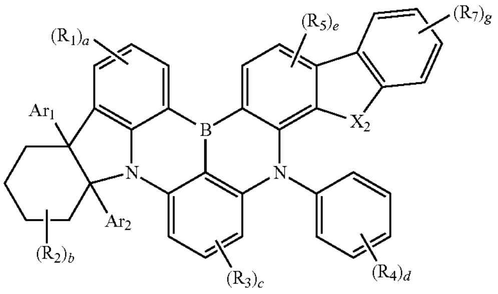

<Chemical Formula 2-6>

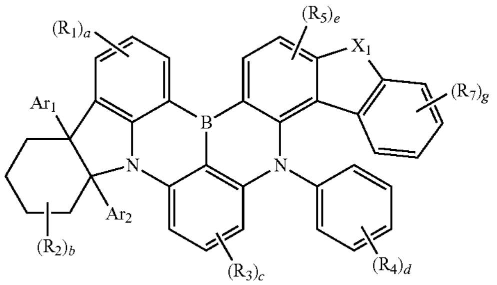

-continued

<Chemical Formula 2-7>

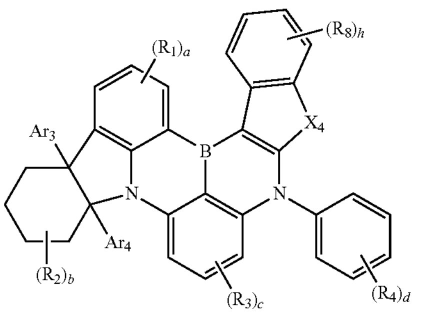

<Chemical Formula 2-8>

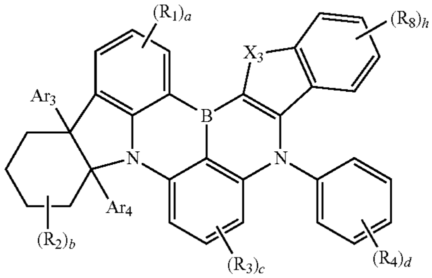

wherein in Chemical Formula 2-1 to Chemical Formula 2-8:

$R_1$, $R_3$, $R_4$, a, c and d have the same definitions as in Chemical Formula 1;

$Ar_1$ to $Ar_4$ are the same as or different from each other, and each independently is hydrogen, deuterium, a halogen group, a substituted or unsubstituted alkyl group, a substituted or unsubstituted cycloalkyl group, a substituted or unsubstituted aryl group, or a substituted or unsubstituted heteroring;

$X_1$ to $X_4$ are the same as or different from each other, and each independently O, S or CRR';

R, R', $R_2$, $R_5$, $R_7$ and $R_8$ are the same as or different from each other, and each independently is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aralkyl group, a substituted or unsubstituted aryl group, a substituted or unsubstituted amine group, or a substituted or unsubstituted heteroring, or adjacent groups bond to each other to form a substituted or unsubstituted ring;

b is an integer of 0 to 8, and when b is 2 or greater, the $R_2$s are the same as or different from each other;

e is an integer of 0 to 2, and when e is 2, the $R_5$s are the same as or different from each other;

g is an integer of 0 to 4, and when g is 2 or greater, the $R_7$s are the same as or different from each other, and h is an integer of 0 to 4, and when h is 2 or greater, the $R_8$s are the same as or different from each other.

In one embodiment of the present specification, $Ar_1$ to $Ar_4$ are the same as or different from each other, and each independently is hydrogen, deuterium, a halogen group, a substituted or unsubstituted alkyl group, a substituted or unsubstituted cycloalkyl group, a substituted or unsubstituted aryl group, or a substituted or unsubstituted heteroring.

In one embodiment of the present specification, $Ar_1$ to $Ar_4$ are the same as or different from each other, and each independently is hydrogen, deuterium, a halogen group, a substituted or unsubstituted alkyl group having 1 to 10 carbon atoms, a substituted or unsubstituted cycloalkyl group having 3 to 20 carbon atoms, a substituted or unsubstituted aryl group having 6 to 20 carbon atoms, or a substituted or unsubstituted heterocyclic group having 3 to 20 carbon atoms.

In one embodiment of the present specification, $Ar_1$ to $Ar_4$ are the same as or different from each other, and each independently is a substituted or unsubstituted alkyl group.

In one embodiment of the present specification, $Ar_1$ to $Ar_4$ are the same as or different from each other, and each independently is an alkyl group.

In one embodiment of the present specification, $Ar_1$ to $Ar_4$ are the same as or different from each other, and each independently is a substituted or unsubstituted alkyl group having 1 to 10 carbon atoms.

In one embodiment of the present specification, $Ar_1$ to $Ar_4$ are the same as or different from each other, and each independently is a methyl group, an ethyl group, a propyl group, an isopropyl group, a butyl group, a tert-butyl group, a pentyl group, a hexyl group, a heptyl group, an octyl group, a nonyl group or a decyl group.

In one embodiment of the present specification, $Ar_1$ to $Ar_4$ are the same as or different from each other, and each independently is a methyl group, an ethyl group, a propyl group, an isopropyl group, a butyl group or a tert-butyl group.

In one embodiment of the present specification, $Ar_1$ to $Ar_4$ are the same as or different from each other, and each independently is a methyl group, an ethyl group or a tert-butyl group.

In one embodiment of the present specification, $Ar_1$ to $Ar_4$ are a methyl group.

In one embodiment of the present specification, $Ar_5$ and $Ar_6$ are the same as or different from each other, and each independently is an aryl group that is unsubstituted or substituted with an alkyl group; or an aliphatic hydrocarbon ring group that is unsubstituted or substituted with an alkyl group.

In one embodiment of the present specification, $Ar_5$ and $Ar_6$ are the same as or different from each other, and each independently is an aryl group that is unsubstituted or substituted with an alkyl group having 1 to 10 carbon atoms; or an aliphatic hydrocarbon ring group that is unsubstituted or substituted with an alkyl group having 1 to 10 carbon atoms.

In one embodiment of the present specification, $Ar_5$ and $Ar_6$ are the same as or different from each other, and each independently is an aryl group having 6 to 30 carbon atoms that is unsubstituted or substituted with an alkyl group having 1 to 10 carbon atoms; or an aliphatic hydrocarbon ring group having 6 to 30 carbon atoms that is unsubstituted or substituted with an alkyl group having 1 to 10 carbon atoms.

In one embodiment of the present specification, $Ar_5$ and $Ar_6$ are the same as or different from each other, and each independently is an aryl group having 6 to 30 carbon atoms that is unsubstituted or substituted with an alkyl group having 1 to 5 carbon atoms; or an aliphatic hydrocarbon ring group having 6 to 30 carbon atoms that is unsubstituted or substituted with an alkyl group having 1 to 5 carbon atoms.

In one embodiment of the present specification, $Ar_5$ and $Ar_6$ are the same as or different from each other, and each independently is a phenyl group that is unsubstituted or substituted with an alkyl group having 1 to 5 carbon atoms; a biphenyl group that is unsubstituted or substituted with an alkyl group having 1 to 5 carbon atoms; a naphthyl group that is unsubstituted or substituted with an alkyl group having 1 to 5 carbon atoms; a cyclohexyl group that is unsubstituted or substituted with an alkyl group having 1 to 5 carbon atoms; or a tetrahydronaphthalene group that is unsubstituted or substituted with an alkyl group having 1 to 5 carbon atoms.

In one embodiment of the present specification, $Ar_5$ and $Ar_6$ are the same as or different from each other, and each independently is a phenyl group substituted with a tert-butyl group; or a tetrahydronaphthalene group substituted with a methyl group.

In one embodiment of the present specification, $Ar_5$ and $Ar_6$ bond to each other to form a substituted or unsubstituted aliphatic hydrocarbon ring, a substituted or unsubstituted aromatic ring, a substituted or unsubstituted heteroring, or a substituted or unsubstituted ring having these fused therein.

In one embodiment of the present specification, $Ar_5$ and $Ar_6$ bond to each other to form an aliphatic hydrocarbon ring, an aromatic ring, a heteroring, or a ring having these fused therein, and the aliphatic hydrocarbon ring, the aromatic ring, the heteroring, or the ring having these fused therein is unsubstituted or substituted with an alkyl group or an aryl group.

In one embodiment of the present specification, $Ar_5$ and $Ar_6$ bond to each other to form an aliphatic hydrocarbon ring, an aromatic ring, a heteroring, or a ring having these fused therein, and the aliphatic hydrocarbon ring, the aromatic ring, the heteroring, or the ring having these fused therein is unsubstituted or substituted with an alkyl group having 1 to 10 carbon atoms or an aryl group having 6 to 30 carbon atoms.

In one embodiment of the present specification, $Ar_5$ and $Ar_6$ bond to each other to form an aliphatic hydrocarbon ring, an aromatic ring, a heteroring, or a ring having these fused therein, and the aliphatic hydrocarbon ring, the aromatic ring, the heteroring, or the ring having these fused therein is unsubstituted or substituted with a methyl group or a phenyl group.

In one embodiment of the present specification, $X_1$ is O.

In one embodiment of the present specification, $X_1$ is S.

In one embodiment of the present specification, $X_1$ is CRR'.

In one embodiment of the present specification, $X_2$ is O.

In one embodiment of the present specification, $X_2$ is S.

In one embodiment of the present specification, $X_2$ is CRR'.

In one embodiment of the present specification, $X_3$ is O.

In one embodiment of the present specification, $X_3$ is S.

In one embodiment of the present specification, $X_3$ is CRR'.

In one embodiment of the present specification, $X_4$ is O.

In one embodiment of the present specification, $X_4$ is S.

In one embodiment of the present specification, $X_4$ is CRR'.

In one embodiment of the present specification, when $X_1$ is O, $X_2$ is a direct bond.

In one embodiment of the present specification, when $X_1$ is S, $X_2$ is a direct bond.

In one embodiment of the present specification, when $X_1$ is CRR', $X_2$ is a direct bond.

In one embodiment of the present specification, when $X_2$ is O, $X_1$ is a direct bond.

In one embodiment of the present specification, when $X_2$ is S, $X_1$ is a direct bond.

In one embodiment of the present specification, when $X_2$ is CRR', $X_1$ is a direct bond.

In one embodiment of the present specification, when $X_3$ is O, $X_4$ is a direct bond.

In one embodiment of the present specification, when $X_3$ is S, $X_4$ is a direct bond.

In one embodiment of the present specification, when $X_3$ is CRR', $X_4$ is a direct bond.

In one embodiment of the present specification, when $X_4$ is O, $X_3$ is a direct bond.

In one embodiment of the present specification, when $X_4$ is S, $X_3$ is a direct bond.

In one embodiment of the present specification, when $X_4$ is CRR', $X_3$ is a direct bond.

In one embodiment of the present specification, R and R' are the same as or different from each other, and each independently is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aralkyl group, a substituted or unsubstituted amine group, a substituted or unsubstituted aryl group, or a substituted or unsubstituted heterocyclic group.

In one embodiment of the present specification, R and R' are the same as or different from each other, and each independently is hydrogen, deuterium, a substituted or unsubstituted alkyl group, a substituted or unsubstituted aryl group, or a substituted or unsubstituted heterocyclic group.

In one embodiment of the present specification, R and R' are the same as or different from each other, and each independently is hydrogen, deuterium, a substituted or unsubstituted alkyl group having 1 to 10 carbon atoms, a substituted or unsubstituted aryl group having 6 to 20 carbon atoms, or a substituted or unsubstituted heterocyclic group having 6 to 20 carbon atoms.

In one embodiment of the present specification, R and R' are the same as or different from each other, and each independently is hydrogen, deuterium, or a substituted or unsubstituted alkyl group having 1 to 10 carbon atoms.

In one embodiment of the present specification, R and R' are the same as or different from each other, and each independently is an alkyl group having 1 to 10 carbon atoms.

In one embodiment of the present specification, R and R' are the same as or different from each other, and each independently is a methyl group, an ethyl group, a propyl group, an isopropyl group, a butyl group or a tert-butyl group.

In one embodiment of the present specification, R and R' are the same as or different from each other, and each independently is a methyl group or an ethyl group.

In one embodiment of the present specification, $R_1$ is hydrogen, deuterium, a halogen group, a nitrile group, a substituted or unsubstituted alkyl group, a substituted or unsubstituted cycloalkyl group, a substituted or unsubstituted aryl group, a substituted or unsubstituted amine group, or a substituted or unsubstituted heterocyclic group.

In one embodiment of the present specification, $R_1$ is hydrogen, a substituted or unsubstituted alkyl group, or a substituted or unsubstituted aryl group.

In one embodiment of the present specification, $R_1$ is hydrogen, a substituted or unsubstituted alkyl group having 1 to 10 carbon atoms, or a substituted or unsubstituted aryl group having 6 to 30 carbon atoms.

In one embodiment of the present specification, $R_1$ is hydrogen, an alkyl group having 1 to 10 carbon atoms, or an aryl group having 6 to 30 carbon atoms that is unsubstituted or substituted with an alkyl group having 1 to 10 carbon atoms.

In one embodiment of the present specification, $R_1$ is hydrogen, a methyl group, an ethyl group, a propyl group, an isopropyl group, a butyl group, a tert-butyl group, a phenyl group that is unsubstituted or substituted with an alkyl group having 1 to 10 carbon atoms, a biphenyl group that is unsubstituted or substituted with an alkyl group having 1 to 10 carbon atoms, or a naphthyl group that is unsubstituted or substituted with an alkyl group having 1 to 10 carbon atoms.

In one embodiment of the present specification, $R_1$ is hydrogen, a methyl group, or a phenyl group that is unsubstituted or substituted with a methyl group or a tert-butyl group.

In one embodiment of the present specification, $R_3$ is hydrogen, deuterium, a halogen group, a nitrile group, a substituted or unsubstituted alkyl group, a substituted or unsubstituted alkoxy group, a substituted or unsubstituted aryloxy group, a substituted or unsubstituted cycloalkyl group, a substituted or unsubstituted amine group, a substituted or unsubstituted aryl group, or a substituted or unsubstituted heterocyclic group.

In one embodiment of the present specification, $R_3$ is hydrogen, deuterium, a halogen group, a nitrile group, a substituted or unsubstituted alkyl group, a substituted or unsubstituted amine group, a substituted or unsubstituted aryl group, or a substituted or unsubstituted heterocyclic group.

In one embodiment of the present specification, $R_3$ is hydrogen; a substituted or unsubstituted alkyl group having 1 to 10 carbon atoms; an amine group that is unsubstituted or substituted with an aryl group or a heteroaryl group; a substituted or unsubstituted aryl group having 6 to 30 carbon atoms; or a substituted or unsubstituted heterocyclic group having 3 to 30 carbon atoms.

In one embodiment of the present specification, $R_3$ is an alkyl group.

In one embodiment of the present specification, $R_3$ is an alkyl group having 1 to 10 carbon atoms.

In one embodiment of the present specification, $R_3$ is a methyl group, an ethyl group, a propyl group, an isopropyl group, a butyl group or a tert-butyl group.

In one embodiment of the present specification, $R_3$ is a methyl group, an ethyl group or a tert-butyl group.

In one embodiment of the present specification, $R_3$ is a methyl group.

In one embodiment of the present specification, $R_3$ is an amine group substituted with an aryl group or a heteroaryl group.

In one embodiment of the present specification, $R_3$ is an amine group, and the amine group is substituted with an aryl group having 6 to 30 carbon atoms or a heteroaryl group having 3 to 30 carbon atoms.

In one embodiment of the present specification, $R_3$ is an amine group, and the amine group is substituted with a phenyl group, a phenyl group substituted with tert-butyl, a biphenyl group, a dibenzofuran group or a dibenzothiophene group.

In one embodiment of the present specification, $R_3$ is a heterocyclic group that is unsubstituted or substituted with any one or more selected from among deuterium, an alkyl group and an aryl group.

In one embodiment of the present specification, $R_3$ is an N-containing heterocyclic group that is unsubstituted or substituted with any one or more selected from among deuterium, an alkyl group and an aryl group.

In one embodiment of the present specification, $R_3$ is hexahydrocarbazole unsubstituted or substituted with any one or more selected from among deuterium, an alkyl group and an aryl group.

In one embodiment of the present specification, $R_3$ is hexahydrocarbazole unsubstituted or substituted with any one or more selected from among deuterium, a phenyl group, a methyl group and a tert-butyl group.

In one embodiment of the present specification, $R_3$ is a methyl group; an amine group substituted with a phenyl group, a phenyl group substituted with tert-butyl, a biphenyl group, a dibenzofuran group or a dibenzothiophene group; or hexahydrocarbazole unsubstituted or substituted with any one or more selected from among deuterium, a phenyl group, a methyl group and a tert-butyl group.

In one embodiment of the present specification, $R_4$ is hydrogen, a substituted or unsubstituted alkyl group having 1 to 10 carbon atoms, a substituted or unsubstituted aryl group having 6 to 30 carbon atoms, or a substituted or unsubstituted heteroring having 3 to 30 carbon atoms, or bonds to adjacent substituents to form a hydrocarbon ring substituted with an alkyl group.

In one embodiment of the present specification, $R_4$ is hydrogen, an alkyl group having 1 to 10 carbon atoms, an aryl group having 6 to 30 carbon atoms, or a heteroring having 3 to 30 carbon atoms.

In one embodiment of the present specification, $R_4$ is hydrogen, a methyl group, an ethyl group, a propyl group, an isopropyl group, a tert-butyl group, a phenyl group, a biphenyl group, a naphthyl group, a phenanthrene group, an anthracene group, a dibenzofuran group, a dibenzothiophene group, or a carbazole group.

In one embodiment of the present specification, $R_4$ is hydrogen, a methyl group, a tert-butyl group, or a phenyl group.

In one embodiment of the present specification, $R_4$ bonds to adjacent substituents to form an aliphatic hydrocarbon ring substituted with an alkyl group.

In one embodiment of the present specification, $R_4$ bonds to adjacent substituents to form an aliphatic hydrocarbon ring substituted with a methyl group.

In one embodiment of the present specification, $R_4$ bonds to adjacent substituents to form a cycloalkyl ring substituted with a methyl group.

In one embodiment of the present specification, $R_5$ to $R_8$ are the same as or different from each other, and each independently is hydrogen or an alkyl group, or bond to adjacent substituents to form a substituted or unsubstituted hydrocarbon ring.

In one embodiment of the present specification, $R_5$ to $R_8$ are the same as or different from each other, and each independently is hydrogen or an alkyl group having 1 to 10 carbon atoms, or bond to adjacent substituents to form a hydrocarbon ring unsubstituted or substituted with an alkyl group.

In one embodiment of the present specification, $R_5$ to $R_8$ are the same as or different from each other, and each independently is hydrogen or an alkyl group having 1 to 10 carbon atoms, or bond to adjacent substituents to form a hydrocarbon ring unsubstituted or substituted with an alkyl group.

In one embodiment of the present specification, $R_5$ to $R_8$ are the same as or different from each other, and each independently is hydrogen or an alkyl group having 1 to 10 carbon atoms, or bond to adjacent substituents to form an aliphatic hydrocarbon ring unsubstituted or substituted with an alkyl group.

In one embodiment of the present specification, $R_5$ to $R_8$ are the same as or different from each other, and each independently is hydrogen, a methyl group, an ethyl group, a propyl group or a tert-butyl group, or bond to adjacent substituents to form a cycloalkyl ring unsubstituted or substituted with an alkyl group.

In one embodiment of the present specification, $R_5$ to $R_8$ are the same as or different from each other, and each independently is hydrogen or a tert-butyl group, or bond to adjacent substituents to form a cyclohexyl ring unsubstituted or substituted with a methyl group.

In one embodiment of the present specification, $R_2$ is hydrogen.

In one embodiment of the present specification, $R_5$ is hydrogen.

In one embodiment of the present specification, $R_6$ is hydrogen.

In one embodiment of the present specification, $R_7$ is hydrogen.

In one embodiment of the present specification, $R_8$ is hydrogen.

In one embodiment of the present specification, $R_{14}$ bonds to adjacent substituents to form a substituted or unsubstituted heteroring or a substituted or unsubstituted fluorene ring, and $R_{14}$ that does not form the ring is hydrogen.

In one embodiment of the present specification, $R_{14}$ bonds to adjacent substituents to form a dibenzofuran ring, a dibenzothiophene ring, a carbazole ring, or a fluorene ring substituted with an alkyl group, and $R_{14}$ that does not form the ring is hydrogen.

In one embodiment of the present specification, $R_{14}$ bonds to adjacent substituents to form a dibenzofuran ring, a dibenzothiophene ring, or a fluorene ring substituted with a methyl group, and $R_{14}$ that does not form the ring is hydrogen.

In one embodiment of the present specification, $R_{15}$ is hydrogen or an alkyl group.

In one embodiment of the present specification, $R_{15}$ is hydrogen or an alkyl group having 1 to 10 carbon atoms.

In one embodiment of the present specification, $R_{15}$ is hydrogen or a tert-butyl group.

In one embodiment of the present specification, Chemical Formula 1 is any one selected from among the following compounds.

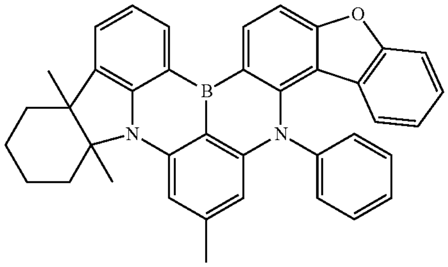

-continued

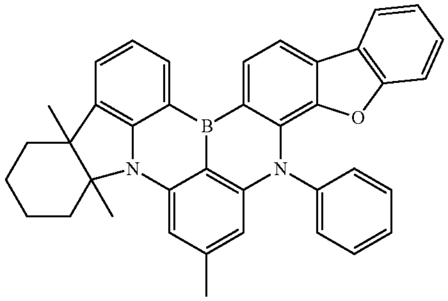

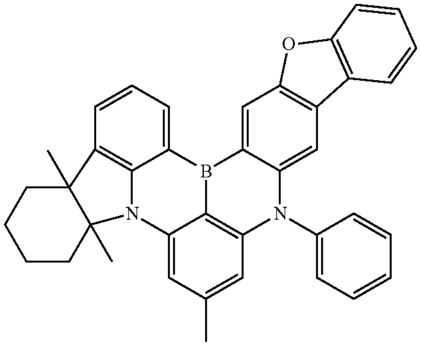

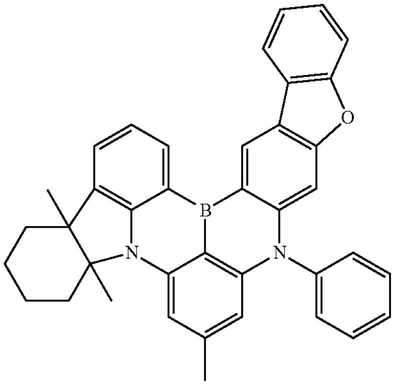

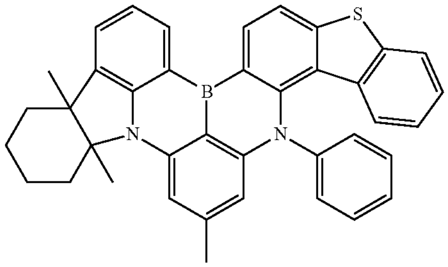

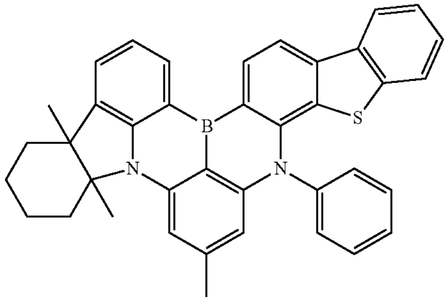

-continued
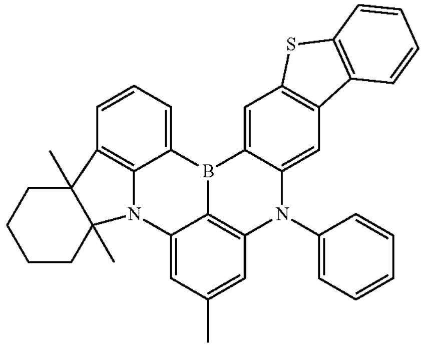
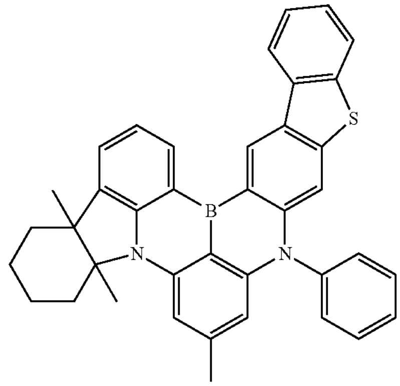
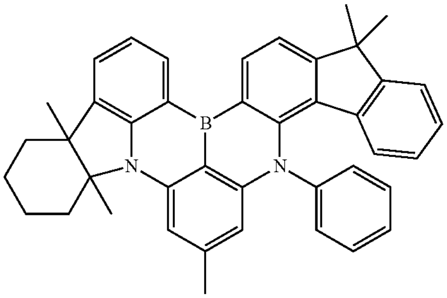
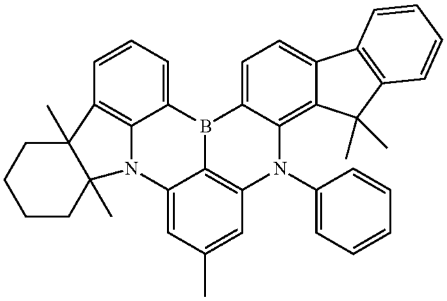
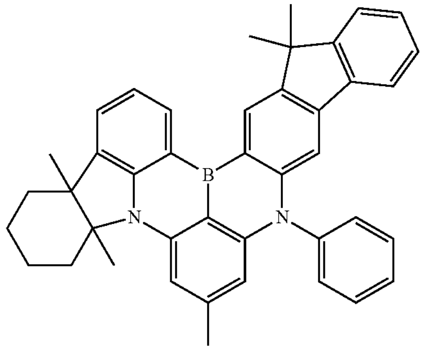
-continued
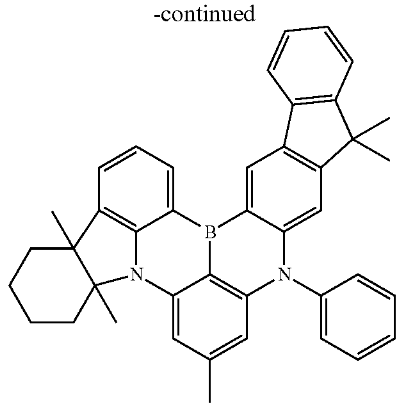
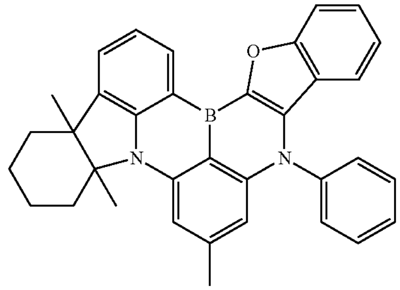
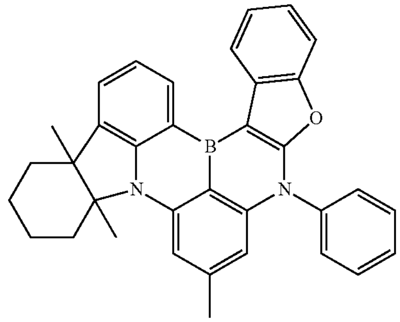
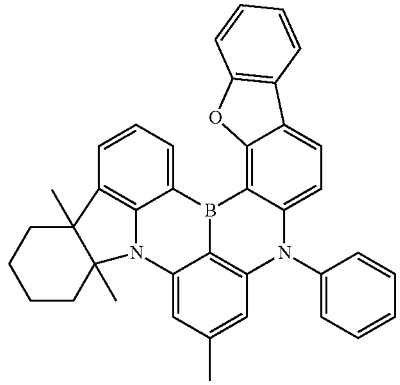
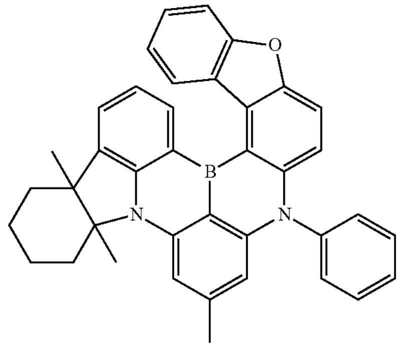

-continued
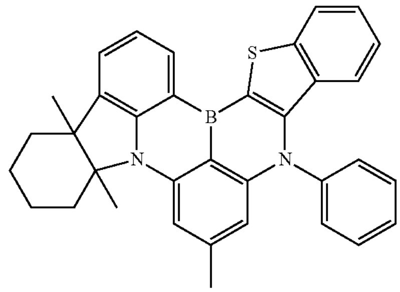
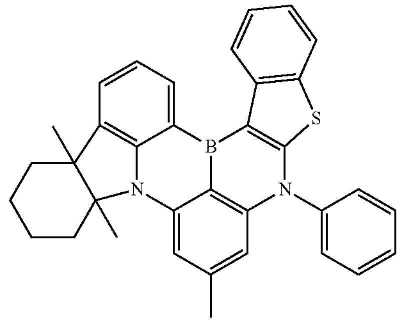
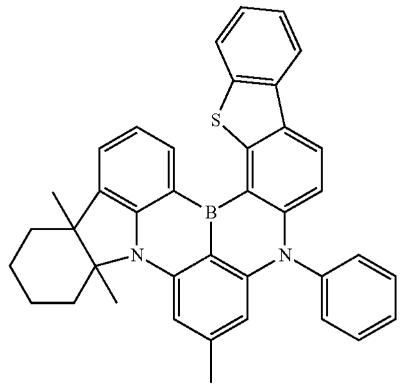
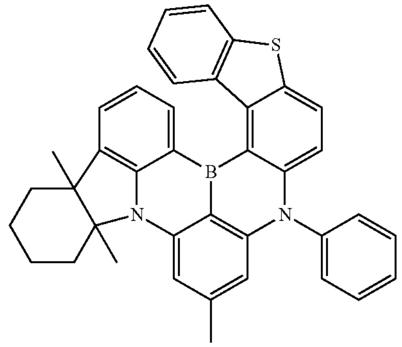
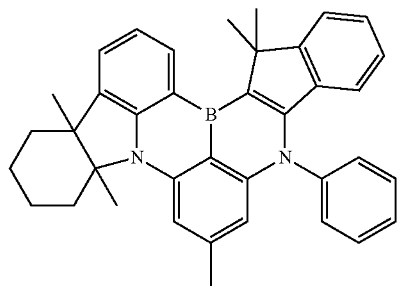
-continued
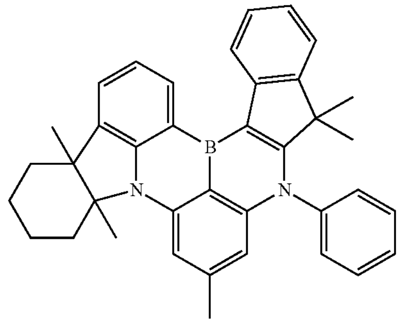
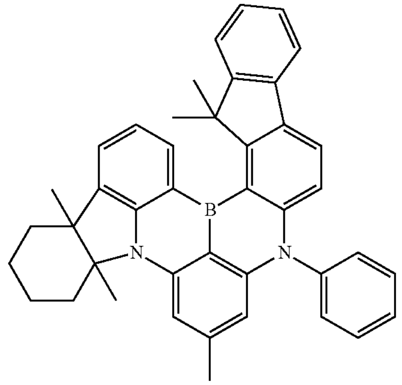
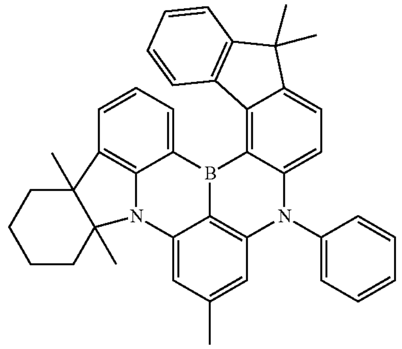
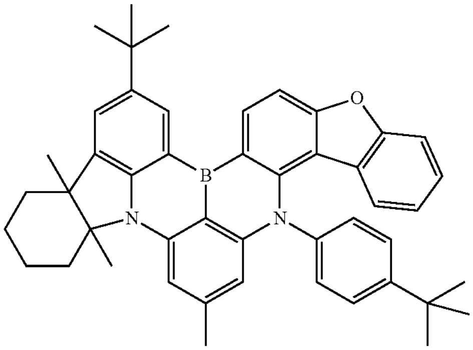

-continued
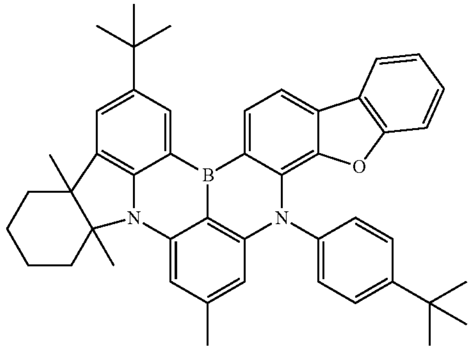
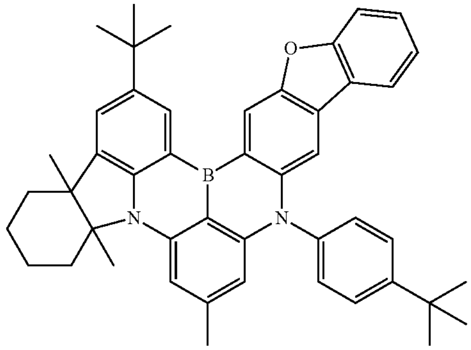
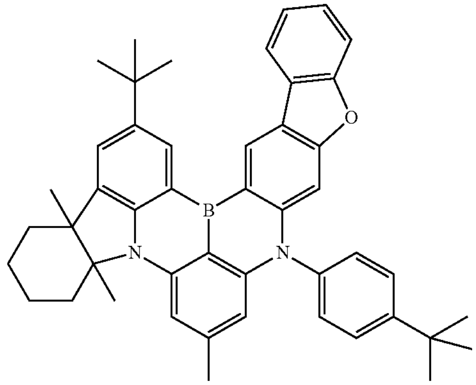
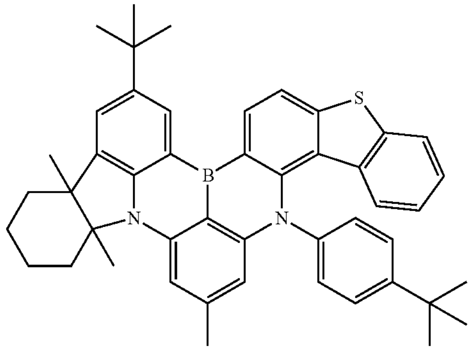
-continued
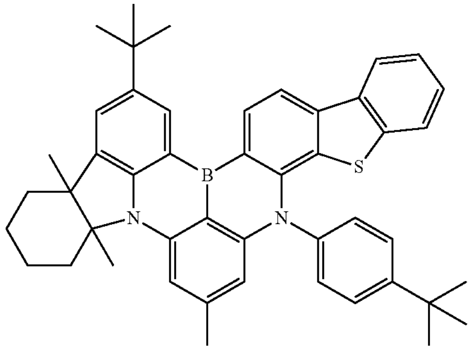
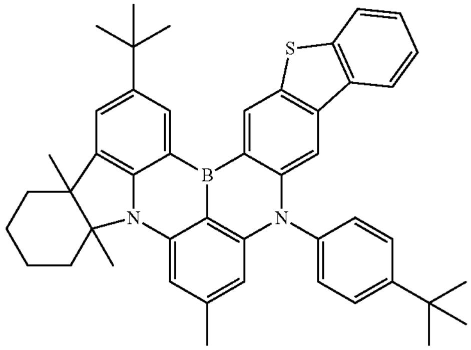
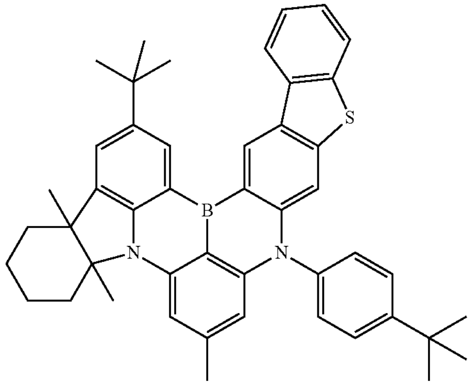
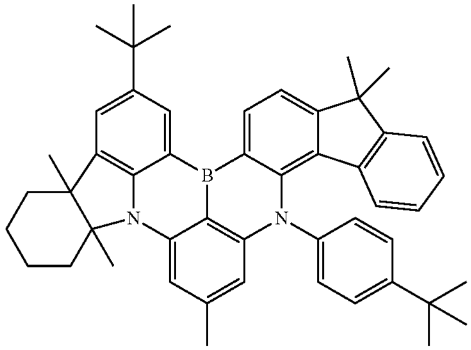

-continued
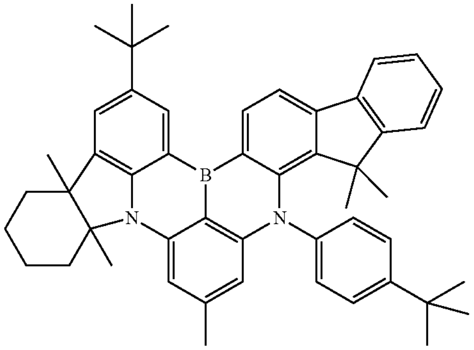
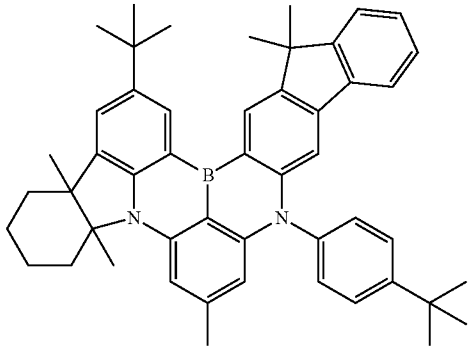
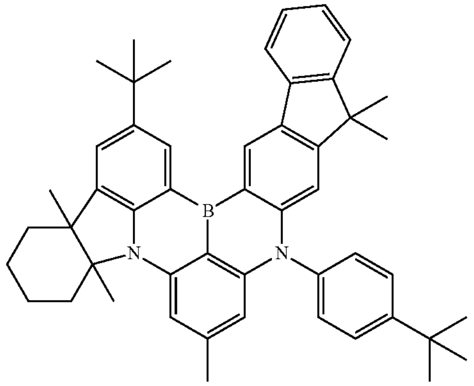
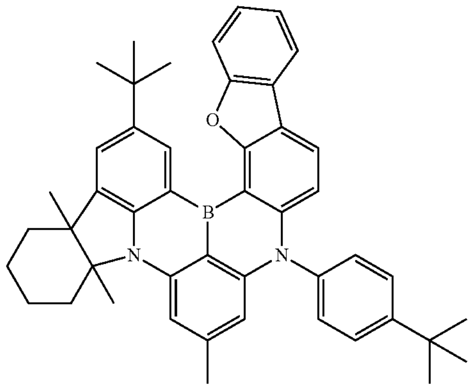
-continued
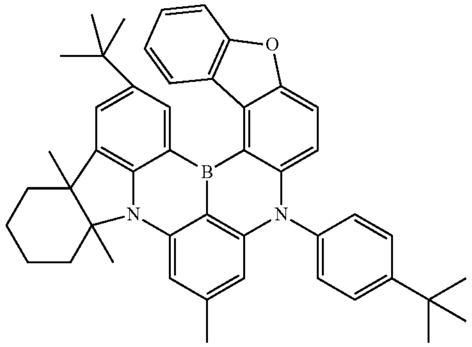
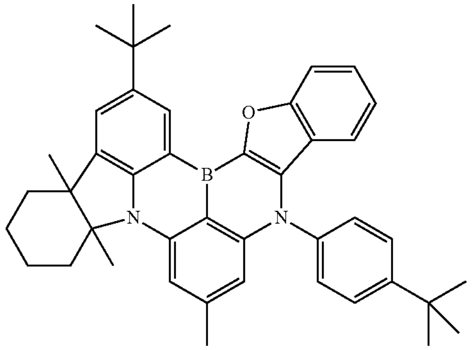
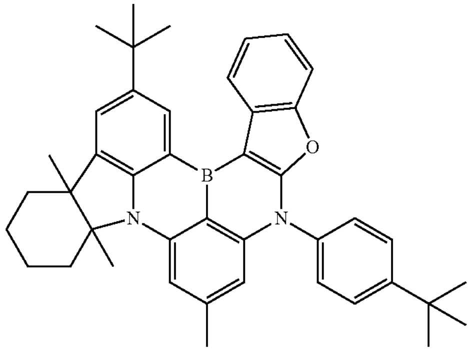
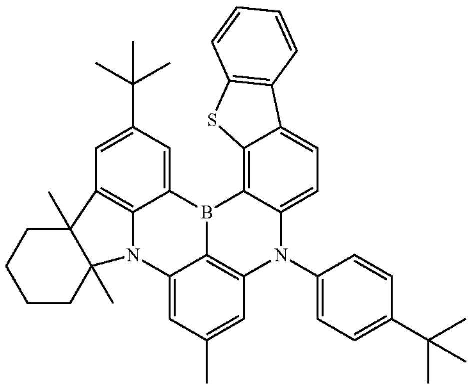

-continued
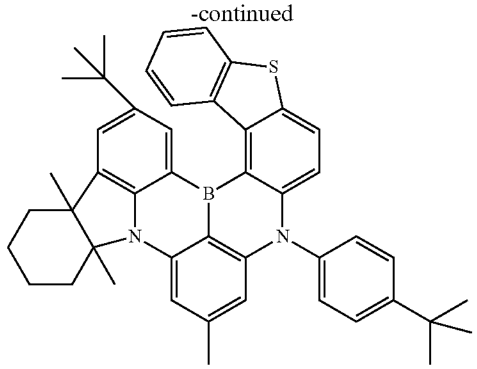
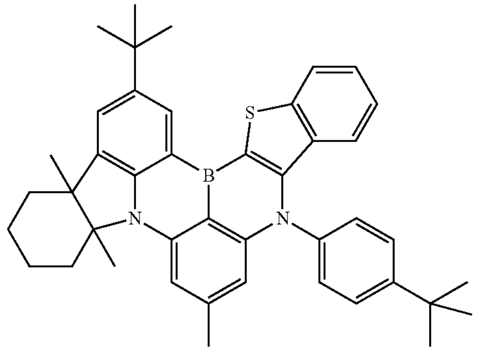
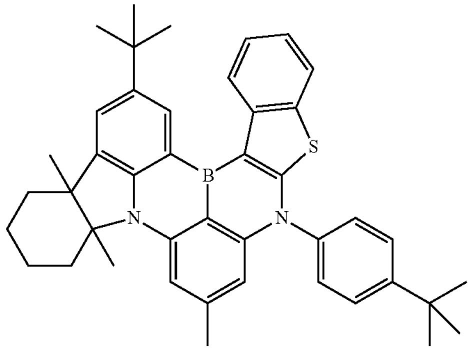
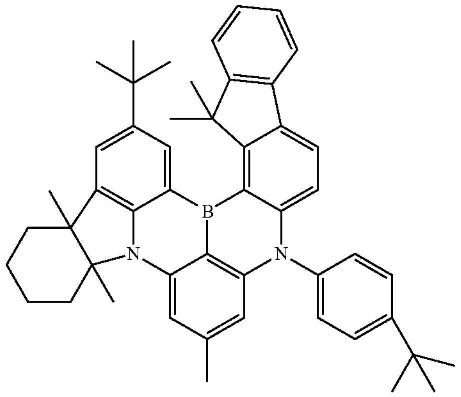
-continued
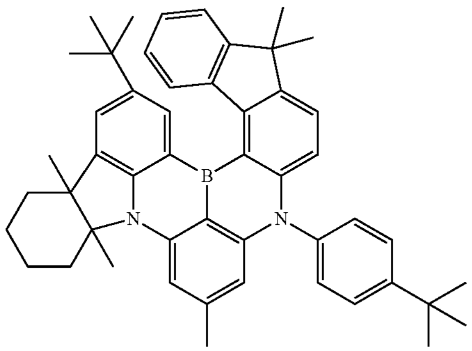
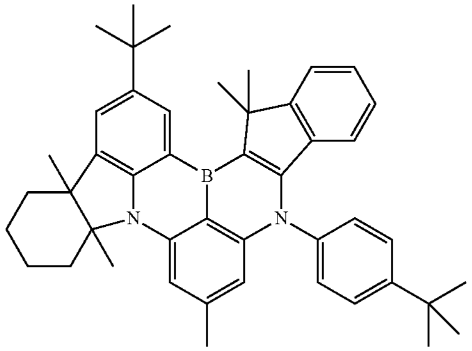
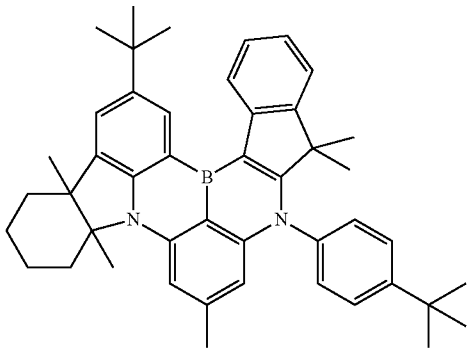
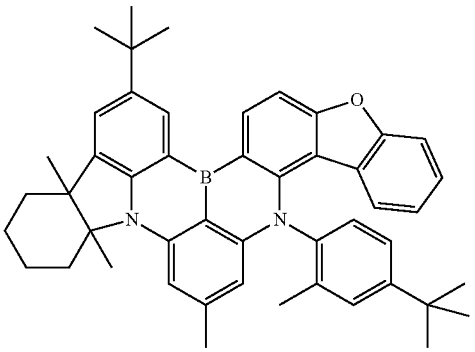

-continued
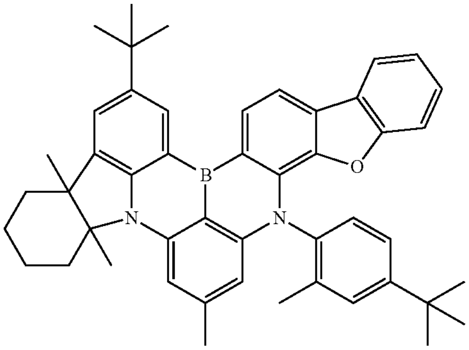
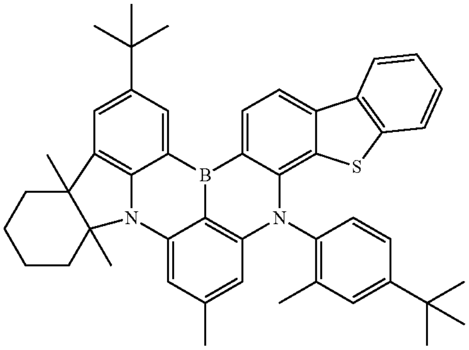
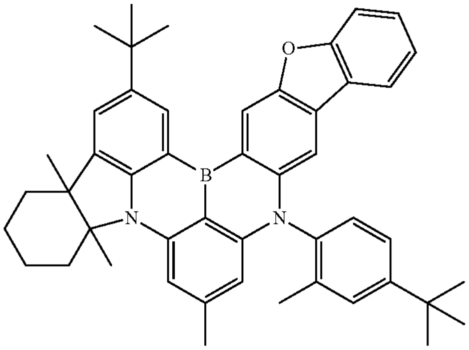
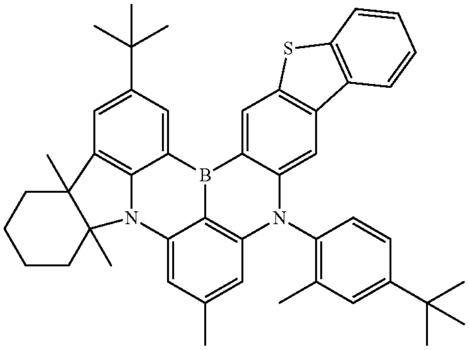
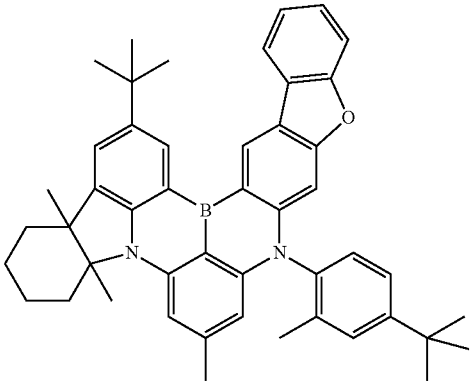
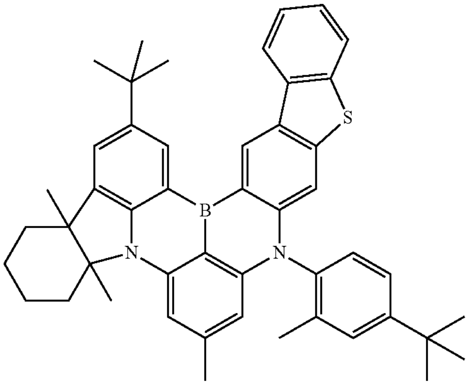
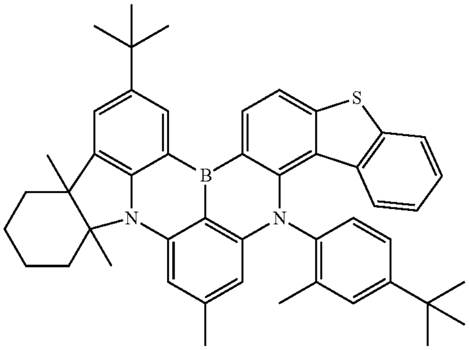
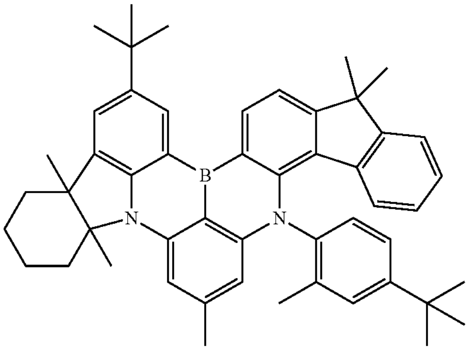

-continued
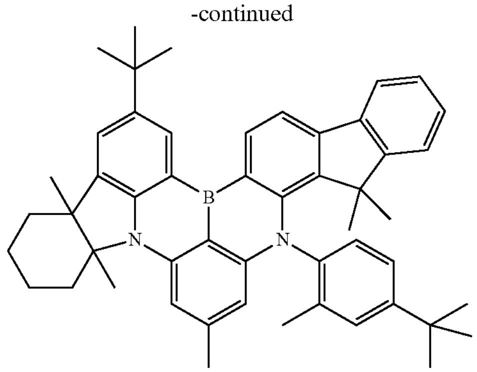
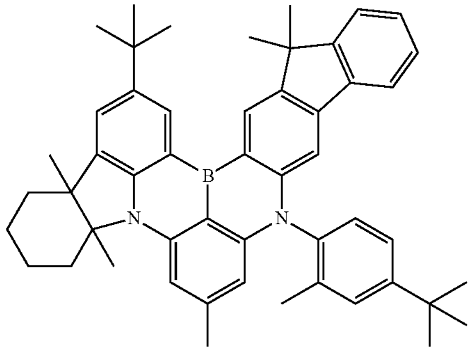
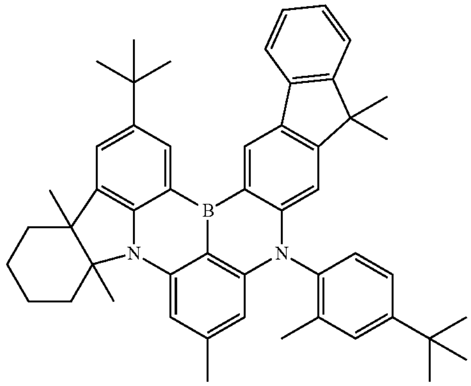
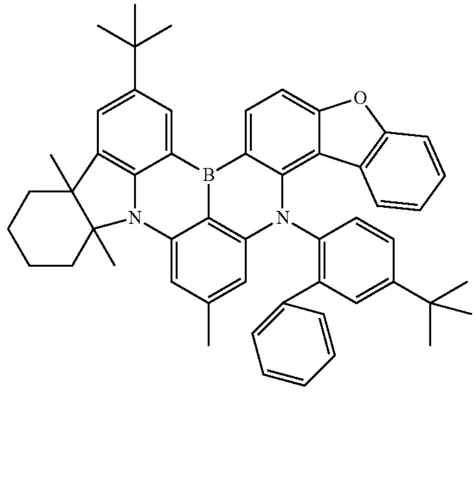
-continued
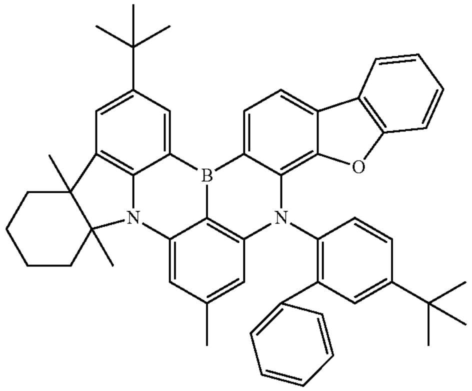
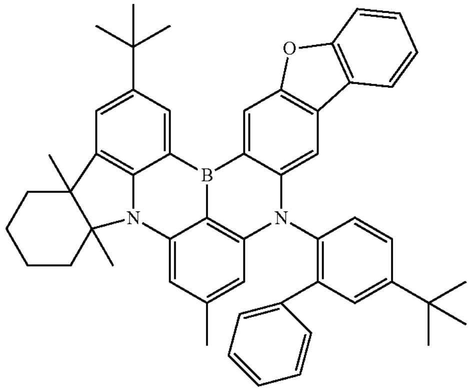
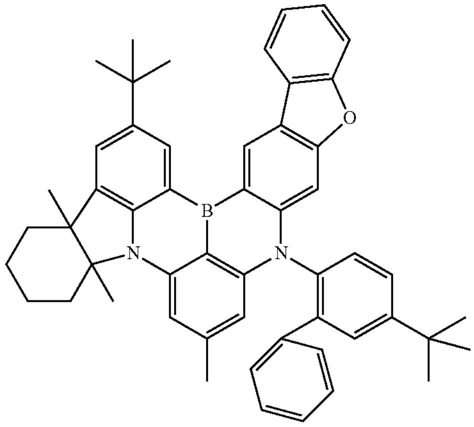
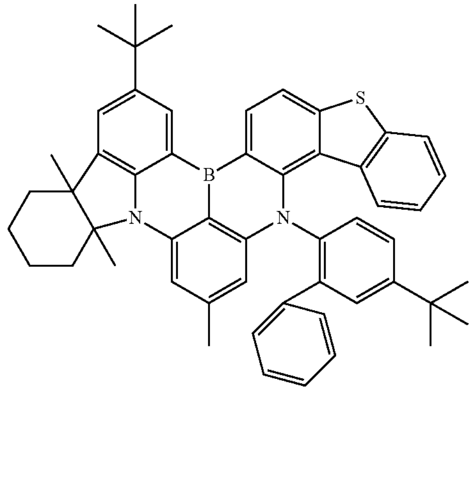

-continued
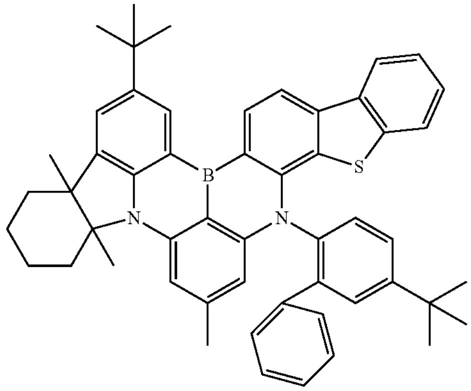
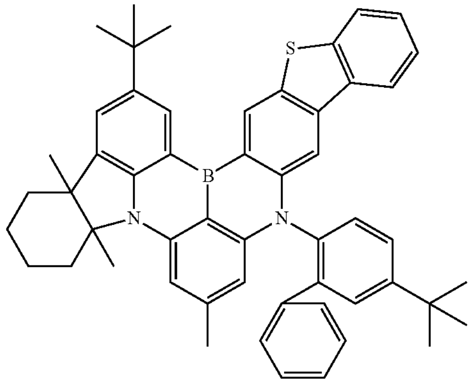
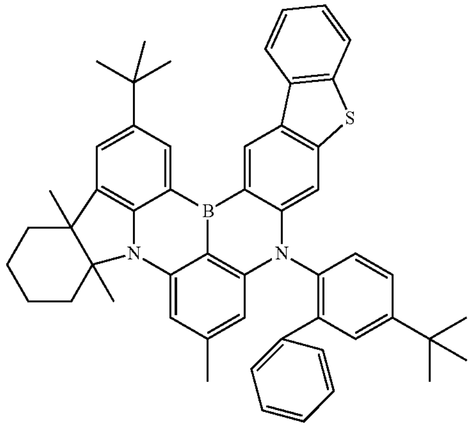
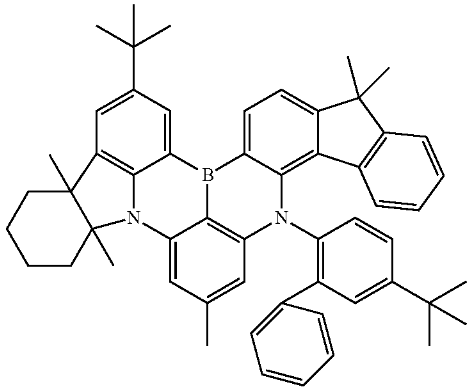
-continued
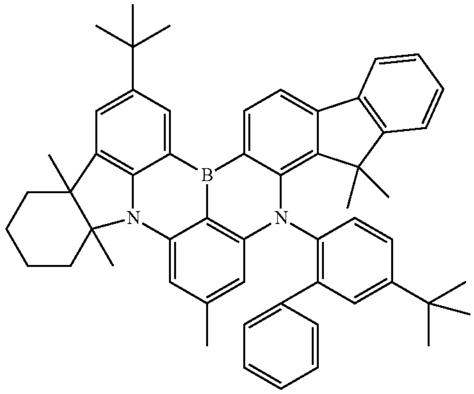
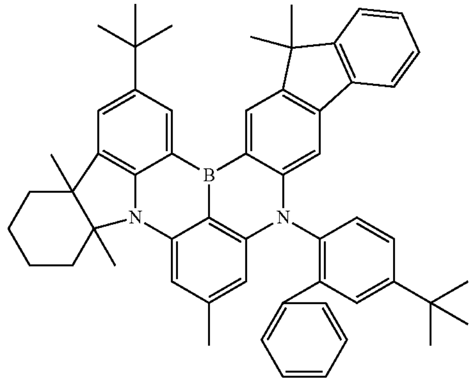
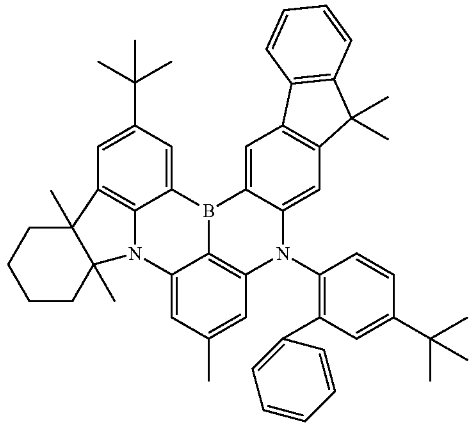
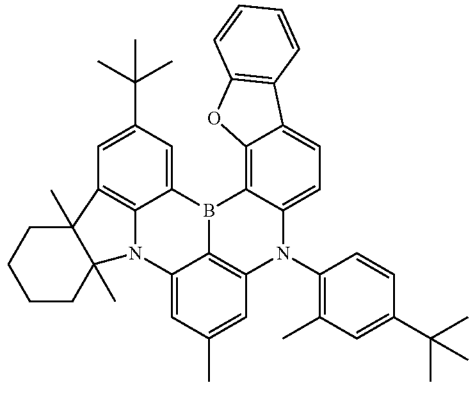

-continued
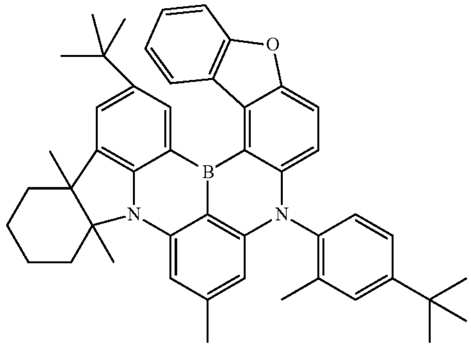
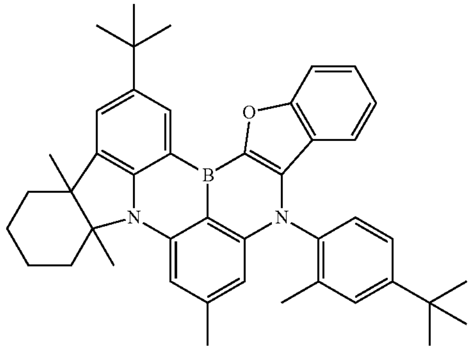
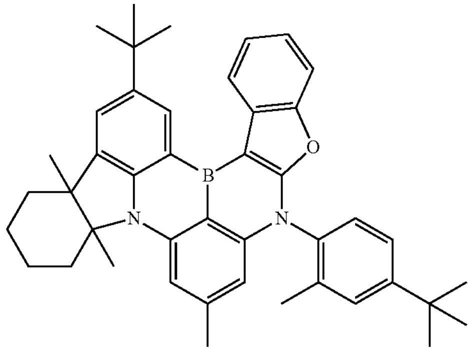
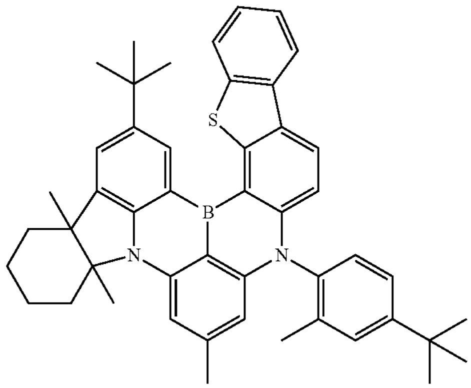
-continued
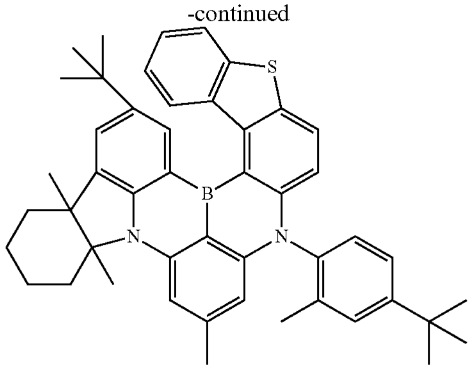
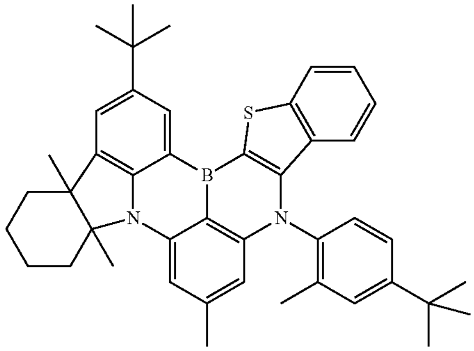
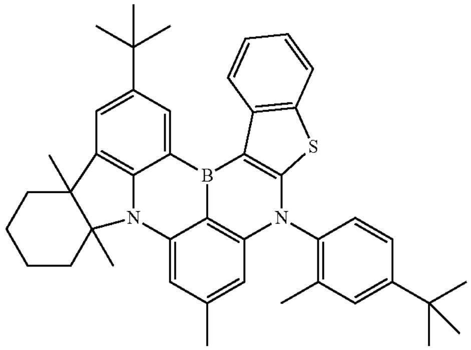
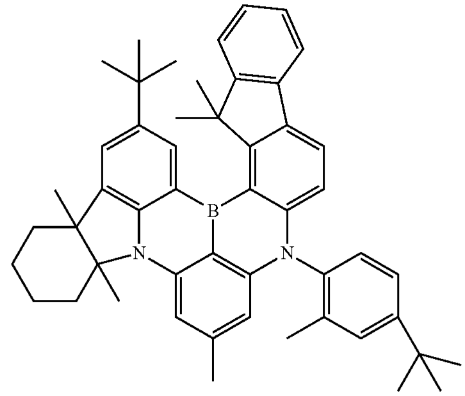

-continued
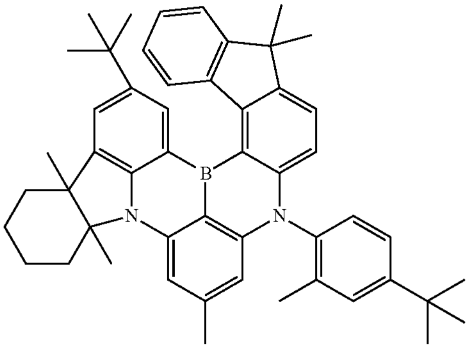
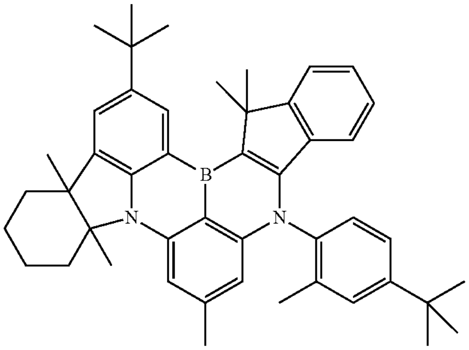
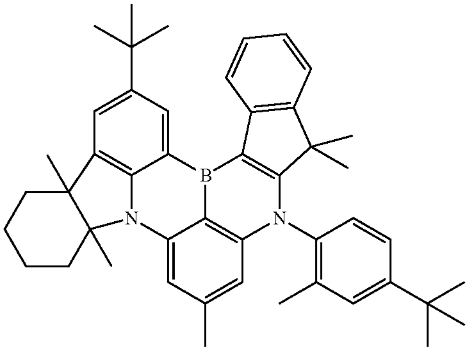
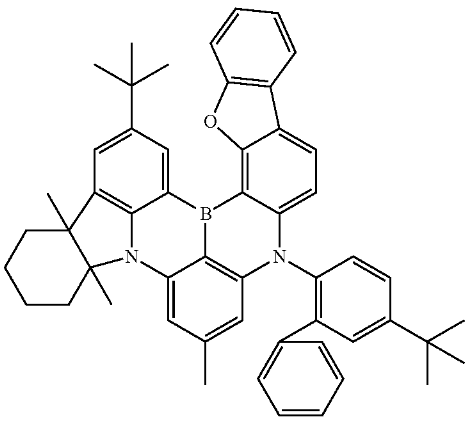
-continued
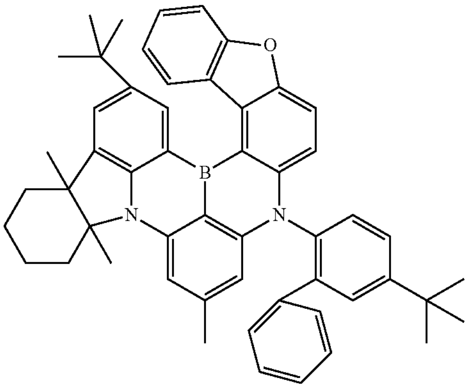
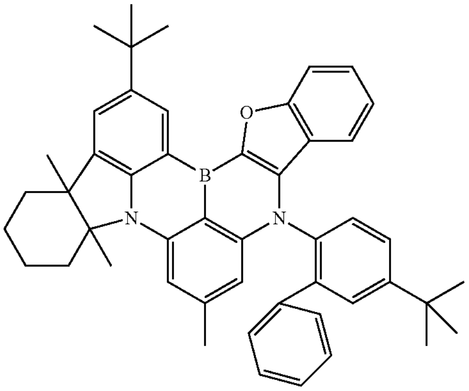
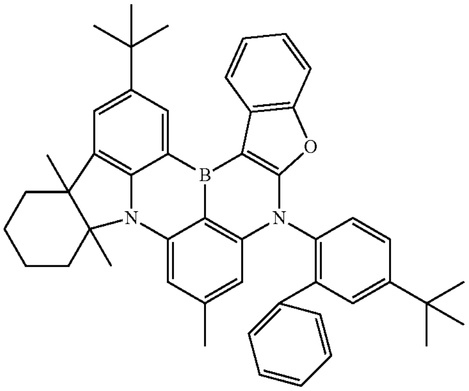
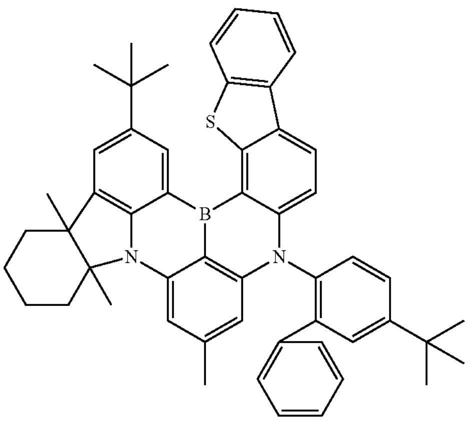

-continued
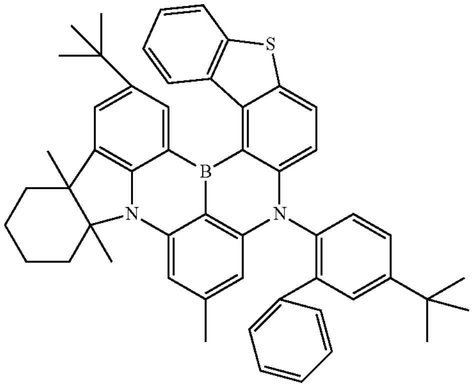
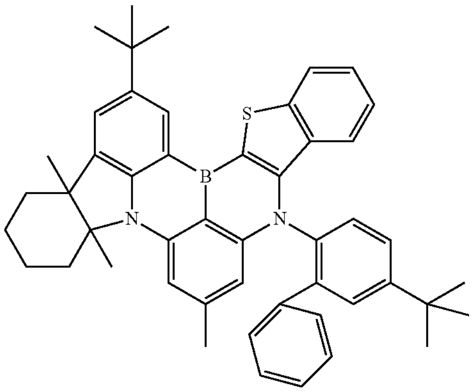
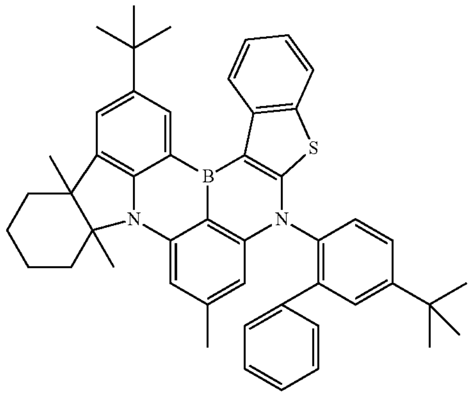
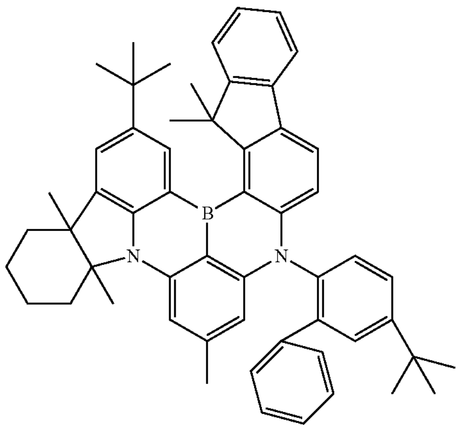
-continued
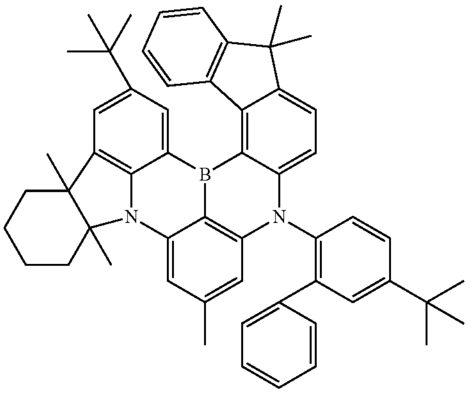
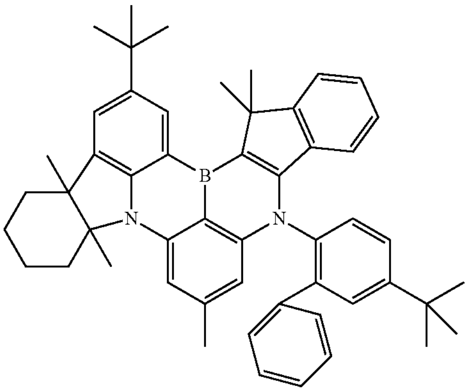
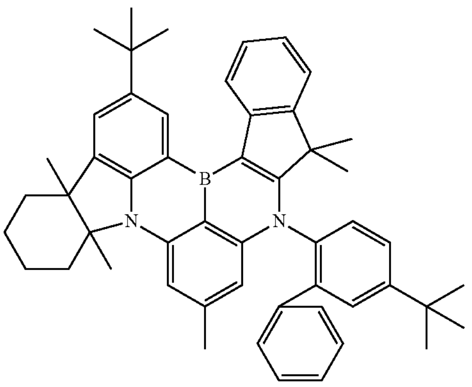
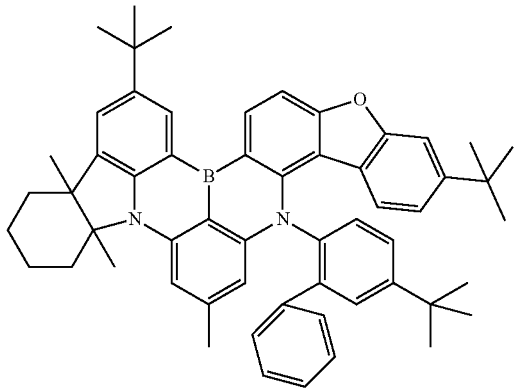

-continued
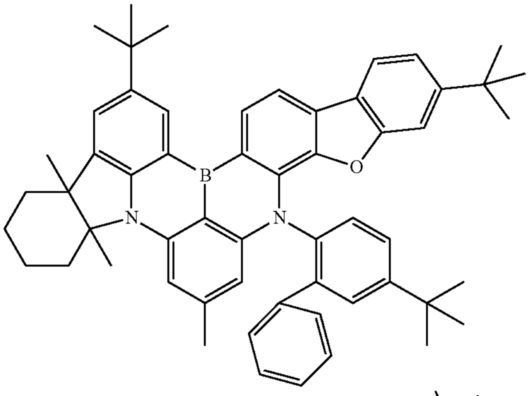
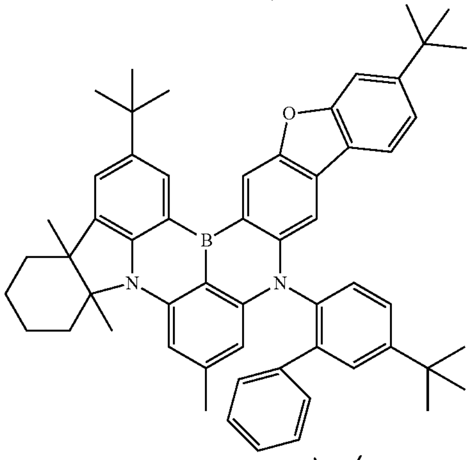
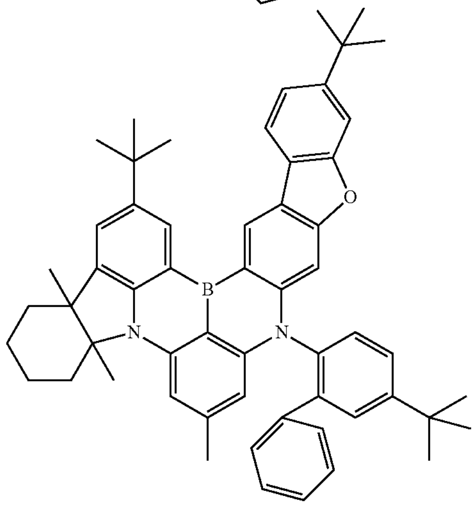
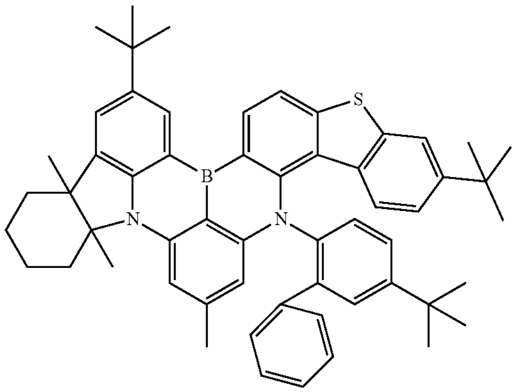
-continued
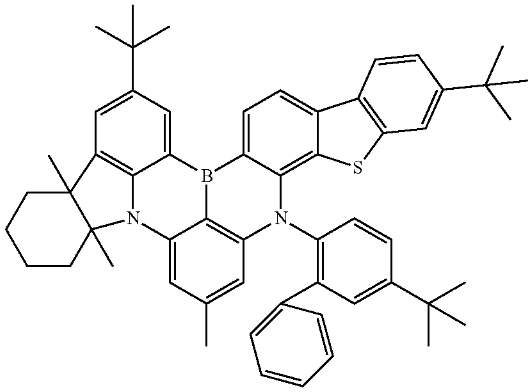
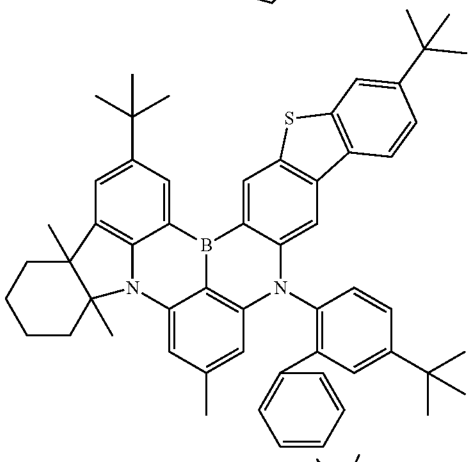
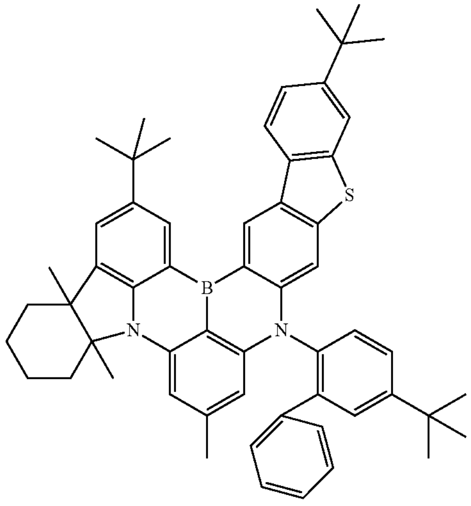
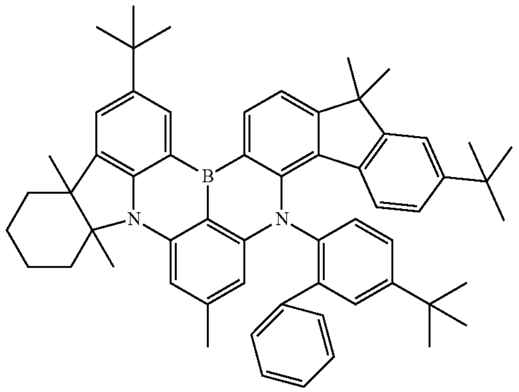

-continued
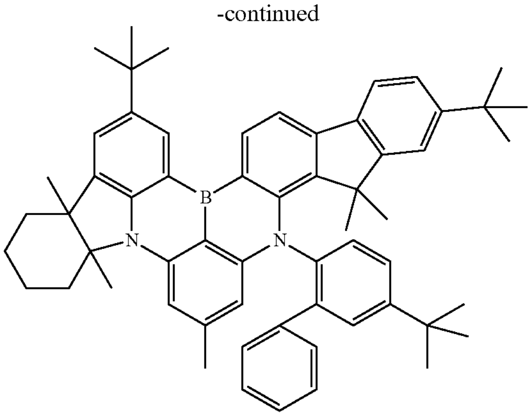
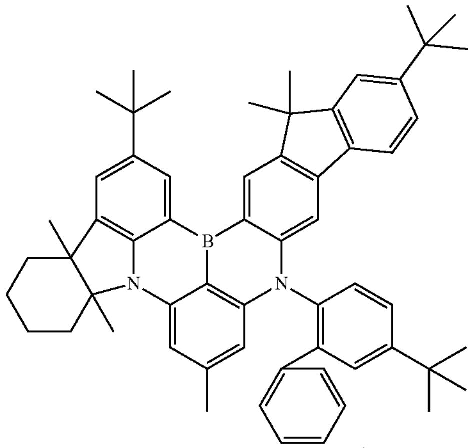
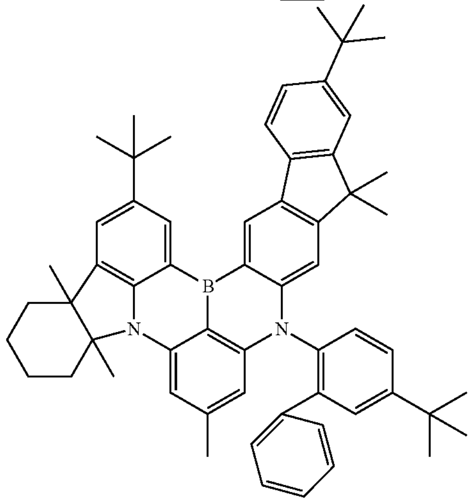
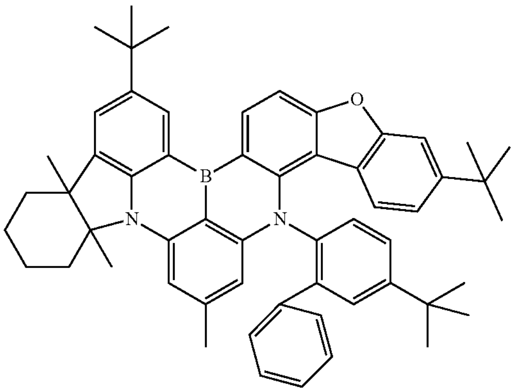
-continued
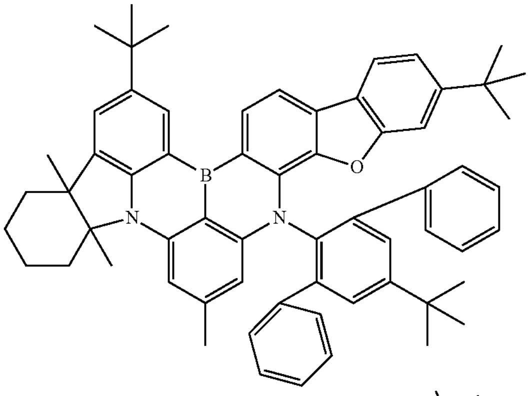
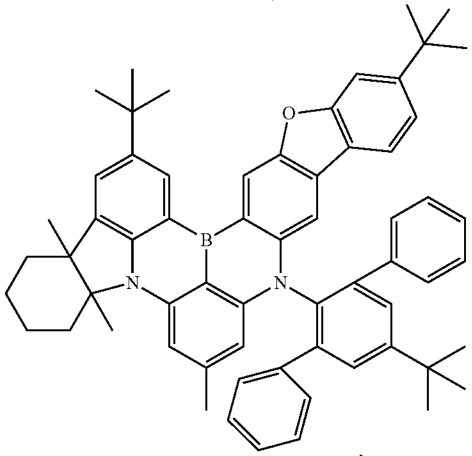
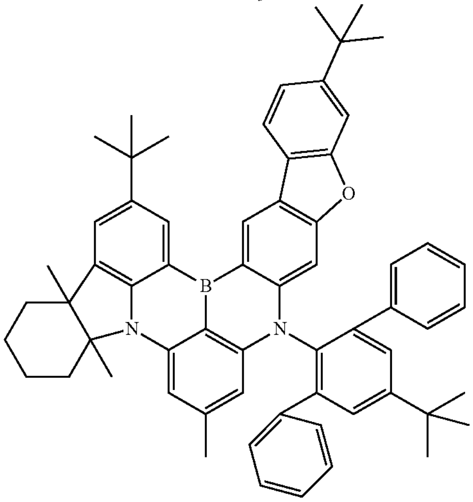
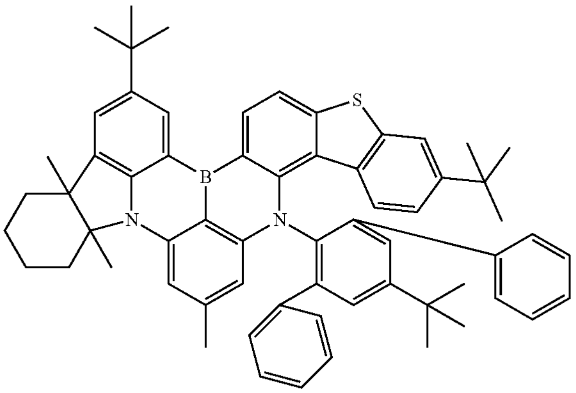

-continued
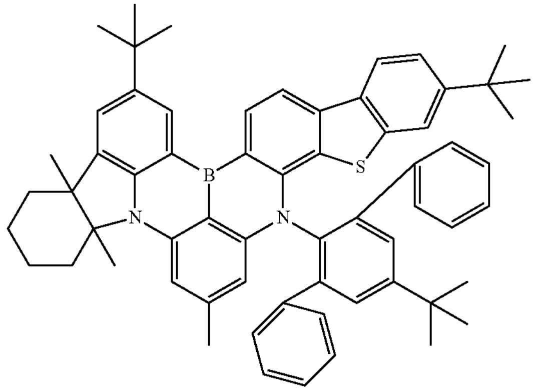
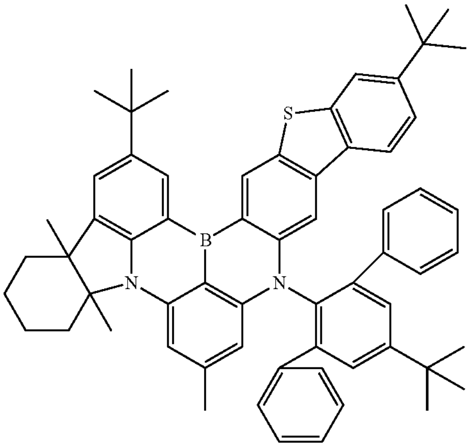
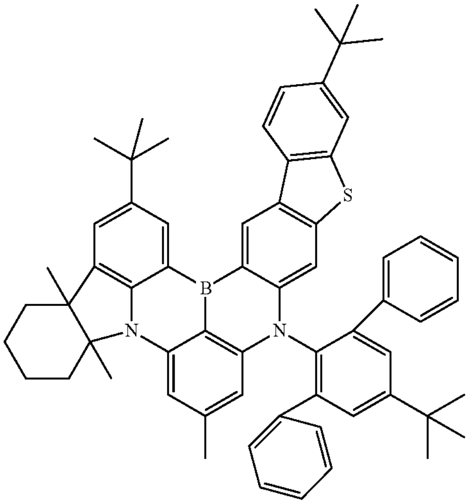
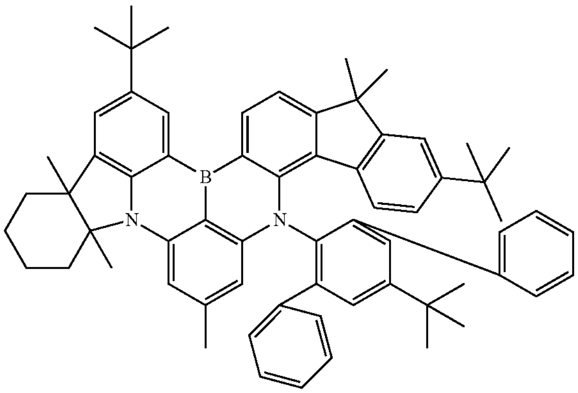
-continued
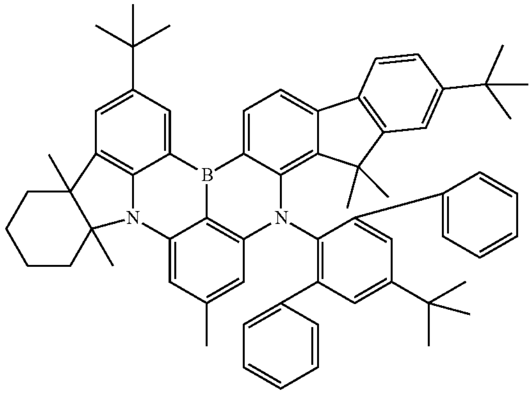
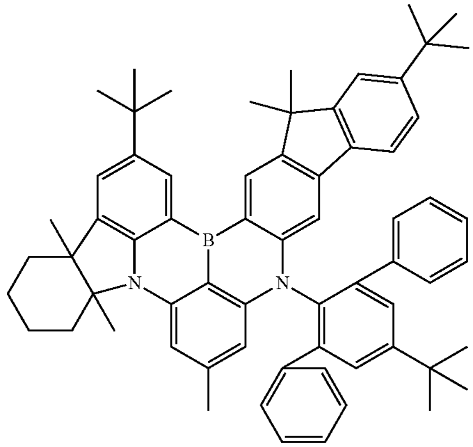
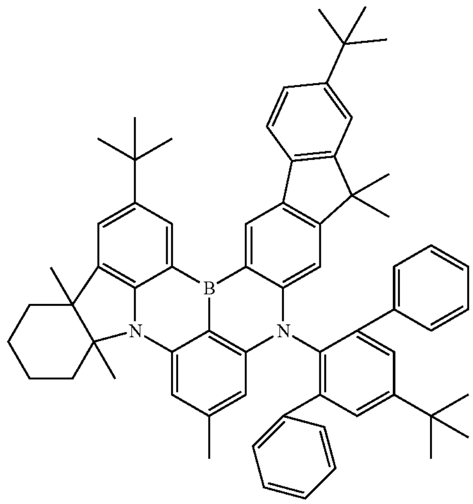

-continued
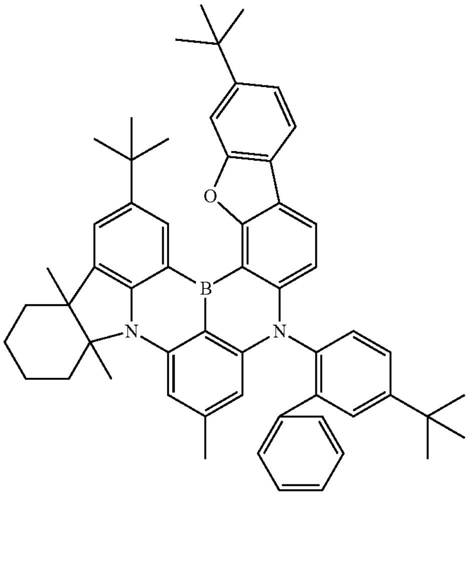
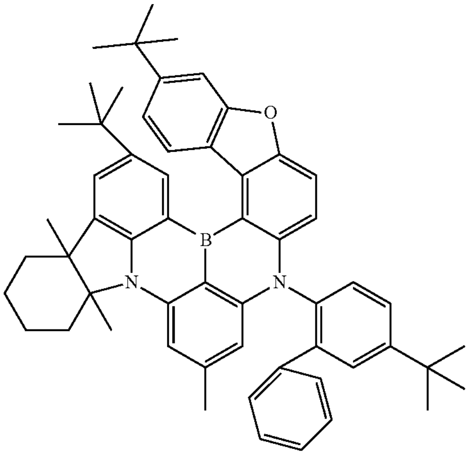
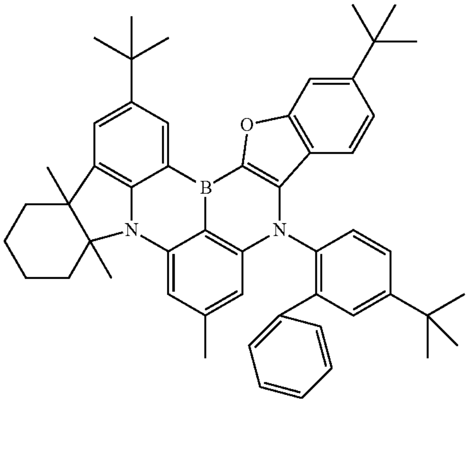
-continued
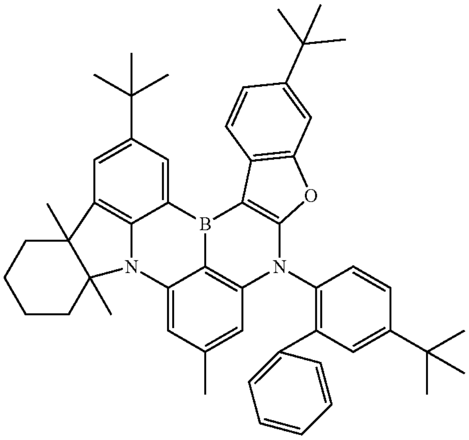
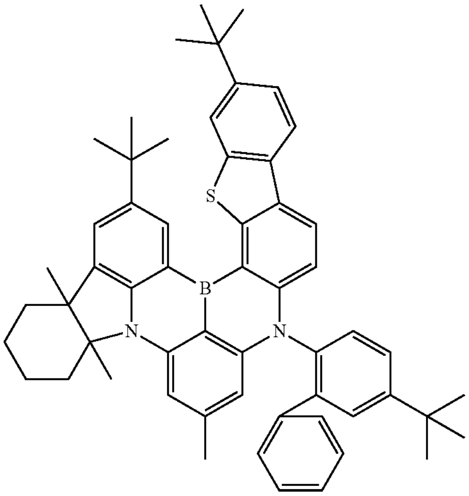
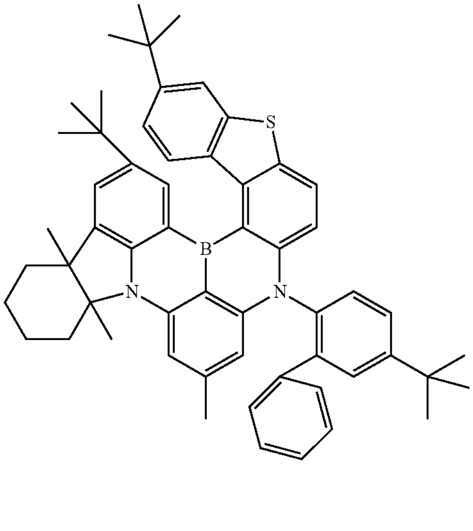

-continued
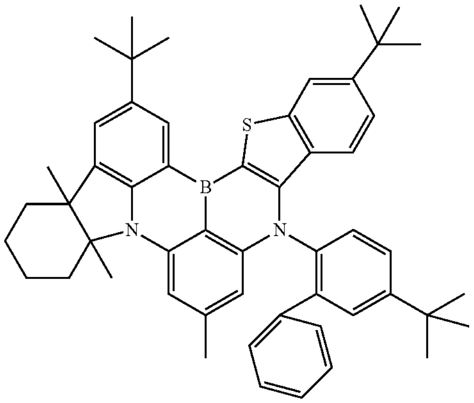
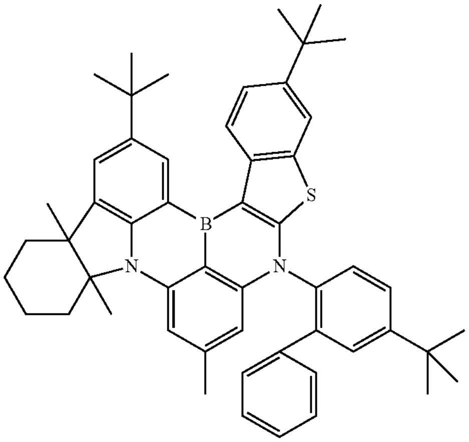
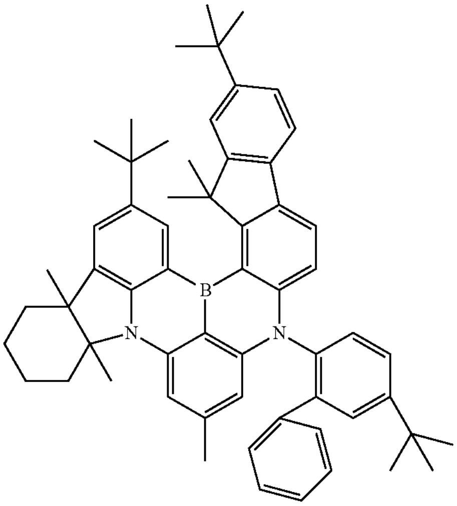
-continued
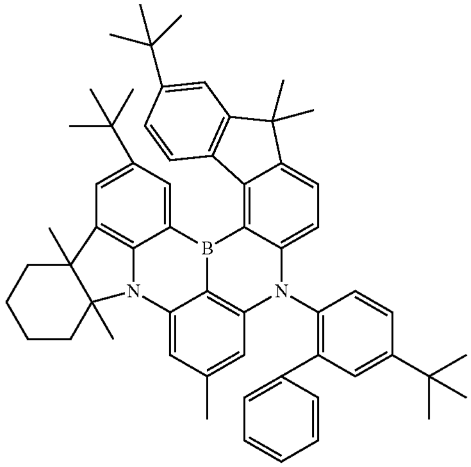
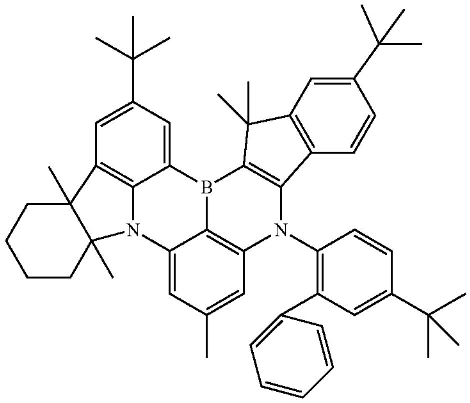
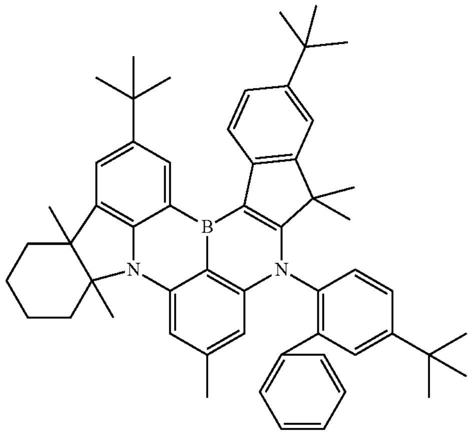

-continued
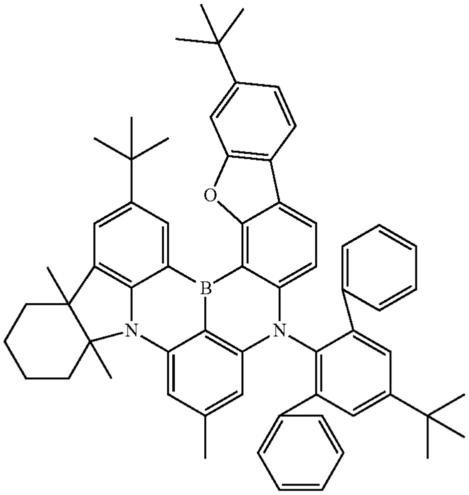
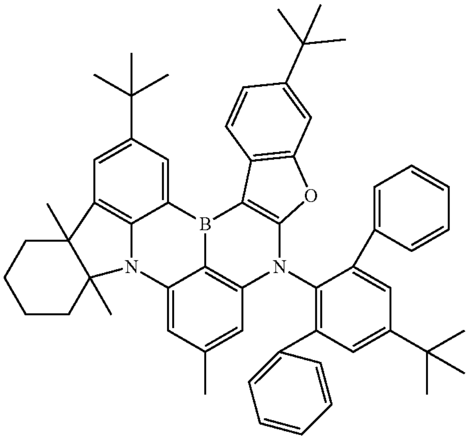
-continued
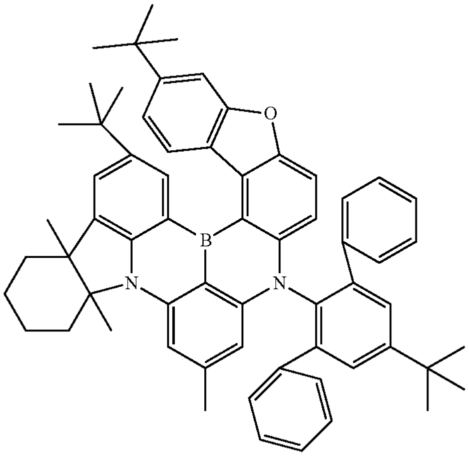
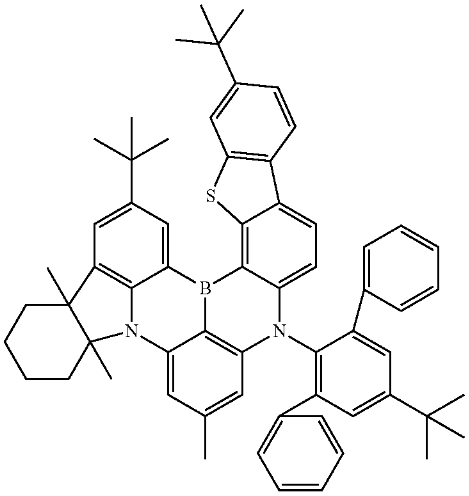
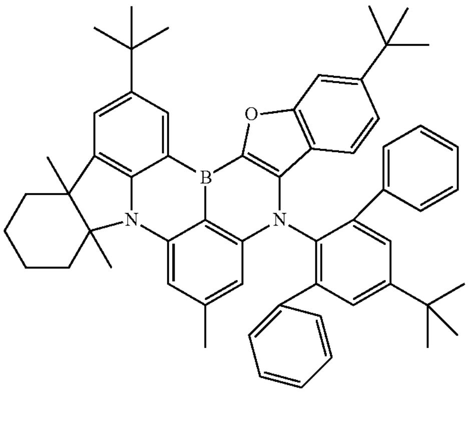
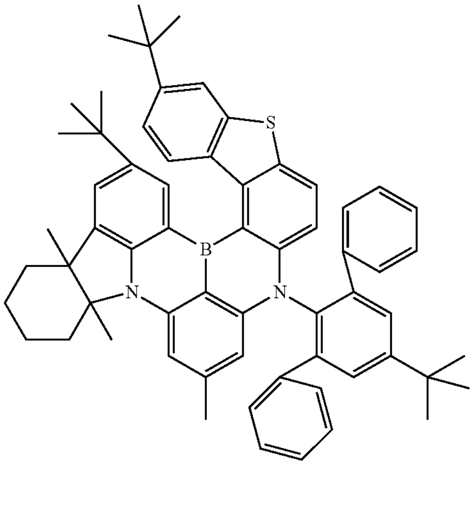

-continued
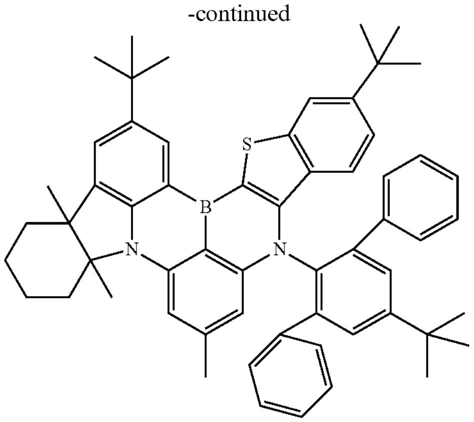
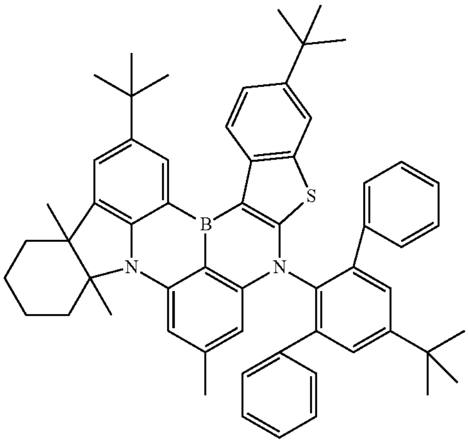
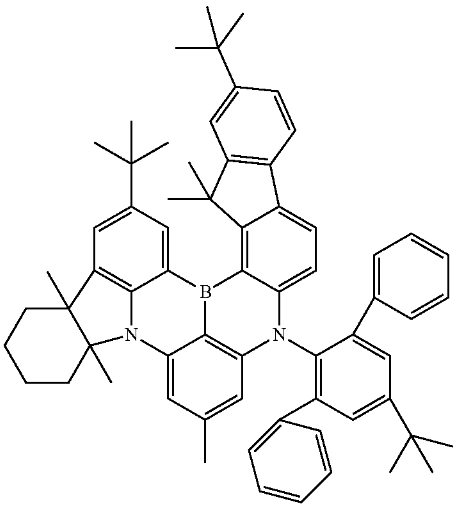
-continued
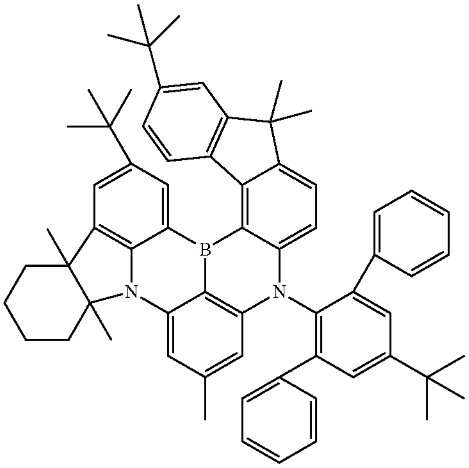
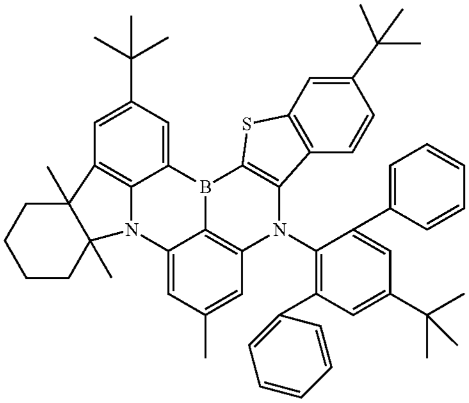
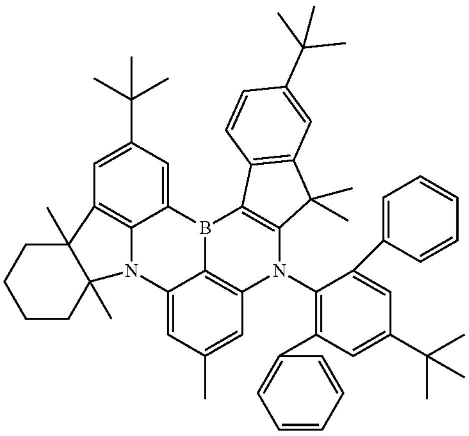

-continued
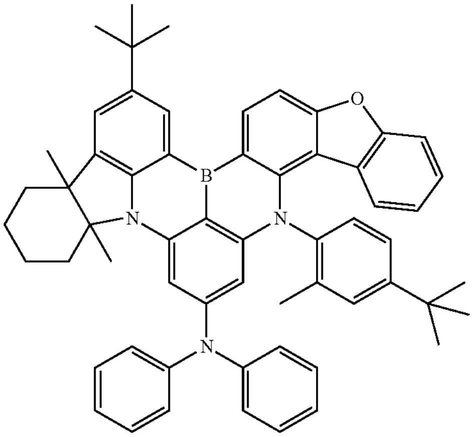
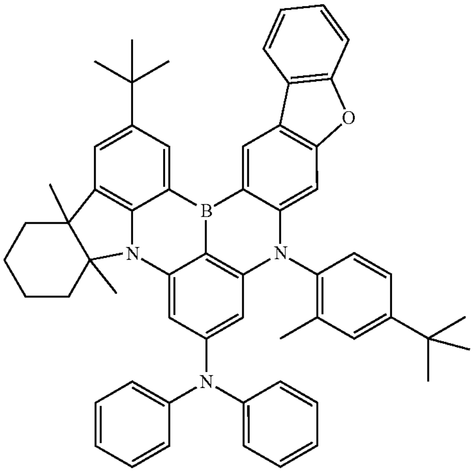
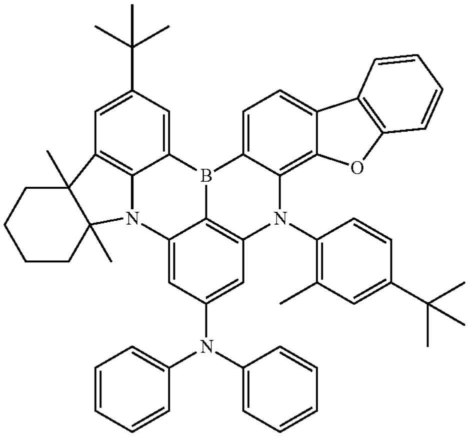
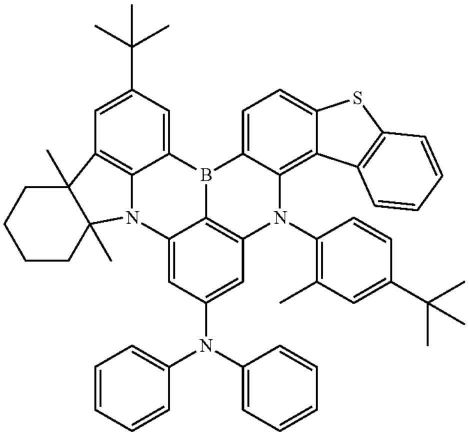
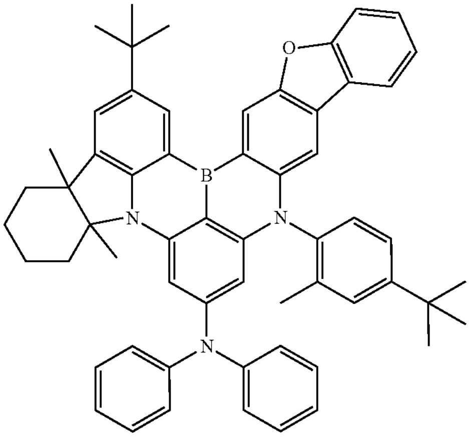
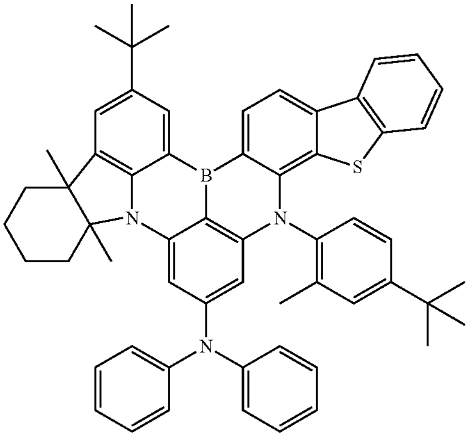

-continued
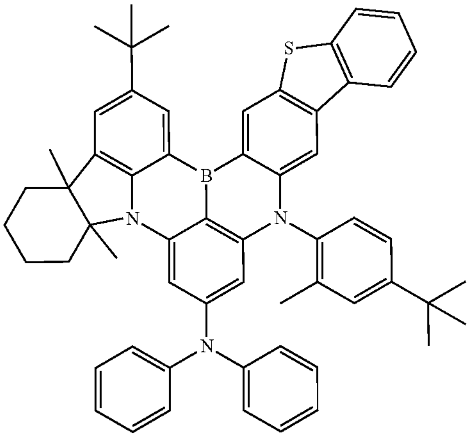
-continued
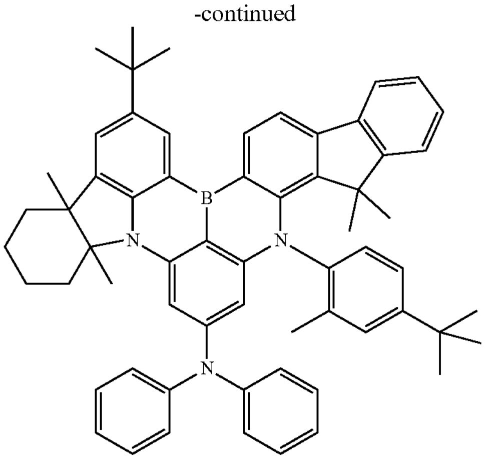
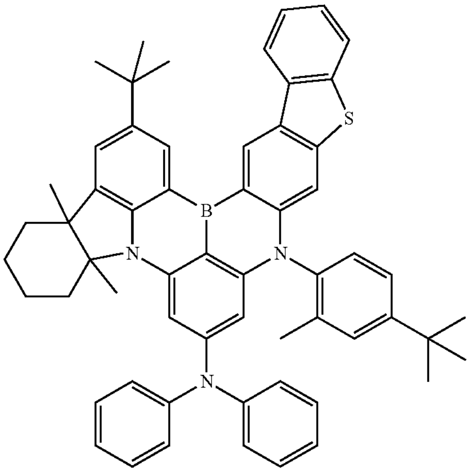
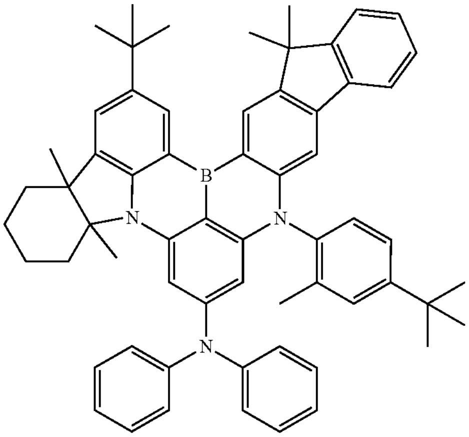
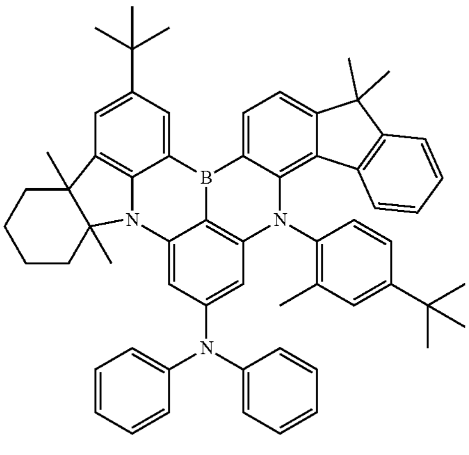
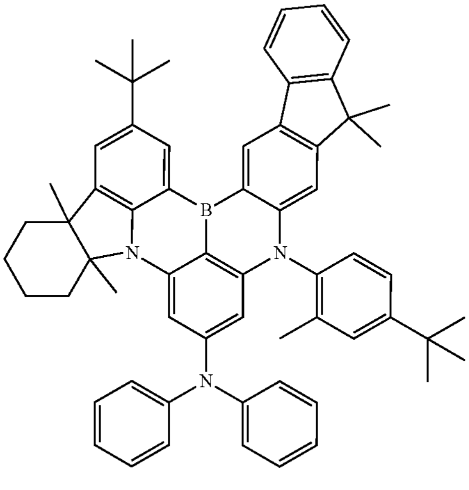

-continued
-continued
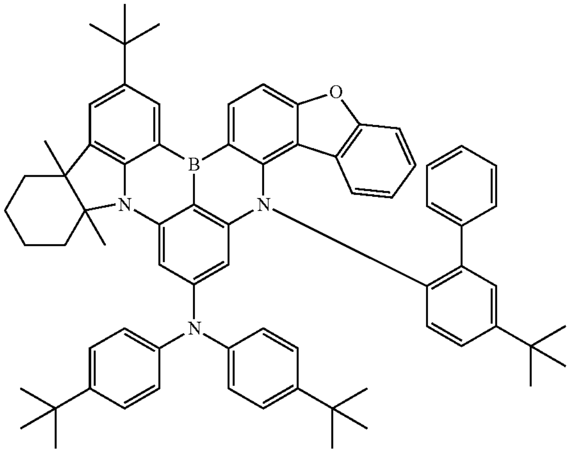
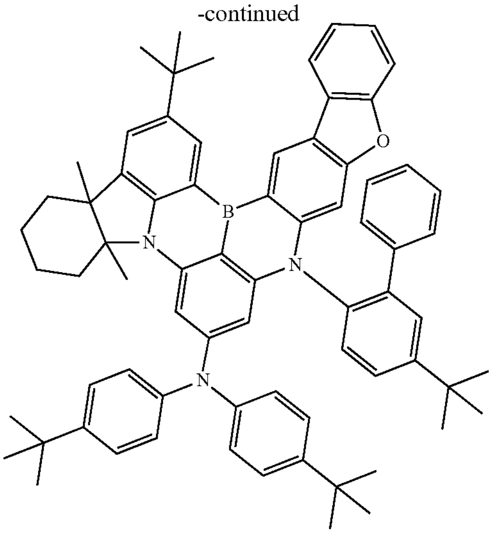
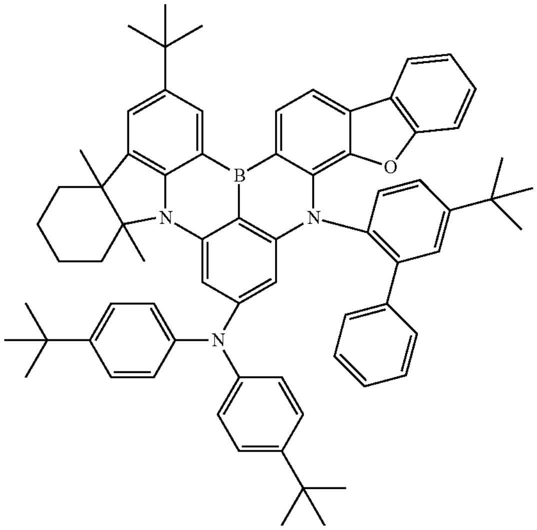
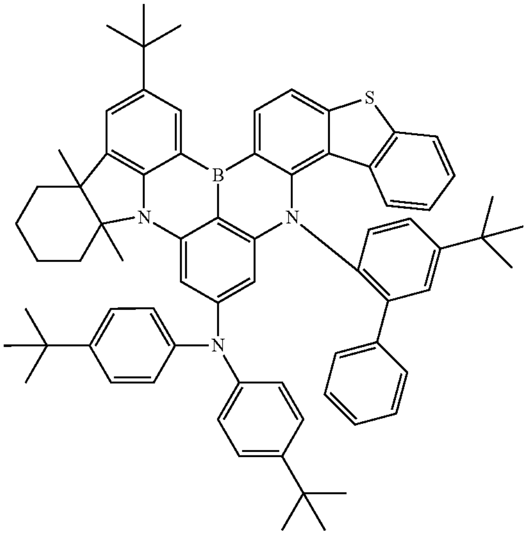
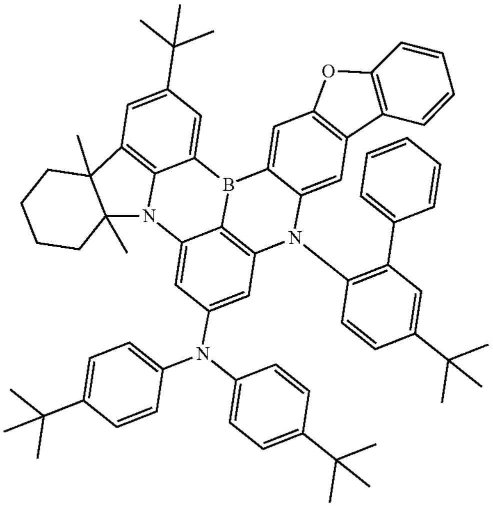
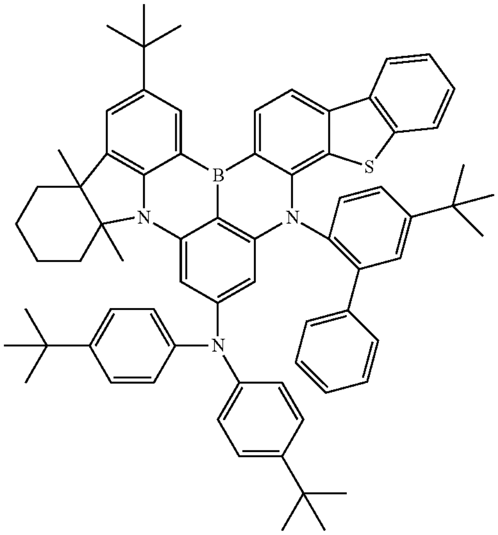

-continued
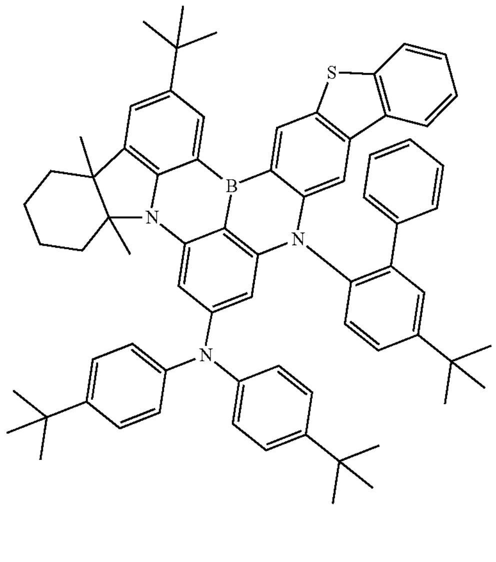
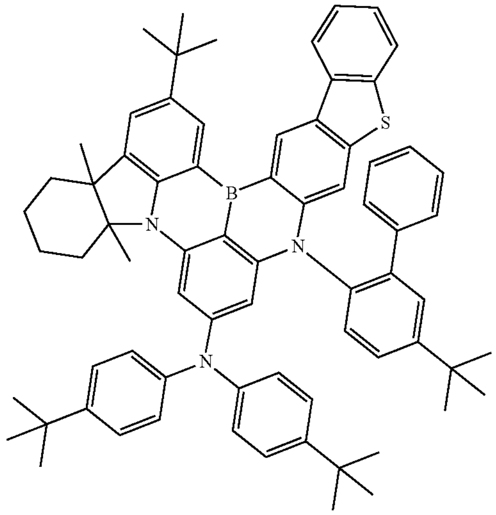
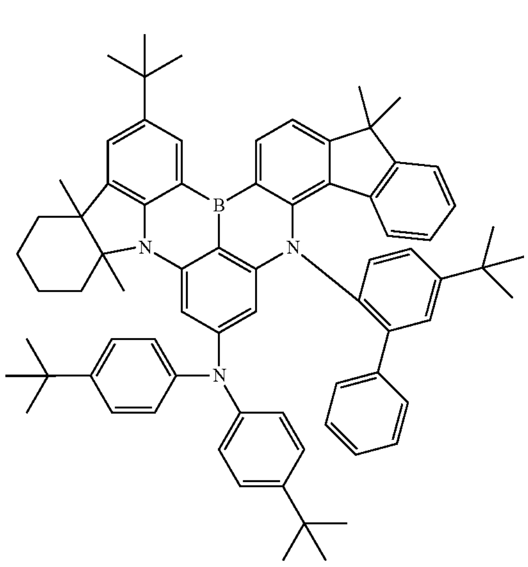
-continued
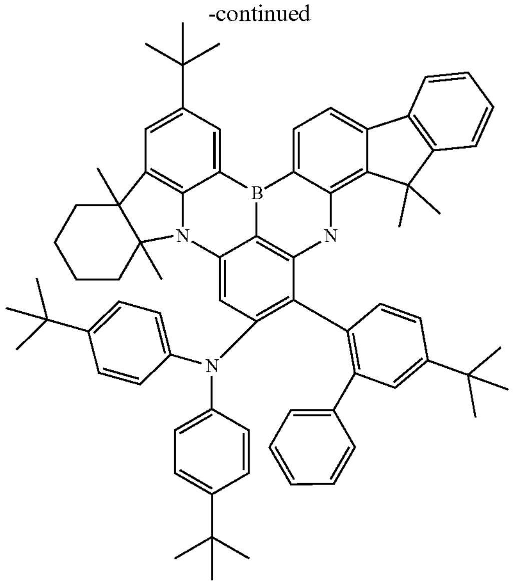
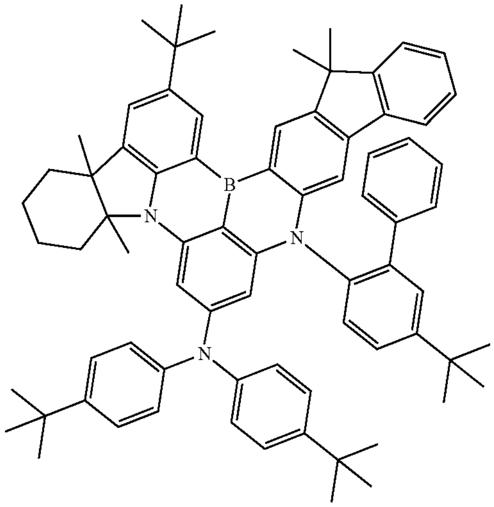
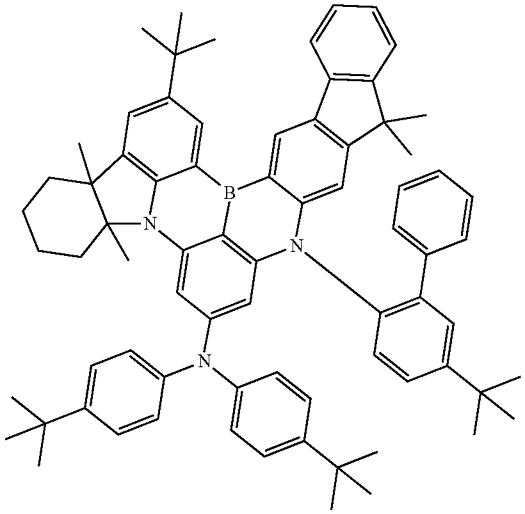

-continued
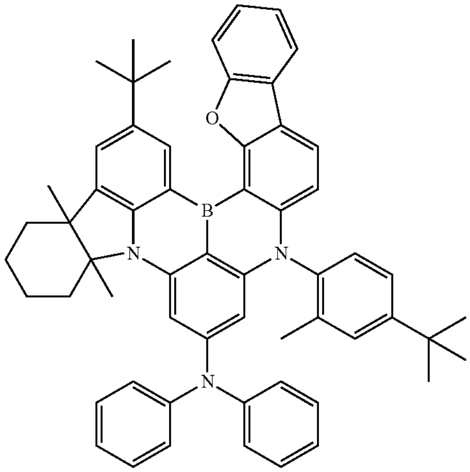
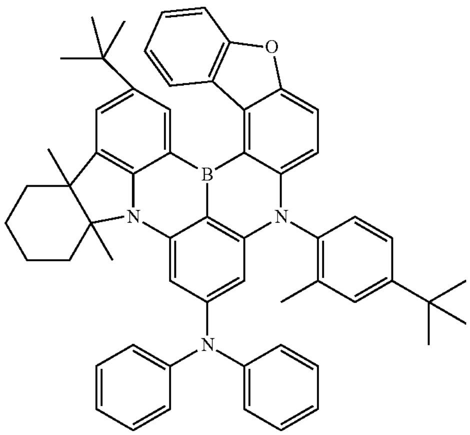
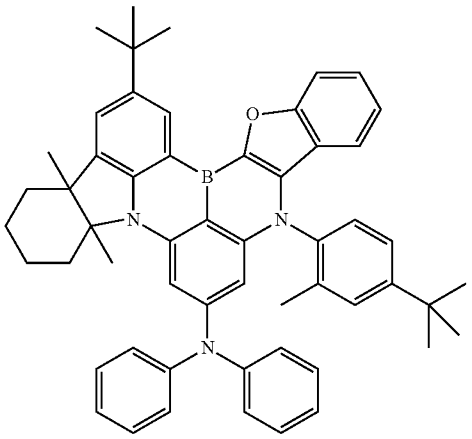
-continued
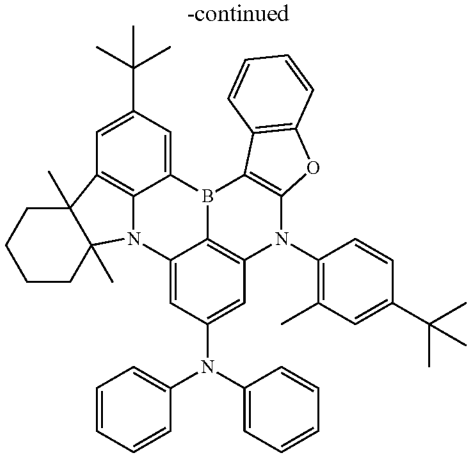
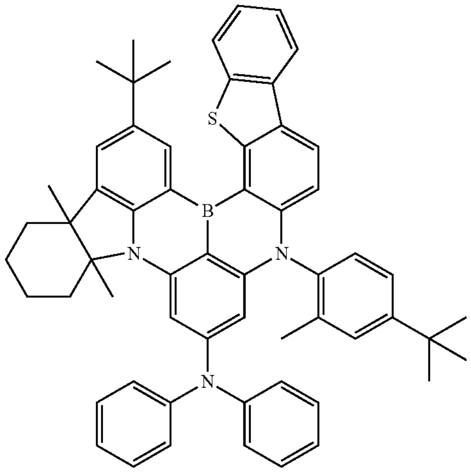
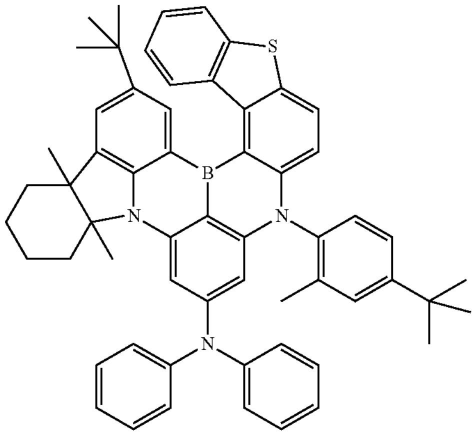

-continued
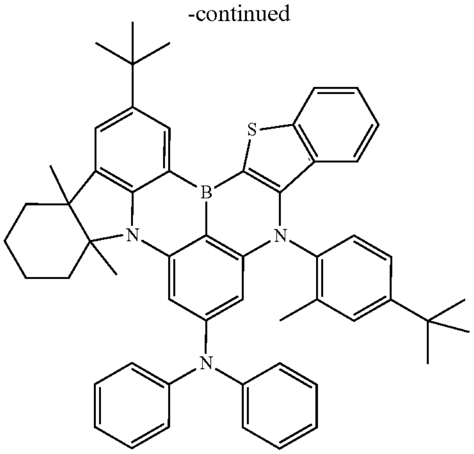
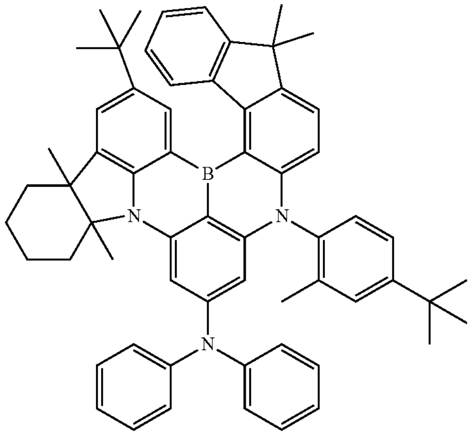
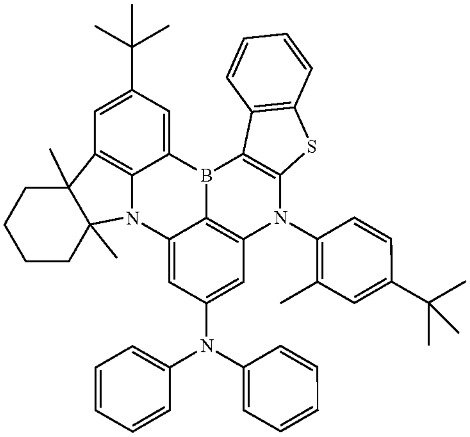
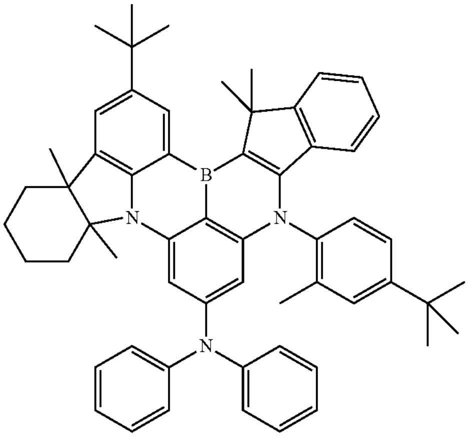
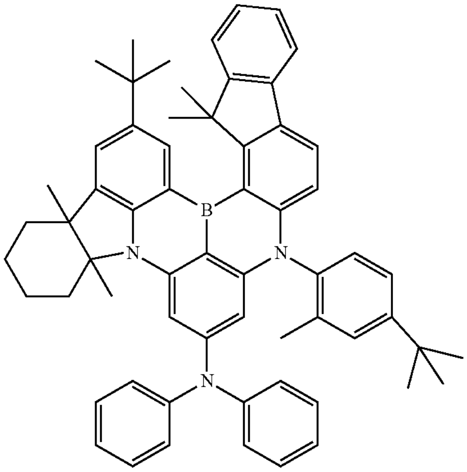
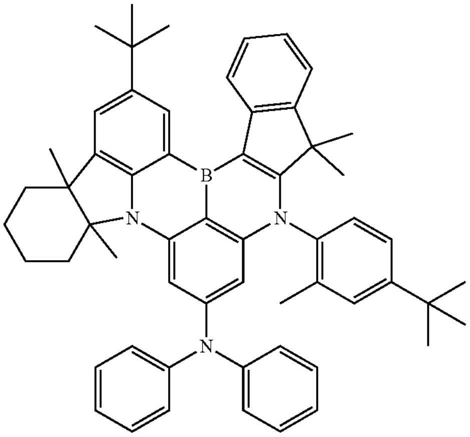

-continued
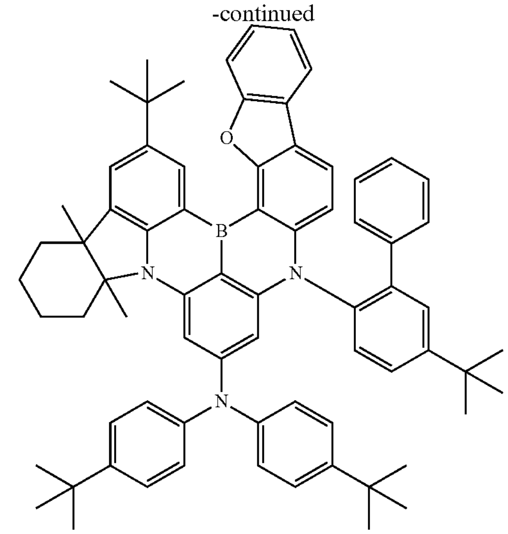
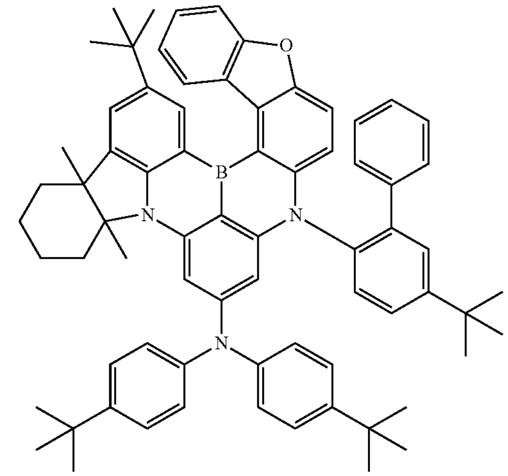
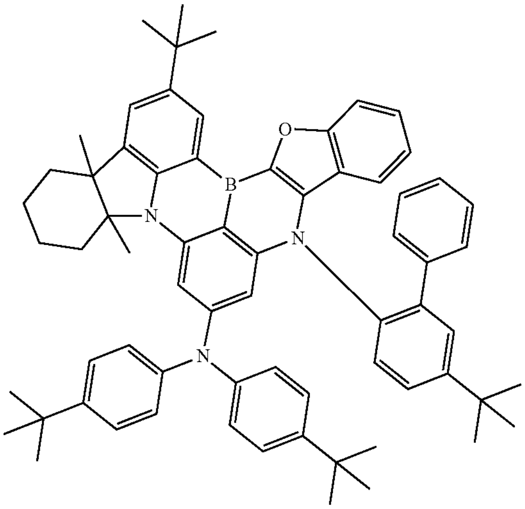
-continued
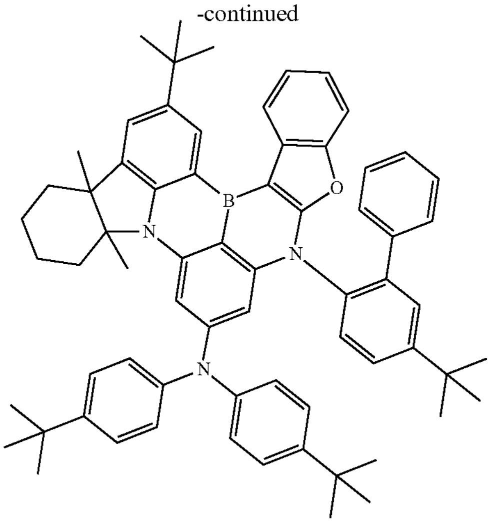
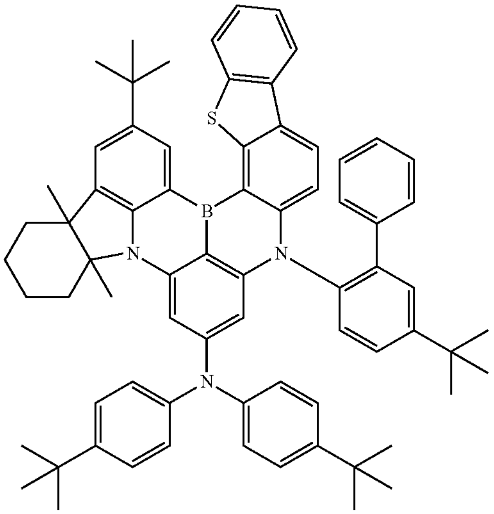
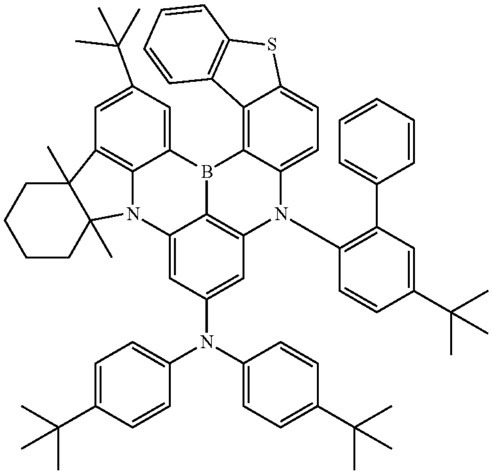

-continued
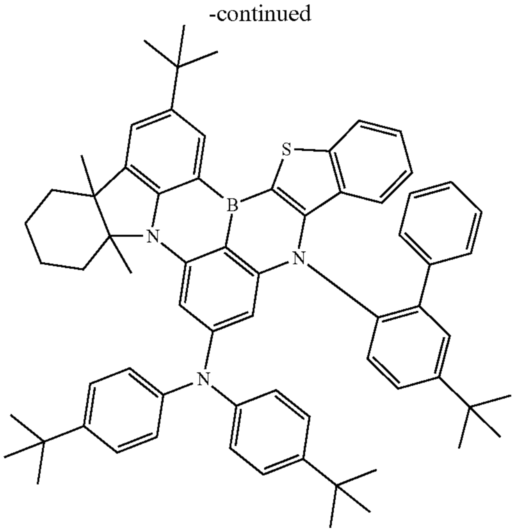
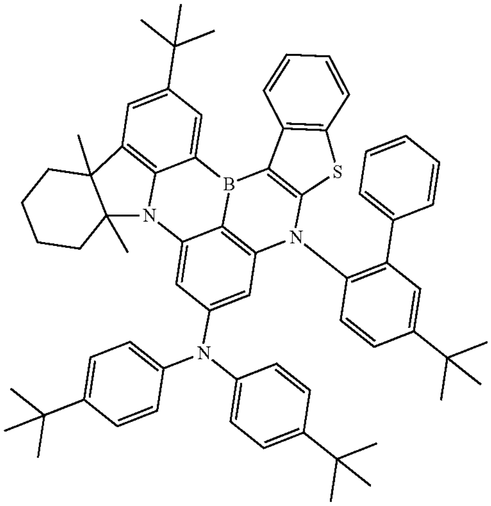
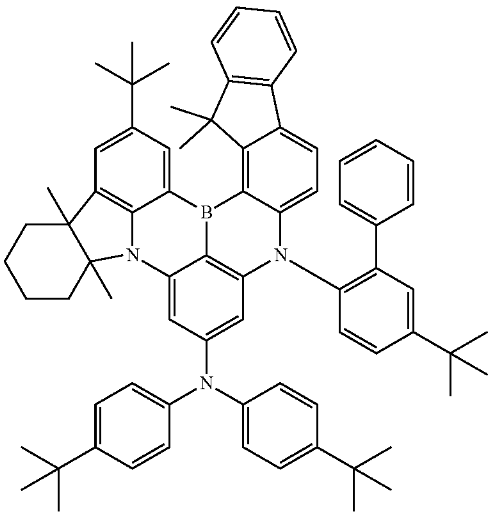
-continued
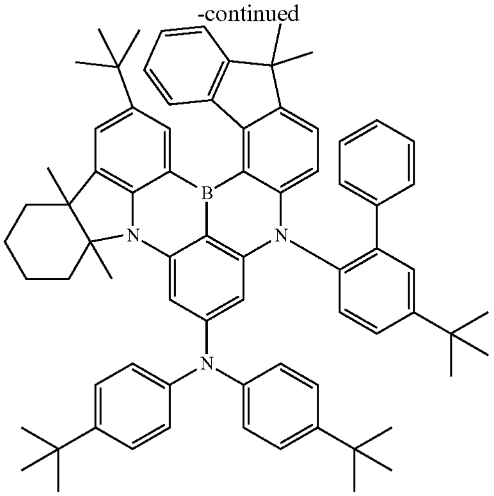
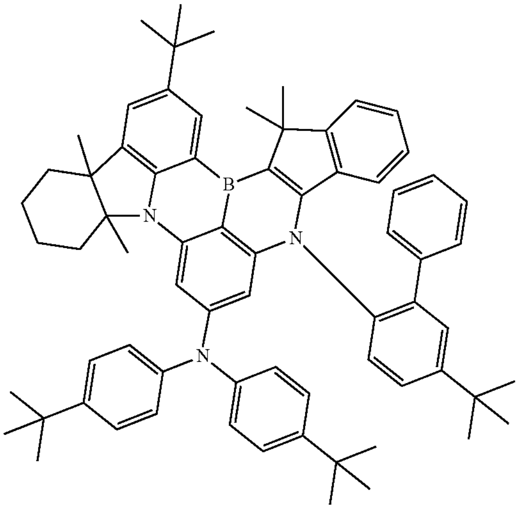
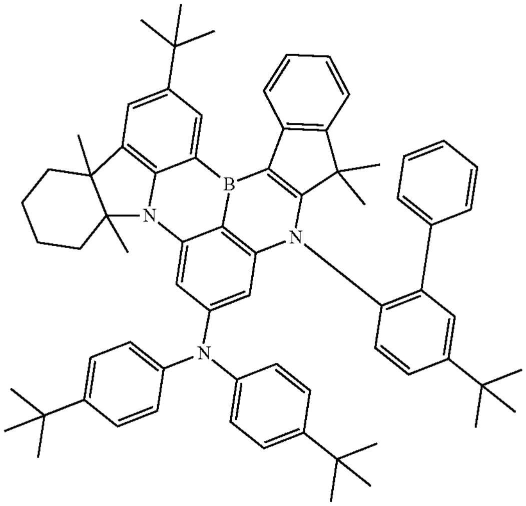

-continued
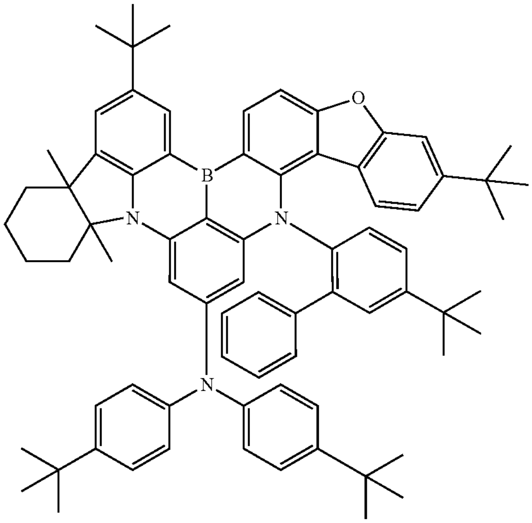
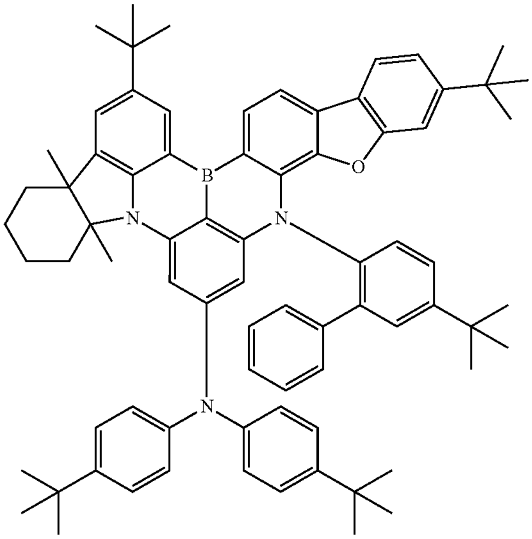
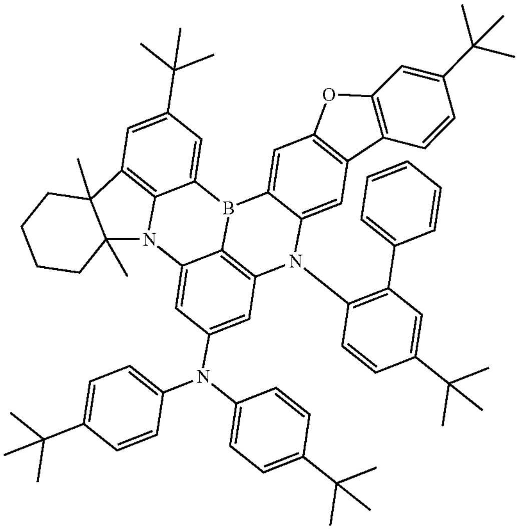
-continued
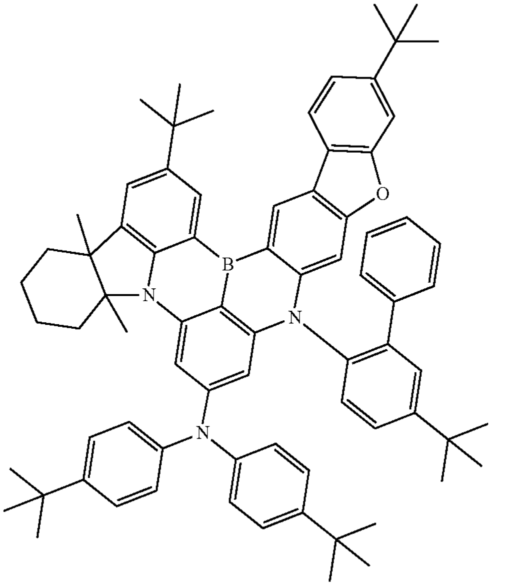
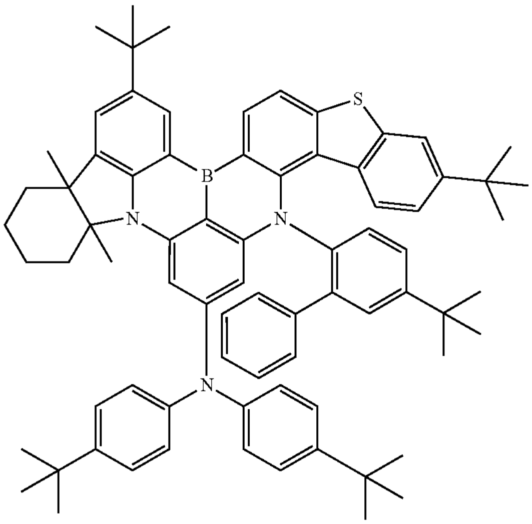
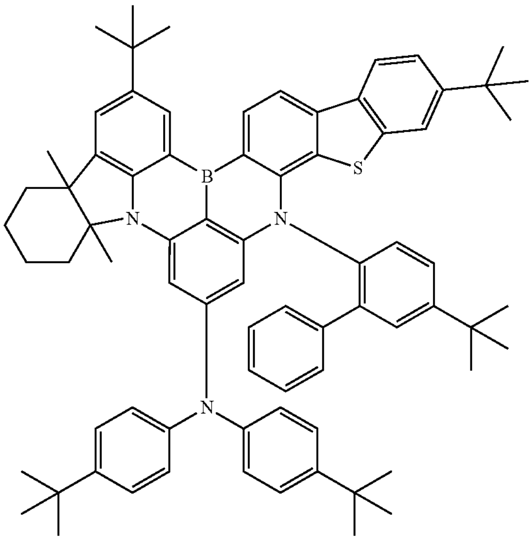

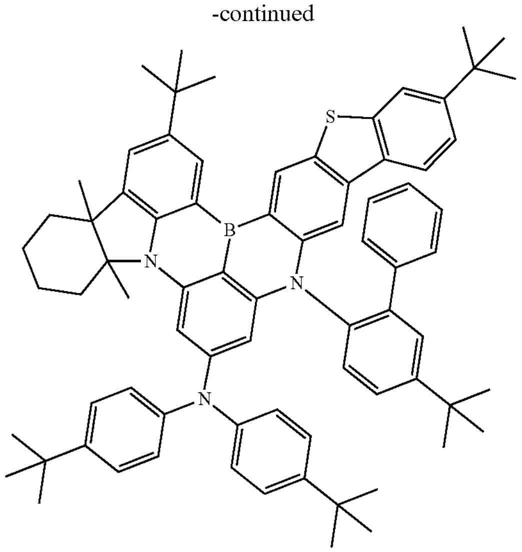
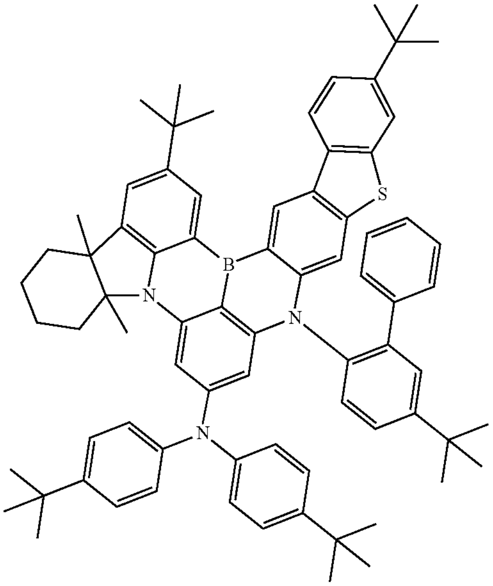
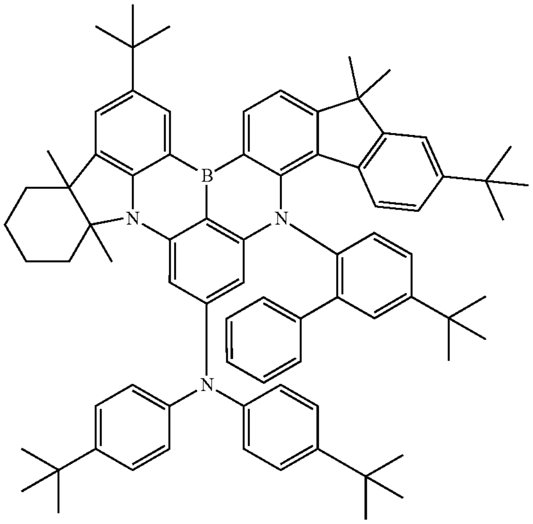
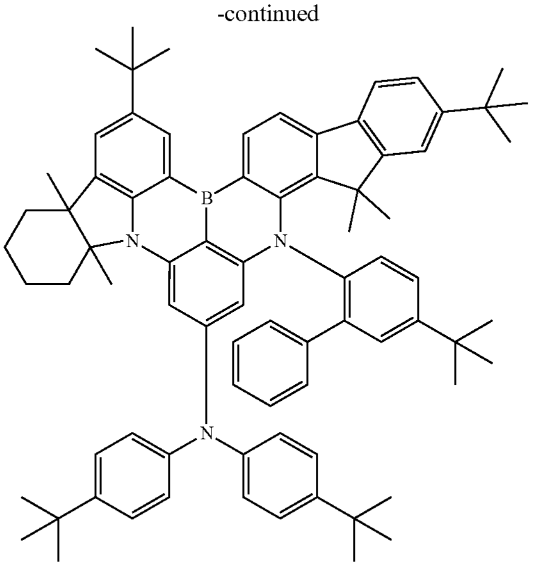
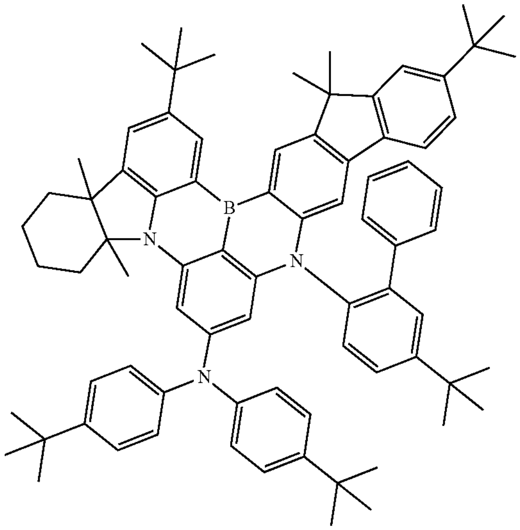
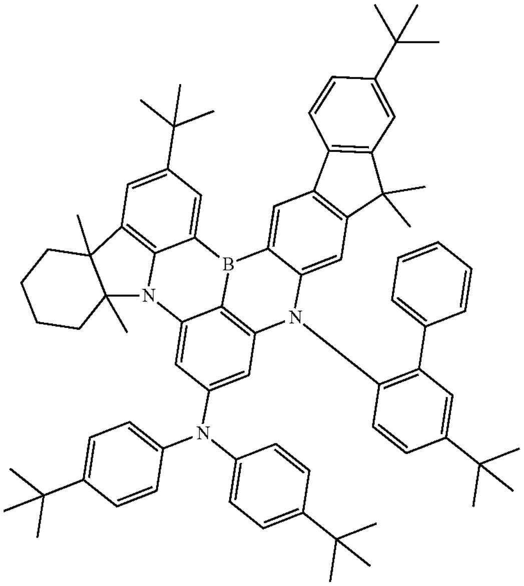

-continued
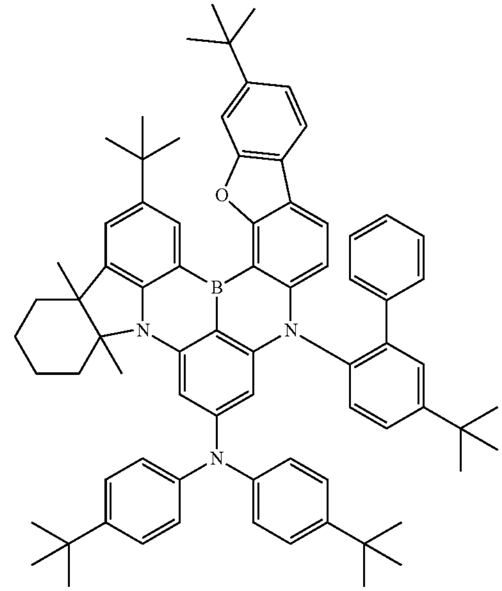
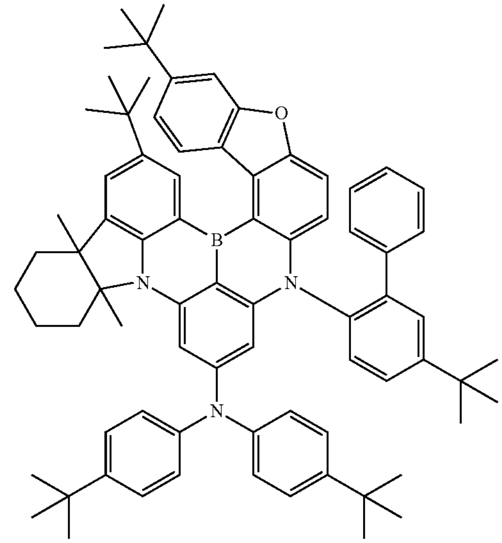
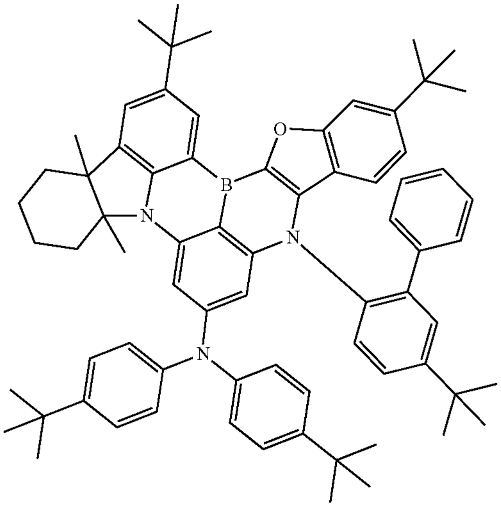
-continued
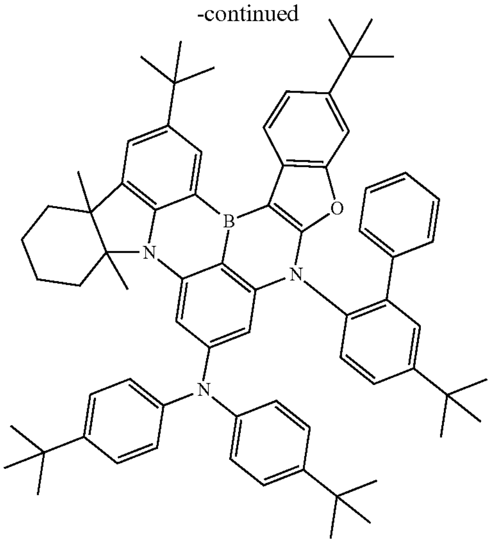
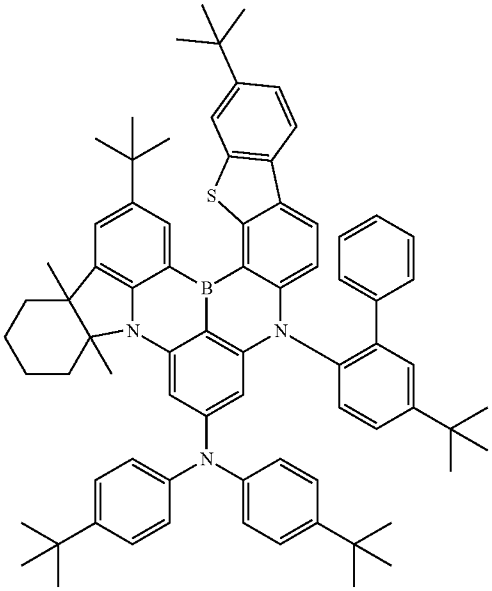
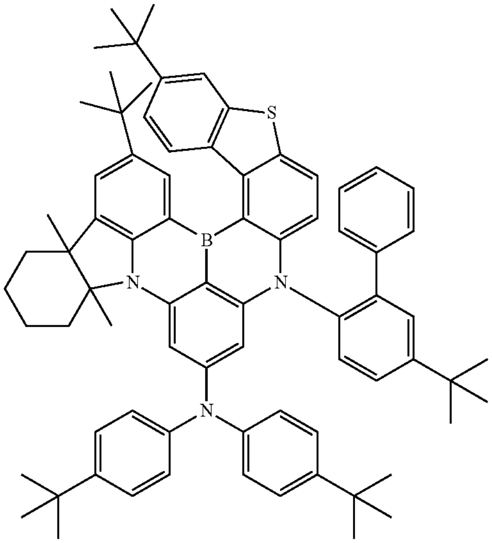

-continued
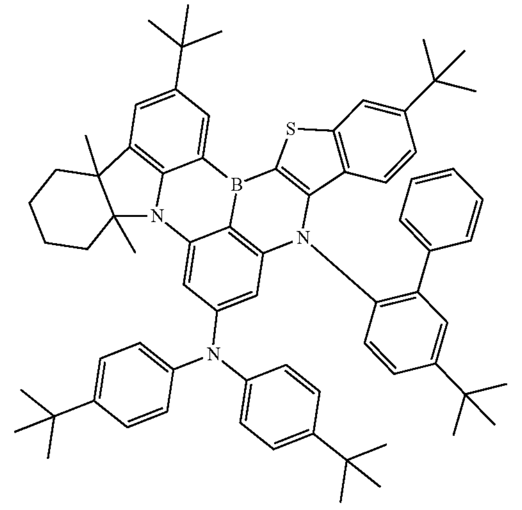
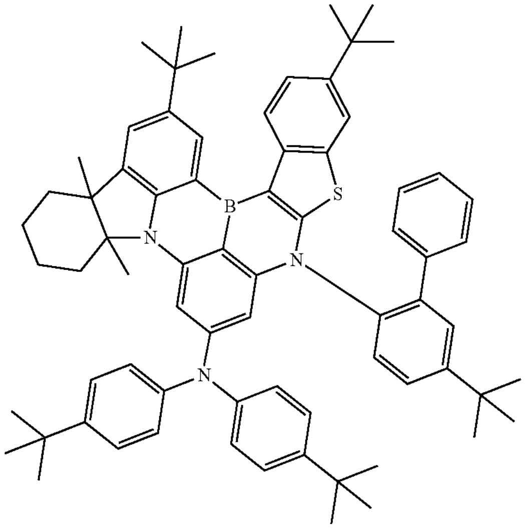
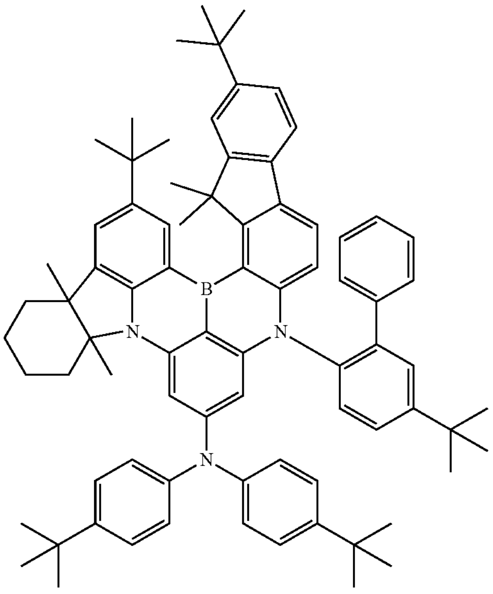
-continued
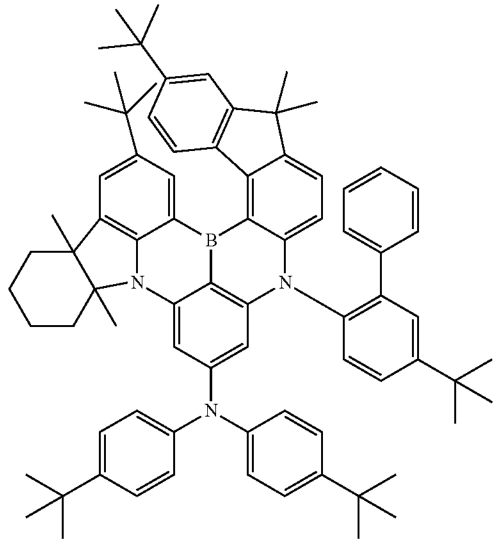
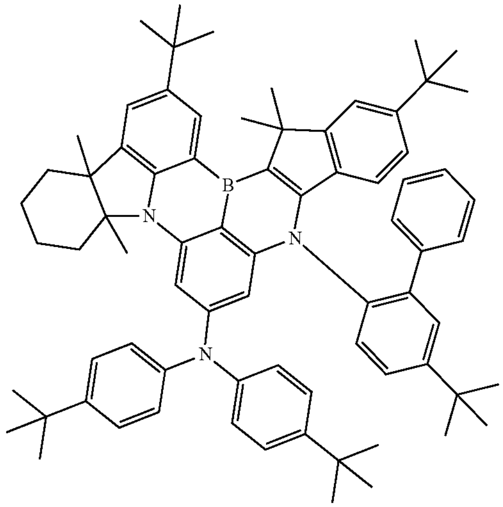
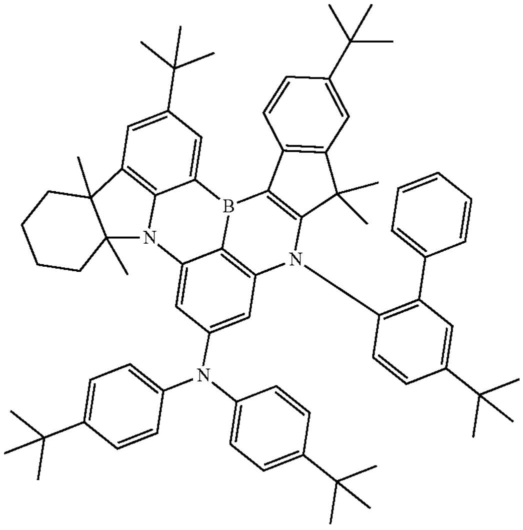

-continued
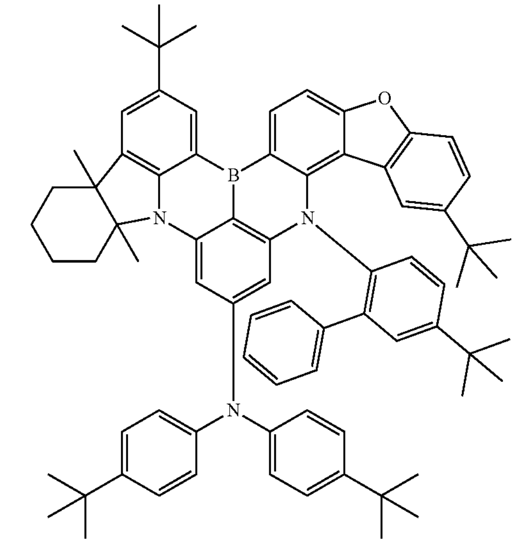
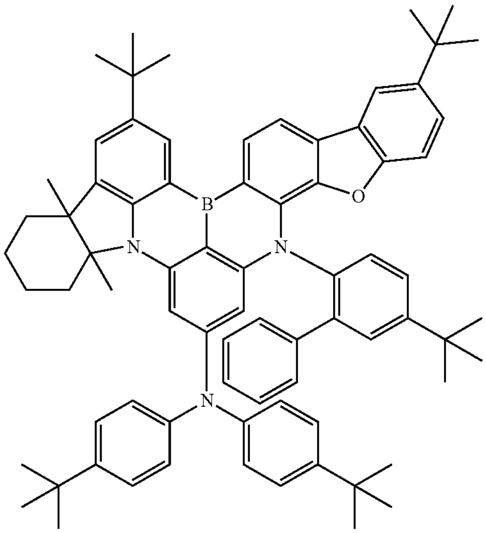
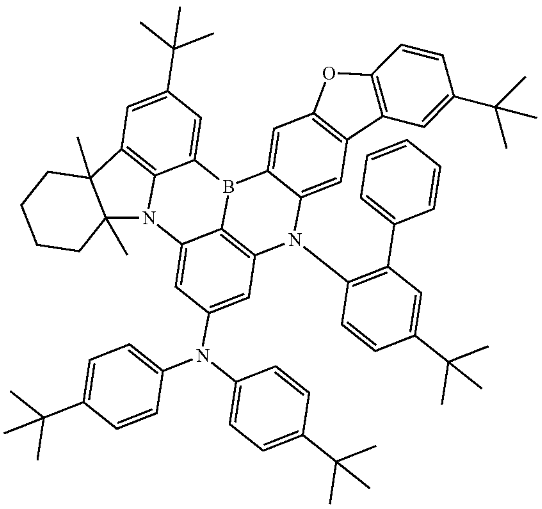
-continued
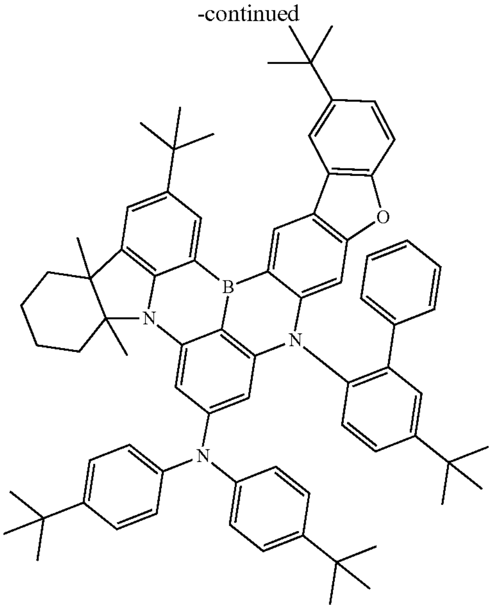
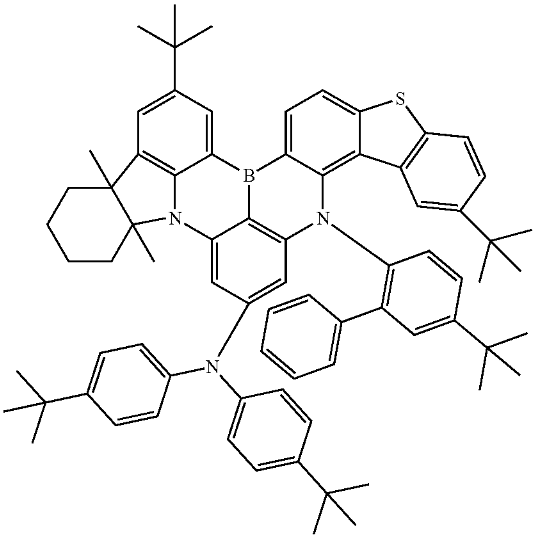
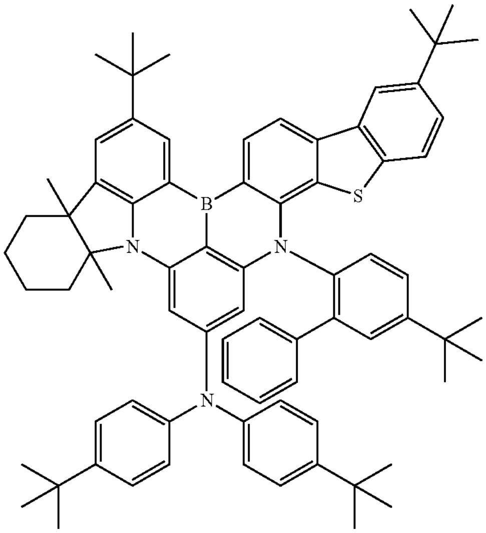

-continued
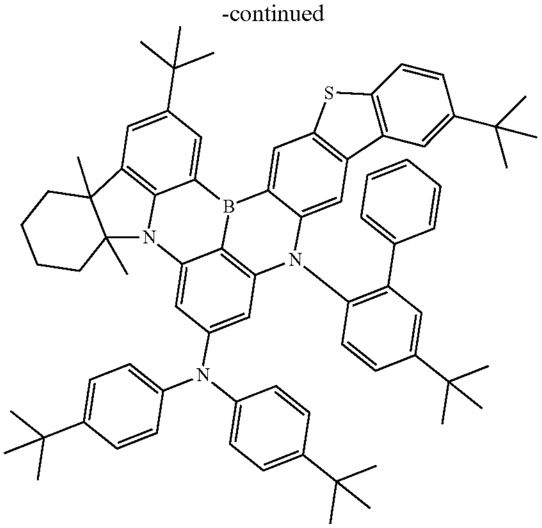
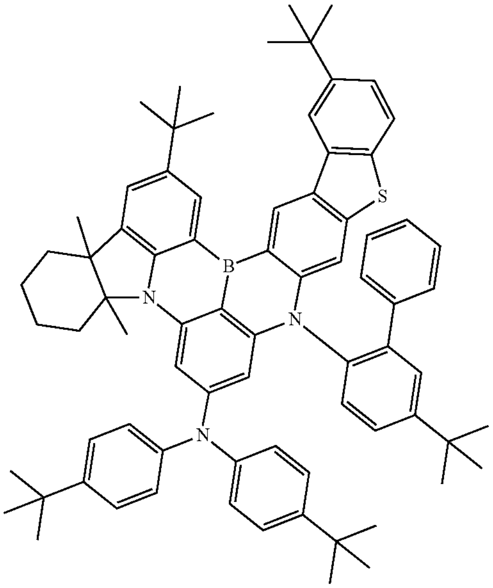
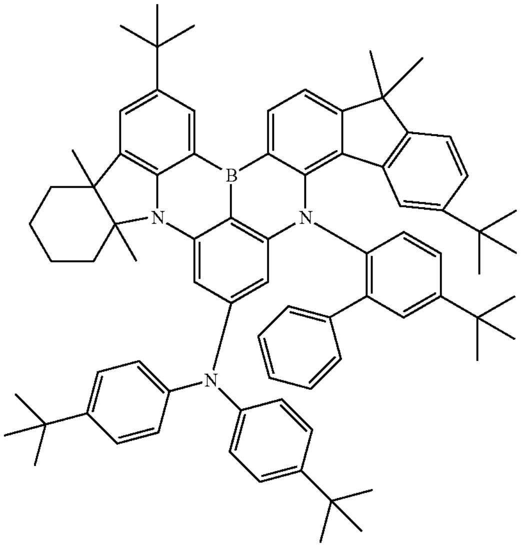
-continued
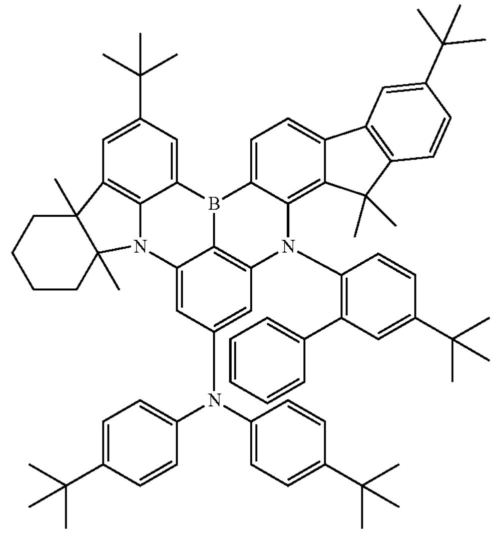
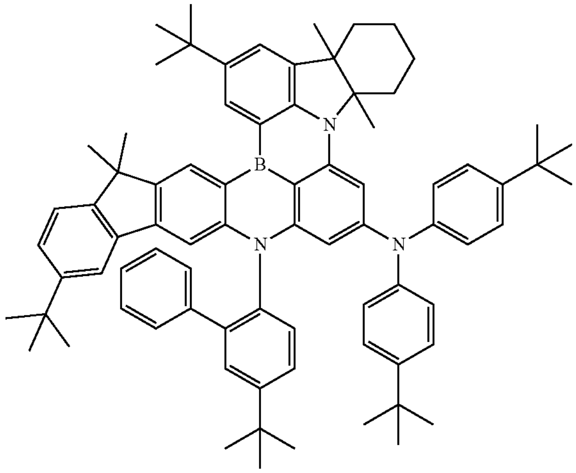
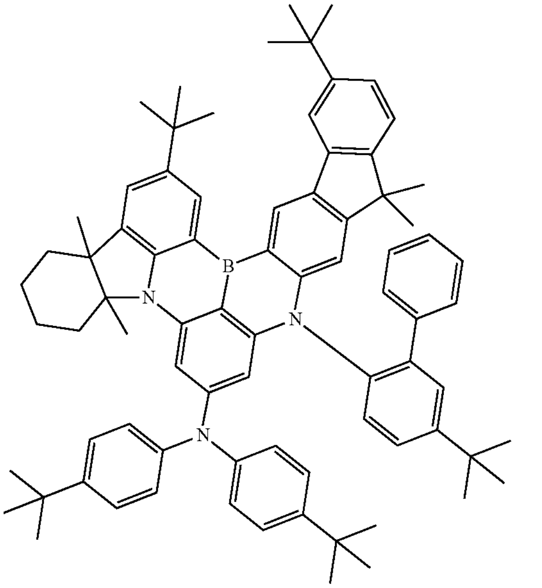

-continued
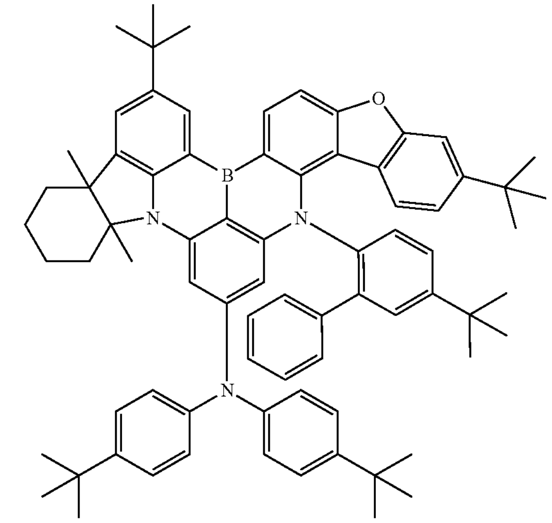
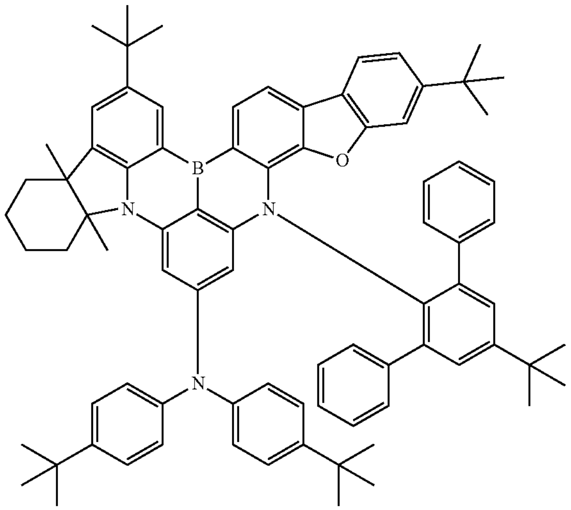
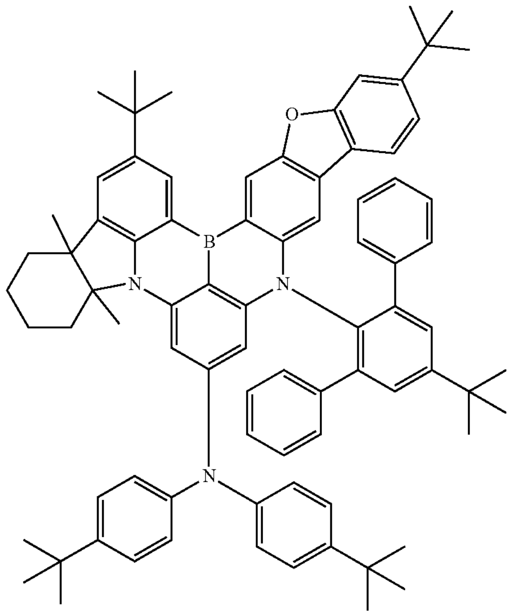
-continued
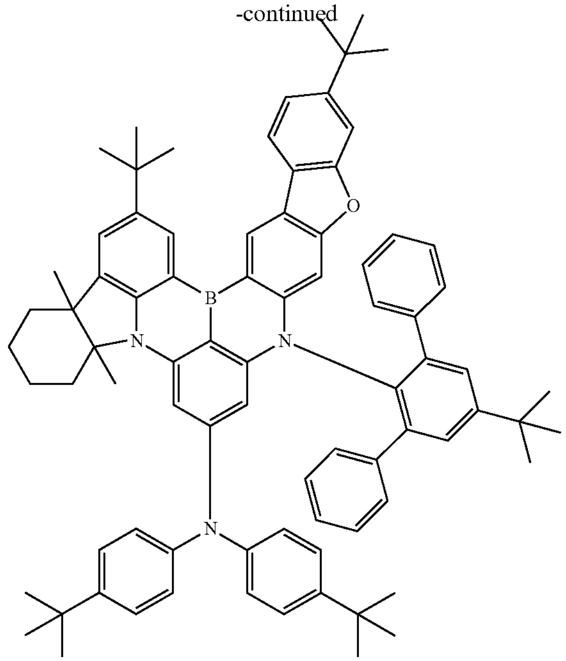
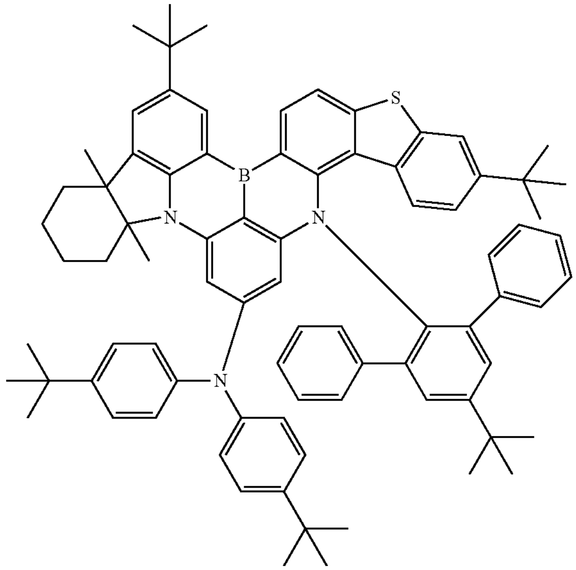

-continued
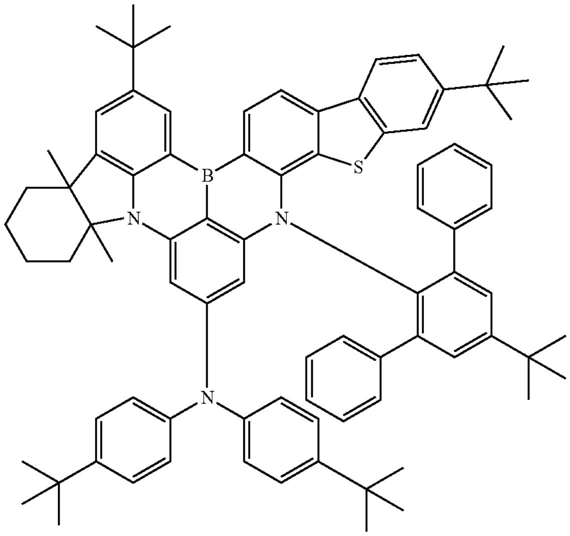
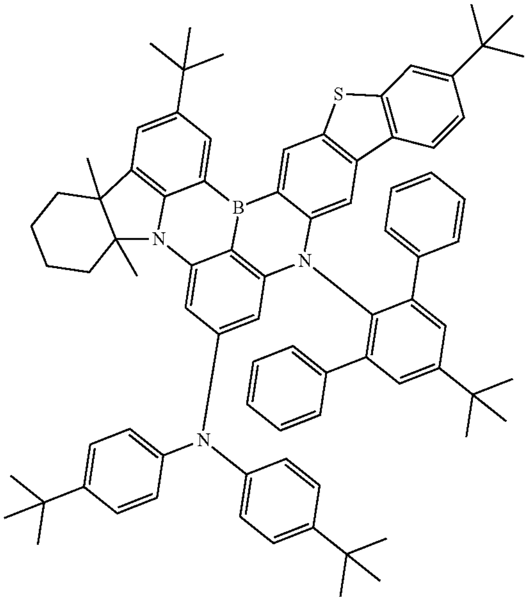
-continued
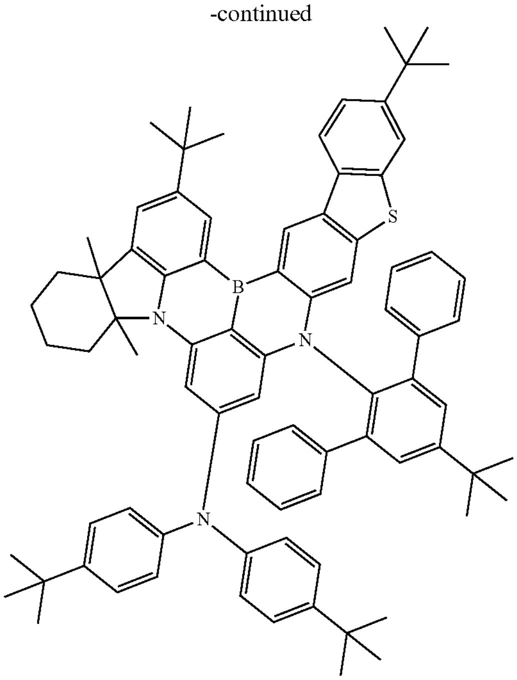
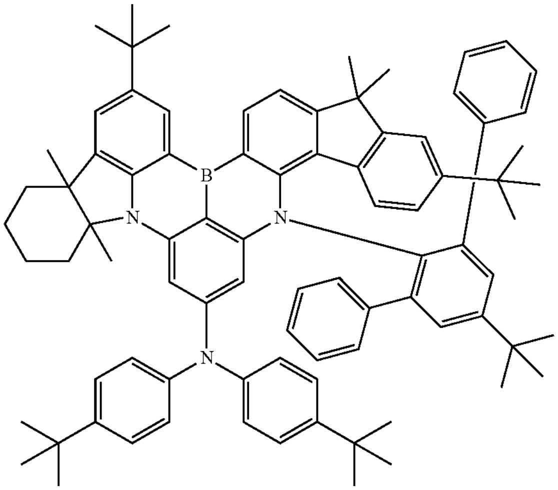
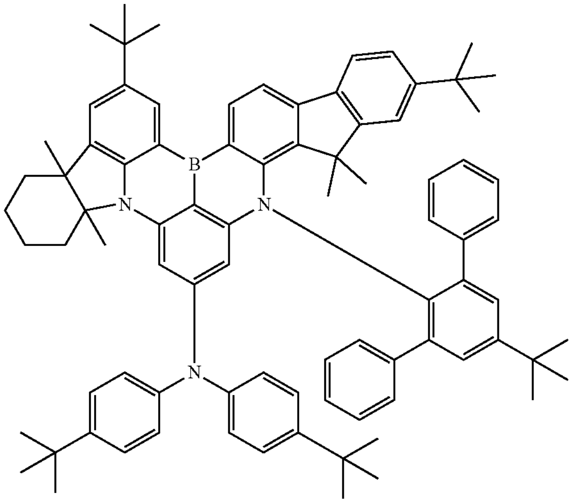

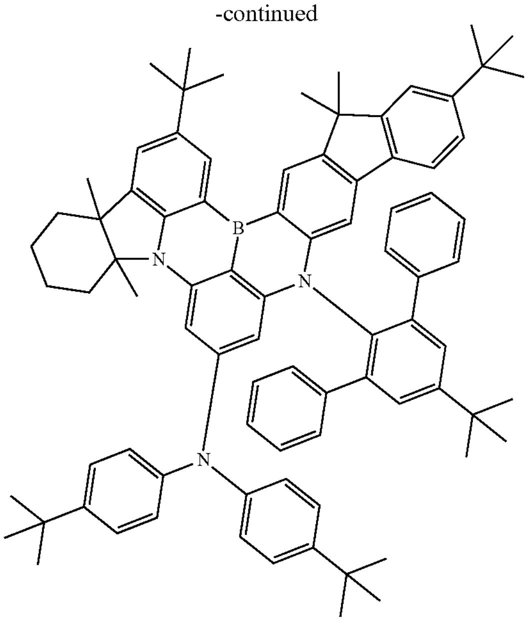
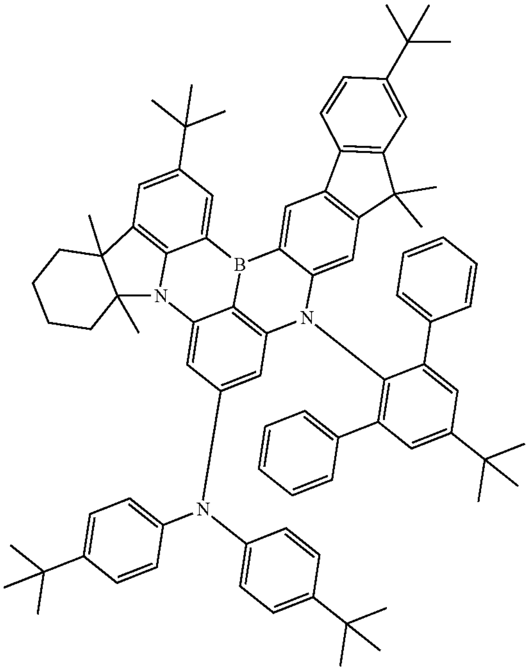
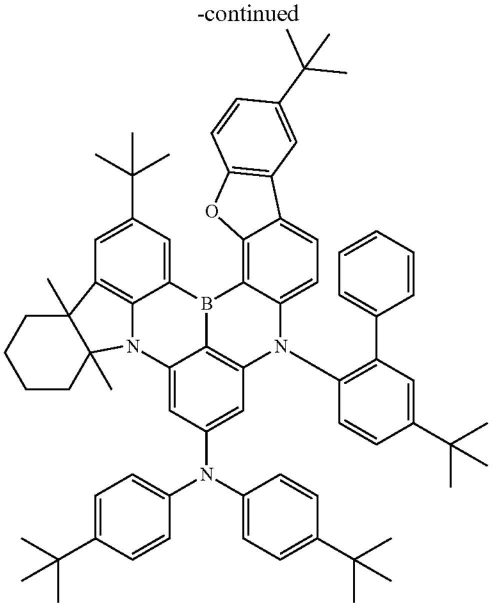
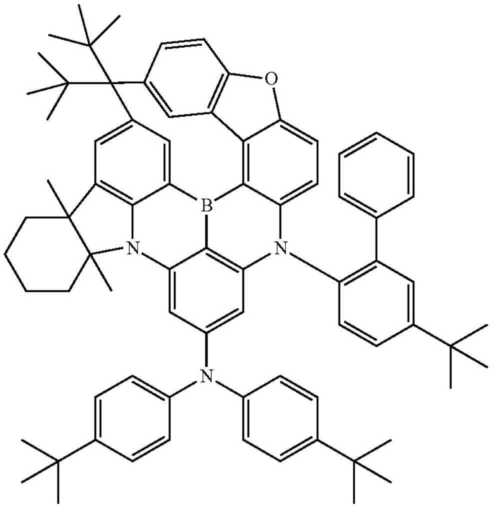
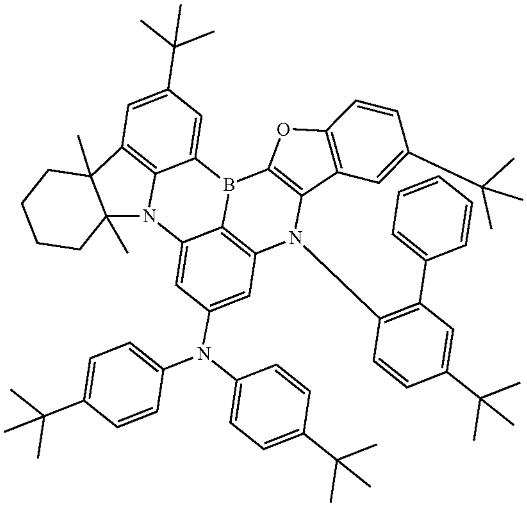

-continued
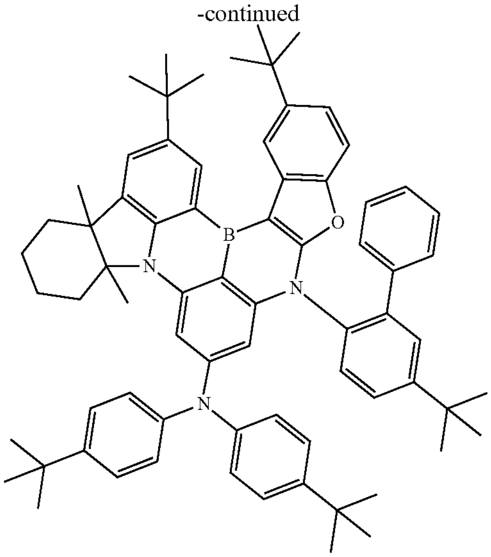
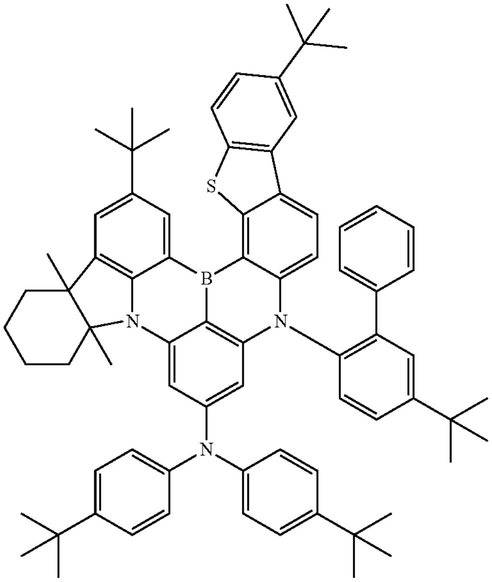
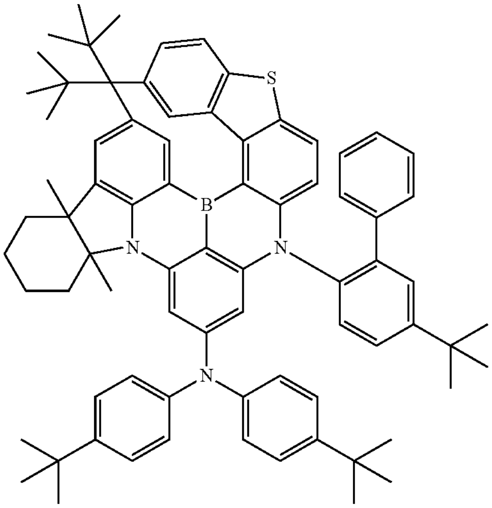
-continued
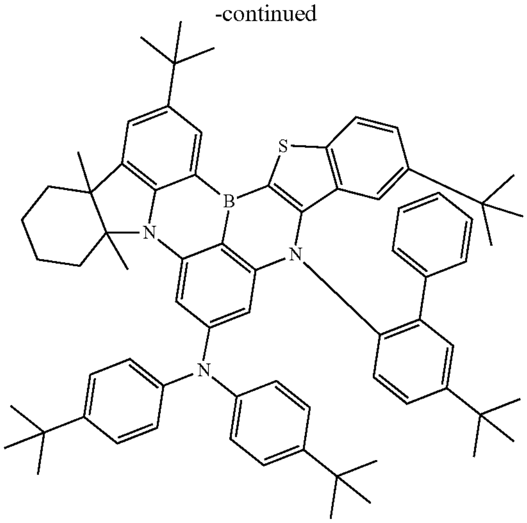
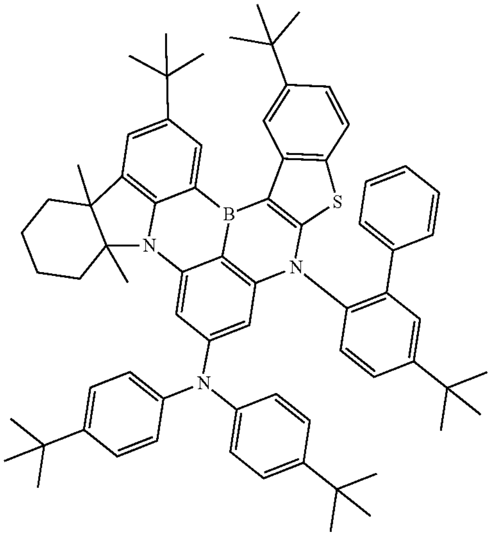
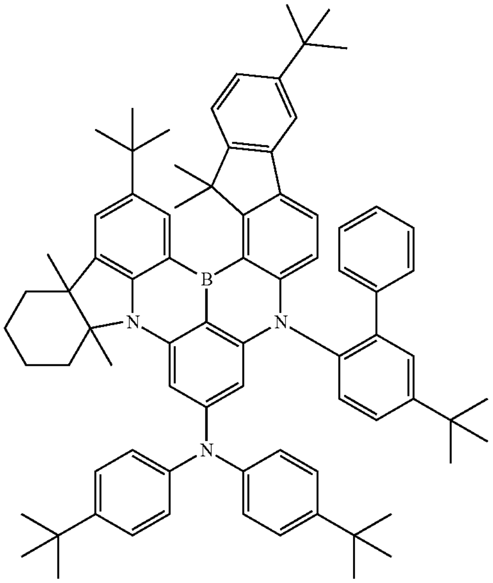

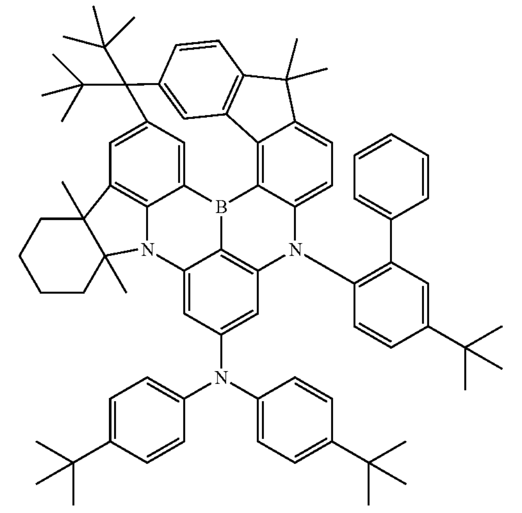
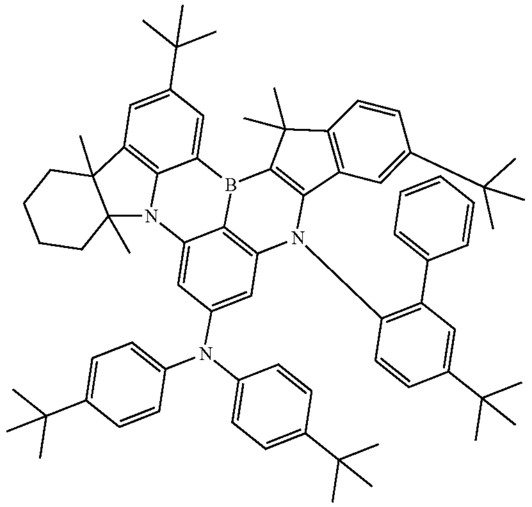
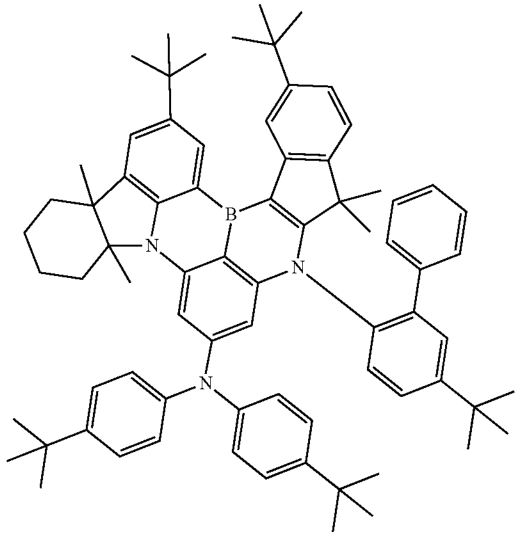
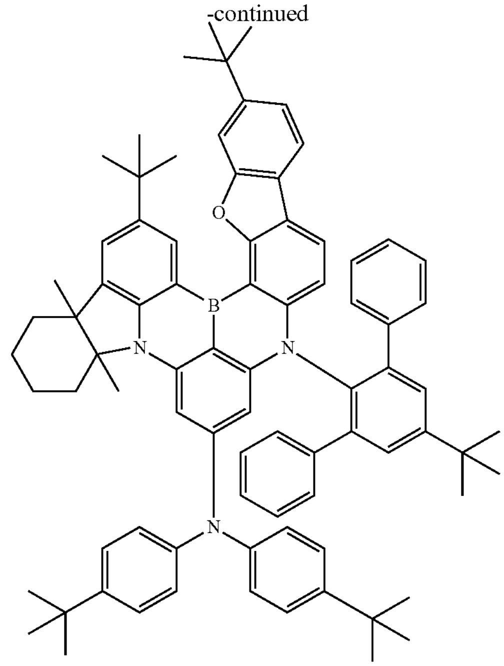
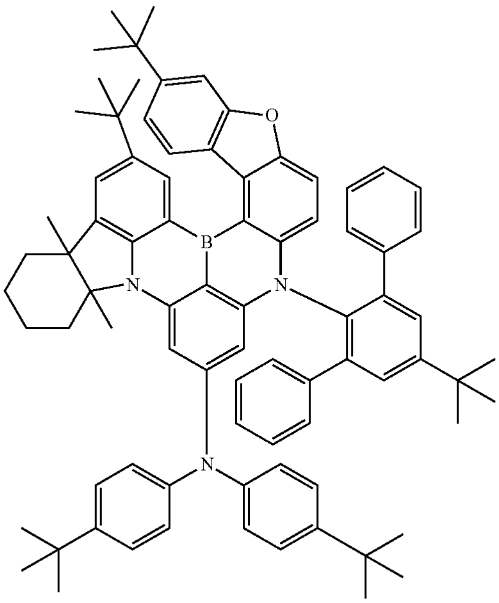

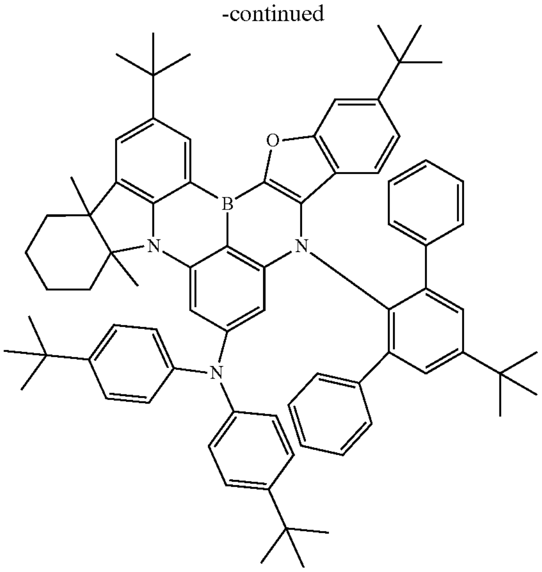
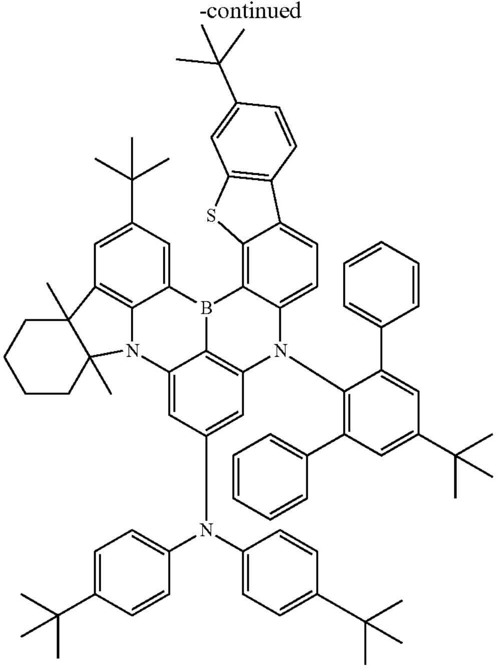
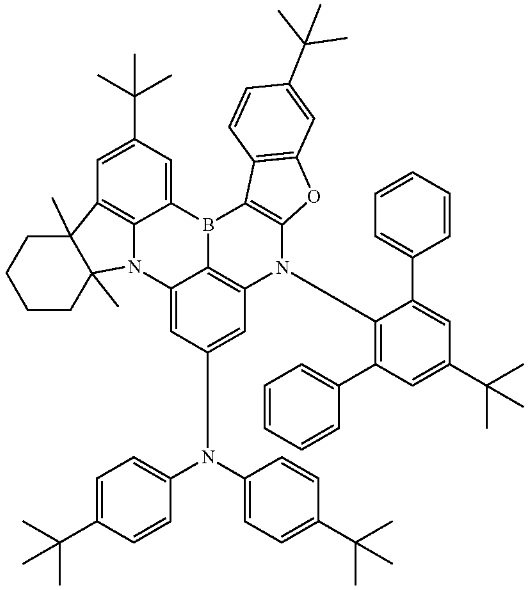
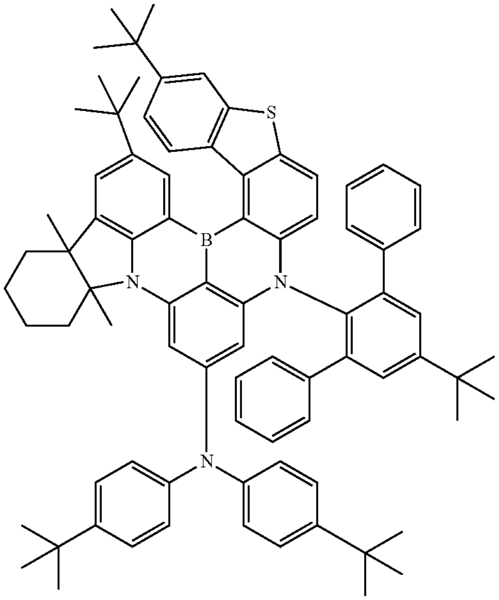

-continued
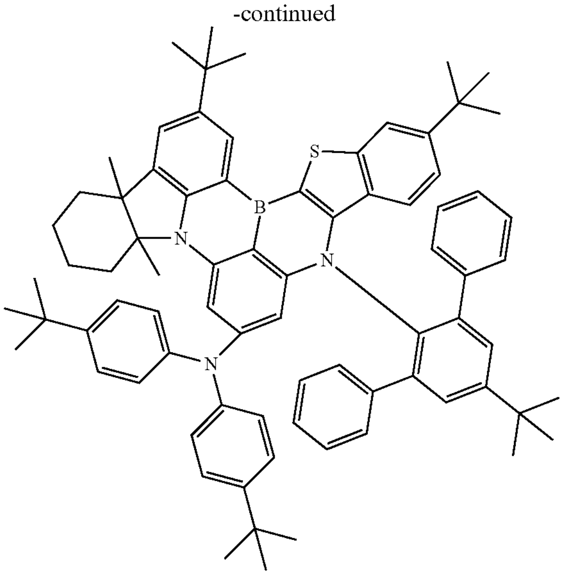
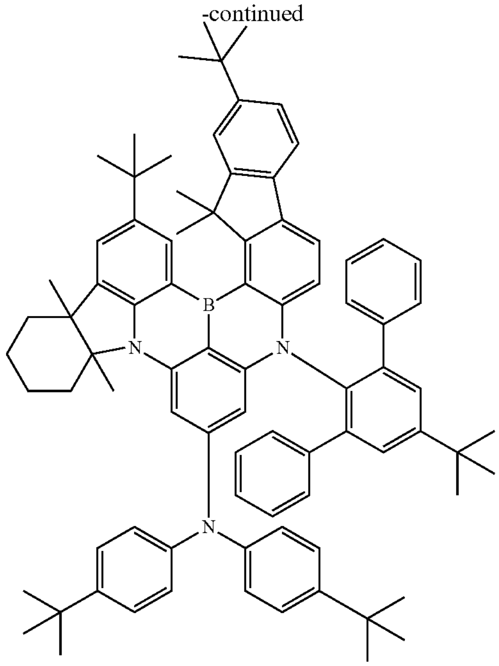
-continued
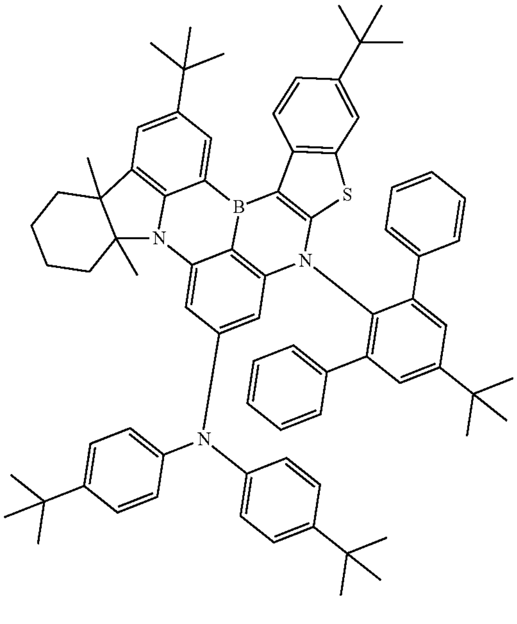
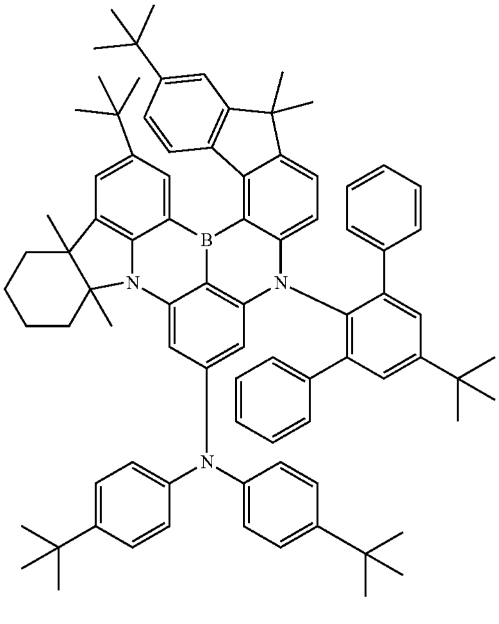

-continued
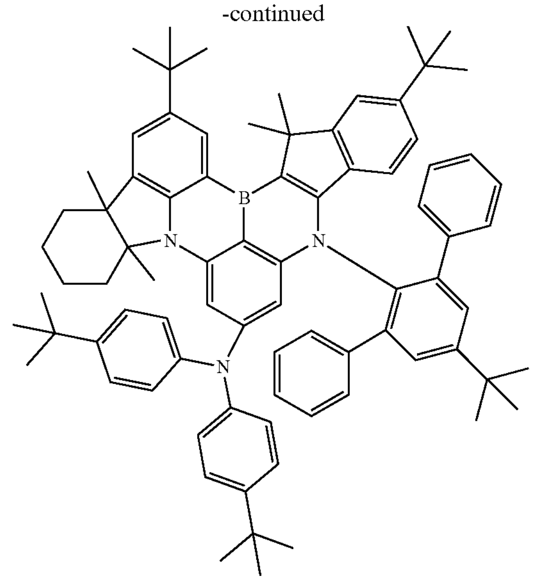
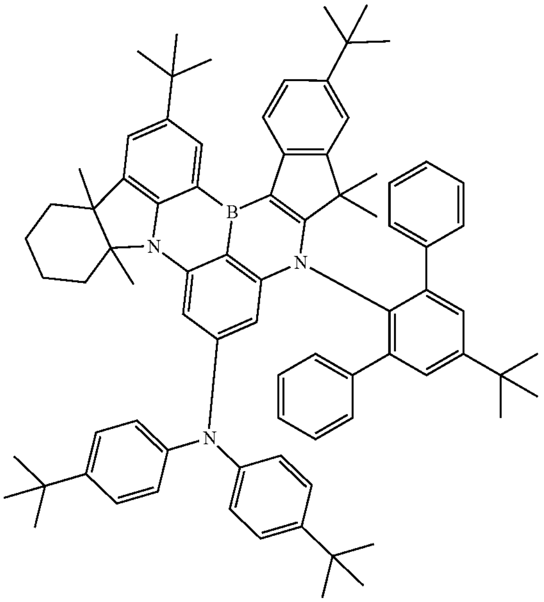
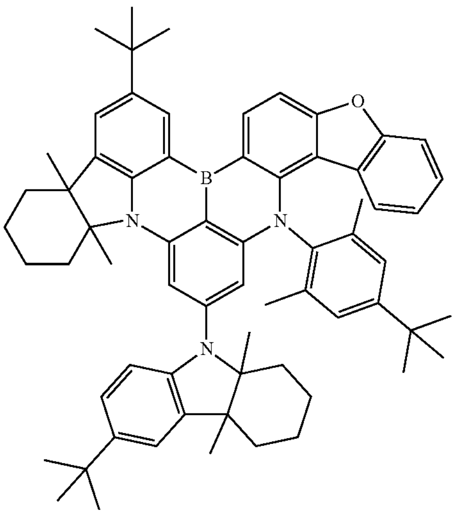
-continued
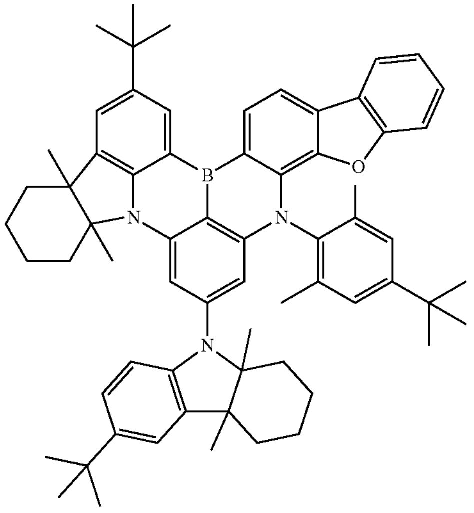
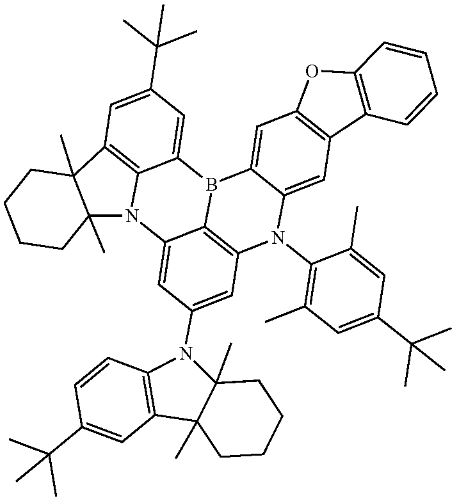
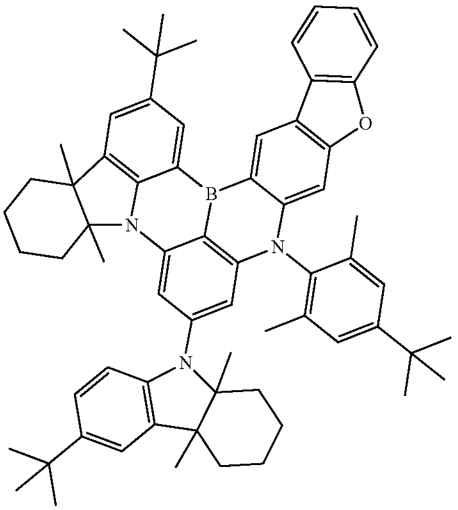

-continued
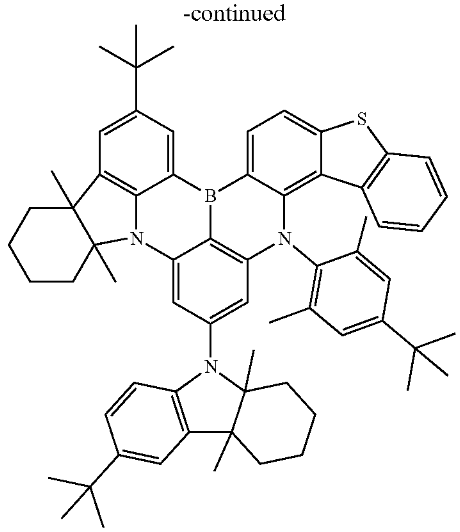
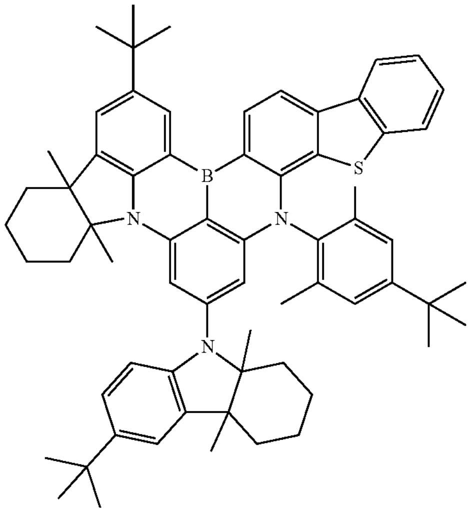
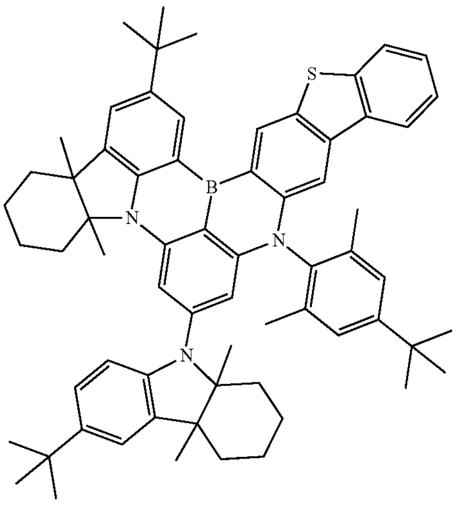
-continued
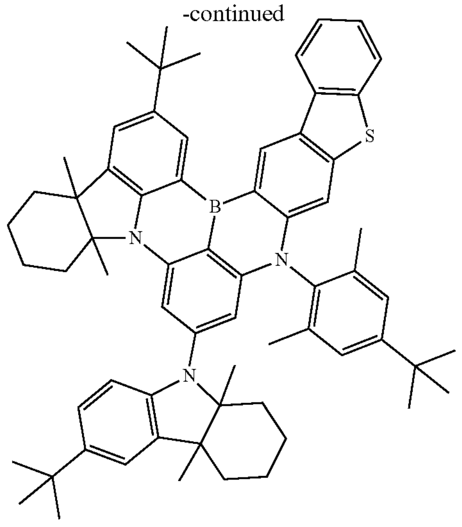
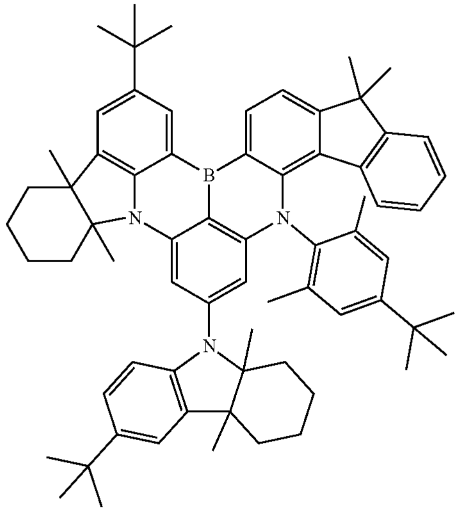
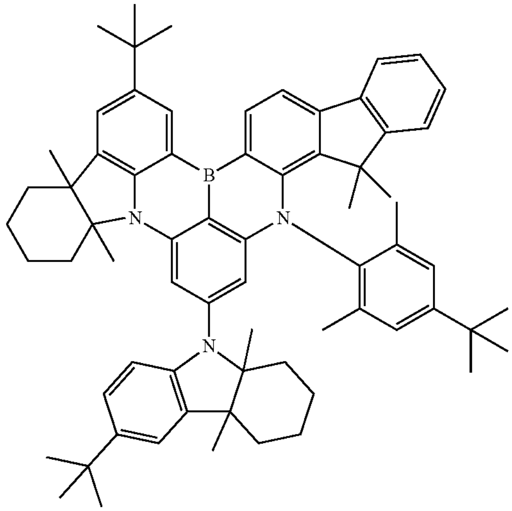

-continued
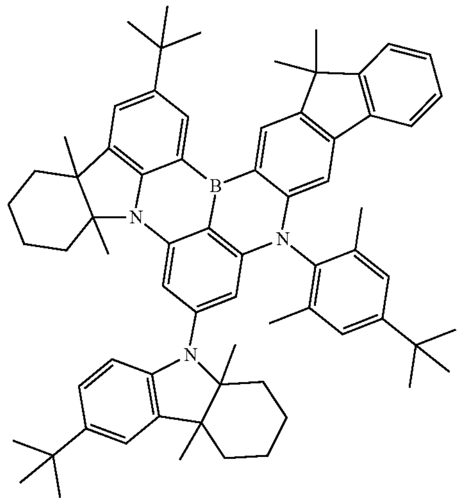
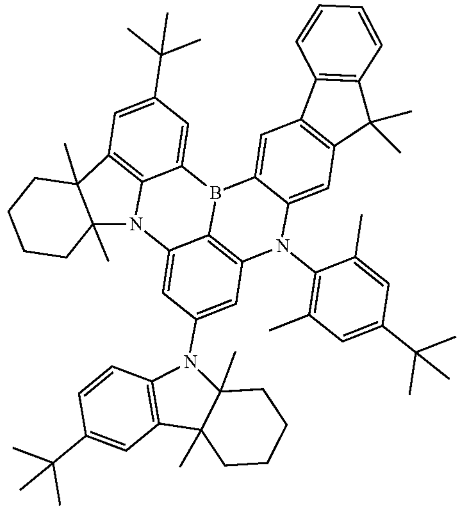
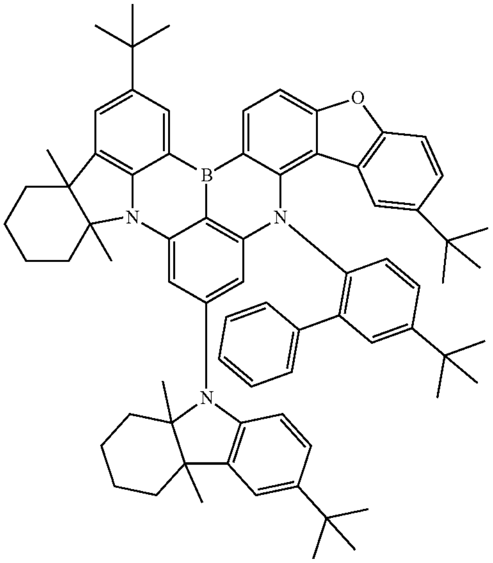
-continued
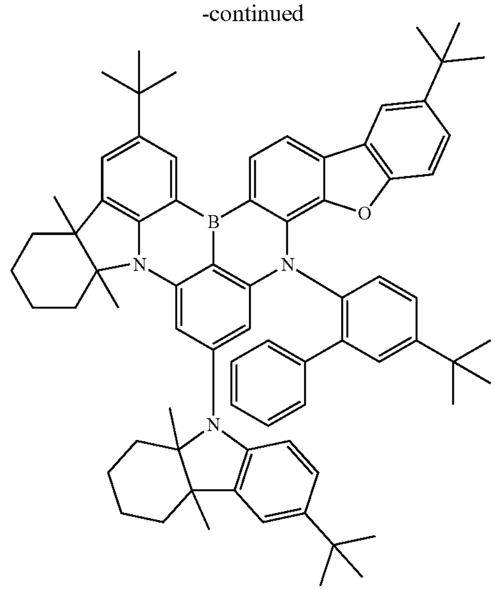
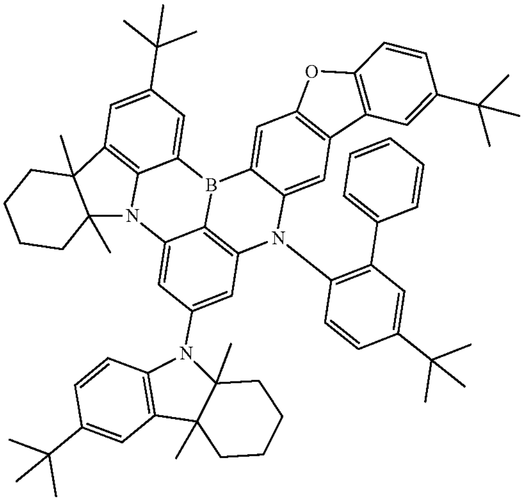
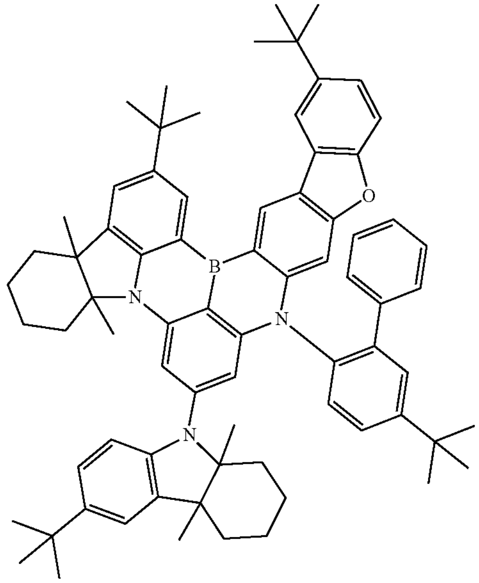

-continued
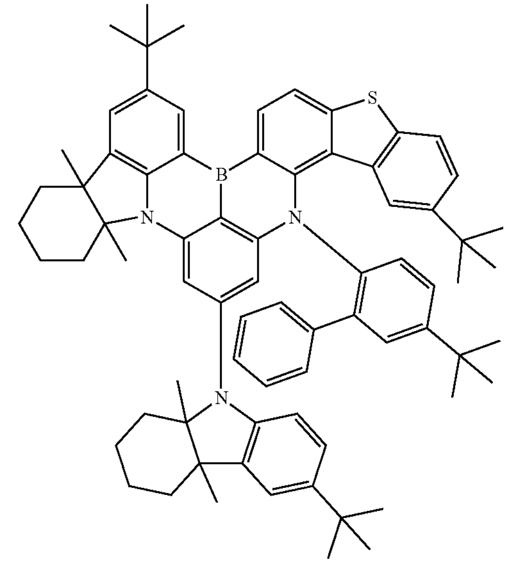
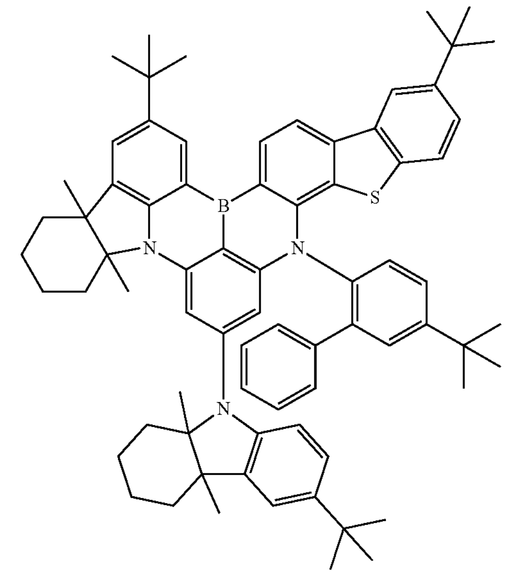
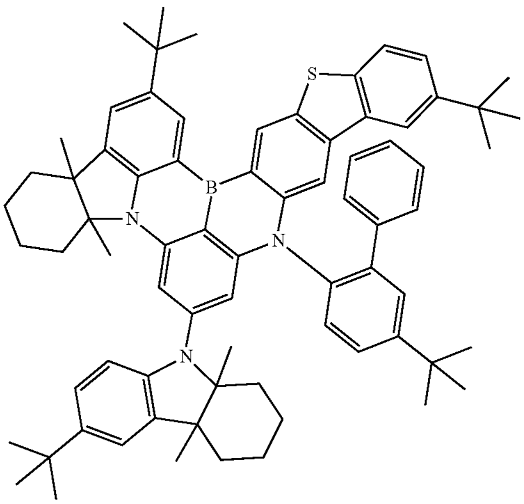
-continued
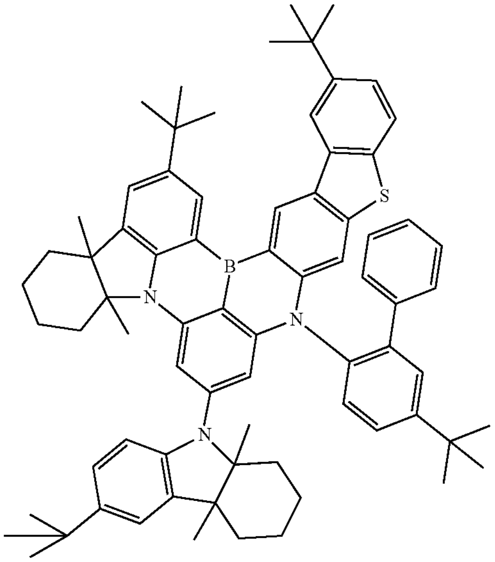
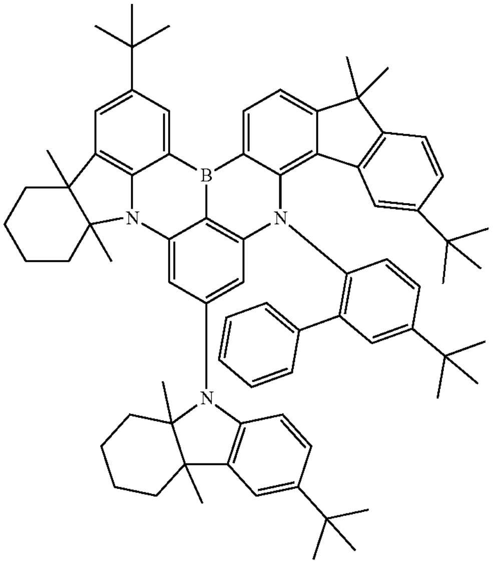
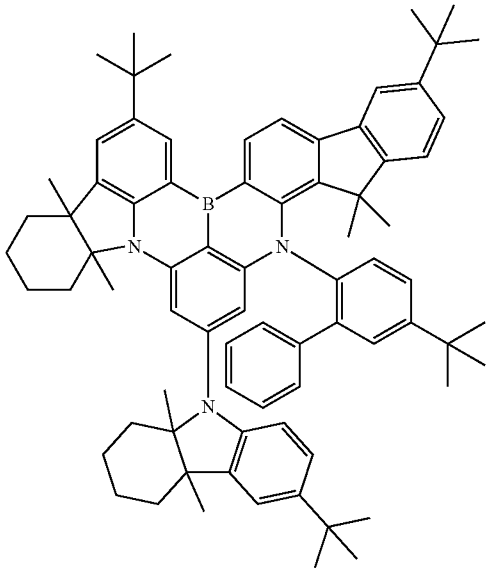

-continued
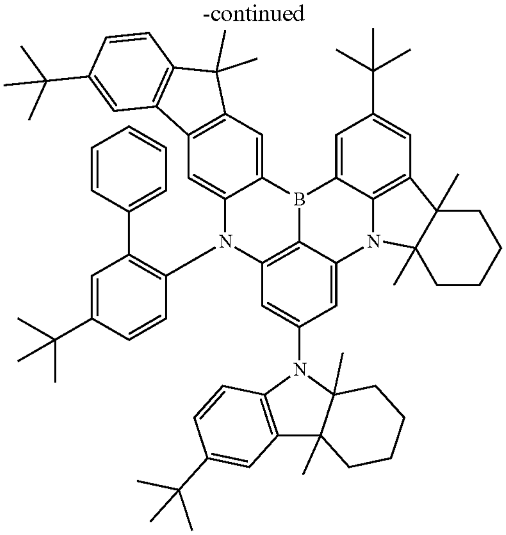
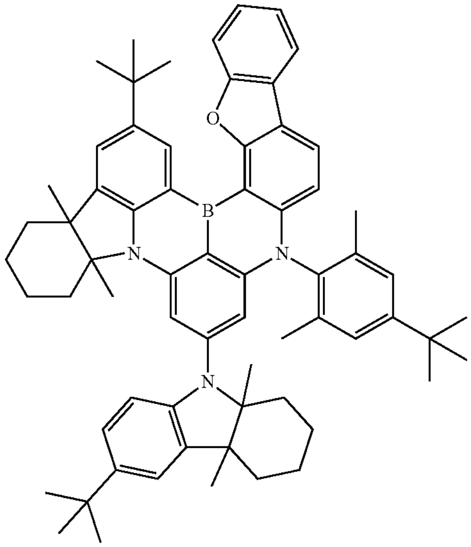
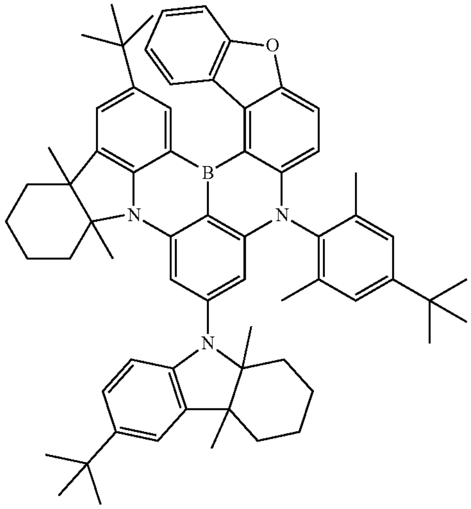
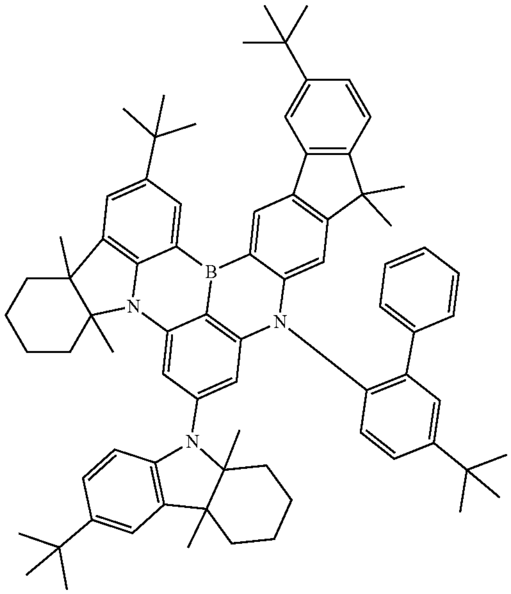
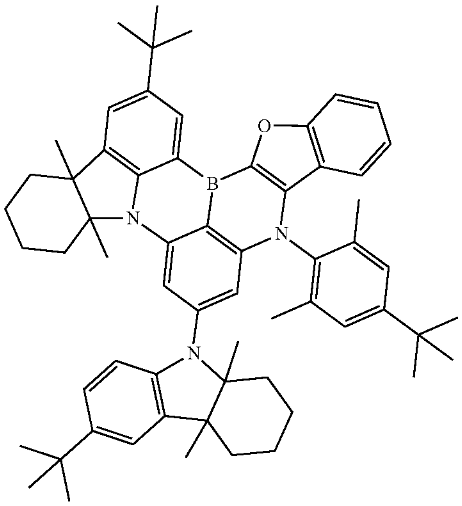

-continued
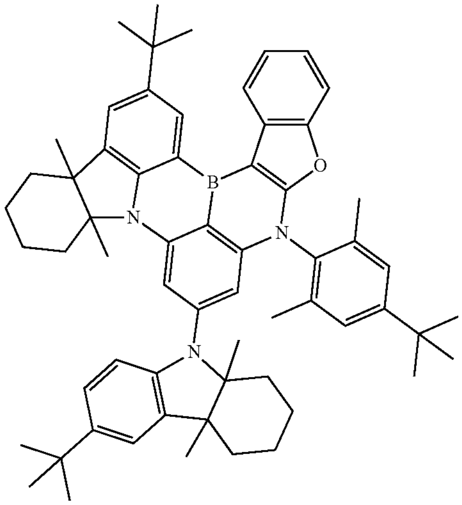
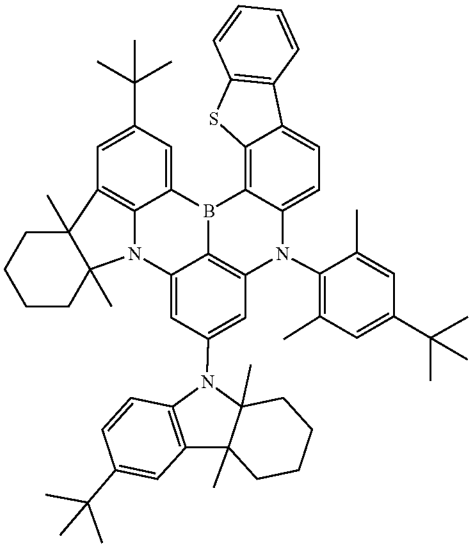
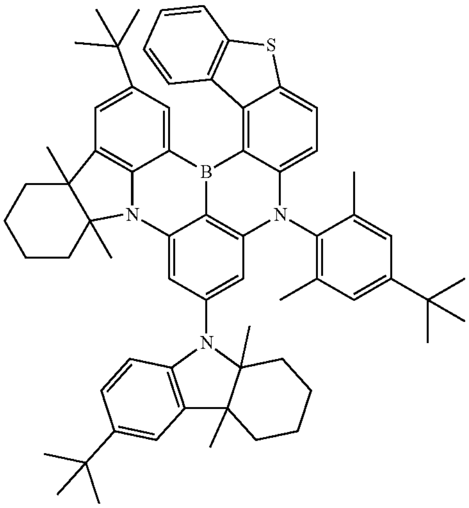
-continued
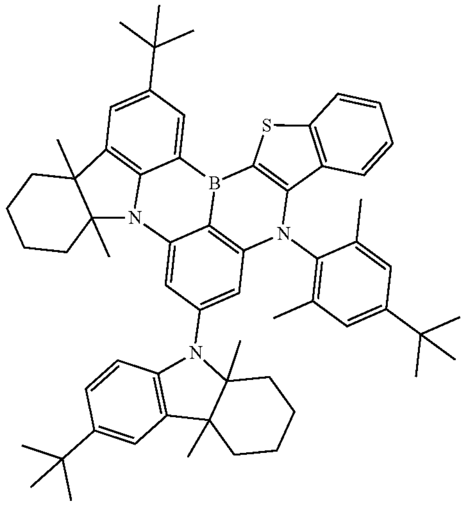
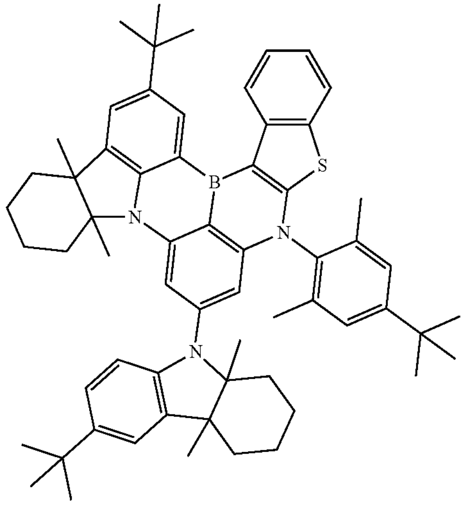
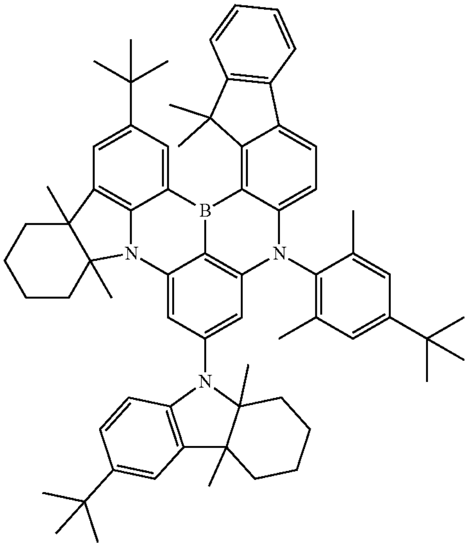

-continued
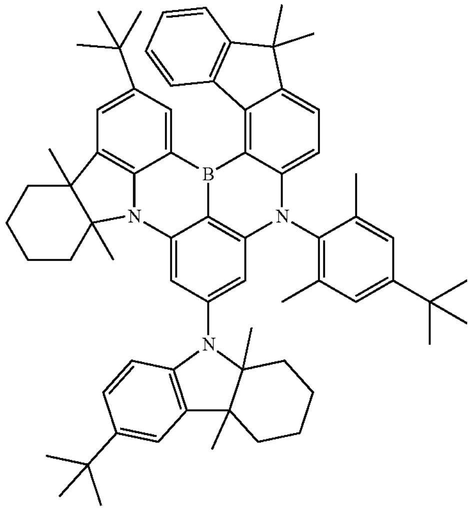
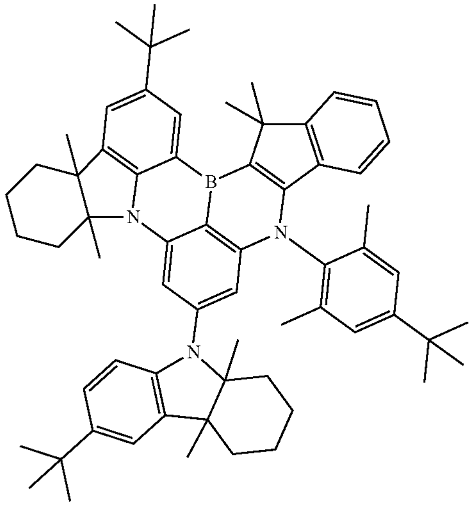
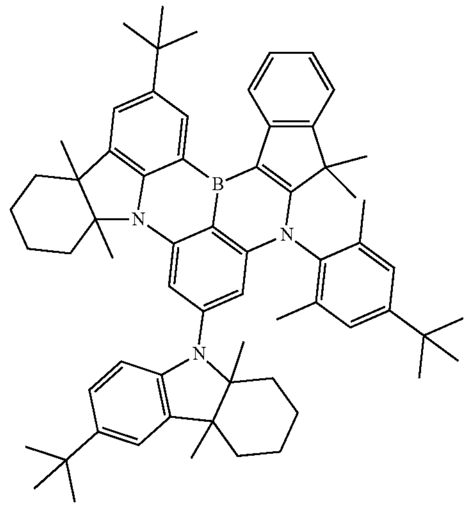
-continued
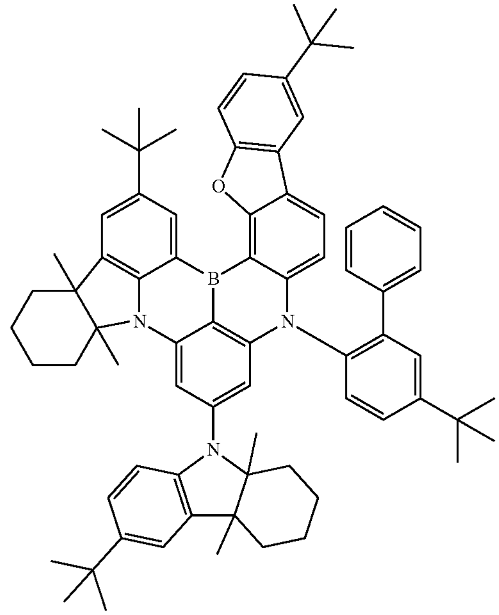
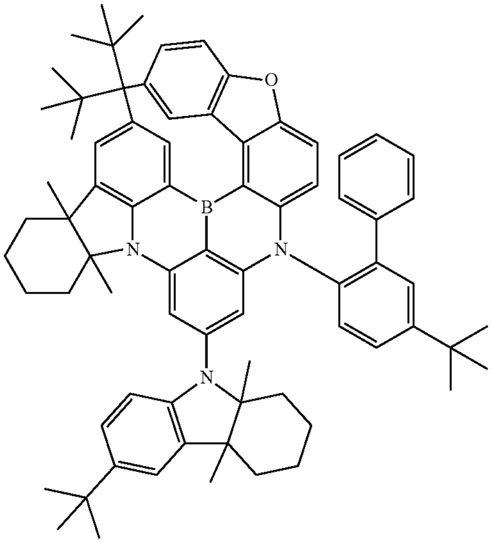
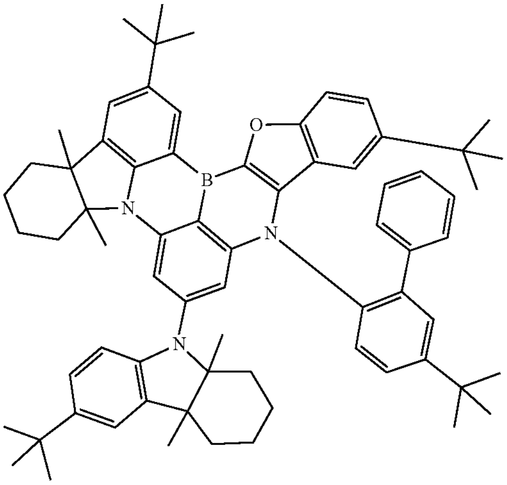

-continued
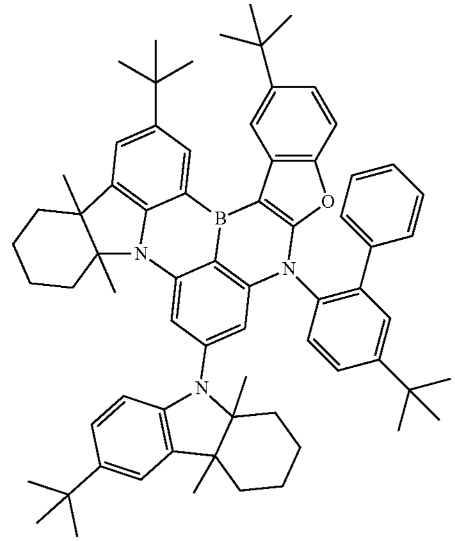
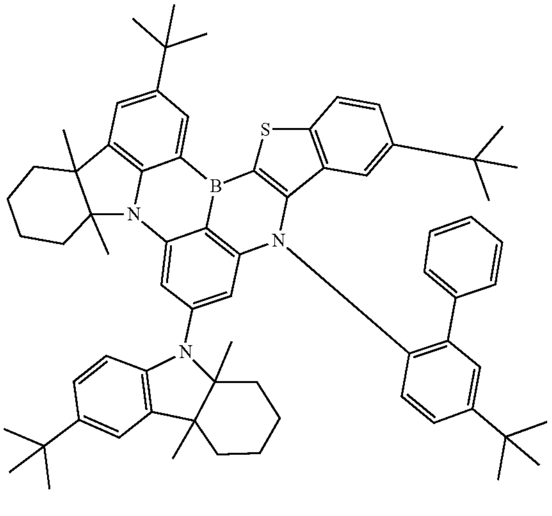
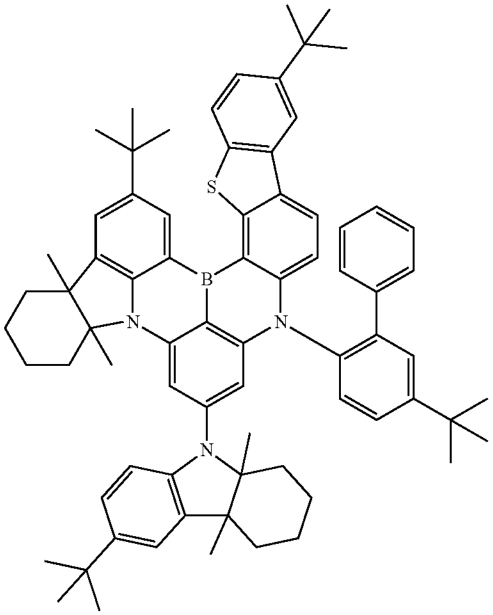
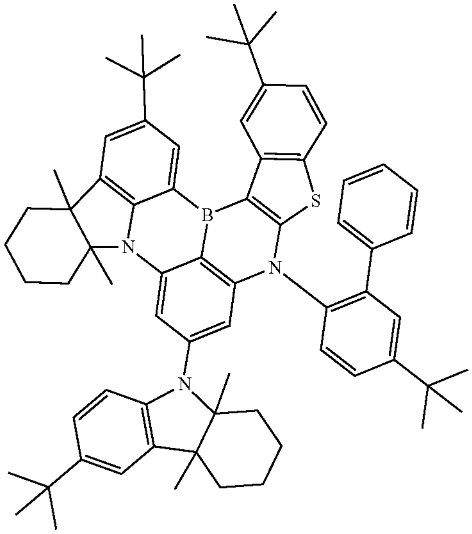
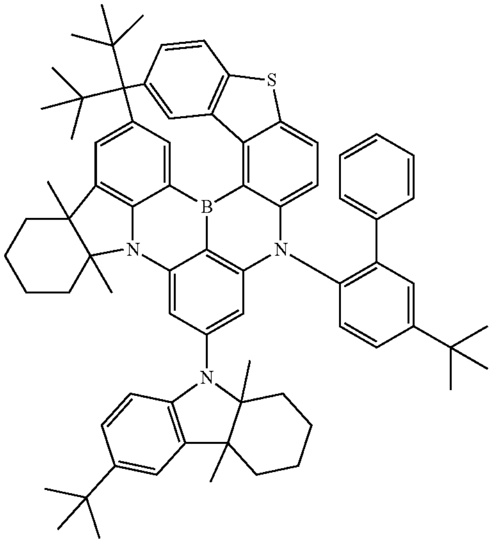
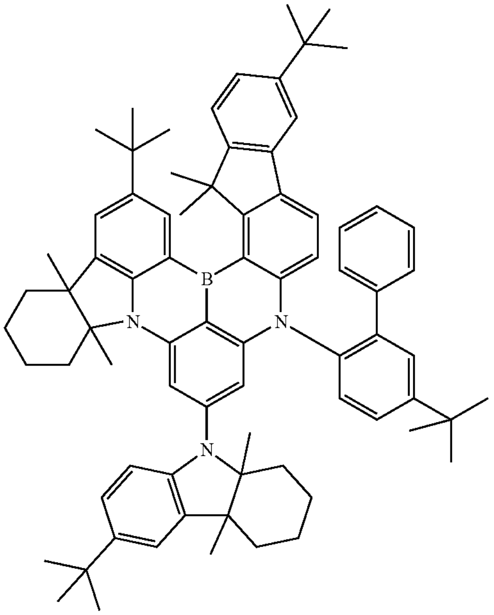
-continued -continued
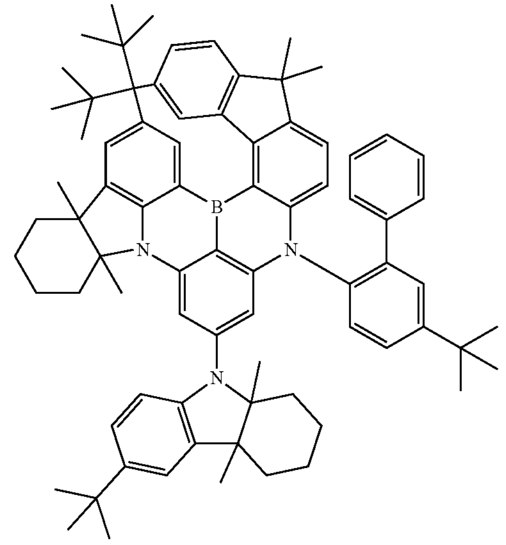
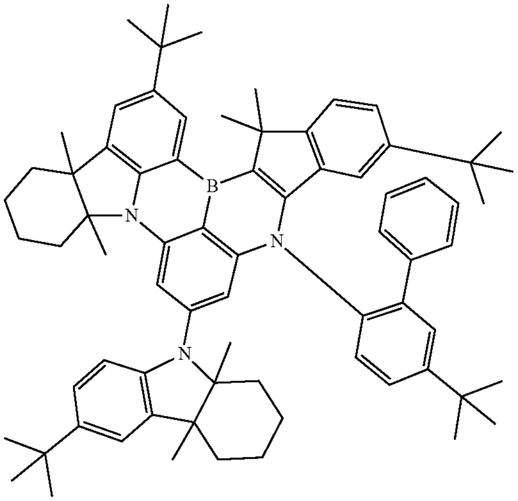
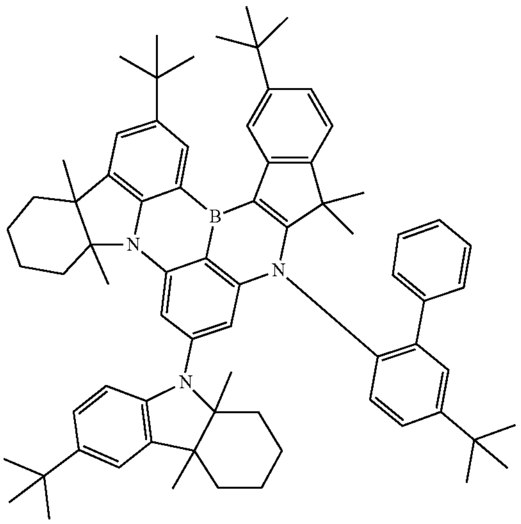
-continued
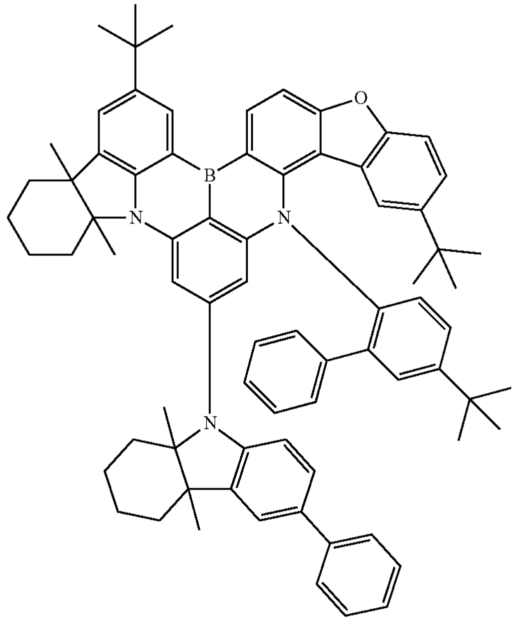
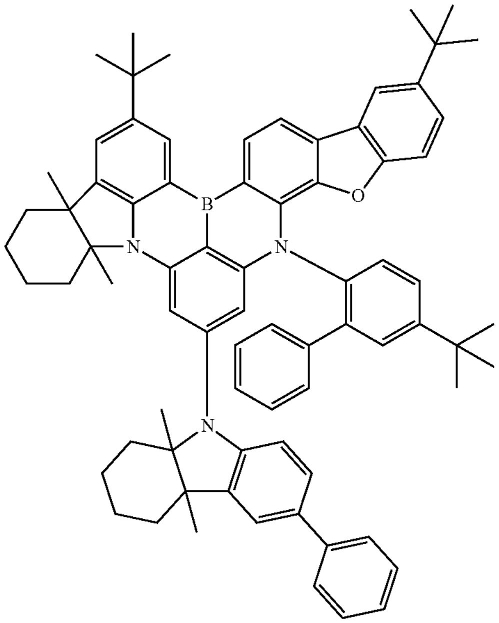

-continued
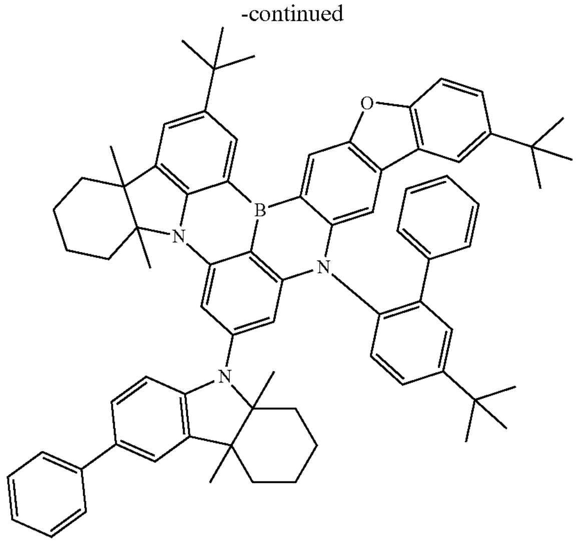
-continued
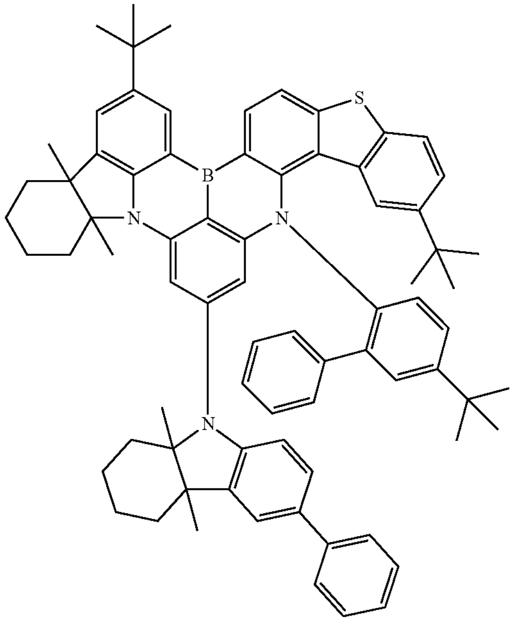
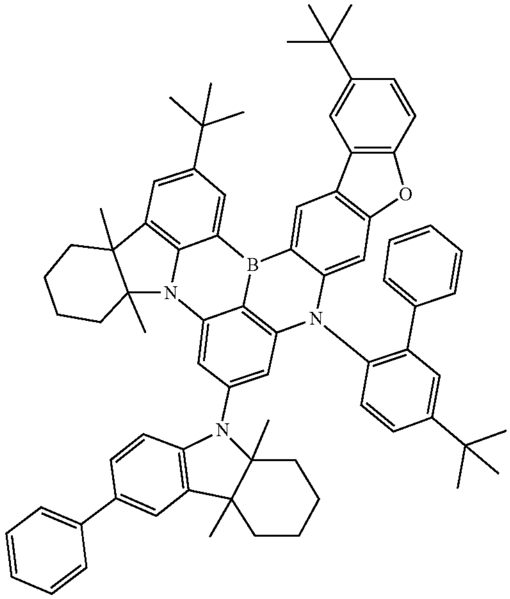
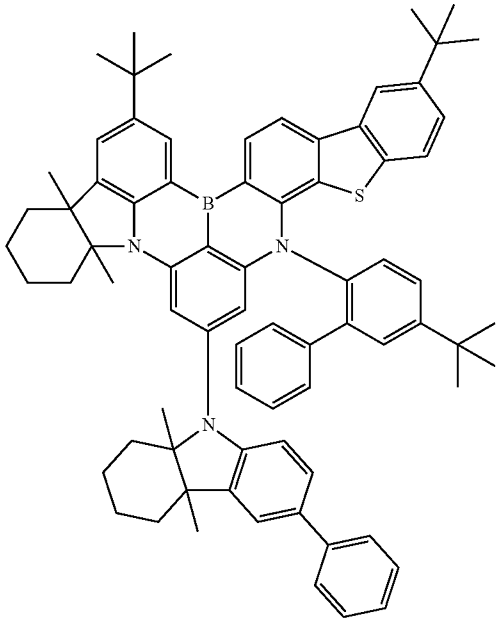

-continued
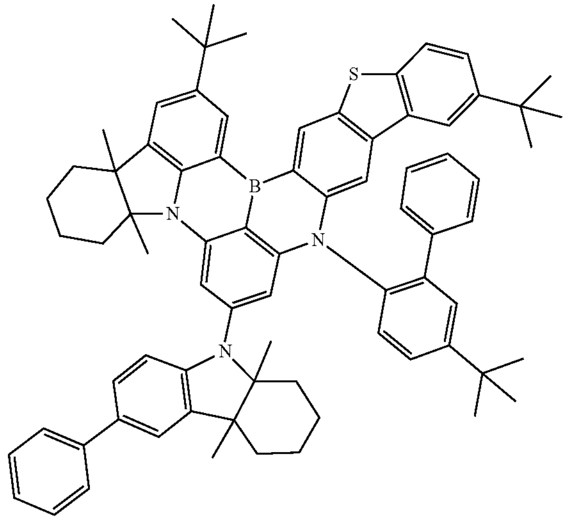
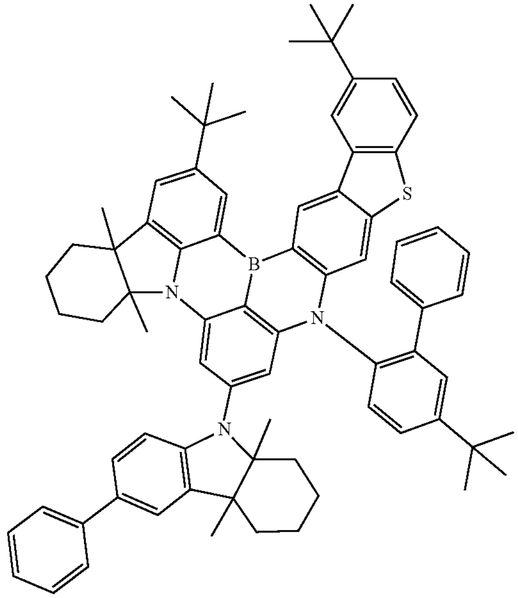
-continued
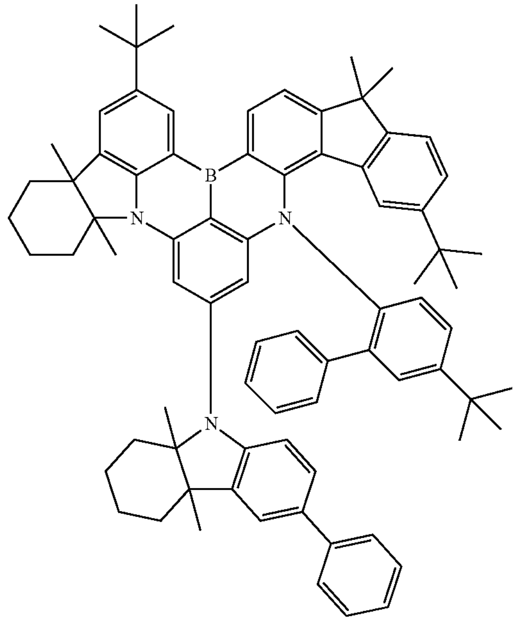
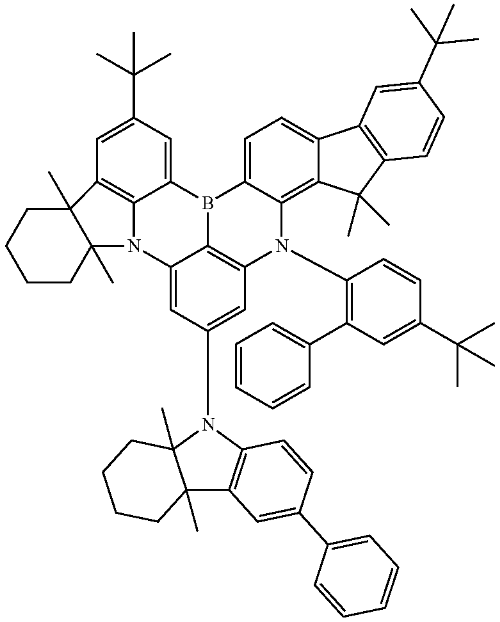

-continued
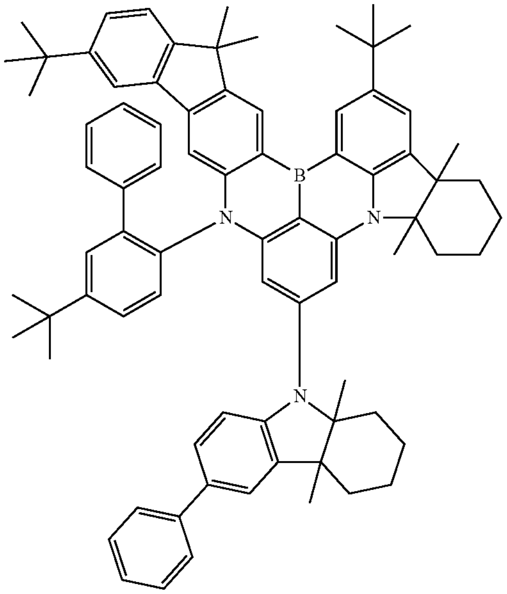
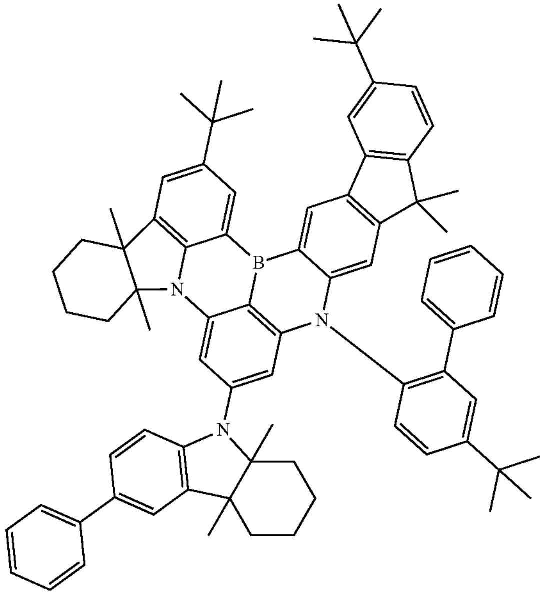
-continued
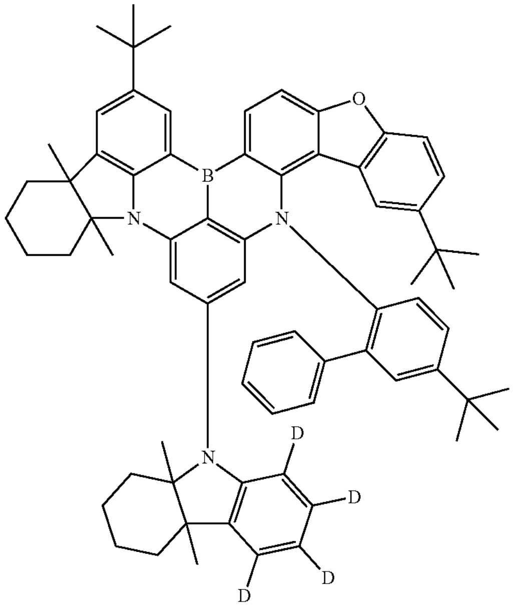
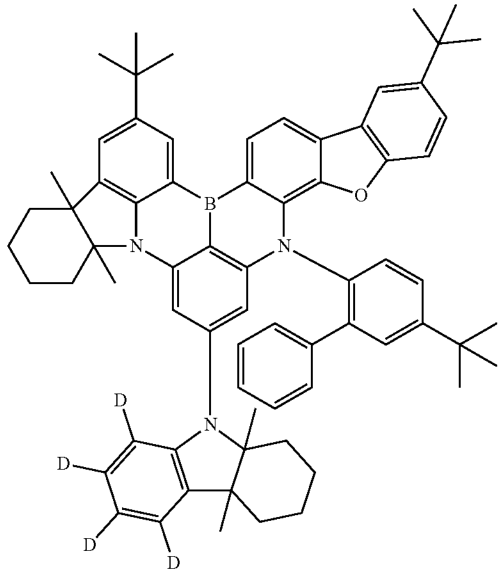
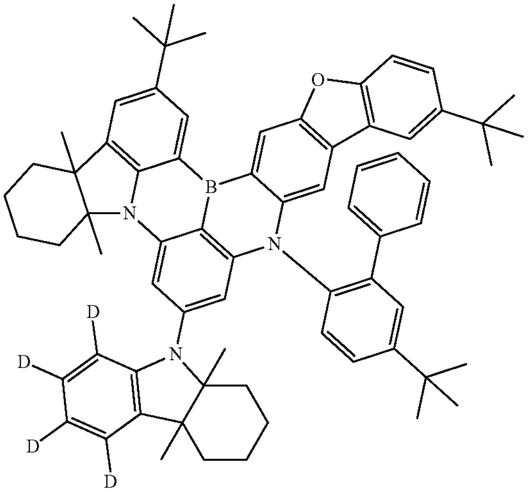

-continued
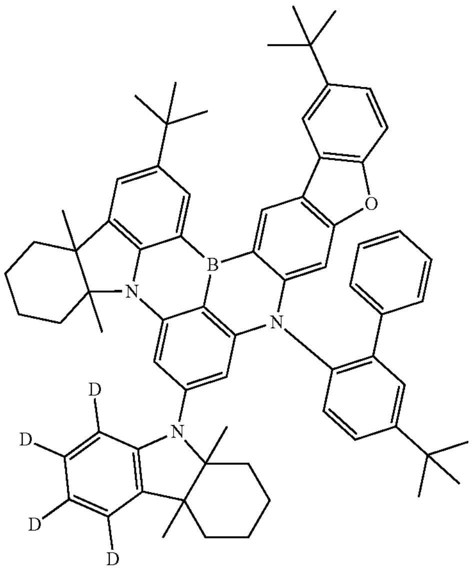
-continued
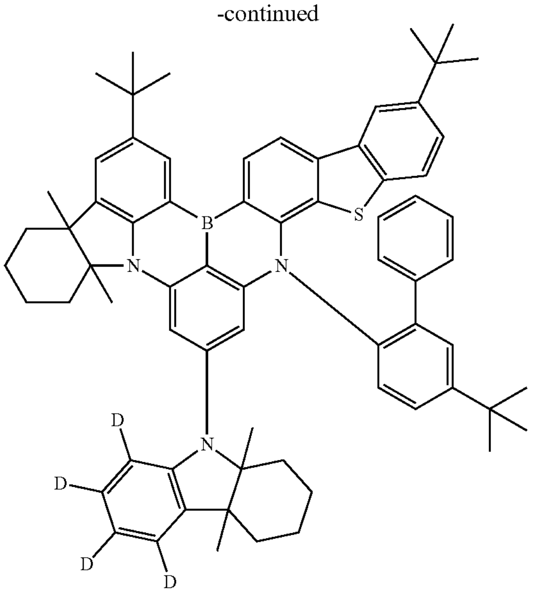
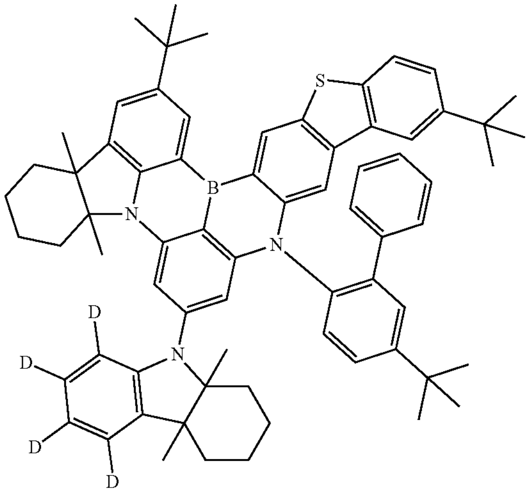
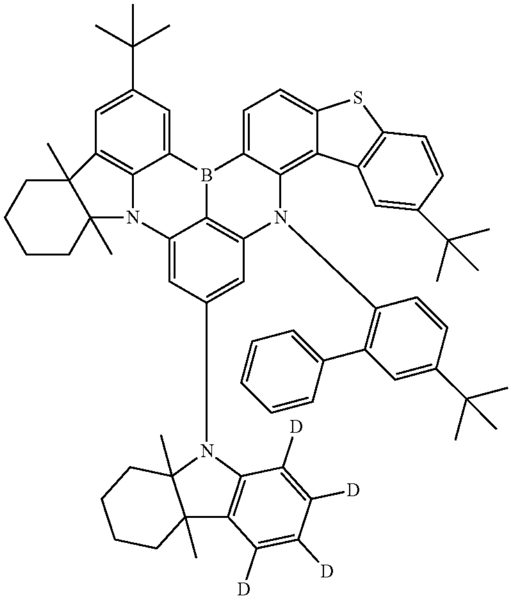
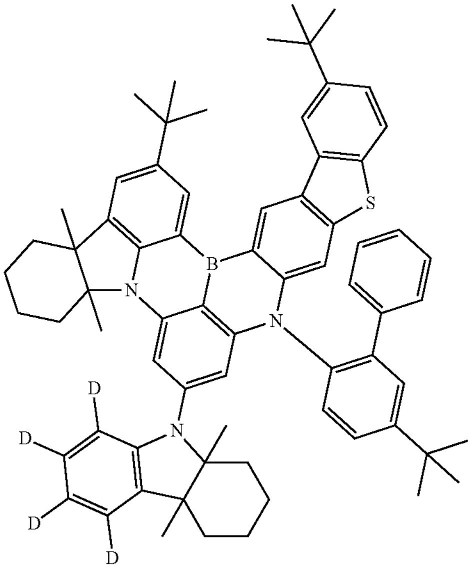

-continued
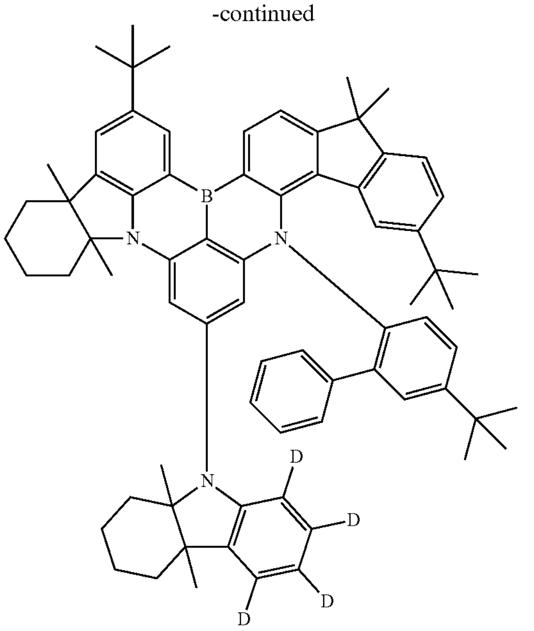
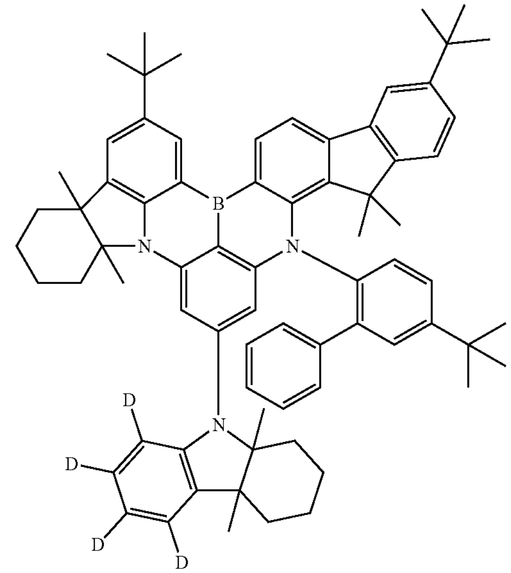
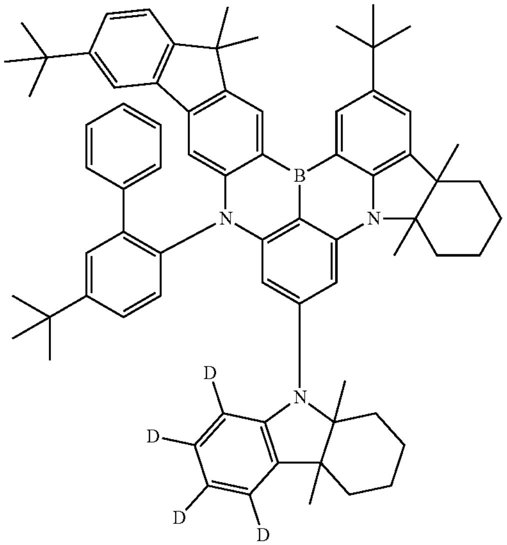
-continued
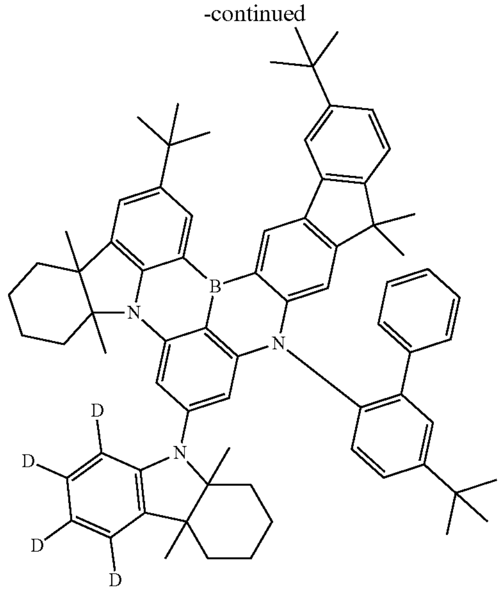
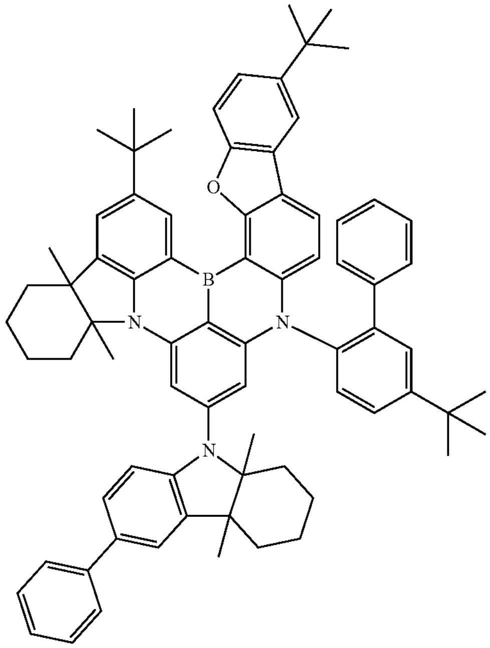

-continued
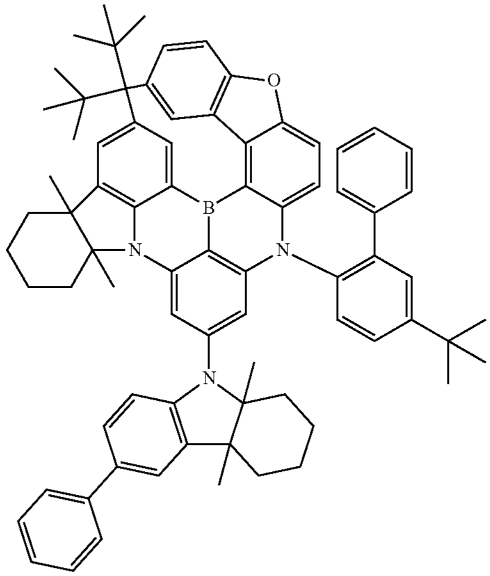
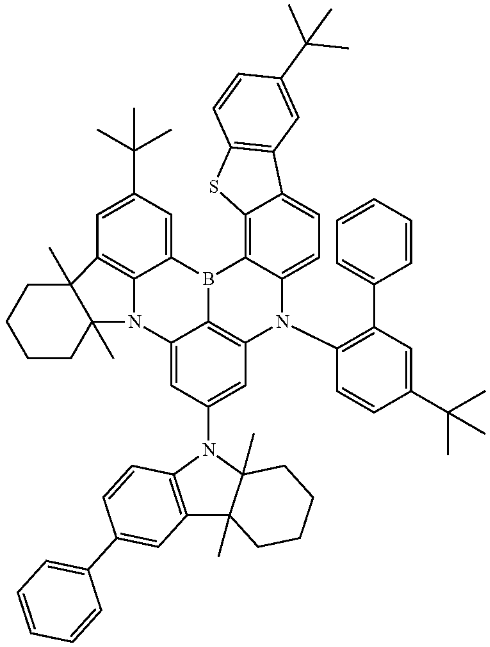
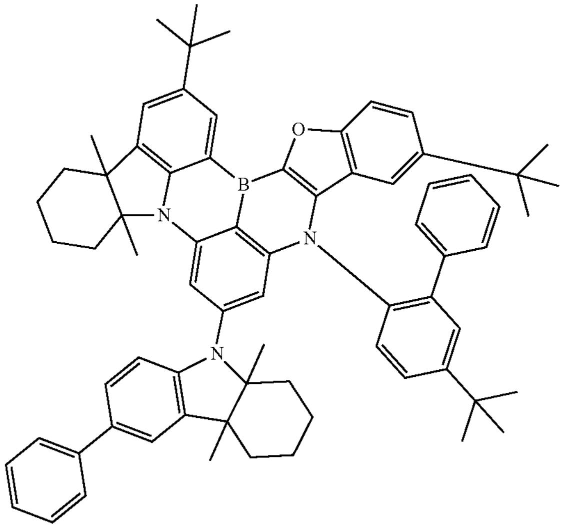
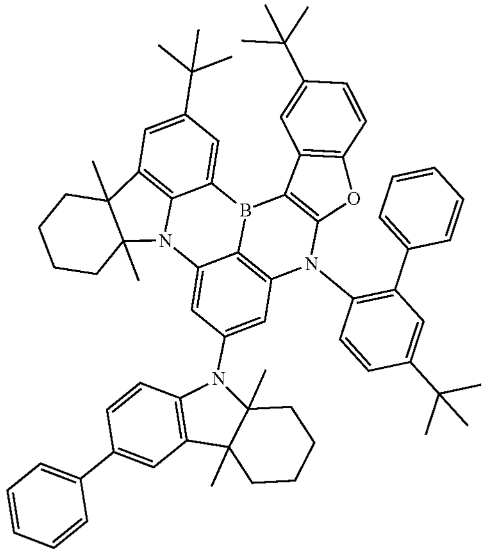
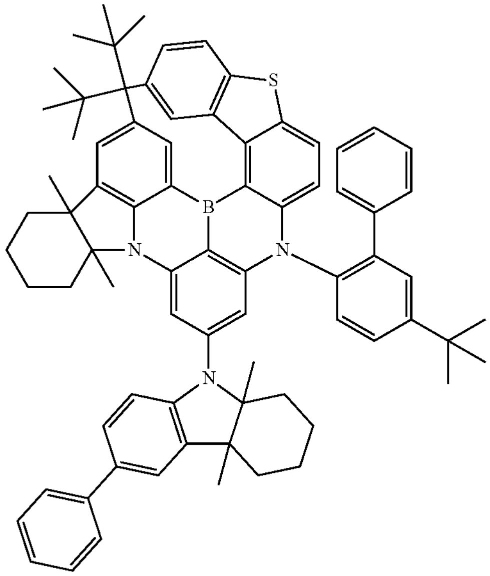
-continued -continued
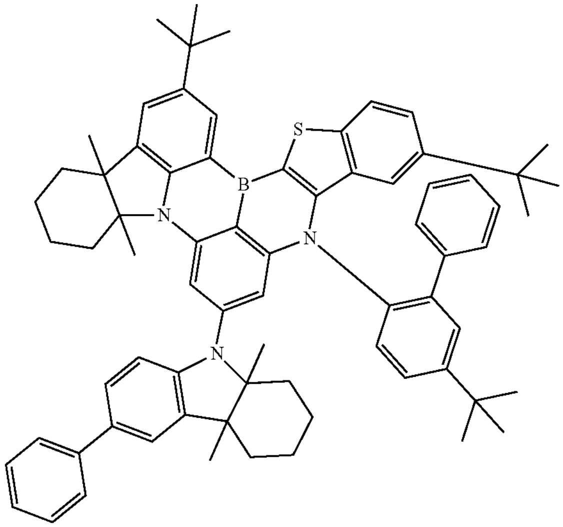
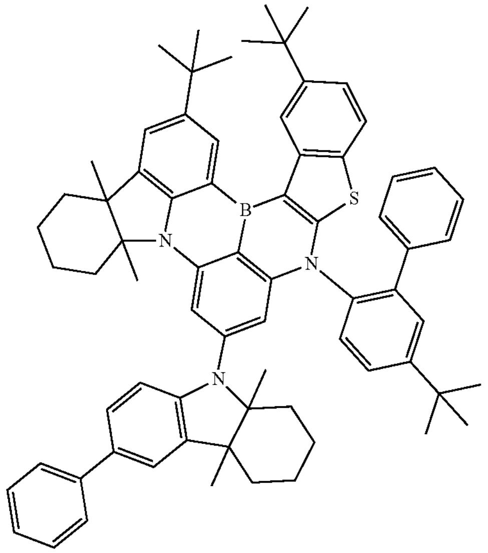
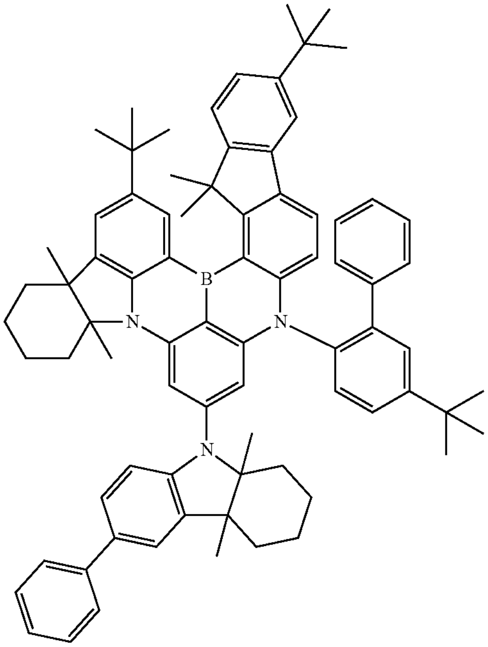
-continued
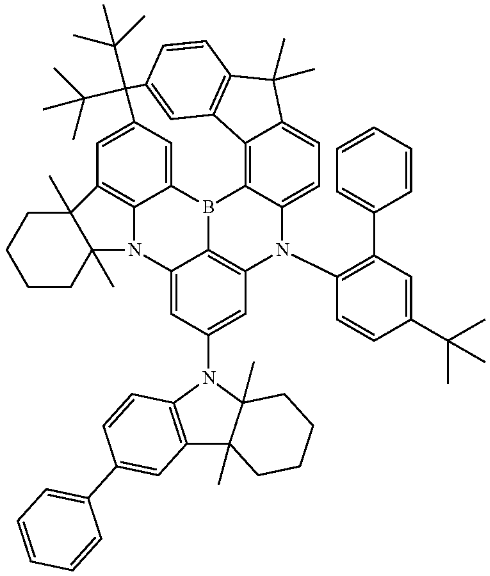
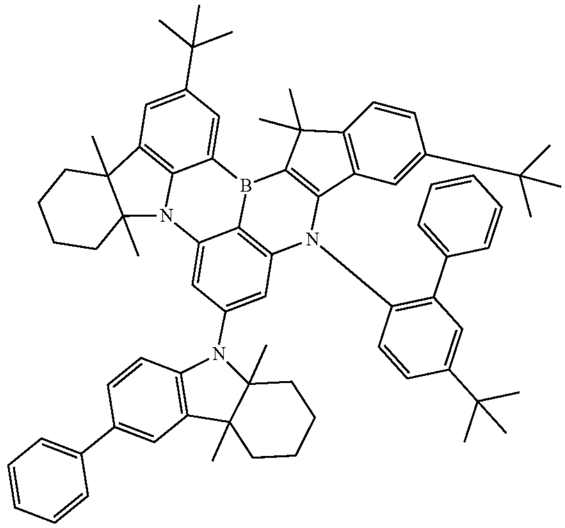
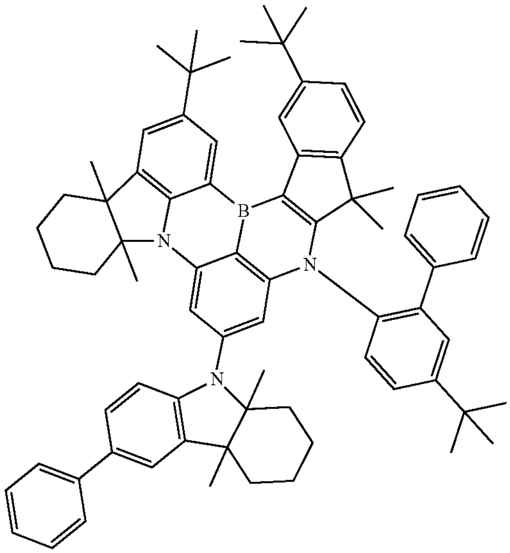

-continued
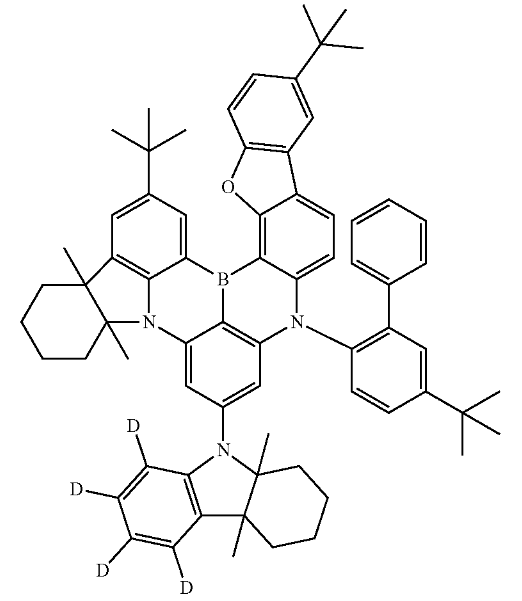
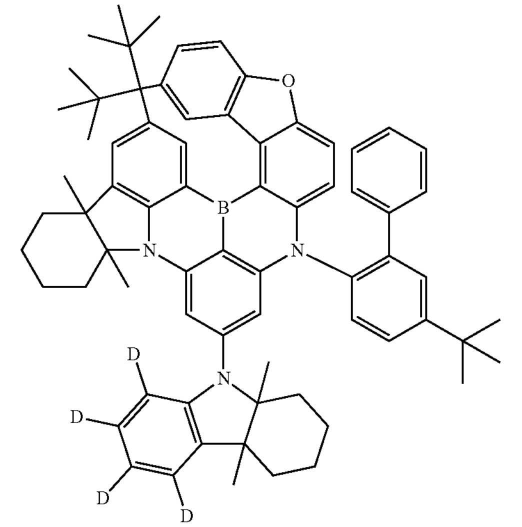
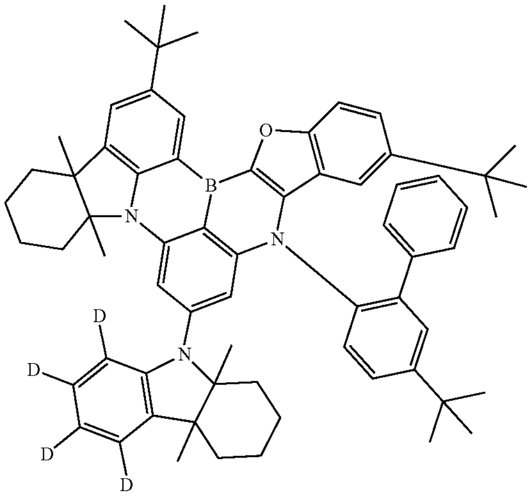
-continued
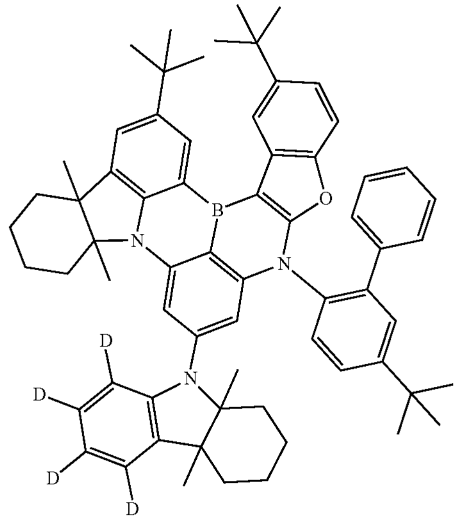
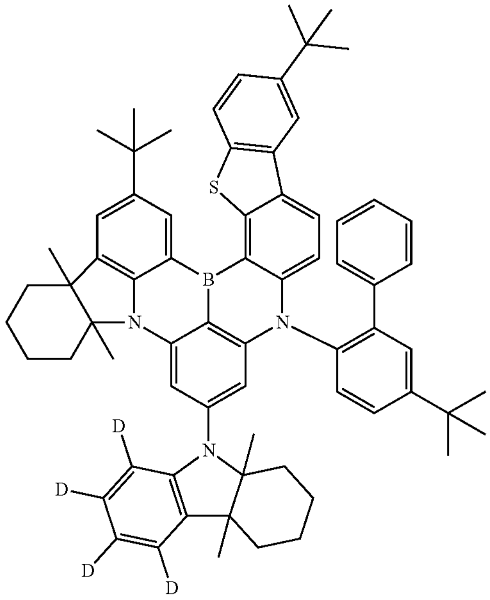
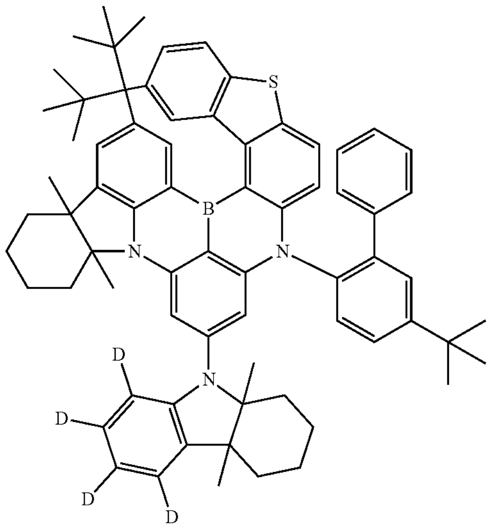

-continued
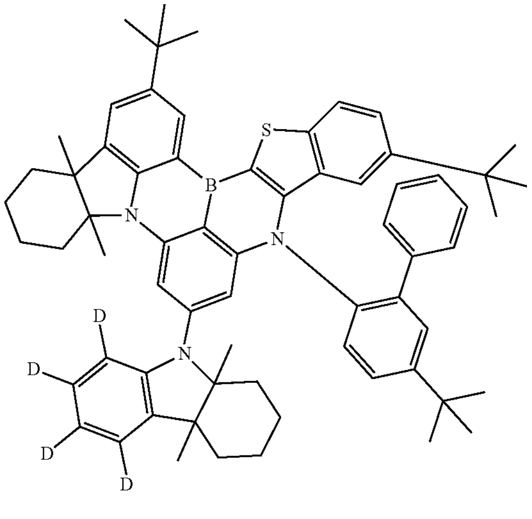
-continued
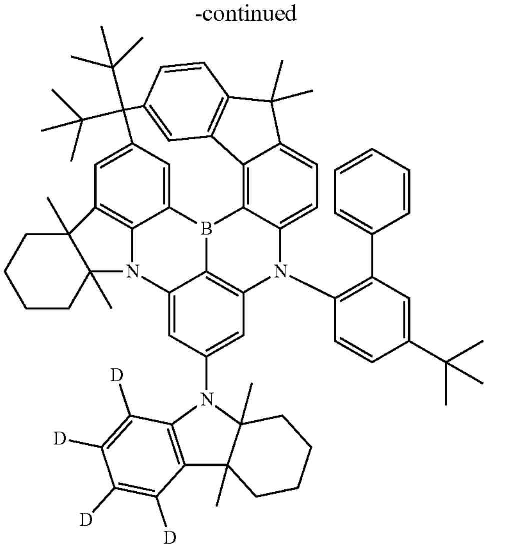
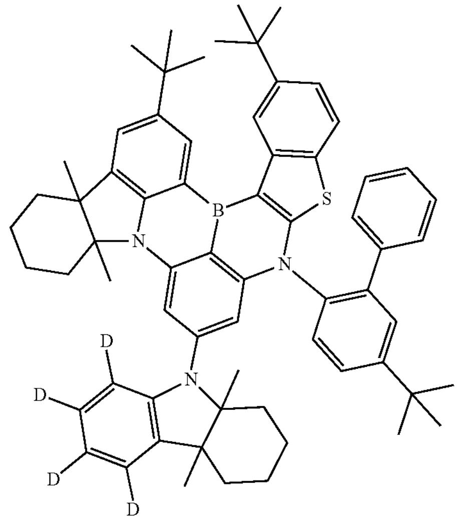
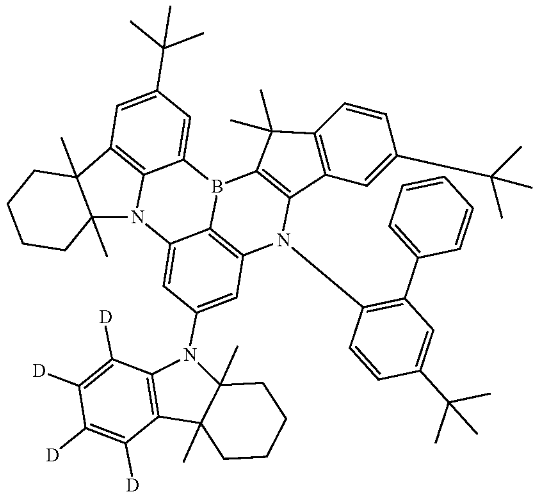
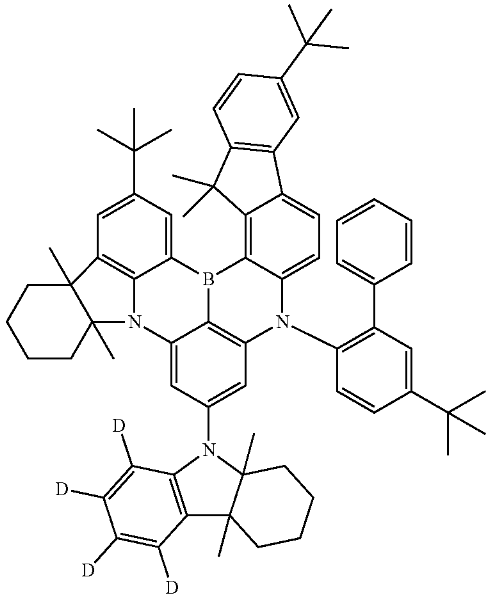
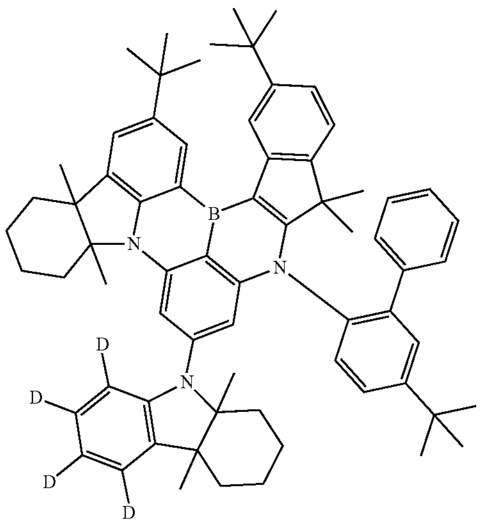

-continued
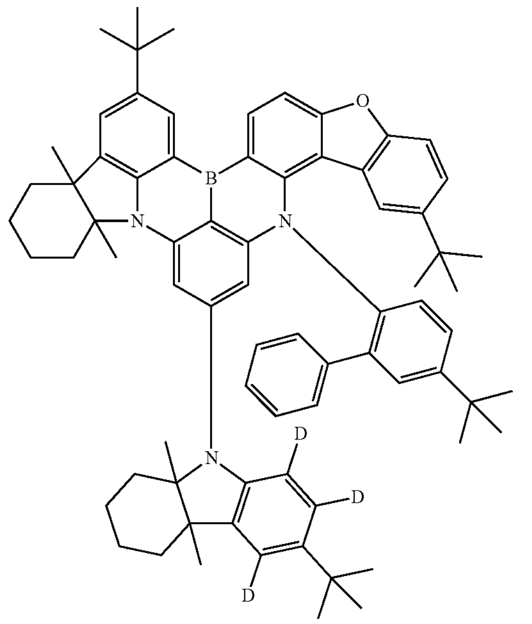
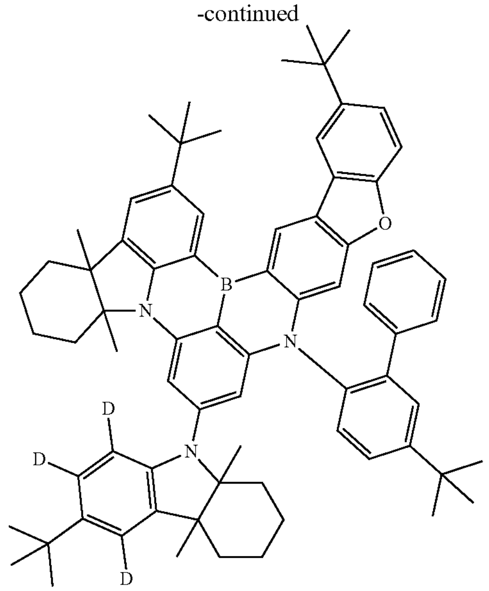
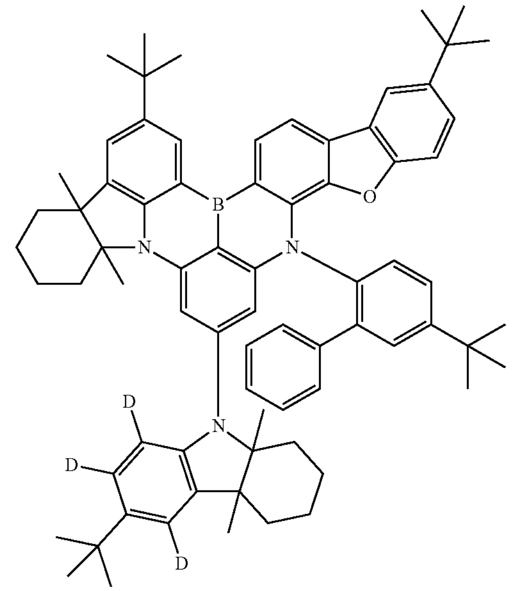
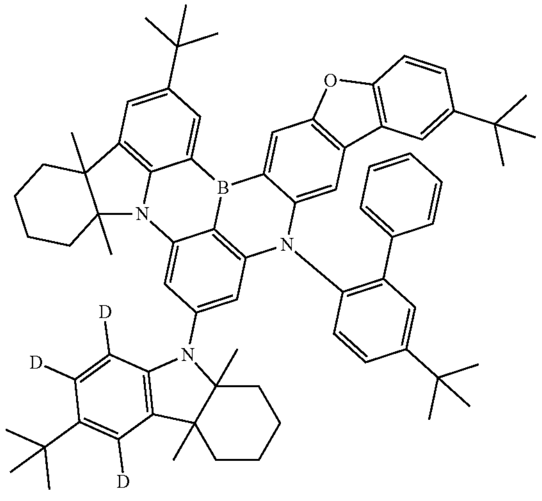
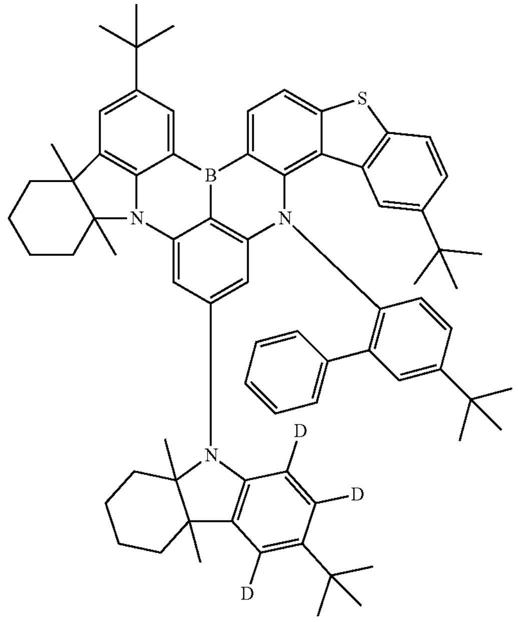

-continued
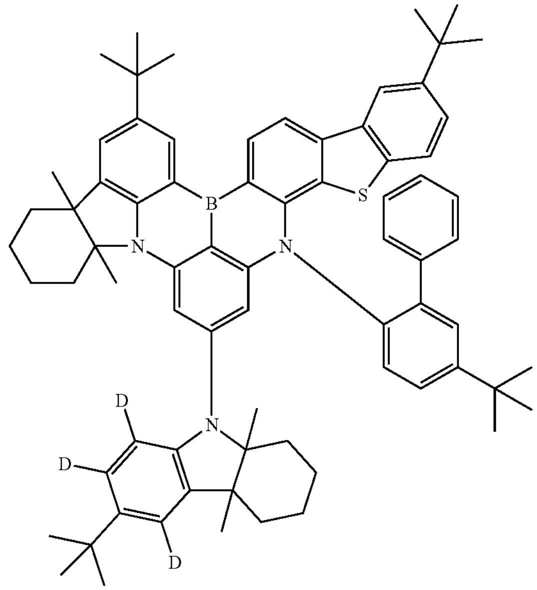
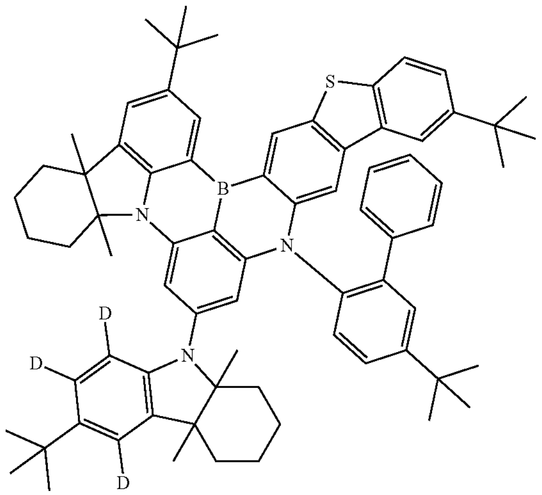
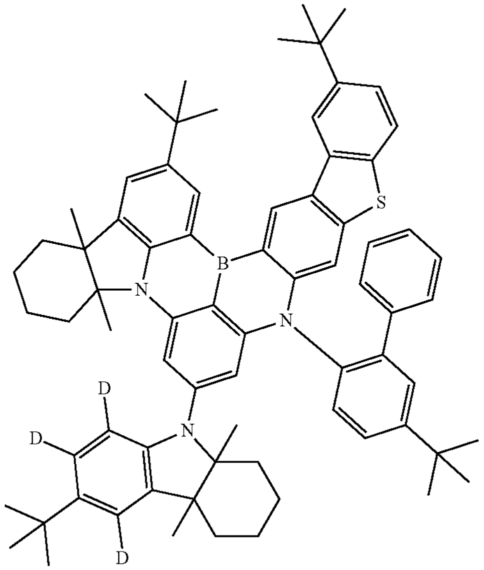
-continued
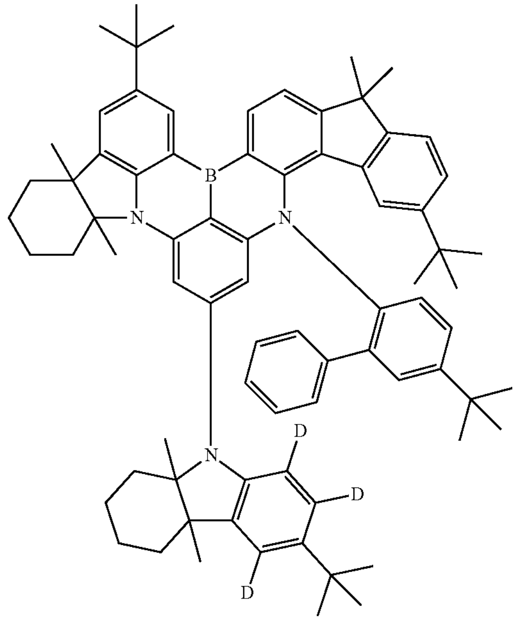
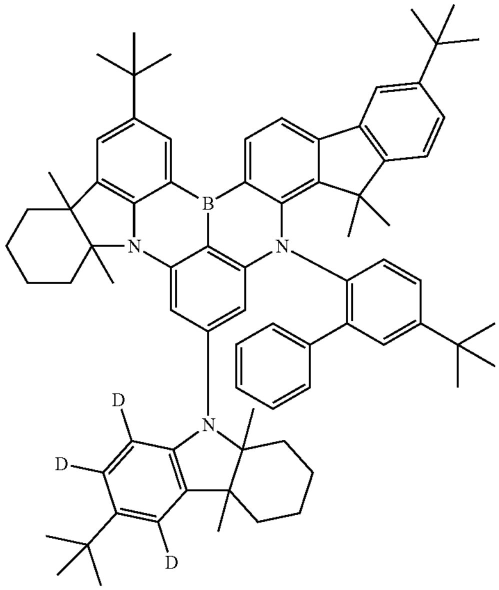
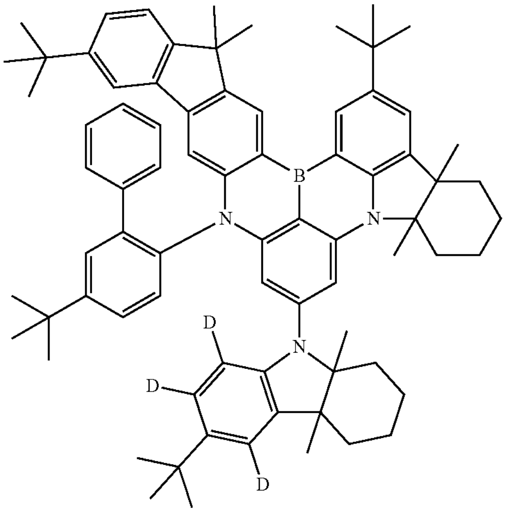

-continued
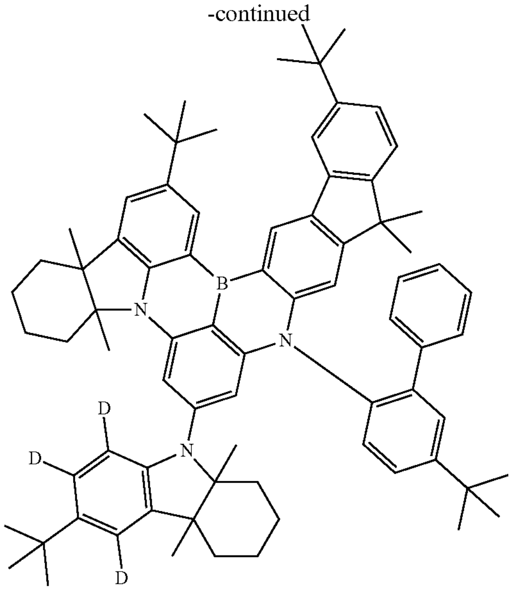
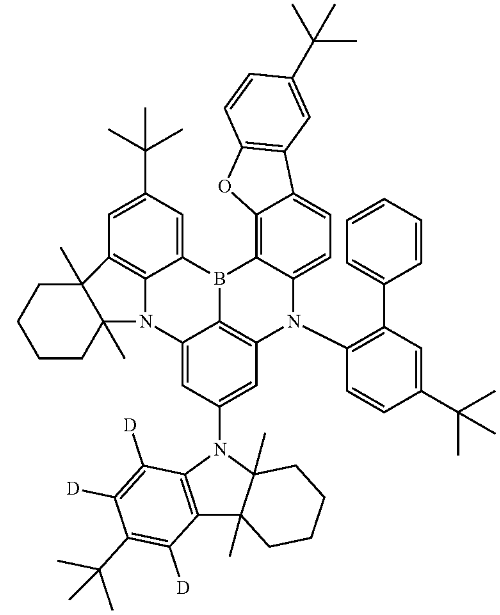
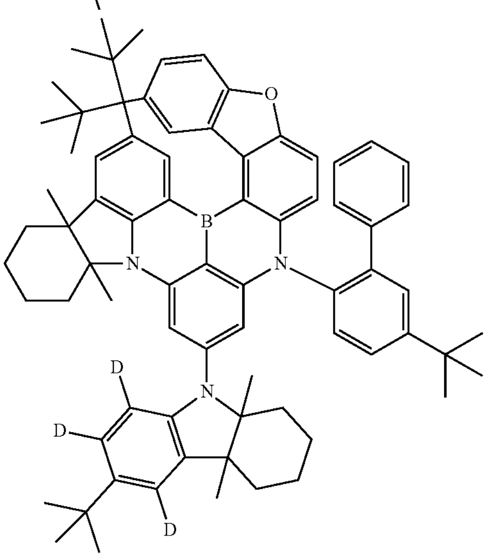
-continued
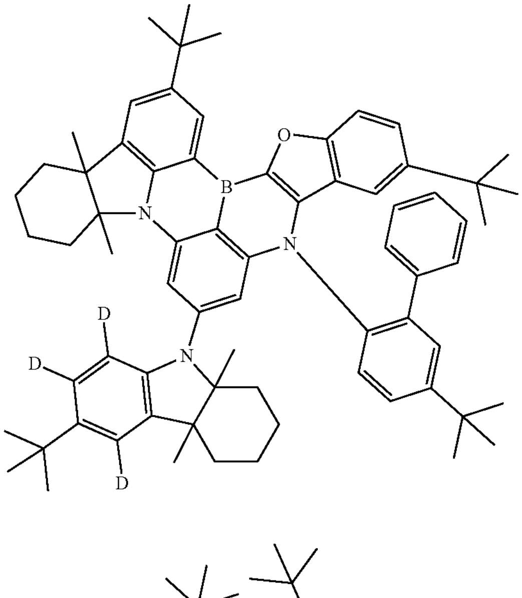
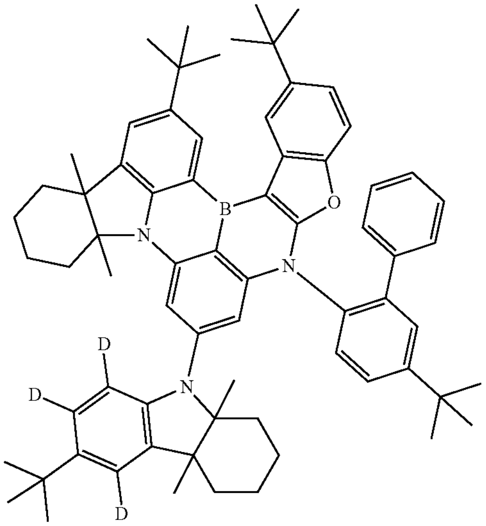
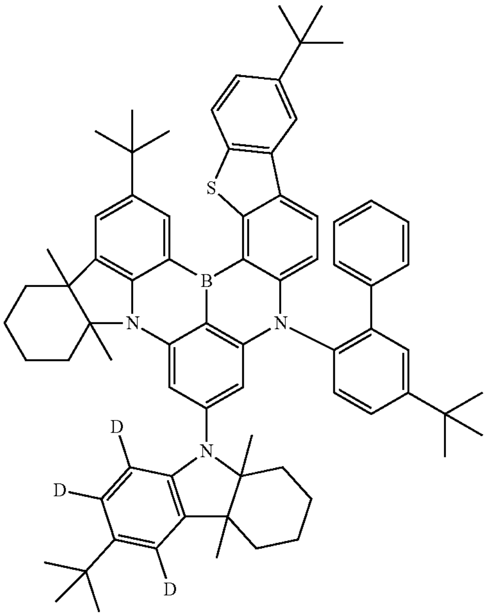

-continued
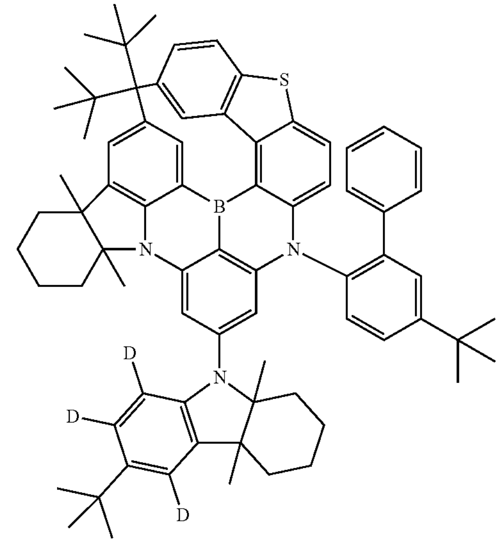
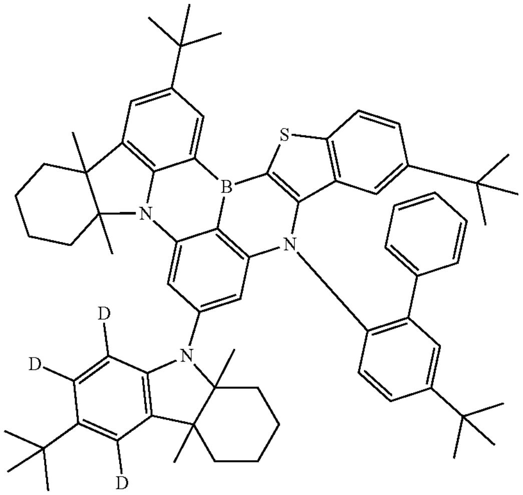
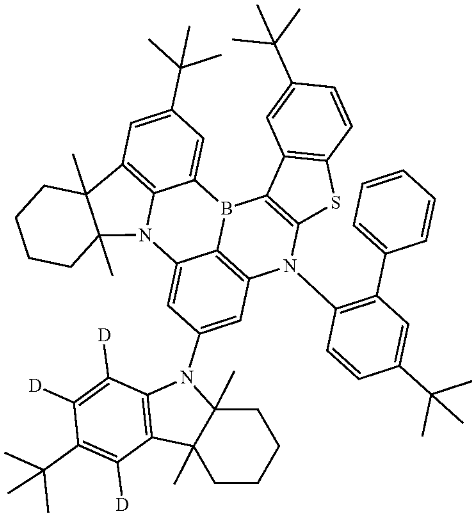
-continued
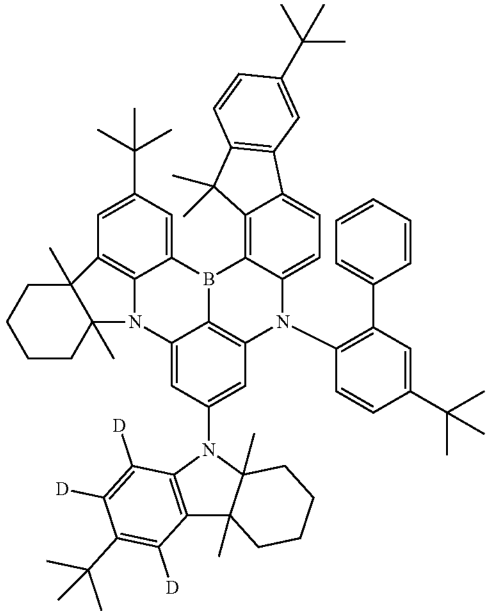
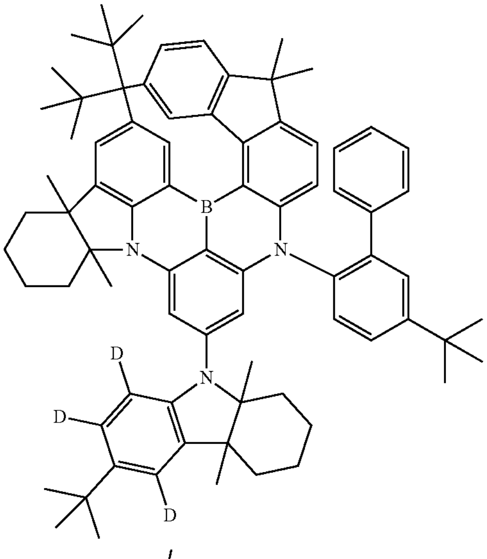
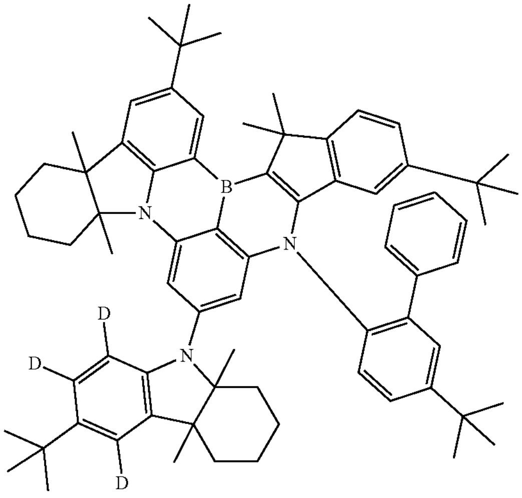

-continued
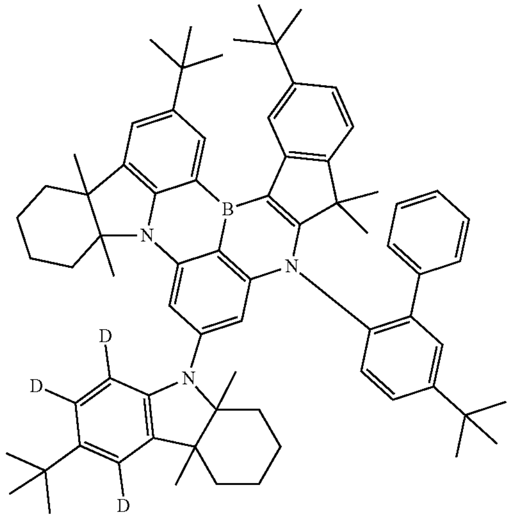
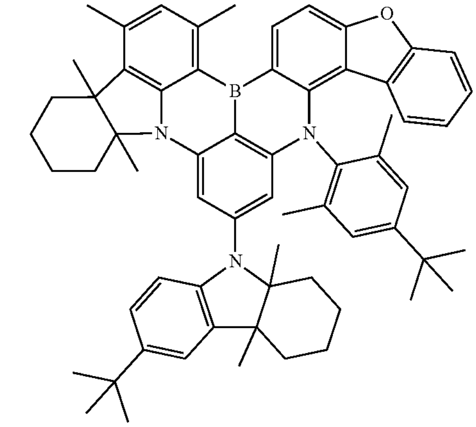
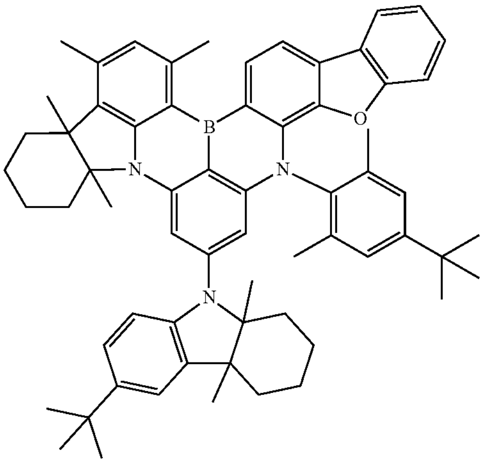
-continued
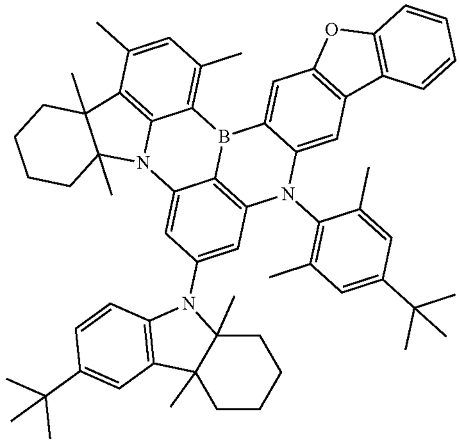
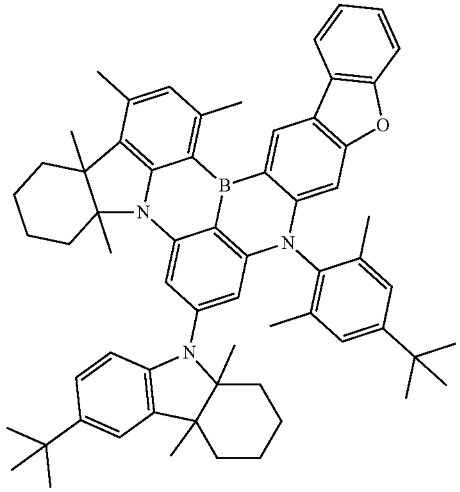
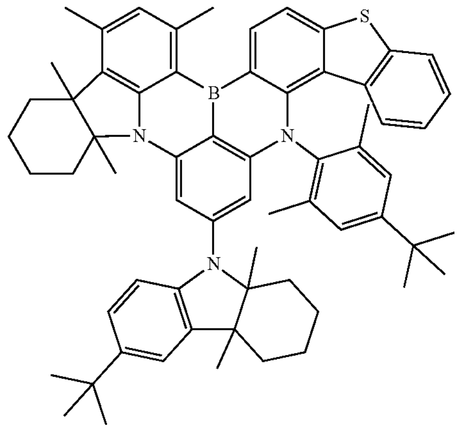

-continued
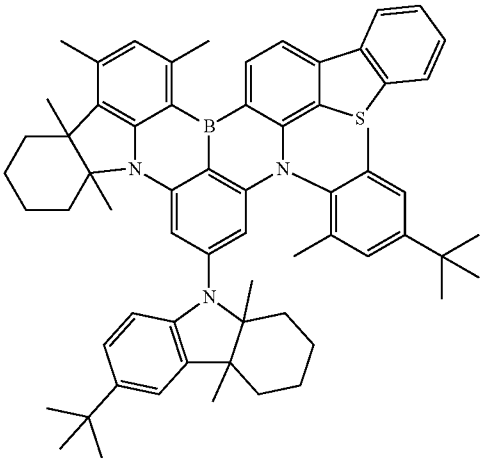
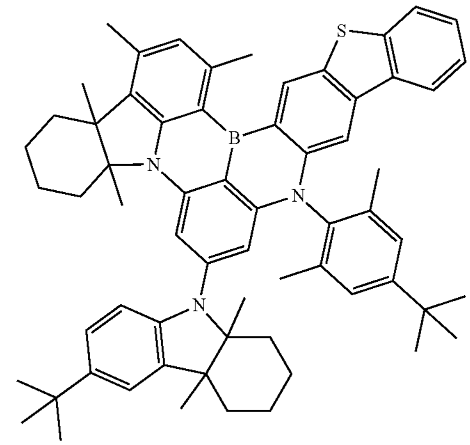
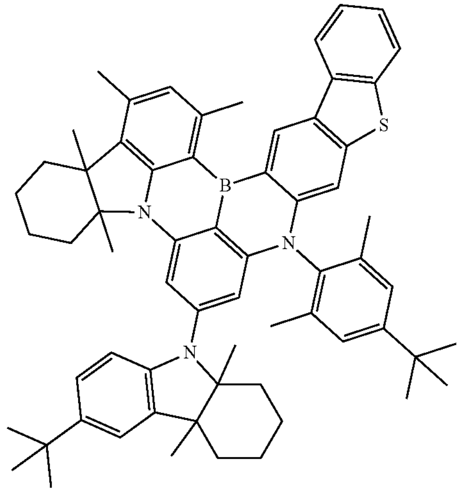
-continued
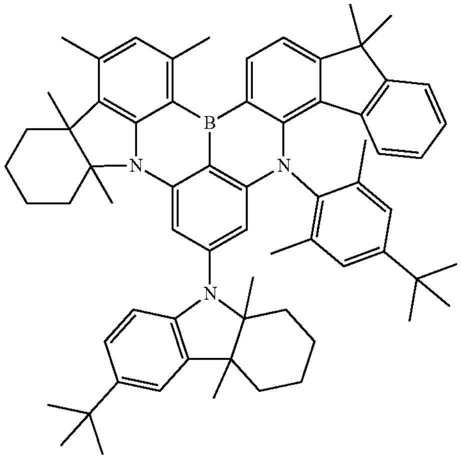
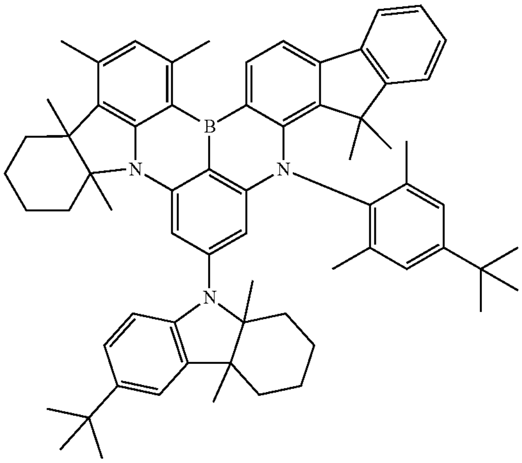
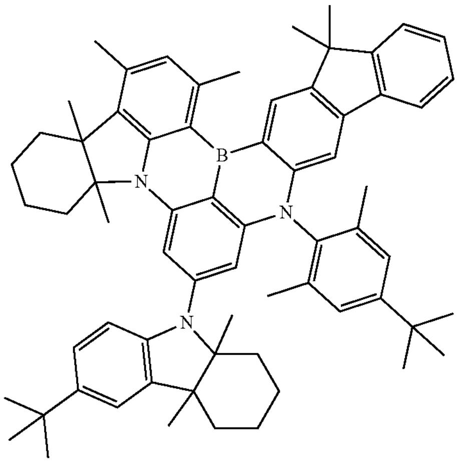

-continued
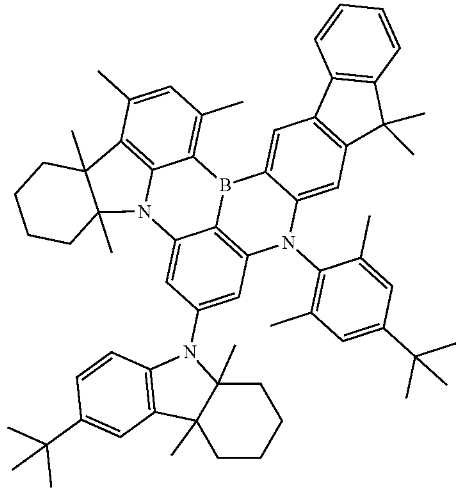
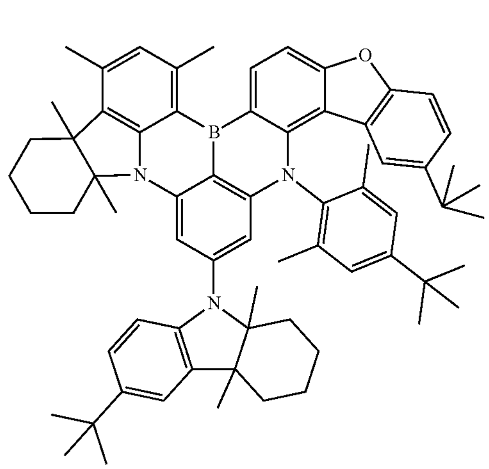
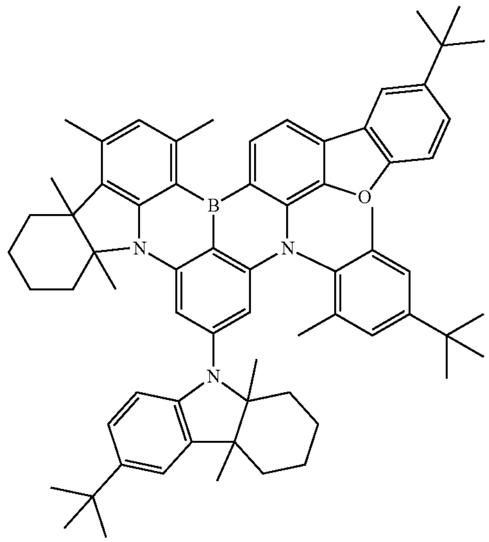
-continued
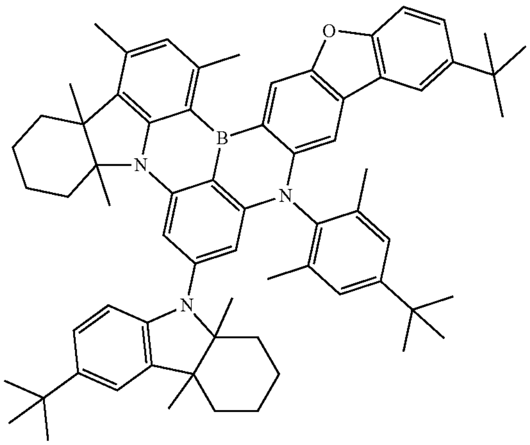
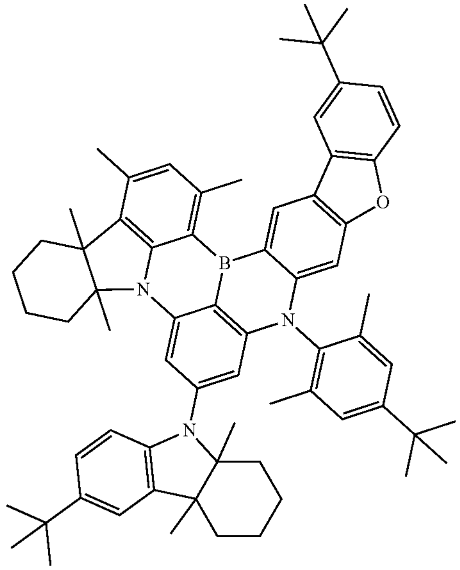
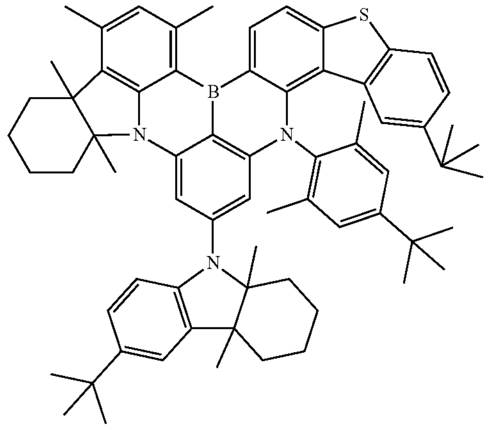

-continued
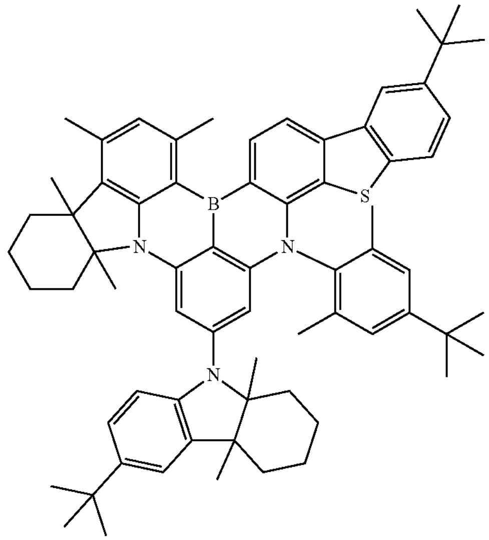
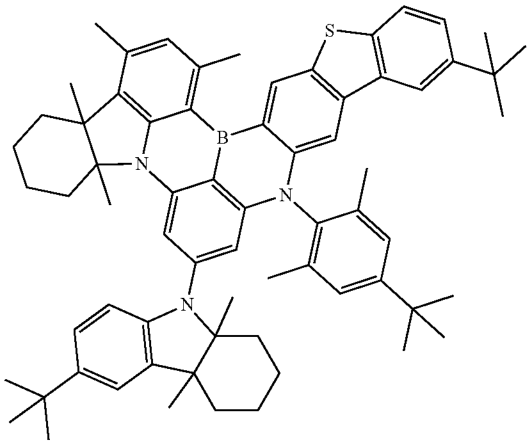
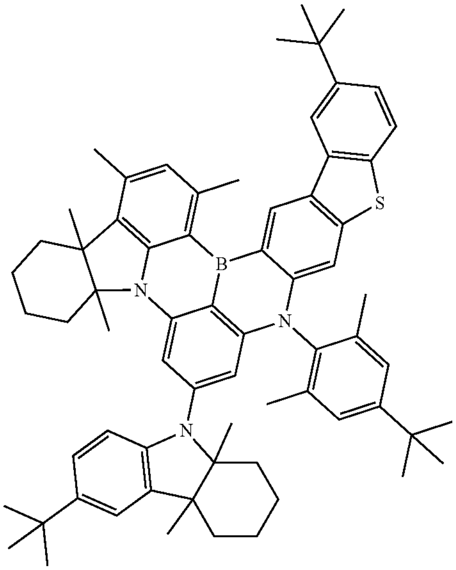
-continued
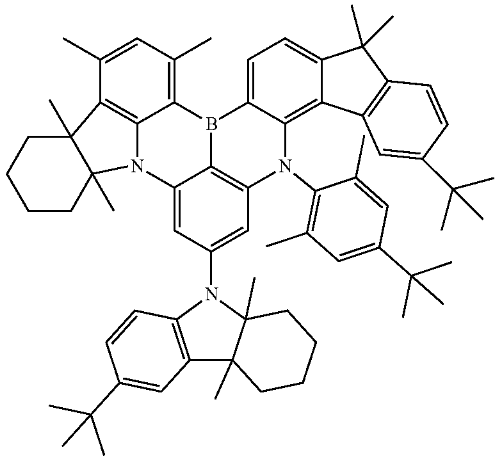
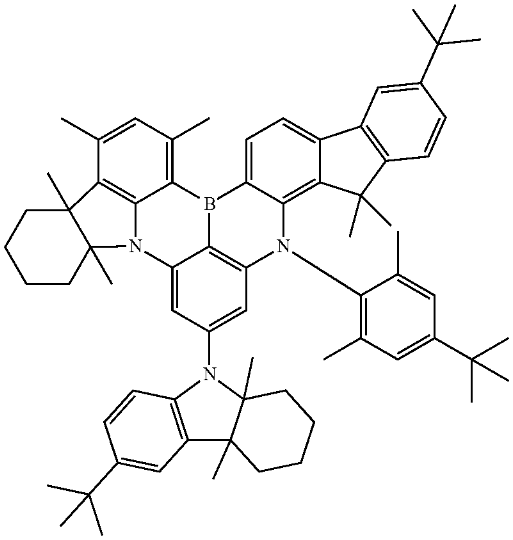
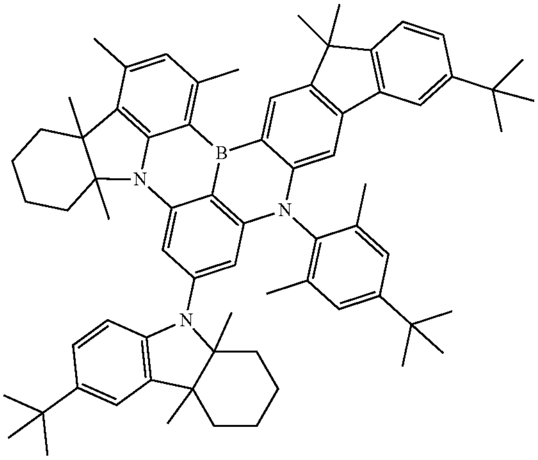

-continued
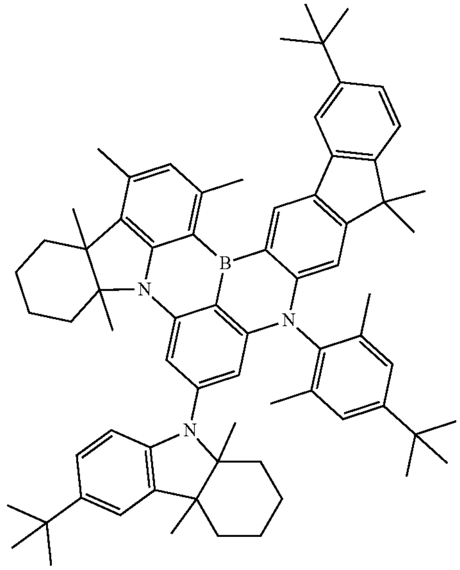
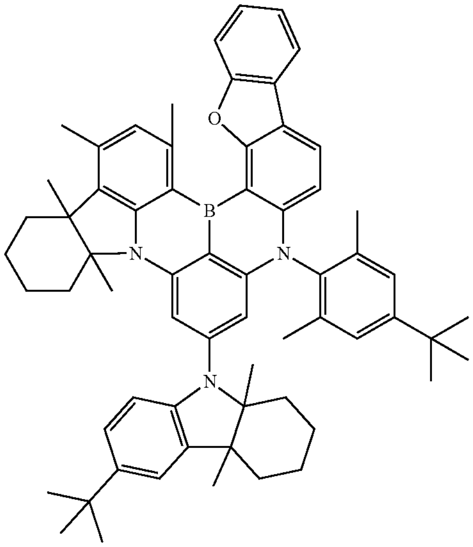
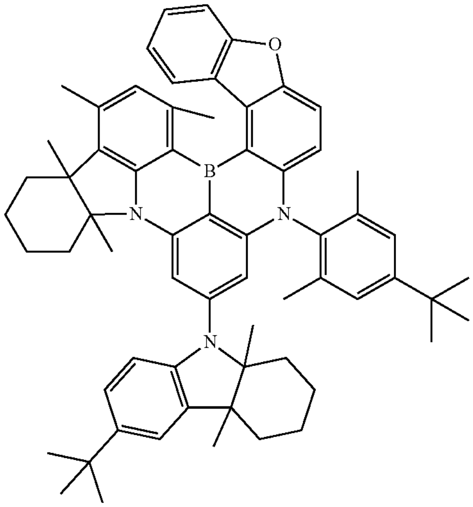
-continued
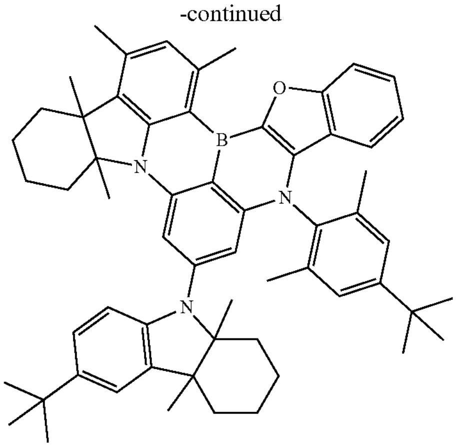
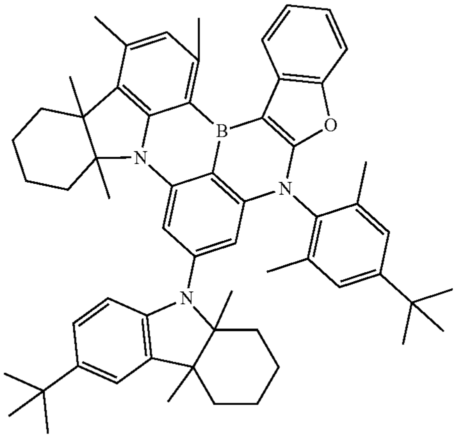
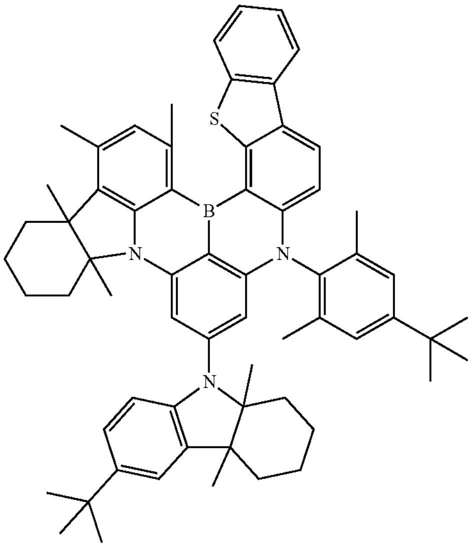

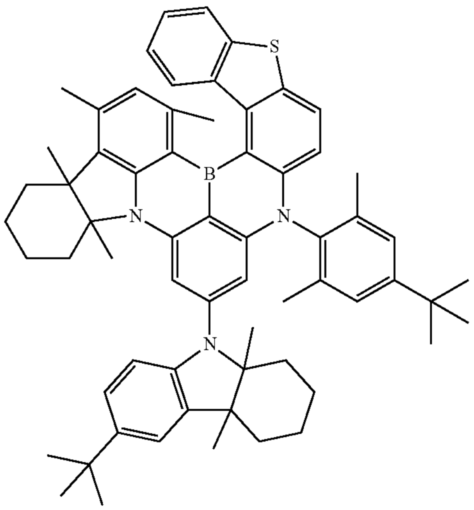
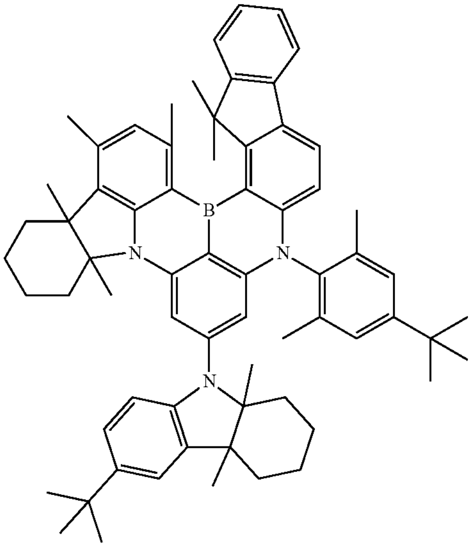
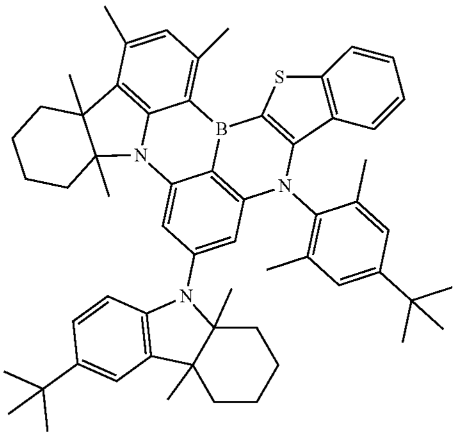
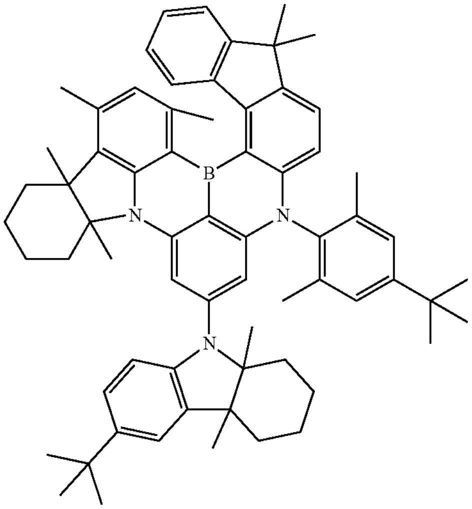
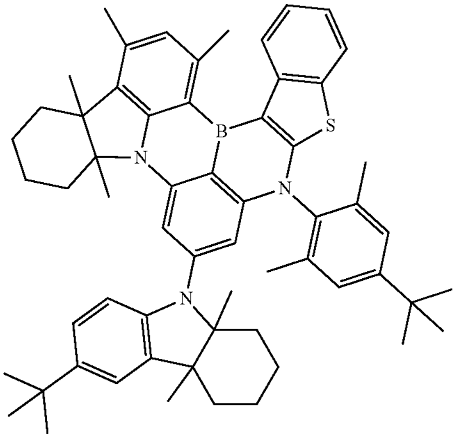
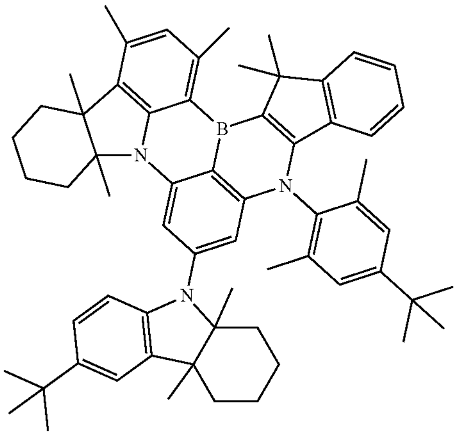

-continued
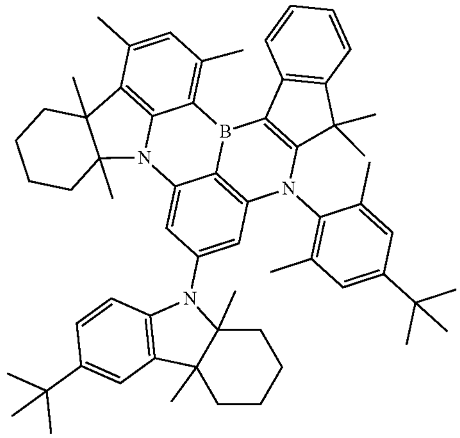
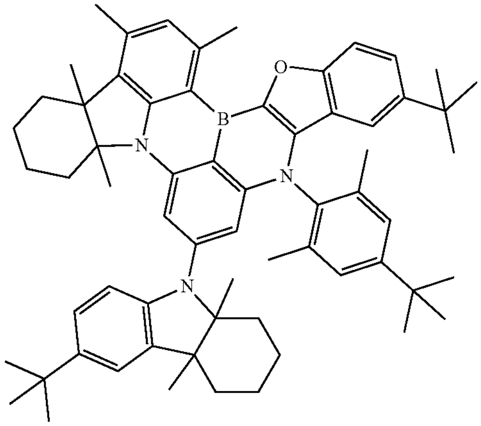
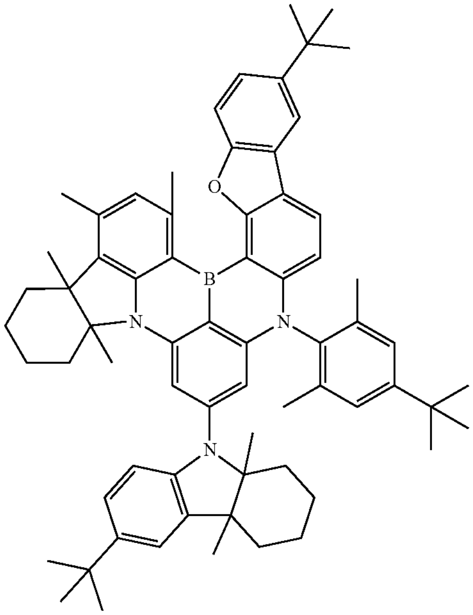
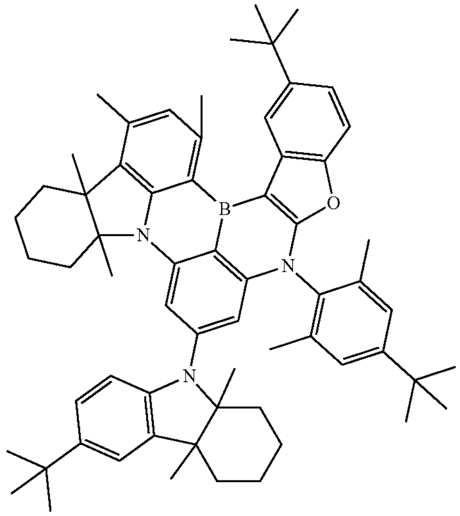
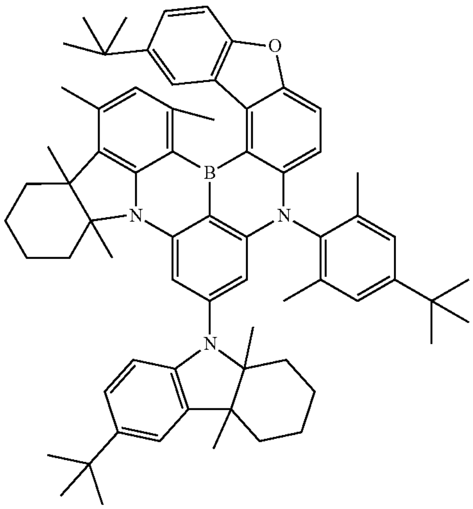
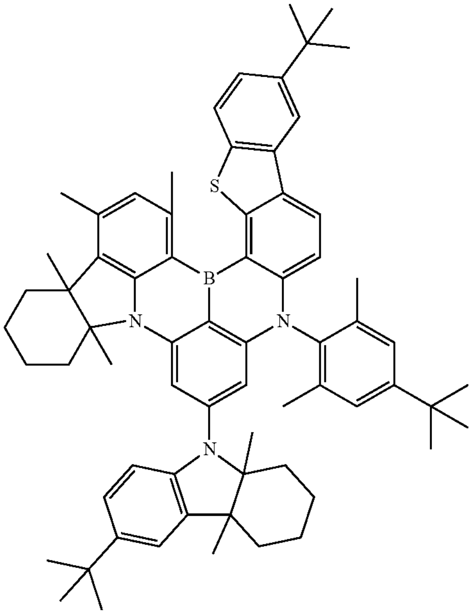

-continued
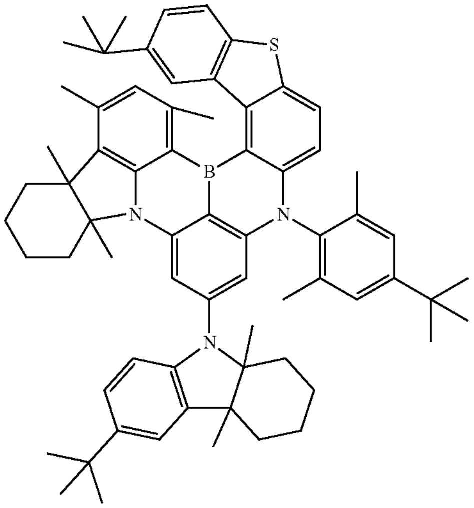
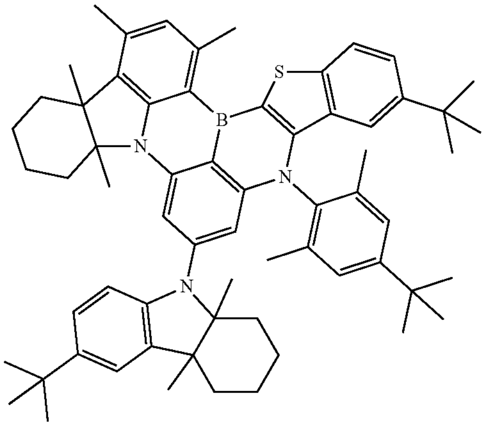
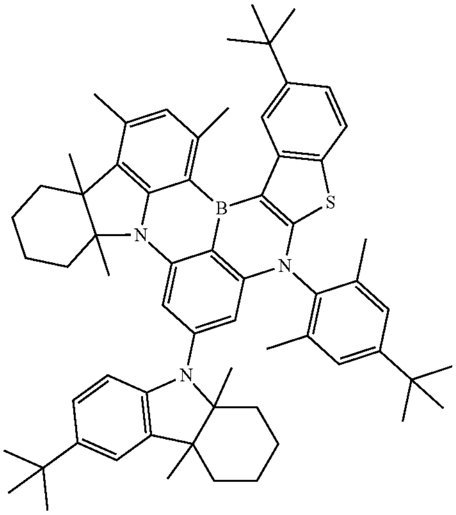
-continued
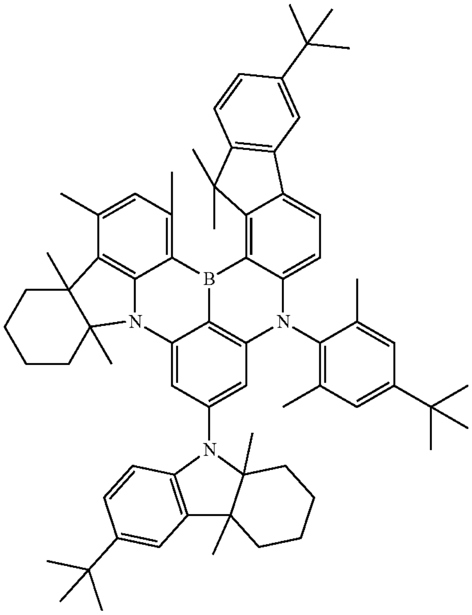
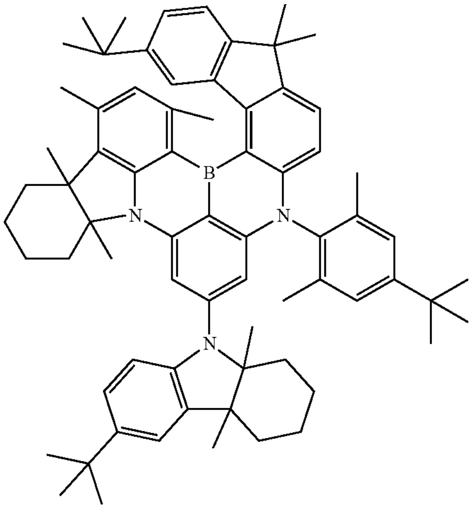
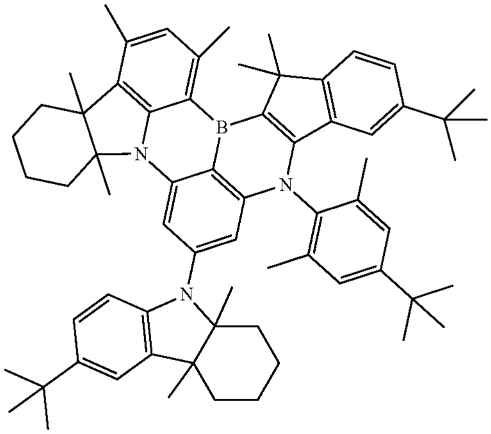

-continued
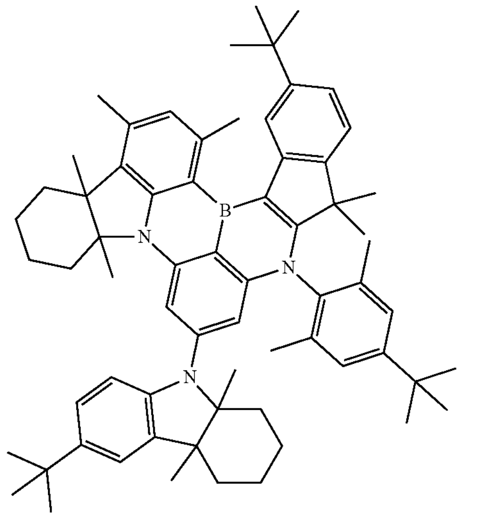
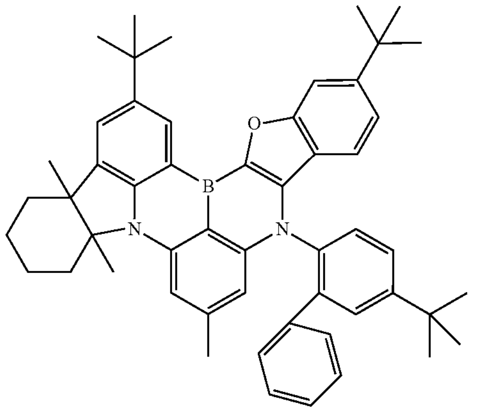
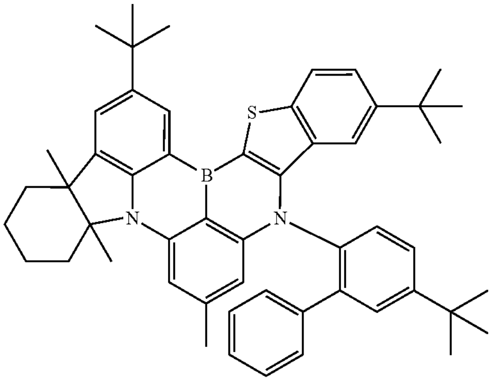
-continued
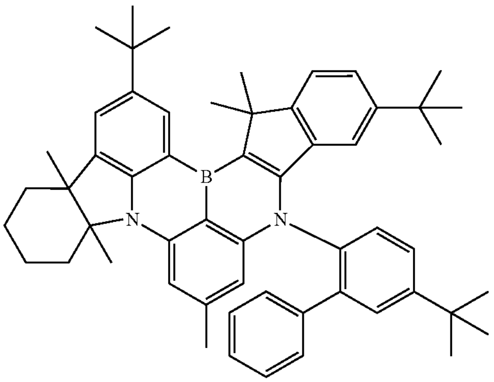
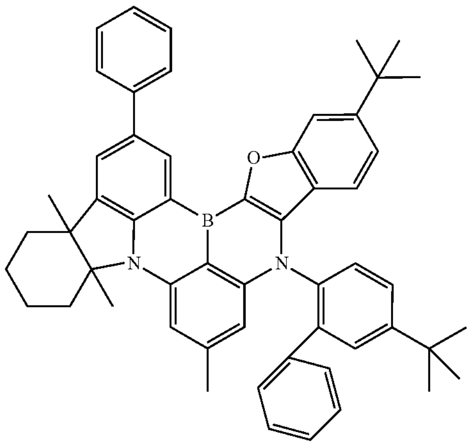
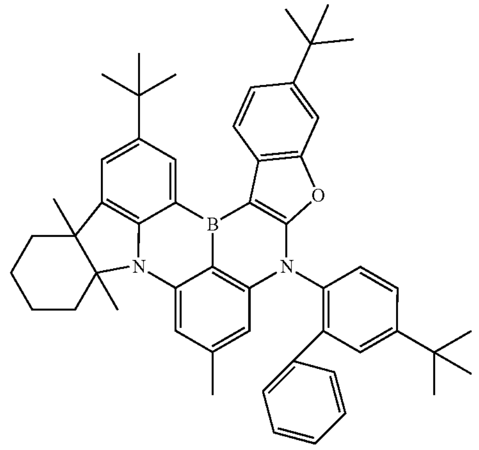
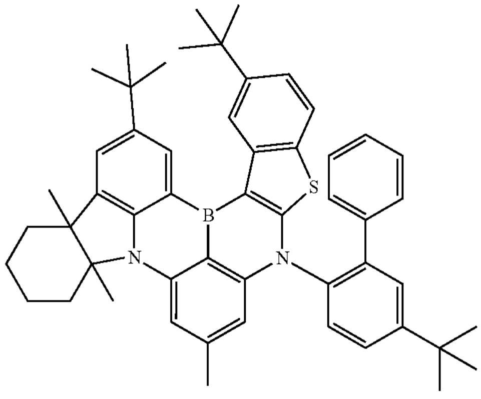

-continued
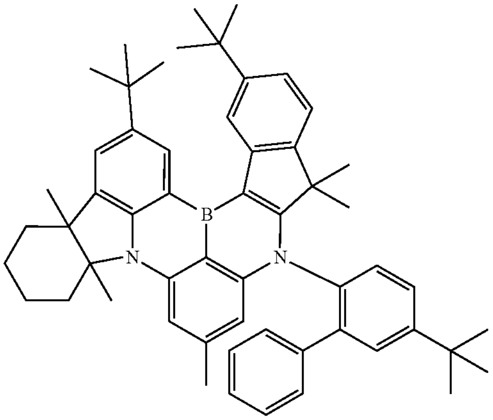
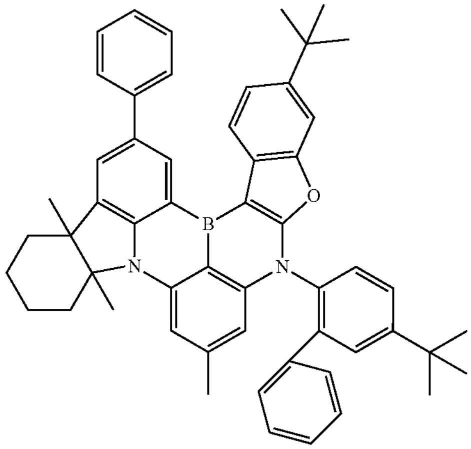
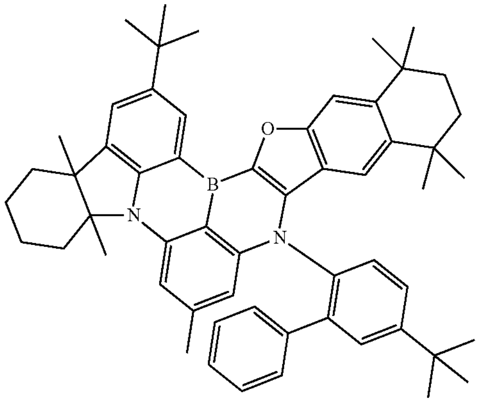
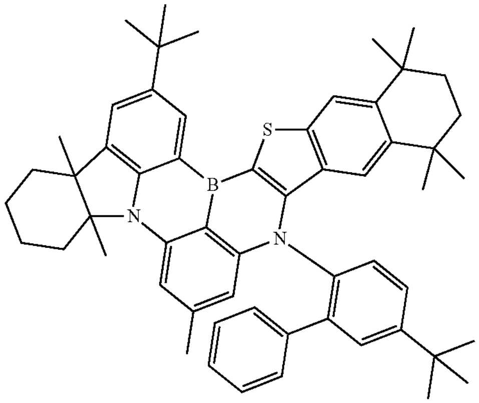
-continued
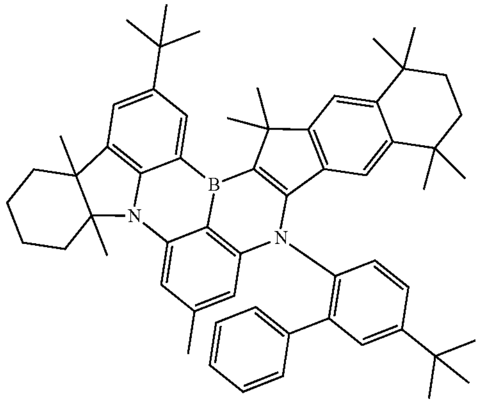
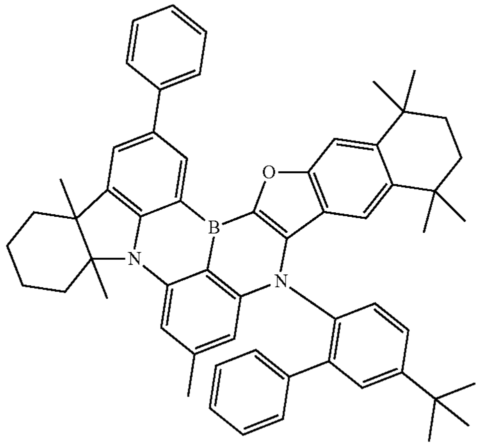
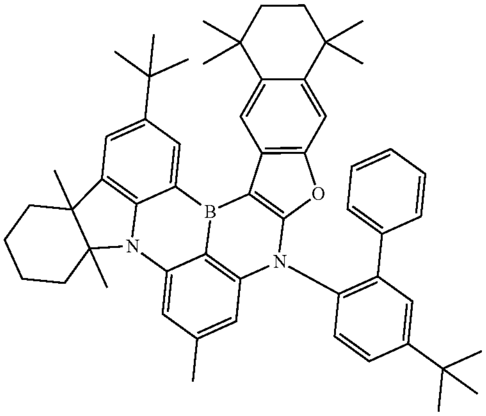
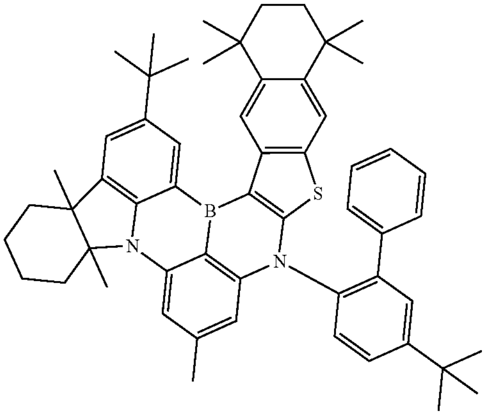

-continued
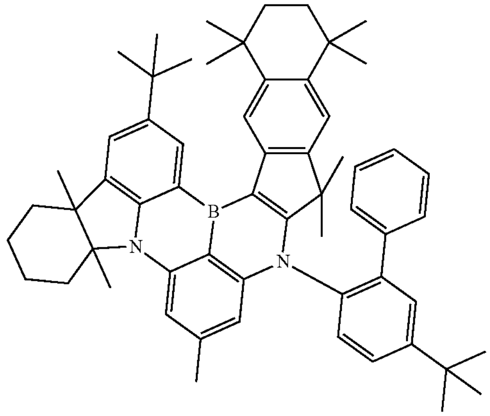
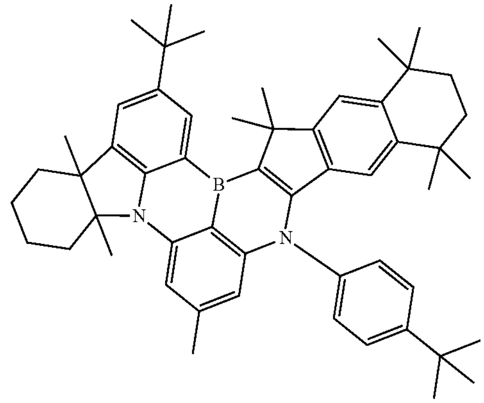
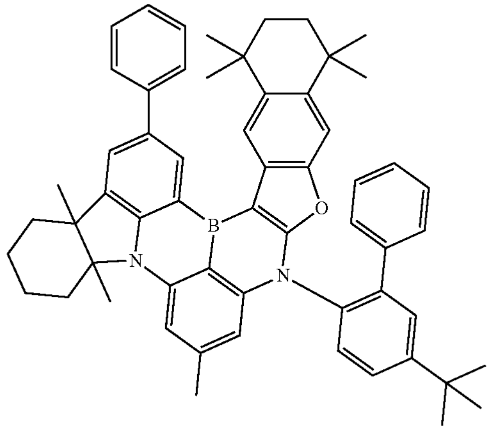
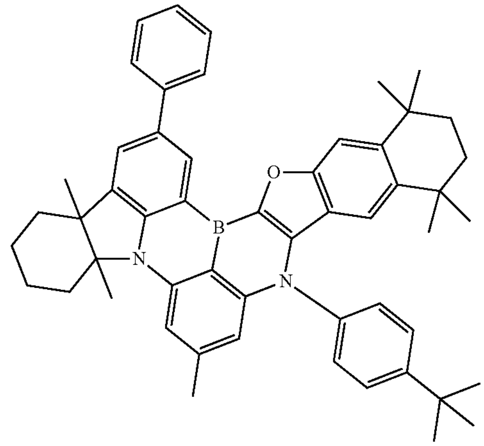
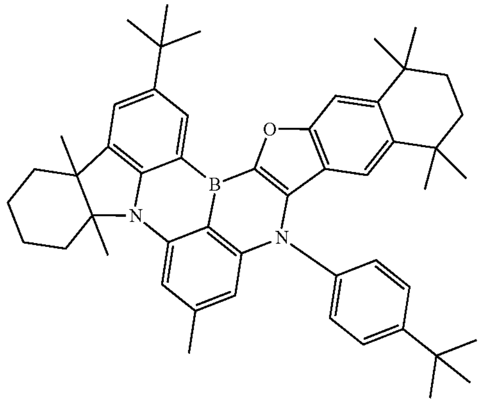
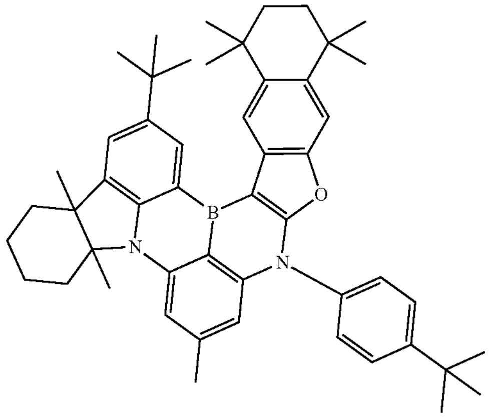
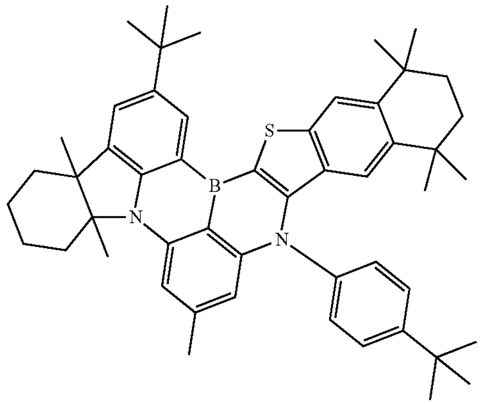
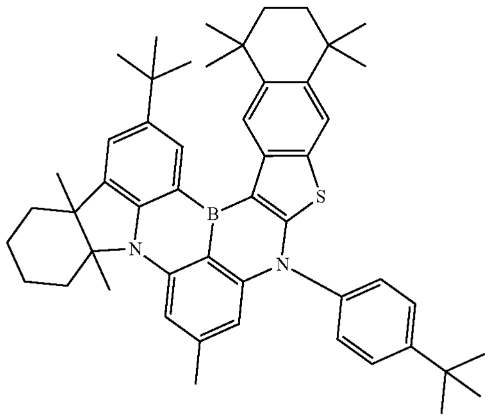

-continued
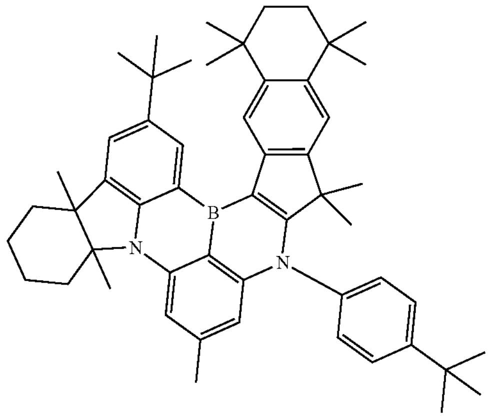
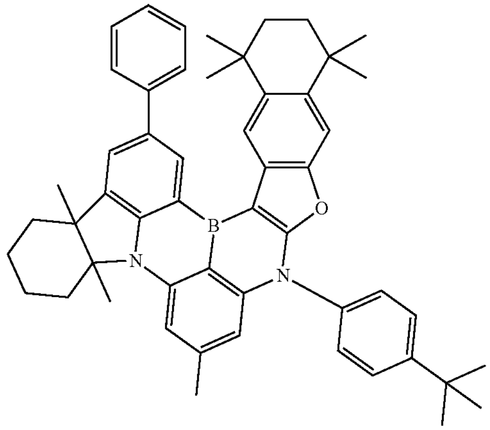
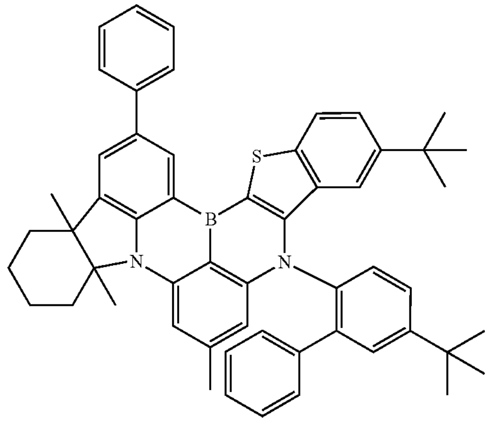
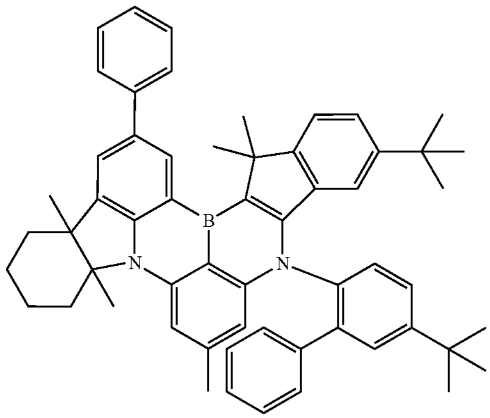
-continued
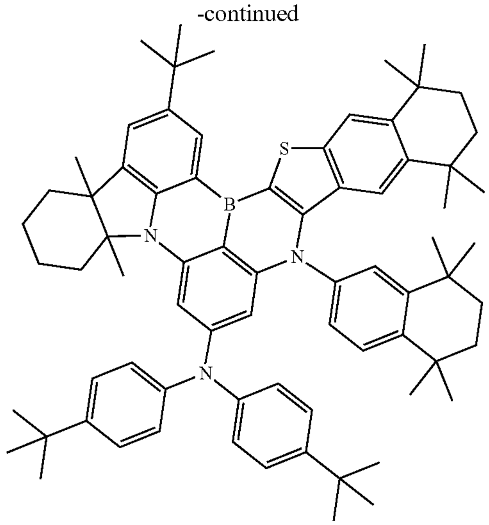
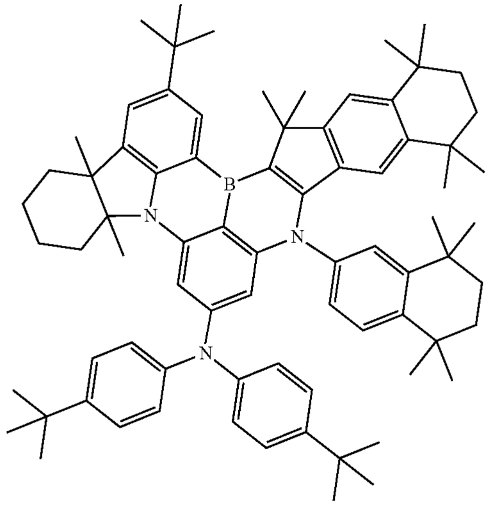
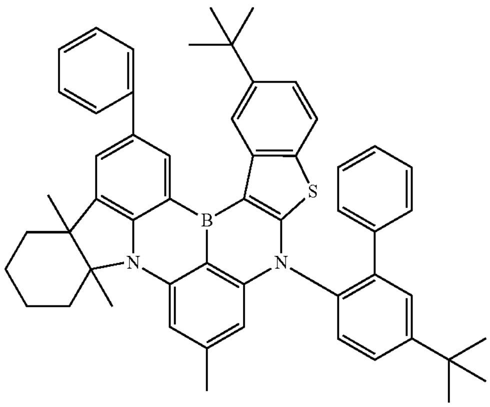

-continued
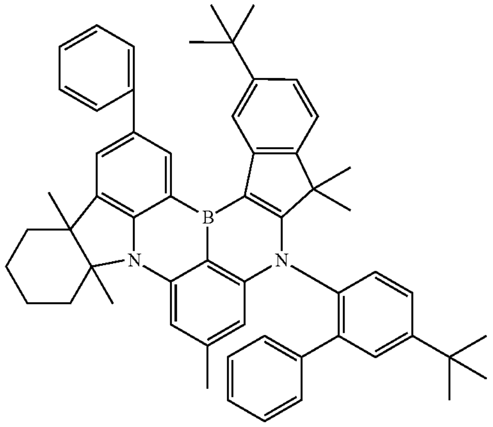
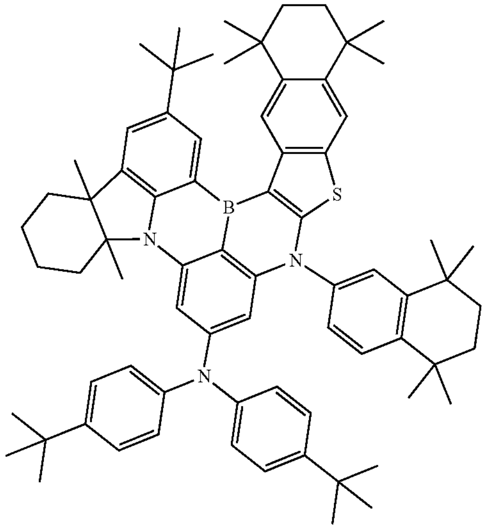
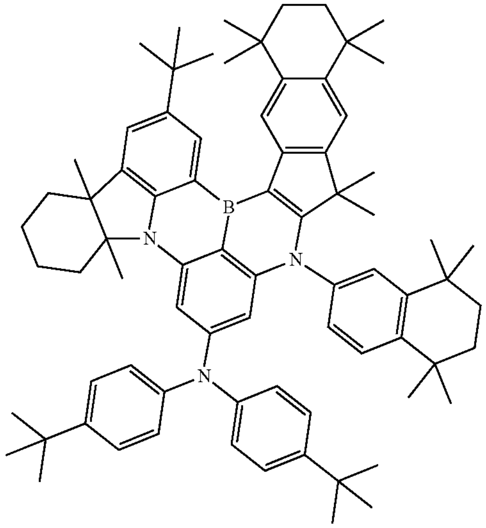
-continued
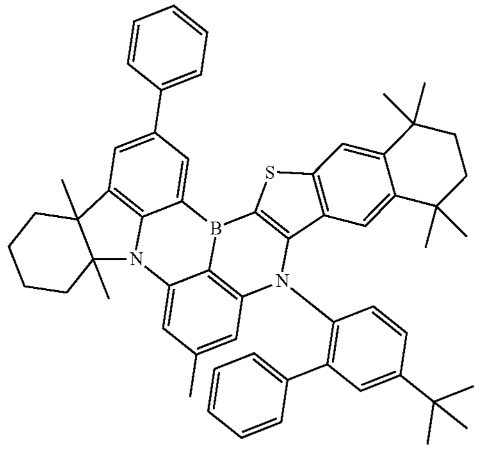
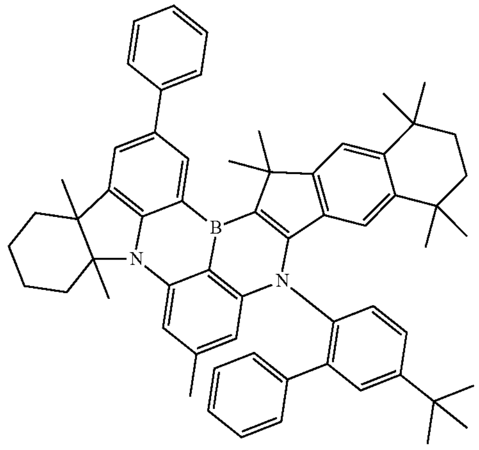
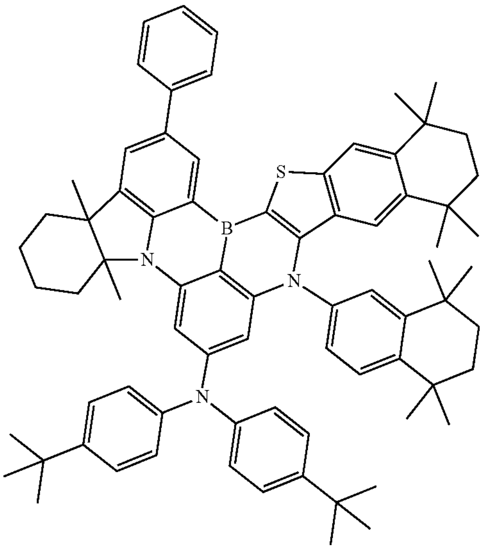

-continued
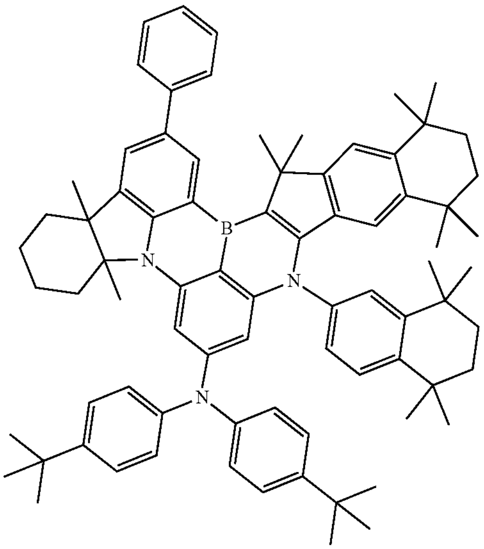
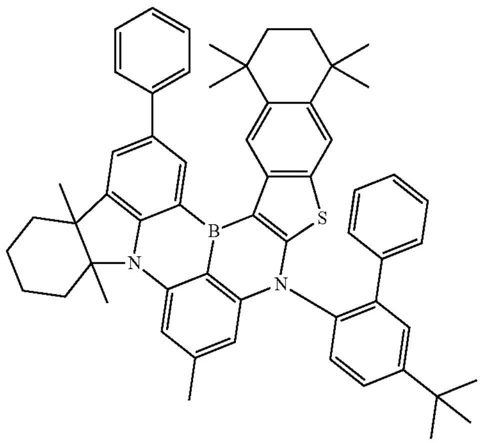
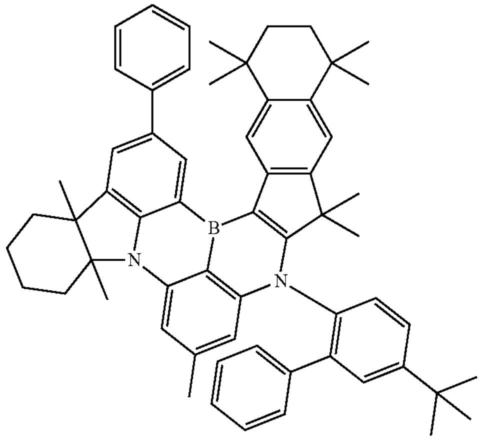
-continued
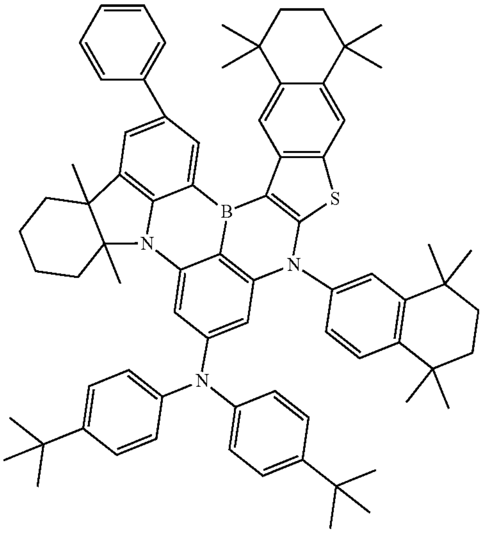
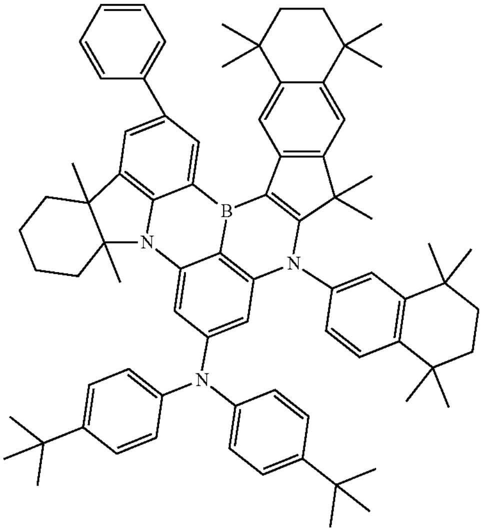
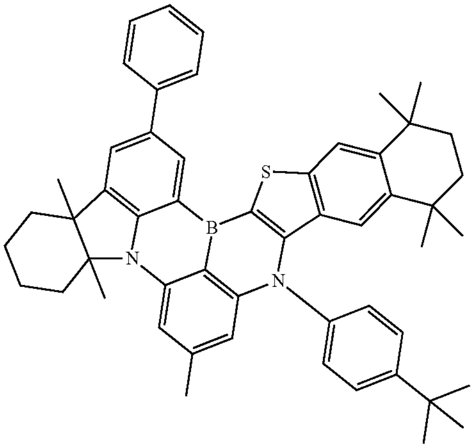

-continued
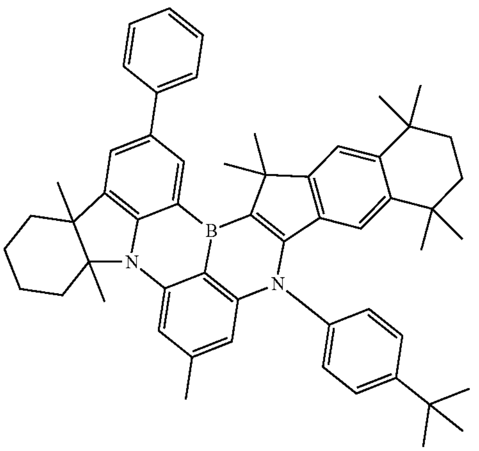
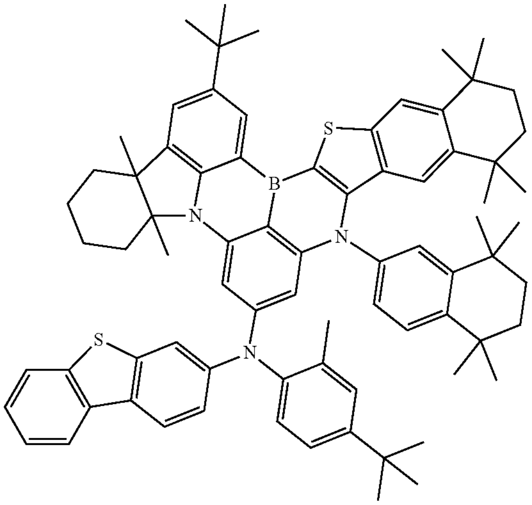
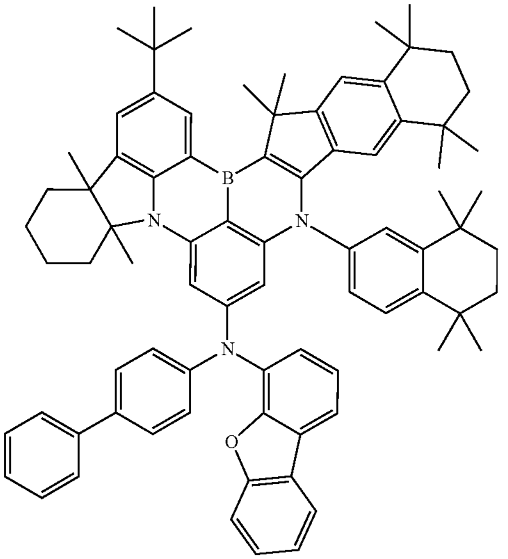
-continued
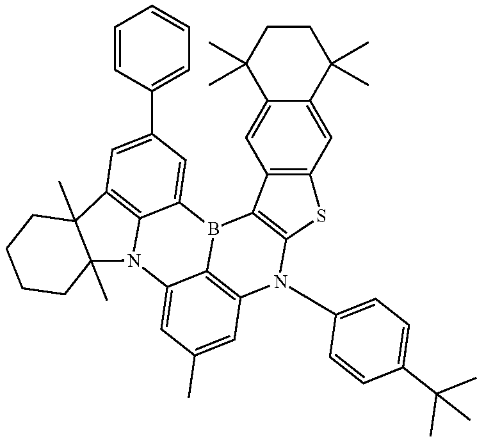
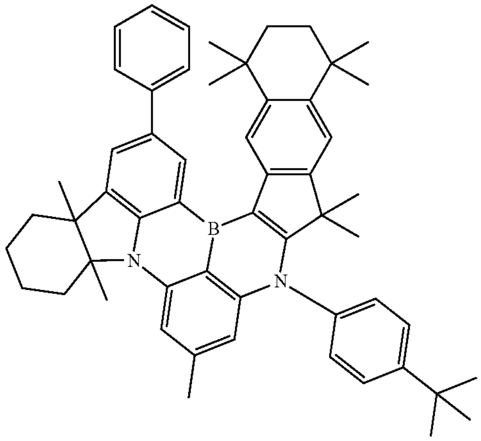
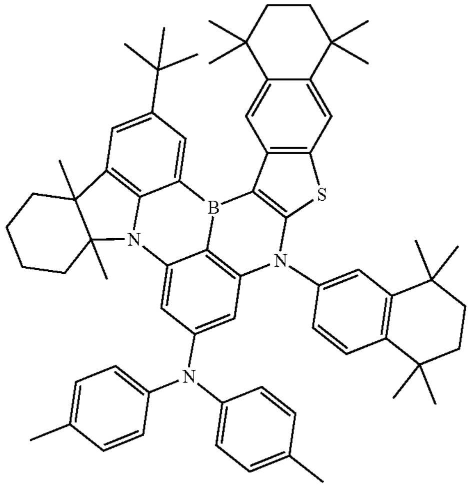

-continued
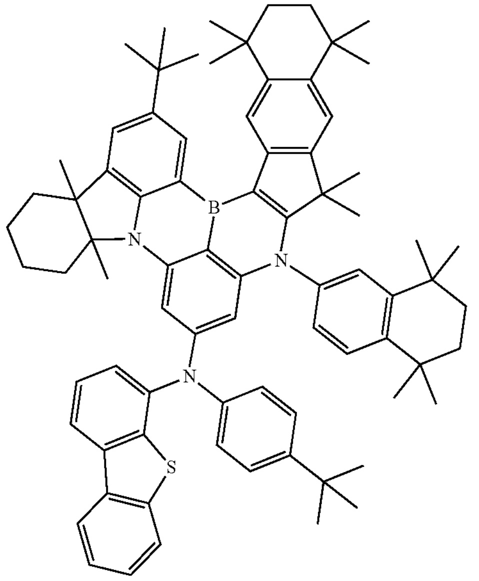
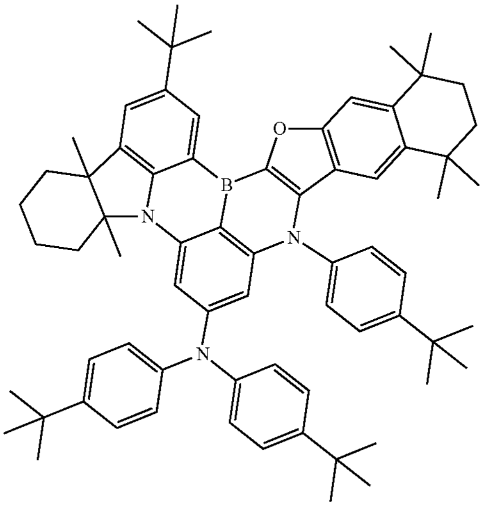
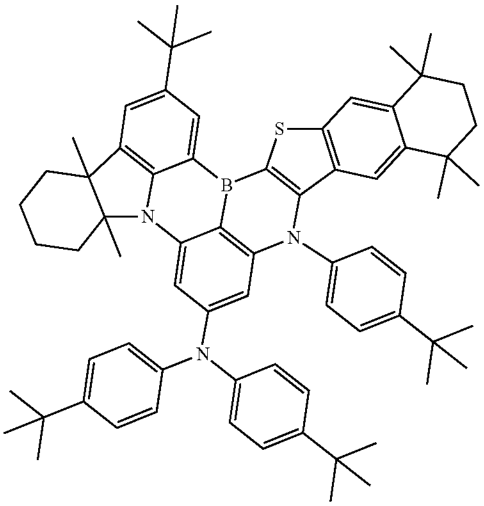
-continued
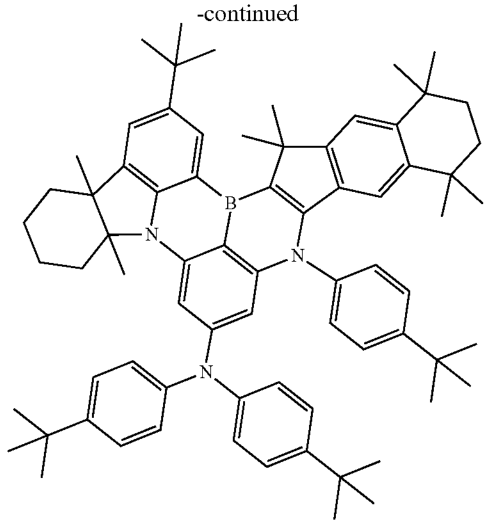
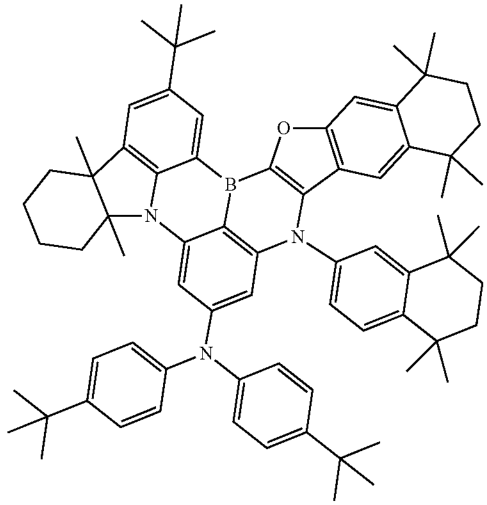
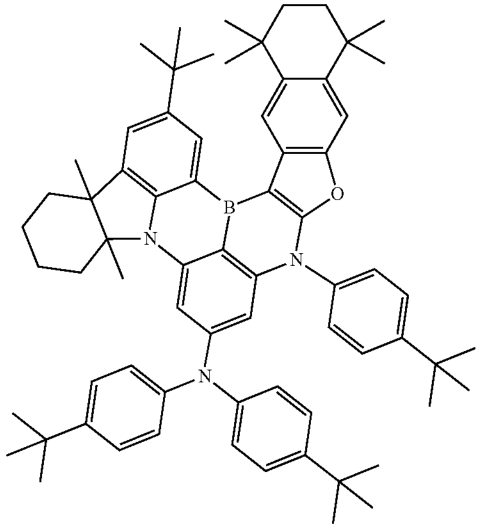

-continued
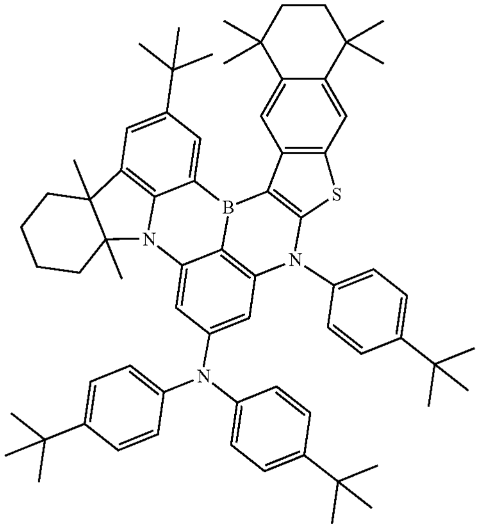
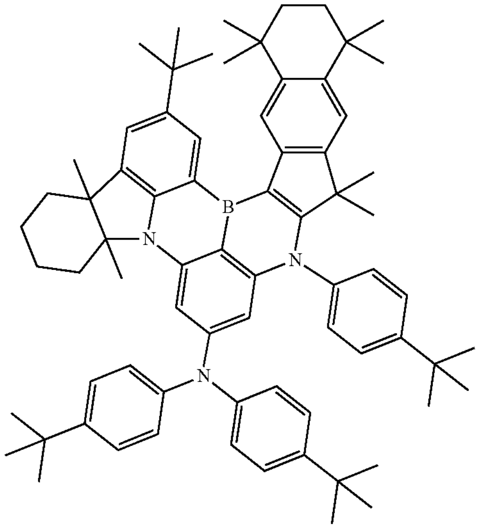
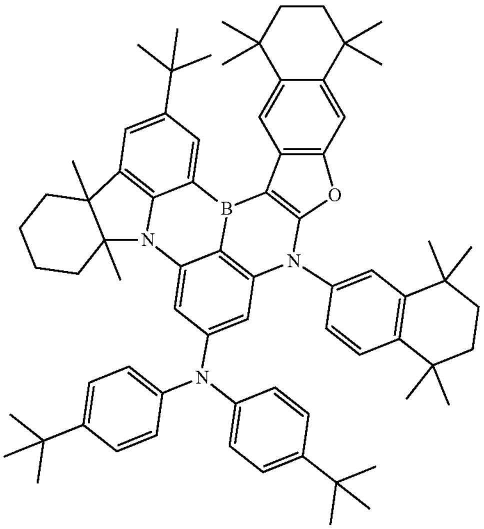
-continued
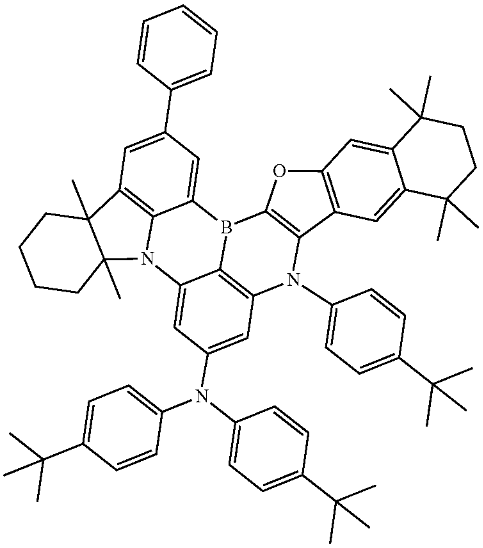
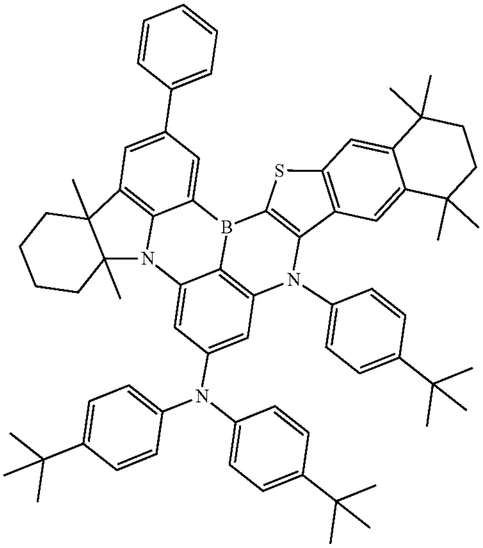
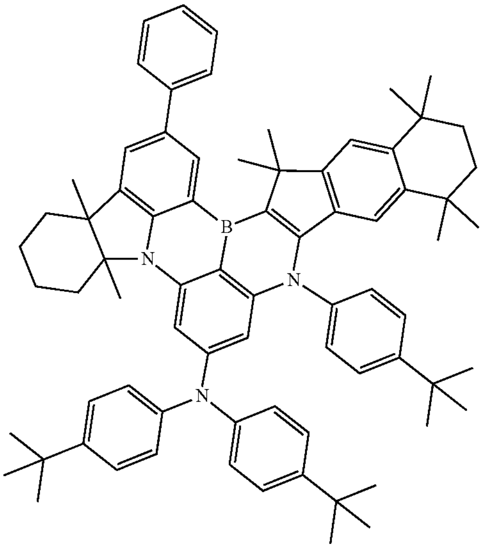

-continued
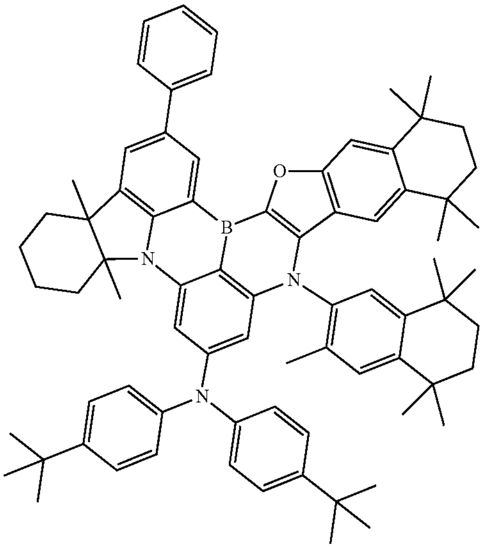
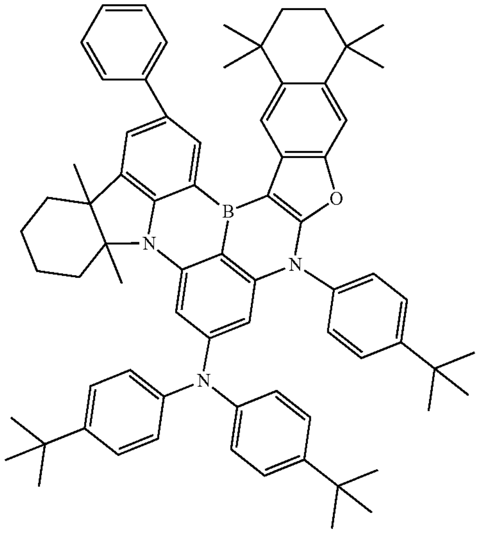
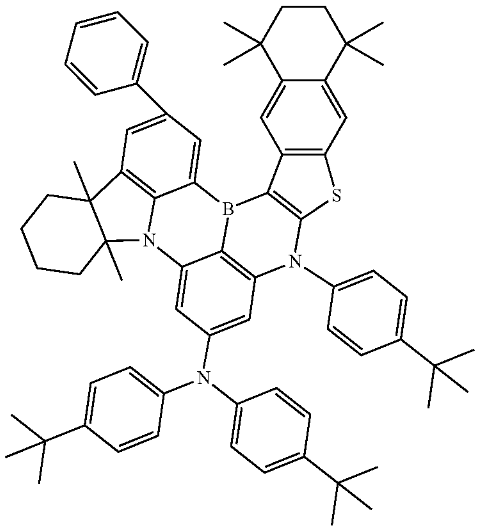
-continued
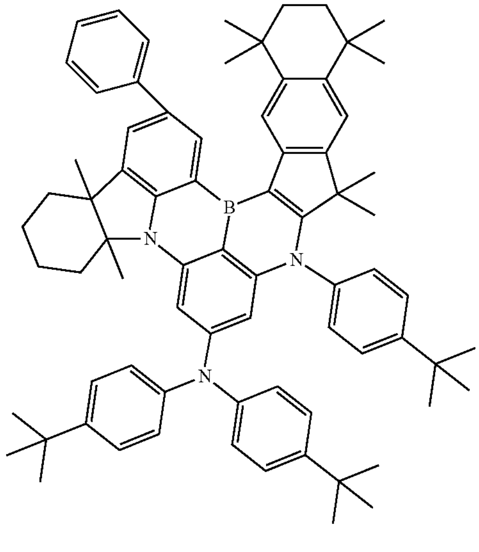
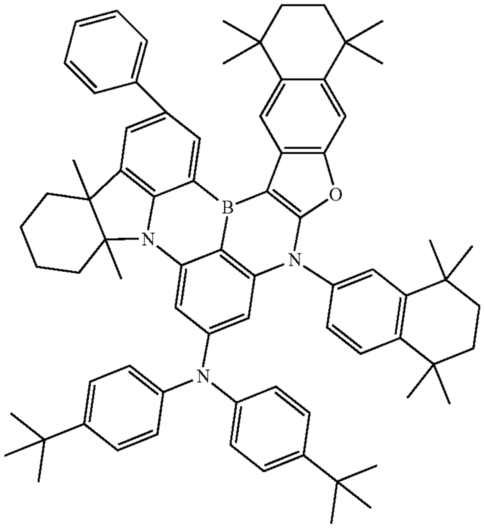
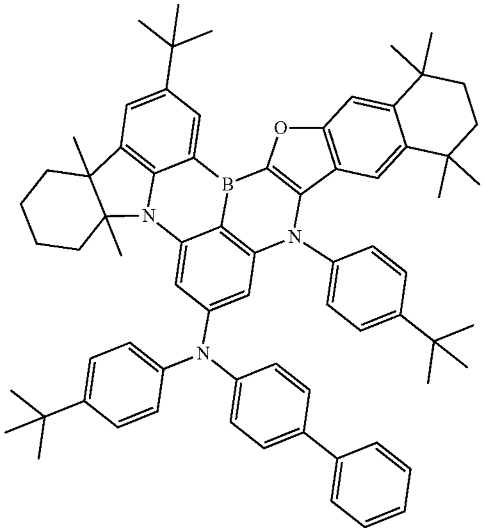

-continued
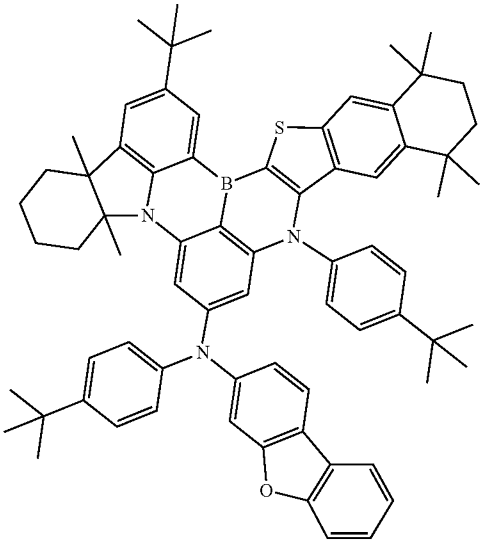
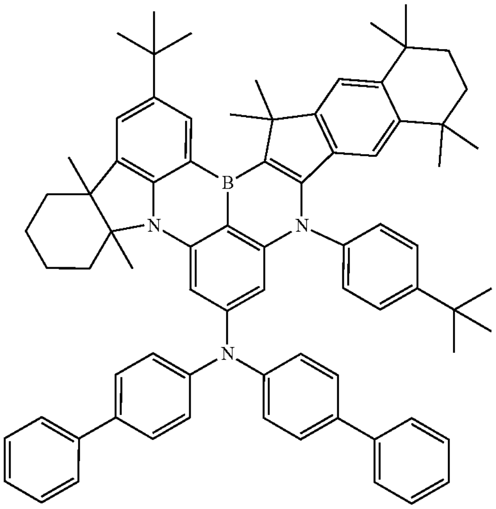
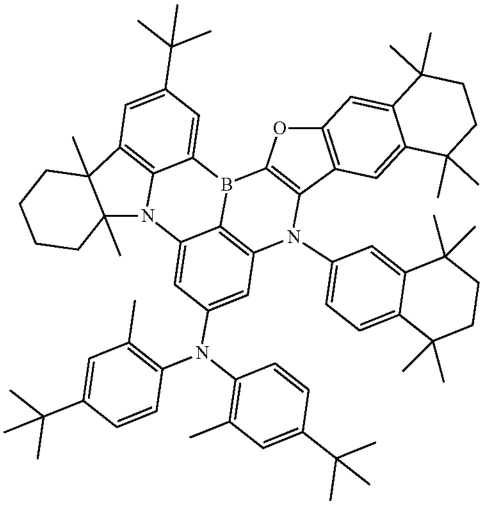
-continued
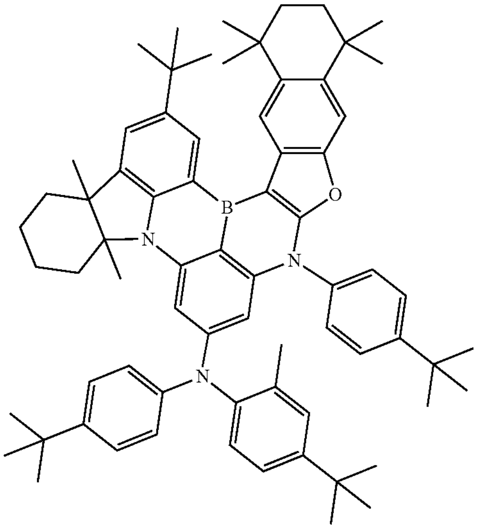
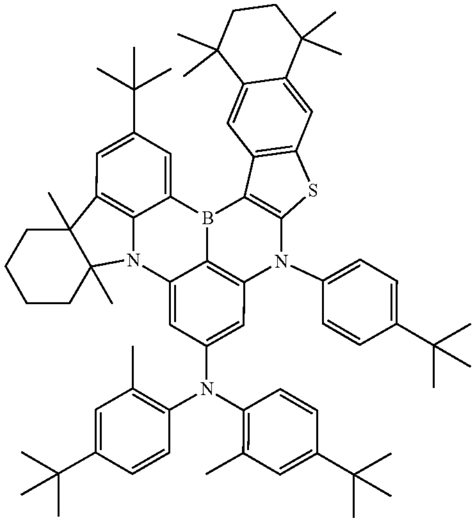
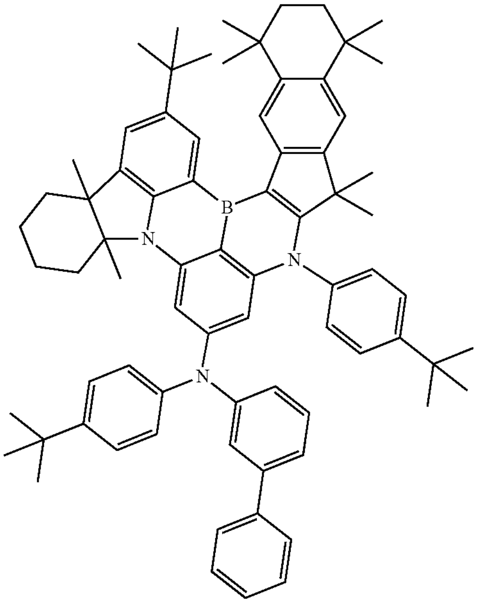

-continued
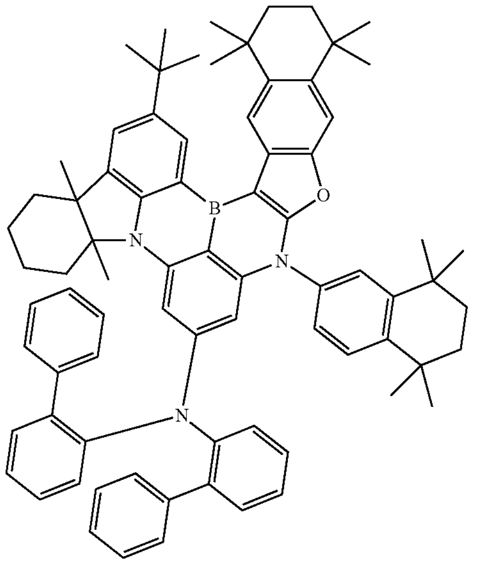
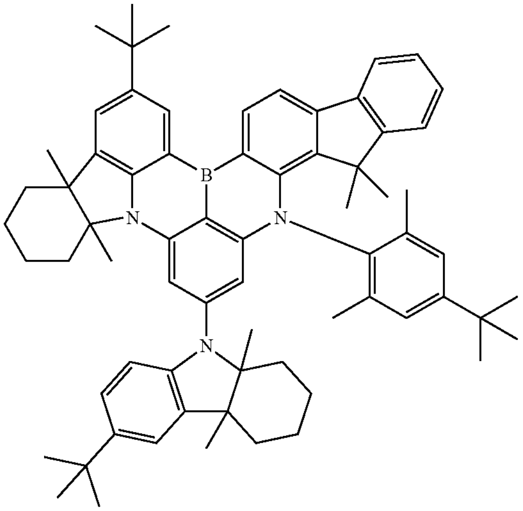
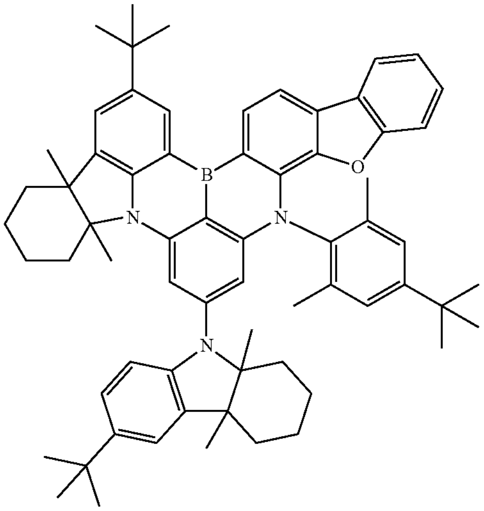
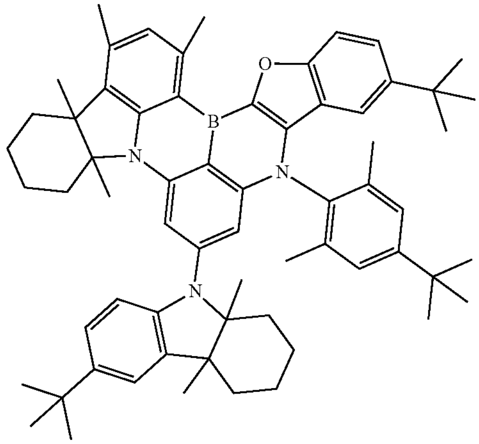
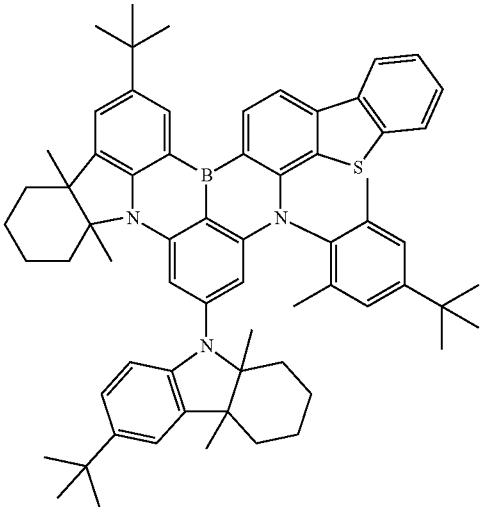
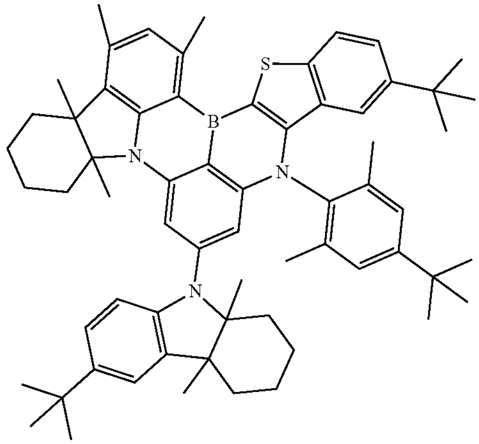
-continued -continued
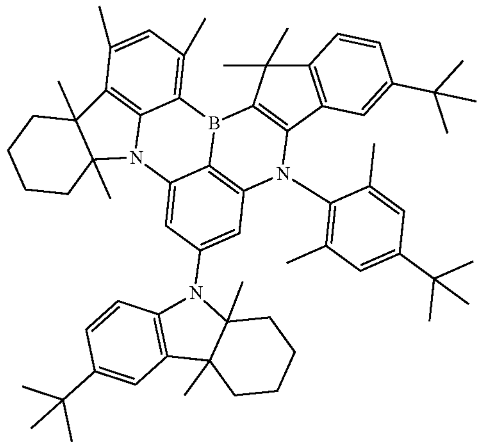
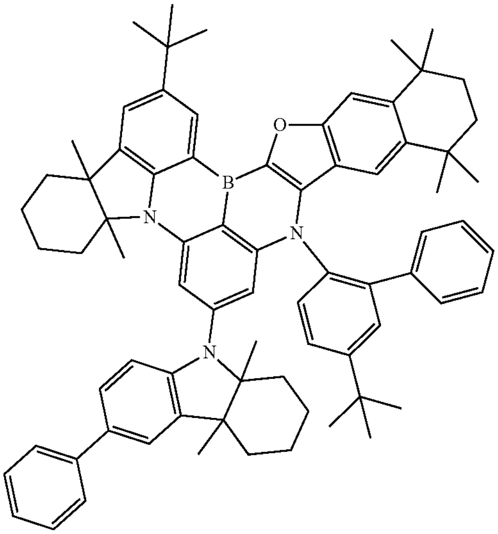
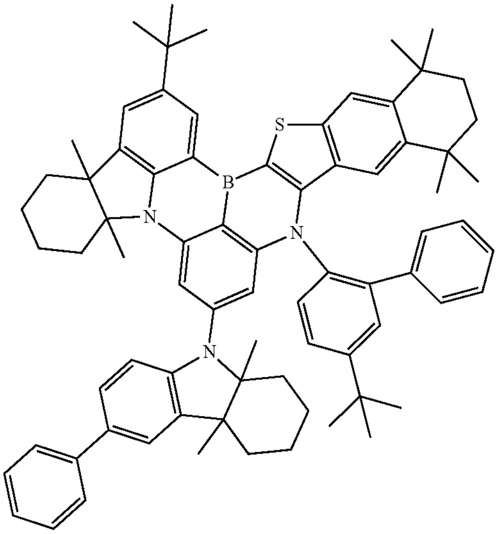
-continued
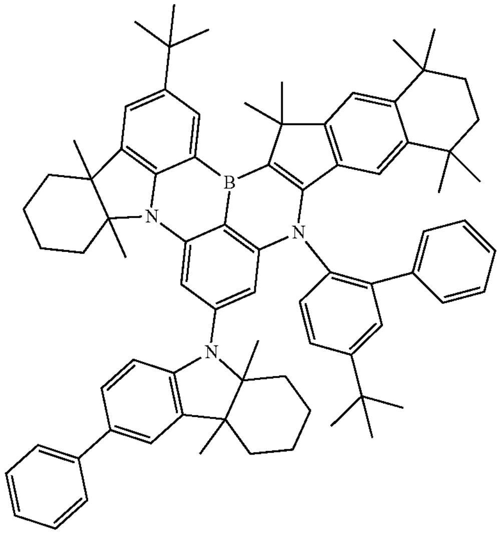
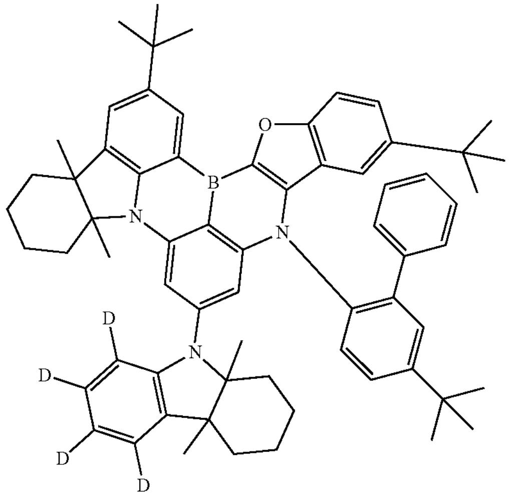
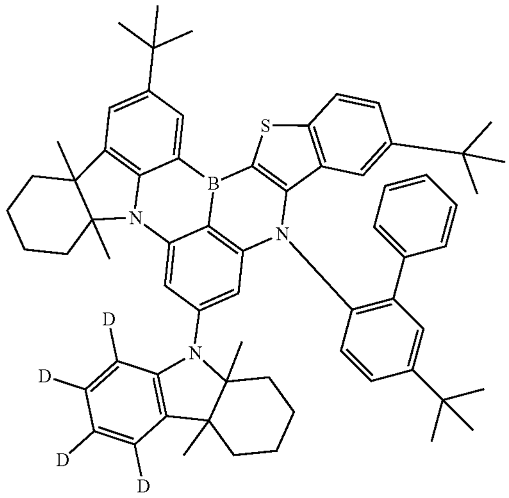

-continued
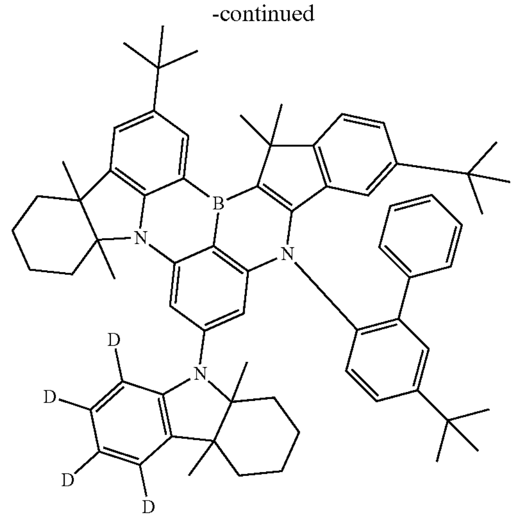
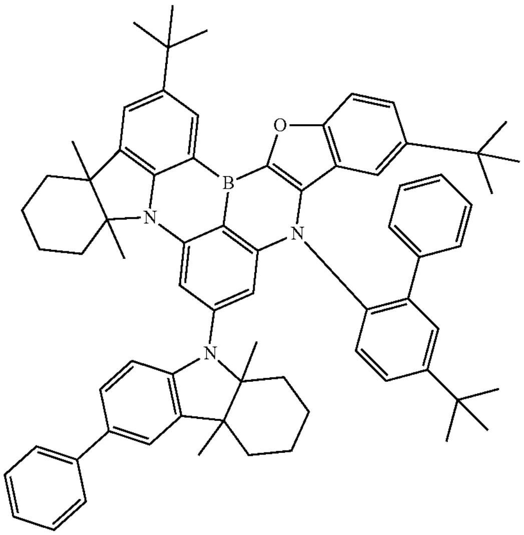
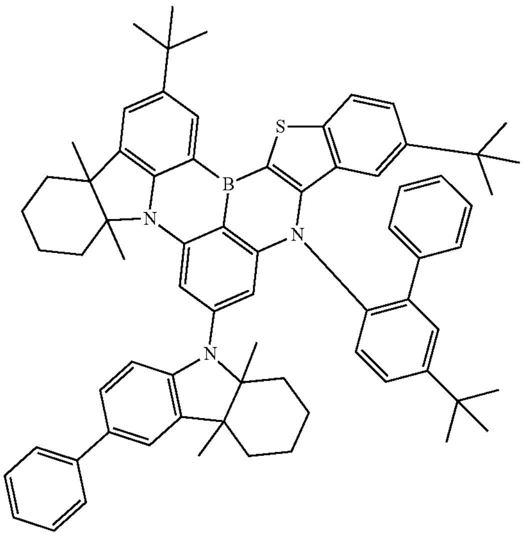
-continued
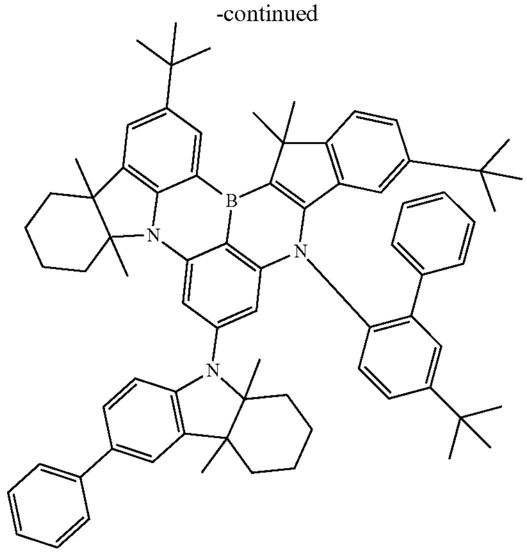
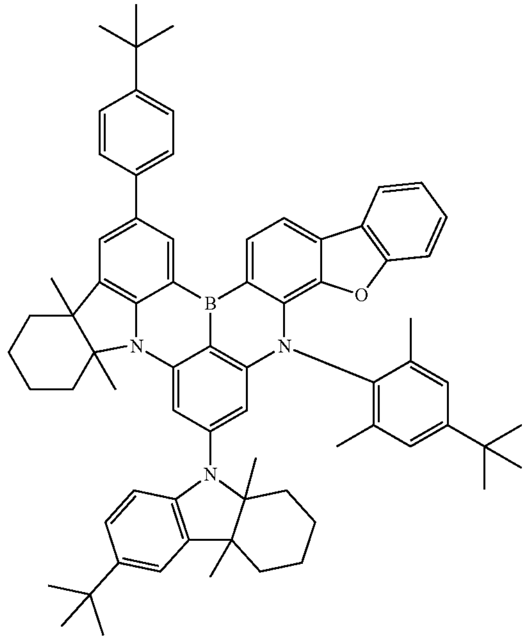
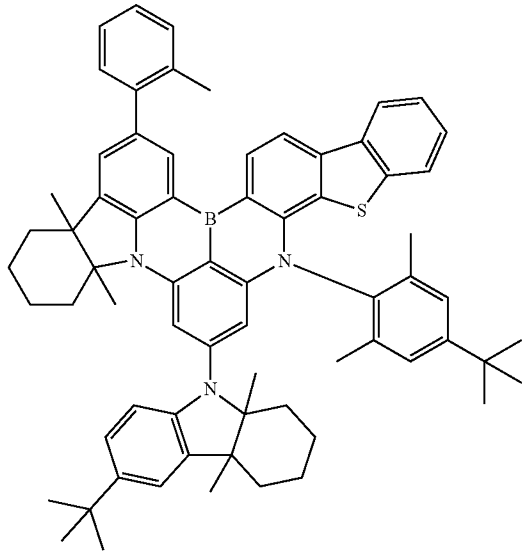

-continued
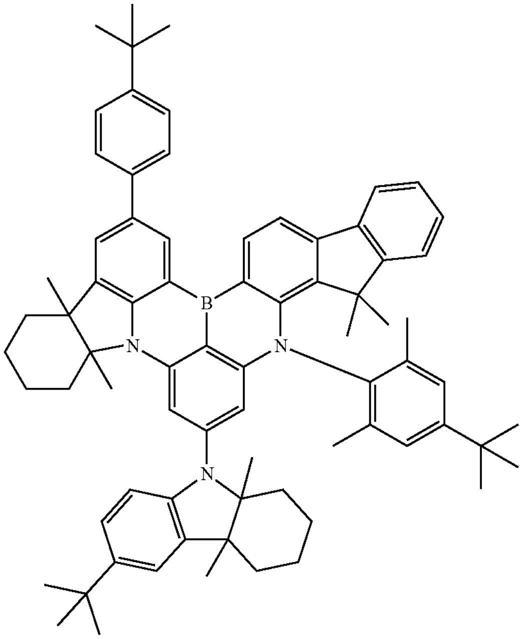
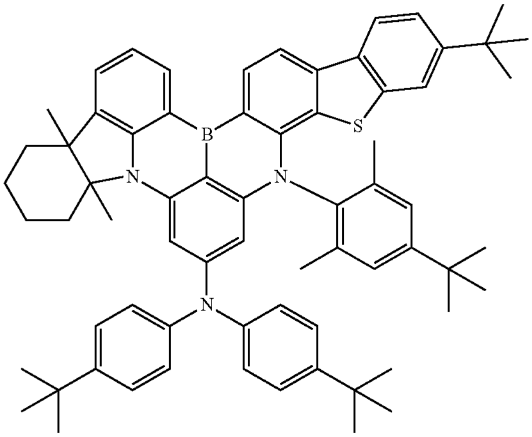
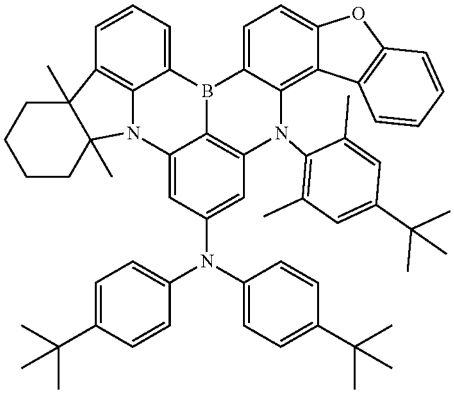
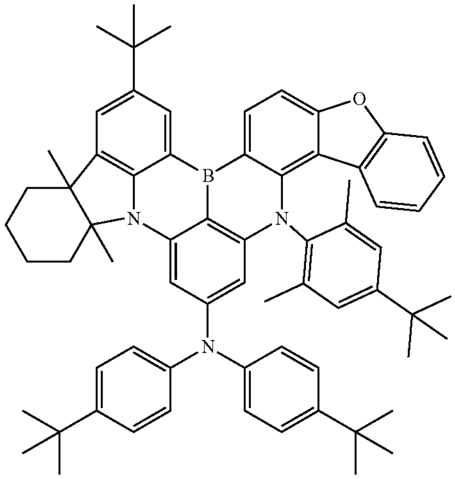
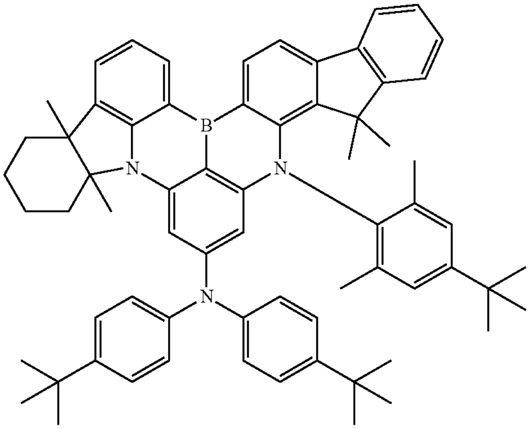
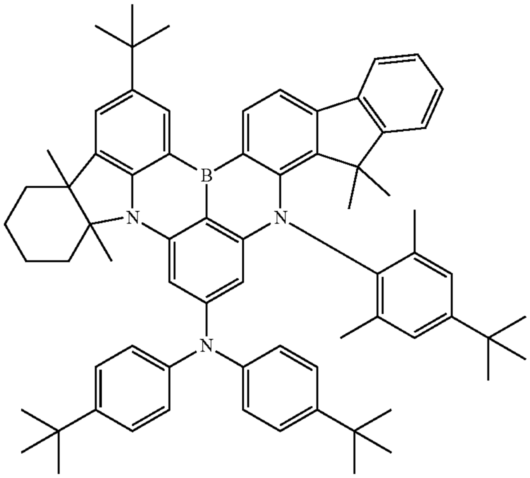
-continued -continued
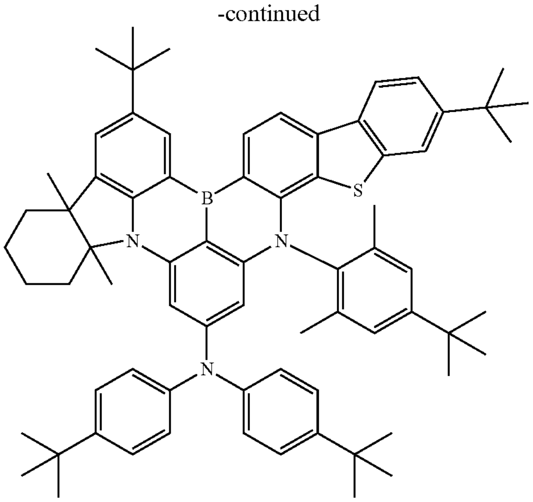
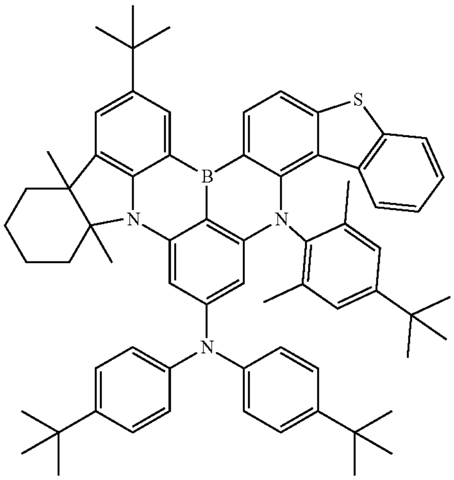
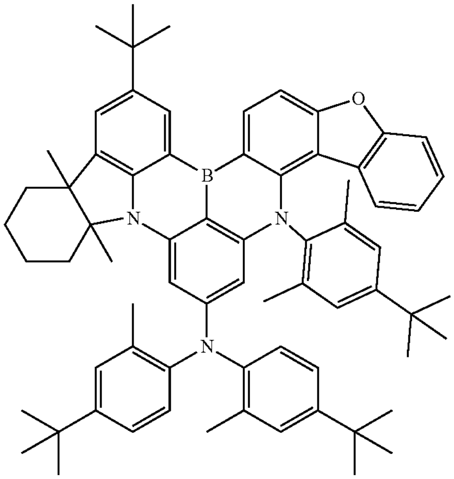
-continued
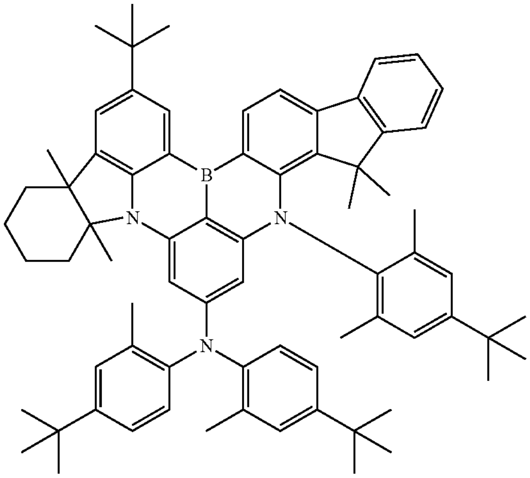
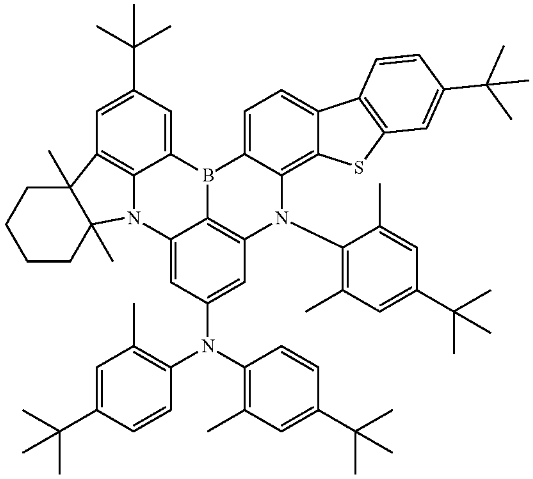
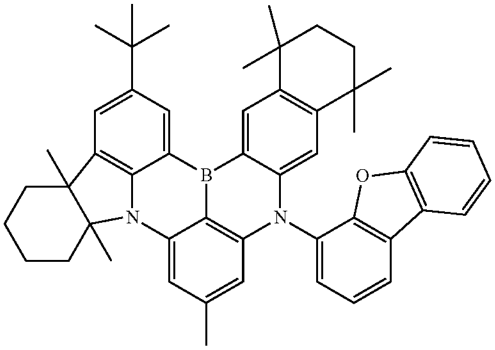

-continued
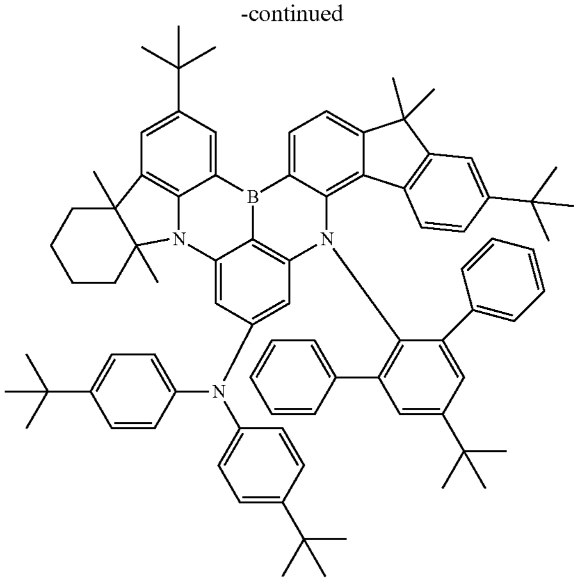
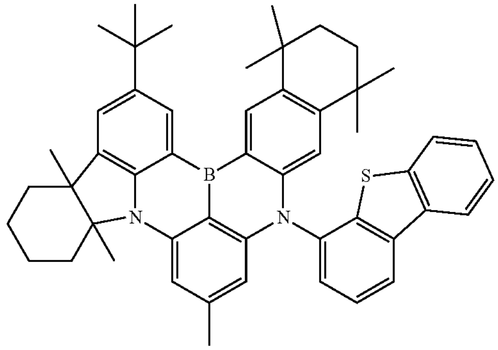
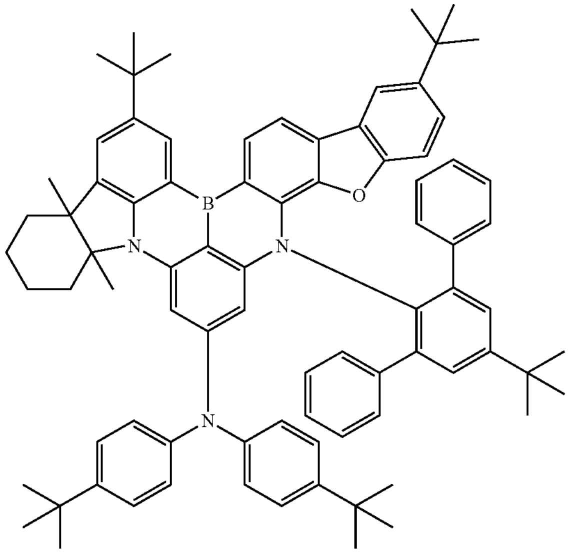
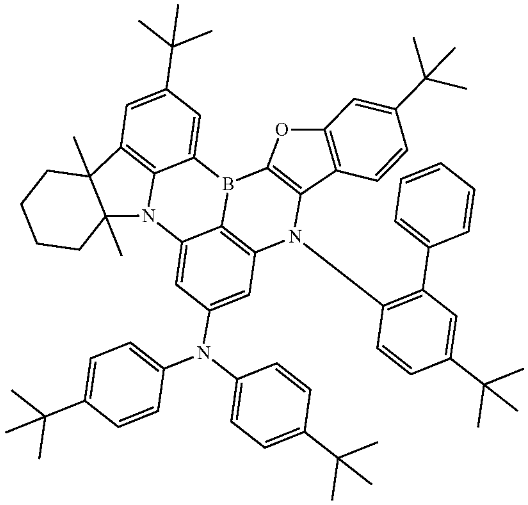
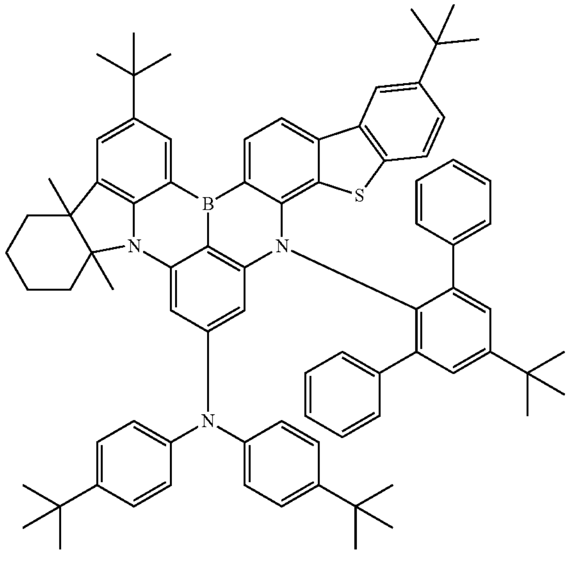
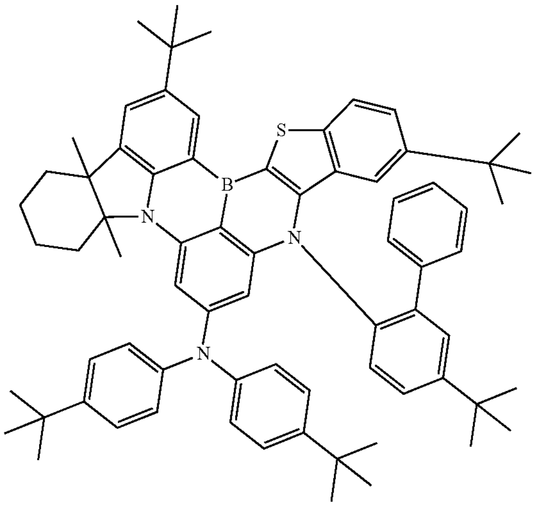

-continued
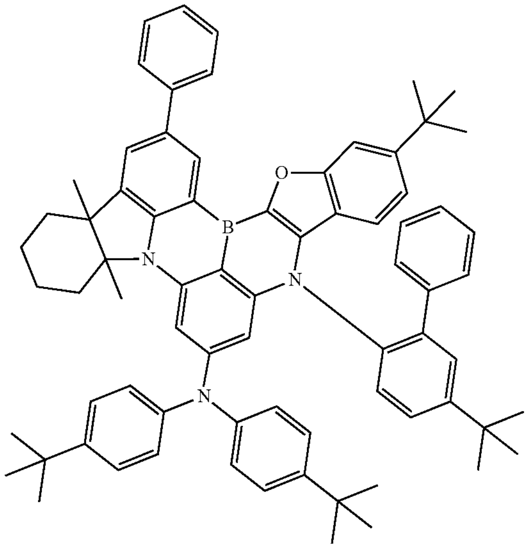
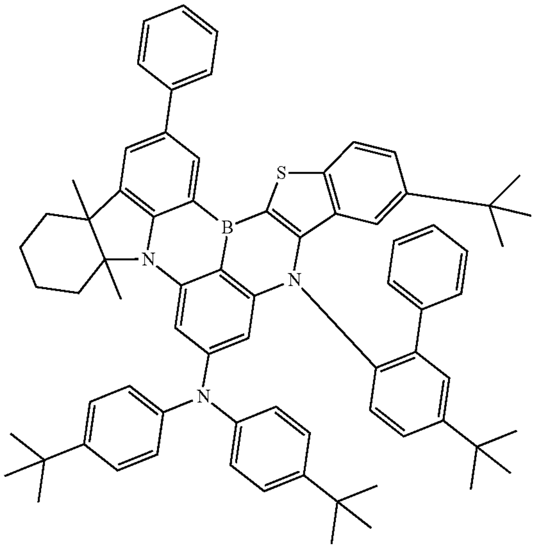
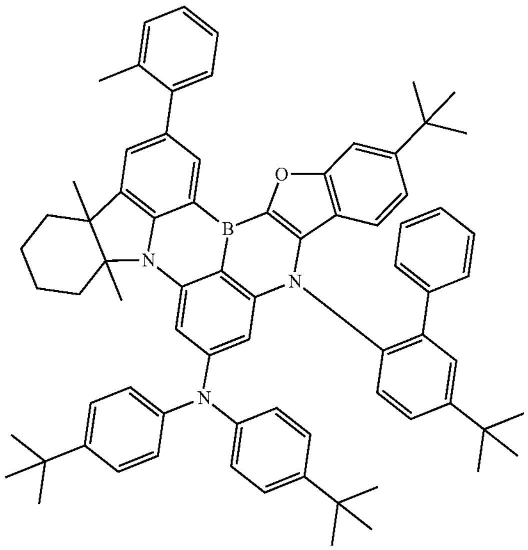
-continued
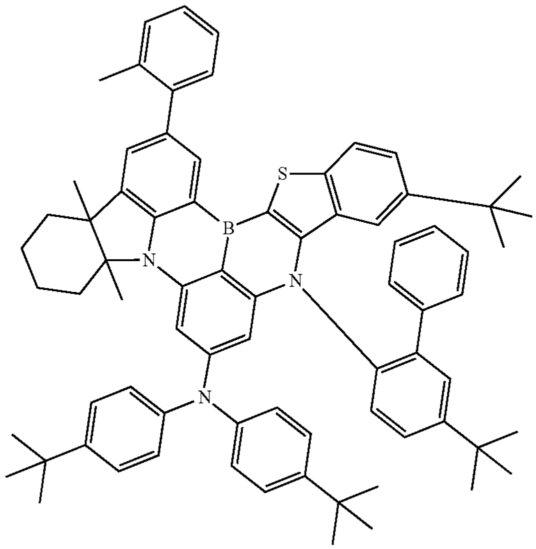
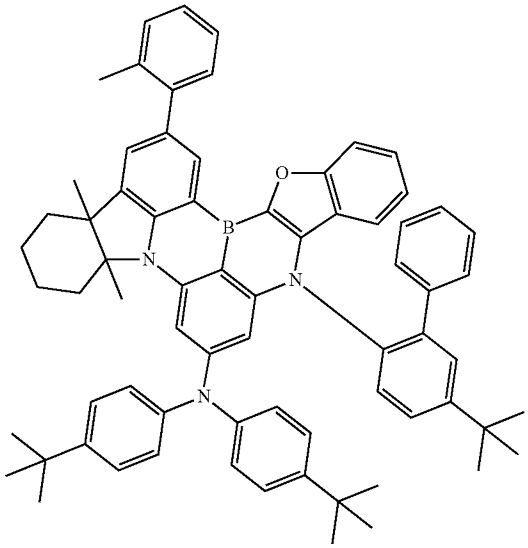
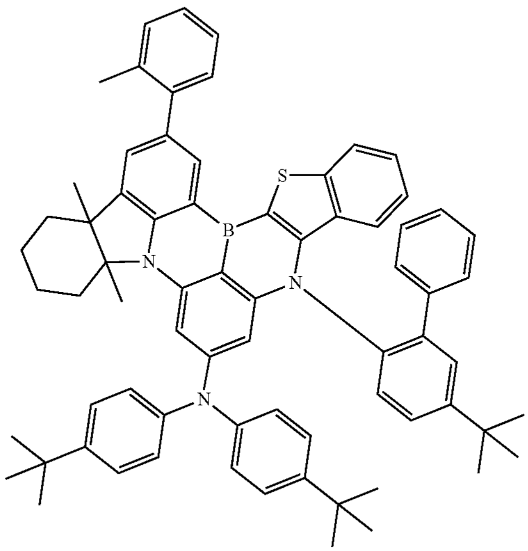

-continued
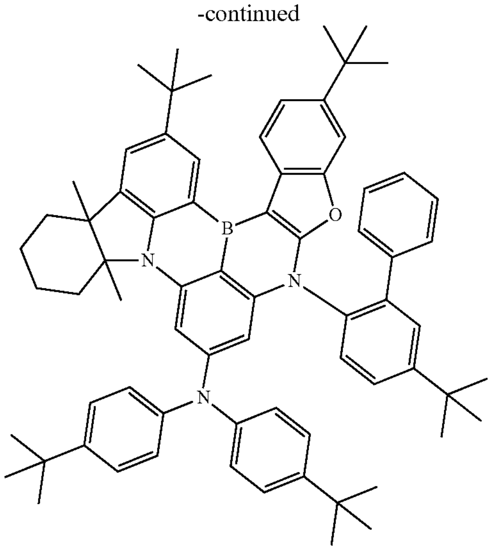
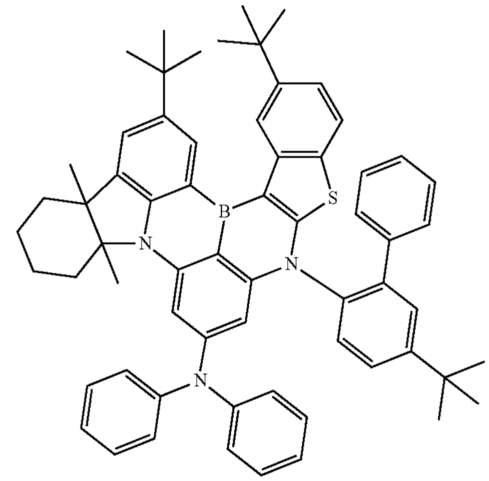
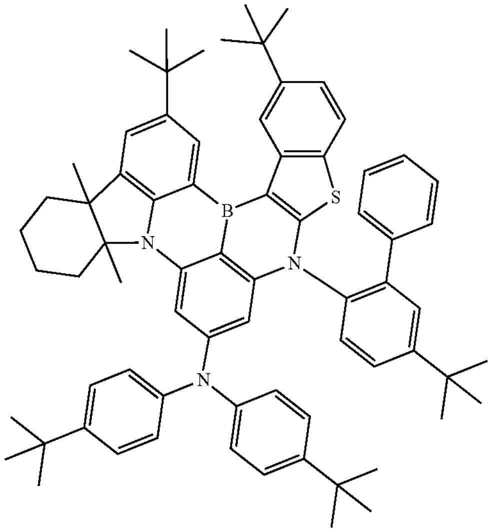
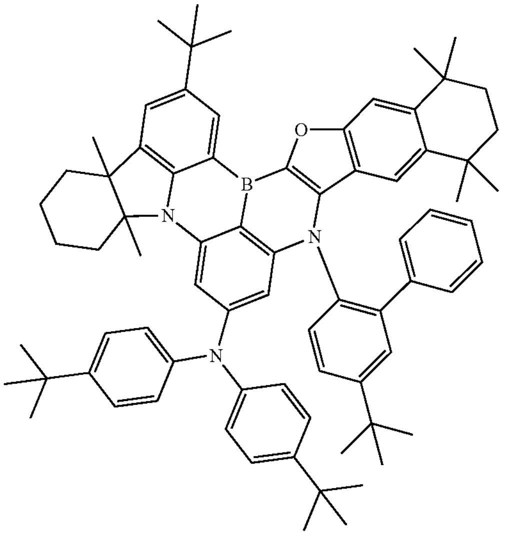
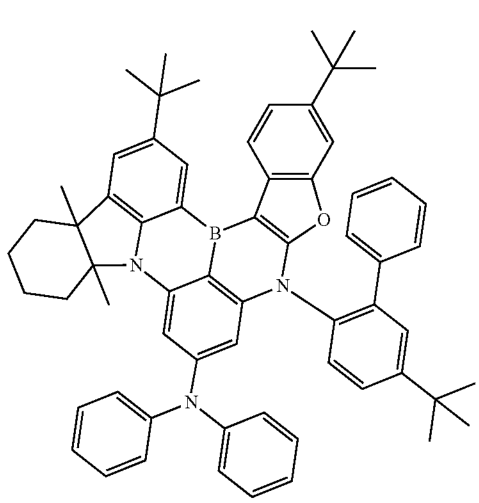
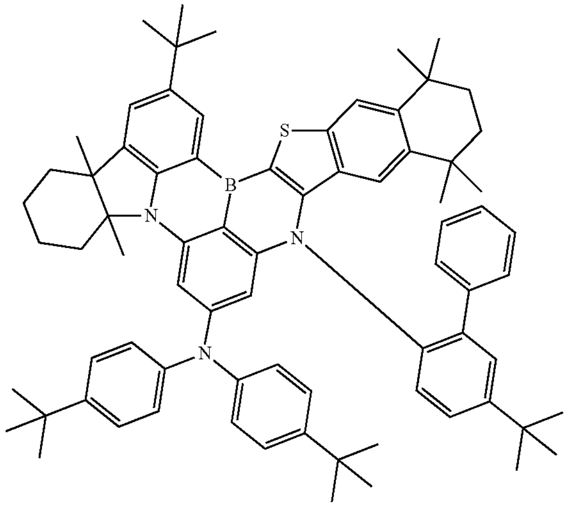

-continued
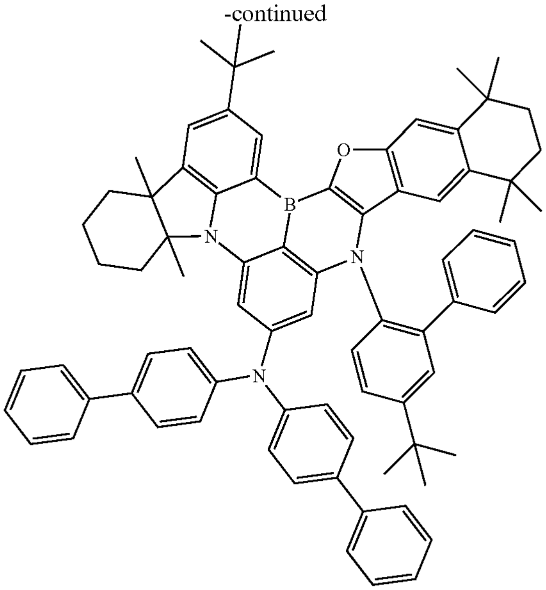
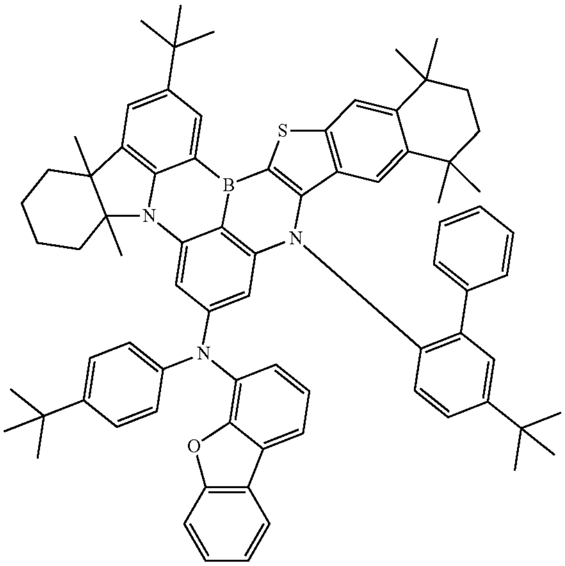
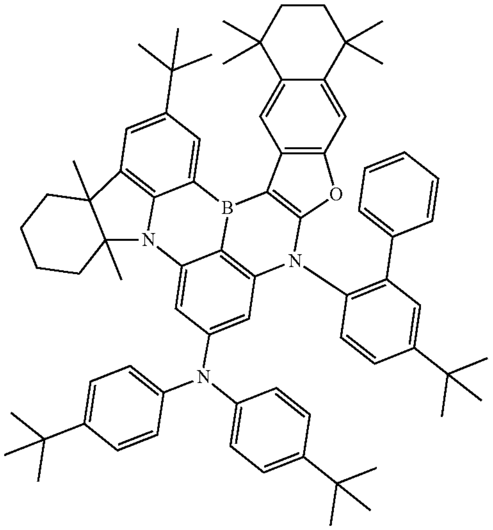
-continued
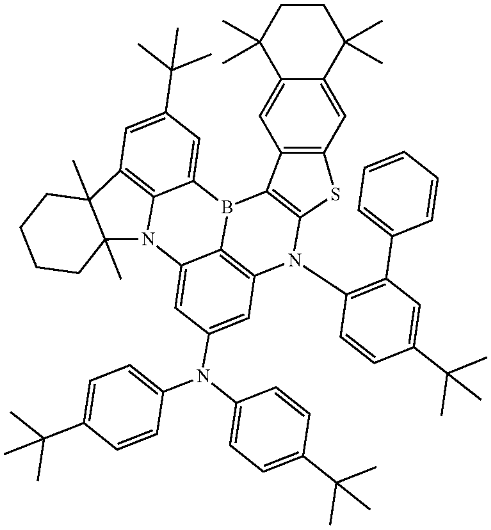
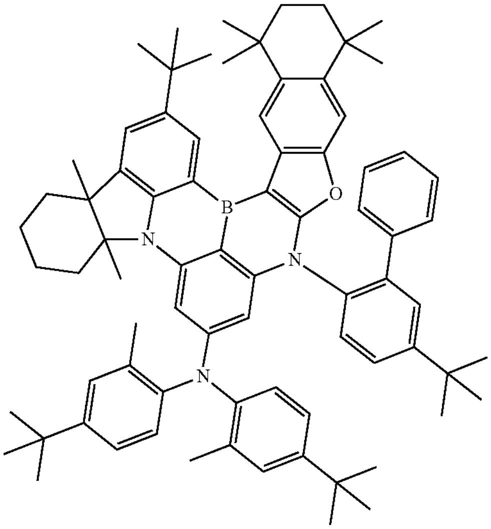
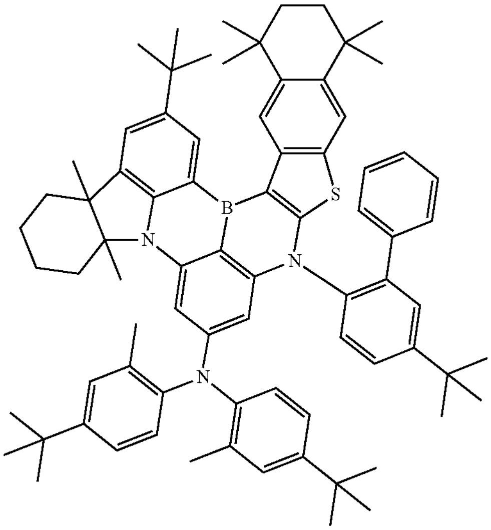

-continued
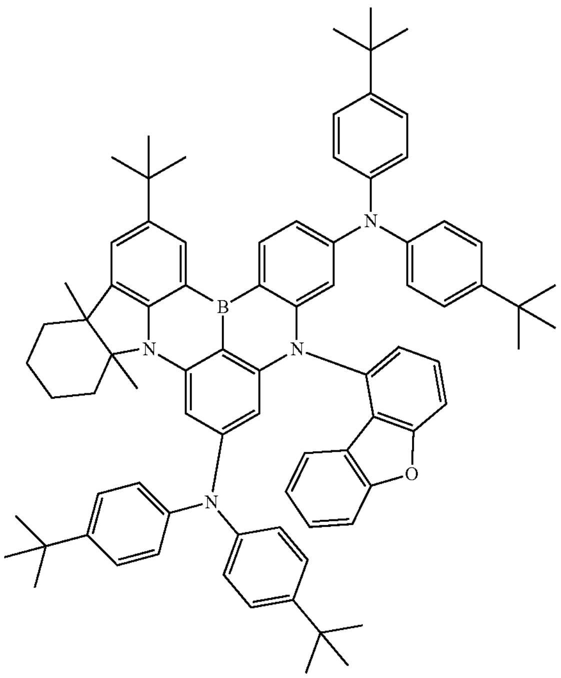
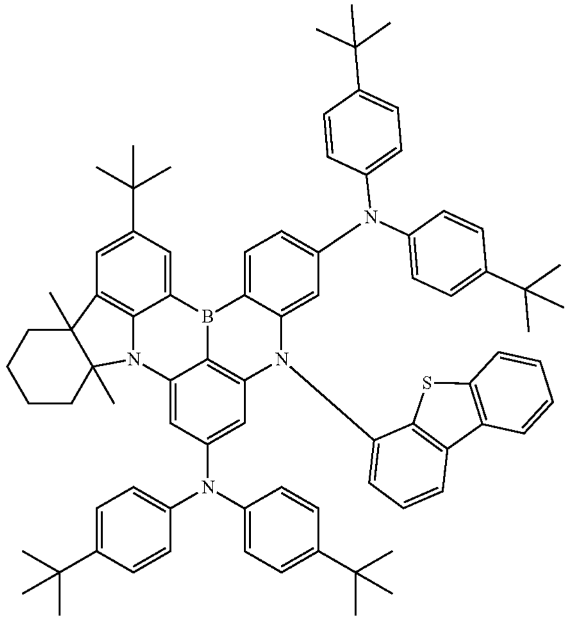
-continued
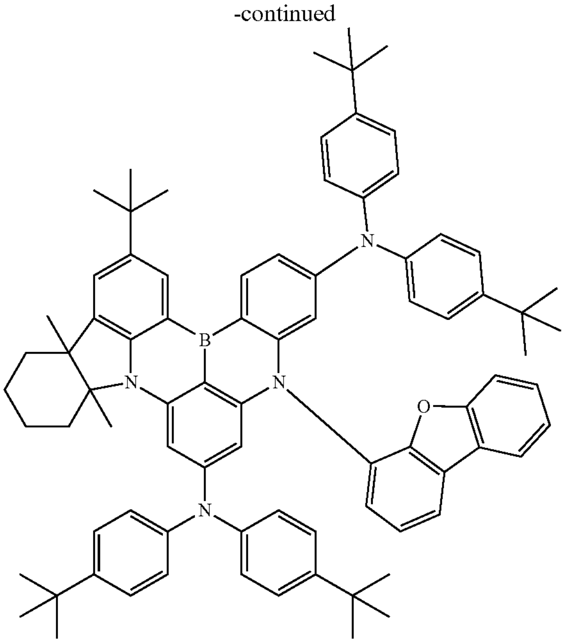
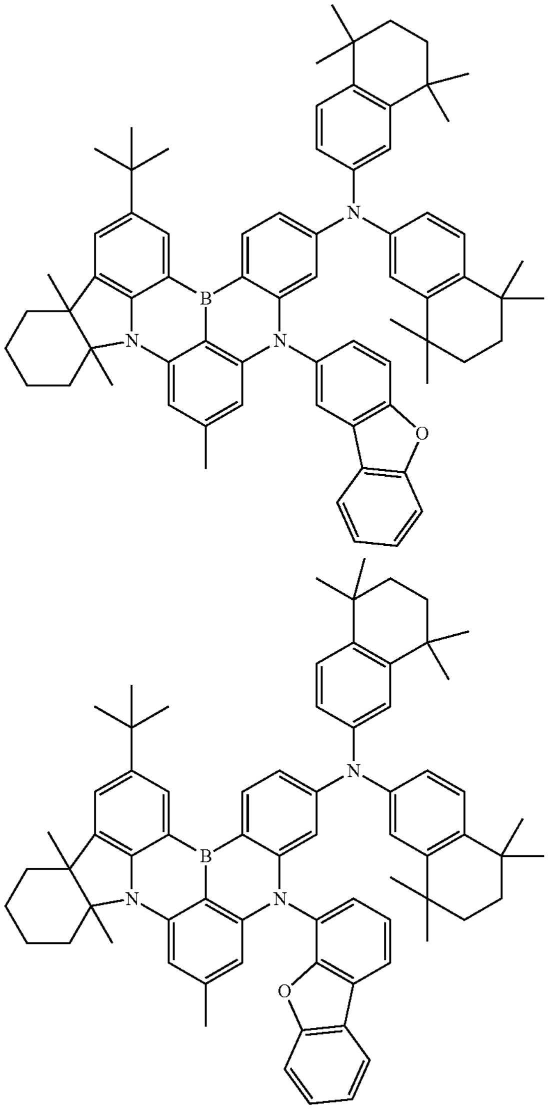

-continued
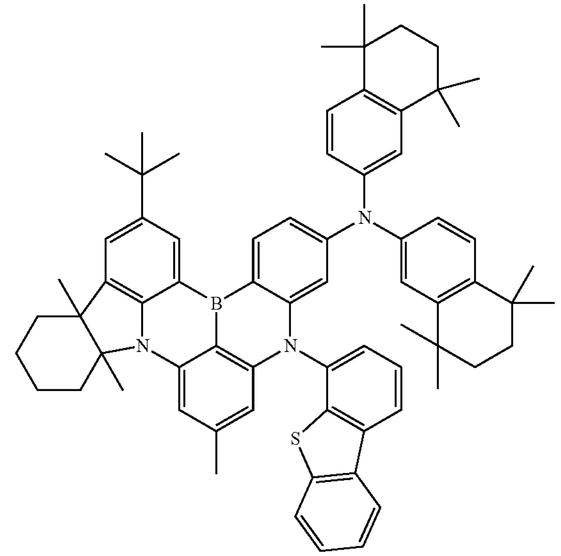
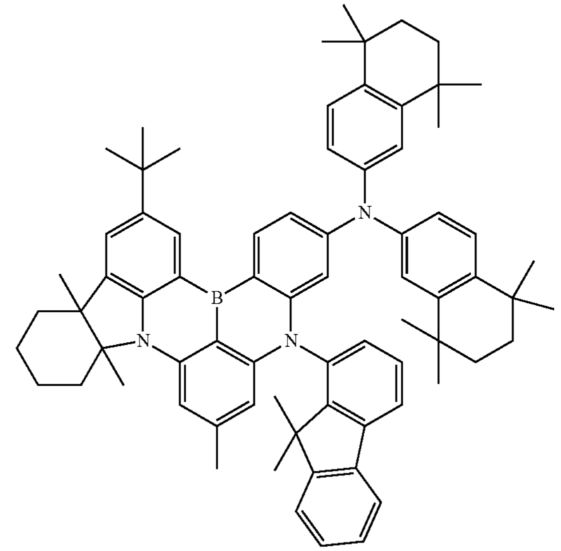
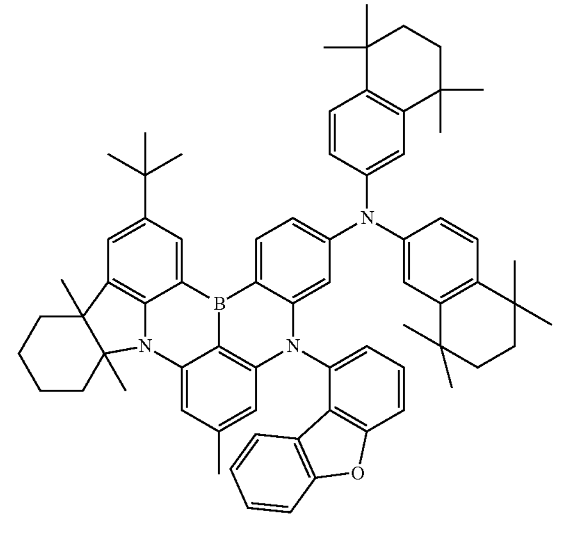
-continued
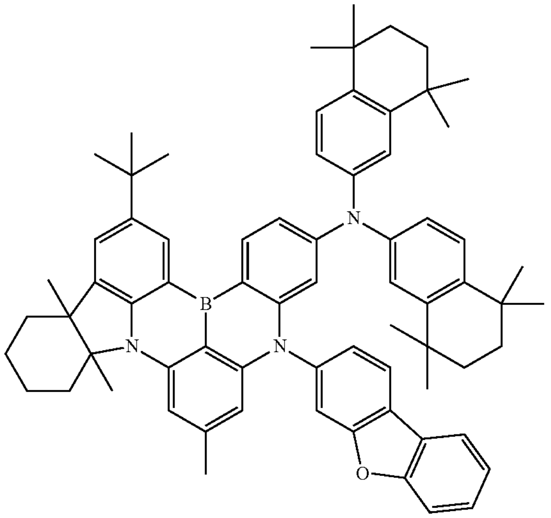
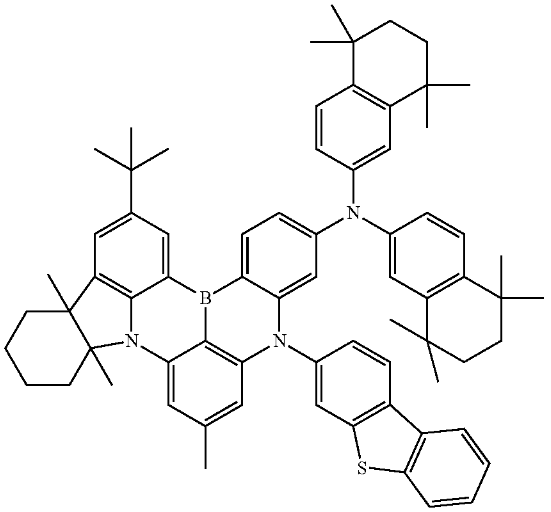
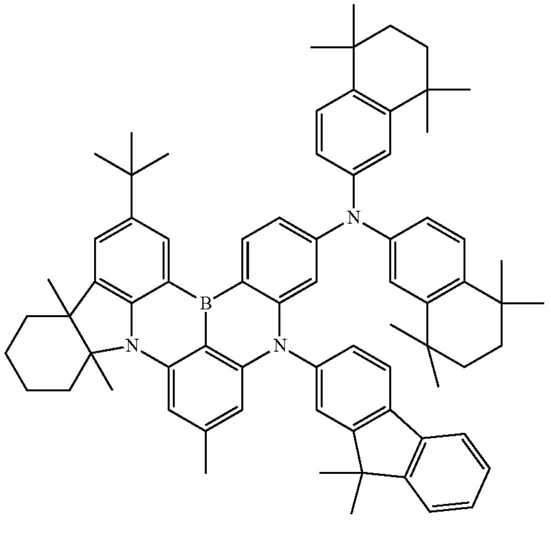

-continued
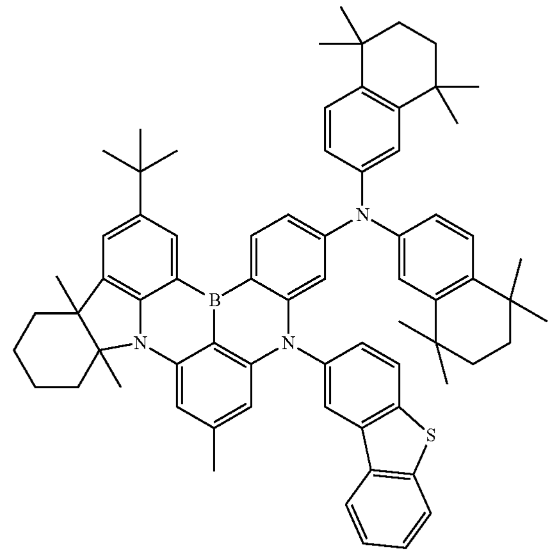
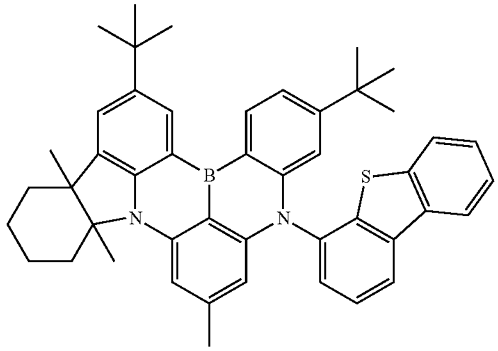
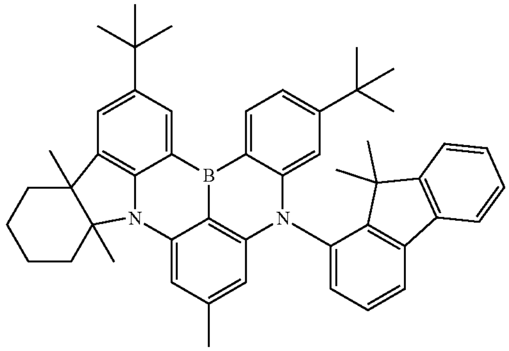
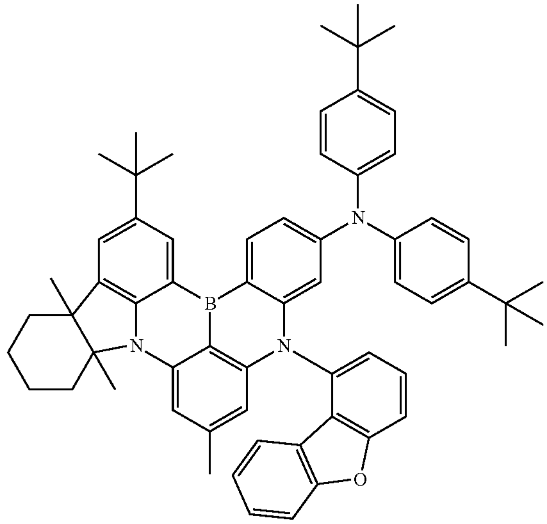
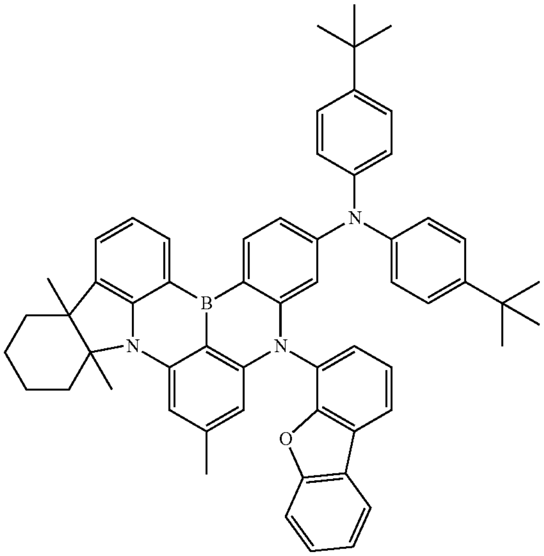
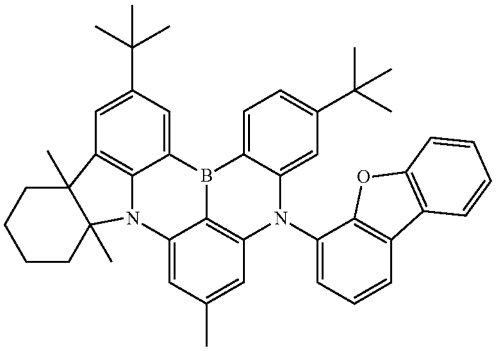
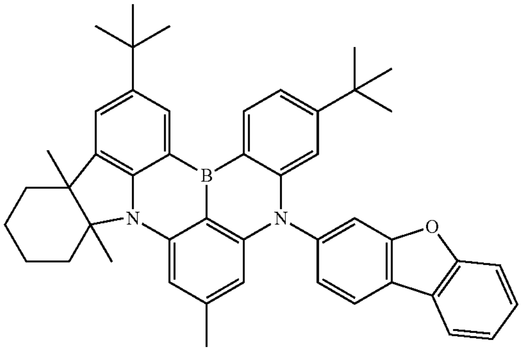

-continued
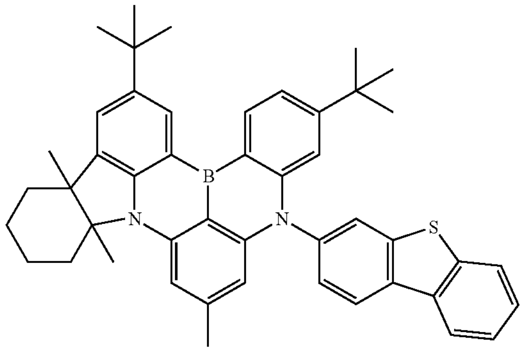
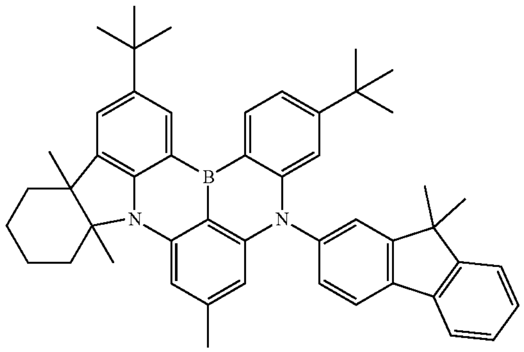
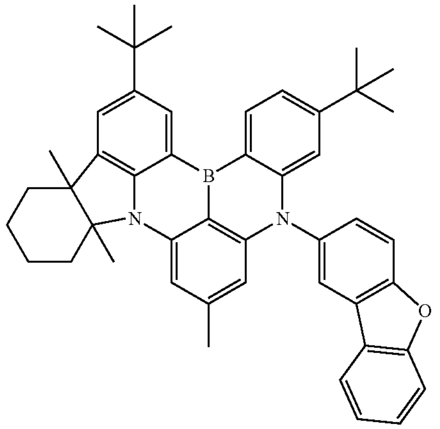
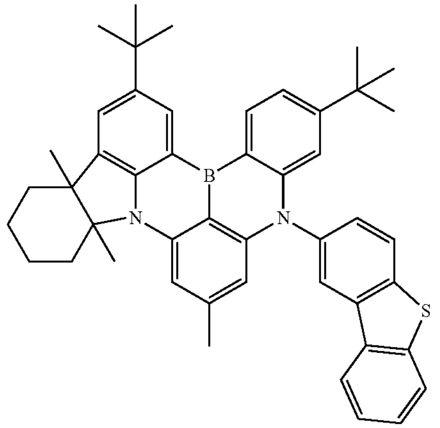
-continued
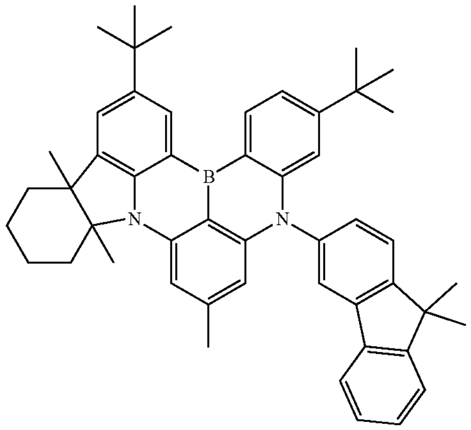
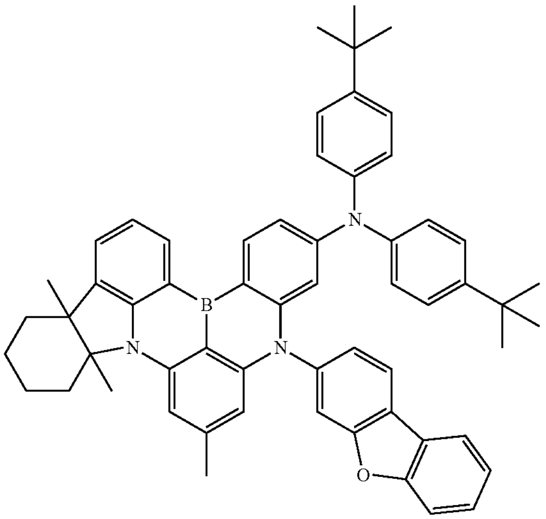
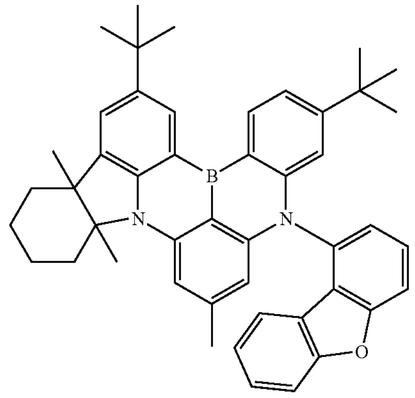

-continued
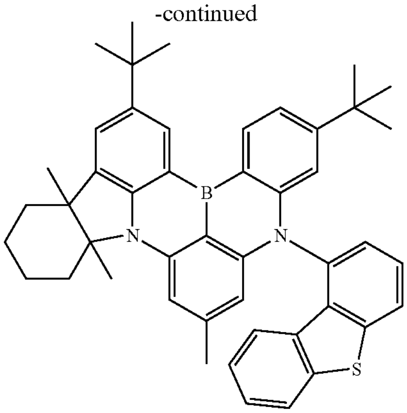
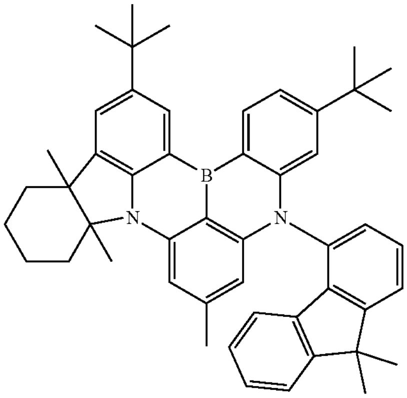
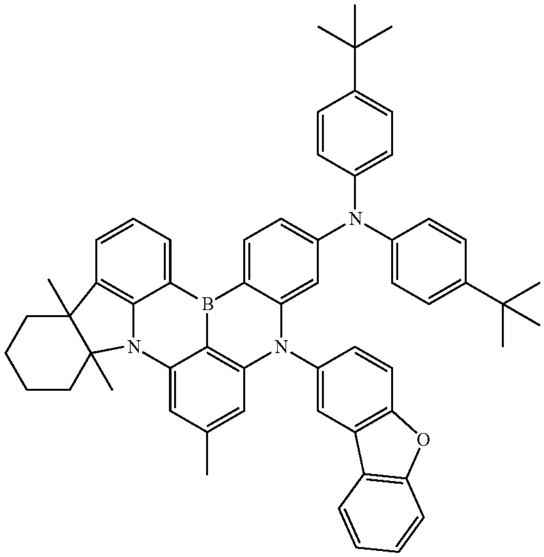
-continued
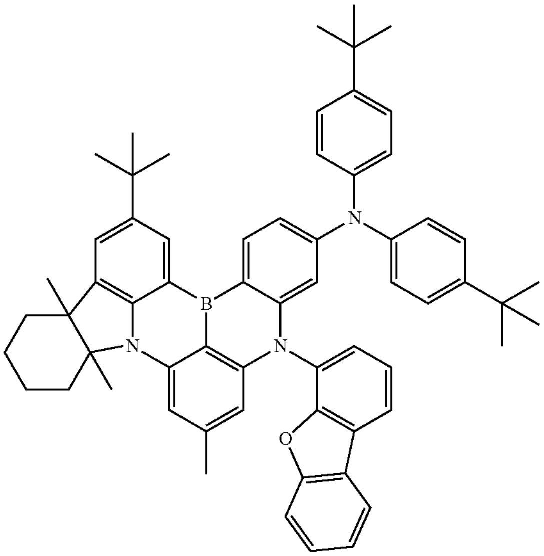
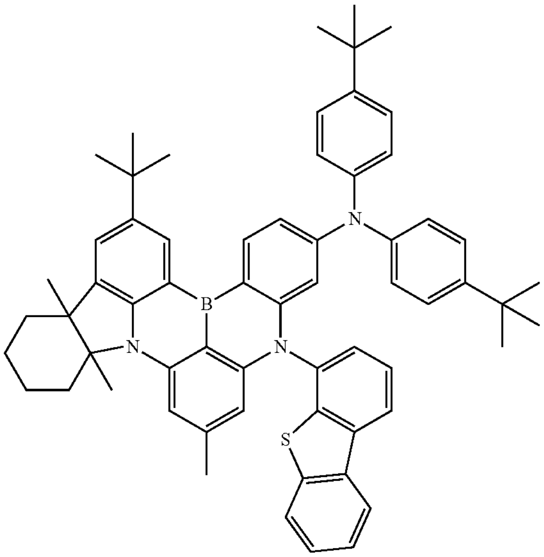
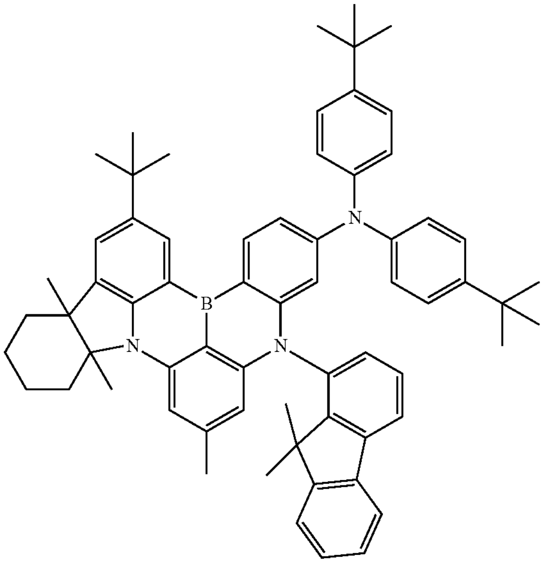

-continued
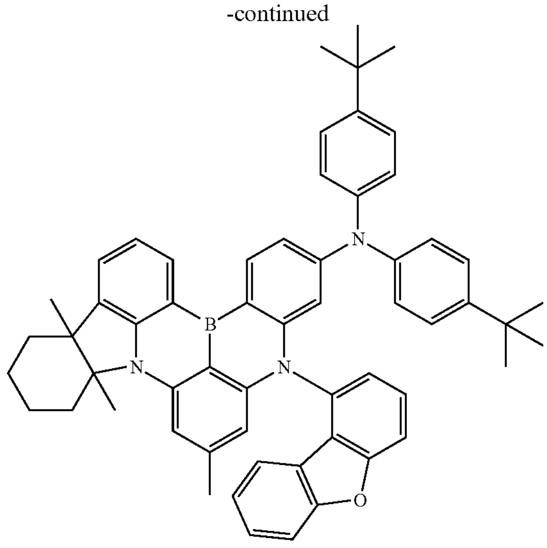
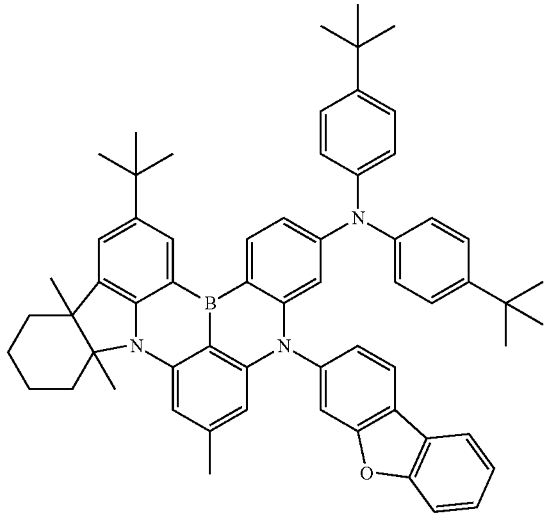
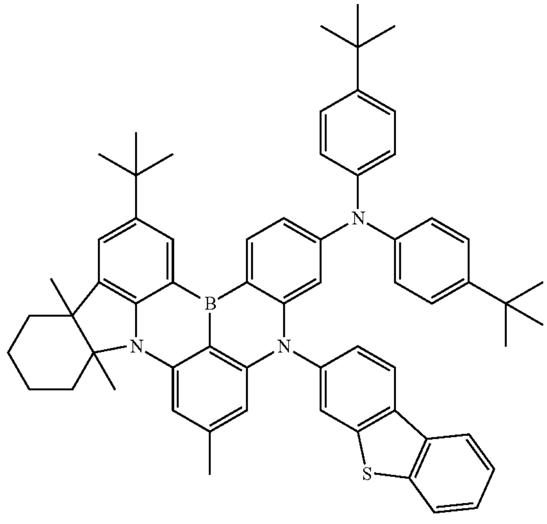
-continued
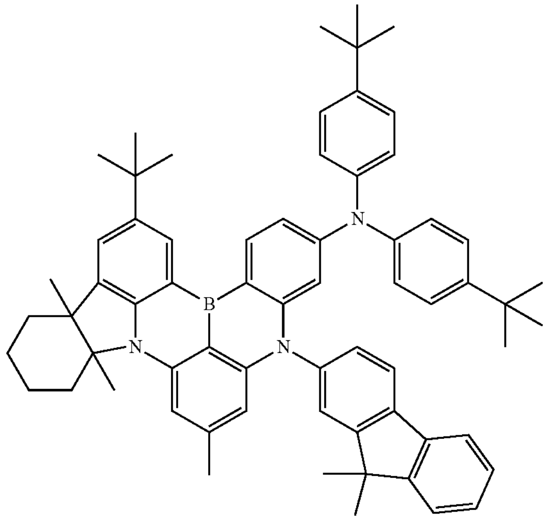
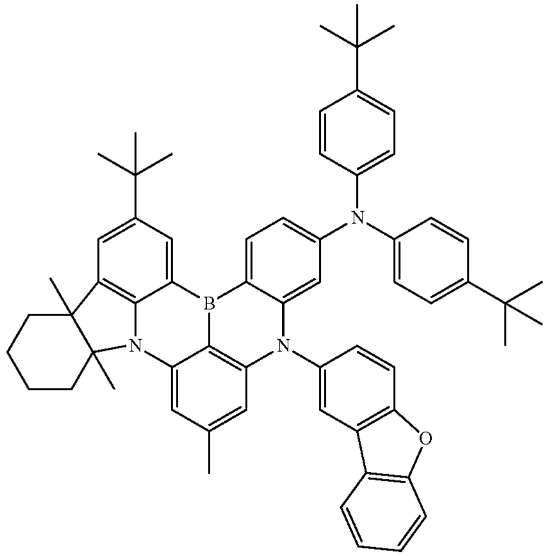
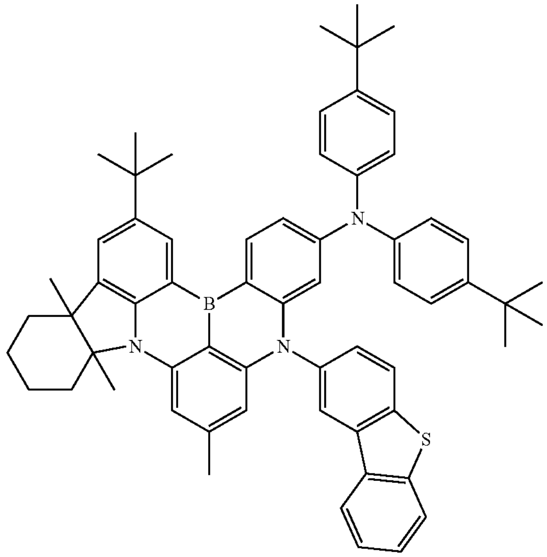

-continued
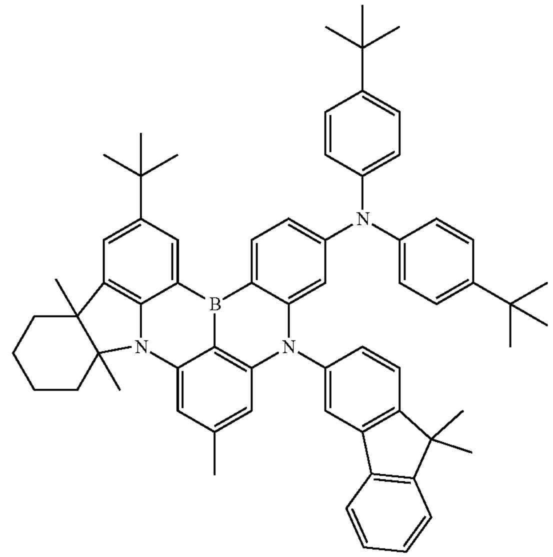
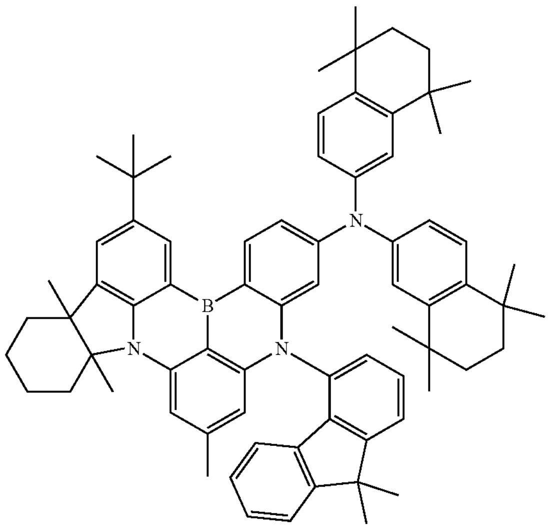
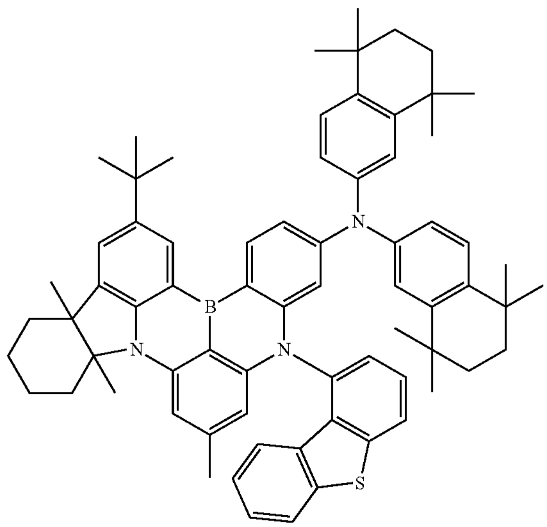
-continued
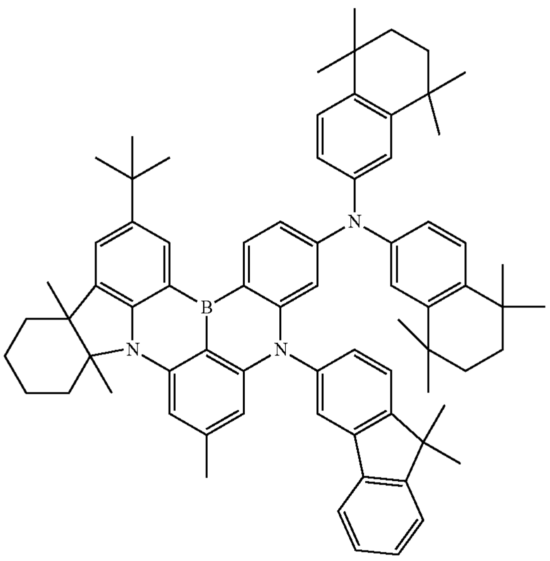
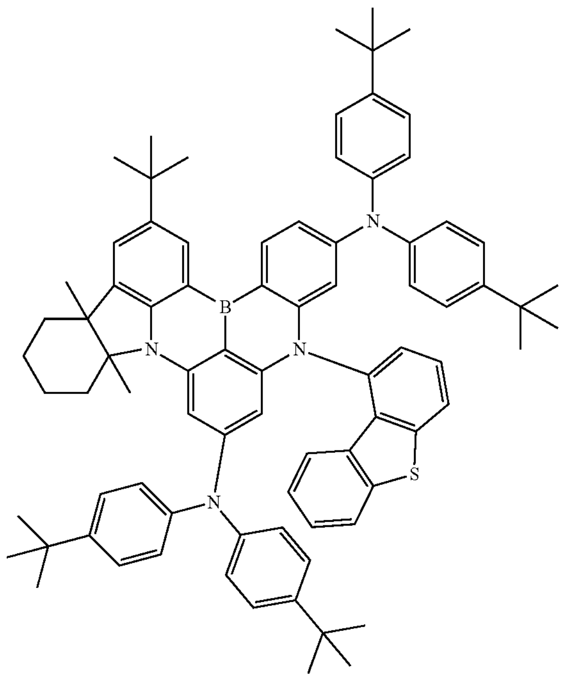

-continued
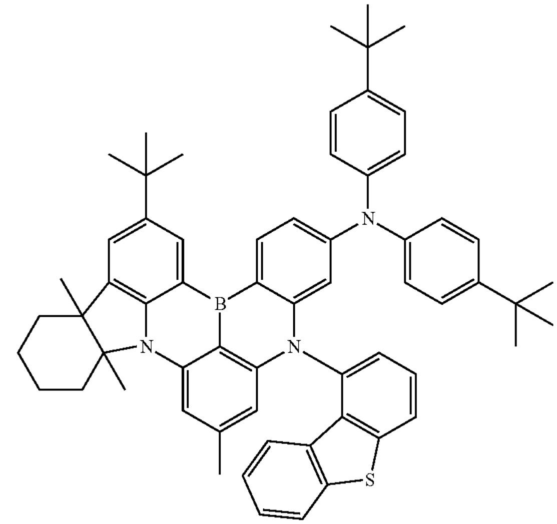
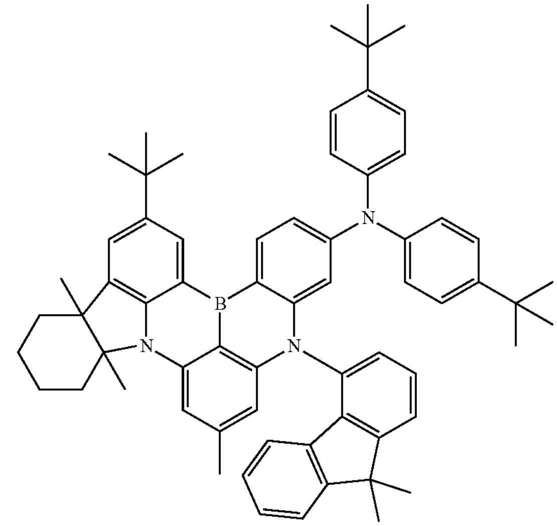
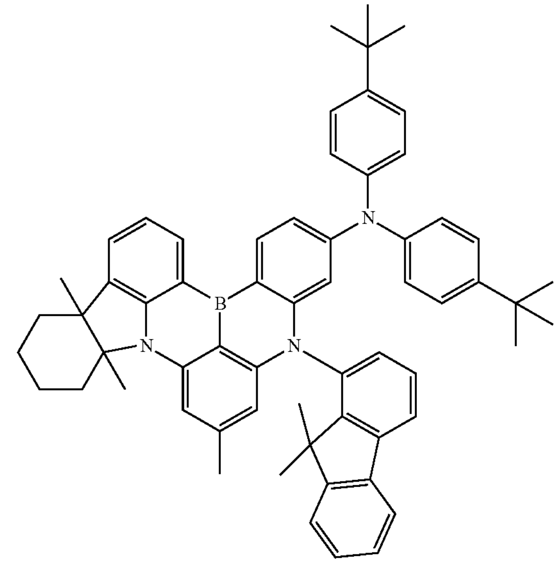
-continued
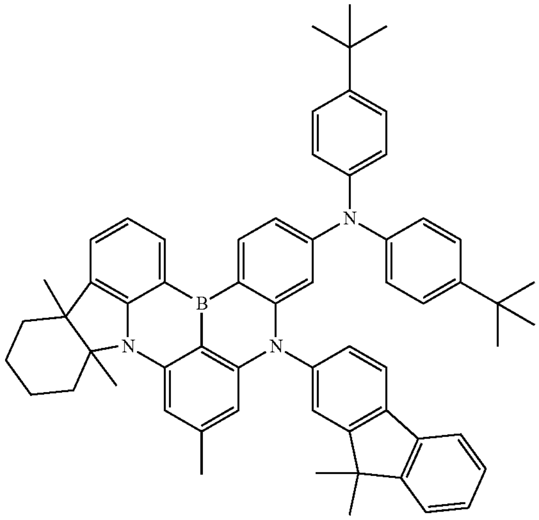
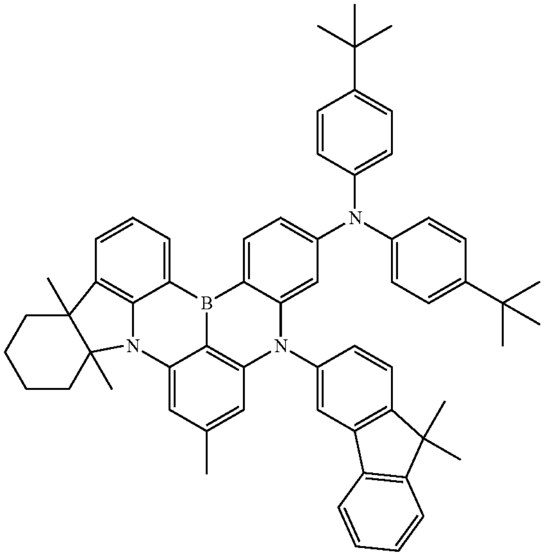
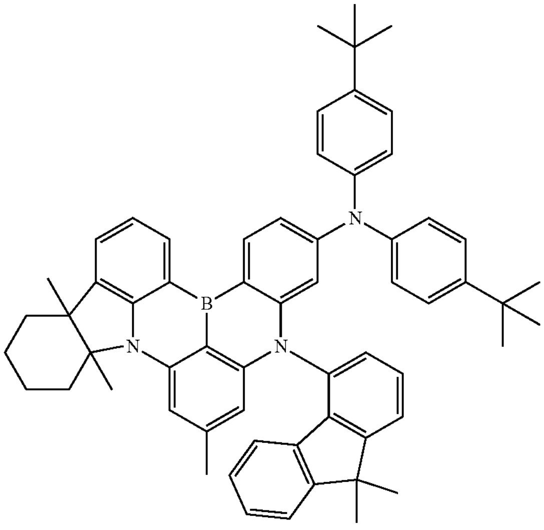

-continued
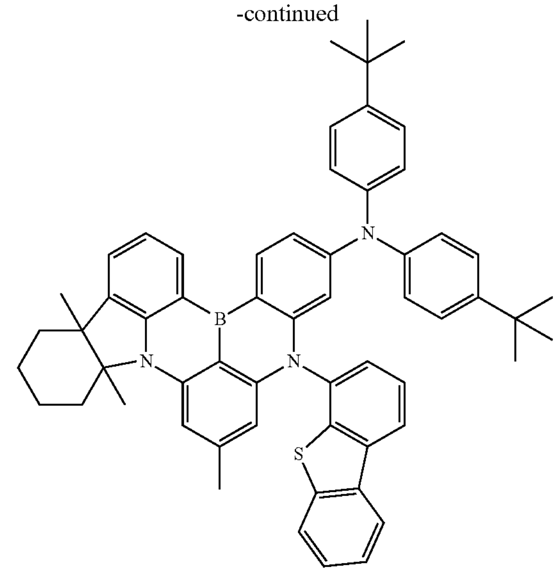
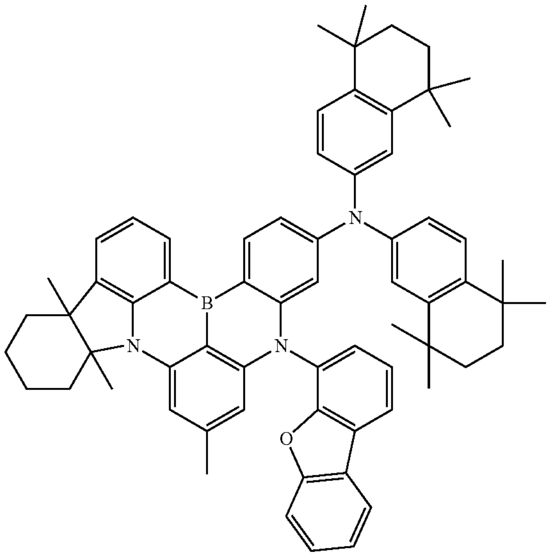
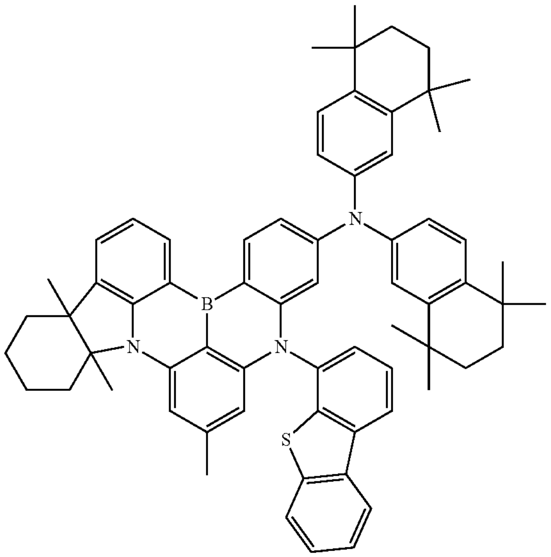
-continued
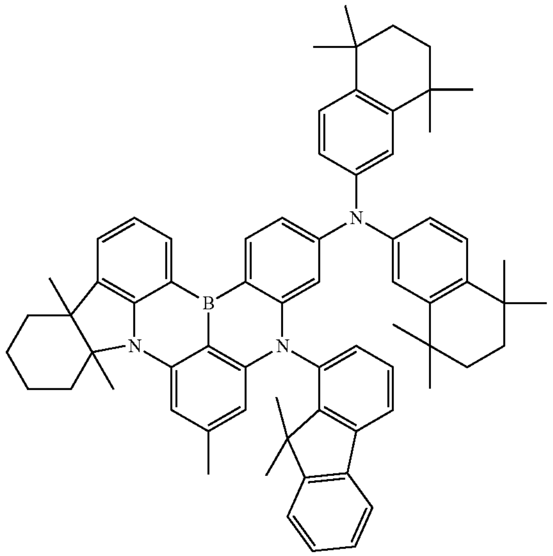
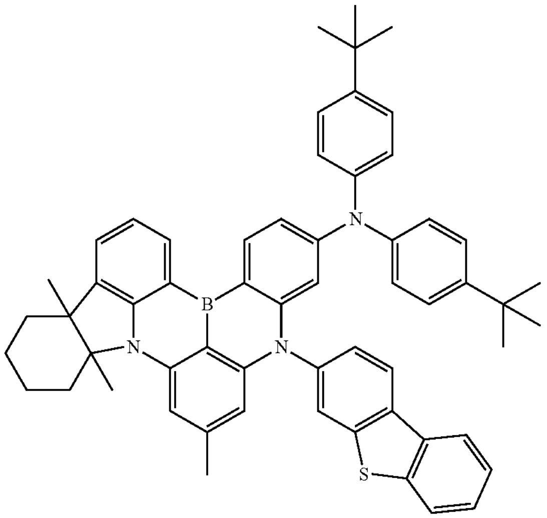
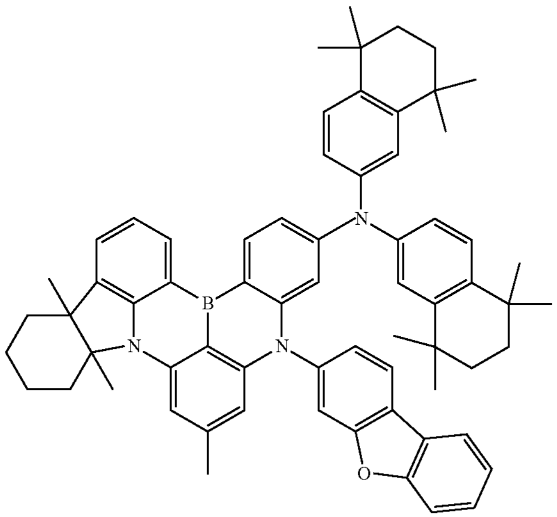

-continued
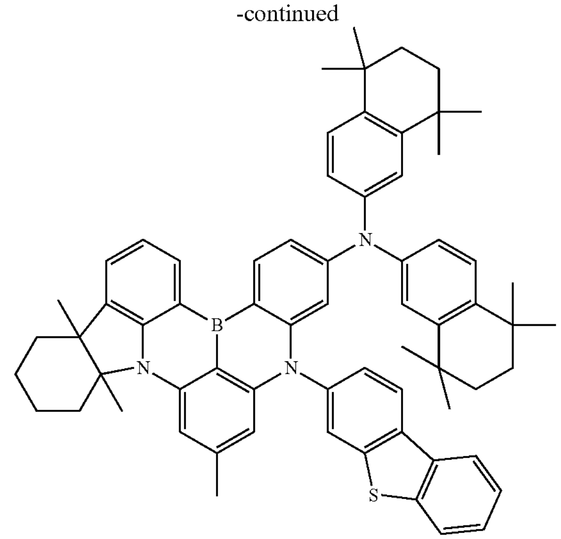
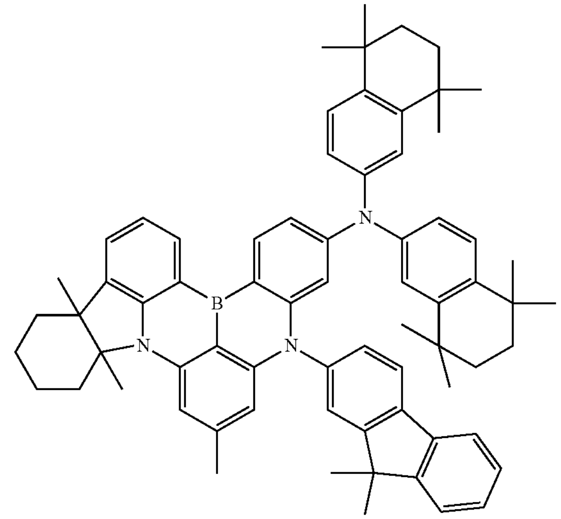
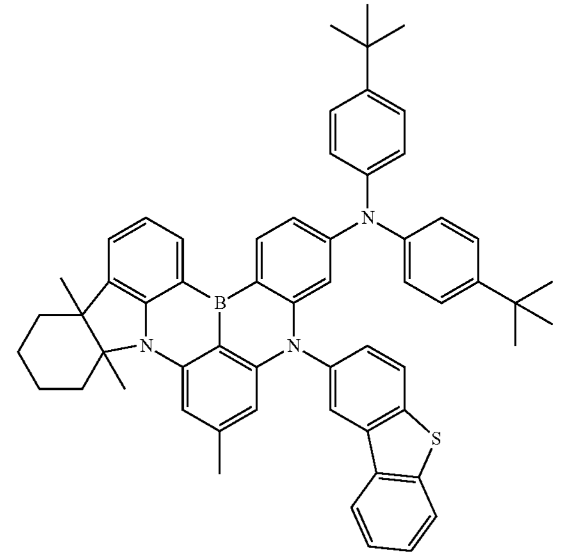
-continued
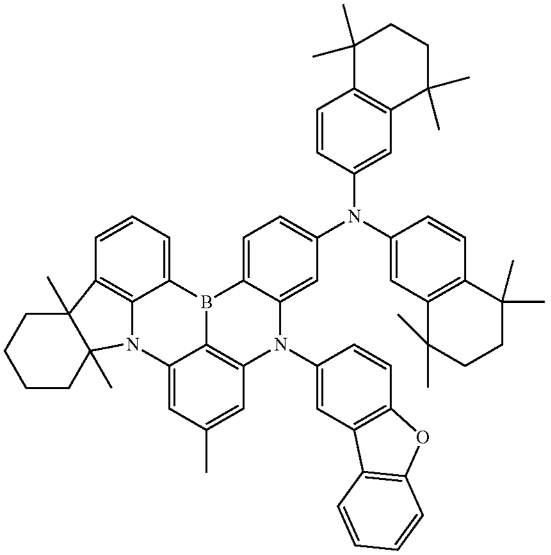
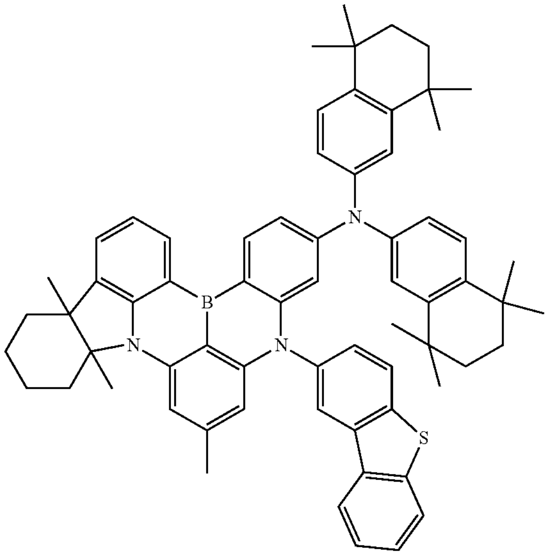
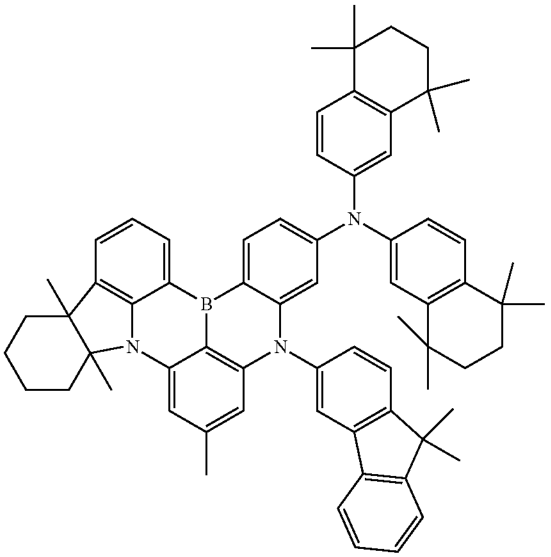

-continued
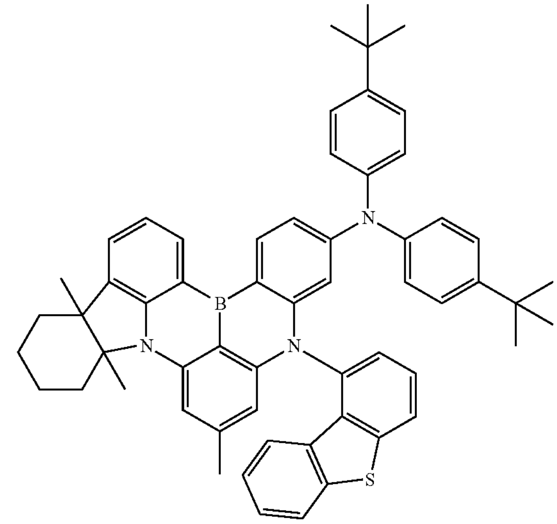
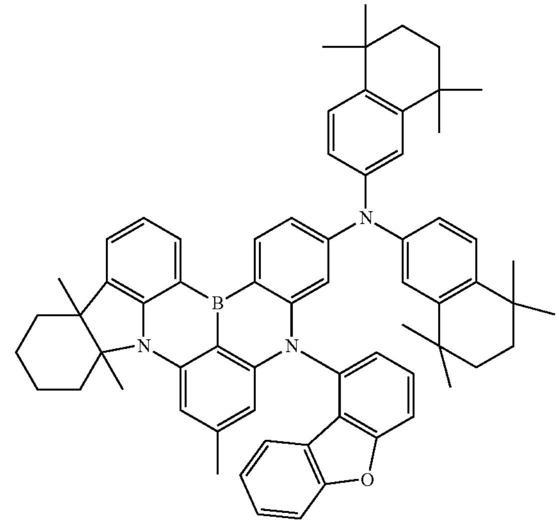
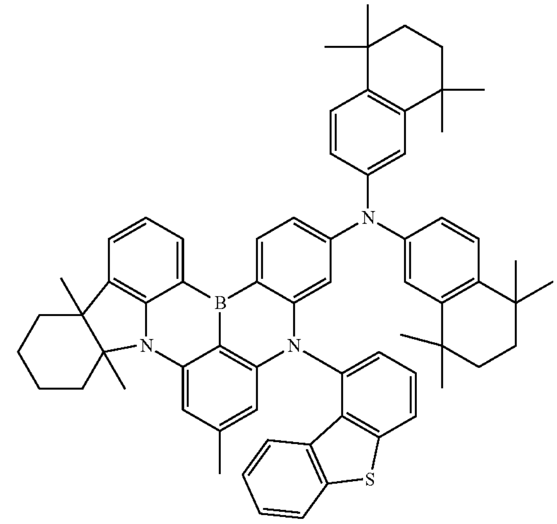
-continued
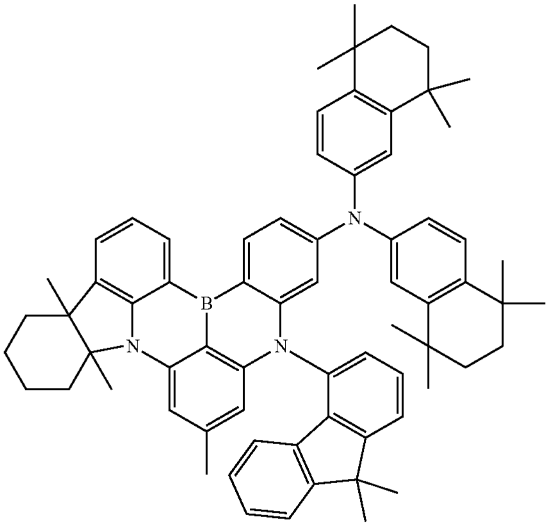
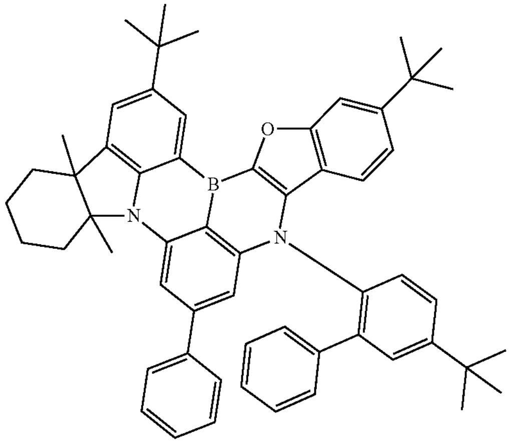
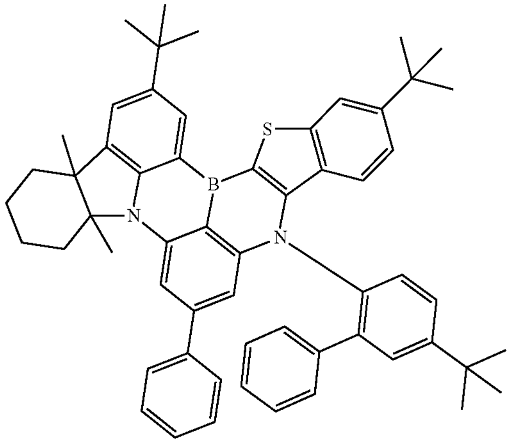

-continued
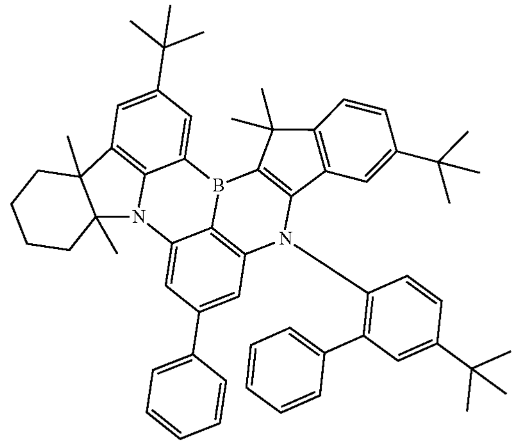
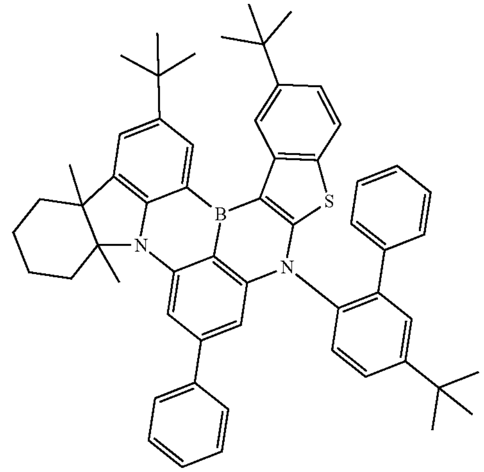
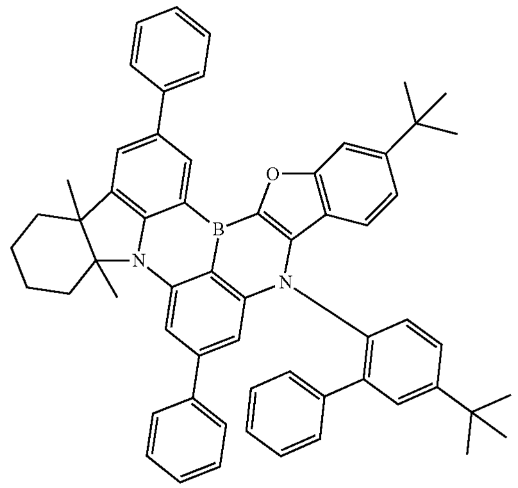
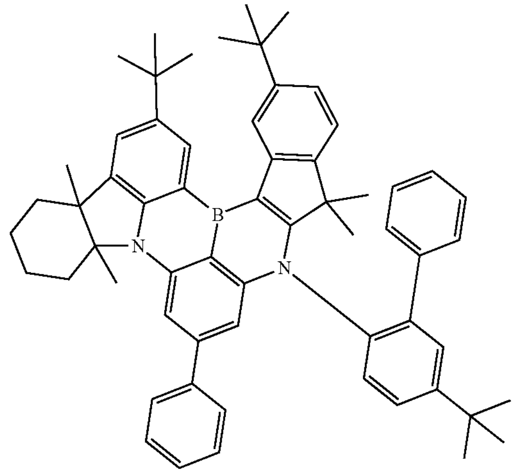
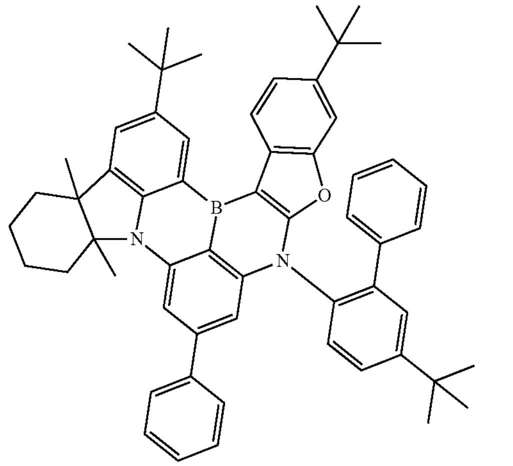
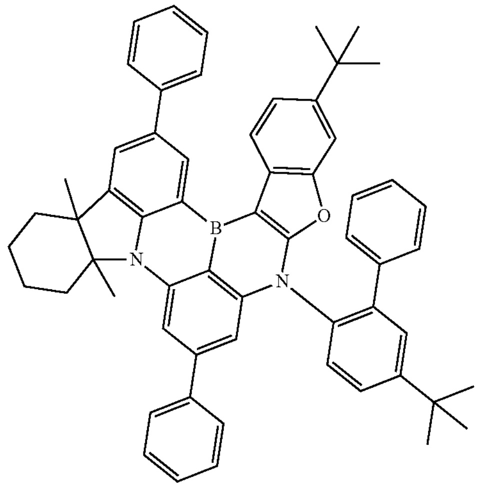
-continued -continued
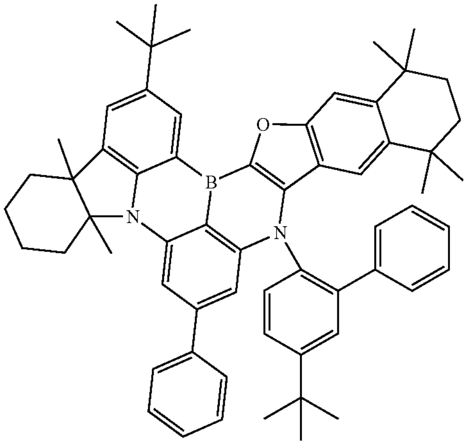
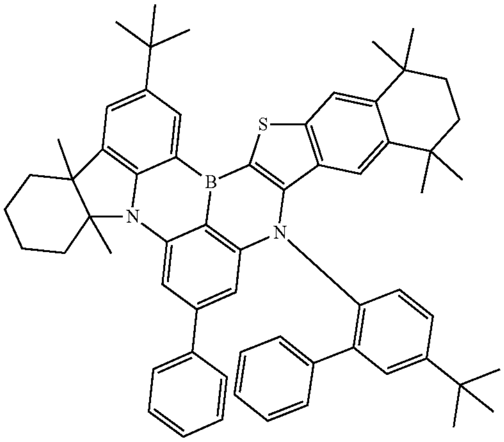
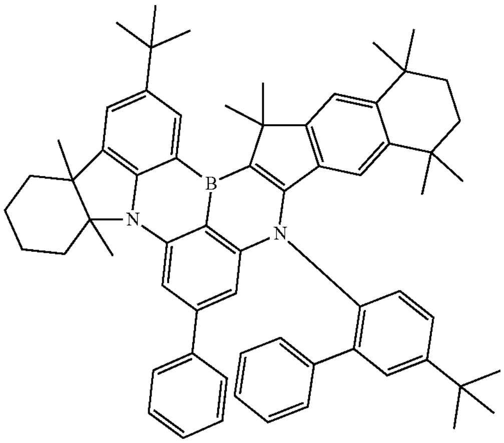
-continued
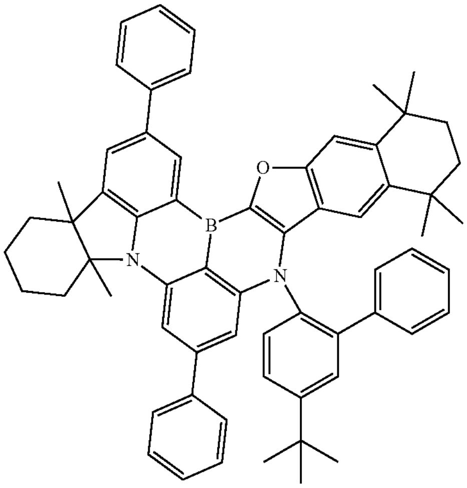
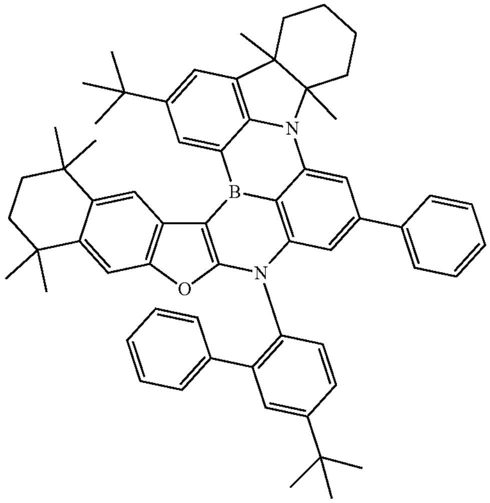
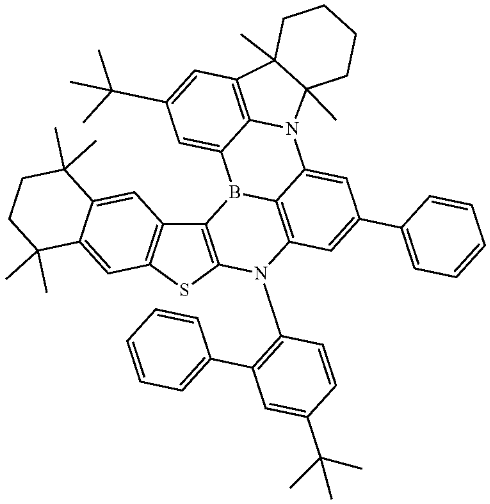

-continued
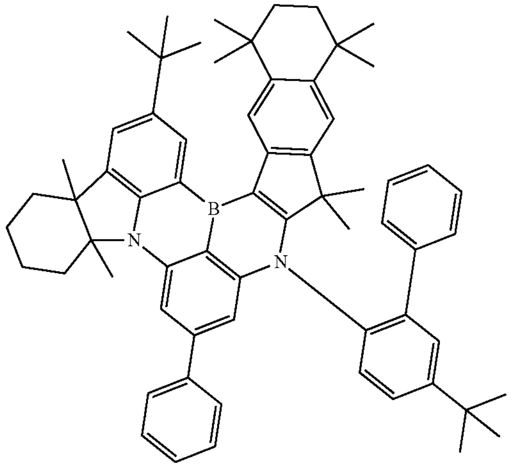
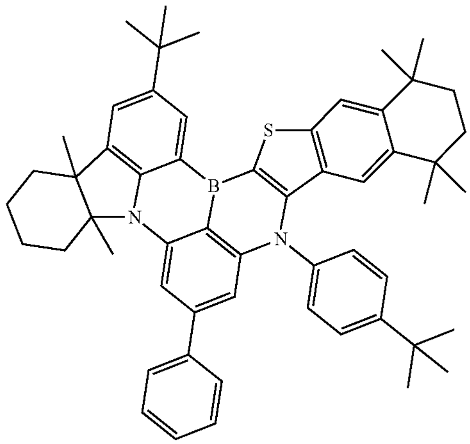
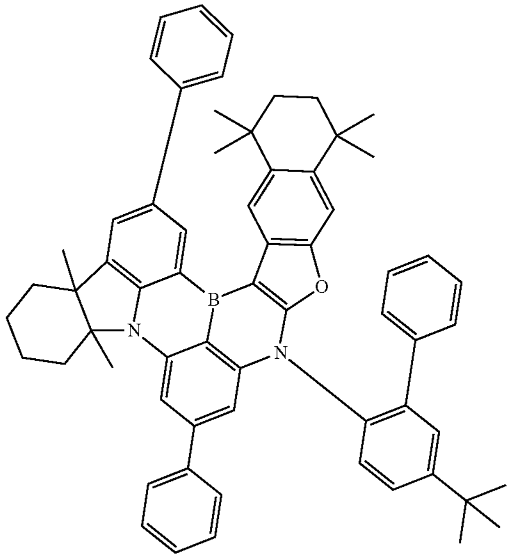
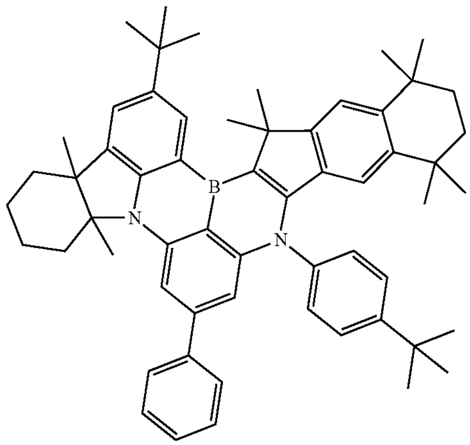
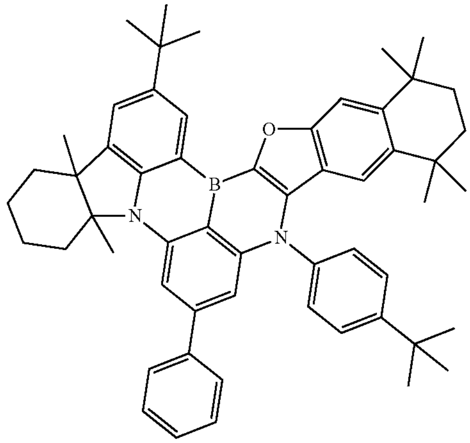
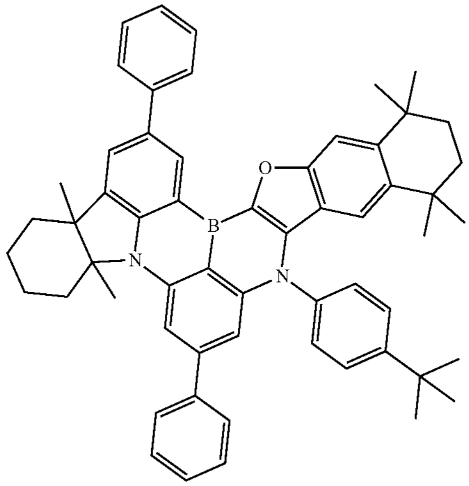
-continued -continued
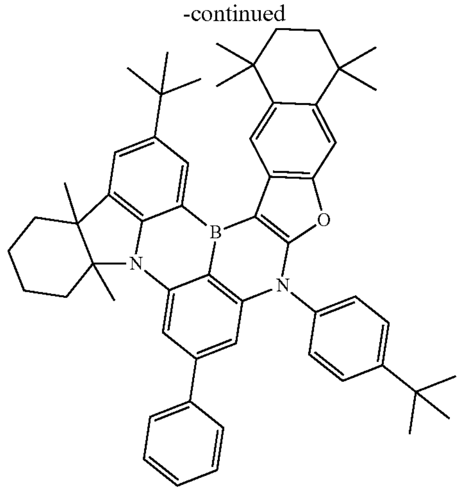
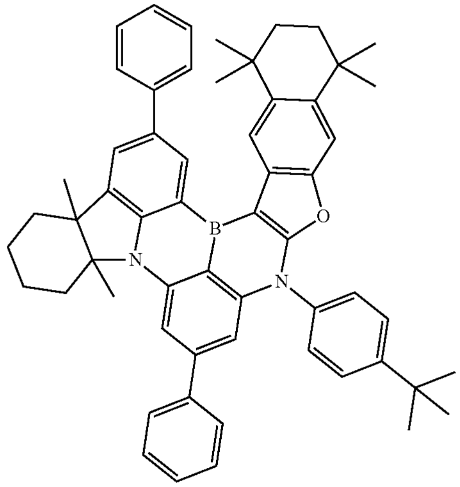
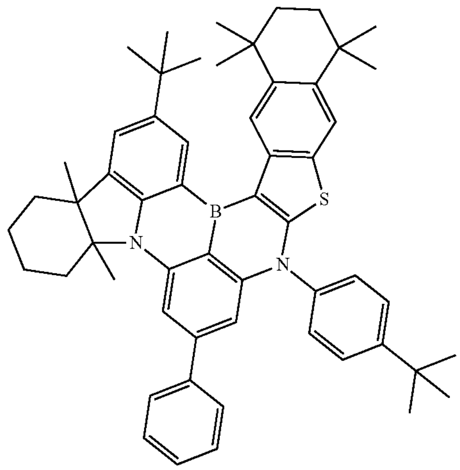
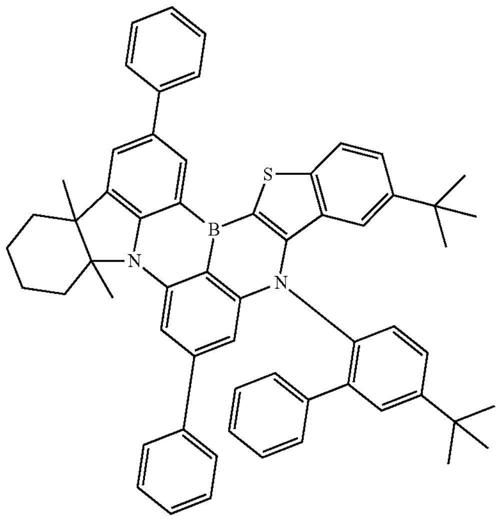
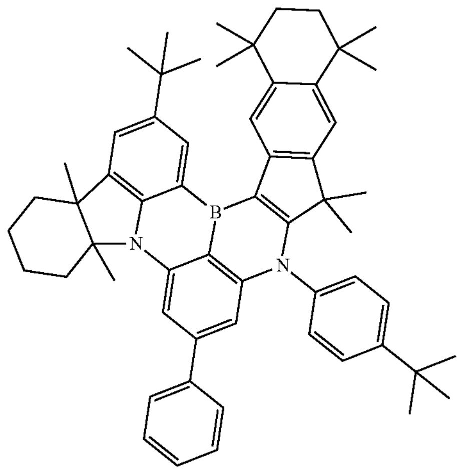
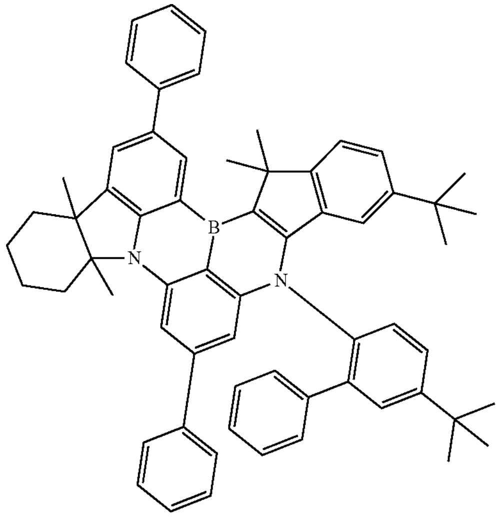
-continued -continued
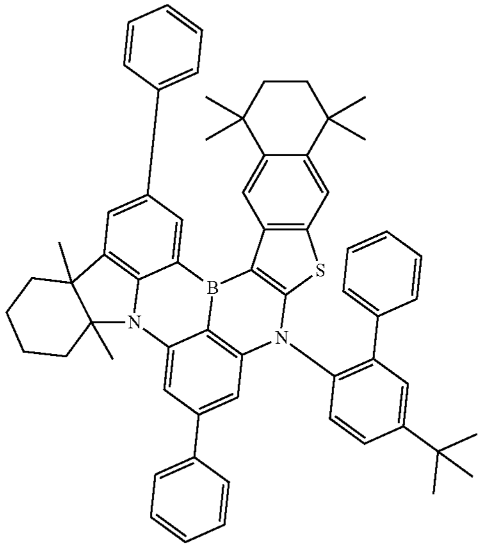
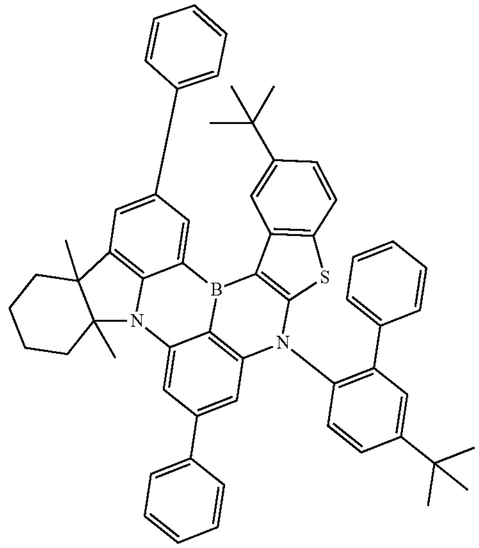
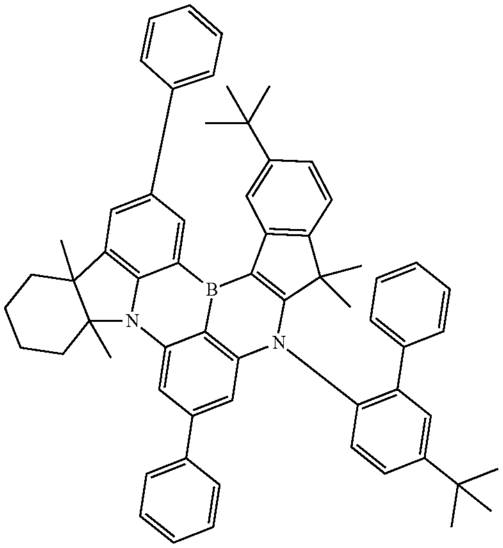
-continued
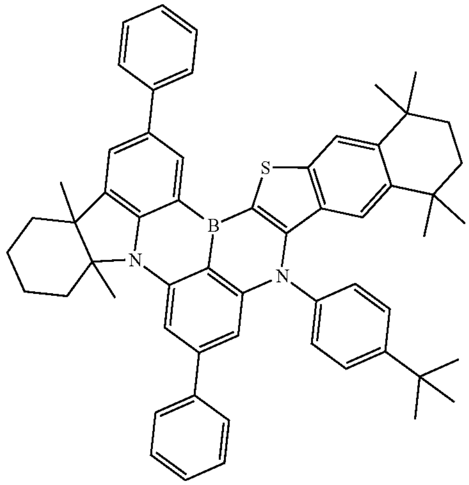
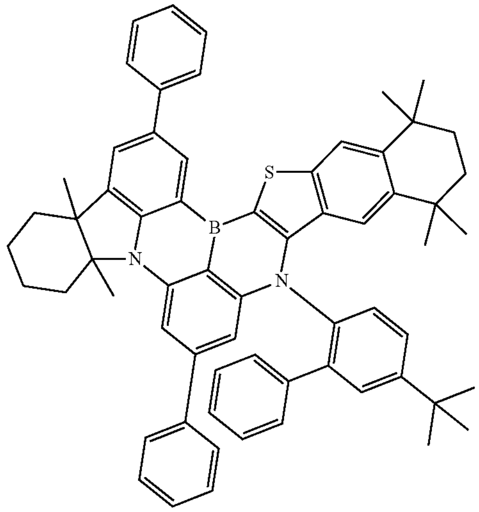
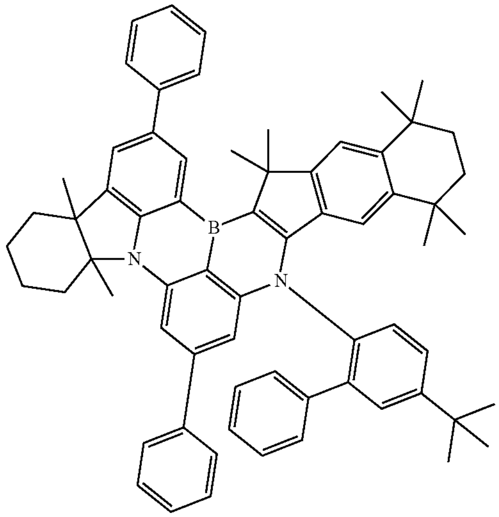

-continued
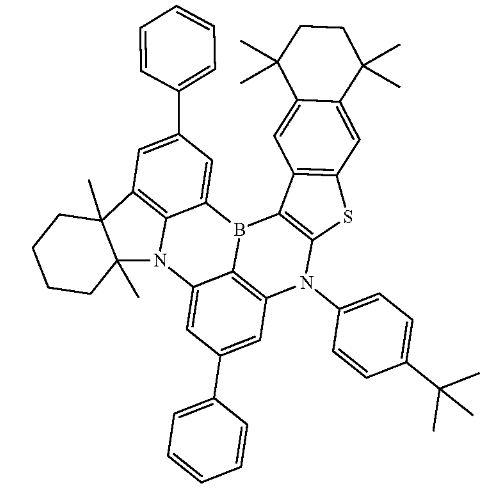
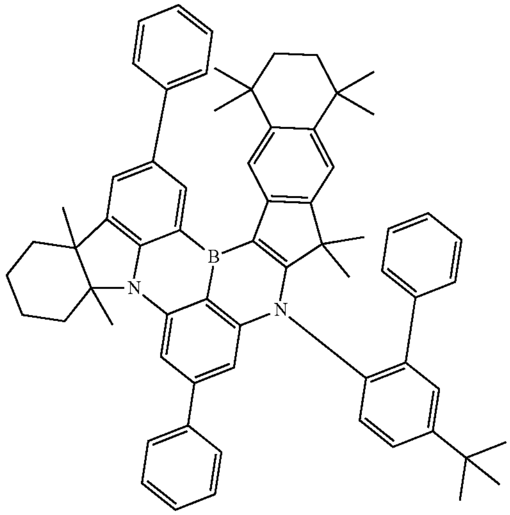
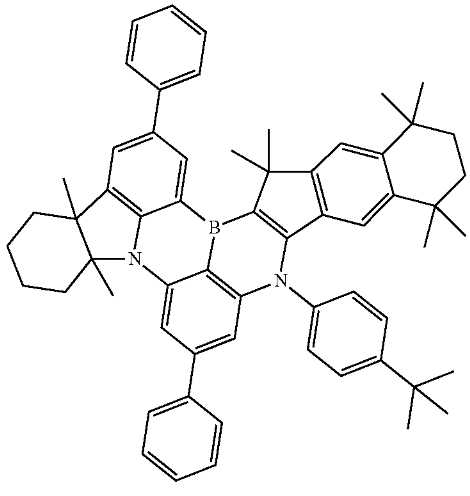
-continued
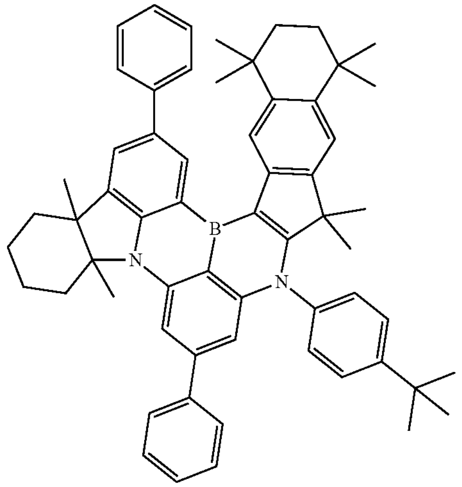
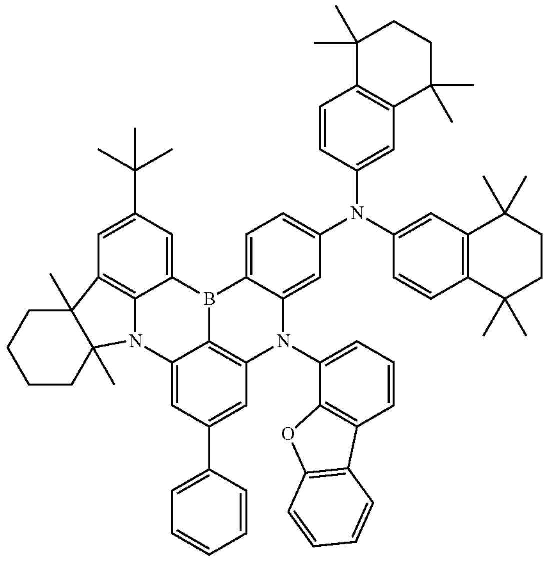
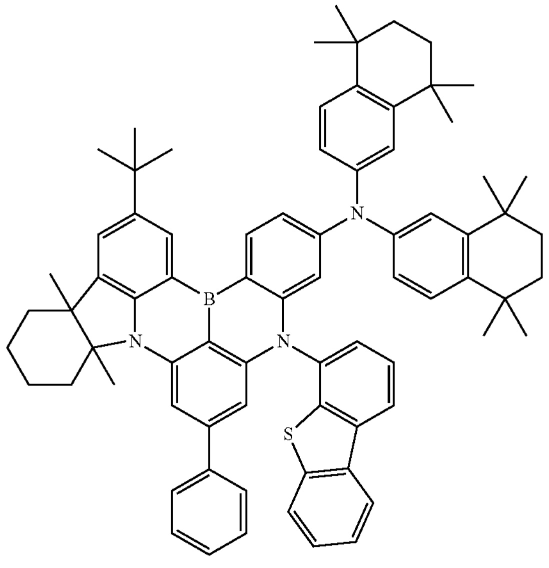

-continued
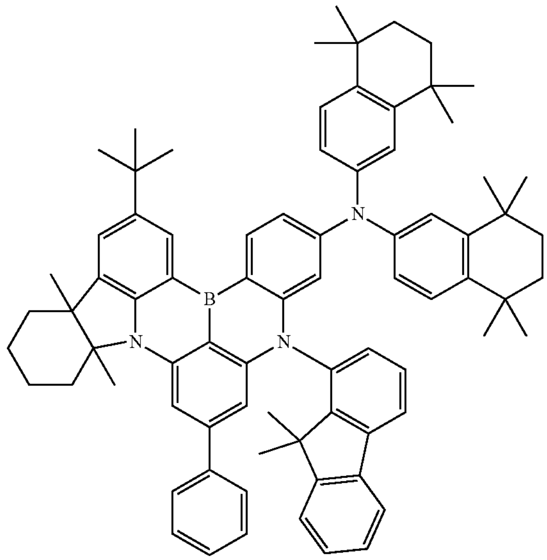
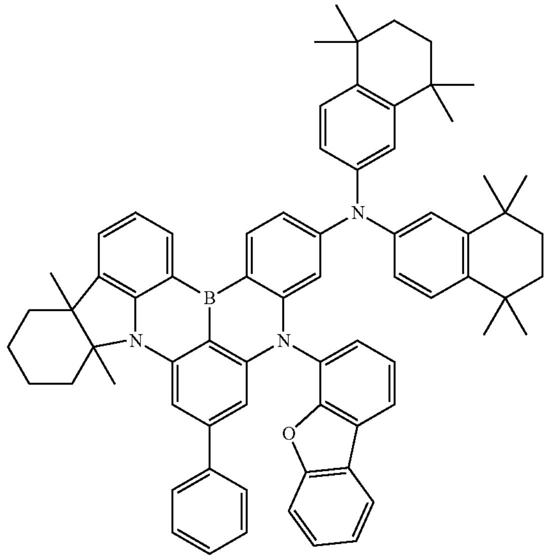
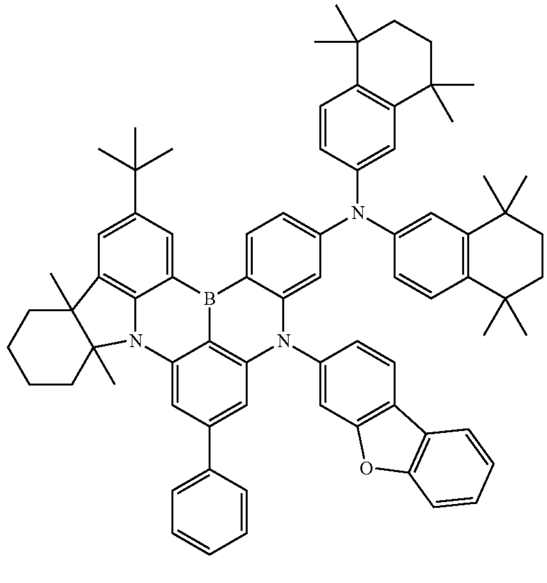
-continued
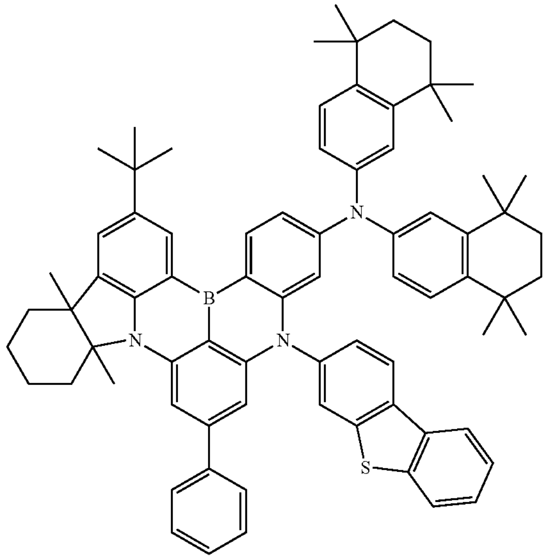
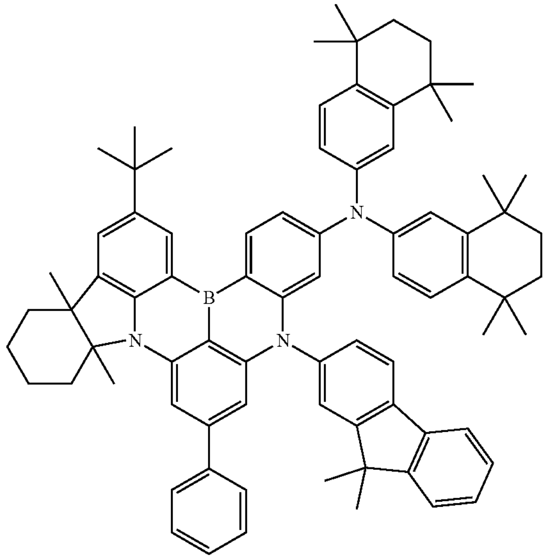
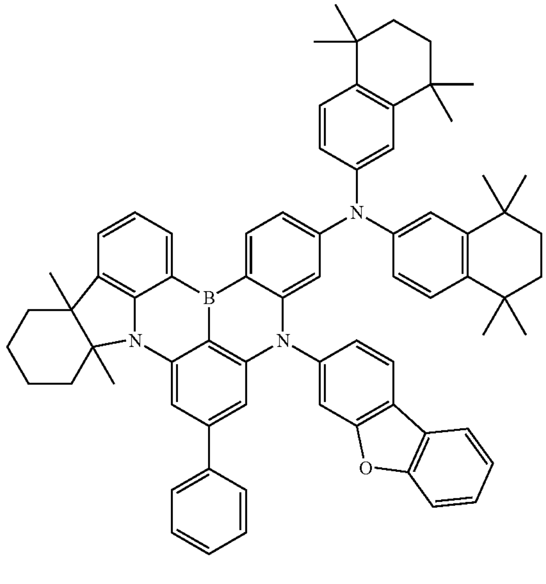

-continued
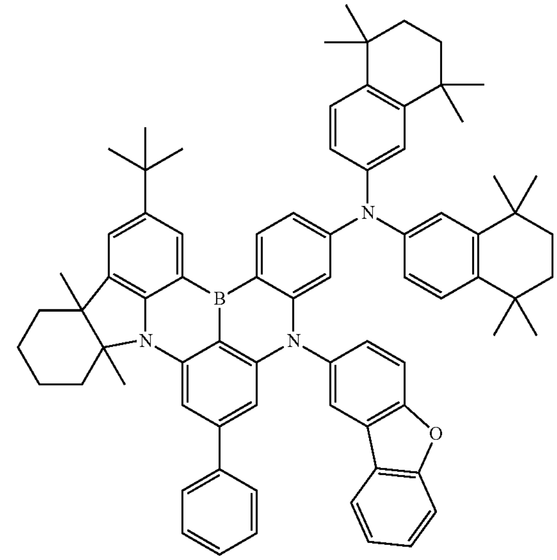
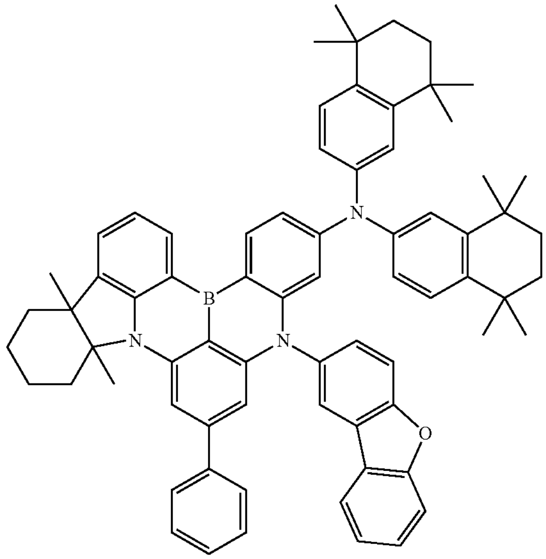
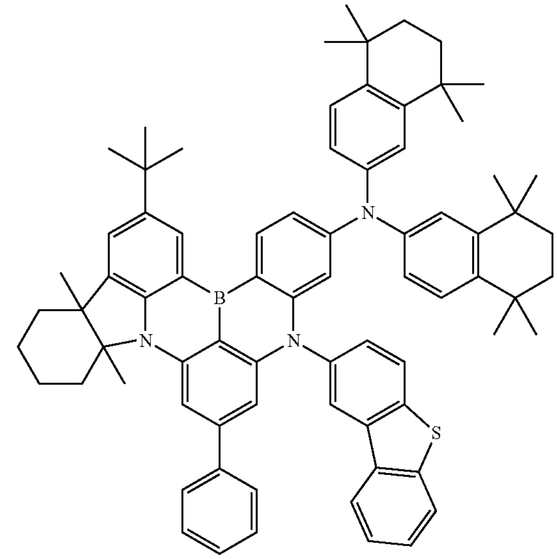
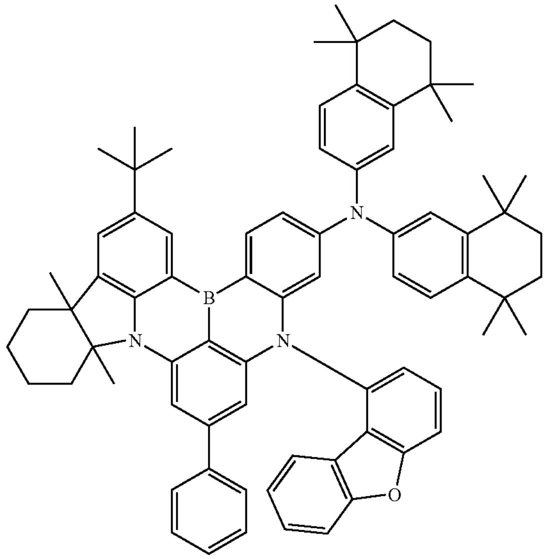
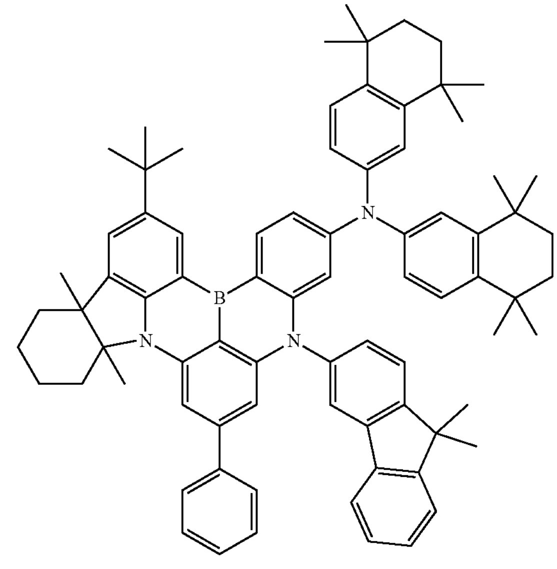
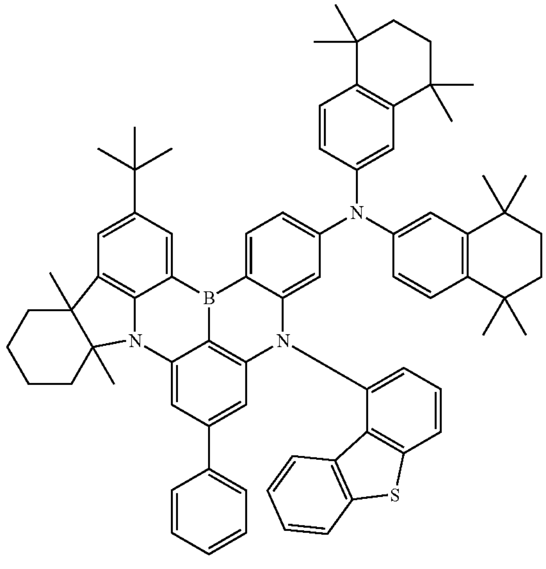
-continued

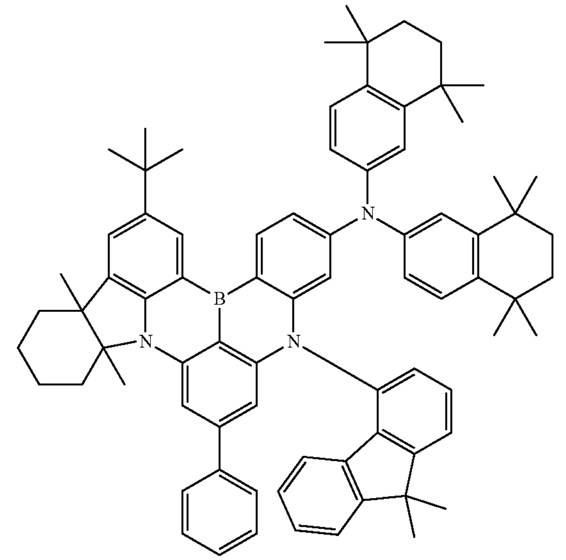
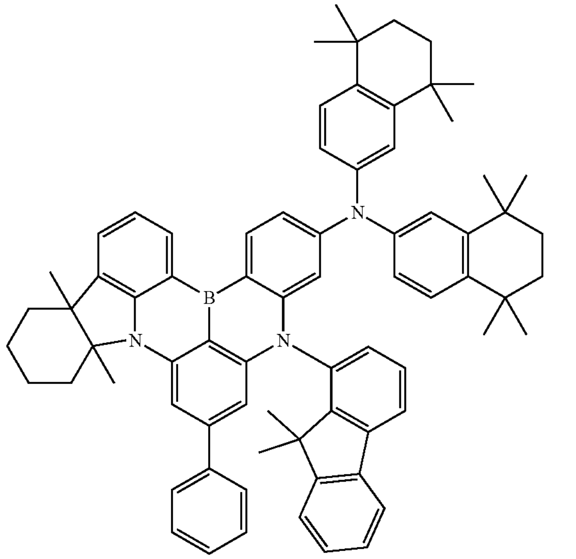
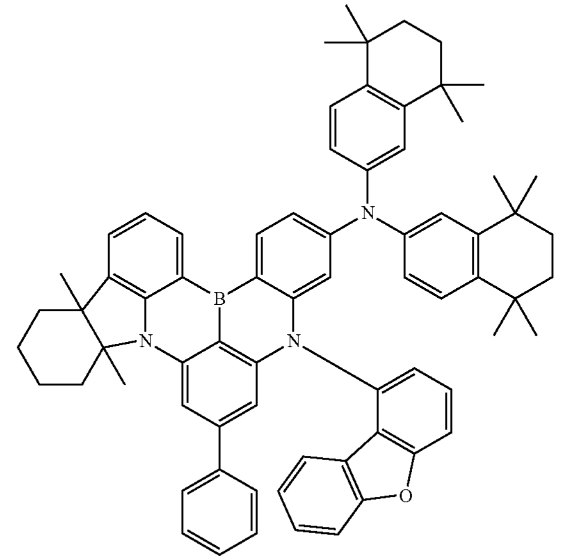
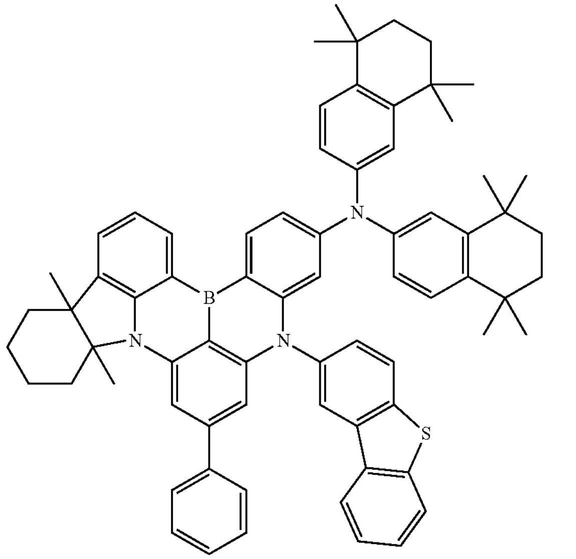
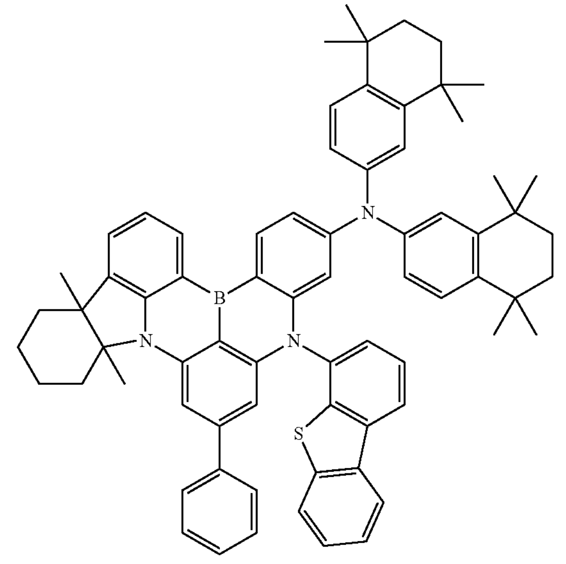
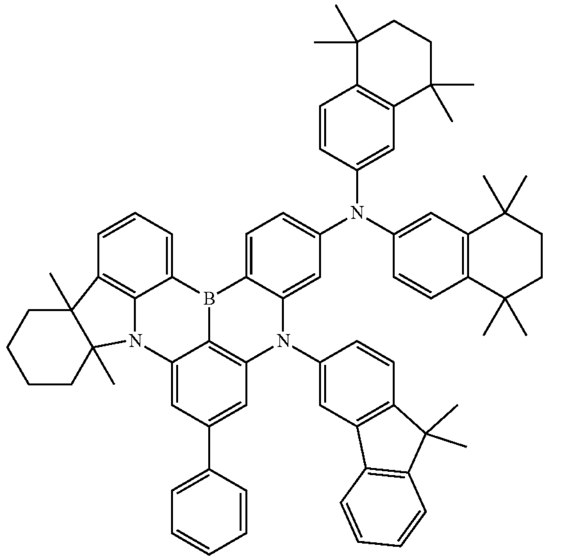

-continued
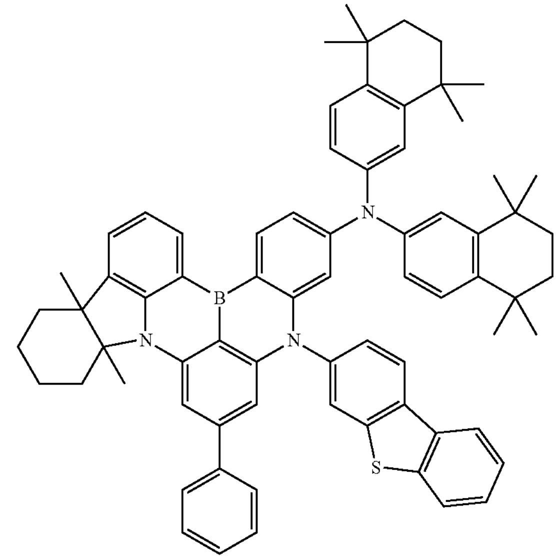
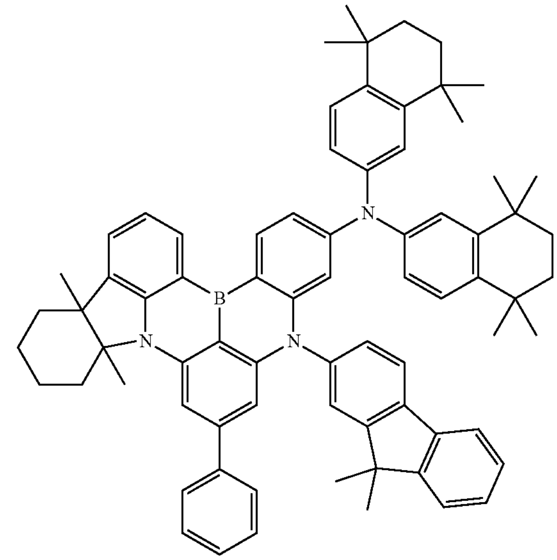
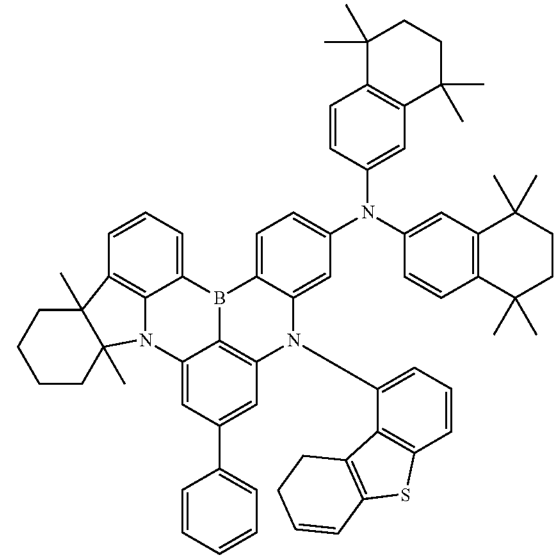
-continued
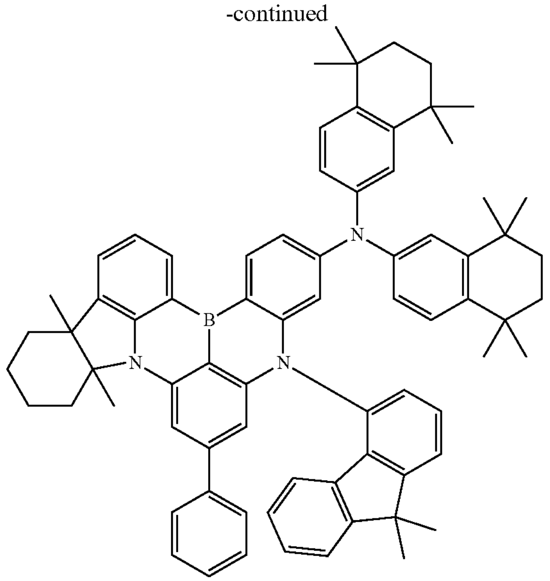
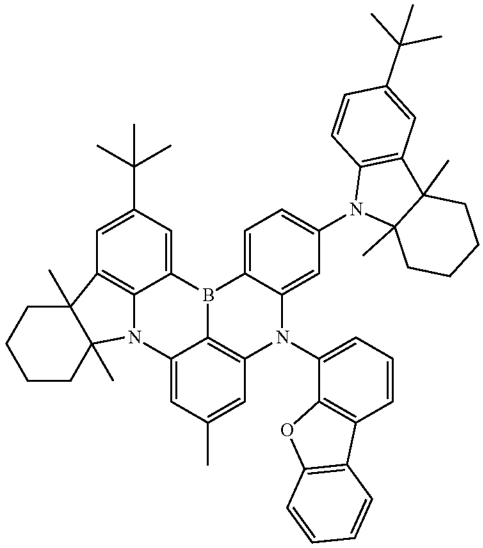
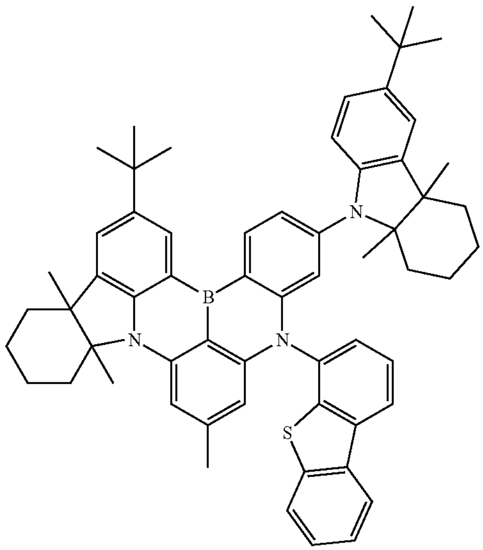

-continued
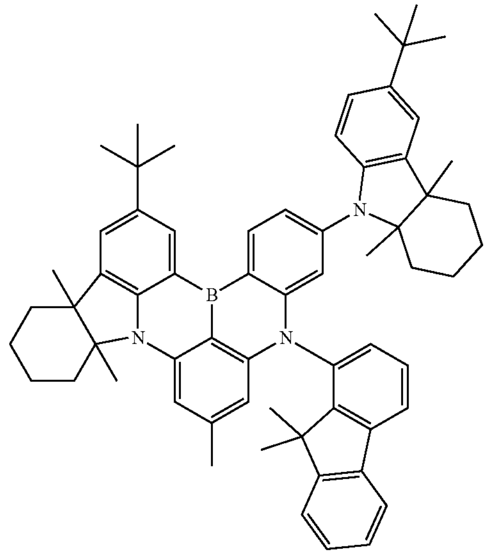
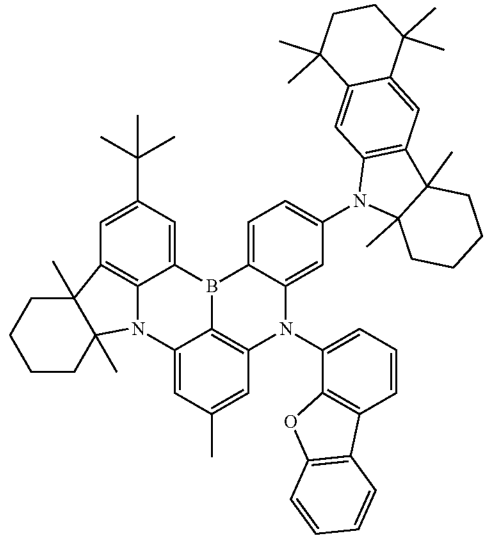
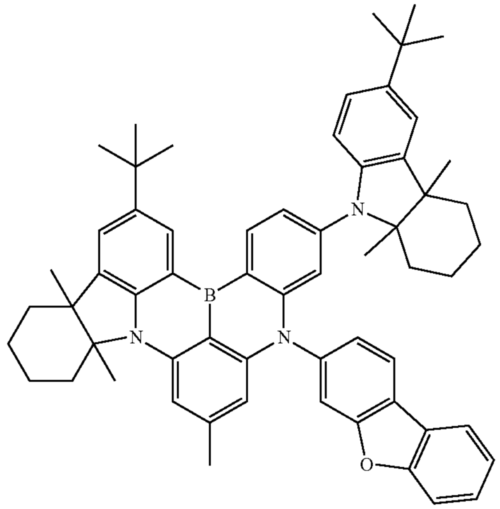
-continued
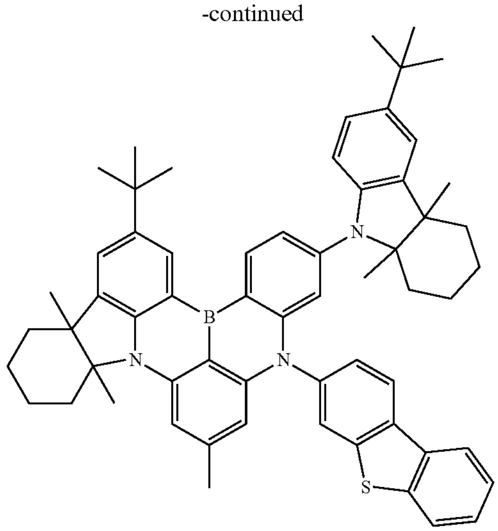
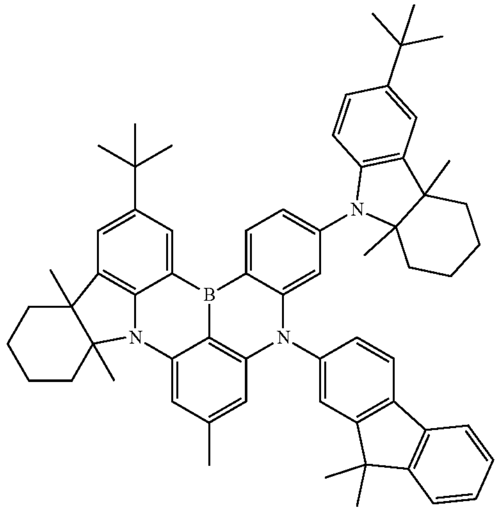
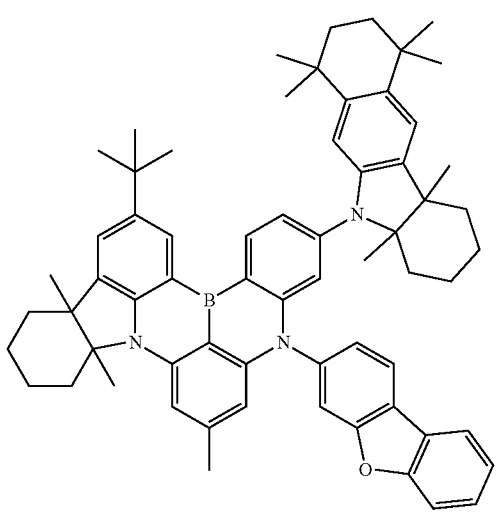

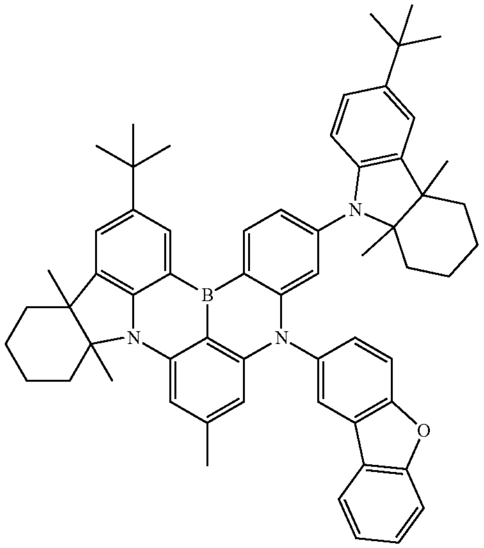
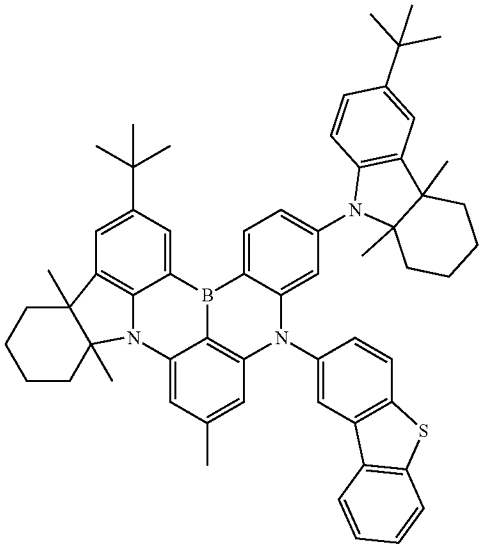
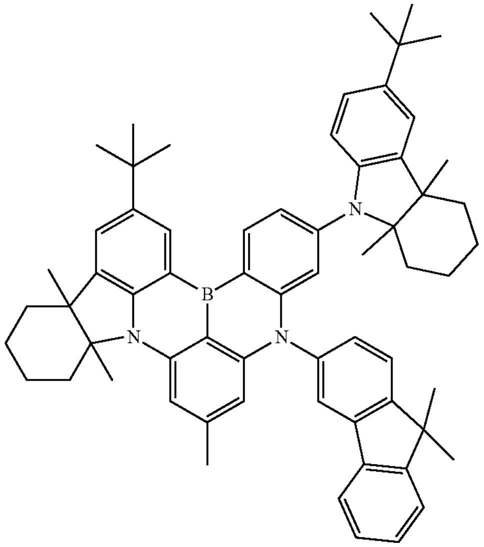
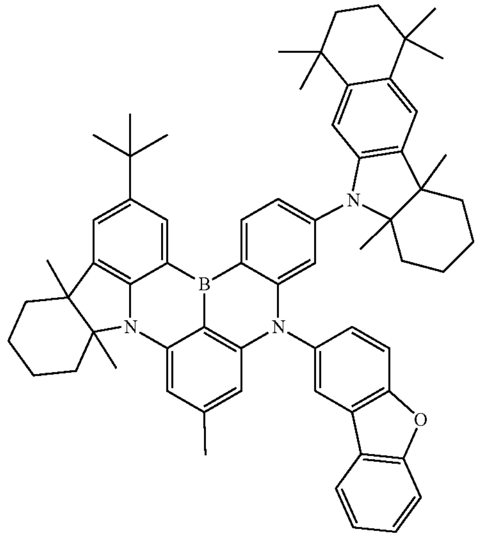
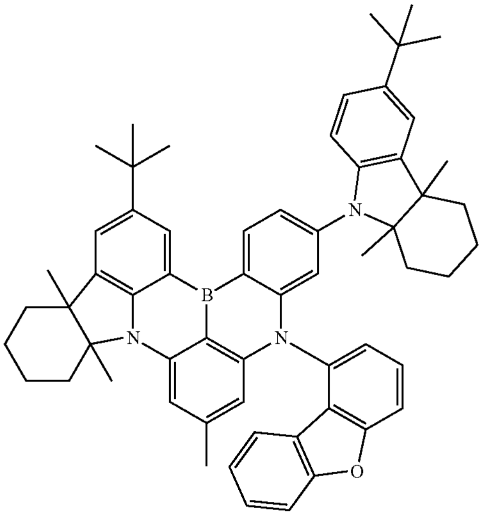
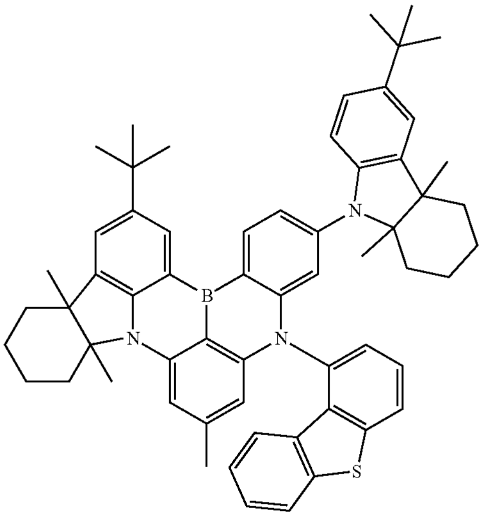

-continued
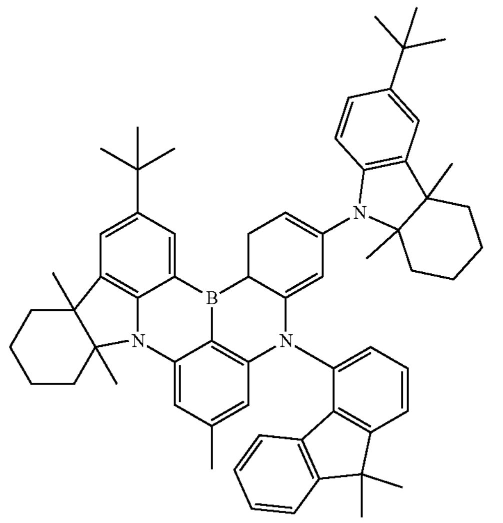
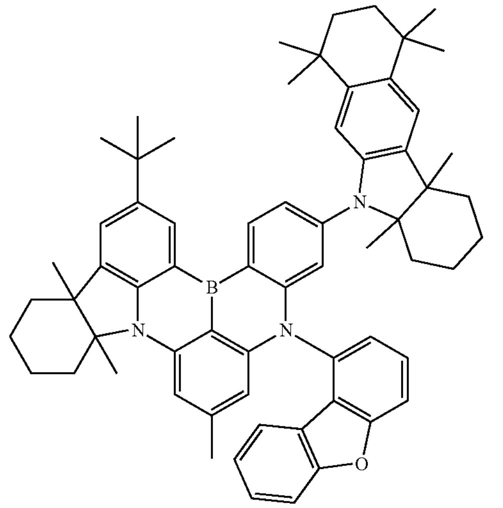
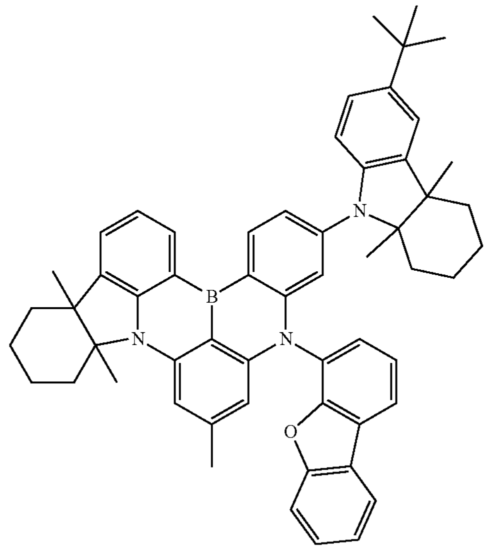
-continued
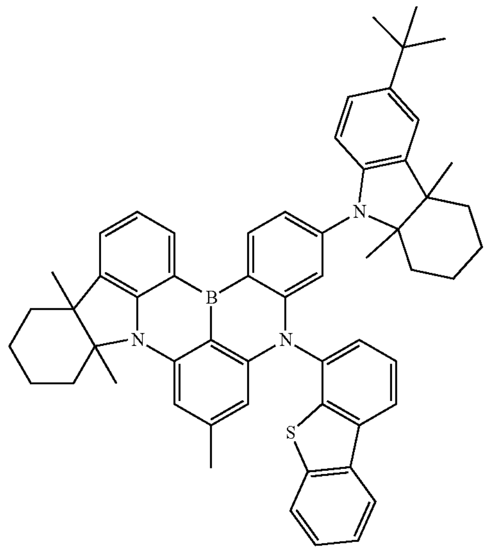
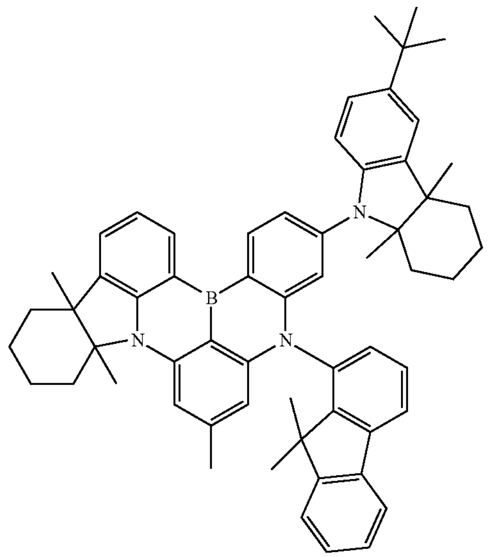
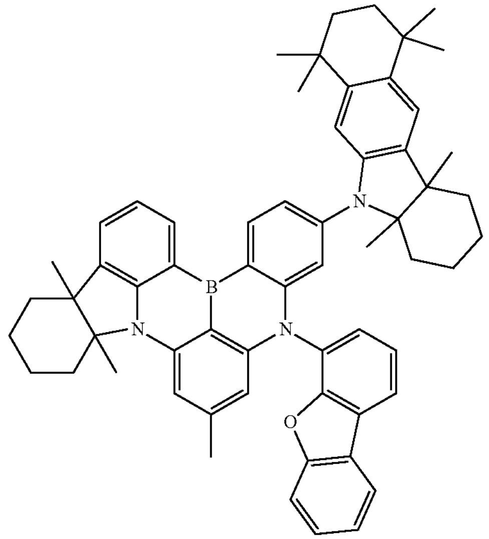

-continued
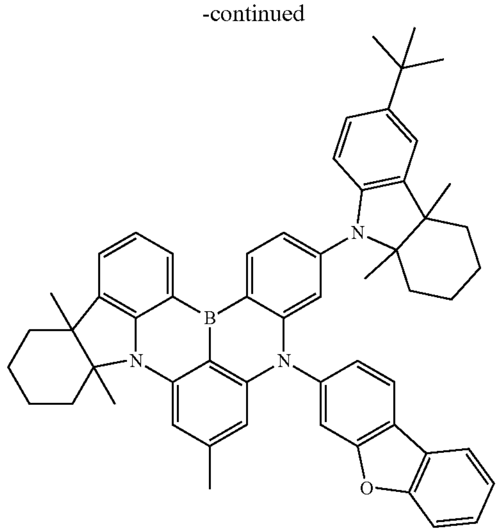
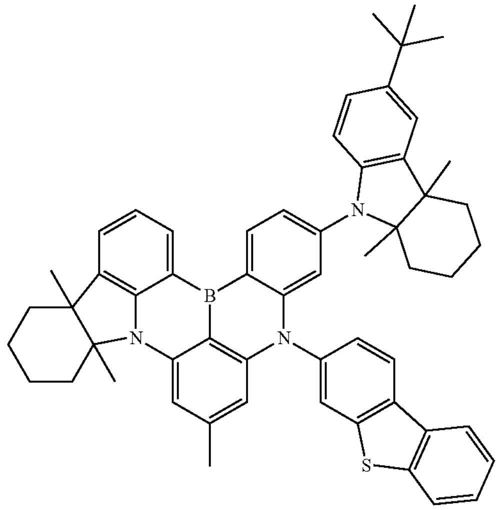
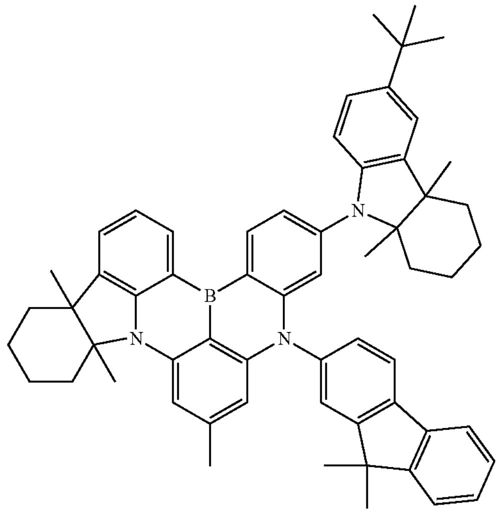
-continued
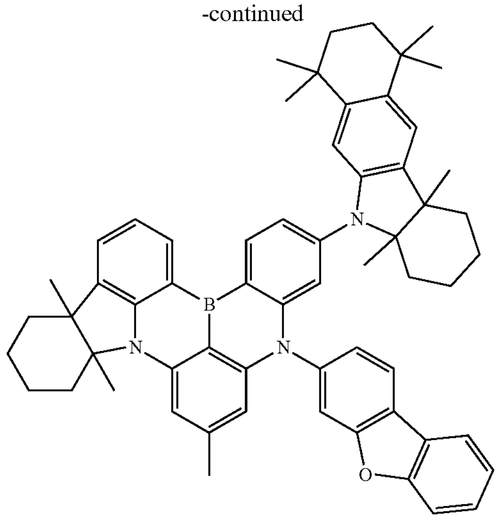
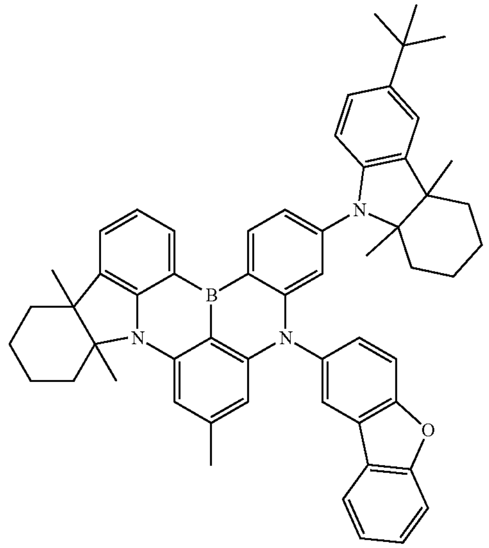
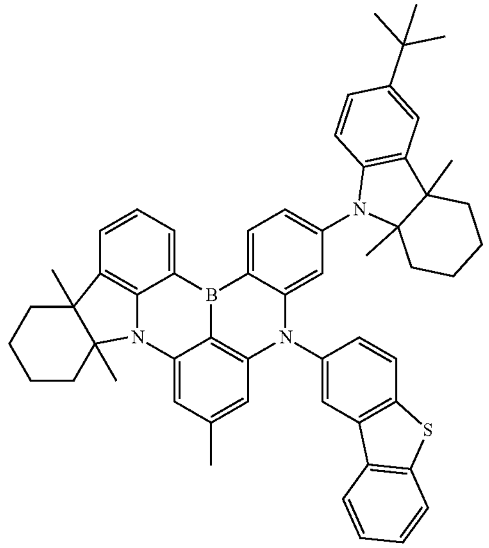

-continued
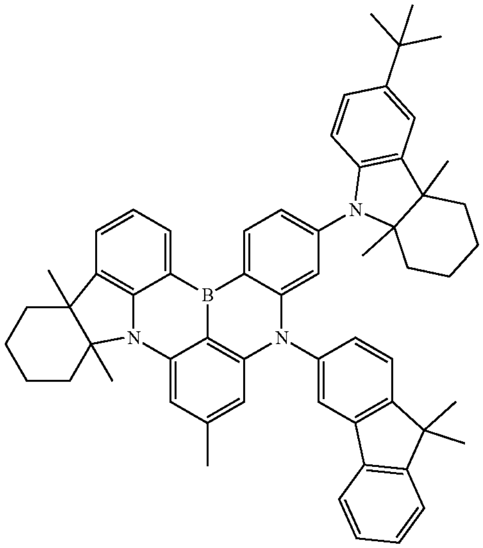
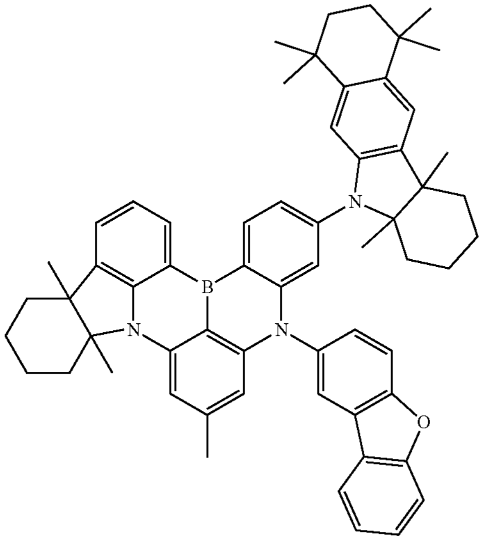
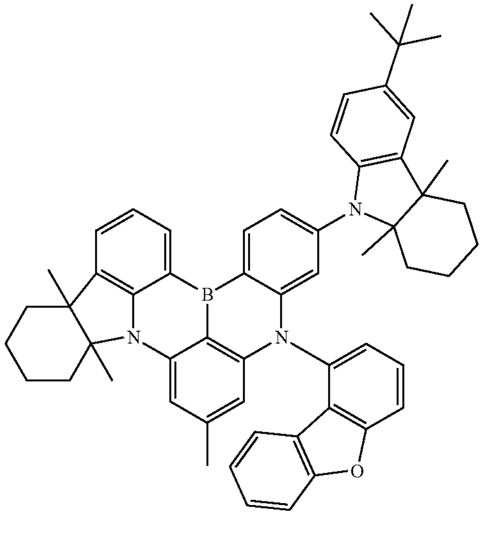
-continued
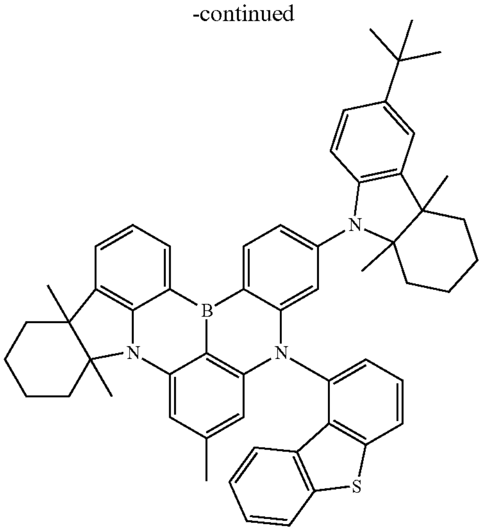
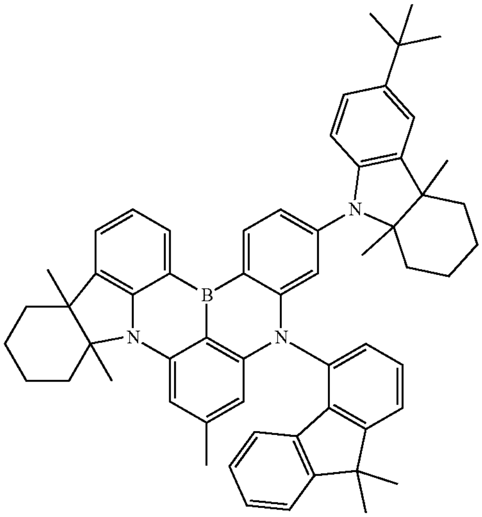
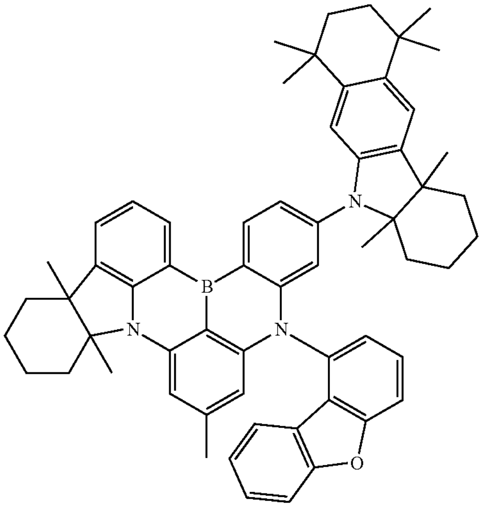

-continued
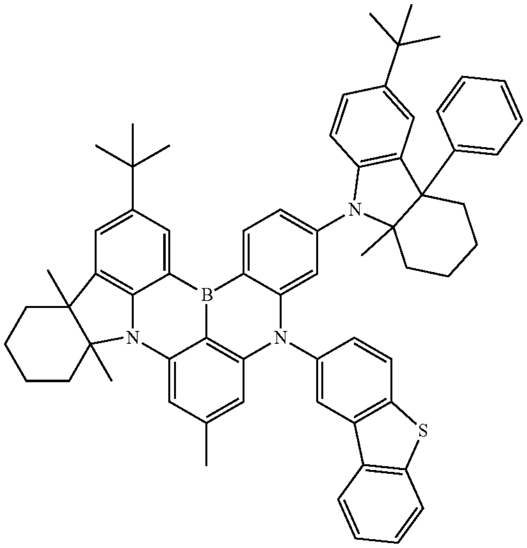
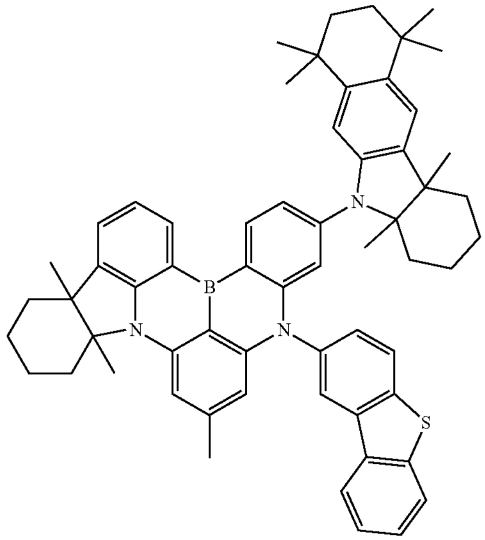
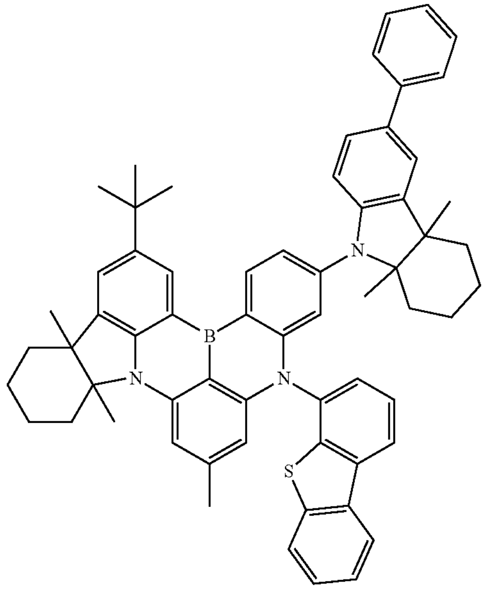
-continued
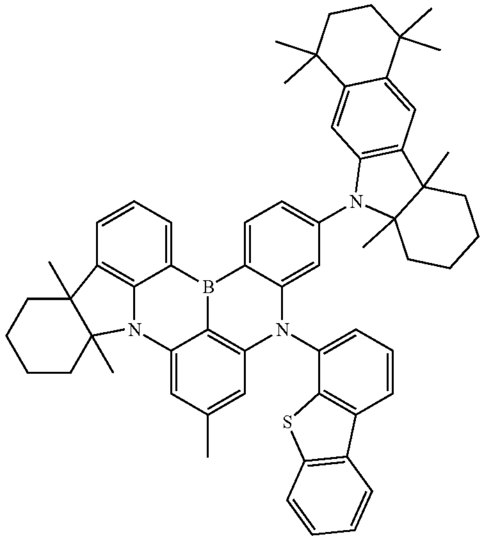
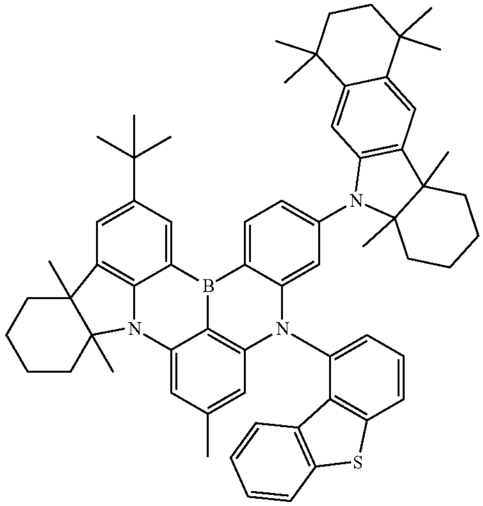
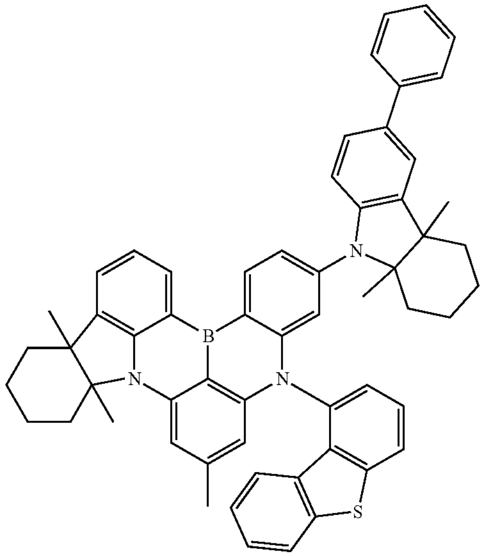

-continued

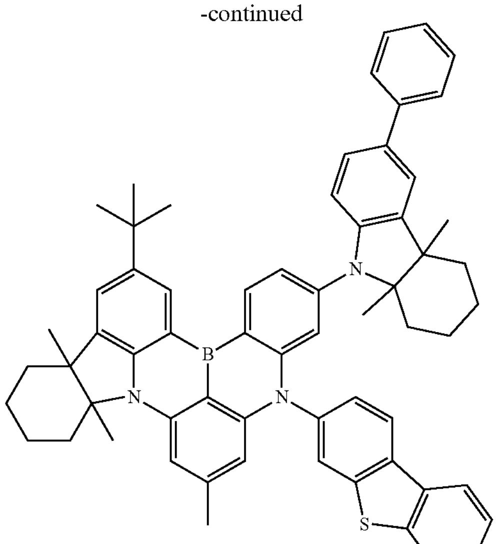

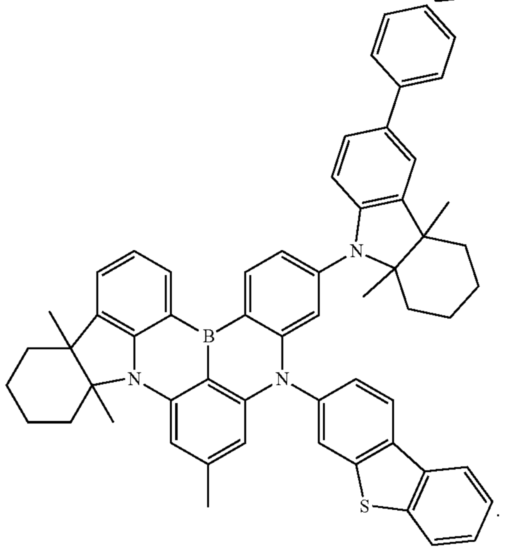

In the present specification, a description of a certain part "including" certain constituents means capable of further including other constituents, and does not exclude other constituents unless particularly stated on the contrary.

In the present specification, a description of one member being placed "on" another member includes not only a case of the one member being in contact with the another member but a case of still another member being present between the two members.

An organic light emitting device of the present disclosure includes a first electrode; a second electrode provided opposite to the first electrode; and one, two or more organic material layers provided between the first electrode and the second electrode, wherein one or more layers of the organic material layers can include the above-described compound.

For example, the organic light emitting device of the present disclosure can have structures as illustrated in FIG. 1 and FIG. 2, however, the structure is not limited thereto.

FIG. 1 illustrates a structure of the organic light emitting device in which a first electrode (2), a light emitting layer (3) and a second electrode (4) are consecutively laminated on a substrate (1). The heterocyclic compound of the present disclosure is included in the light emitting layer.

FIG. 2 illustrates a structure of the organic light emitting device in which a first electrode (2), a hole injection layer (5), a hole transfer layer (6), an electron blocking layer (7), a light emitting layer (3), a first electron transfer layer (8), a second electron transfer layer (9), an electron injection layer (10) and a second electrode (4) are consecutively laminated on a substrate (1). The heterocyclic compound of the present disclosure is preferably included in the light emitting layer.

FIG. 1 and FIG. 2 are for illustrative purposes only, and the organic light emitting device is not limited thereto.

In one embodiment of the present disclosure, the organic material layer includes a light emitting layer, and the light emitting layer includes the heterocyclic compound of Chemical Formula 1.

In one embodiment of the present disclosure, the light emitting layer includes a dopant and a host.

In one embodiment of the present disclosure, the light emitting layer includes a dopant and a host in a mass ratio of 1:99 to 5:95.

In one embodiment of the present disclosure, the light emitting layer includes the compound of Chemical Formula 1 as a dopant.

In one embodiment of the present disclosure, the light emitting layer includes the compound of Chemical Formula 1 as a blue dopant.

In one embodiment of the present disclosure, the light emitting layer includes a host.

The organic light emitting device according to one embodiment of the present specification includes a light emitting layer, and the light emitting layer includes the compound of Chemical Formula 1 and a compound of the following Chemical Formula H.

<Chemical Formula H>

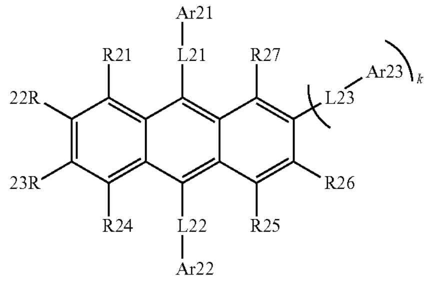

In Chemical Formula H,

L21 to L23 are the same as or different from each other, and each independently is a direct bond, a substituted or unsubstituted arylene group, or a substituted or unsubstituted heteroarylene group, R21 to R27 are the same as or different from each other, and each independently is hydrogen, deuterium, a substituted or unsubstituted alkyl group, a substituted or unsubstituted cycloalkyl group, a substituted or unsubstituted silyl group, a substituted or unsubstituted aryl group, or a substituted or unsubstituted heteroaryl group, Ar21 to Ar23 are the same as or different from each other, and each independently is a substituted or unsubstituted aryl group, or a substituted or unsubstituted heteroaryl group, and k is 0 or 1.

In one embodiment of the present specification, when k is 0, hydrogen or deuterium is linked to the position of -L23-Ar23.

In one embodiment of the present specification, L21 to L23 are the same as or different from each other, and each independently is a direct bond, a substituted or unsubstituted C6-C30 arylene group, or a C2-C30 heteroarylene group substituted or unsubstituted and including N, O or S.

In one embodiment of the present specification, L21 to L23 are the same as or different from each other, and each independently is a direct bond, a C6-C30 arylene group, or a C2-C30 heteroarylene group including N, O or S, and the arylene group or the heteroarylene group is unsubstituted or substituted with a C1-C10 alkyl group, a C6-C30 aryl group or a C2-C30 heteroaryl group.

In one embodiment of the present specification, L21 to L23 are the same as or different from each other, and each independently is a direct bond, a substituted or unsubstituted phenylene group, a substituted or unsubstituted biphenylene group, a substituted or unsubstituted naphthylene group, a substituted or unsubstituted divalent dibenzofuran group, or a substituted or unsubstituted divalent dibenzothiophene group.

In one embodiment of the present specification, Ar21 to Ar23 are the same as or different from each other, and each independently is a substituted or unsubstituted C6-C30 aryl group, or a substituted or unsubstituted C2-C30 heteroaryl group.

In one embodiment of the present specification, Ar21 to Ar23 are the same as or different from each other, and each independently is a C6-C30 aryl group that is unsubstituted or substituted with deuterium; or a C2-C30 heteroaryl group that is unsubstituted or substituted with deuterium.

In one embodiment of the present specification, Ar21 to Ar23 are the same as or different from each other, and each independently is a substituted or unsubstituted monocyclic to tetracyclic aryl group; or a substituted or unsubstituted monocyclic to tetracyclic heteroaryl group.

In one embodiment of the present specification, Ar21 to Ar23 are the same as or different from each other, and each independently is a monocyclic to tetracyclic aryl group that is unsubstituted or substituted with deuterium; or a monocyclic to tetracyclic heteroaryl group that is unsubstituted or substituted with deuterium.

In one embodiment of the present specification, Ar21 to Ar23 are the same as or different from each other, and each independently is a substituted or unsubstituted phenyl group, a substituted or unsubstituted biphenyl group, a substituted or unsubstituted terphenyl group, a substituted or unsubstituted naphthyl group, a substituted or unsubstituted anthracene group, a substituted or unsubstituted phenanthryl group, a substituted or unsubstituted phenalene group, a substituted or unsubstituted fluorenyl group, a substituted or unsubstituted benzofluorenyl group, a substituted or unsubstituted furan group, a substituted or unsubstituted thiophene group, a substituted or unsubstituted dibenzofuran group, a substituted or unsubstituted naphthobenzofuran group, a substituted or unsubstituted dibenzothiophene group, or a substituted or unsubstituted naphthobenzothiophene group.

In one embodiment of the present specification, Ar21 and Ar22 are different from each other.

In one embodiment of the present specification, Ar21 is a substituted or unsubstituted aryl group, and Ar22 is a substituted or unsubstituted aryl group.

In one embodiment of the present specification, Ar21 is a substituted or unsubstituted aryl group, and Ar22 is a substituted or unsubstituted heteroaryl group.

In one embodiment of the present specification, Ar21 is an aryl group that is unsubstituted or substituted with deuterium, and Ar22 is an aryl group that is unsubstituted or substituted with deuterium.

In one embodiment of the present specification, Ar21 is an aryl group that is unsubstituted or substituted with deuterium, and Ar22 is a heteroaryl group that is unsubstituted or substituted with deuterium.

In one embodiment of the present specification, R21 to R27 are the same as or different from each other, and each independently is hydrogen or deuterium.

In one embodiment of the present specification, R21 to R27 are hydrogen.

In one embodiment of the present specification, R21 to R27 are deuterium.

In one embodiment of the present specification, Chemical Formula H is one of the following Chemical Formula H01 or H02:

<Chemical Formula H01>

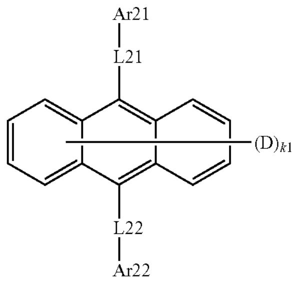

<Chemical Formula H02>

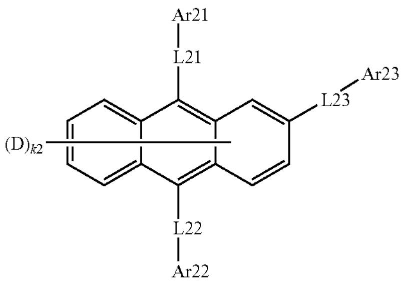

wherein in Chemical Formulae H01 and H02:

L21 to L23 and Ar21 to Ar23 have the same definitions as in Chemical Formula H, D means deuterium, k1 is an integer of 0 to 8, and k2 is an integer of 0 to 7.

In one embodiment of the present specification, the compound of Chemical Formula H is any one compound selected from among the following compounds:

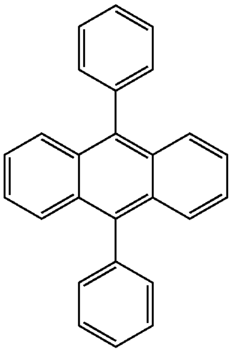

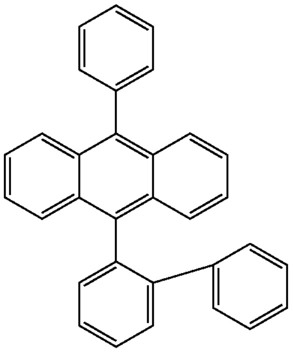

-continued
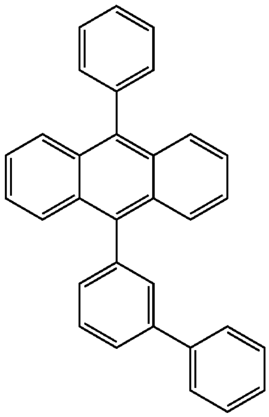
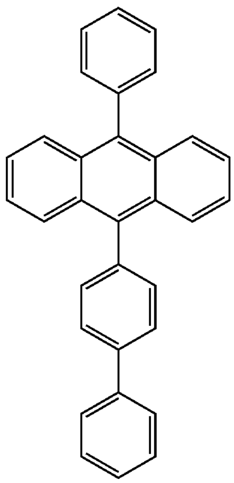
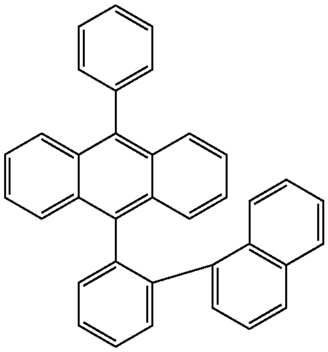
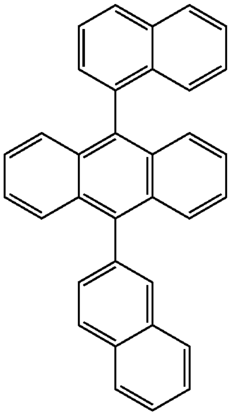
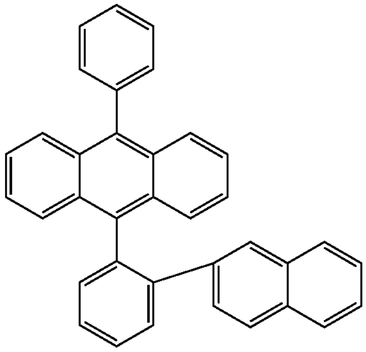
-continued
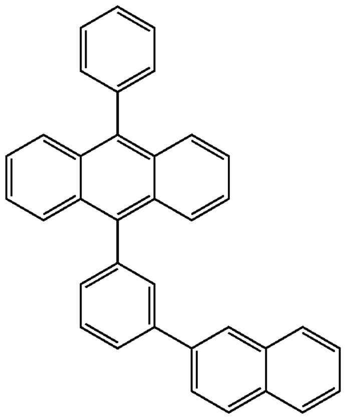
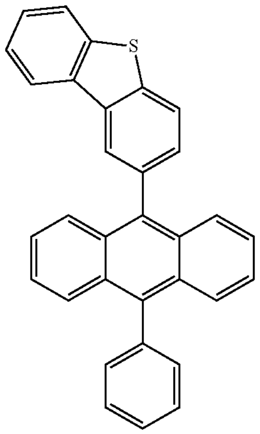
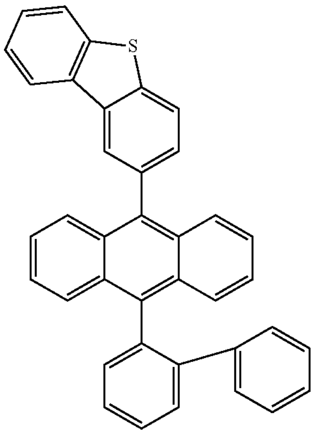
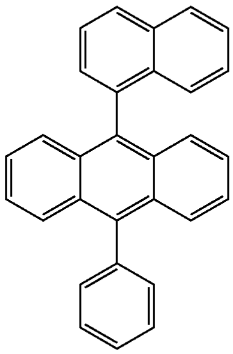
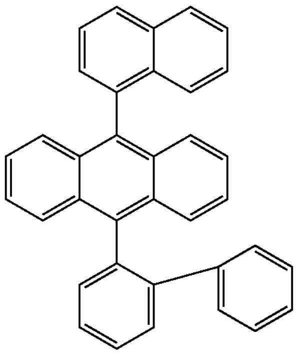
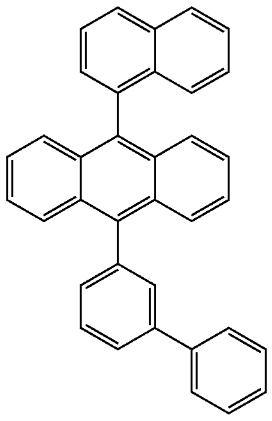
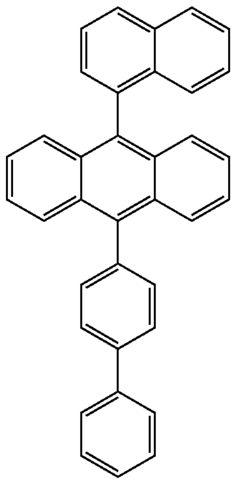

-continued
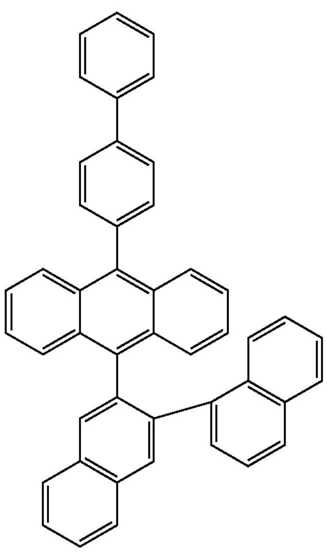
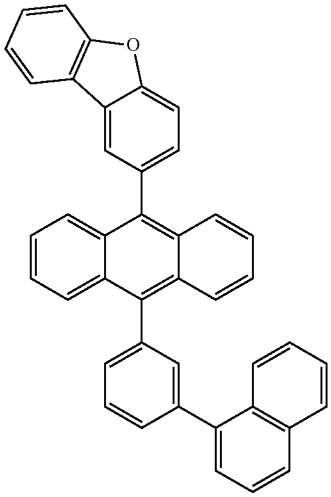
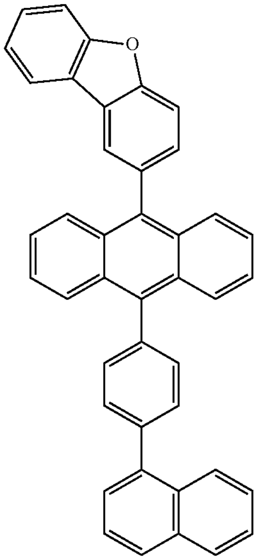
-continued
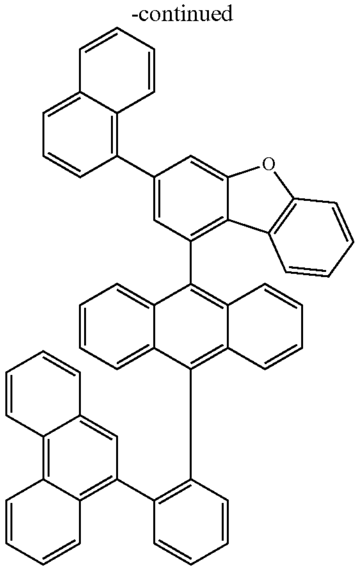
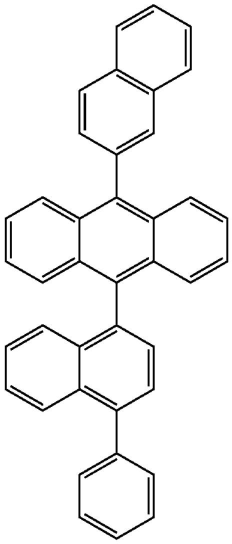
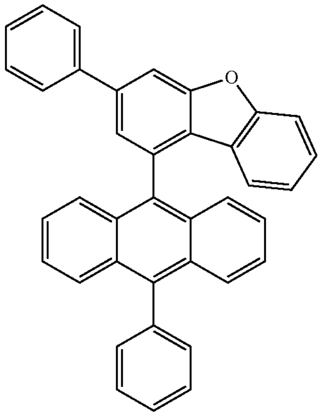
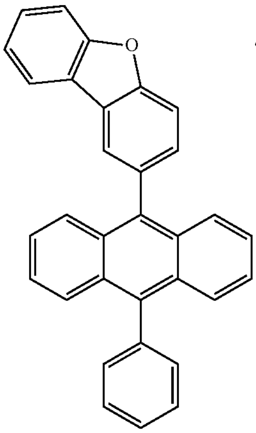
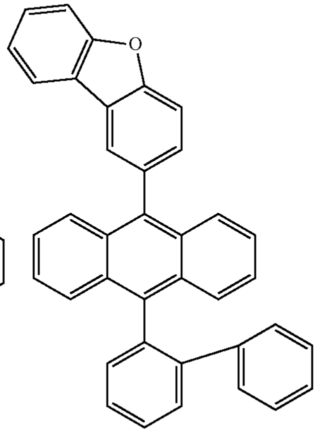

-continued
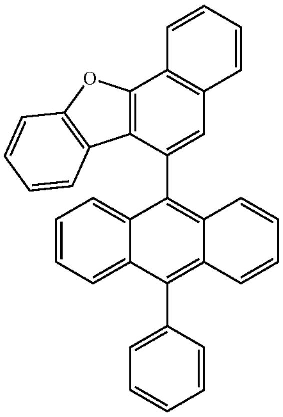
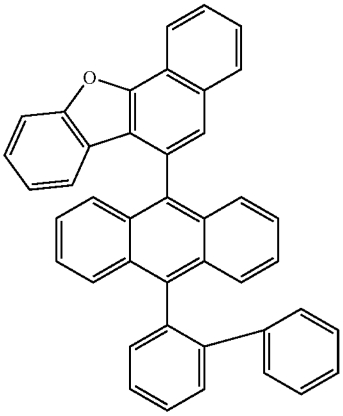
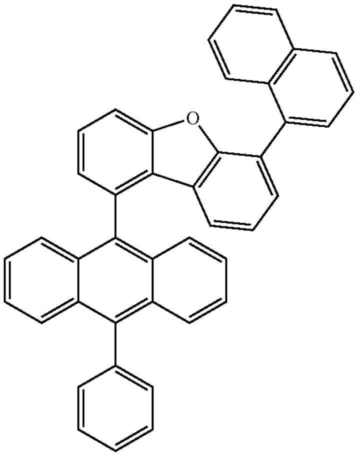
-continued
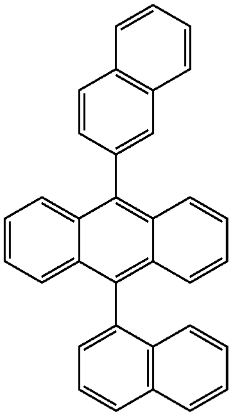
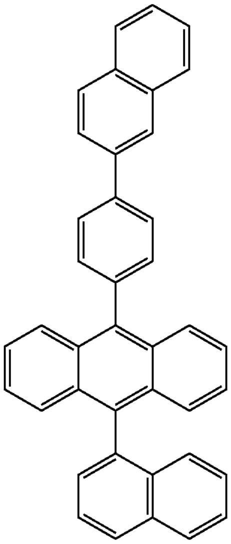
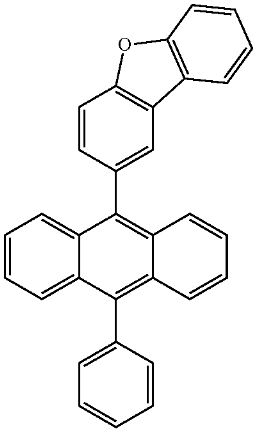
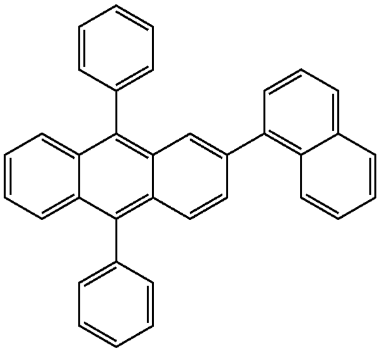

-continued
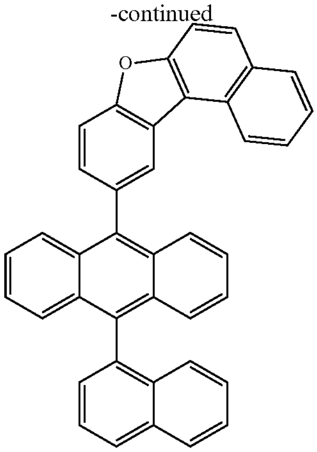
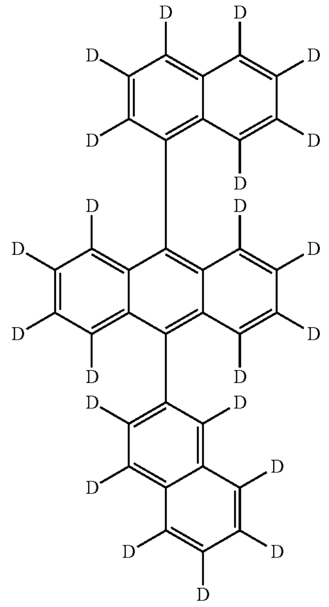
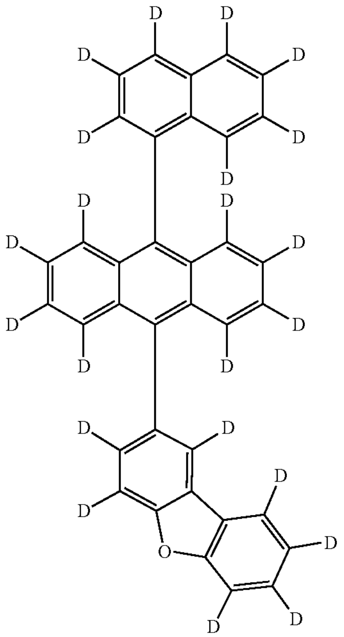
-continued
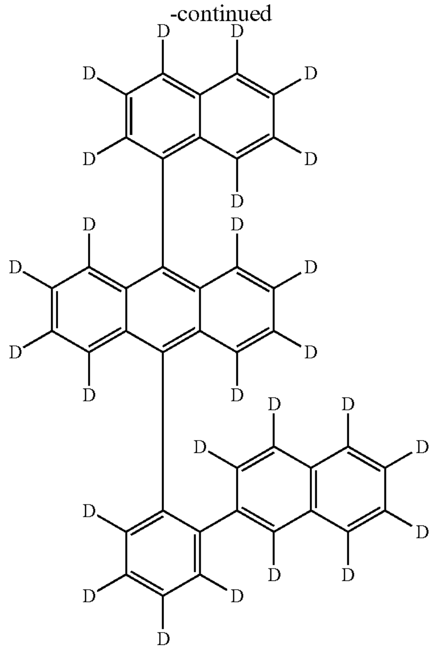
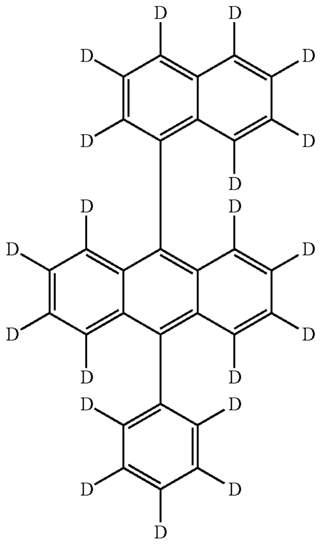
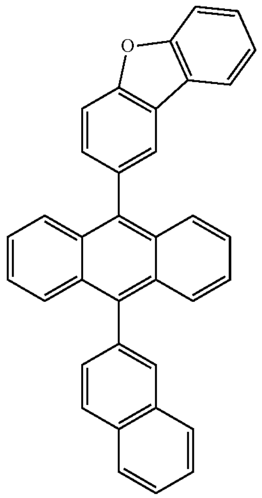

-continued
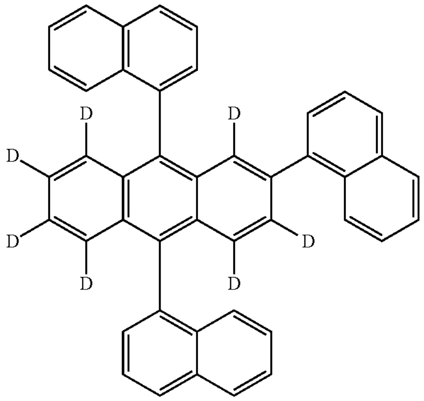
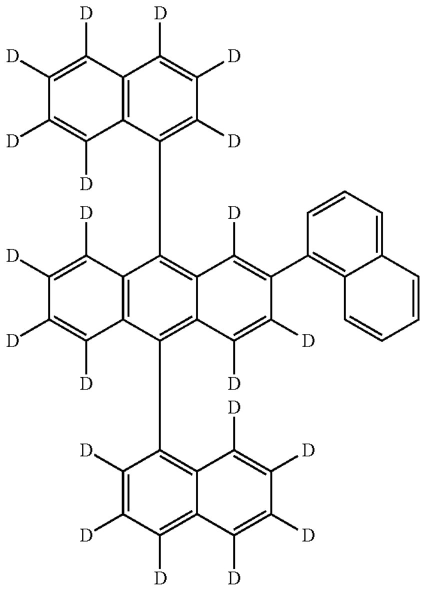
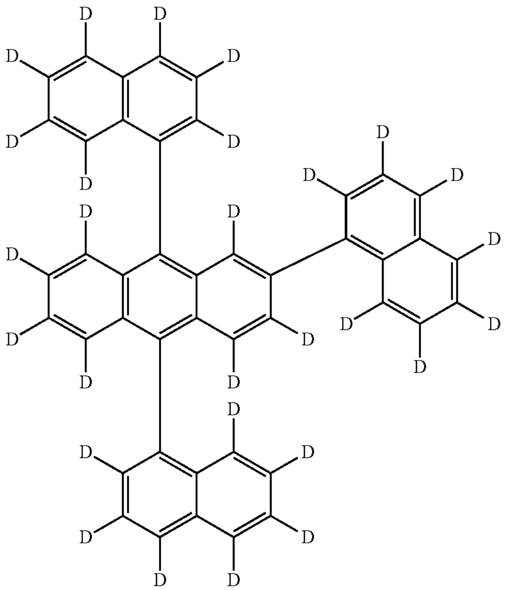
-continued
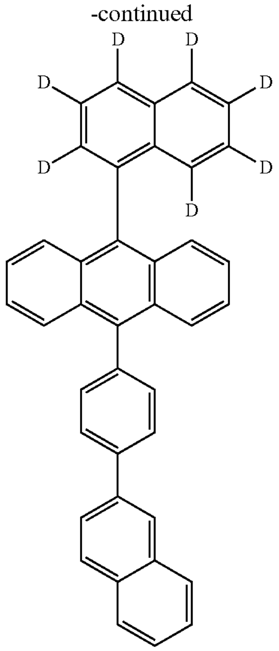
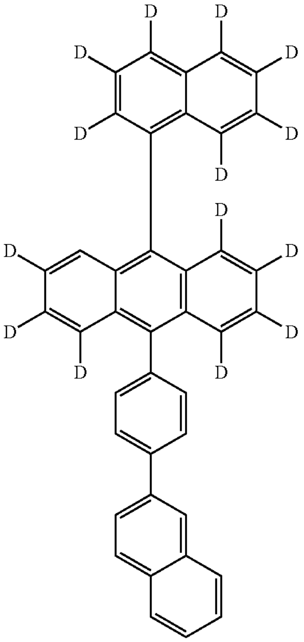

-continued
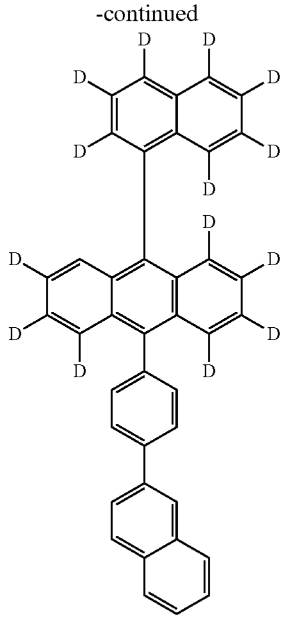
-continued
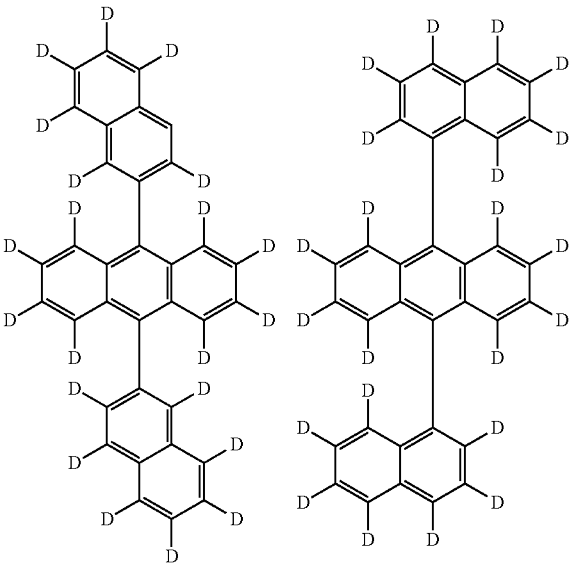
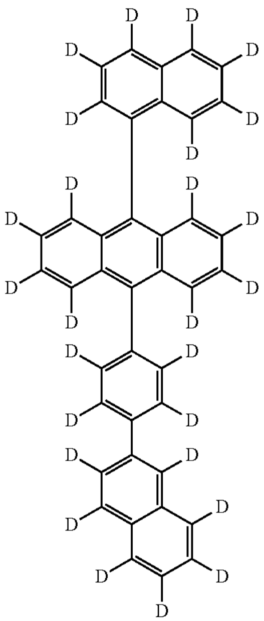
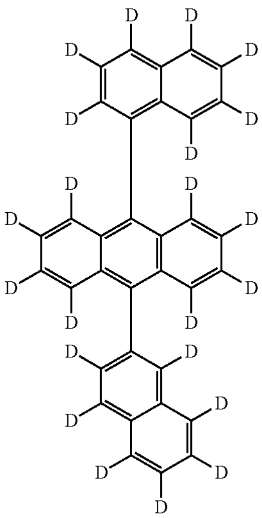
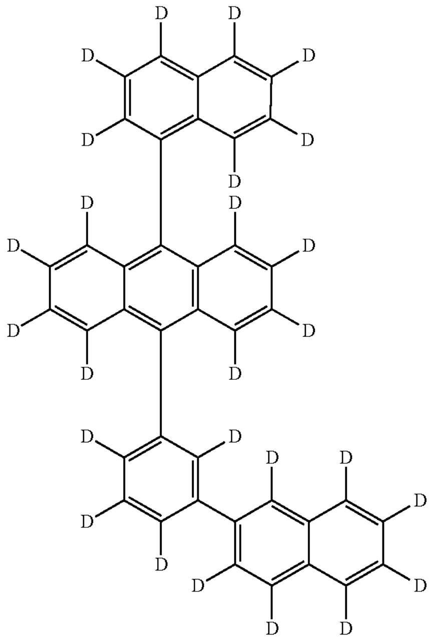

-continued
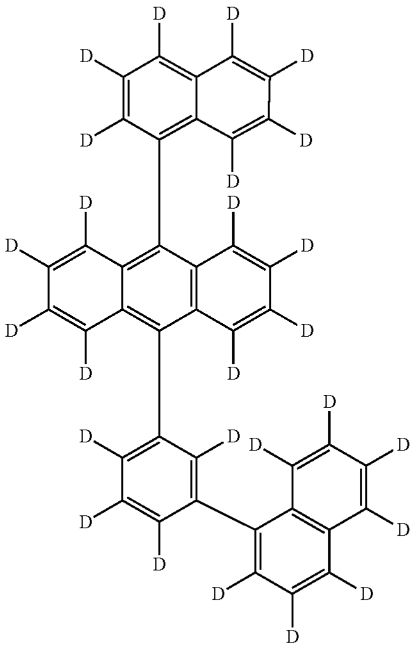
-continued
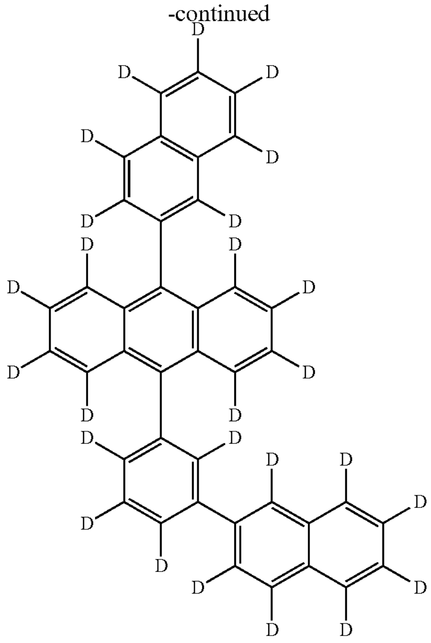
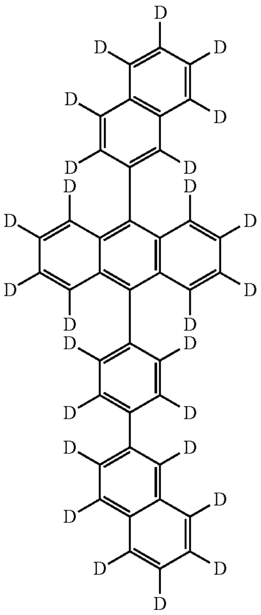
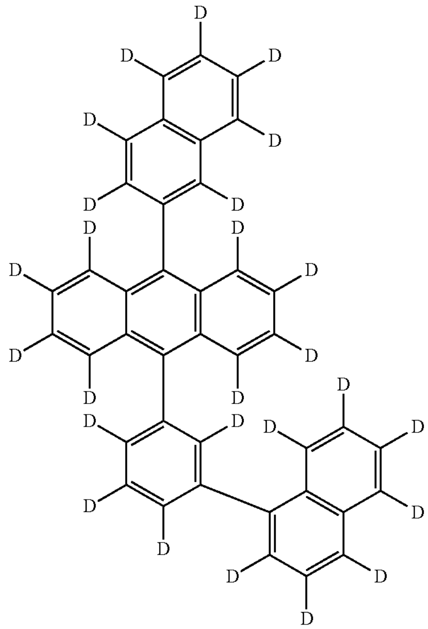

-continued
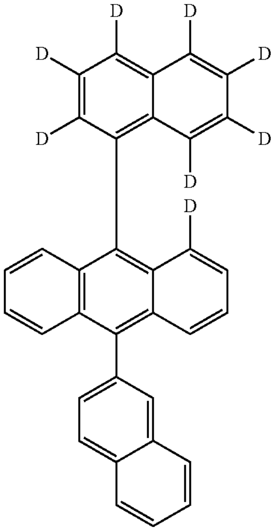
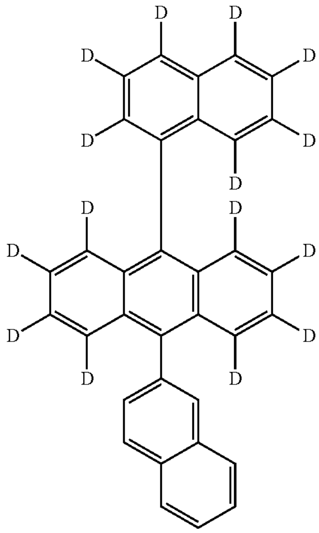
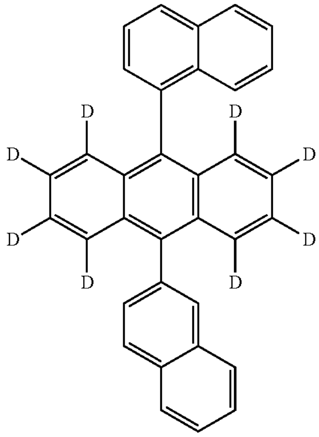
-continued
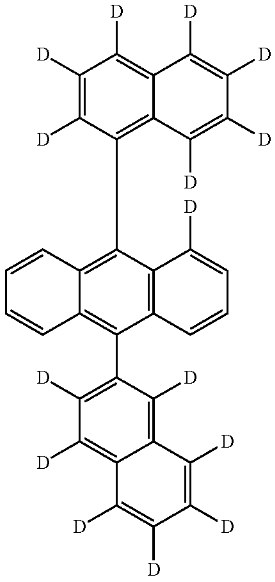
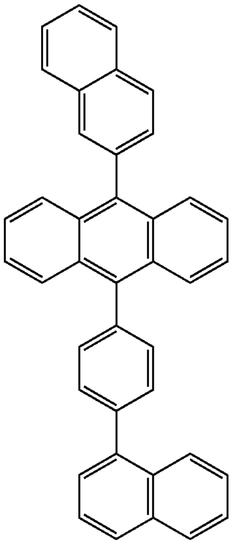
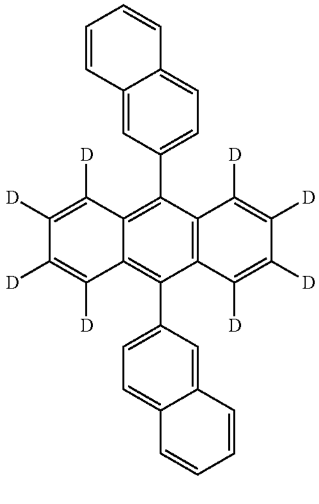
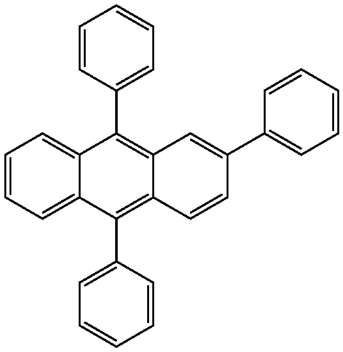

-continued
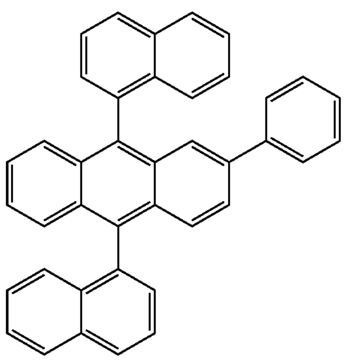
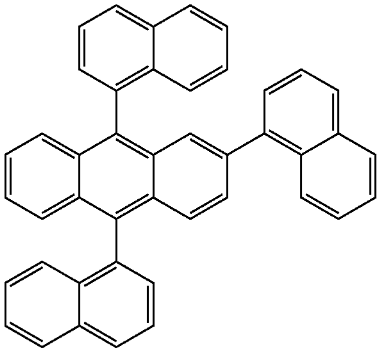
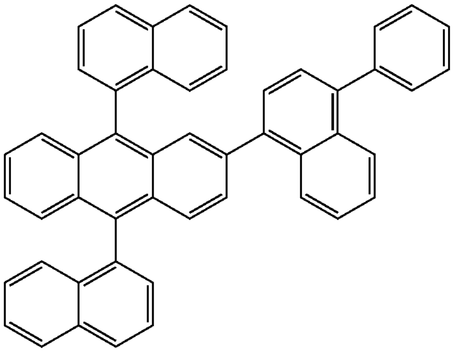
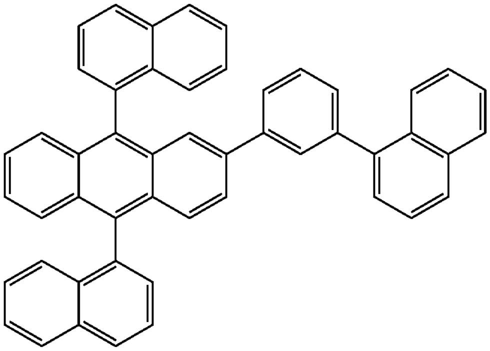
-continued
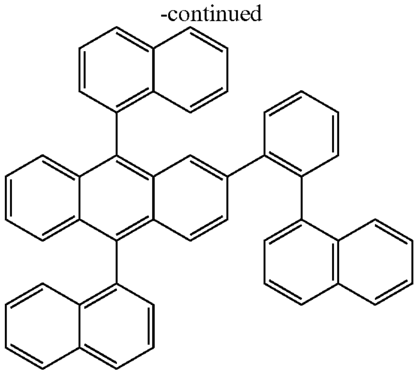
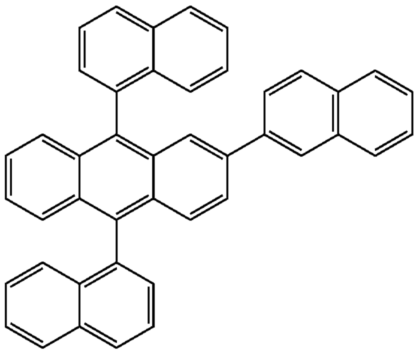
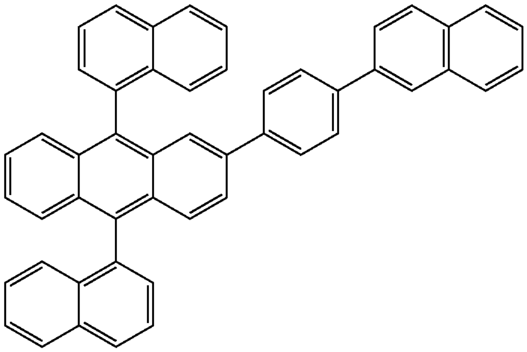
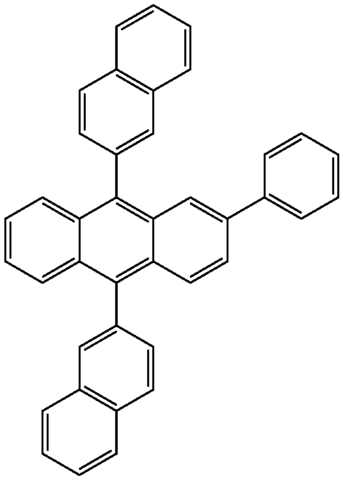

-continued
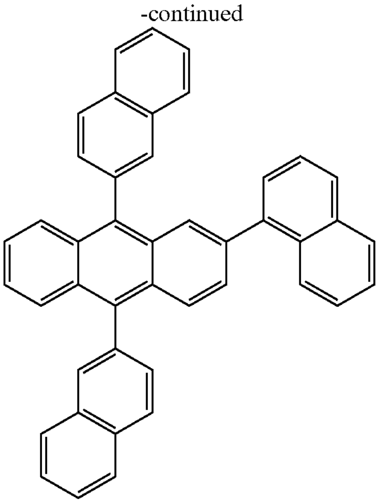
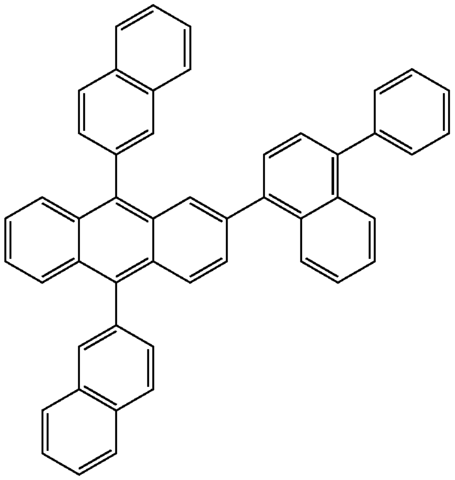
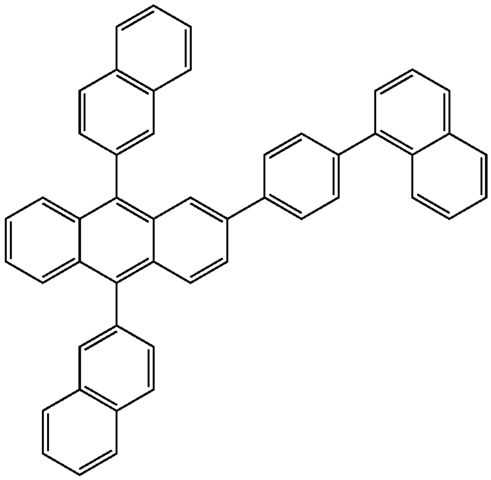
-continued
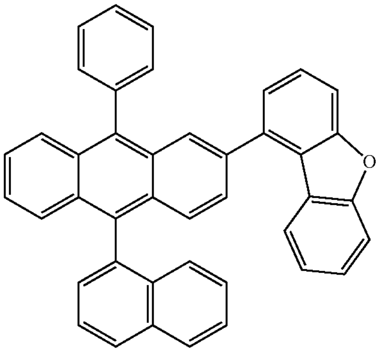
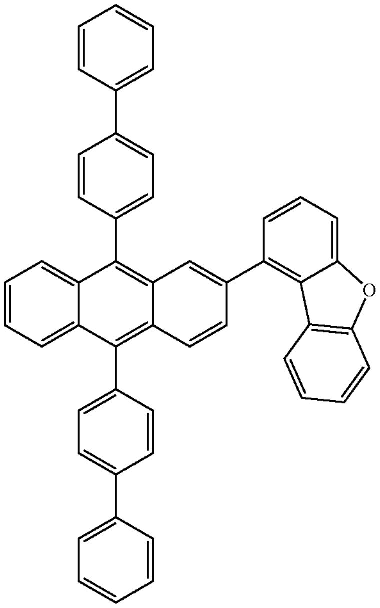
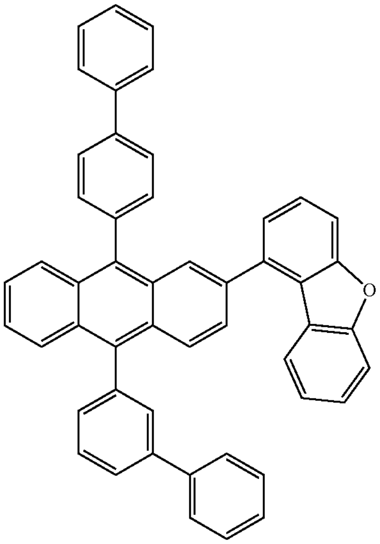

-continued
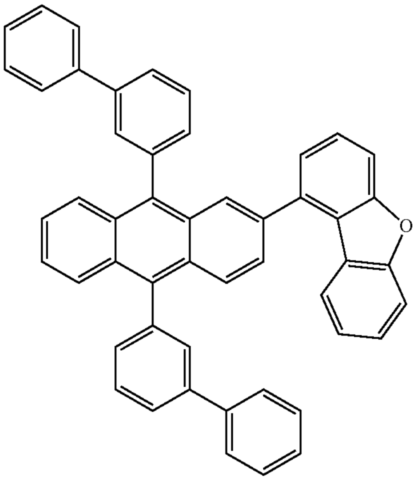
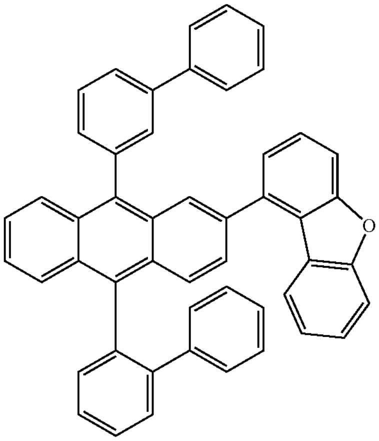
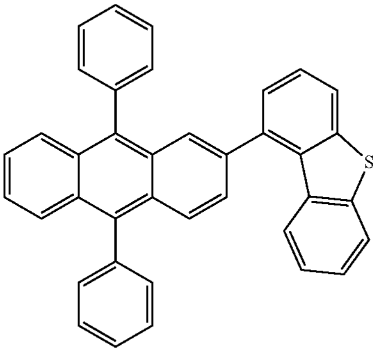
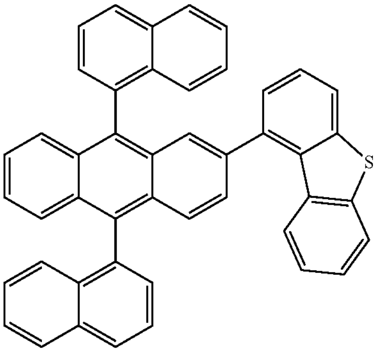
-continued
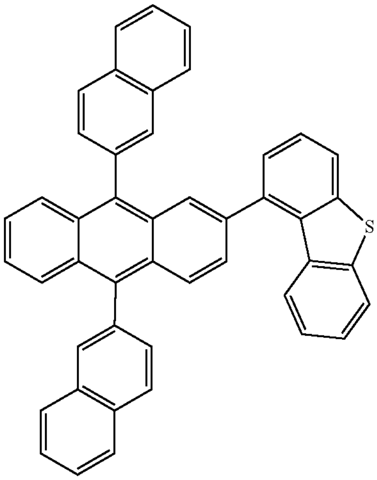
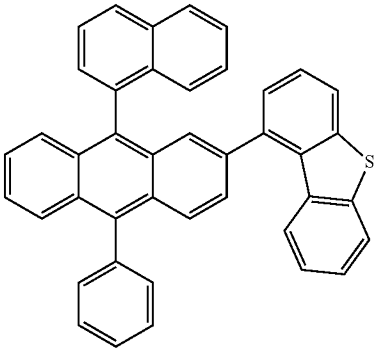
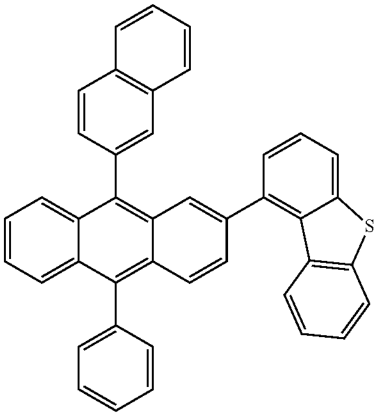
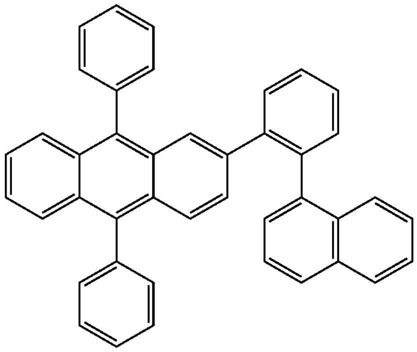

-continued
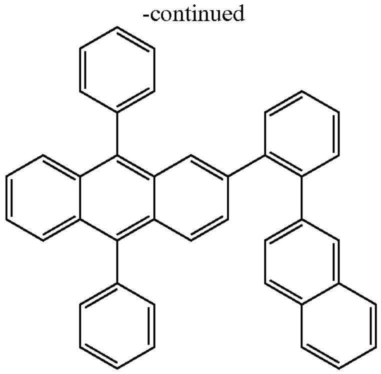
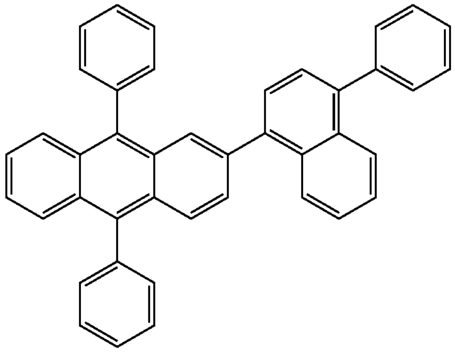
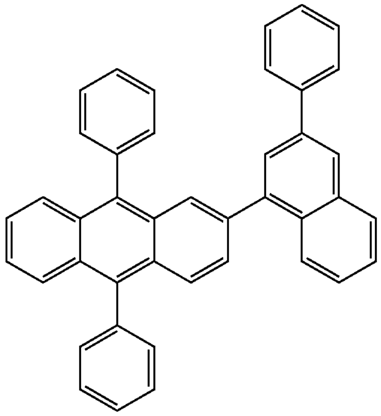
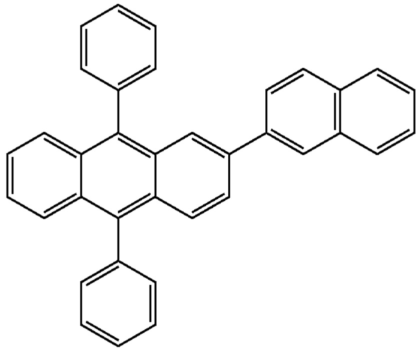
-continued
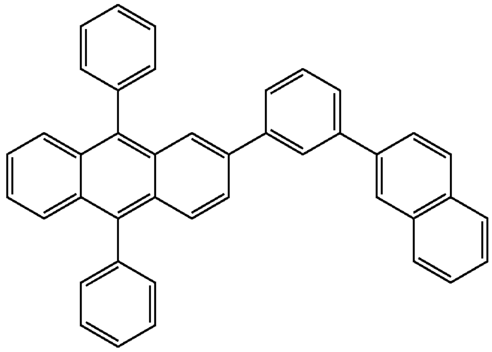
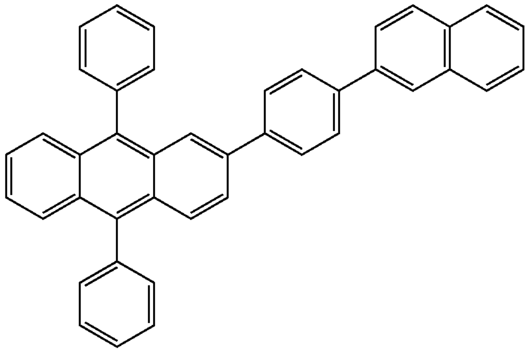
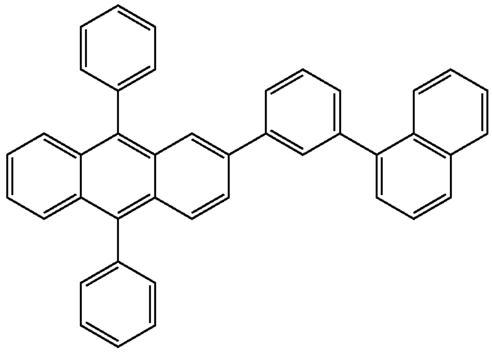
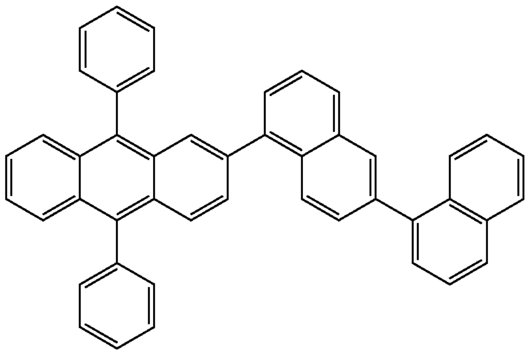

-continued
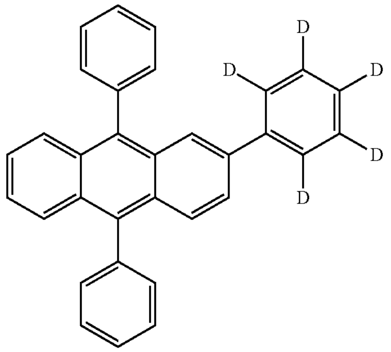
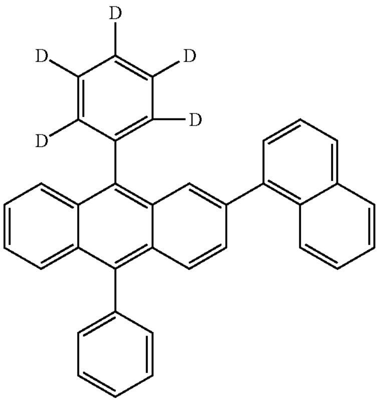
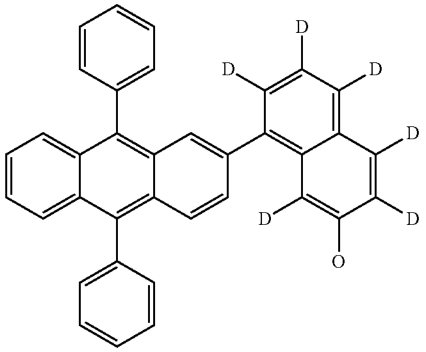
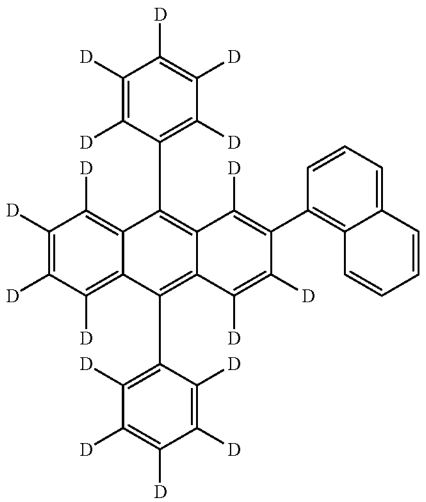
-continued
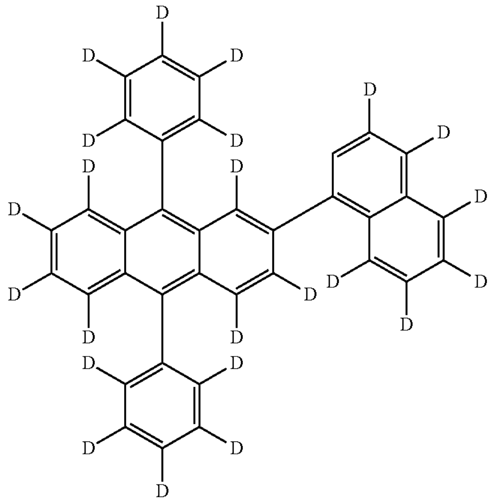
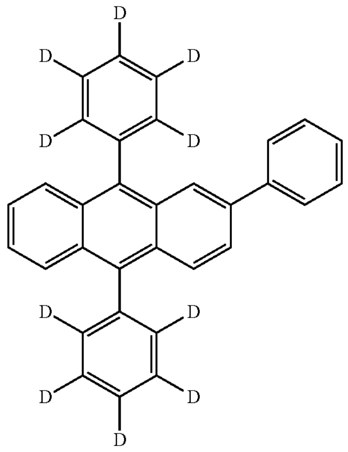
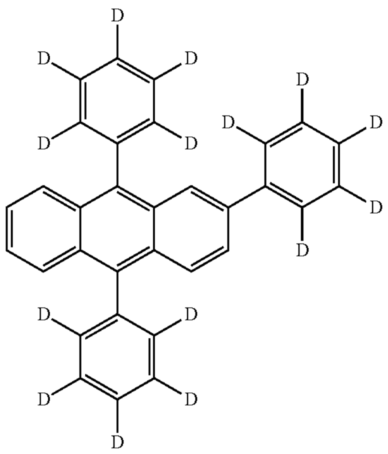

-continued
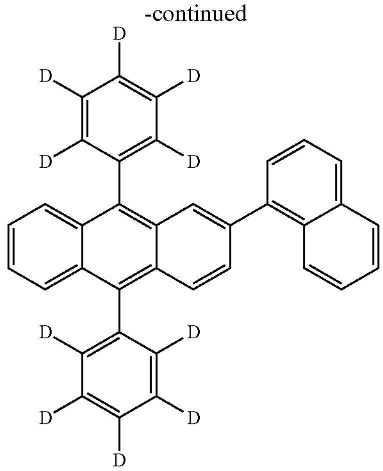
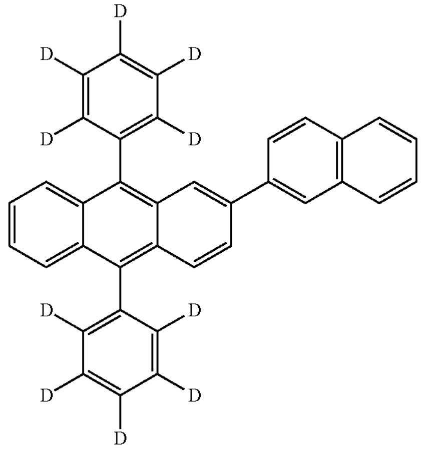
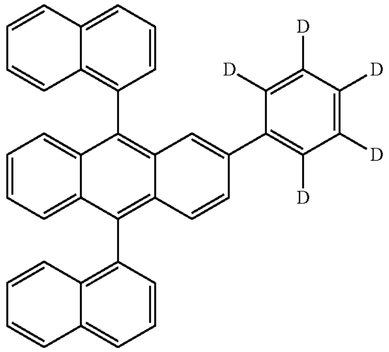
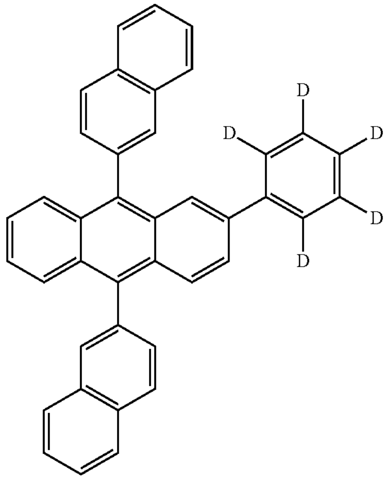
-continued
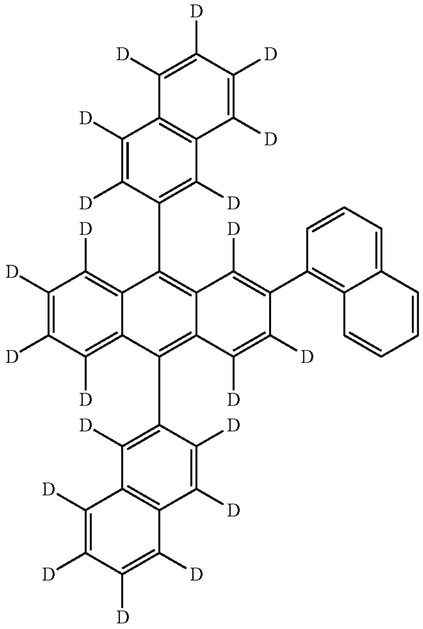
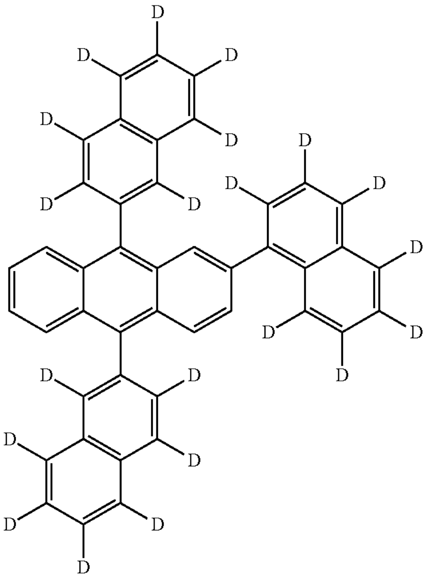

-continued

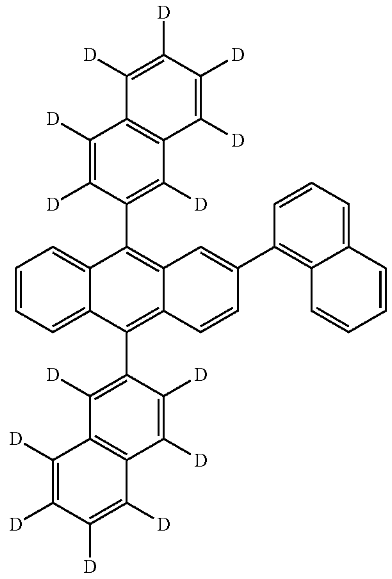

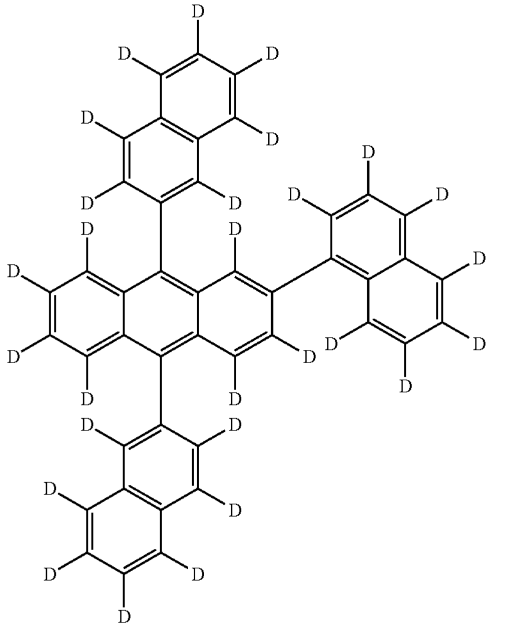

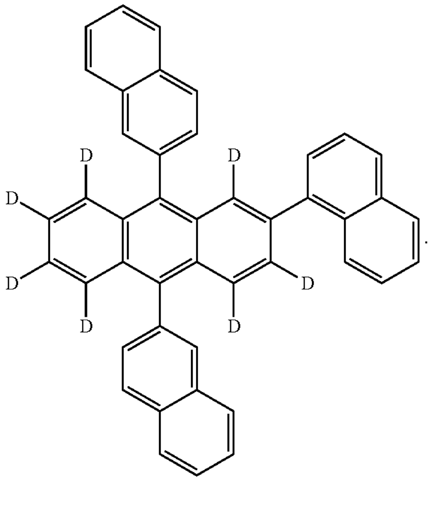

In one embodiment of the present disclosure, the organic material layer includes a hole injection layer, a hole transfer layer, or a hole injection and transfer layer, and the hole injection layer, the hole transfer layer, or the hole injection and transfer layer can include the compound of Chemical Formula 1.

In one embodiment of the present disclosure, the organic material layer includes an electron injection layer, an electron transfer layer, or an electron injection and transfer layer, and the electron injection layer, the electron transfer layer, or the electron injection and transfer layer can include the compound of Chemical Formula 1.

In one embodiment of the present disclosure, the organic material layer includes an electron blocking layer or a hole blocking layer, and the electron blocking layer or the hole blocking layer can include the compound of Chemical Formula 1.

For example, the organic light emitting device according to the present disclosure can be manufactured by forming an anode on a substrate by depositing a metal, a metal oxide having conductivity, or an alloy thereof using a physical vapor deposition (PVD) method such as sputtering or e-beam evaporation, forming an organic material layer including a hole injection layer, a hole transfer layer, a light emitting layer or an electron transfer layer and an organic material layer including the compound of Chemical Formula 1 thereon, and then depositing a material usable as a cathode thereon. In addition to such a method, the organic light emitting device can also be manufactured by consecutively depositing a cathode material, an organic material layer and an anode material on a substrate.

As the anode material, materials having large work function are normally preferred so that hole injection to an organic material layer is smooth. Specific examples of the anode material usable in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)-thiophene] (PEDT), polypyrrole and polyaniline, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The hole injection material is a material capable of favorably receiving holes from an anode at a low voltage, and the highest occupied molecular orbital (HOMO) of the hole injection material is preferably in between the work function of the anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

As the hole transfer material, materials capable of receiving holes from an anode or a hole injection layer, moving the holes to a light emitting layer, and having high mobility for the holes are suited. Specific examples thereof include arylamine-based organic materials, conductive polymers, block copolymers having conjugated parts and non-conjugated parts together, and the like, but are not limited thereto.

The light emitting material is a material capable of emitting light in a visible region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxy-quinoline aluminum complexes ($Alq_3$); carbazole-based compounds; dimerized styryl compounds; BAlq; 10-hydroxybenzoquinoline-metal compounds; benzoxazole-, benzothiazole- and benzimidazole-based compounds; poly(p-phenylenevinylene) (PPV)-based polymers; spiro compounds; polyfluorene, rubrene, and the like, but are not limited thereto.

When the organic light emitting device includes a plurality of organic material layers, the organic material layers can be formed with materials the same as or different from each other.

The organic light emitting device of the present specification can be manufactured using materials and methods known in the art except that one or more layers of the organic material layers are formed using the compound.

One embodiment of the present specification also provides a method for manufacturing an organic light emitting device formed using the compound.

The dopant material can include aromatic compounds, styrylamine compounds, boron complexes, fluoranthene compounds, metal complexes and the like. Specifically, the aromatic compound is a fused aromatic ring derivative having a substituted or unsubstituted arylamino group, and arylamino group-including pyrene, anthracene, chrysene, peryflanthene and the like can be included. The styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group can be substituted or unsubstituted. Specifically, styrylamine, styryldiamine, styryltriamine, styryltetramine and the like can be included, however, the styrylamine compound is not limited thereto. As the metal complex, iridium complexes, platinum complexes and the like can be used, however, the metal complex is not limited thereto.

The electron transfer layer is a layer receiving electrons from an electron injection layer and transferring the electrons to a light emitting layer, and as the electron transfer material, materials capable of favorably receiving electrons from a cathode, moving the electrons to a light emitting layer, and having high mobility for the electrons are suited. Specific examples thereof include Al complexes of 8-hydroxyquinoline; complexes including $Alq_3$; organic radical compounds; hydroxyflavon-metal complexes, and the like, but are not limited thereto. The electron transfer layer can be used together with any desired cathode material as used in the art. Particularly, examples of the suitable cathode material can include common materials having low work function and having an aluminum layer or a silver layer following. Specifically, cesium, barium, calcium, ytterbium and samarium are included, and in each case, an aluminum layer or a silver layer follows.

The electron transfer layer can have a multilayer structure of a first electron transfer layer and a second electron transfer layer, and among the multilayered electron transfer layers, the layer far from a light emitting layer can include LiQ.

The electron injection layer is a layer injecting electrons from an electrode, and compounds having an electron transferring ability, having an electron injection effect from a cathode, having an excellent electron injection effect for a light emitting layer or light emitting material, and preventing excitons generated in the light emitting layer from moving to a hole injection layer, and in addition thereto, having an excellent thin film forming ability are preferred. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxy-quinolinato)copper, bis(8-hydroxyquinolinato)manganese, tris(8-hydroxyquinolinato)aluminum, tris(2-methyl-8-hydroxy-quinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chloro-gallium, bis(2-methyl-8-quinolinato) (o-cresolato)gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer blocking holes from reaching a cathode, and can be generally formed under the same condition as the hole injection layer. Specific examples thereof can include oxadiazole derivatives, triazole derivatives, phenanthroline derivatives, BCP, aluminum complexes and the like, but are not limited thereto.

The organic light emitting device according to the present specification can be a top-emission type, a bottom-emission type or a dual-emission type depending on the materials used.

The organic light emitting device of the present disclosure can be manufactured using common organic light emitting device manufacturing methods and materials except that one or more layers of the organic material layers are formed using the above-described compound.

EXAMPLES

Methods for preparing the compound of Chemical Formula 1, and methods for manufacturing the organic light emitting device using the same will be specifically described in the following examples. However, the following examples are for illustrative purposes only, and the scope of the present disclosure is not limited thereto.

As for the types and the number of substituents in the following reaction formulae, various types of intermediates can be synthesized by those skilled in the art properly selecting known starting materials. As the reaction type and the reaction condition, those known in the art can be used.

Synthesis Example 1. Synthesis of Compound 1

1) Synthesis of Intermediate 1

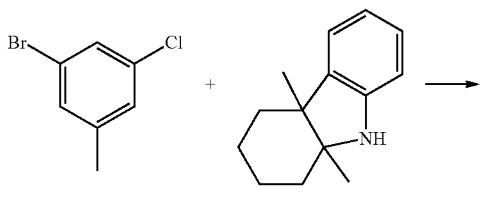

-continued

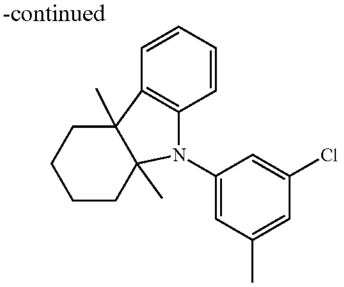

[Intermediate 1]

After introducing 1-bromo-3-chloro-5-methylbenzene (40 g), 4a,9a-dimethyl-2,3,4,4a,9,9a-hexahydro-1H-carbazole (39.2 g), sodium-tert-butoxide (37.4 g) and bis(tri-tert-butyl-phosphine) palladium (0) (1.0 g) to toluene (600 ml), the mixture was stirred for 2 hours under reflux. After the reaction was finished, the result was extracted and then column purified to obtain Intermediate 1 (50 g, yield 79%). MS[M+H]+=326

2) Synthesis of Intermediate 2

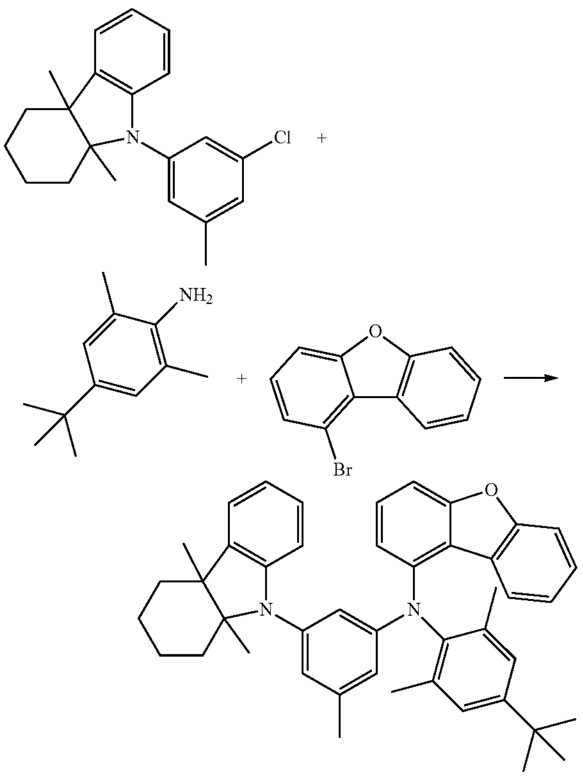

Intermediate 2

After introducing Intermediate 1 (40 g), 4-(tert-butyl)-2,6-dimethylaniline (21.8 g), sodium-tert-butoxide (35.4 g) and bis(tri-tert-butylphosphine)palladium(0) (0.62 g) to toluene (600 ml), the mixture was refluxed for 1 hour, and, after checking the progress of the reaction, 1-bromodibenzo[b,d]furan (30 g) was introduced thereto during the reflux reaction, and the result was further refluxed for 1 hour. After the reaction was finished, the result was extracted and then column purified to obtain Intermediate 2 (55 g, yield 71%). MS[M+H]+=633

3) Synthesis of Compound 1

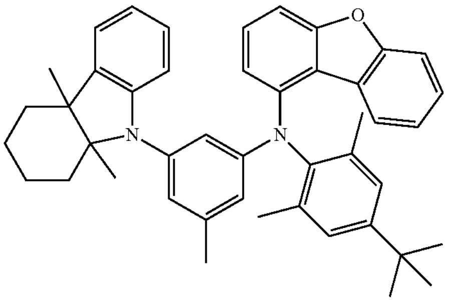

Intermediate 2

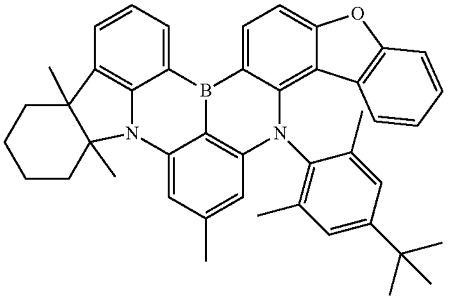

Compound 1

After introducing Intermediate 2 (25 g) and boron triiodide (26.3 g) to 1,2-dichlorobenzene (250 ml) under a nitrogen atmosphere, the mixture was stirred for 4 hours at 160° C. After the reaction was finished, the result was extracted and then recrystallized to obtain Compound 1 (7.1 g, yield 31%). MS[M+H]+=641

Synthesis Example 2. Synthesis of Compound 2

1) Synthesis of Intermediate 3

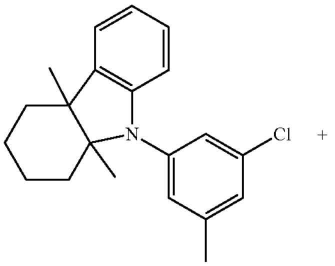

Intermediate 1

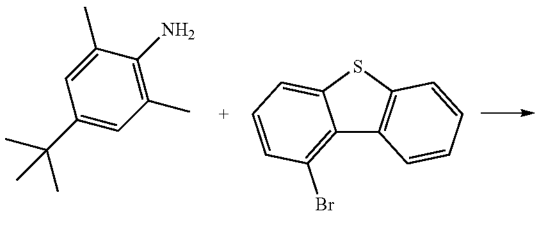

-continued

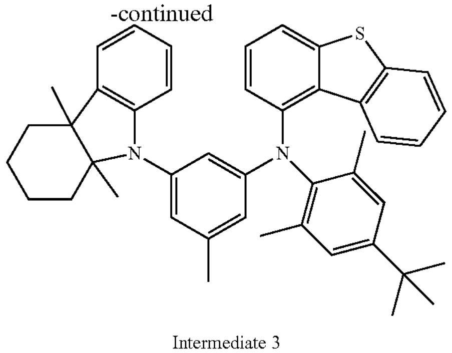

Intermediate 3

After introducing Intermediate 1 (40 g), 4-(tert-butyl)-2,6-dimethylaniline (21.8 g), sodium-tert-butoxide (35.4 g) and bis(tri-tert-butylphosphine)palladium(0) (0.62 g) to toluene (600 ml), the mixture was refluxed for 1 hour, and, after checking the progress of the reaction, 1-bromodibenzo-[b,d]thiophene (32.3 g) was introduced thereto during the reflux reaction, and the result was further refluxed for 1 hour. After the reaction was finished, the result was extracted and then column purified to obtain Intermediate 3 (57 g, yield 72%). MS[M+H]+=649

2) Synthesis of Compound 2

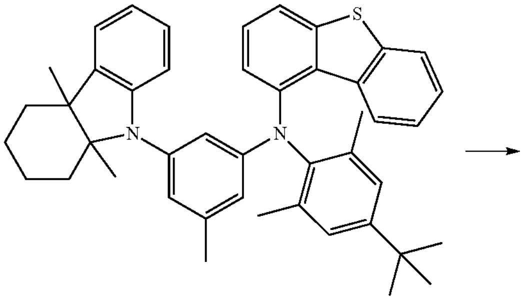

Intermediate 3

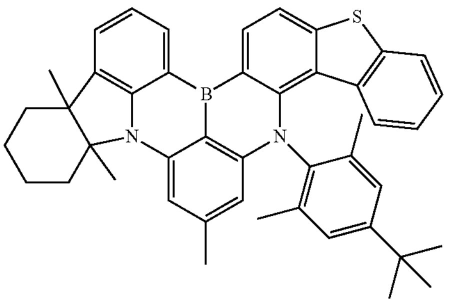

Compound 2

After introducing Intermediate 3 (25 g) and boron triiodide (25.6 g) to 1,2-dichlorobenzene (250 ml) under a nitrogen atmosphere, the mixture was stirred for 4 hours at 160° C. After the reaction was finished, the result was extracted and then recrystallized to obtain Compound 2 (7.5 g, yield 30%). MS[M+H]+=657

Synthesis Example 3. Synthesis of Compound 3

1) Synthesis of Intermediate 4

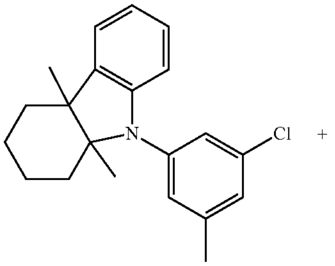

Intermediate 1

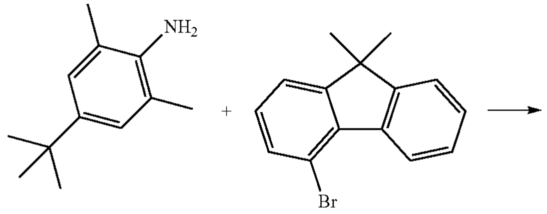

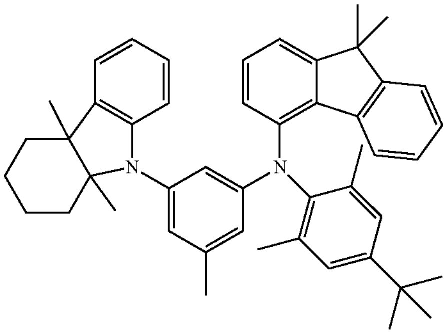

Intermediate 4

After introducing Intermediate 1 (40 g), 4-(tert-butyl)-2,6-dimethylaniline (21.8 g), sodium-tert-butoxide (35.4 g) and bis(tri-tert-butylphosphine)palladium(0) (0.62 g) to toluene (600 ml), the mixture was refluxed for 1 hour, and, after checking the progress of the reaction, 4-bromo-9,9-dimethyl-9H-fluorene (33.5 g) was introduced thereto during the reflux reaction, and the result was further refluxed for 1 hour. After the reaction was finished, the result was extracted and then column purified to obtain Intermediate 4 (56 g, yield 69%). MS[M+H]+=659

2) Synthesis of Compound 3

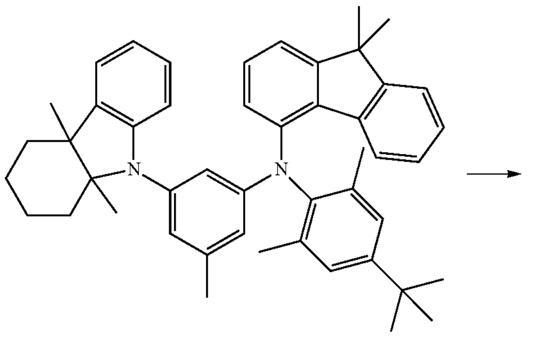

Intermediate 4

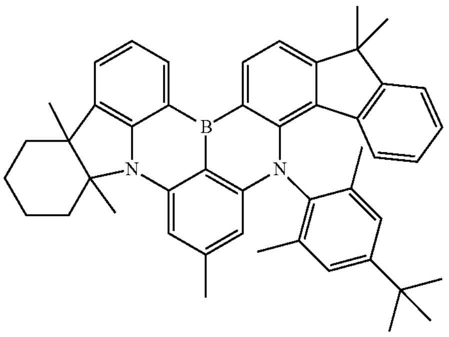

Compound 3

After introducing Intermediate 4 (25 g) and boron triiodide (25.3 g) to 1,2-dichlorobenzene (250 ml) under a nitrogen atmosphere, the mixture was stirred for 4 hours at 160° C. After the reaction was finished, the result was extracted and then recrystallized to obtain Compound 3 (7.4 g, yield 29%). MS[M+H]+=667

Synthesis Example 4. Synthesis of Compound 4

1) Synthesis of Intermediate 5

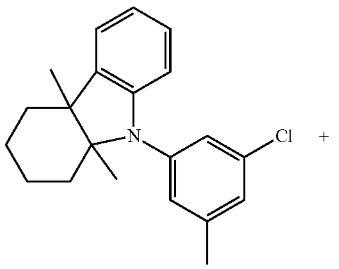

Intermediate 1

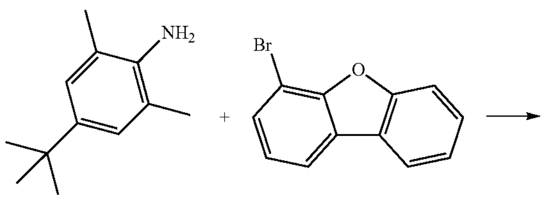

-continued

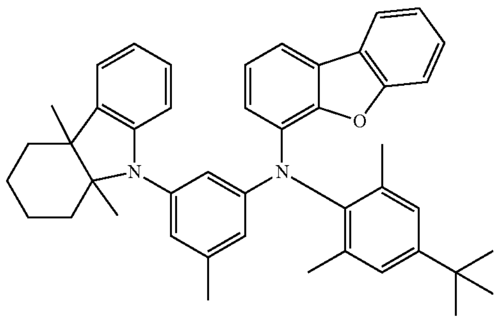

Intermediate 5

A reaction was conducted using the same equivalents and materials and the same synthesis method as the synthesis process of Intermediate 2 using Intermediate 1 (40 g) and 4-bromodibenzo[b,d]furan (30 g). After the reaction was finished, the result was extracted and then column purified to obtain Intermediate 5 (54 g, yield 71%). MS[M+H]+=633

2) Synthesis of Compound 4

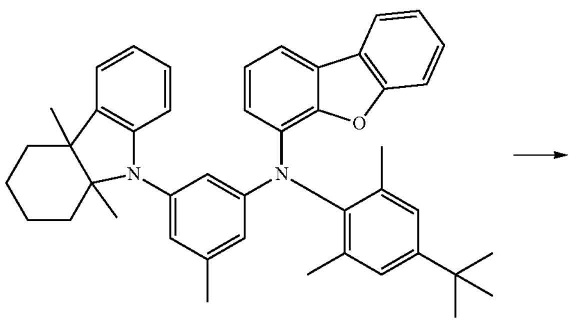

Intermediate 5

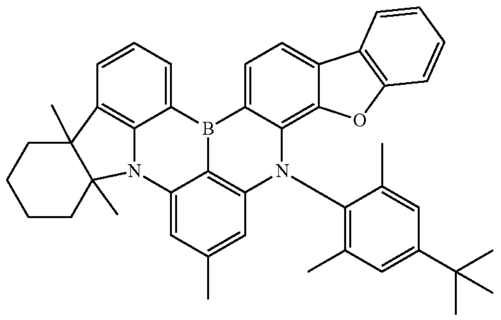

Compound 4

After introducing Intermediate 5 (25 g) and boron triiodide (26.3 g) to 1,2-dichlorobenzene (250 ml) under a nitrogen atmosphere, the mixture was stirred for 4 hours at 160° C. After the reaction was finished, the result was extracted and then recrystallized to obtain Compound 4 (7.2 g, yield 31%). MS[M+H]+=641

Synthesis Example 5. Synthesis of Compound 5

1) Synthesis of Intermediate 6

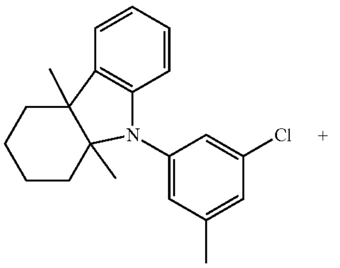

Intermediate 1

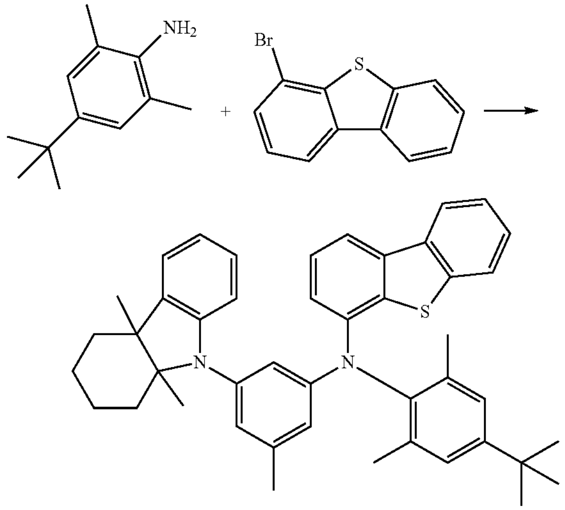

Intermediate 6

A reaction was conducted using the same equivalents and materials and the same synthesis method as the synthesis process of Intermediate 2 using Intermediate 1 (40 g) and 4-bromodibenzo[b,d]thiophene (32.3 g). After the reaction was finished, the result was extracted and then column purified to obtain Intermediate 6 (55 g, yield 71%). MS[M+H]+=649

2) Synthesis of Compound 5

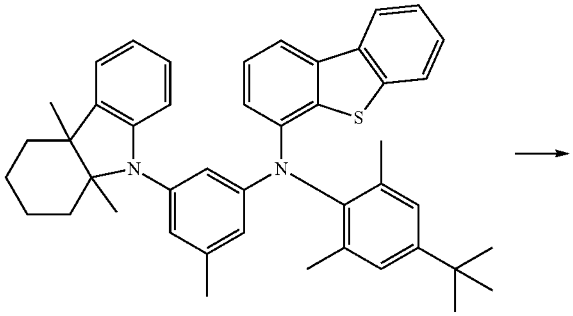

Intermediate 6

-continued

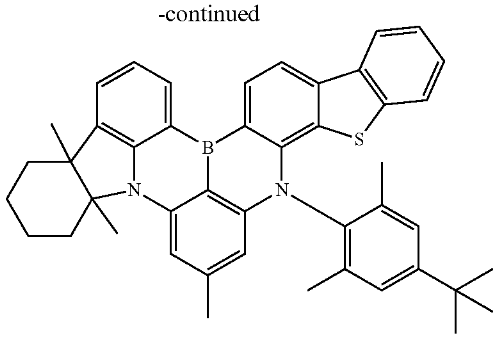

Compound 5

After introducing Intermediate 6 (25 g) and boron triiodide (25.6 g) to 1,2-dichlorobenzene (250 ml) under a nitrogen atmosphere, the mixture was stirred for 4 hours at 160° C. After the reaction was finished, the result was extracted and then recrystallized to obtain Compound 5 (7.6 g, yield 31%). MS[M+H]+=657

Synthesis Example 6. Synthesis of Compound 6

1) Synthesis of Intermediate 7

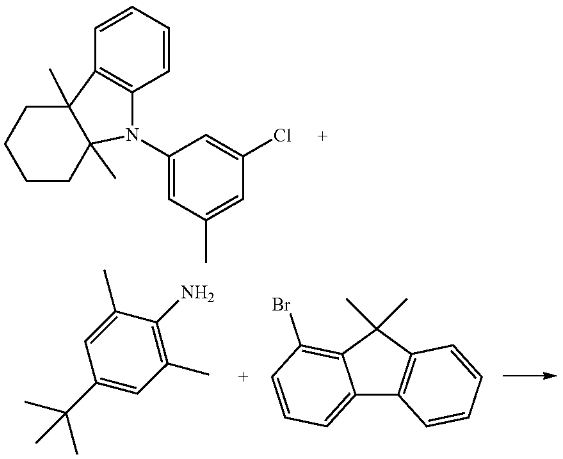

Intermediate 1

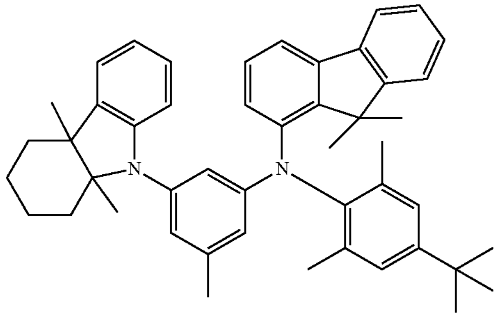

Intermediate 7

A reaction was conducted using the same equivalents and materials and the same synthesis method as the synthesis process of Intermediate 2 using Intermediate 1 (40 g) and 1-bromo-9,9-dimethyl-9H-fluorene (33.5 g). After the reaction was finished, the result was extracted and then column purified to obtain Intermediate 7 (58 g, yield 70%). MS[M+H]+=659

2) Synthesis of Compound 6

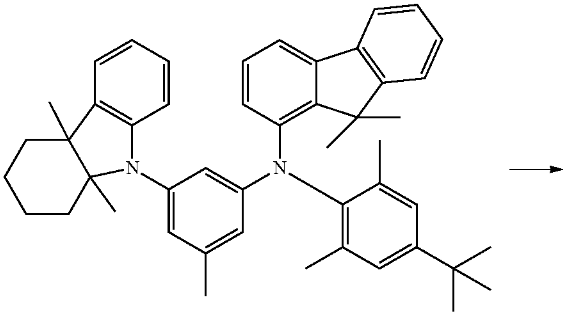

Intermediate 7

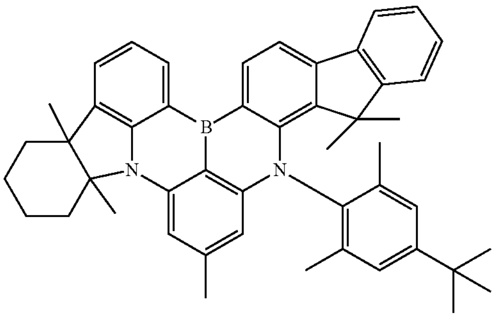

Compound 6

After introducing Intermediate 7 (25 g) and boron triiodide (25.3 g) to 1,2-dichlorobenzene (250 ml) under a nitrogen atmosphere, the mixture was stirred for 4 hours at 160° C. After the reaction was finished, the result was extracted and then recrystallized to obtain Compound 6 (7.6 g, yield 30%). MS[M+H]+=667

Synthesis Example 7. Synthesis of Compound 7

1) Synthesis of Intermediate 8

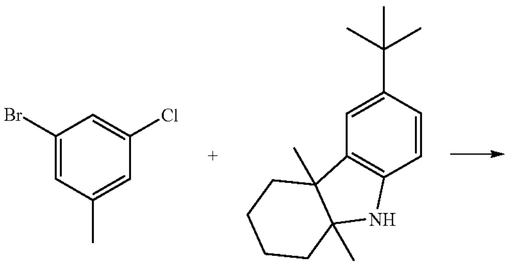

-continued

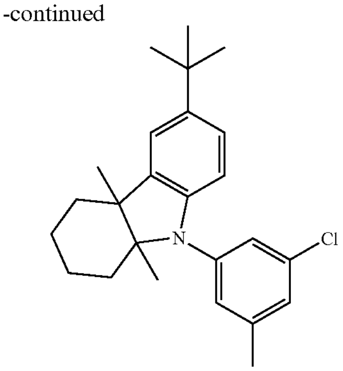

Intermediate 8

A reaction was conducted using the same equivalents and materials and the same synthesis method as the synthesis process of Intermediate 1 using 6-(tert-butyl)-4a,9a-dimethyl-2,3,4,4a,9,9a-hexahydro-1H-carbazole (50 g). After the reaction was finished, the result was extracted and then column purified to obtain Intermediate 8 (58 g, yield 78%). MS[M+H]+=382

2) Synthesis of Intermediate 9

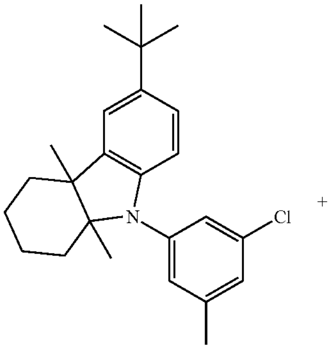

Intermediate 8

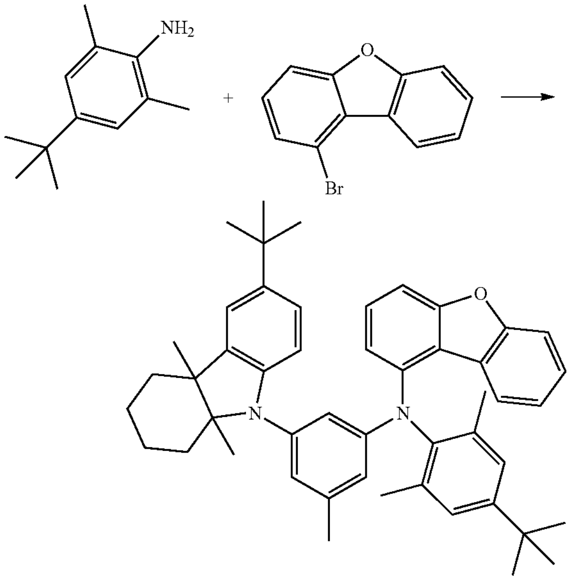

Intermediate 9

A reaction was conducted using the same equivalents and materials and the same synthesis method as the synthesis process of Intermediate 2 using Intermediate 8 (40 g) and 1-bromodibenzo[b,d]furan (26 g). After the reaction was finished, the result was extracted and then column purified to obtain Intermediate 9 (55 g, yield 76%). MS[M+H]+=690

3) Synthesis of Compound 7

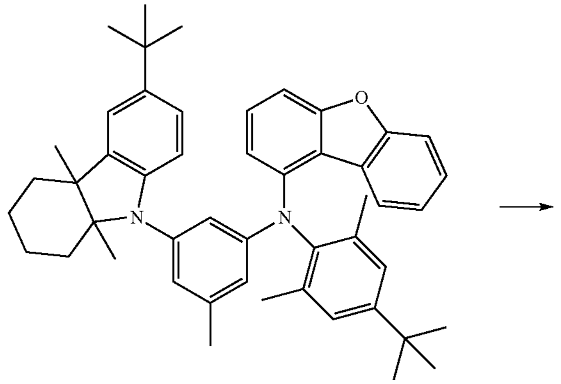

Intermediate 9

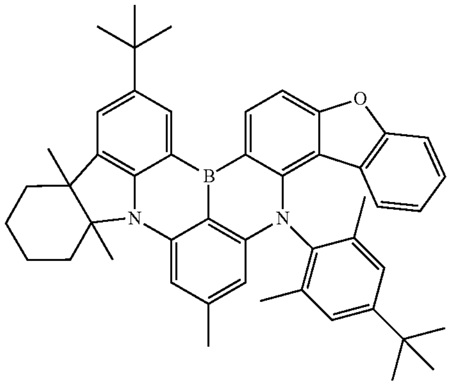

Compound 7

After introducing Intermediate 9 (25 g) and boron triiodide (24.1 g) to 1,2-dichlorobenzene (250 ml) under a nitrogen atmosphere, the mixture was stirred for 4 hours at 160° C. After the reaction was finished, the result was extracted and then recrystallized to obtain Compound 7 (7.6 g, yield 30%). MS[M+H]+=697

Synthesis Example 8. Synthesis of Compound 8

1) Synthesis of Intermediate 10

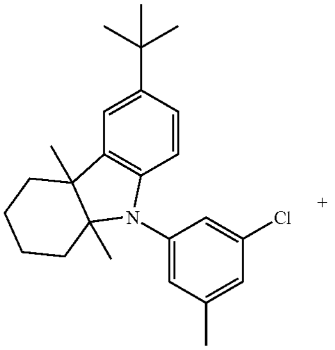

Intermediate 8

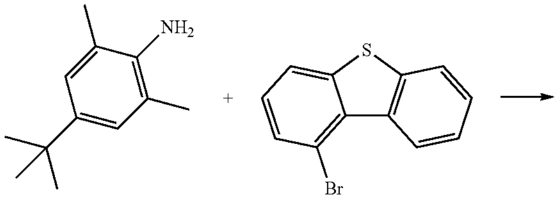

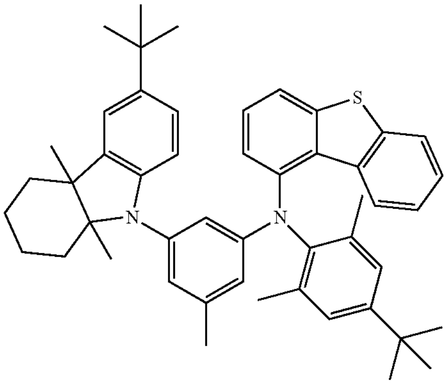

Intermediate 10

A reaction was conducted using the same equivalents and materials and the same synthesis method as the synthesis process of Intermediate 2 using Intermediate 8 (40 g) and 1-bromodibenzo[b,d]thiophene (27.6 g). After the reaction was finished, the result was extracted and then column purified to obtain Intermediate 10 (54 g, yield 79%). MS[M+H]+=649

2) Synthesis of Compound 8

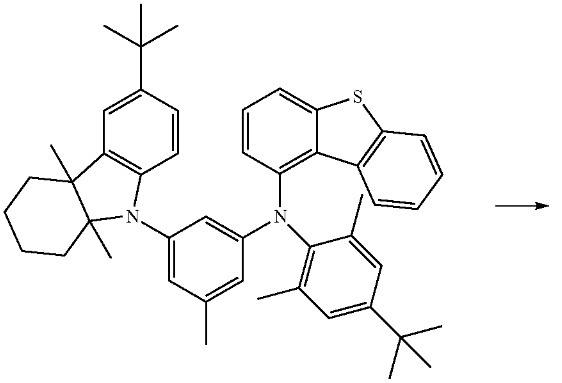

Intermediate 10

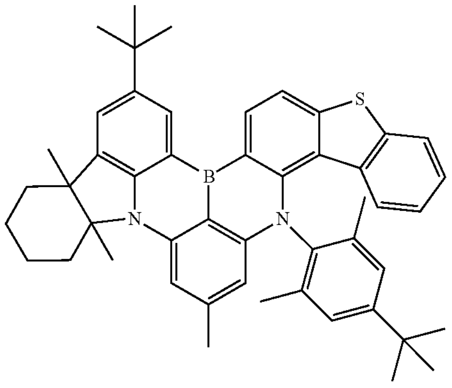

Compound 8

After introducing Intermediate 10 (25 g) and boron triiodide (25.6 g) to 1,2-dichlorobenzene (250 ml) under a nitrogen atmosphere, the mixture was stirred for 4 hours at 160° C. After the reaction was finished, the result was extracted and then recrystallized to obtain Compound 8 (7.7 g, yield 30%). MS[M+H]+=657

Synthesis Example 9. Synthesis of Compound 9

1) Synthesis of Intermediate 11

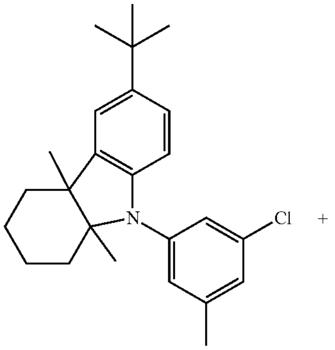

Intermediate 8

-continued

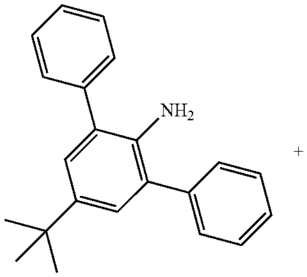

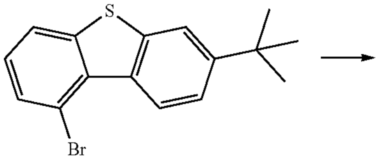

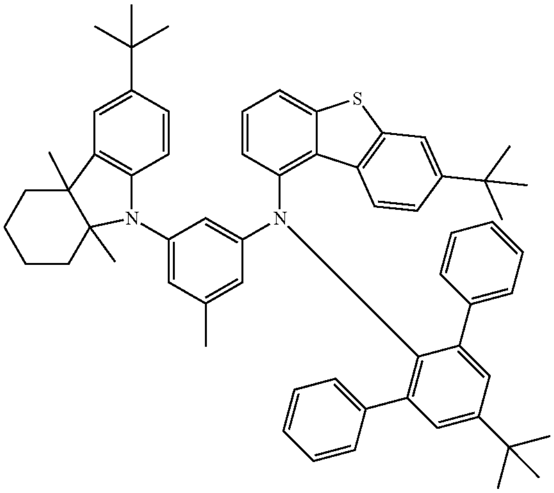

Intermediate 11

A reaction was conducted using the same equivalents and materials and the same synthesis method as the synthesis process of Intermediate 2 using Intermediate 8 (40 g), 5'-(tert-butyl)-[1,1':3',1"-terphenyl]-2'-amine (31.6 g) and 1-bromo-7-(tert-butyl)dibenzo[b,d]thiophene (33.4 g). After the reaction was finished, the result was extracted and then column purified to obtain Intermediate 11 (66 g, yield 71%). MS[M+H]+=886

2) Synthesis of Compound 9

After introducing Intermediate 11 (25 g) and boron triiodide (18.8 g) to 1,2-dichlorobenzene (250 ml) under a nitrogen atmosphere, the mixture was stirred for 4 hours at 160° C. After the reaction was finished, the result was extracted and then recrystallized to obtain Compound 9 (7.8 g, yield 31%). MS[M+H]+=894

Synthesis Example 10. Synthesis of Compound 10

1) Synthesis of Intermediate 12

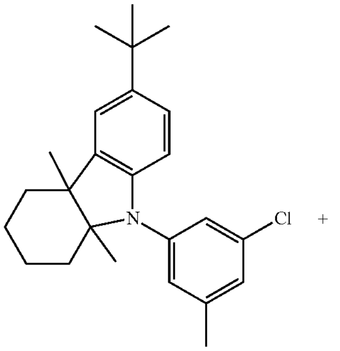

Intermediate 8

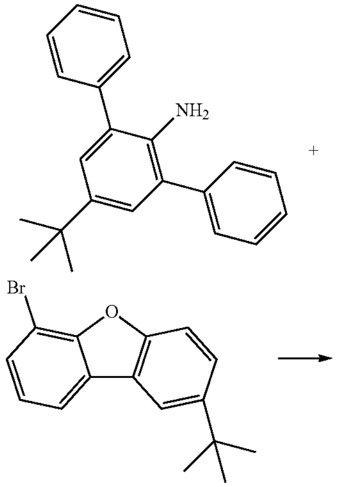

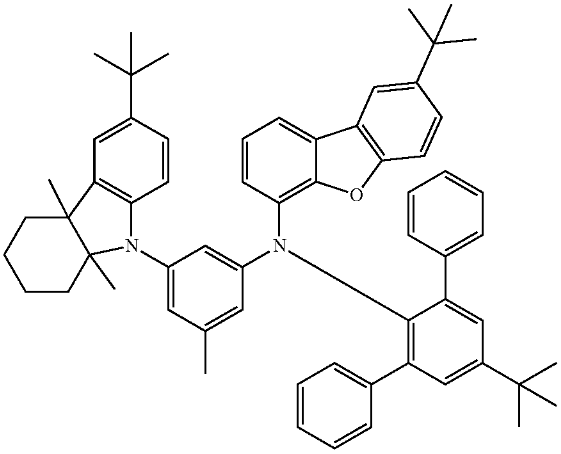

Intermediate 12

A reaction was conducted using the same equivalents and materials and the same synthesis method as the synthesis process of Intermediate 2 using Intermediate 8 (40 g), 5'-(tert-butyl)-[1,1':3',1"-terphenyl]-2'-amine (31.6 g) and 6-bromo-2-(tert-butyl)dibenzo[b,d]furan (31.8 g). After the reaction was finished, the result was extracted and then column purified to obtain Intermediate 12 (67 g, yield 74%). MS[M+H]+=870

2) Synthesis of Compound 10

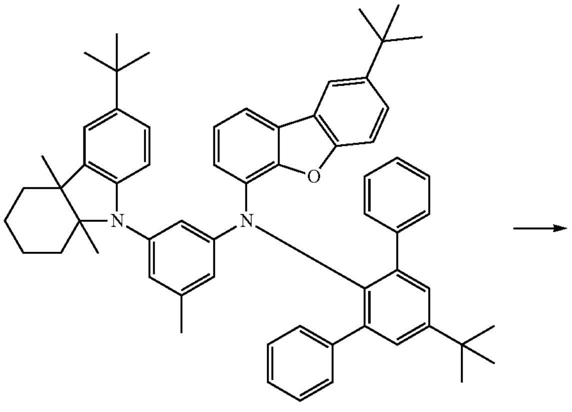

Intermediate 12

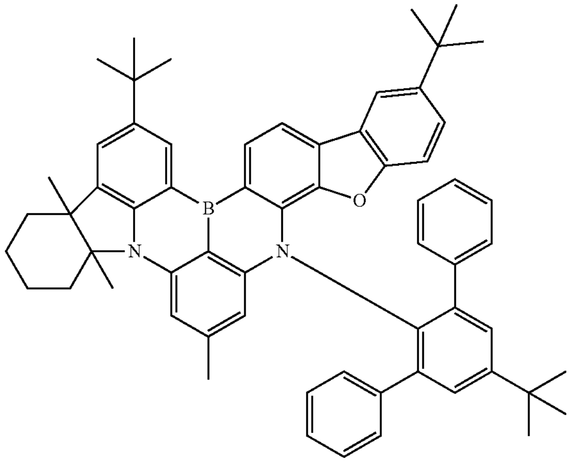

Compound 10

After introducing Intermediate 12 (25 g) and boron triiodide (19.2 g) to 1,2-dichlorobenzene (250 ml) under a nitrogen atmosphere, the mixture was stirred for 4 hours at 160° C. After the reaction was finished, the result was extracted and then recrystallized to obtain Compound 10 (8.0 g, yield 32%). MS[M+H]+=878

Synthesis Example 11. Synthesis of Compound 11

1) Synthesis of Intermediate 13

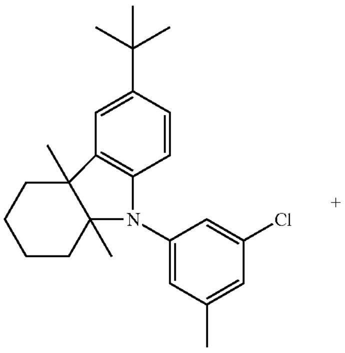

Intermediate 8

-continued

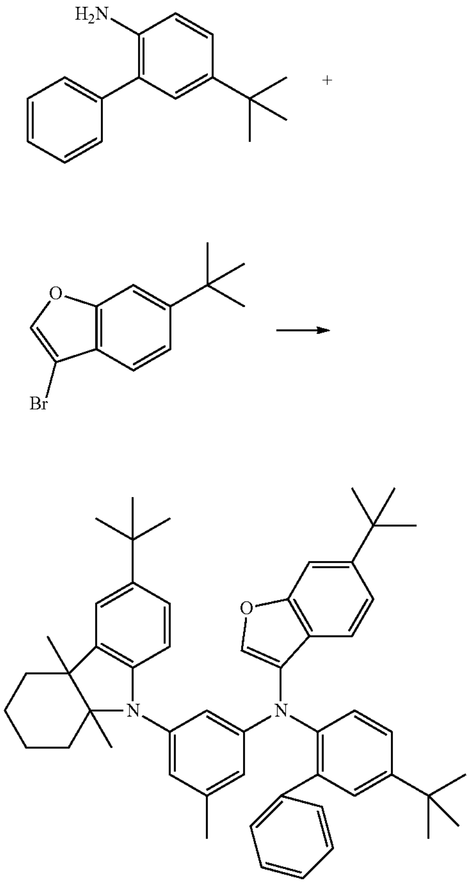

Intermediate 13

A reaction was conducted using the same equivalents and materials and the same synthesis method as the synthesis process of Intermediate 2 using Intermediate 8 (40 g), 5-(tert-butyl)-[1,1'-biphenyl]-2-amine (23.6 g) and 3-bromo-6-(tert-butyl)benzofuran (26.5 g). After the reaction was finished, the result was extracted and then column purified to obtain Intermediate 13 (54 g, yield 69%). MS[M+H]+=744

2) Synthesis of Compound 11

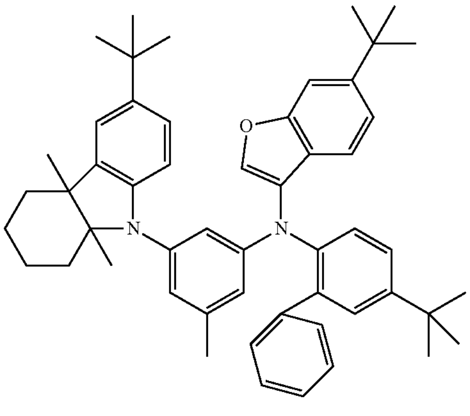

Intermediate 13

-continued

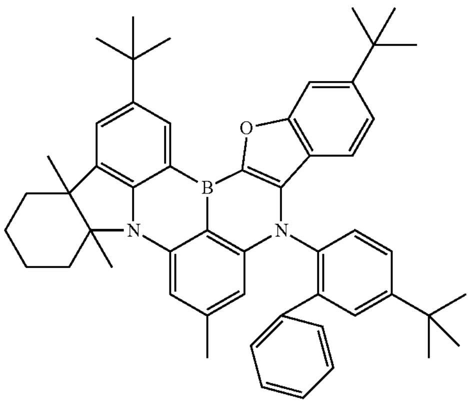

Compound 11

After introducing Intermediate 13 (25 g) and boron triiodide (22.4 g) to 1,2-dichlorobenzene (250 ml) under a nitrogen atmosphere, the mixture was stirred for 4 hours at 160° C. After the reaction was finished, the result was extracted and then recrystallized to obtain Compound 11 (7.9 g, yield 33%). MS[M+H]+=751

Synthesis Example 12. Synthesis of Compound 12

1) Synthesis of Intermediate 14

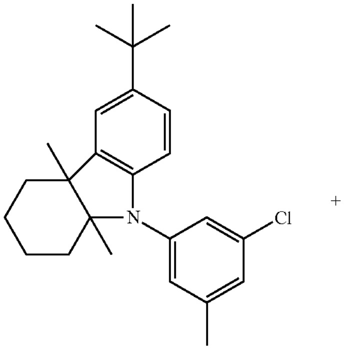

Intermediate 8

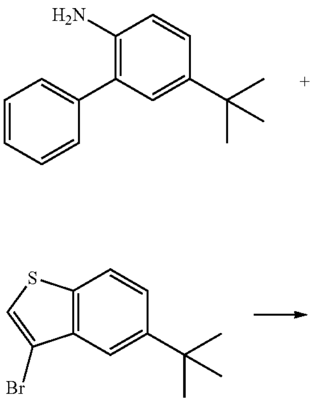

-continued

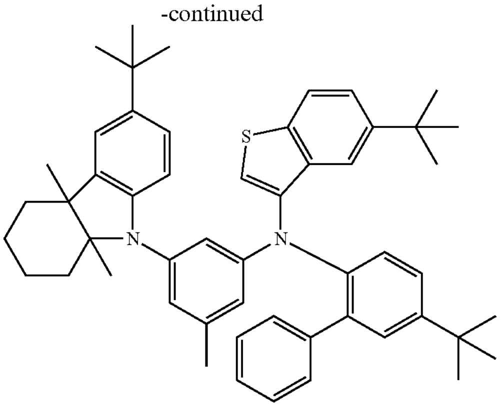

Intermediate 14

A reaction was conducted using the same equivalents and materials and the same synthesis method as the synthesis process of Intermediate 2 using Intermediate 8 (40 g), 5-(tert-butyl)-[1,1'-biphenyl]-2-amine (23.6 g) and 3-bromo-5-(tert-butyl)-benzo[b]thiophene (28.2 g). After the reaction was finished, the result was extracted and then column purified to obtain Intermediate 14 (61 g, yield 77%). MS[M+H]+=760

2) Synthesis of Compound 12

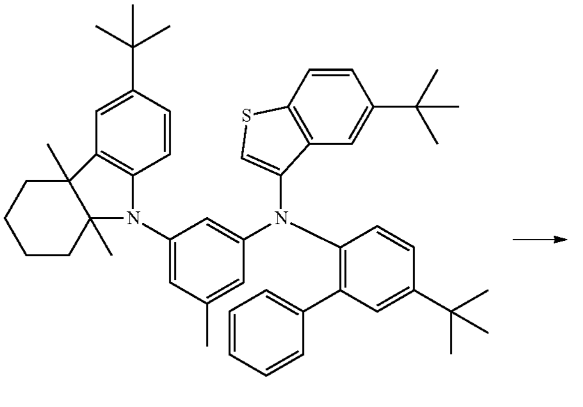

Intermediate 14

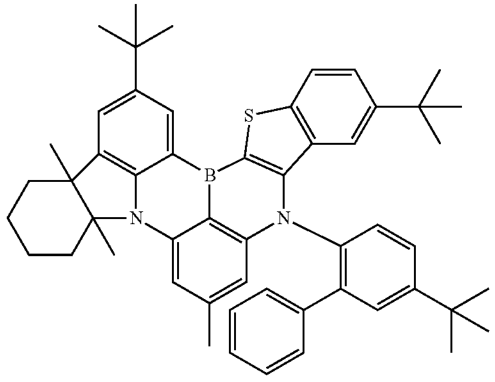

Compound 12

After introducing Intermediate 14 (25 g) and boron triiodide (22.0 g) to 1,2-dichlorobenzene (250 ml) under a nitrogen atmosphere, the mixture was stirred for 4 hours at 160° C. After the reaction was finished, the result was extracted and then recrystallized to obtain Compound 12 (7.5 g, yield 30%). MS[M+H]+=768

Synthesis Example 13. Synthesis of Compound 13

1) Synthesis of Intermediate 15

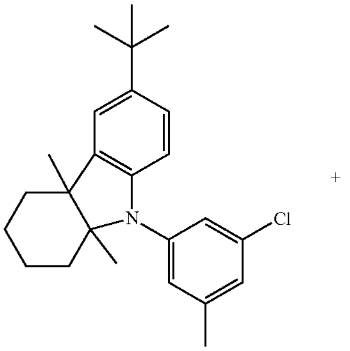

Intermediate 8

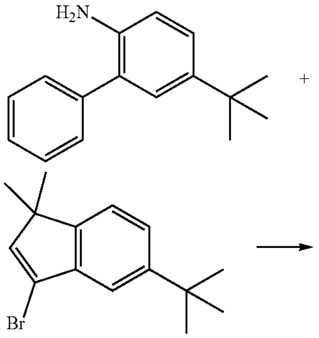

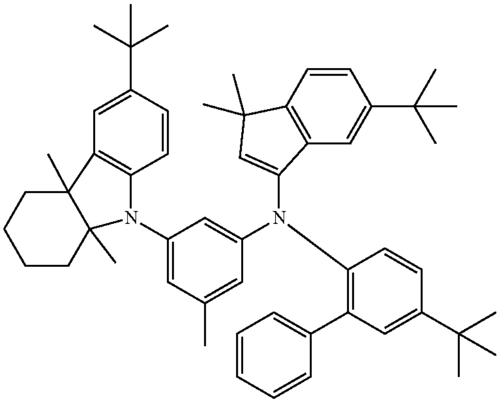

Intermediate 15

A reaction was conducted using the same equivalents and materials and the same synthesis method as the synthesis process of Intermediate 2 using Intermediate 8 (40 g), 5-(tert-butyl)-[1,1'-biphenyl]-2-amine (23.6 g) and 3-bromo-5-(tert-butyl)-1,1-dimethyl-1H-indene (29.2 g). After the reaction was finished, the result was extracted and then column purified to obtain Intermediate 15 (60 g, yield 74%). MS[M+H]+=770

2) Synthesis of Compound 13

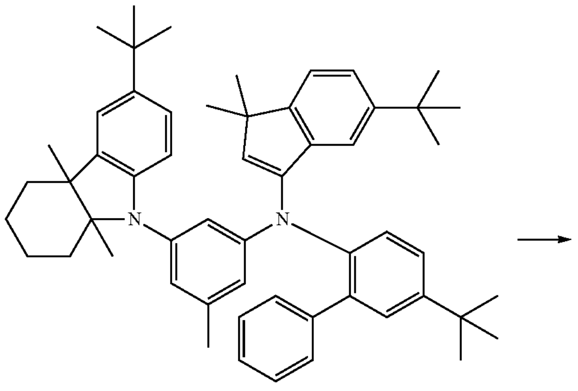

Intermediate 15

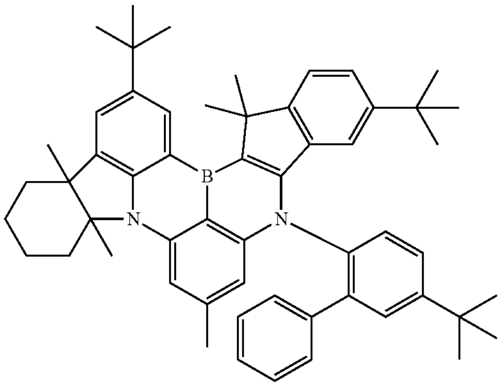

Compound 13

After introducing Intermediate 15 (25 g) and boron triiodide (21.6 g) to 1,2-dichlorobenzene (250 ml) under a nitrogen atmosphere, the mixture was stirred for 4 hours at 160° C. After the reaction was finished, the result was extracted and then recrystallized to obtain Compound 13 (7.4 g, yield 29%). MS[M+H]+=778

Synthesis Example 14. Synthesis of Compound 14

1) Synthesis of Intermediate 16

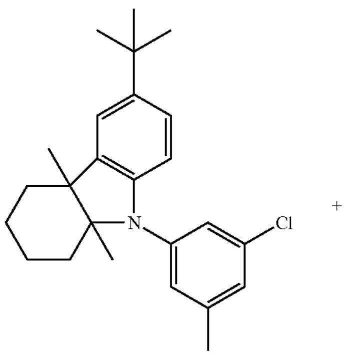

Intermediate 8

-continued

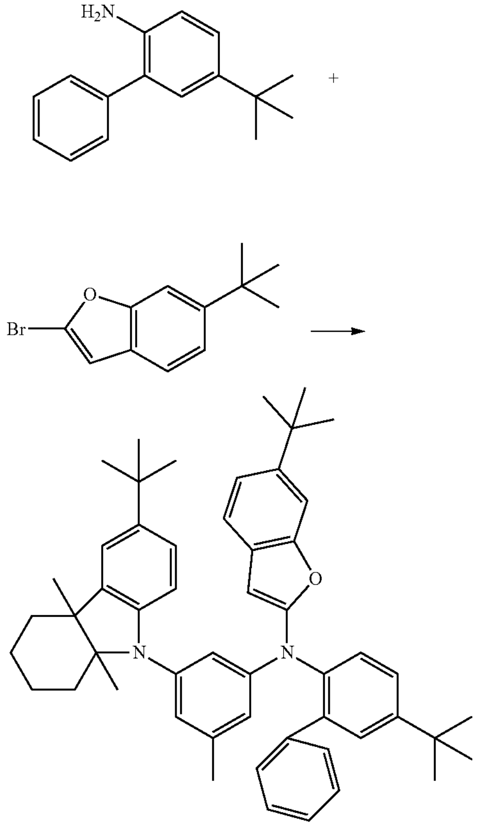

Intermediate 16

A reaction was conducted using the same equivalents and materials and the same synthesis method as the synthesis process of Intermediate 2 using Intermediate 8 (40 g), 5-(tert-butyl)-[1,1'-biphenyl]-2-amine (23.6 g) and 2-bromo-6-(tert-butyl)benzofuran (26.5 g). After the reaction was finished, the result was extracted and then column purified to obtain Intermediate 16 (61 g, yield 78%). MS[M+H]+=744

2) Synthesis of Compound 14

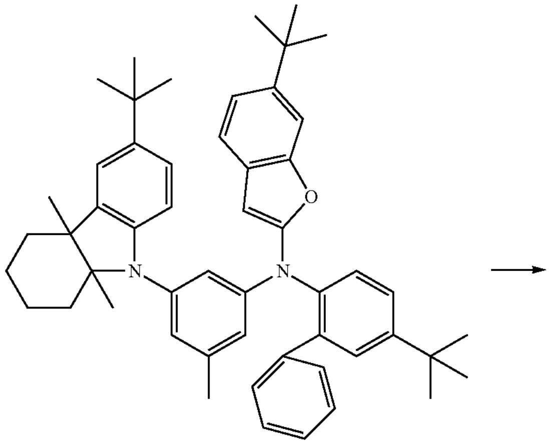

Intermediate 16

-continued

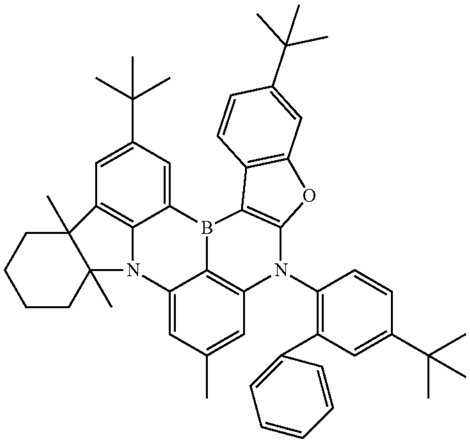

Compound 14

After introducing Intermediate 16 (25 g) and boron triiodide (22.4 g) to 1,2-dichlorobenzene (250 ml) under a nitrogen atmosphere, the mixture was stirred for 4 hours at 160° C. After the reaction was finished, the result was extracted and then recrystallized to obtain Compound 14 (7.6 g, yield 30%). MS[M+H]+=751

Synthesis Example 15. Synthesis of Compound 15

1) Synthesis of Intermediate 17

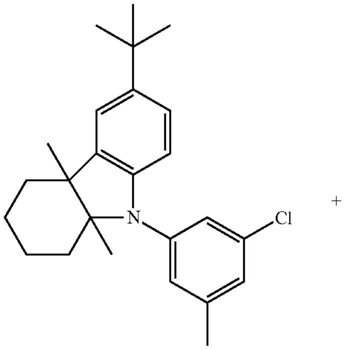

Intermediate 8

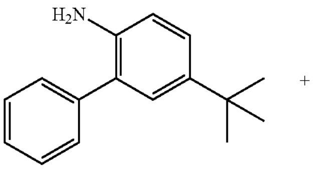

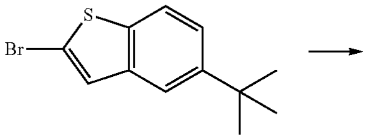

-continued

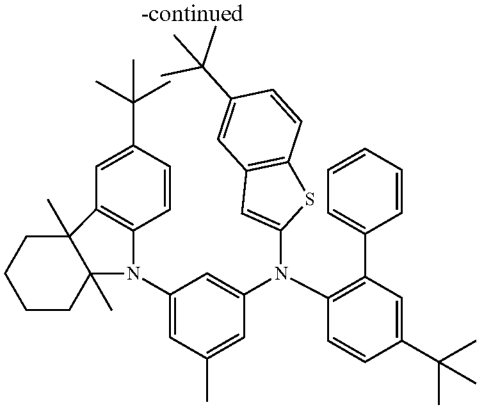

Intermediate 17

A reaction was conducted using the same equivalents and materials and the same synthesis method as the synthesis process of Intermediate 2 using Intermediate 8 (40 g), 5-(tert-butyl)-[1,1'-biphenyl]-2-amine (23.6 g) and 2-bromo-5-(tert-butyl)-benzo[b]thiophene (28.2 g). After the reaction was finished, the result was extracted and then column purified to obtain Intermediate 17 (59 g, yield 76%). MS[M+H]+=760

2) Synthesis of Compound 15

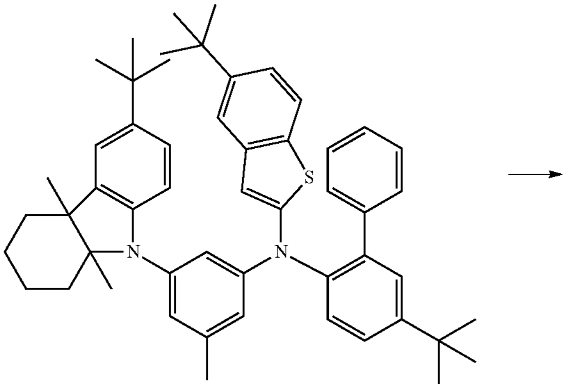

Intermediate 17

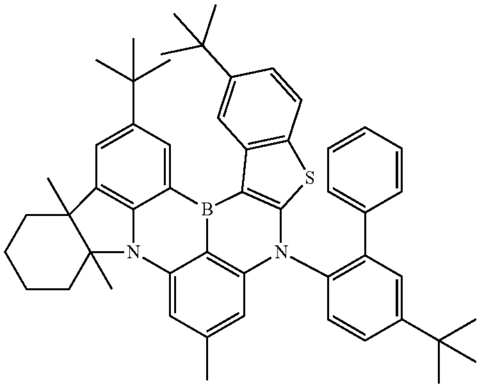

Compound 15

After introducing Intermediate 17 (25 g) and boron triiodide (22.0 g) to 1,2-dichlorobenzene (250 ml) under a nitrogen atmosphere, the mixture was stirred for 4 hours at 160° C. After the reaction was finished, the result was extracted and then recrystallized to obtain Compound 15 (7.2 g, yield 29%). MS[M+H]+=768

Synthesis Example 16. Synthesis of Compound 16

1) Synthesis of Intermediate 18

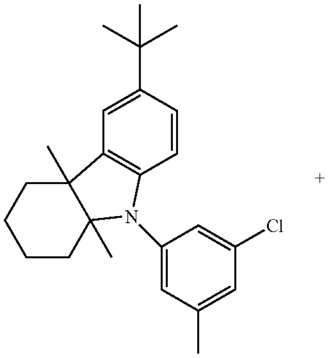

Intermediate 8

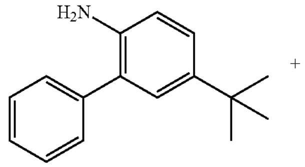

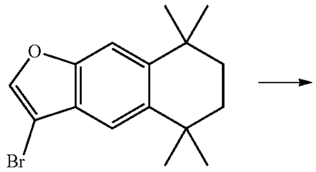

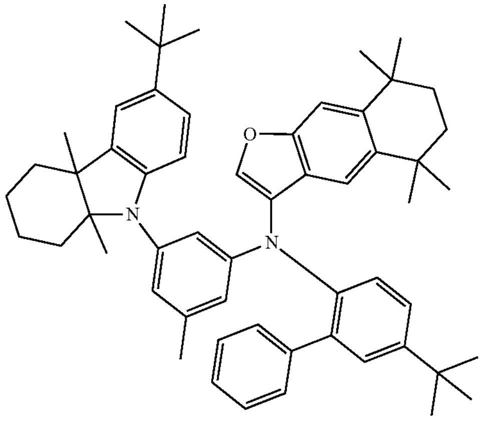

Intermediate 18

A reaction was conducted using the same equivalents and materials and the same synthesis method as the synthesis process of Intermediate 2 using Intermediate 8 (40 g), 5-(tert-butyl)-[1,1'-biphenyl]-2-amine (23.6 g) and 3-bromo-5,5,8,8-tetramethyl-5,6,7,8-tetrahydronaphtho[2,3-b]furan (32.1 g). After the reaction was finished, the result was extracted and then column purified to obtain Intermediate 18 (63 g, yield 75%). MS[M+H]+=798

2) Synthesis of Compound 16

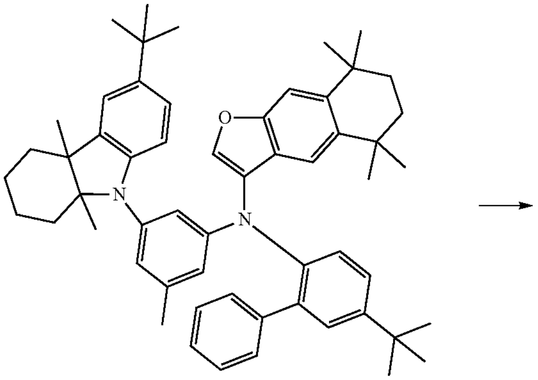

Intermediate 18

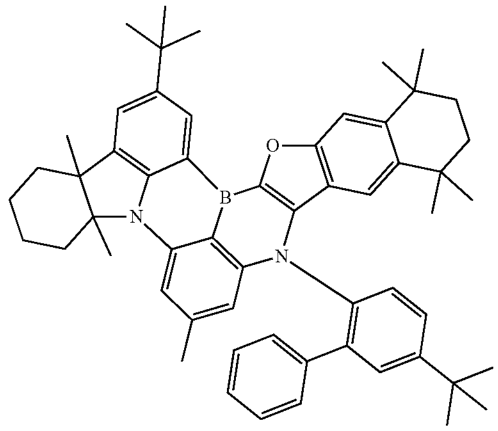

Compound 16

After introducing Intermediate 18 (25 g) and boron triiodide (20.8 g) to 1,2-dichlorobenzene (250 ml) under a nitrogen atmosphere, the mixture was stirred for 4 hours at 160° C. After the reaction was finished, the result was extracted and then recrystallized to obtain Compound 16 (7.7 g, yield 31%). MS[M+H]+=806

Synthesis Example 17. Synthesis of Compound 17

1) Synthesis of Intermediate 19

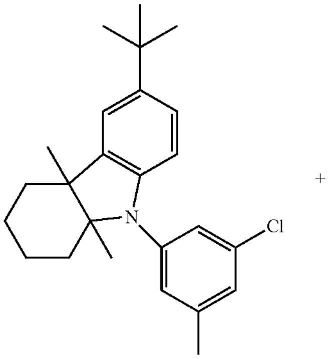

Intermediate 8

-continued

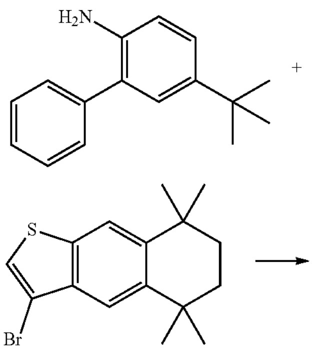

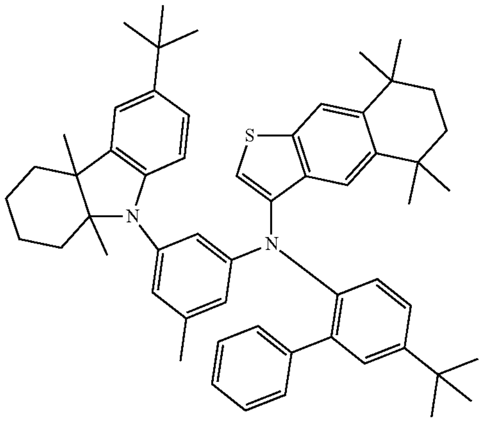

Intermediate 19

A reaction was conducted using the same equivalents and materials and the same synthesis method as the synthesis process of Intermediate 2 using Intermediate 8 (40 g), 5-(tert-butyl)-[1,1'-biphenyl]-2-amine (23.6 g) and 3-bromo-5,5,8,8-tetramethyl-5,6,7,8-tetrahydronaphtho[2,3-b]thiophene (33.9 g). After the reaction was finished, the result was extracted and then column purified to obtain Intermediate 19 (62 g, yield 73%). MS[M+H]+=814

2) Synthesis of Compound 17

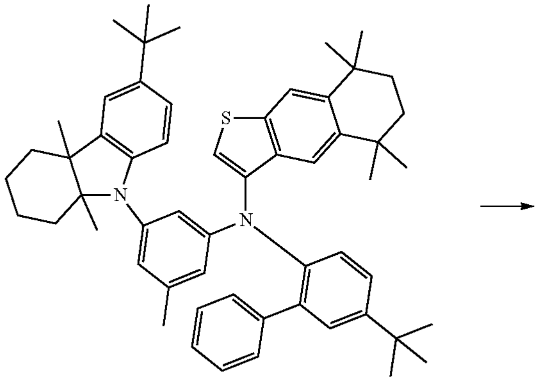

Intermediate 19

-continued

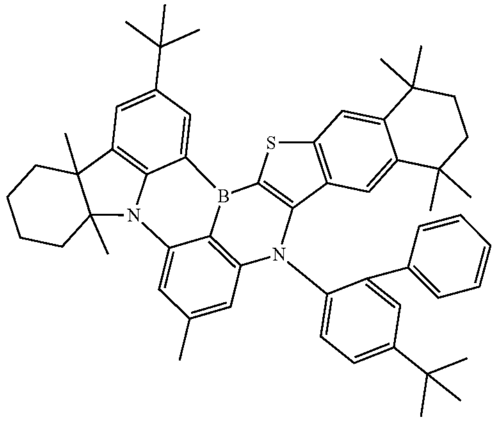

Compound 17

After introducing Intermediate 19 (25 g) and boron triiodide (20.5 g) to 1,2-dichlorobenzene (250 ml) under a nitrogen atmosphere, the mixture was stirred for 4 hours at 160° C. After the reaction was finished, the result was extracted and then recrystallized to obtain Compound 17 (7.5 g, yield 30%). MS[M+H]+=822

Synthesis Example 18. Synthesis of Compound 18

1) Synthesis of Intermediate 20

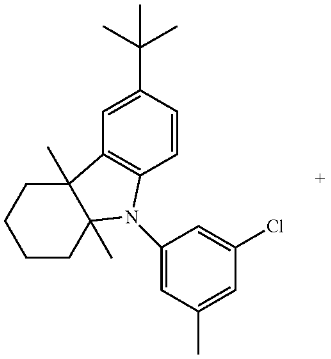

Intermediate 8

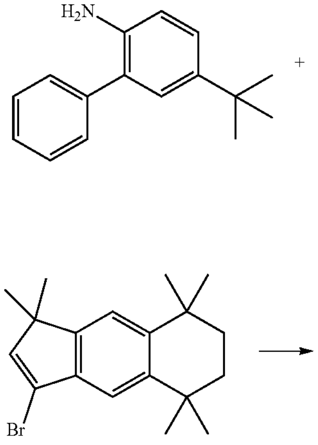

-continued

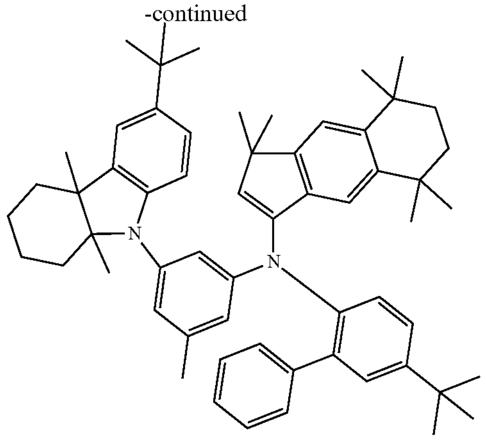

Intermediate 20

A reaction was conducted using the same equivalents and materials and the same synthesis method as the synthesis process of Intermediate 2 using Intermediate 8 (40 g), 5-(tert-butyl)-[1,1'-biphenyl]-2-amine (23.6 g) and 3-bromo-1,1,5,5,8,8-hexamethyl-5,6,7,8-tetrahydro-1H-cyclopenta[b]naphthalene (34.9 g). After the reaction was finished, the result was extracted and then column purified to obtain Intermediate 20 (61 g, yield 71%). MS[M+H]+=824

2) Synthesis of Compound 18

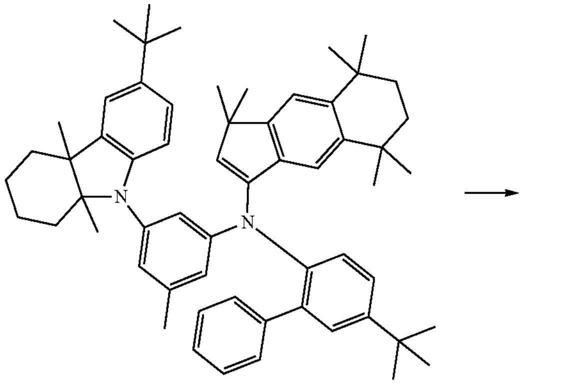

Intermediate 20

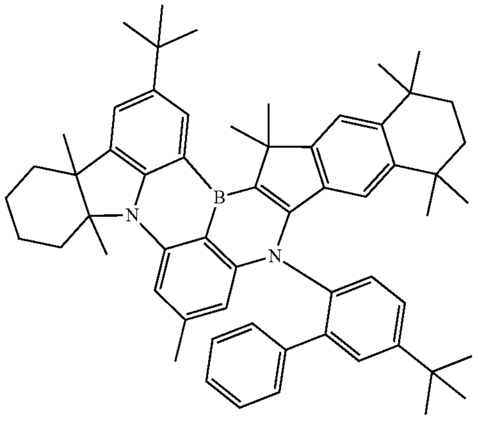

Compound 18

After introducing Intermediate 20 (25 g) and boron triiodide (20.2 g) to 1,2-dichlorobenzene (250 ml) under a nitrogen atmosphere, the mixture was stirred for 4 hours at 160° C. After the reaction was finished, the result was extracted and then recrystallized to obtain Compound 18 (7.7 g, yield 31%). MS[M+H]+=832

Synthesis Example 19. Synthesis of Compound 19

1) Synthesis of Intermediate 21

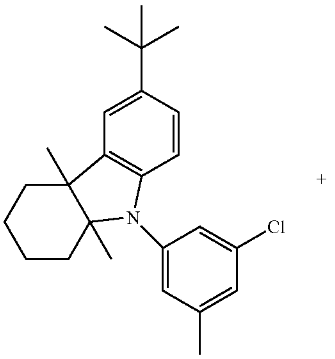

Intermediate 8

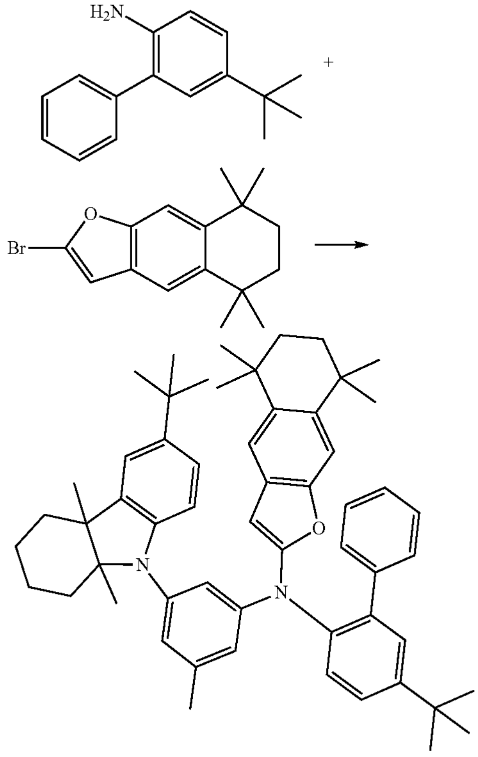

Intermediate 21

A reaction was conducted using the same equivalents and materials and the same synthesis method as the synthesis process of Intermediate 2 using Intermediate 8 (40 g), 5-(tert-butyl)-[1,1'-biphenyl]-2-amine (23.6 g) and 2-bromo-5,5,8,8-tetramethyl-5,6,7,8-tetrahydronaphtho[2,3-b]furan (32.1 g). After the reaction was finished, the result was extracted and then column purified to obtain Intermediate 21 (61 g, yield 74%). MS[M+H]+=798

2) Synthesis of Compound 19

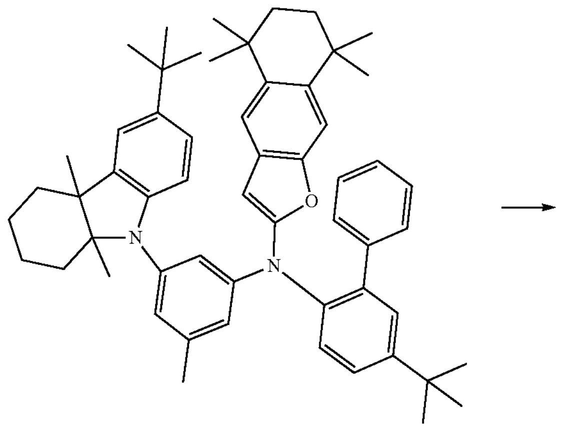

Intermediate 21

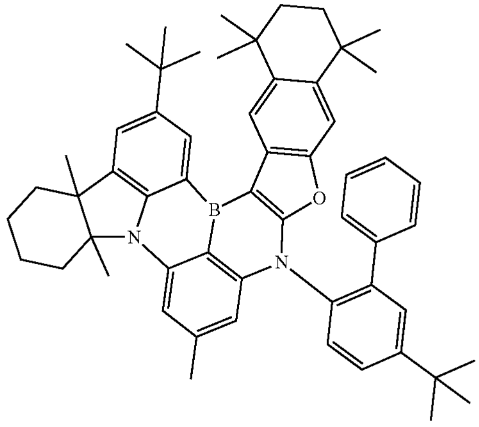

Compound 19

After introducing Intermediate 21 (25 g) and boron triiodide (20.8 g) to 1,2-dichlorobenzene (250 ml) under a nitrogen atmosphere, the mixture was stirred for 4 hours at 160° C. After the reaction was finished, the result was extracted and then recrystallized to obtain Compound 19 (7.5 g, yield 30%). MS[M+H]+=806

Synthesis Example 20. Synthesis of Compound 20

1) Synthesis of Intermediate 22

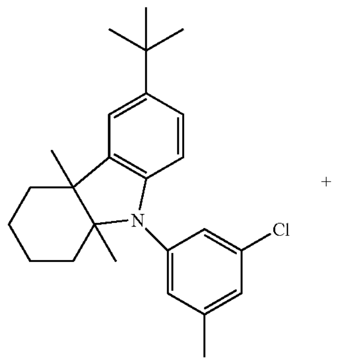

Intermediate 8

-continued

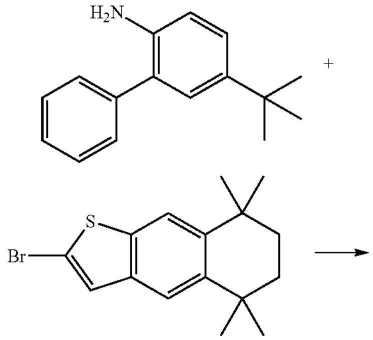

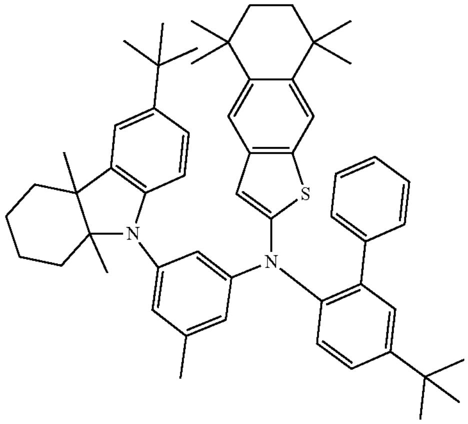

Intermediate 22

A reaction was conducted using the same equivalents and materials and the same synthesis method as the synthesis process of Intermediate 2 using Intermediate 8 (40 g), 5-(tert-butyl)-[1,1'-biphenyl]-2-amine (23.6 g) and 2-bromo-5,5,8,8-tetramethyl-5,6,7,8-tetrahydronaphtho[2,3-b]thiophene (33.9 g). After the reaction was finished, the result was extracted and then column purified to obtain Intermediate 22 (60 g, yield 72%). MS[M+H]+=814

2) Synthesis of Compound 20

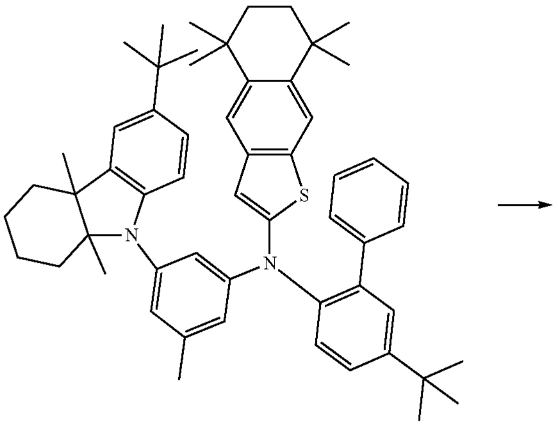

Intermediate 22

-continued

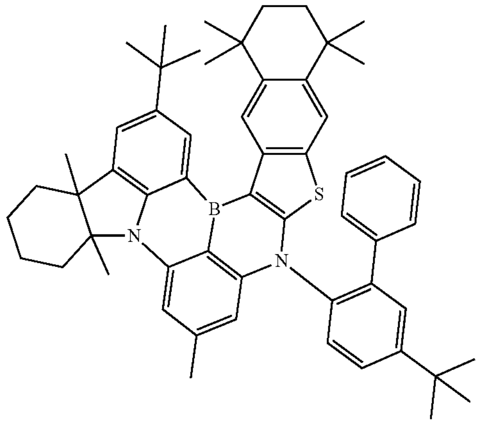

Compound 20

After introducing Intermediate 22 (25 g) and boron triiodide (20.5 g) to 1,2-dichlorobenzene (250 ml) under a nitrogen atmosphere, the mixture was stirred for 4 hours at 160° C. After the reaction was finished, the result was extracted and then recrystallized to obtain Compound 20 (7.1 g, yield 28%). MS[M+H]+=822

Synthesis Example 21. Synthesis of Compound 21

1) Synthesis of Intermediate 23

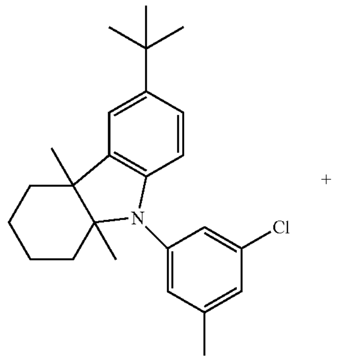

Intermediate 8

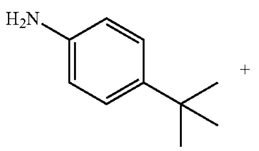

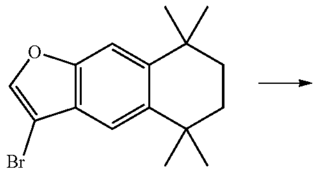

-continued

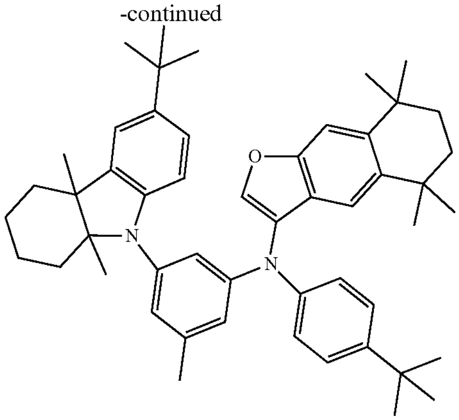

Intermediate 23

A reaction was conducted using the same equivalents and materials and the same synthesis method as the synthesis process of Intermediate 2 using Intermediate 8 (40 g), 4-(tert-butyl)-aniline (15.6 g) and 3-bromo-5,5,8,8-tetramethyl-5,6,7,8-tetrahydronaphtho[2,3-b]furan (32.2 g). After the reaction was finished, the result was extracted and then column purified to obtain Intermediate 23 (54 g, yield 72%). MS[M+H]+=722

2) Synthesis of Compound 21

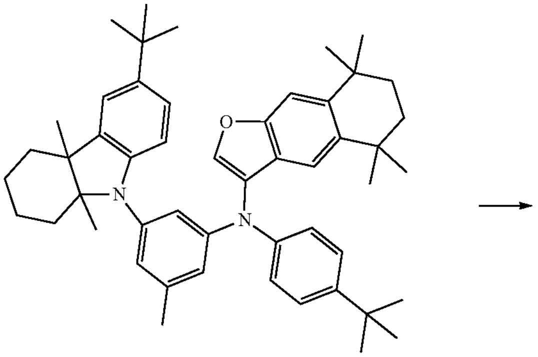

Intermediate 23

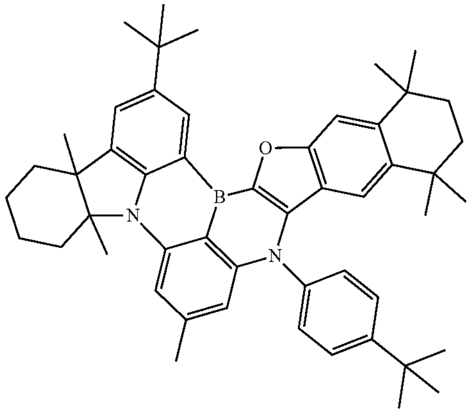

Compound 21

After introducing Intermediate 23 (25 g) and boron triiodide (23.1 g) to 1,2-dichlorobenzene (250 ml) under a nitrogen atmosphere, the mixture was stirred for 4 hours at 160° C. After the reaction was finished, the result was extracted and then recrystallized to obtain Compound 21 (7.3 g, yield 29%). MS[M+H]+=730

Synthesis Example 22. Synthesis of Compound 22

1) Synthesis of Intermediate 24

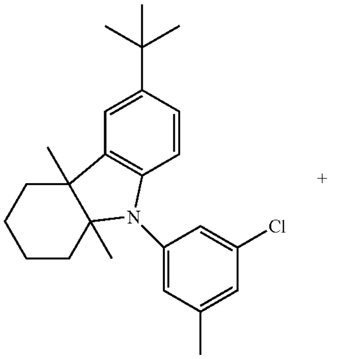

Intermediate 8

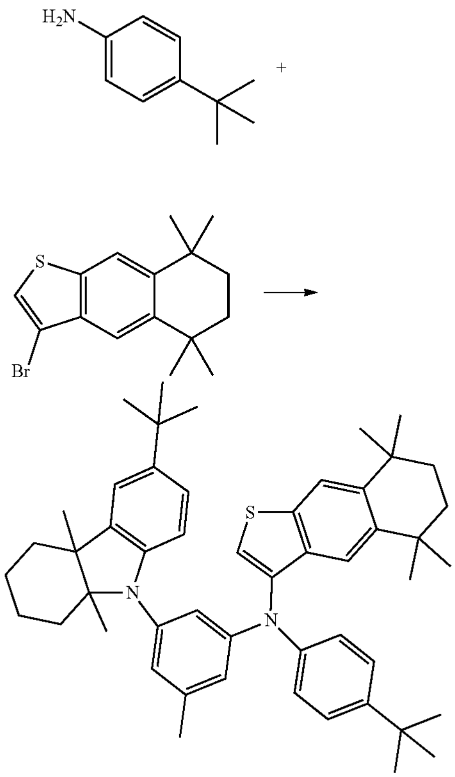

Intermediate 24

A reaction was conducted using the same equivalents and materials and the same synthesis method as the synthesis process of Intermediate 2 using Intermediate 8 (40 g), 4-(tert-butyl)aniline (15.6 g) and 3-bromo-5,5,8,8-tetramethyl-5,6,7,8-tetrahydronaphtho[2,3-b]thiophene (33.9 g). After the reaction was finished, the result was extracted and then column purified to obtain Intermediate 24 (55 g, yield 71%). MS[M+H]+=738

2) Synthesis of Compound 22

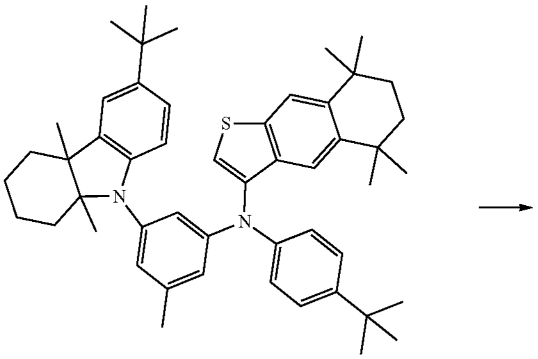

Intermediate 24

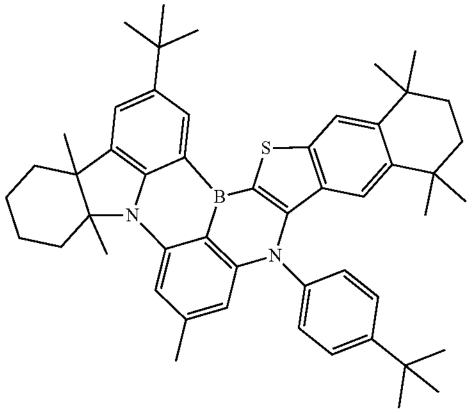

Compound 22

After introducing Intermediate 24 (25 g) and boron triiodide (22.5 g) to 1,2-dichlorobenzene (250 ml) under a nitrogen atmosphere, the mixture was stirred for 4 hours at 160° C. After the reaction was finished, the result was extracted and then recrystallized to obtain Compound 22 (7.4 g, yield 29%). MS[M+H]+=746

Synthesis Example 23. Synthesis of Compound 23

1) Synthesis of Intermediate 25

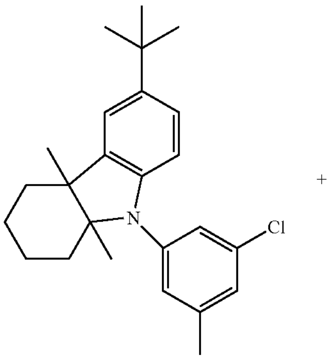

Intermediate 8

-continued

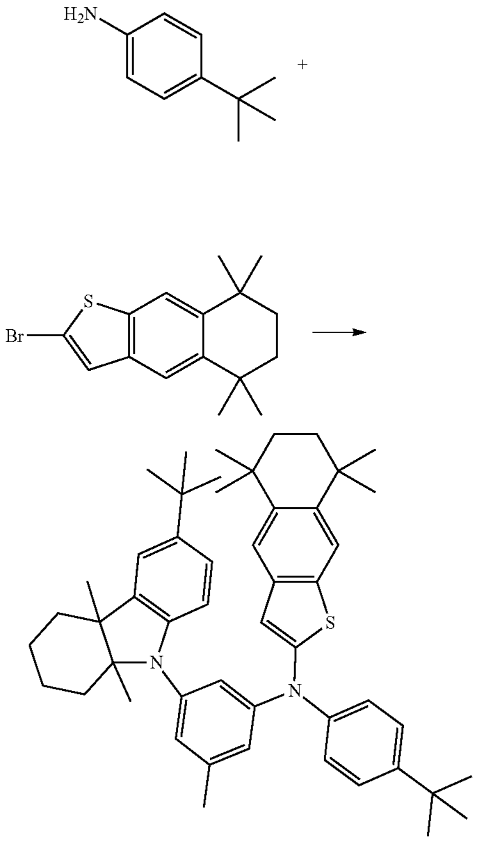

Intermediate 25

A reaction was conducted using the same equivalents and materials and the same synthesis method as the synthesis process of Intermediate 2 using Intermediate 8 (40 g), 4-(tert-butyl)-aniline (15.6 g) and 2-bromo-5,5,8,8-tetramethyl-5,6,7,8-tetrahydronaphtho[2,3-b]thiophene (33.9 g). After the reaction was finished, the result was extracted and then column purified to obtain Intermediate 25 (56 g, yield 71%). MS[M+H]+=738

2) Synthesis of Compound 23

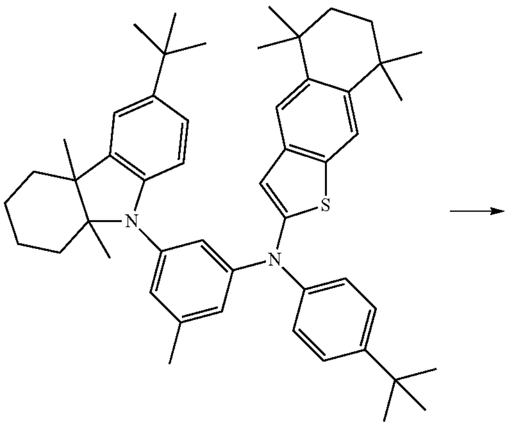

Intermediate 25

-continued

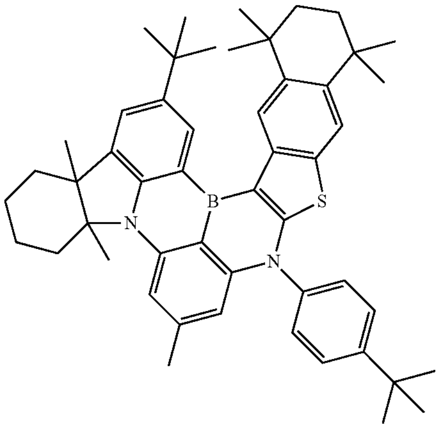

Compound 23

After introducing Intermediate 25 (25 g) and boron triiodide (20.5 g) to 1,2-dichlorobenzene (250 ml) under a nitrogen atmosphere, the mixture was stirred for 4 hours at 160° C. After the reaction was finished, the result was extracted and then recrystallized to obtain Compound 23 (7.2 g, yield 28%). MS[M+H]+=746

Synthesis Example 24. Synthesis of Compound 24

1) Synthesis of Intermediate 26

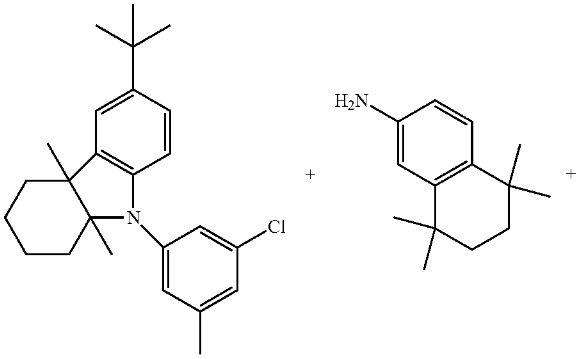

Intermediate 8

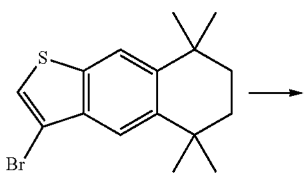

-continued

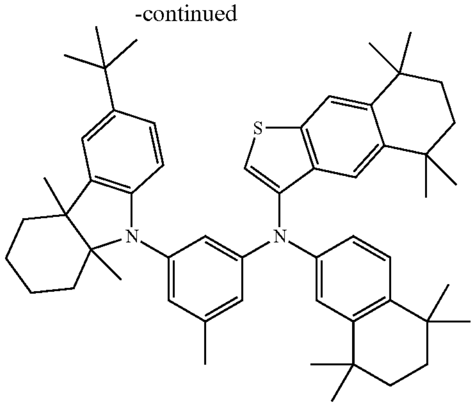

Intermediate 26

A reaction was conducted using the same equivalents and materials and the same synthesis method as the synthesis process of Intermediate 2 using Intermediate 8 (40 g), 5,5,8,8-tetramethyl-5,6,7,8-tetrahydronaphthalen-2-amine (21.3 g) and 3-bromo-5,5,8,8-tetramethyl-5,6,7,8-tetrahydronaphtho[2,3-b]thiophene (33.9 g). After the reaction was finished, the result was extracted and then column purified to obtain Intermediate 26 (56 g, yield 68%). MS[M+H]+=792

2) Synthesis of Compound 24

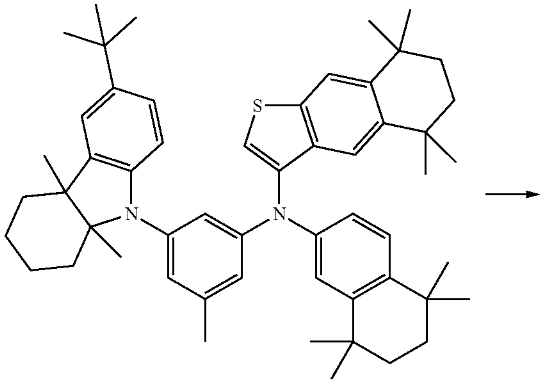

Intermediate 26

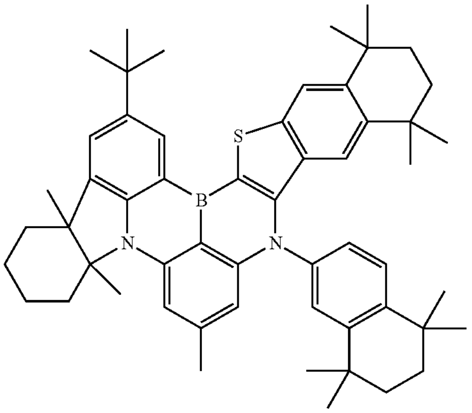

Compound 24

After introducing Intermediate 26 (25 g) and boron triiodide (22.5 g) to 1,2-dichlorobenzene (250 ml) under a nitrogen atmosphere, the mixture was stirred for 4 hours at 160° C. After the reaction was finished, the result was extracted and then recrystallized to obtain Compound 24 (7.6 g, yield 30%). MS[M+H]+=780

Synthesis Example 25. Synthesis of Compound 25

1) Synthesis of Intermediate 27

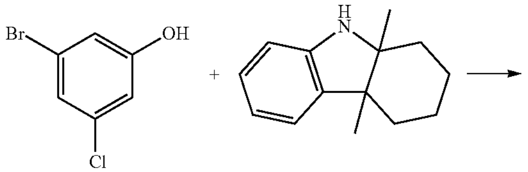

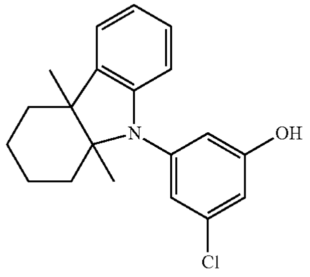

Intermediate 27

After introducing 3-bromo-5-chlorophenol (40 g), 6-(tert-butyl)-4a,9a-dimethyl-2,3,4,4a,9,9a-hexahydro-1H-carbazole (49.6 g), sodium-tert-butoxide (55.6 g) and bis(tri-tert-butylphosphine)palladium(0) (1 g) to toluene (600 ml), the mixture was refluxed for 1 hour, and then column purified to obtain Intermediate 27 (55 g, yield 74%). MS[M+H]+=385

2) Synthesis of Intermediate 28

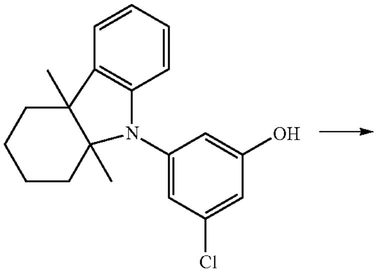

Intermediate 27

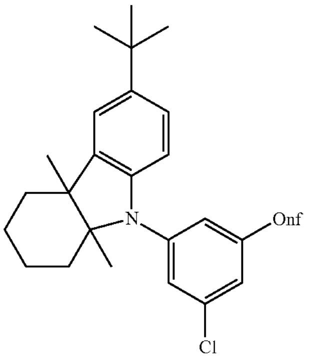

Intermediate 28

After introducing Intermediate 27 (40 g), 1,1,2,2,3,3,4,4,4-nonafluorobutane-1-sulfonyl fluoride (28 ml) and potassium carbonate (43.2 g) to tetrahydrofuran (400 ml) and water (200 ml), the mixture was reacted for 3 hours. After the reaction was finished, the result was extracted, and then the solution was removed to obtain Intermediate 28 (64 g, yield 92%). MS[M+H]+=667

3) Synthesis of Intermediate 29

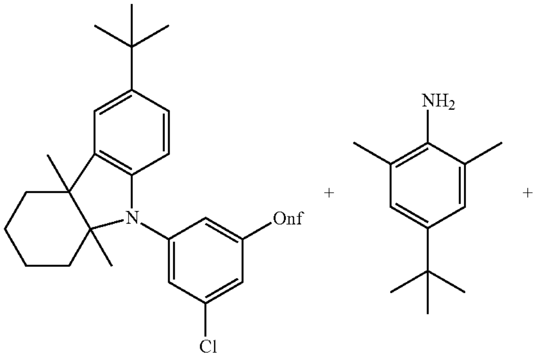

Intermediate 28

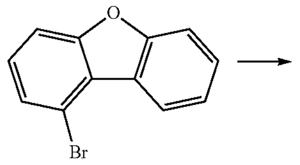

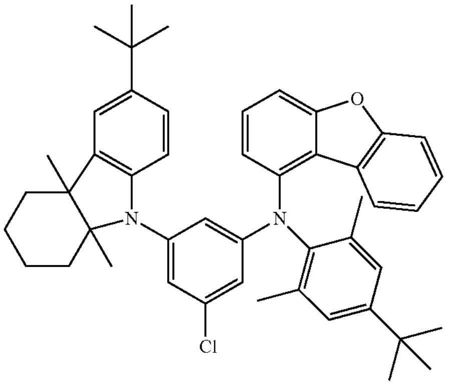

Intermediate 29

After introducing Intermediate 28 (40 g), 4-(tert-butyl)-2,6-dimethylaniline (10.6 g), pd(dba)$_2$ (1.03 g), Xphos (1.72 g) and cesium carbonate (58.7 g) to xylene (500 ml) under a nitrogen atmosphere, the mixture was stirred for 24 hours under reflux. After checking the progress of the reaction, 1-bromodibenzo[b,d]furan (25.9 g) was introduced thereto, and the result was stirred for 6 hours under reflux. After that, the result was extracted and then column purified to obtain Intermediate 29 (56 g, yield 75%). MS[M+H]+=710

4) Synthesis of Intermediate 30

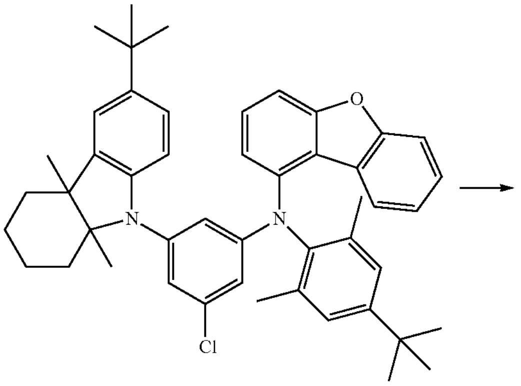

Intermediate 29

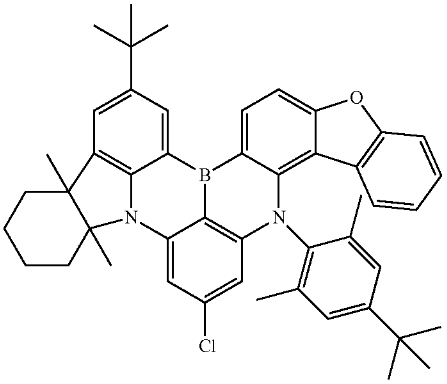

Intermediate 30

After introducing Intermediate 29 (25 g) and boron triiodide (23.5 g) to 1,2-dichlorobenzene (250 ml), the mixture was stirred for 4 hours at 160° C. After the reaction was finished, the result was extracted and then recrystallized to obtain Intermediate 30 (7.7 g, yield 30%). MS[M+H]+=718

5) Synthesis of Compound 25

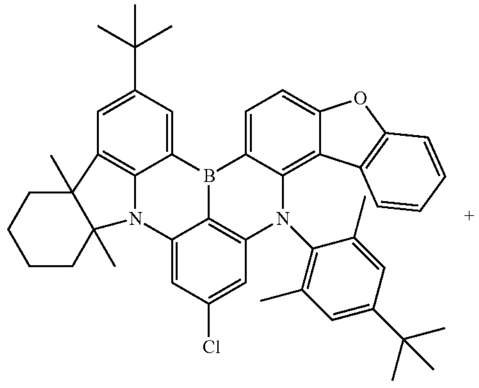

Intermediate 30

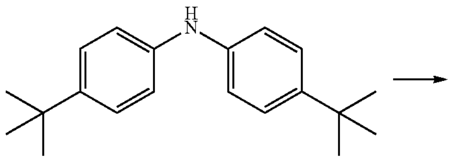

-continued

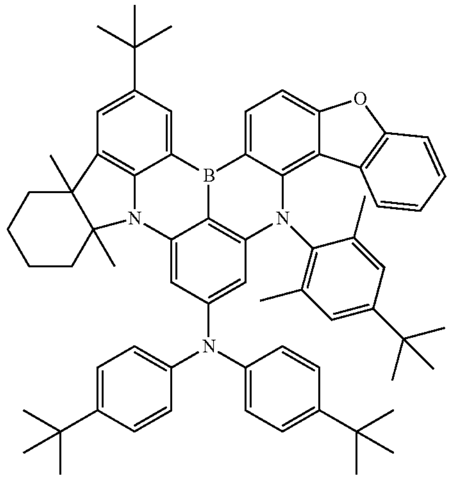

Compound 25

After introducing Intermediate 30 (7 g), bis(4-(tert-butyl) phenyl)amine (3.85 g), sodium-tert-butoxide (1.9 g) and bis(tri-tert-butylphosphine)palladium(0) (0.05 g) to xylene (80 ml), the mixture was stirred for 5 hours under reflux. After the reaction was finished, the result was extracted and then recrystallized to obtain Compound 25 (7.2 g, yield 76%). MS[M+H]+=963

Synthesis Example 26. Synthesis of Compound 26

1) Synthesis of Compound 26

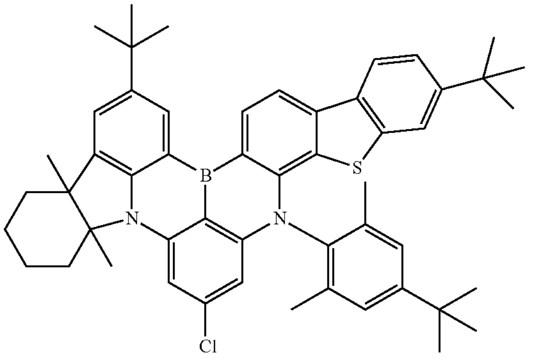

Intermediate 31

+

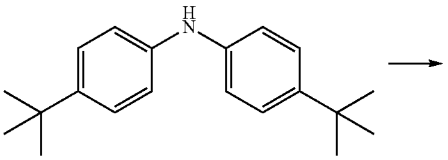

-continued

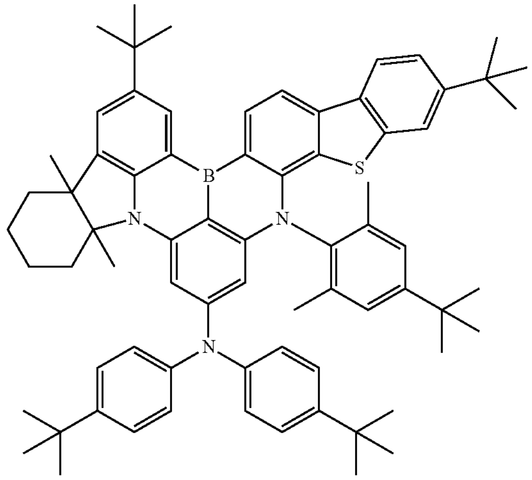

Compound 26

Intermediate 31 (7 g) obtained with the same materials and equivalents and the same synthesis methods using 6-bromo-3-(tert-butyl)dibenzo[b,d]thiophene instead of 1-bromodibenzo-[b,d]furan in the synthesis processes of Intermediates 27 to 30, bis(4-(tert-butyl)phenyl)amine (3.5 g), sodium-tert-butoxide (1.7 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 26 (7.1 g, yield 77%). MS[M+H]+=1035

Synthesis Example 27. Synthesis of Compound 27

1) Synthesis of Compound 27

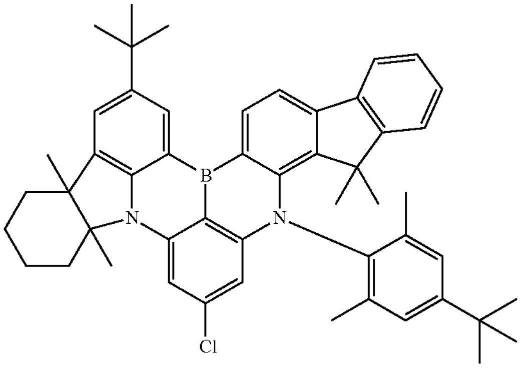

Intermediate 32

+

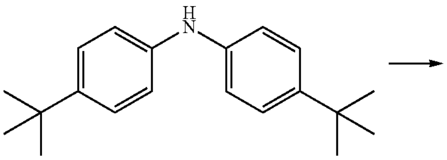

-continued

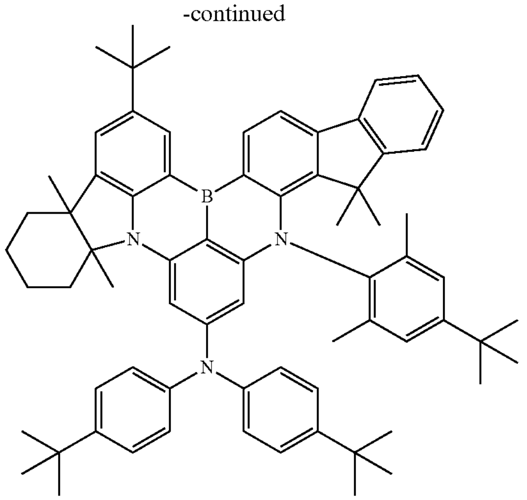

Compound 27

-continued

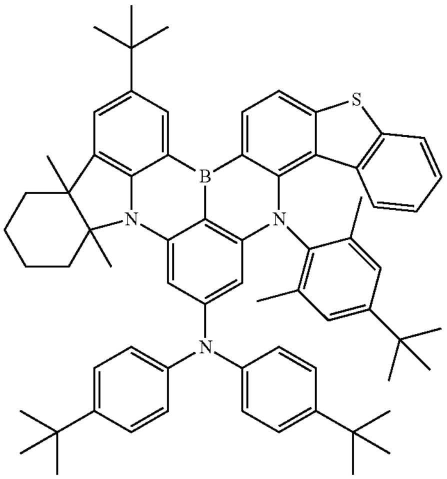

Compound 28

Intermediate 32 (7 g) obtained with the same materials and equivalents and the same synthesis methods using 1-bromo-9,9-dimethyl-9H-fluorene instead of 1-bromodibenzo[b,d]furan in the synthesis processes of Intermediates 27 to 30, bis(4-(tert-butyl)phenyl)amine (3.7 g), sodium-tert-butoxide (1.8 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 27 (7.4 g, yield 80%). MS[M+H]+=989

Synthesis Example 28. Synthesis of Compound 28

1) Synthesis of Compound 28

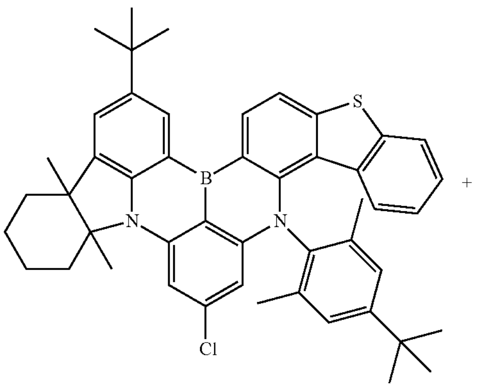

Intermediate 33

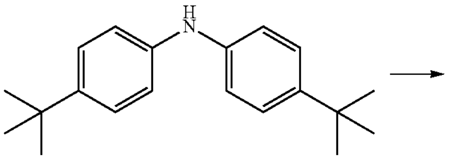

Intermediate 33 (7 g) obtained with the same materials and equivalents and the same synthesis methods using 1-bromodibenzo[b,d]thiophene instead of 1-bromodibenzo[b,d]furan in the synthesis processes of Intermediates 27 to 30, bis(4-(tert-butyl)phenyl)amine (3.7 g), sodium-tert-butoxide (1.8 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 28 (7.3 g, yield 78%). MS[M+H]+=979

Synthesis Example 29. Synthesis of Compound 29

1) Synthesis of Compound 29

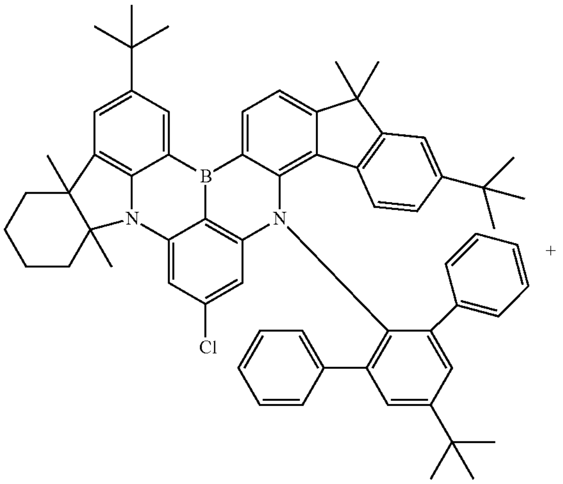

Intermediate 34

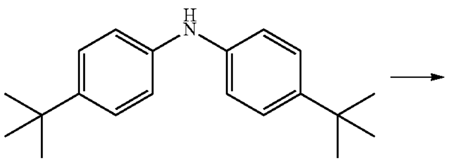

-continued

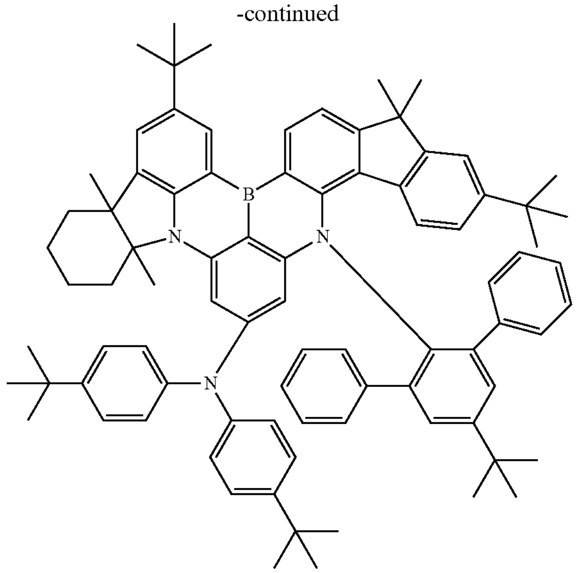

Compound 29

Intermediate 34 (7 g) obtained with the same materials and equivalents and the same synthesis methods using 5'-(tert-butyl)-[1,1':3',1"-terphenyl]-2'-amine instead of 4-(tert-butyl)-2,6-dimethylaniline and using 4-bromo-9,9-dimethyl-9H-fluorene instead of 1-bromodibenzo[b,d]furan in the synthesis processes of Intermediates 27 to 30, bis(4-(tert-butyl)phenyl)amine (3.0 g), sodium-tert-butoxide (1.5 g) and bis(tri-tert-butylphosphine)palladium(0) (0.04 g) were introduced to xylene (80 ml), and the mixture was stirred for 5 hours under reflux. After the reaction was finished, the result was extracted and then recrystallized to obtain Compound 29 (6.7 g, yield 76%). MS[M+H]+=1169

Synthesis Example 30. Synthesis of Compound 30

1) Synthesis of Compound 30

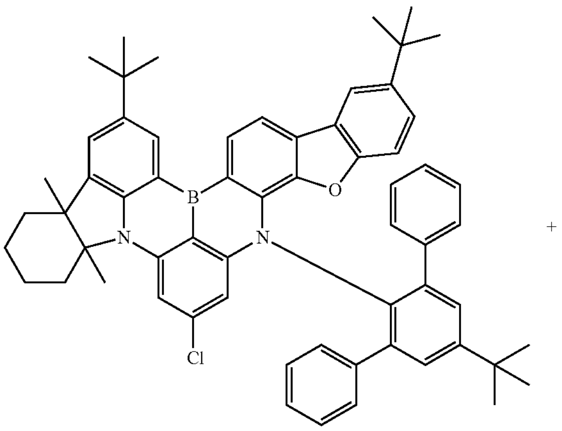

Intermediate 35

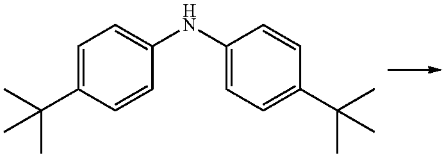

-continued

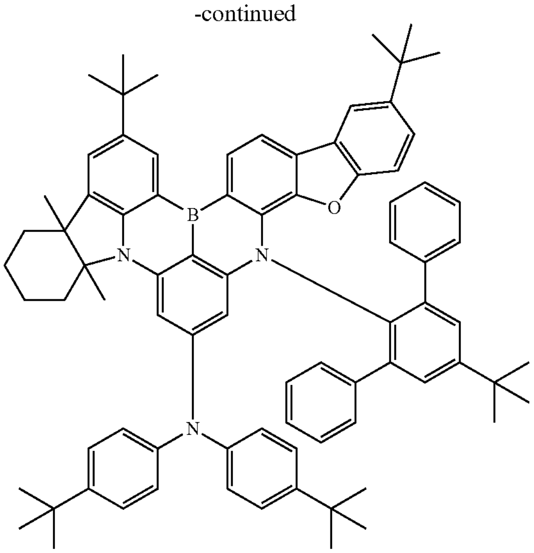

Compound 30

Intermediate 35 (7 g) obtained with the same materials and equivalents and the same synthesis methods using 5'-(tert-butyl)-[1,1':3',1"-terphenyl]-2'-amine instead of 4-(tert-butyl)-2,6-dimethylaniline and using 6-bromo-2-(tert-butyl)dibenzo[b,d]furan instead of 1-bromodibenzo[b,d]furan in the synthesis processes of Intermediates 27 to 30, bis(4-(tert-butyl)phenyl)amine (3.0 g), sodium-tert-butoxide (1.5 g) and bis(tri-tert-butylphosphine)palladium(0) (0.04 g) were introduced to xylene (80 ml), and the mixture was stirred for 5 hours under reflux. After the reaction was finished, the result was extracted and then recrystallized to obtain Compound 30 (6.9 g, yield 77%). MS[M+H]+=1143

Synthesis Example 31. Synthesis of Compound 31

1) Synthesis of Compound 31

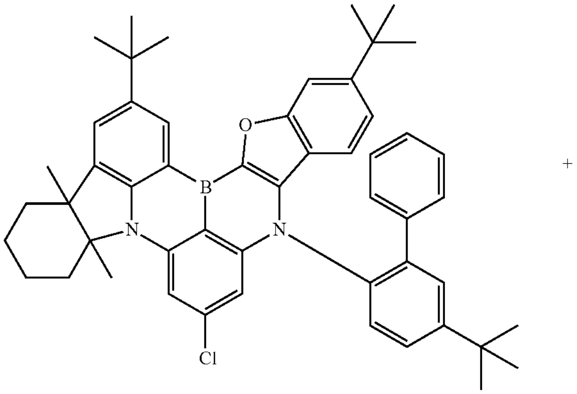

Intermediate 36

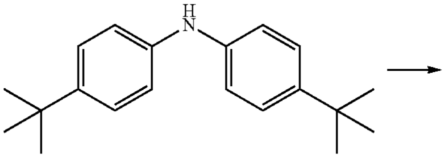

-continued

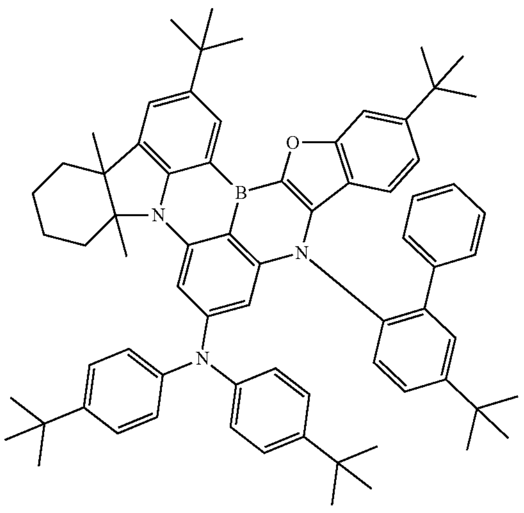

Compound 31

-continued

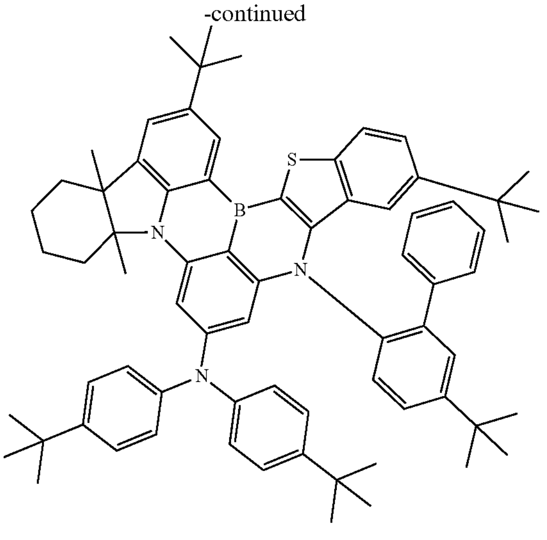

Compound 32

Intermediate 36 (7 g) obtained with the same materials and equivalents and the same synthesis methods using 5-(tert-butyl)-[1,1'-biphenyl]-2-amine instead of 4-(tert-butyl)-2,6-dimethylaniline and using 3-bromo-6-(tert-butyl) benzofuran instead of 1-bromodibenzo[b,d]furan in the synthesis processes of Intermediates 27 to 30, bis(4-(tert-butyl) phenyl)amine (3.6 g), sodium-tert-butoxide (1.9 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 31 (7.2 g, yield 78%). MS[M+H]+=1017

Synthesis Example 32. Synthesis of Compound 32

1) Synthesis of Compound 32

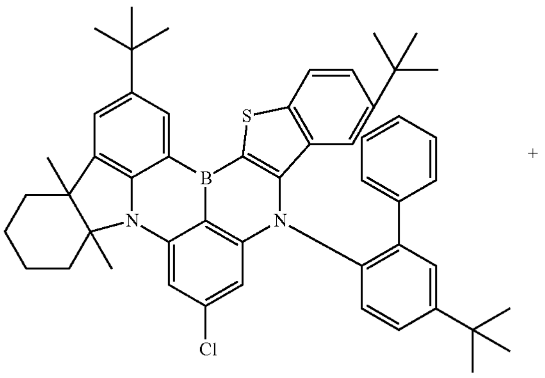

Intermediate 37

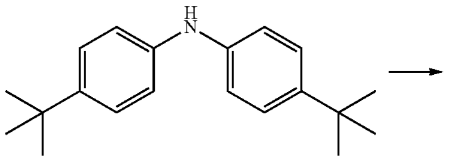

Intermediate 37 (7 g) obtained with the same materials and equivalents and the same synthesis methods using 5-(tert-butyl)-[1,1'-biphenyl]-2-amine instead of 4-(tert-butyl)-2,6-dimethylaniline and using 3-bromo-5-(tert-butyl) benzo[b]-thiophene instead of 1-bromodibenzo[b,d]furan in the synthesis processes of Intermediates 27 to 30, bis(4-(tert-butyl)-phenyl)amine (3.5 g), sodium-tert-butoxide (1.7 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 32 (7.1 g, yield 77%). MS[M+H]+=1033

Synthesis Example 33. Synthesis of Compound 33

1) Synthesis of Compound 33

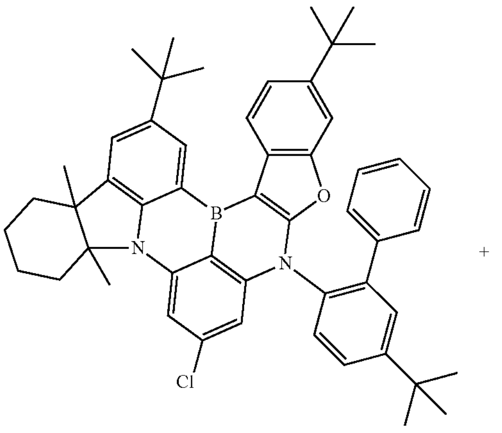

Intermediate 38

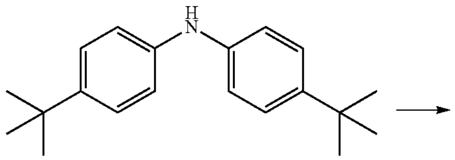

-continued

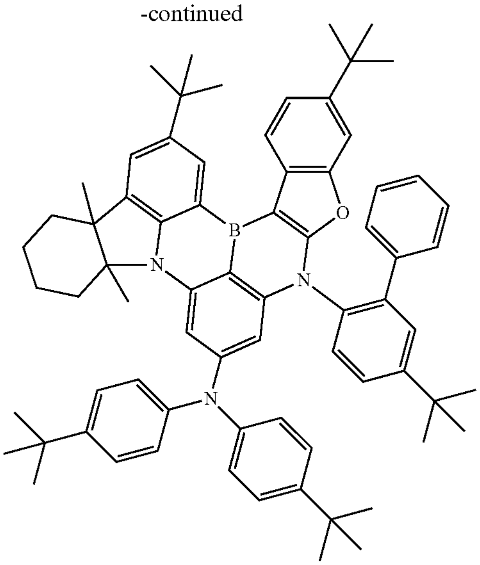

Compound 33

Intermediate 38 (7 g) obtained with the same materials and equivalents and the same synthesis methods using 5-(tert-butyl)-[1,1'-biphenyl]-2-amine instead of 4-(tert-butyl)-2,6-dimethylaniline and using 2-bromo-5-(tert-butyl) benzofuran instead of 1-bromodibenzo[b,d]furan in the synthesis processes of Intermediates 27 to 30, bis(4-(tert-butyl) phenyl)amine (3.5 g), sodium-tert-butoxide (1.7 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 33 (7.3 g, yield 79%). MS[M+H]+=1017

Synthesis Example 34. Synthesis of Compound 34

1) Synthesis of Compound 34

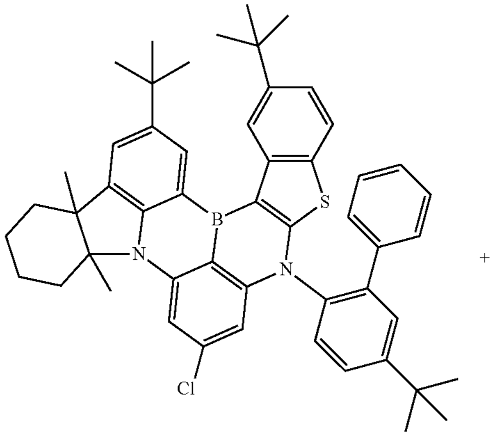

Intermediate 39

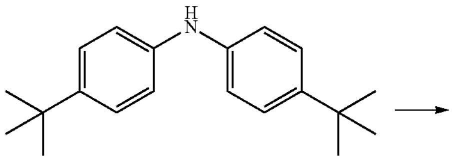

-continued

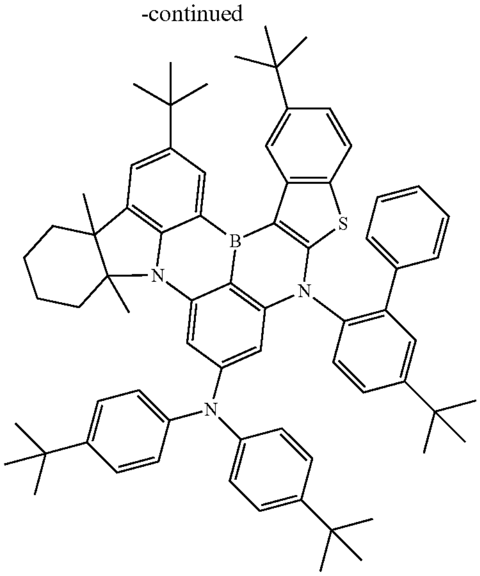

Compound 34

Intermediate 39 (7 g) obtained with the same materials and equivalents and the same synthesis methods using 5-(tert-butyl)-[1,1'-biphenyl]-2-amine instead of 4-(tert-butyl)-2,6-dimethylaniline and using 2-bromo-5-(tert-butyl) benzo[b]-thiophene instead of 1-bromodibenzo[b,d]furan in the synthesis processes of Intermediates 27 to 30, bis(4-(tert-butyl)phenyl)-amine (3.5 g), sodium-tert-butoxide (1.7 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 34 (7.2 g, yield 77%). MS[M+H]+=1033

Synthesis Example 35. Synthesis of Compound 35

1) Synthesis of Compound 35

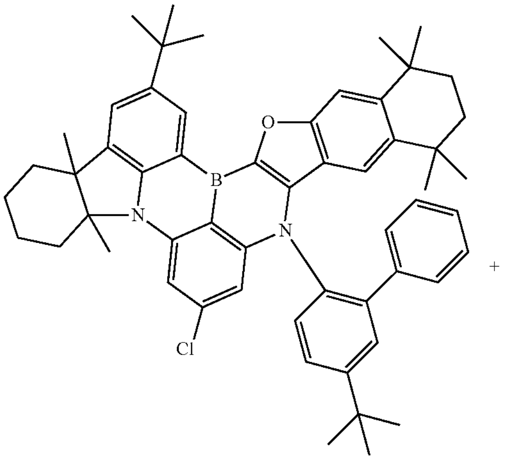

Intermediate 40

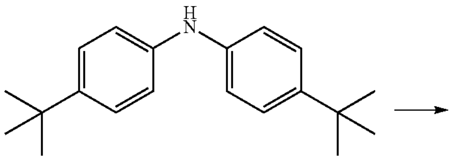

-continued

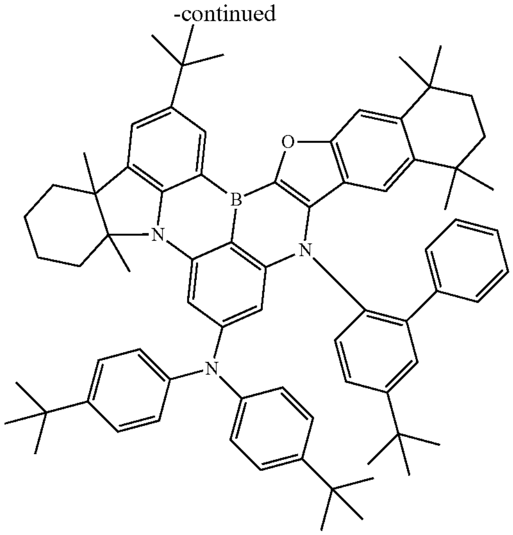

Compound 35

Intermediate 40 (7 g) obtained with the same materials and equivalents and the same synthesis methods using 5-(tert-butyl)-[1,1'-biphenyl]-2-amine instead of 4-(tert-butyl)-2,6-dimethylaniline and using 3-bromo-5,5,8,8-tetramethyl-5,6,7,8-tetrahydronaphtho[2,3-b]furan instead of 1-bromodibenzo[b,d]-furan in the synthesis processes of Intermediates 27 to 30, bis(4-(tert-butyl)phenyl)amine (3.3 g), sodium-tert-butoxide (1.7 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 35 (7.1 g, yield 78%). MS[M+H]+=1071

Synthesis Example 36. Synthesis of Compound 36

1) Synthesis of Compound 36

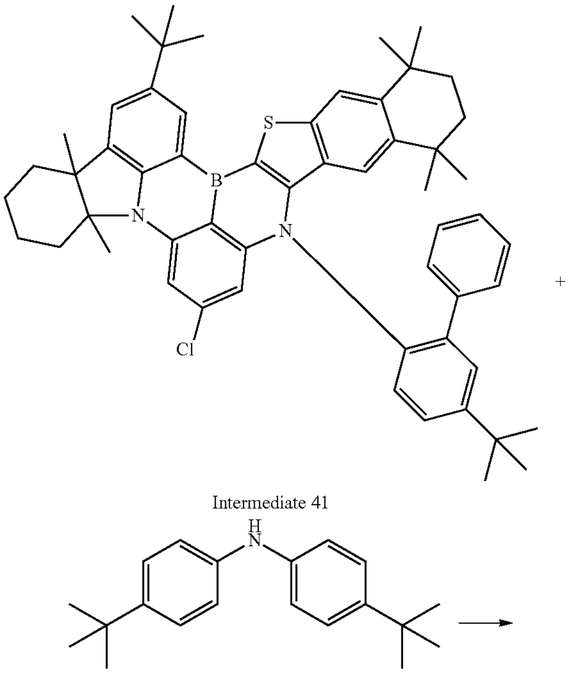

Intermediate 41

-continued

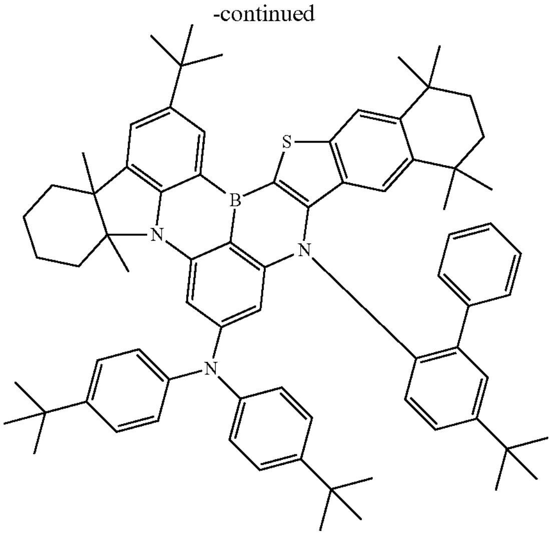

Compound 36

Intermediate 41 (7 g) obtained with the same materials and equivalents and the same synthesis methods using 5-(tert-butyl)-[1,1'-biphenyl]-2-amine instead of 4-(tert-butyl)-2,6-dimethylaniline and using 3-bromo-5,5,8,8-tetramethyl-5,6,7,8-tetrahydronaphtho[2,3-b]thiophene instead of 1-bromodibenzo-[b,d]furan in the synthesis processes of Intermediates 27 to 30, bis(4-(tert-butyl)phenyl) amine (3.3 g), sodium-tert-butoxide (1.6 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 36 (6.9 g, yield 76%). MS[M+H]+=1087

Synthesis Example 37. Synthesis of Compound 37

1) Synthesis of Compound 37

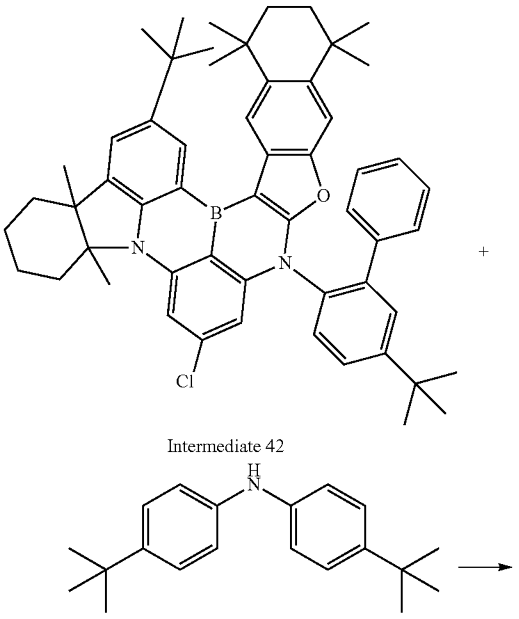

Intermediate 42

-continued

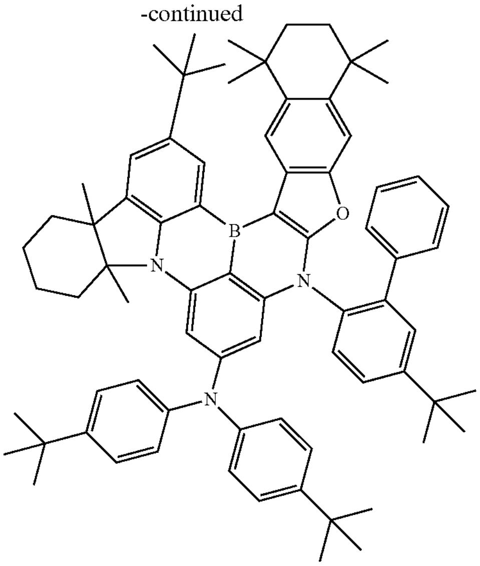

Compound 37

Intermediate 42 (7 g) obtained with the same materials and equivalents and the same synthesis methods using 5-(tert-butyl)-[1,1'-biphenyl]-2-amine instead of 4-(tert-butyl)-2,6-dimethylaniline and using 2-bromo-5,5,8,8-tetramethyl-5,6,7,8-tetrahydronaphtho[2,3-b]furan instead of 1-bromodibenzo[b,d]-furan in the synthesis processes of Intermediates 27 to 30, bis(4-(tert-butyl)phenyl)amine (3.3 g), sodium-tert-butoxide (1.6 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 37 (7.0 g, yield 77%). MS[M+H]+=1071

Synthesis Example 38. Synthesis of Compound 38

1) Synthesis of Compound 38

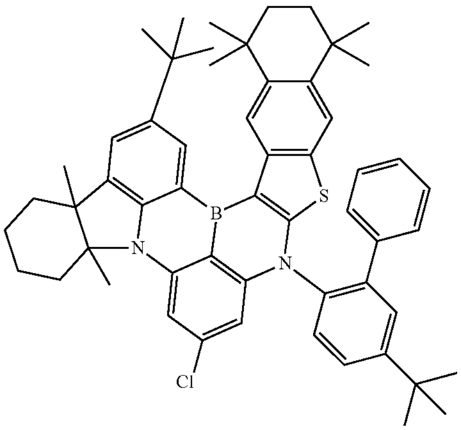

+

Intermediate 43

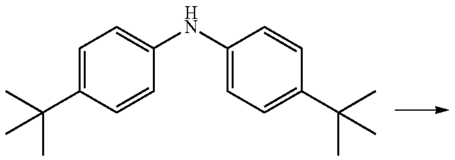

-continued

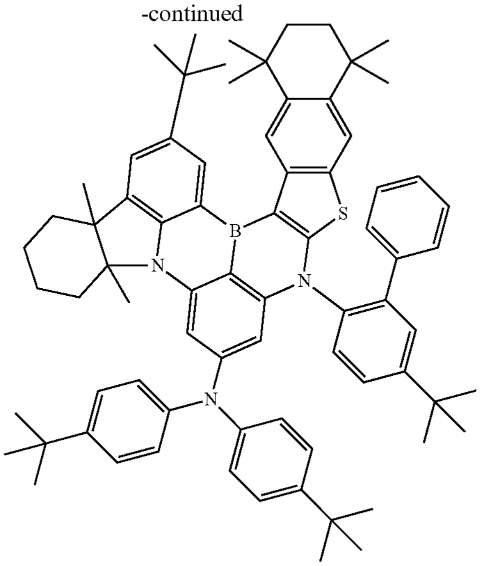

Compound 38

Intermediate 43 (7 g) obtained with the same materials and equivalents and the same synthesis methods using 5-(tert-butyl)-[1,1'-biphenyl]-2-amine instead of 4-(tert-butyl)-2,6-dimethylaniline and using 2-bromo-5,5,8,8-tetramethyl-5,6,7,8-tetrahydronaphtho[2,3-b]thiophene instead of 1-bromodibenzo-[b,d]furan in the synthesis processes of Intermediates 27 to 30, bis(4-(tert-butyl)phenyl) amine (3.3 g), sodium-tert-butoxide (1.6 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 38 (7.1 g, yield 79%). MS[M+H]+=1087

Synthesis Example 39. Synthesis of Compound 39

1) Synthesis of Compound 39

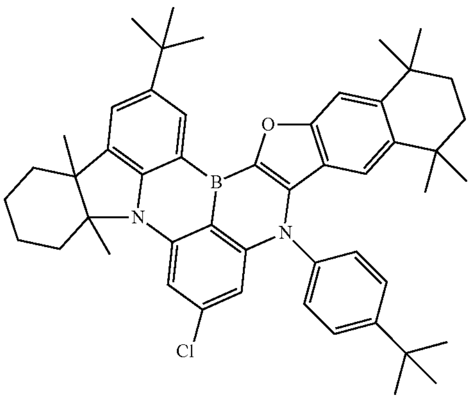

+

Intermediate 44

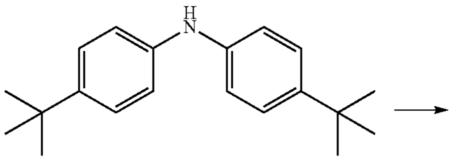

-continued

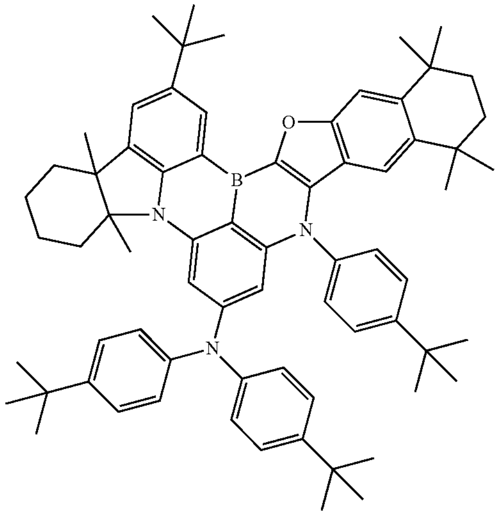

Compound 39

-continued

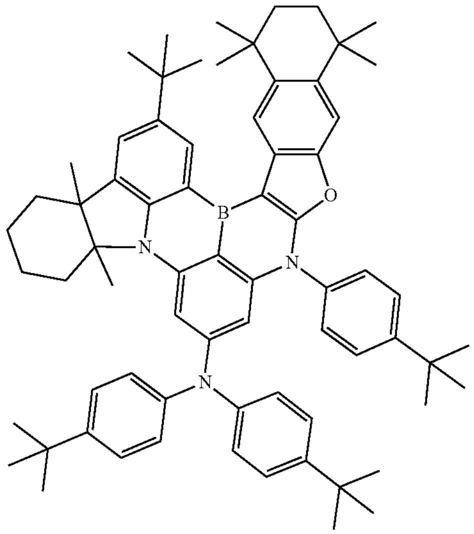

Compound 40

Intermediate 44 (7 g) obtained with the same materials and equivalents and the same synthesis methods using 4-(tert-butyl)aniline instead of 4-(tert-butyl)-2,6-dimethyl-aniline and using 3-bromo-5,5,8,8-tetramethyl-5,6,7,8-tetra-hydro-naphtho[2,3-b]furan instead of 1-bromodibenzo[b,d]furan in the synthesis processes of Intermediates 27 to 30, bis(4-(tert-butyl)phenyl)amine (3.7 g), sodium-tert-butoxide (1.8 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 39 (7.5 g, yield 81%). MS[M+H]+=995

Synthesis Example 40. Synthesis of Compound 40

1) Synthesis of Compound 40

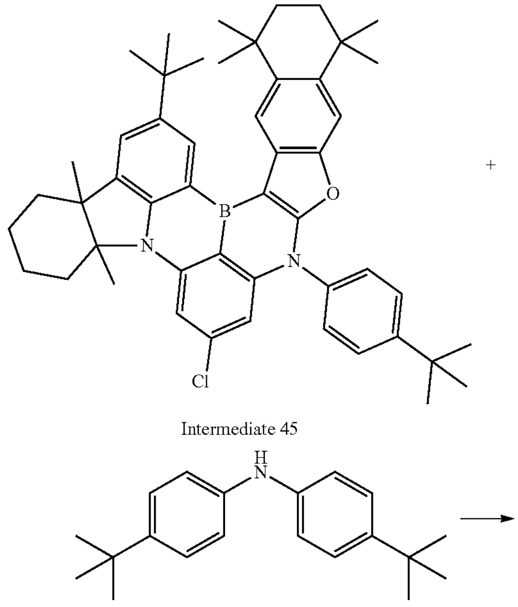

Intermediate 45

Intermediate 45 (7 g) obtained with the same materials and equivalents and the same synthesis methods using 4-(tert-butyl)aniline instead of 4-(tert-butyl)-2,6-dimethyl-aniline and using 2-bromo-5,5,8,8-tetramethyl-5,6,7,8-tetra-hydro-naphtho[2,3-b]furan instead of 1-bromodibenzo[b,d]furan in the synthesis processes of Intermediates 27 to 30, bis(4-(tert-butyl)phenyl)amine (3.7 g), sodium-tert-butoxide (1.8 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 40 (7.4 g, yield 80%). MS[M+H]+=995

Synthesis Example 41. Synthesis of Compound 41

1) Synthesis of Compound 41

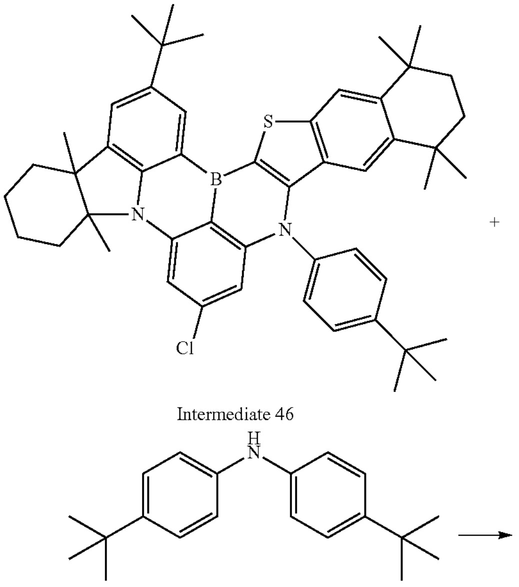

Intermediate 46

-continued

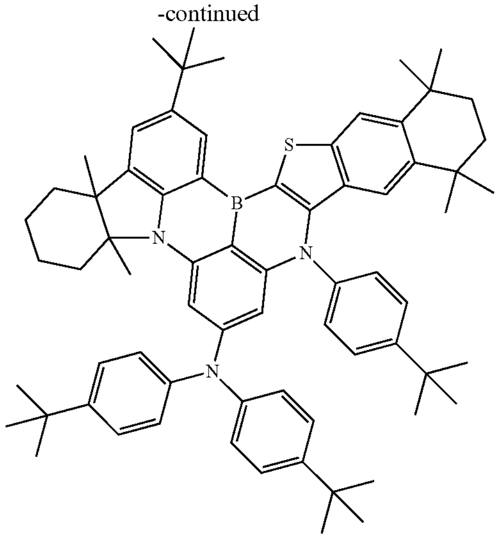

Compound 41

Intermediate 46 (7 g) obtained with the same materials and equivalents and the same synthesis methods using 4-(tert-butyl)aniline instead of 4-(tert-butyl)-2,6-dimethyl-aniline and using 3-bromo-5,5,8,8-tetramethyl-5,6,7,8-tetra-hydro-naphtho[2,3-b]thiophene instead of 1-bromodibenzo [b,d]furan in the synthesis processes of Intermediates 27 to 30, bis(4-(tert-butyl)phenyl)amine (3.6 g), sodium-tert-butoxide (1.8 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 41 (7.4 g, yield 80%). MS[M+H]+=1011

Synthesis Example 42. Synthesis of Compound 42

1) Synthesis of Compound 42

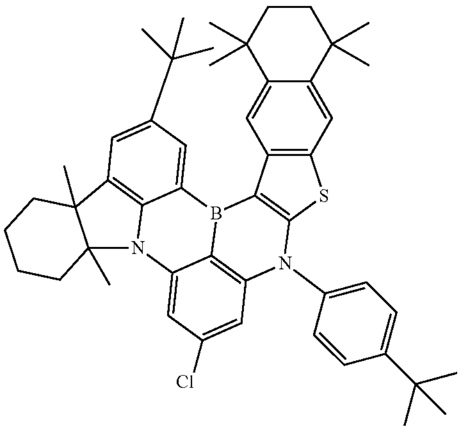

+

Intermediate 47

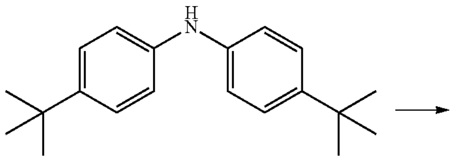

-continued

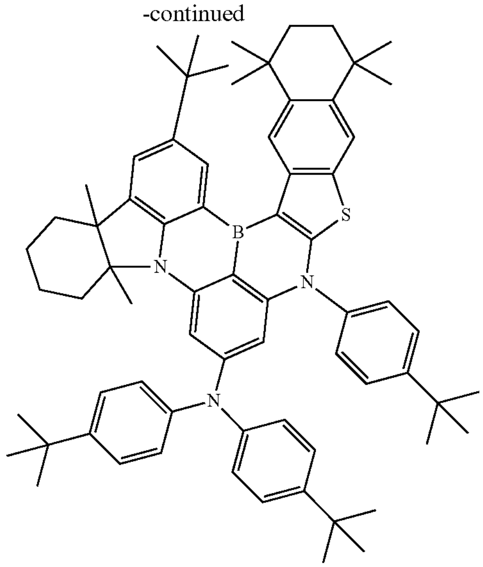

Compound 42

Intermediate 47 (7 g) obtained with the same materials and equivalents and the same synthesis methods using 4-(tert-butyl)aniline instead of 4-(tert-butyl)-2,6-dimethyl-aniline and using 2-bromo-5,5,8,8-tetramethyl-5,6,7,8-tetra-hydro-naphtho[2,3-b]thiophene instead of 1-bromodibenzo [b,d]furan in the synthesis processes of Intermediates 27 to 30, bis(4-(tert-butyl)phenyl)amine (3.6 g), sodium-tert-butoxide (1.8 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 42 (7.6 g, yield 81%). MS[M+H]+=1011

Synthesis Example 43. Synthesis of Compound 43

1) Synthesis of Compound 43

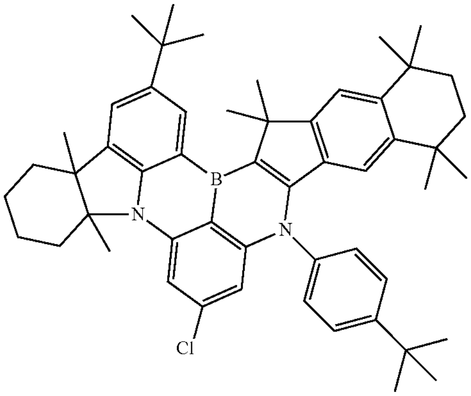

+

Intermediate 48

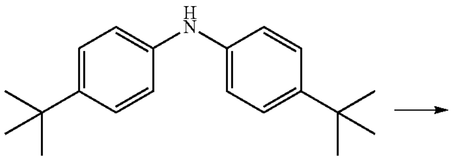

-continued

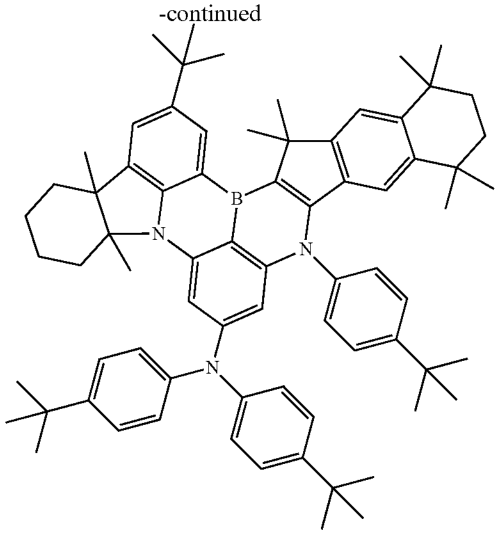

Compound 43

Intermediate 48 (7 g) obtained with the same materials and equivalents and the same synthesis methods using 4-(tert-butyl)aniline instead of 4-(tert-butyl)-2,6-dimethyl-aniline and using 3-bromo-1,1,5,5,8,8-hexamethyl-5,6,7,8-tetrahydro-1H-cyclopenta[b]naphthalene instead of 1-bromodibenzo[b,d]-furan in the synthesis processes of Intermediates 27 to 30, bis(4-(tert-butyl)phenyl)amine (3.5 g), sodium-tert-butoxide (1.8 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 43 (7.3 g, yield 79%). MS[M+H]+=1021

Synthesis Example 44. Synthesis of Compound 44

1) Synthesis of Compound 44

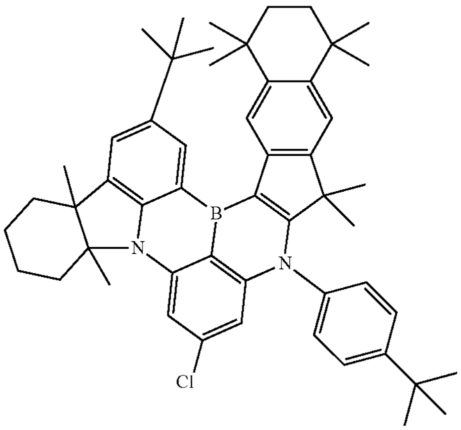

+

Intermediate 49

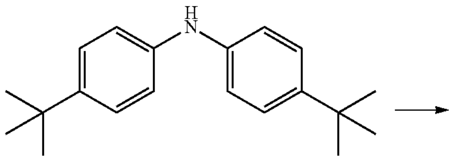

-continued

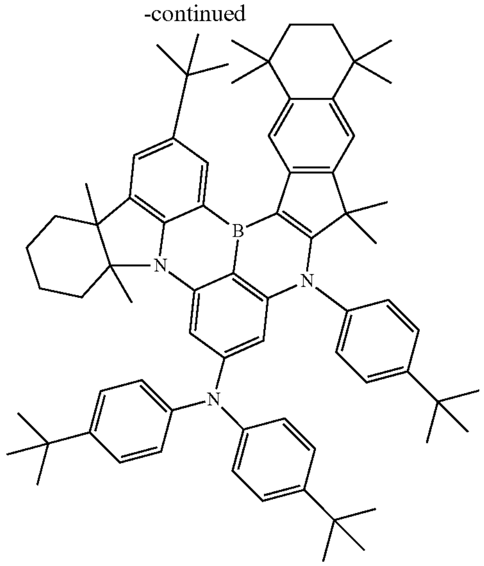

Compound 44

Intermediate 49 (7 g) obtained with the same materials and equivalents and the same synthesis methods using 4-(tert-butyl)aniline instead of 4-(tert-butyl)-2,6-dimethyl-aniline and using 2-bromo-1,1,5,5,8,8-hexamethyl-5,6,7,8-tetrahydro-1H-cyclopenta[b]naphthalene instead of 1-bromodibenzo[b,d]-furan in the synthesis processes of Intermediates 27 to 30, bis(4-(tert-butyl)phenyl)amine (3.5 g), sodium-tert-butoxide (1.8 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 44 (7.2 g, yield 78%). MS[M+H]+=1021

Synthesis Example 45. Synthesis of Compound 45

1) Synthesis of Compound 45

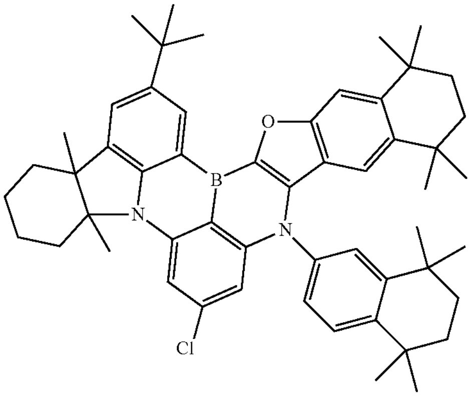

+

Intermediate 50

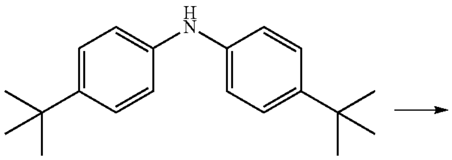

-continued

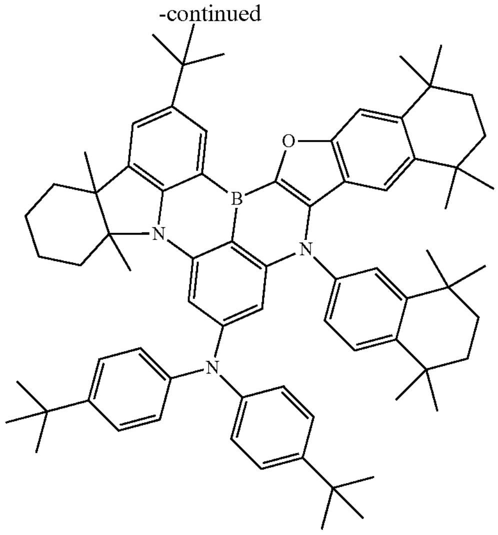

Compound 45

Intermediate 50 (7 g) obtained with the same materials and equivalents and the same synthesis methods using 5,5,8,8-tetramethyl-5,6,7,8-tetrahydronaphthalen-2-amine instead of 4-(tert-butyl)-2,6-dimethylaniline and using 3-bromo-5,5,8,8-tetramethyl-5,6,7,8-tetrahydronaphtho[2,3-b]furan instead of 1-bromodibenzo[b,d]furan in the synthesis processes of Intermediates 27 to 30, bis(4-(tert-butyl)phenyl)amine (3.4 g), sodium-tert-butoxide (1.7 g) and bis(tri-tert-butyl-phosphine)palladium(0) (0.05 g) were introduced to xylene (80 ml), and the mixture was stirred for 5 hours under reflux. After the reaction was finished, the result was extracted and then recrystallized to obtain Compound 45 (7.3 g, yield 80%). MS[M+H]+=1049

Synthesis Example 46. Synthesis of Compound 46

1) Synthesis of Compound 46

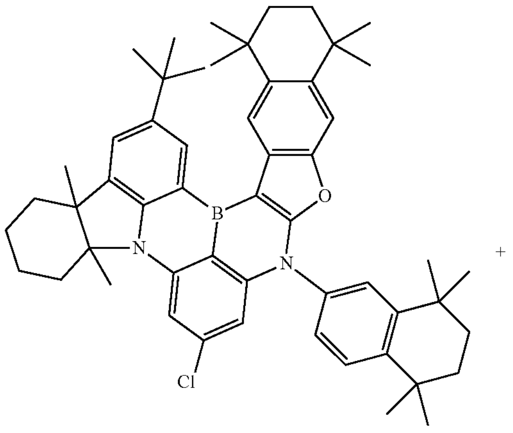

Intermediate 51

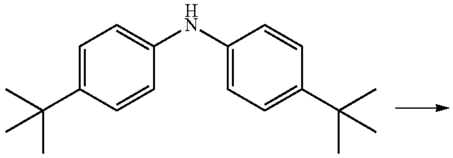

-continued

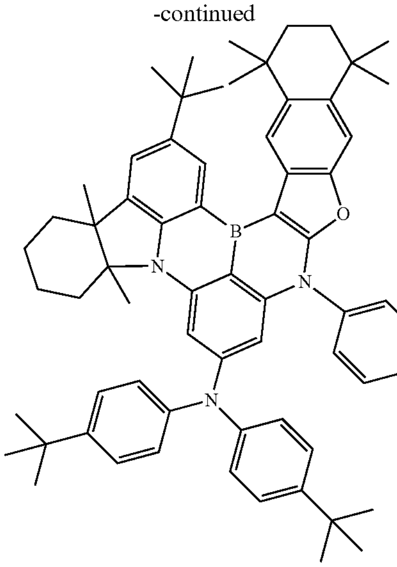

Compound 46

Intermediate 51 (7 g) obtained with the same materials and equivalents and the same synthesis methods using 5,5,8,8-tetramethyl-5,6,7,8-tetrahydronaphthalen-2-amine instead of 4-(tert-butyl)-2,6-dimethylaniline and using 2-bromo-5,5,8,8-tetramethyl-5,6,7,8-tetrahydronaphtho[2,3-b]furan instead of 1-bromodibenzo[b,d]furan in the synthesis processes of Intermediates 27 to 30, bis(4-(tert-butyl)phenyl)amine (3.4 g), sodium-tert-butoxide (1.7 g) and bis(tri-tert-butylphosphine)-palladium(0) (0.05 g) were introduced to xylene (80 ml), and the mixture was stirred for 5 hours under reflux. After the reaction was finished, the result was extracted and then recrystallized to obtain Compound 46 (7.4 g, yield 81%). MS[M+H]+=1049

Synthesis Example 47. Synthesis of Compound 47

1) Synthesis of Compound 47

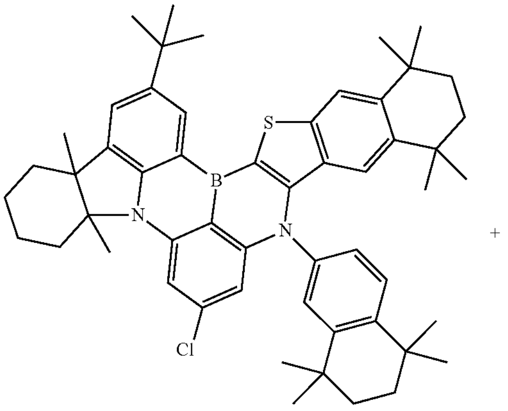

Intermediate 52

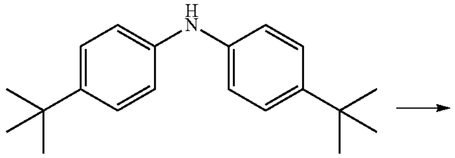

-continued

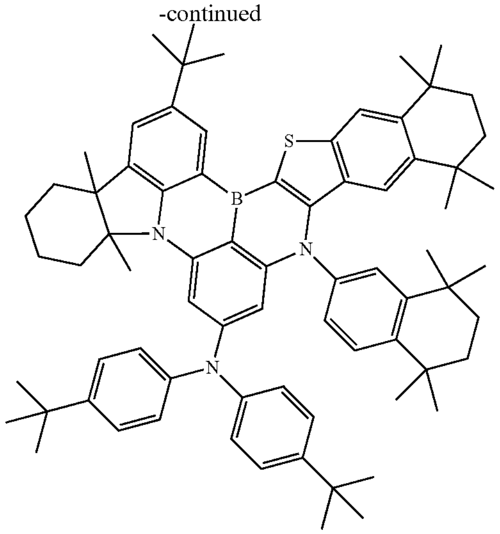

Compound 47

Intermediate 52 (7 g) obtained with the same materials and equivalents and the same synthesis methods using 5,5,8,8-tetramethyl-5,6,7,8-tetrahydronaphthalen-2-amine instead of 4-(tert-butyl)-2,6-dimethylaniline and using 3-bromo-5,5,8,8-tetramethyl-5,6,7,8-tetrahydronaphtho[2,3-b]thiophene instead of 1-bromodibenzo[b,d]furan in the synthesis processes of Intermediates 27 to 30, bis(4-(tert-butyl)phenyl)amine (3.4 g), sodium-tert-butoxide (1.7 g) and bis(tri-tert-butylphosphine)-palladium(0) (0.05 g) were introduced to xylene (80 ml), and the mixture was stirred for 5 hours under reflux. After the reaction was finished, the result was extracted and then recrystallized to obtain Compound 47 (7.1 g, yield 78%). MS[M+H]+=1065

Synthesis Example 48. Synthesis of Compound 48

1) Synthesis of Compound 48

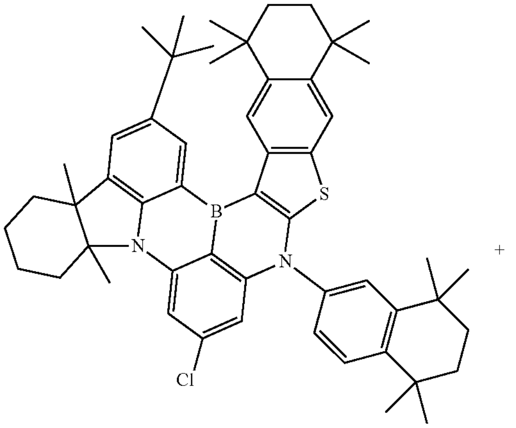

Intermediate 53

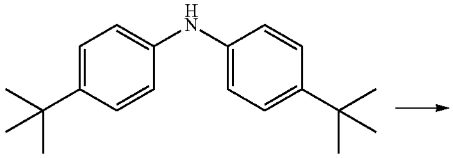

-continued

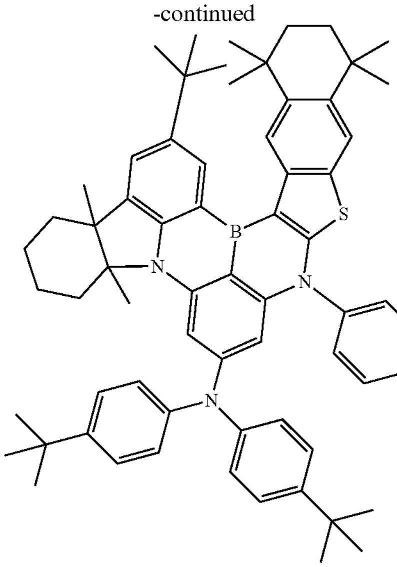

Compound 48

Intermediate 53 (7 g) obtained with the same materials and equivalents and the same synthesis methods using 5,5,8,8-tetramethyl-5,6,7,8-tetrahydronaphthalen-2-amine instead of 4-(tert-butyl)-2,6-dimethylaniline and using 2-bromo-5,5,8,8-tetramethyl-5,6,7,8-tetrahydronaphtho[2,3-b]thiophene instead of 1-bromodibenzo[b,d]furan in the synthesis processes of Intermediates 27 to 30, bis(4-(tert-butyl)phenyl)amine (3.4 g), sodium-tert-butoxide (1.7 g) and bis(tri-tert-butylphosphine)-palladium(0) (0.05 g) were introduced to xylene (80 ml), and the mixture was stirred for 5 hours under reflux. After the reaction was finished, the result was extracted and then recrystallized to obtain Compound 48 (7.3 g, yield 80%). MS[M+H]+=1065

Synthesis Example 49. Synthesis of Compound 49

1) Synthesis of Compound 49

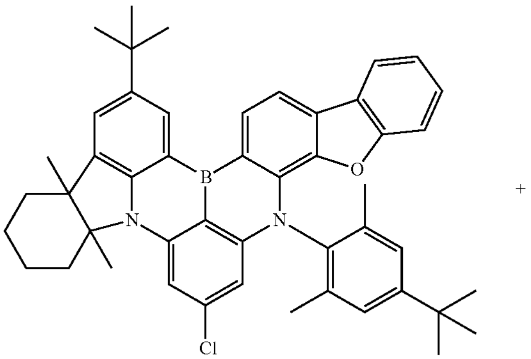

Intermediate 54

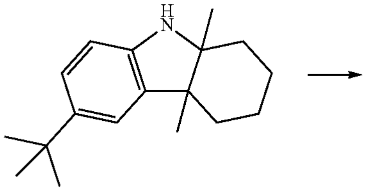

-continued

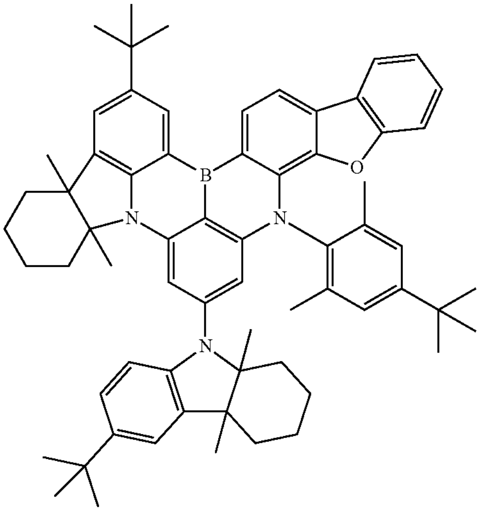

Compound 49

Intermediate 54 (7 g) obtained with the same materials and equivalents and the same synthesis methods using 4-bromodibenzo[b,d]furan instead of 1-bromodibenzo[b,d] furan in the synthesis processes of Intermediates 27 to 30, 6-(tert-butyl)-4a,9a-dimethyl-2,3,4,4a,9,9a-hexahydro-1H-carbazole (2.5 g), sodium-tert-butoxide (1.9 g) and bis(tri-tert-butyl-phosphine)palladium(0) (0.05 g) were introduced to xylene (80 ml), and the mixture was stirred for 5 hours under reflux. After the reaction was finished, the result was extracted and then recrystallized to obtain Compound 49 (7.2 g, yield 79%). MS[M+H]+=939

Synthesis Example 50. Synthesis of Compound 50

1) Synthesis of Compound 50

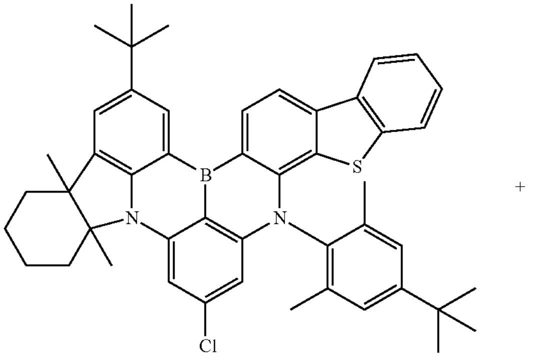

Intermediate 55

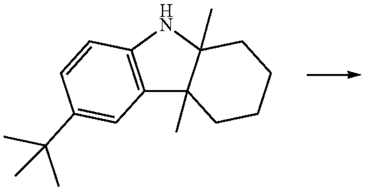

-continued

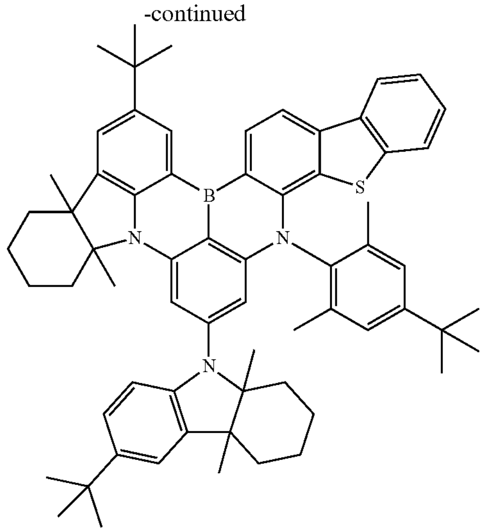

Compound 50

Intermediate 55 (7 g) obtained with the same materials and equivalents and the same synthesis methods using 4-bromodibenzo[b,d]thiophene instead of 1-bromodibenzo [b,d]-furan in the synthesis processes of Intermediates 27 to 30, 6-(tert-butyl)-4a,9a-dimethyl-2,3,4,4a,9,9a-hexahydro-1H-carbazole (2.5 g), sodium-tert-butoxide (1.9 g) and bis (tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 50 (7.1 g, yield 78%). MS[M+H]+=955

Synthesis Example 51. Synthesis of Compound 51

1) Synthesis of Compound 51

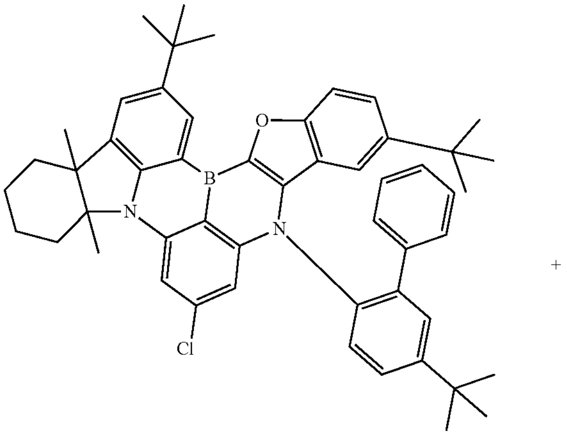

Intermediate 56

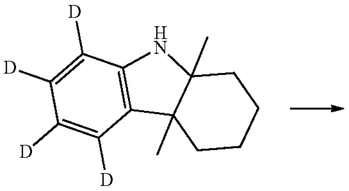

-continued

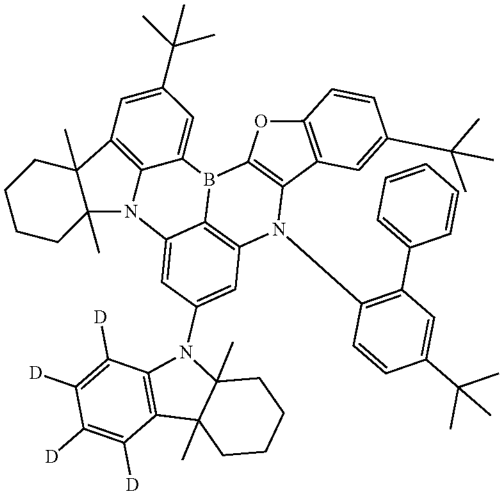

Compound 51

Intermediate 56 (7 g) obtained with the same materials and equivalents and the same synthesis methods using 5-(tert-butyl)-[1,1'-biphenyl]-2-amine instead of 4-(tert-butyl)-2,6-dimethylaniline and using 3-bromo-5-(tert-butyl) benzofuran instead of 1-bromodibenzo[b,d]furan in the synthesis processes of Intermediates 27 to 30, 4a,9a-dimethyl-2,3,4,4a,9,9a-hexahydro-1H-carbazole-5,6,7,8-d4 (1.9 g), sodium-tert-butoxide (1.8 g) and bis(tri-tert-butylphosphine) palladium(0) (0.05 g) were introduced to xylene (80 ml), and the mixture was stirred for 5 hours under reflux. After the reaction was finished, the result was extracted and then recrystallized to obtain Compound 51 (6.6 g, yield 77%). MS[M+H]+=941

Synthesis Example 52. Synthesis of Compound 52

1) Synthesis of Compound 52

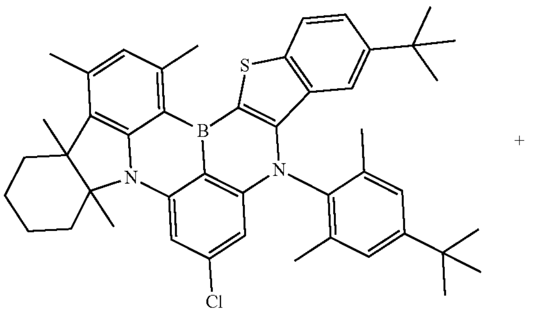

Intermediate 57

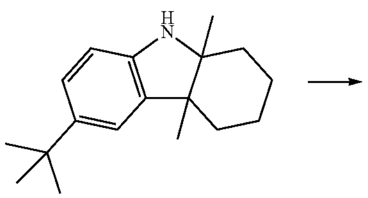

-continued

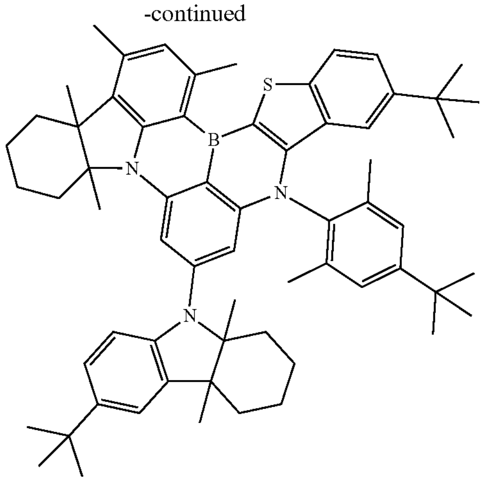

Compound 52

Intermediate 57 (7 g) obtained with the same materials and equivalents and the same synthesis methods using 4a,5,7,9a-tetramethyl-2,3,4,4a,9,9a-hexahydro-1H-carbazole instead of 6-(tert-butyl)-4a,9a-dimethyl-2,3,4,4a,9,9a-hexahydro-1H-carbazole and using 3-bromo-5-(tert-butyl)-benzo[b]thiophene instead of 1-bromodibenzo[b,d]furan in the synthesis processes of Intermediates 27 to 30, 6-(tert-butyl)-4a,9a-dimethyl-2,3,4,4a,9,9a-hexahydro-1H-carbazole (2.5 g), sodium-tert-butoxide (1.9 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 52 (6.9 g, yield 75%). MS[M+H]+=933

Synthesis Example 53. Synthesis of Compound 53

1) Synthesis of Compound 53

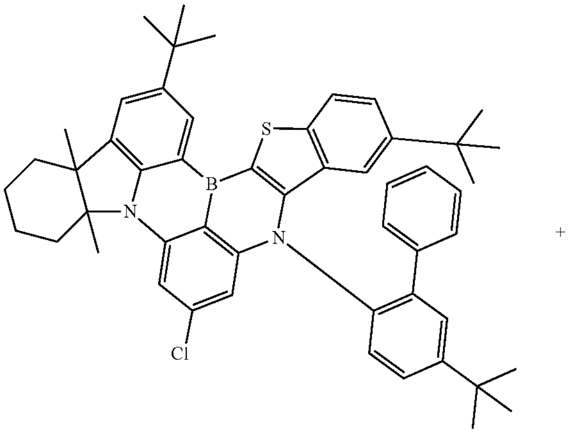

Intermediate 58

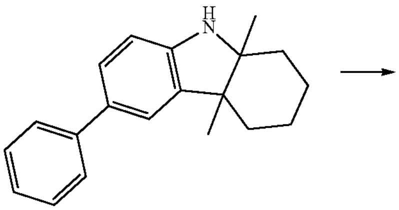

-continued

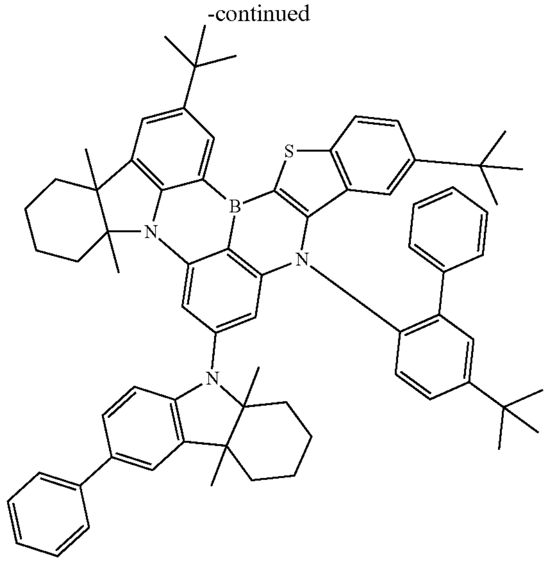

Compound 53

Intermediate 58 (7 g) obtained with the same materials and equivalents and the same synthesis methods using 5-(tert-butyl)-[1,1'-biphenyl]-2-amine instead of 4-(tert-butyl)-2,6-dimethylaniline and using 3-bromo-5-(tert-butyl) benzo[b]-thiophene instead of 1-bromodibenzo[b,d]furan in the synthesis processes of Intermediates 27 to 30, 4a,9a-dimethyl-6-phenyl-2,3,4,4a,9,9a-hexahydro-1H-carbazole (2.8 g), sodium-tert-butoxide (1.9 g) and bis(tri-tert-butylphosphine)palladium(0) (0.05 g) were introduced to xylene (80 ml), and the mixture was stirred for 5 hours under reflux. After the reaction was finished, the result was extracted and then recrystallized to obtain Compound 53 (7.3 g, yield 72%). MS[M+H]+=1029

Synthesis Example 54. Synthesis of Compound 54

1) Synthesis of Compound 54

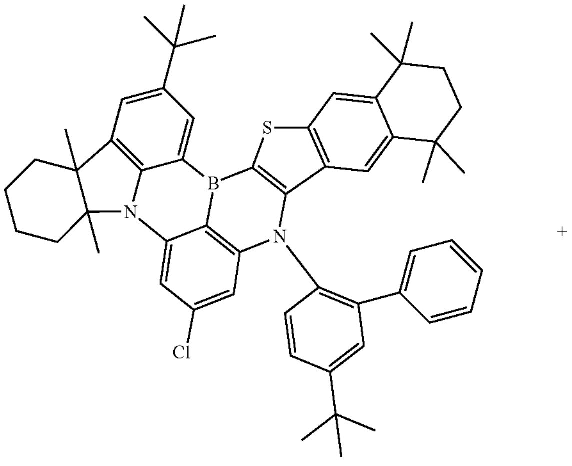

Intermediate 59

-continued

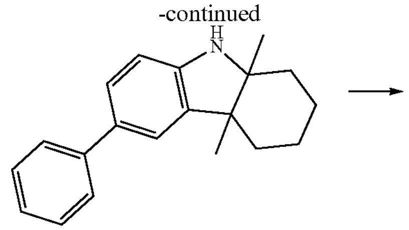

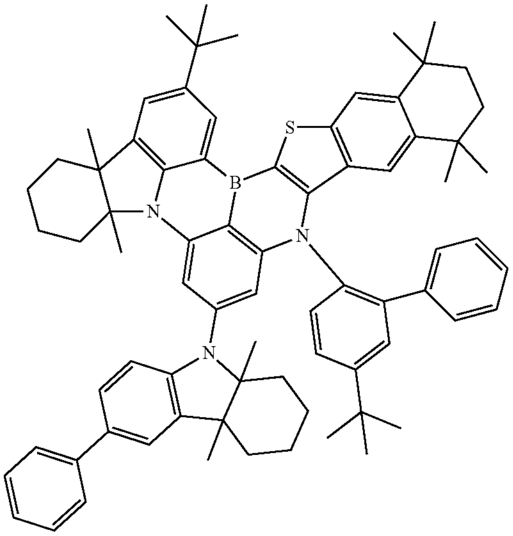

Compound 54

Intermediate 59 (7 g) obtained with the same materials and equivalents and the same synthesis methods using 5-(tert-butyl)-[1,1'-biphenyl]-2-amine instead of 4-(tert-butyl)-2,6-dimethylaniline and using 3-bromo-5,5,8,8-tetramethyl-5,6,7,8-tetrahydronaphtho[2,3-b]thiophene instead of 1-bromodibenzo[b,d]furan in the synthesis processes of Intermediates 27 to 30, 4a,9a-dimethyl-6-phenyl-2,3,4,4a,9,9a-hexahydro-1H-carbazole (2.8 g), sodium-tert-butoxide (1.9 g) and bis(tri-tert-butylphosphine)palladium (0) (0.05 g) were introduced to xylene (80 ml), and the mixture was stirred for 5 hours under reflux. After the reaction was finished, the result was extracted and then recrystallized to obtain Compound 54 (7.9 g, yield 74%). MS[M+H]+=1083

Synthesis Example 55. Synthesis of Compound 55

1) Synthesis of Intermediate 60

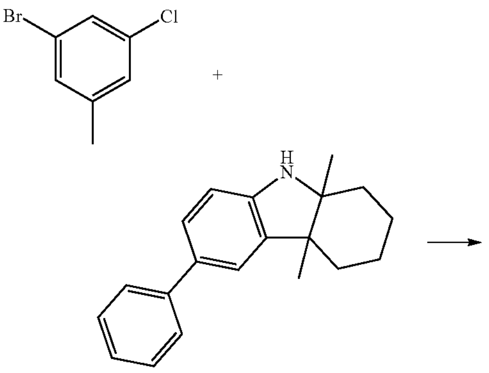

-continued

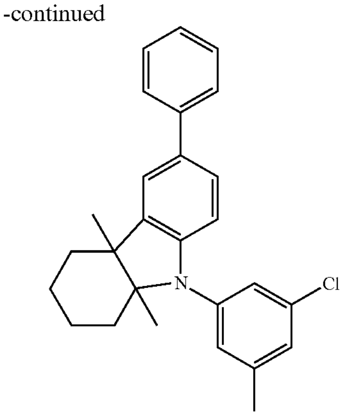

Intermediate 60

-continued

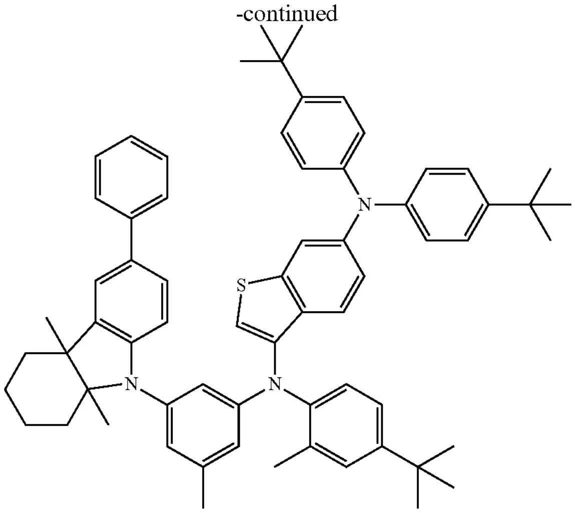

Intermediate 61

After introducing 1-bromo-3-chloro-5-methylbenzene (40 g), 4a,9a-dimethyl-6-phenyl-2,3,4,4a,9,9a-hexahydro-1H-carbazole (54 g), sodium-tert-butoxide (56.2 g) and bis(tri-tert-butylphosphine)palladium(0) (1.0 g) to toluene (600 ml), the mixture was stirred for 2 hours under reflux. After the reaction was finished, the result was extracted and then column purified to obtain Intermediate 60 (56 g, yield 72%). MS[M+H]+=403

2) Synthesis of Intermediate 61

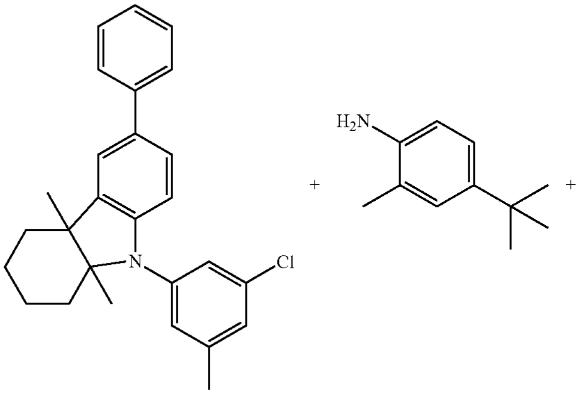

Intermediate 60

After introducing Intermediate 60 (40 g), 4-(tert-butyl)-2-methylaniline (16.3 g), sodium-tert-butoxide (29 g) and bis(tri-tert-butylphosphine)palladium(0) (0.5 g) to toluene (600 ml), the mixture was refluxed for 1 hour, and, after checking the progress of the reaction, 3-bromo-N,N-bis(4-(tert-butyl)phenyl)benzo[b]thiophen-6-amine (50 g) was introduced thereto during the reflux reaction, and the result was further refluxed for 1 hour. After the reaction was finished, the result was extracted and then column purified to obtain Intermediate 61 (66 g, yield 71%). MS[M+H]+=941

3) Synthesis of Compound 55

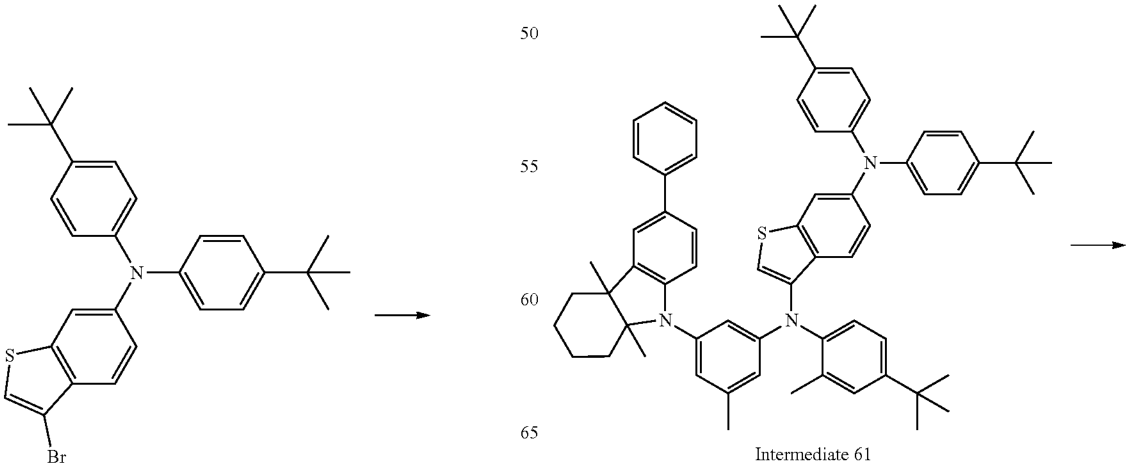

Intermediate 61

-continued

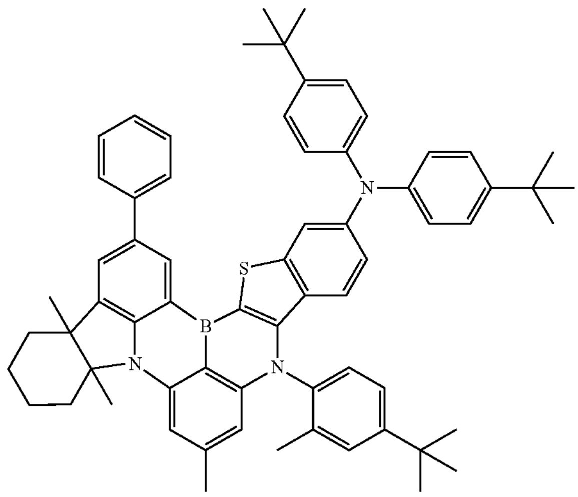

Compound 55

After introducing Intermediate 61 (25 g) and boron triiodide (18.0 g) to 1,2-dichlorobenzene (250 ml) under a nitrogen atmosphere, the mixture was stirred for 4 hours at 160° C. After the reaction was finished, the result was extracted and then recrystallized to obtain Compound 55 (7.4 g, yield 29%). MS[M+H]+=949

Synthesis Example 56. Synthesis of Compound 56

1) Synthesis of Intermediate 62

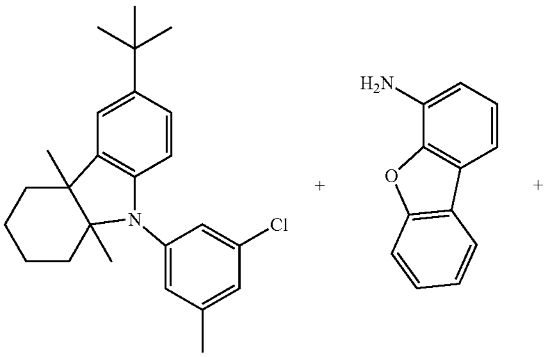

Intermediate 8

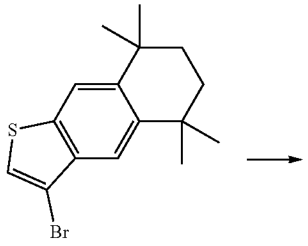

-continued

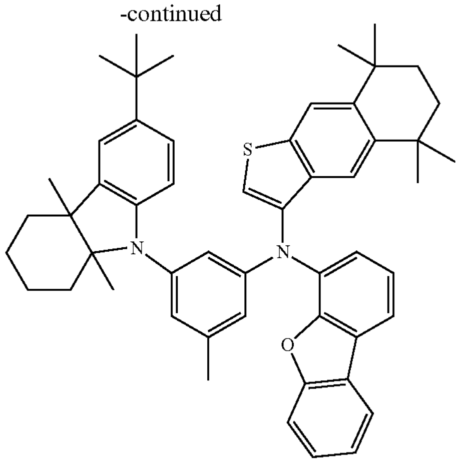

Intermediate 62

After introducing Intermediate 8 (40 g), dibenzo[b,d]furan-4-amine (18.2 g), sodium-tert-butoxide (29 g) and bis(tri-tert-butylphosphine)palladium(0) (0.5 g) to toluene (600 ml), the mixture was refluxed for 1 hour, and, after checking the progress of the reaction, 3-bromo-5,5,8,8-tetramethyl-5,6,7,8-tetrahydronaphtho[2,3-b]thiophene (32.2 g) was introduced thereto during the reflux reaction, and the result was further refluxed for 1 hour. After the reaction was finished, the result was extracted and then column purified to obtain Intermediate 62 (54 g, yield 70%). MS[M+H]+=772

2) Synthesis of Compound 56

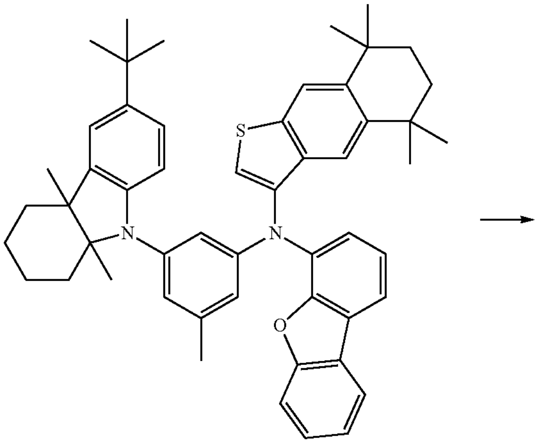

Intermediate 62

-continued

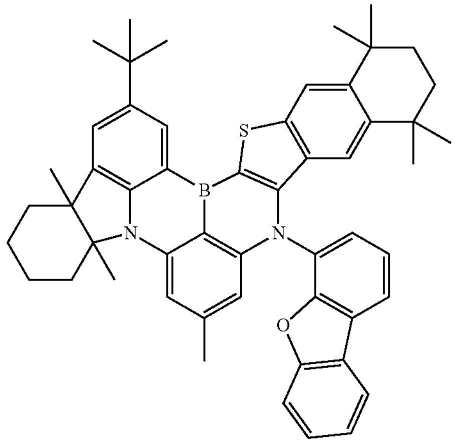

Compound 56

After introducing Intermediate 62 (25 g) and boron triiodide (21.6 g) to 1,2-dichlorobenzene (250 ml) under a nitrogen atmosphere, the mixture was stirred for 4 hours at 160° C. After the reaction was finished, the result was extracted and then recrystallized to obtain Compound 56 (7.5 g, yield 30%). MS[M+H]+=780

Synthesis Example 57. Synthesis of Compound 57

1) Synthesis of Intermediate 63

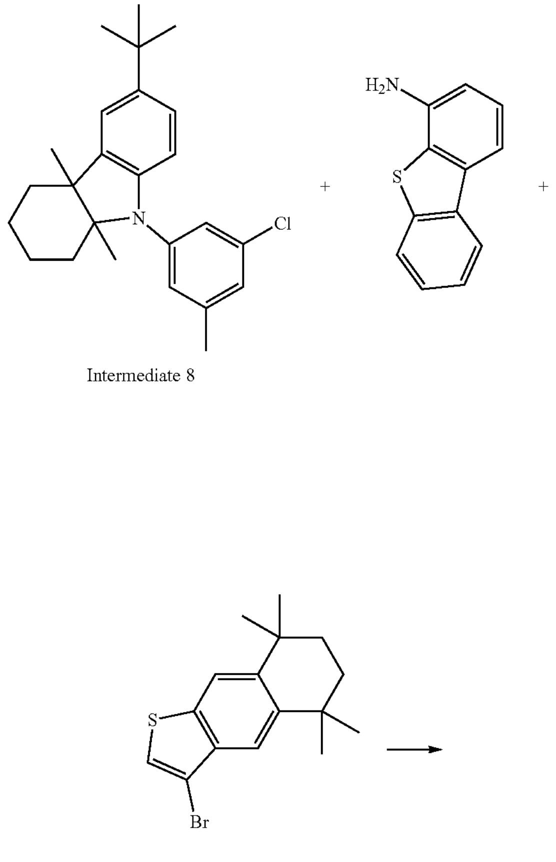

Intermediate 8

-continued

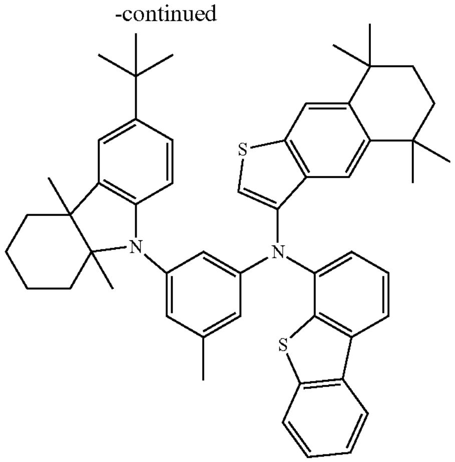

Intermediate 63

A reaction was conducted using the same materials and equivalents and the same synthesis method as the synthesis process of Intermediate 62 using Intermediate 8 (40 g), and dibenzo[b,d]thiophen-4-amine instead of dibenzo[b,d]furan-4-amine, and the result was column purified to obtain Intermediate 63 (56 g, yield 71%). MS[M+H]+=788

2) Synthesis of Compound 57

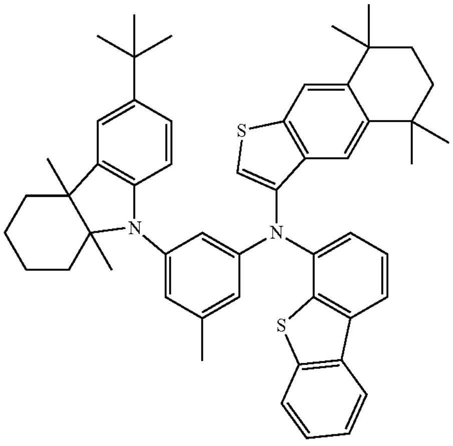

Intermediate 63

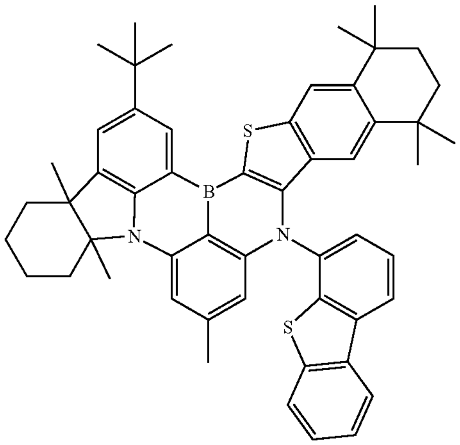

Compound 57

After introducing Intermediate 63 (25 g) and boron triiodide (21.2 g) to 1,2-dichlorobenzene (250 ml) under a nitrogen atmosphere, the mixture was stirred for 4 hours at 160° C. After the reaction was finished, the result was extracted and then recrystallized to obtain Compound 57 (7.8 g, yield 31%). MS[M+H]+=796

Synthesis Example 58. Synthesis of Compound 58

1) Synthesis of Intermediate 64

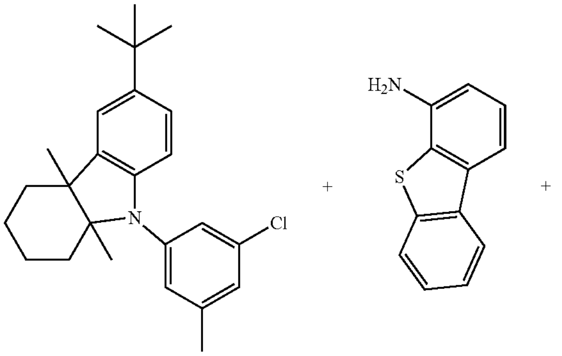

Intermediate 8

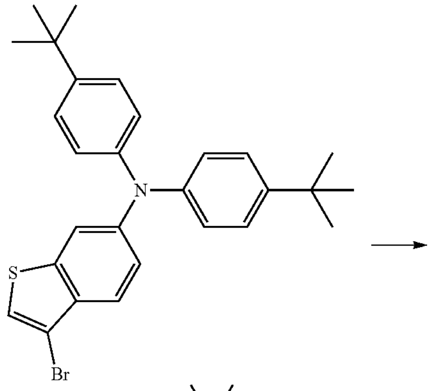

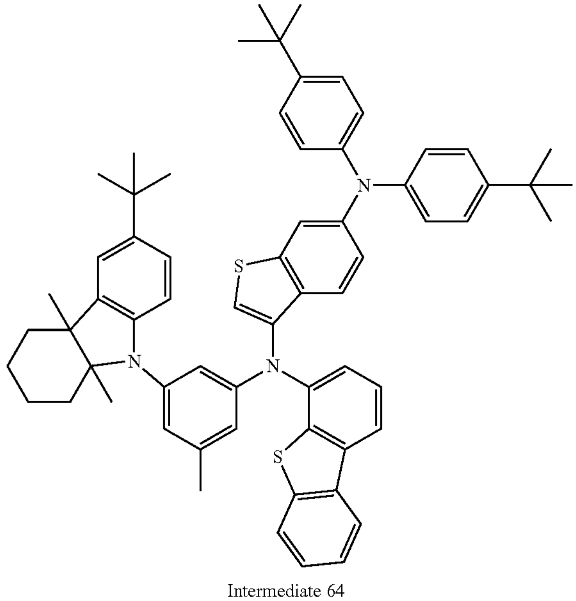

Intermediate 64

A reaction was conducted using the same materials and equivalents and the same synthesis method as the synthesis process of Intermediate 62 using Intermediate 8 (40 g), dibenzo[b,d]thiophen-4-amine instead of dibenzo[b,d]furan-4-amine, and 3-bromo-N,N-bis(4-(tert-butyl)phenyl)benzo[b]-thiophen-6-amine instead of 3-bromo-5,5,8,8-tetramethyl-5,6,7,8-tetrahydronaphtho[2,3-b]thiophene. The result was column purified to obtain Intermediate 64 (71 g, yield 75%). MS[M+H]+=957

2) Synthesis of Compound 58

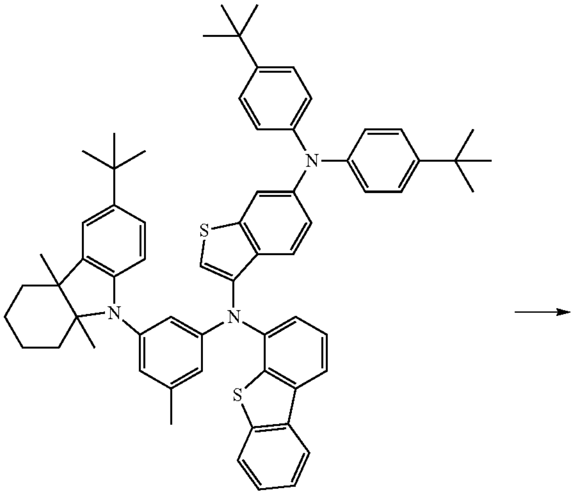

Intermediate 64

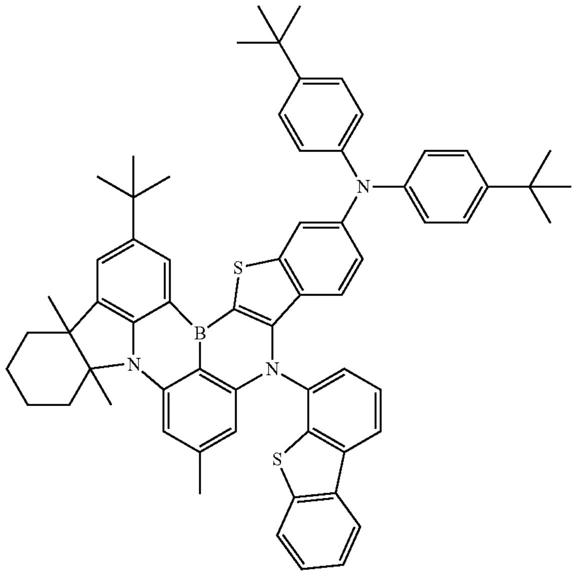

Compound 57

After introducing Intermediate 64 (25 g) and boron triiodide (17.4 g) to 1,2-dichlorobenzene (250 ml) under a nitrogen atmosphere, the mixture was stirred for 4 hours at 160° C. After the reaction was finished, the result was extracted and then recrystallized to obtain Compound 57 (7.4 g, yield 29%). MS[M+H]+=965

Synthesis Example 58. Synthesis of Compound 59

1) Synthesis of Intermediate 65

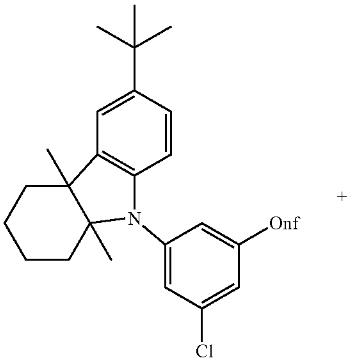

Intermediate 28

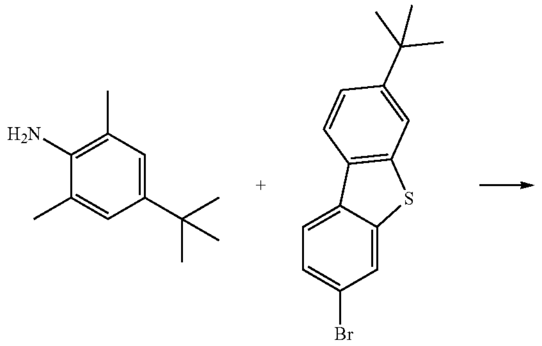

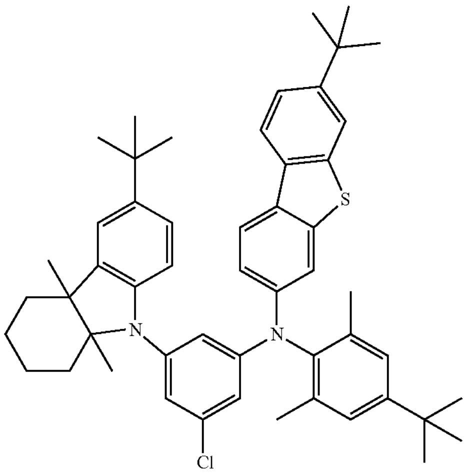

Intermediate 65

After introducing Intermediate 28 (40 g), 4-(tert-butyl)-2,6-dimethylaniline (10.6 g), pd(dba)$_2$ (1.03 g), Xphos (1.72 g) and cesium carbonate (58.7 g) to xylene (500 ml) under a nitrogen atmosphere, the mixture was stirred for 24 hours under reflux. After checking the progress of the reaction, 3-bromo-7-(tert-butyl)dibenzo[b,d]thiophene (19.2 g) was introduced thereto, and the result was stirred for 6 hours under reflux. After that, the result was extracted and then column purified to obtain Intermediate 65 (33 g, yield 70%). MS[M+H]+=783

2) Synthesis of Intermediate 66

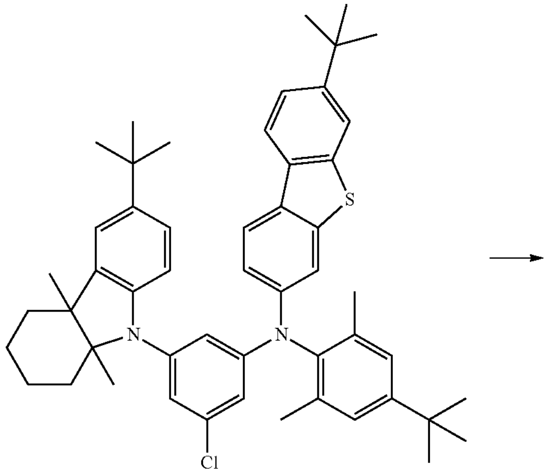

Intermediate 65

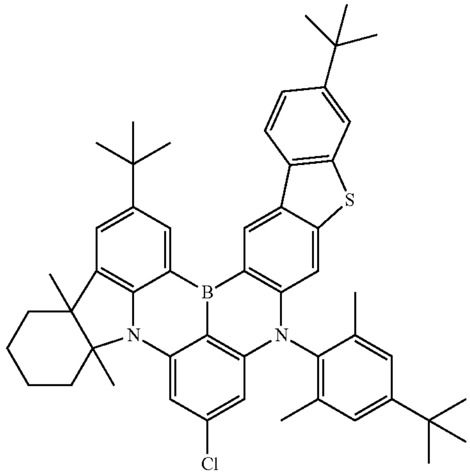

Intermediate 66

After introducing Intermediate 65 (25 g) and boron triiodide (21.3 g) to 1,2-dichlorobenzene (250 ml), the mixture was stirred for 4 hours at 160° C. After the reaction was finished, the result was extracted and then recrystallized to obtain Intermediate 66 (7.8 g, yield 31%). MS[M+H]+=791

3) Synthesis of Compound 59

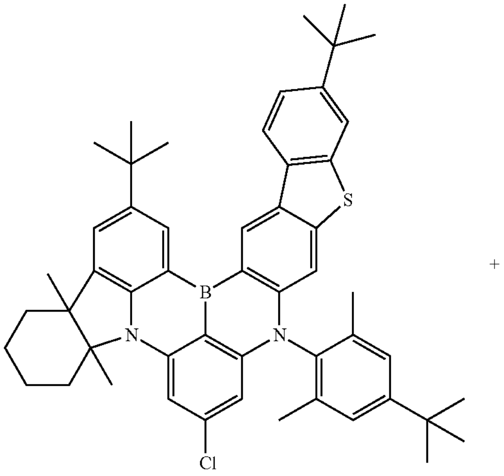

Intermediate 66

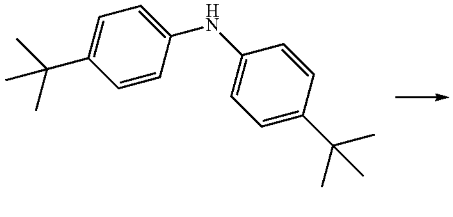

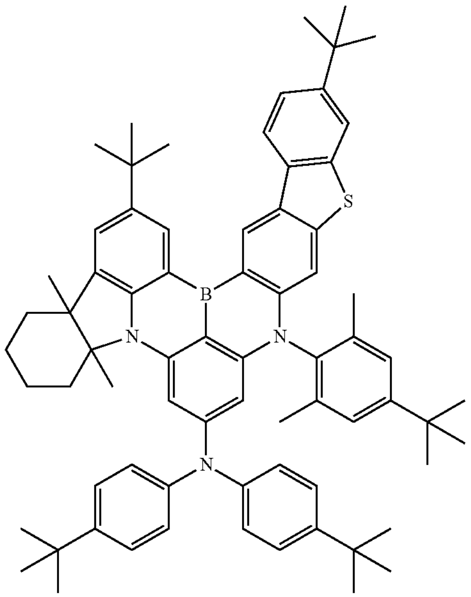

Compound 59

After introducing Intermediate 66 (7 g), bis(4-(tert-butyl)phenyl)amine (2.6 g), sodium-tert-butoxide (1.8 g) and bis(tri-tert-butylphosphine)palladium(0) (0.05 g) to xylene (80 ml), the mixture was stirred for 5 hours under reflux. After the reaction was finished, the result was extracted and then recrystallized to obtain Compound 59 (7.2 g, yield 78%). MS[M+H]+=1035

Synthesis Example 60. Synthesis of Compound 60

1) Synthesis of Intermediate 67

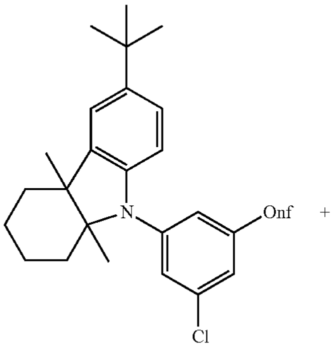

Intermediate 28

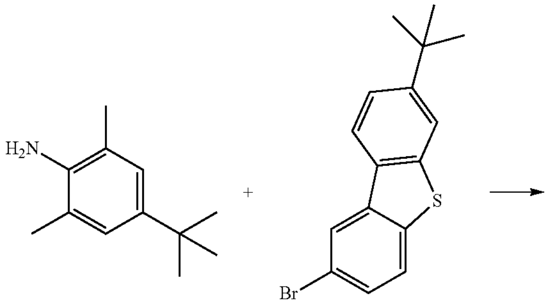

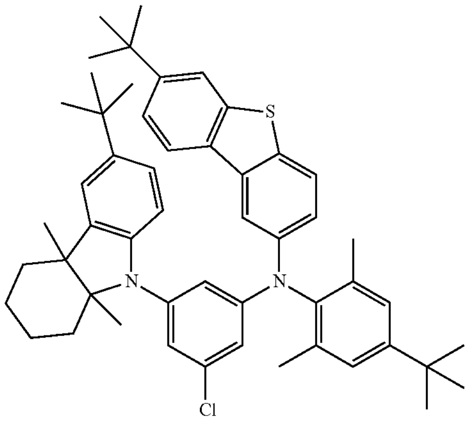

Intermediate 67

After introducing Intermediate 28 (40 g), 4-(tert-butyl)-2,6-dimethylaniline (10.6 g), pd(dba)$_2$ (1.03 g), Xphos (1.72 g) and cesium carbonate (58.7 g) to xylene (500 ml) under a nitrogen atmosphere, the mixture was stirred for 24 hours under reflux. After checking the progress of the reaction, 2-bromo-7-(tert-butyl)dibenzo[b,d]thiophene (19.2 g) was introduced thereto, and the result was stirred for 6 hours under reflux. After that, the result was extracted and then column purified to obtain Intermediate 67 (35 g, yield 71%). MS[M+H]+=783

2) Synthesis of Intermediate 68

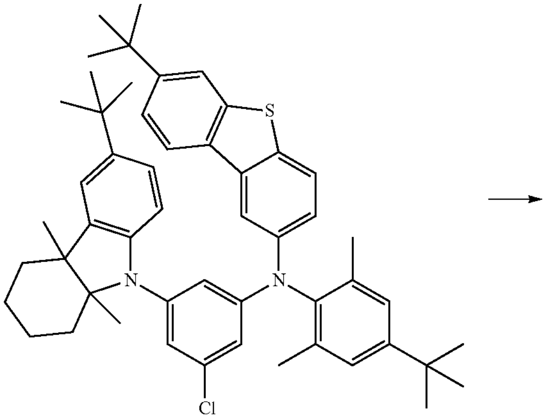

Intermediate 67

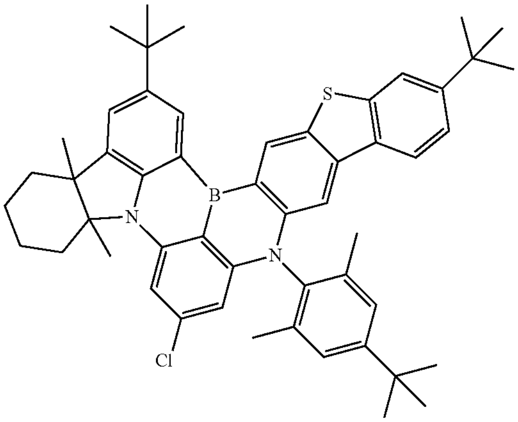

Intermediate 68

After introducing Intermediate 67 (25 g) and boron triiodide (21.3 g) to 1,2-dichlorobenzene (250 ml), the mixture was stirred for 4 hours at 160° C. After the reaction was finished, the result was extracted and then recrystallized to obtain Intermediate 68 (7.7 g, yield 31%). MS[M+H]+=791

3) Synthesis of Compound 60

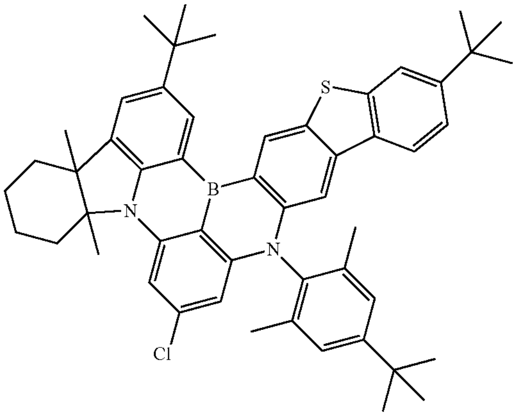

Intermediate 68

+

-continued

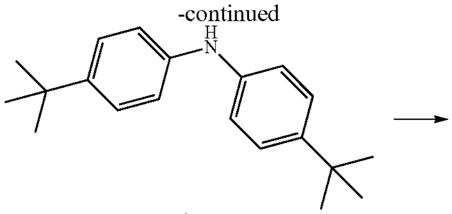

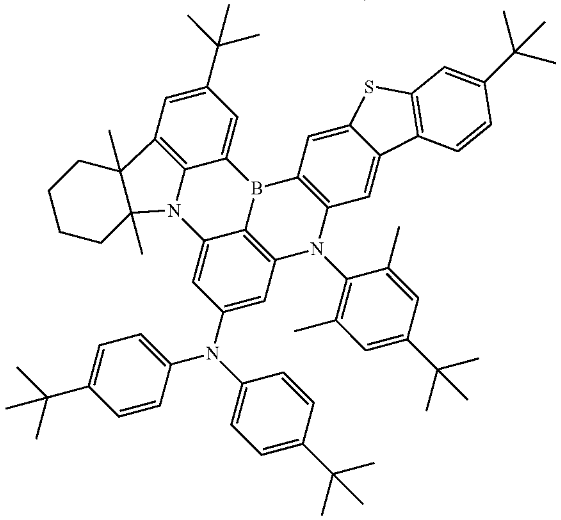

Compound 60

After introducing Intermediate 68 (7 g), bis(4-(tert-butyl) phenyl)amine (2.6 g), sodium-tert-butoxide (1.8 g) and bis(tri-tert-butylphosphine)palladium(0) (0.05 g) to xylene (80 ml), the mixture was stirred for 5 hours under reflux. After the reaction was finished, the result was extracted and then recrystallized to obtain Compound 60 (7.3 g, yield 79%). MS[M+H]+=1035

Synthesis Example 61. Synthesis of Compound 61

1) Synthesis of Intermediate 69

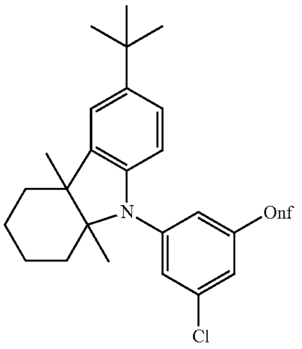

Intermediate 28

+

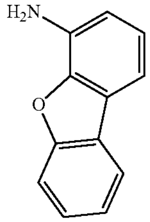

+

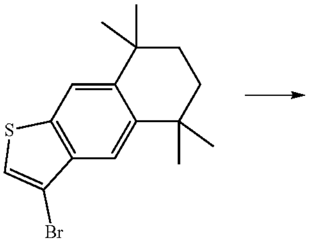

-continued

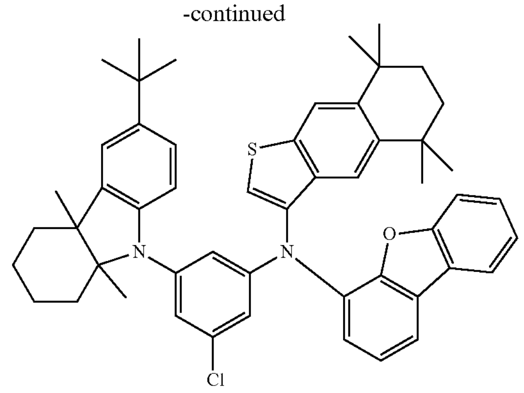

Intermediate 69

After introducing Intermediate 28 (40 g), dibenzo[b,d]furan-4-amine (11.0 g), pd(dba)$_2$ (1.03 g), Xphos (1.72 g) and cesium carbonate (58.7 g) to xylene (500 ml) under a nitrogen atmosphere, the mixture was stirred for 24 hours under reflux. After checking the progress of the reaction, 3-bromo-5,5,8,8-tetramethyl-5,6,7,8-tetrahydronaphtho[2,3-b]thiophene (19.5 g) was introduced thereto, and the result was stirred for 6 hours under reflux. After that, the result was extracted and then column purified to obtain Intermediate 69 (34 g, yield 72%). MS[M+H]+=792

2) Synthesis of Intermediate 70

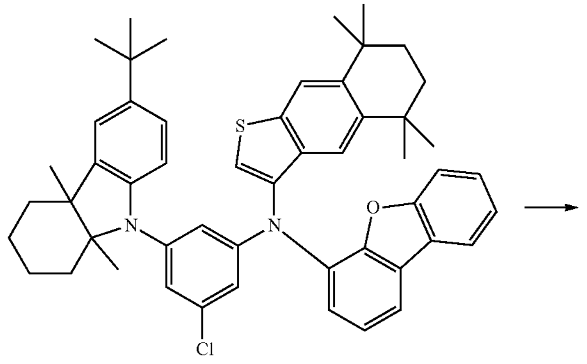

Intermediate 67

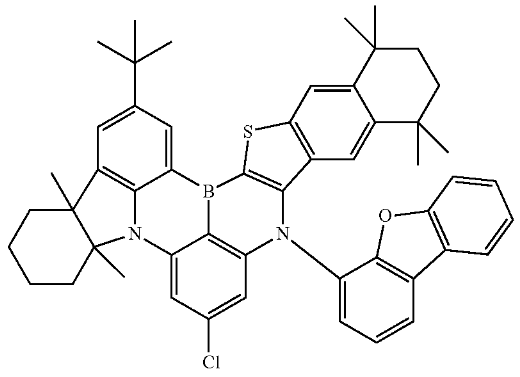

Intermediate 70

After introducing Intermediate 67 (25 g) and boron triiodide (21.1 g) to 1,2-dichlorobenzene (250 ml), the mixture was stirred for 4 hours at 160° C. After the reaction was finished, the result was extracted and then recrystallized to obtain Intermediate 70 (7.6 g, yield 31%). MS[M+H]+=780

3) Synthesis of Compound 61

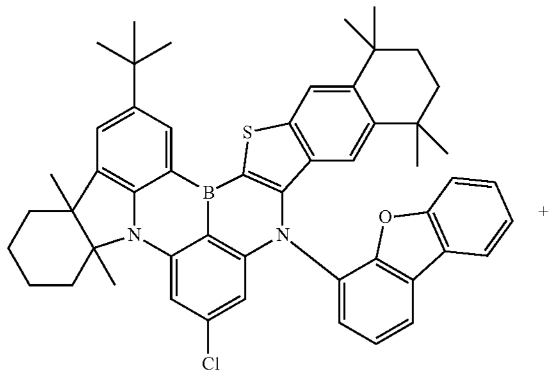

Intermediate 70

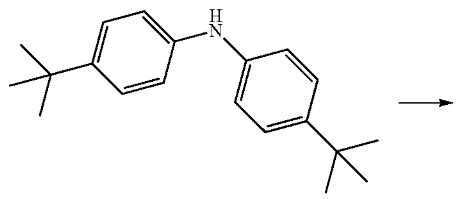

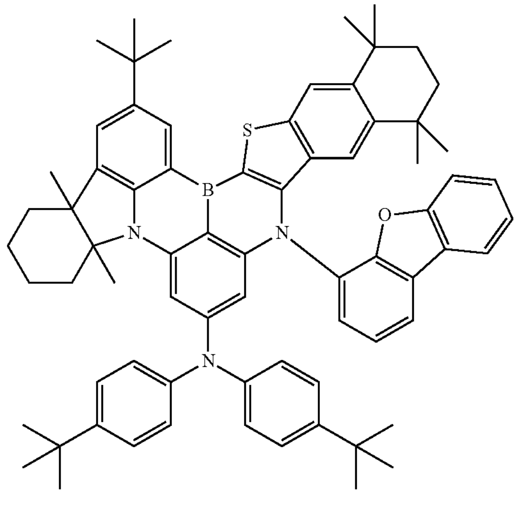

Compound 61

After introducing Intermediate 70 (7 g), bis(4-(tert-butyl)phenyl)amine (2.6 g), sodium-tert-butoxide (1.8 g) and bis(tri-tert-butylphosphine)palladium(0) (0.05 g) to xylene (80 ml), the mixture was stirred for 5 hours under reflux. After the reaction was finished, the result was extracted and then recrystallized to obtain Compound 61 (7.3 g, yield 78%). MS[M+H]+=1045

Synthesis Example 62. Synthesis of Compound 62

1) Synthesis of Intermediate 71

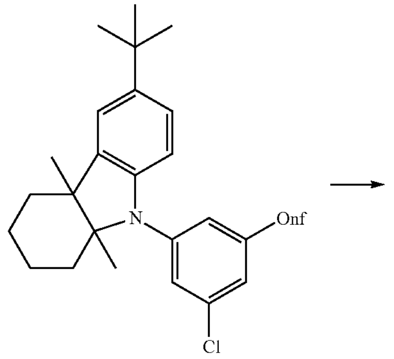

Intermediate 28

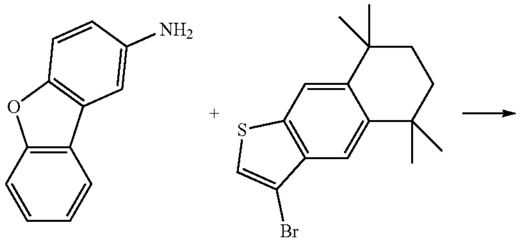

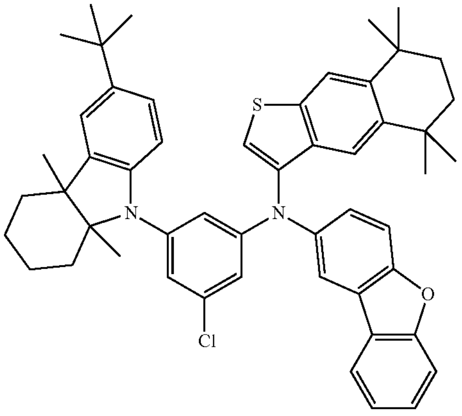

Intermediate 71

After introducing Intermediate 28 (40 g), dibenzo[b,d]furan-2-amine (11.0 g), pd(dba)$_2$ (1.03 g), Xphos (1.72 g) and cesium carbonate (58.7 g) to xylene (500 ml) under a nitrogen atmosphere, the mixture was stirred for 24 hours under reflux. After checking the progress of the reaction, 3-bromo-5,5,8,8-tetramethyl-5,6,7,8-tetrahydro-naphtho[2,3-b]-thiophene (19.5 g) was introduced thereto, and the result was stirred for 6 hours under reflux. After that, the result was extracted and then column purified to obtain Intermediate 71 (36 g, yield 73%). MS[M+H]+=792

2) Synthesis of Intermediate 72

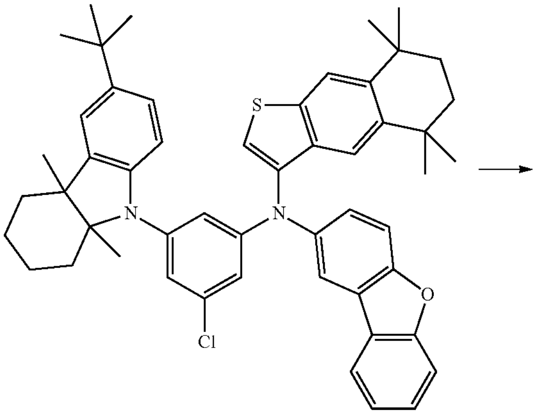

Intermediate 71

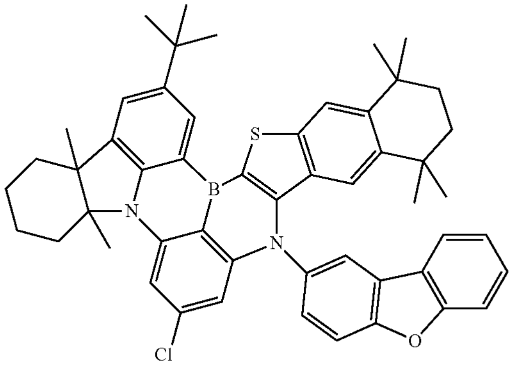

Intermediate 72

After introducing Intermediate 71 (25 g) and boron triiodide (21.1 g) to 1,2-dichlorobenzene (250 ml), the mixture was stirred for 4 hours at 160° C. After the reaction was finished, the result was extracted and then recrystallized to obtain Intermediate 72 (7.3 g, yield 30%). MS[M+H]+=780

3) Synthesis of Compound 62

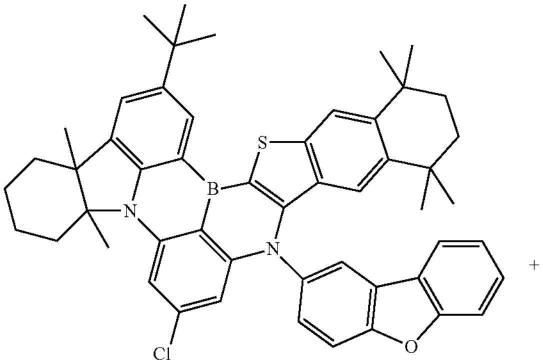

Intermediate 72

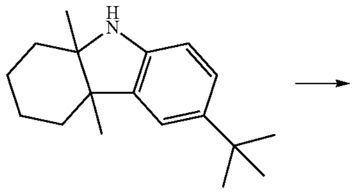

-continued

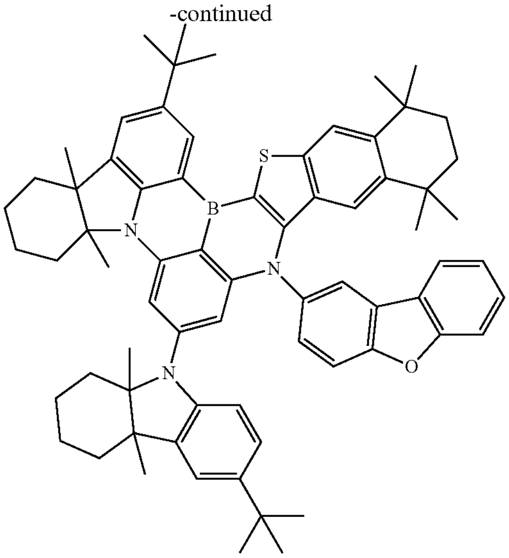

Compound 62

After introducing Intermediate 72 (7 g), 6-(tert-butyl)-4a, 9a-dimethyl-2,3,4,4a,9,9a-hexahydro-1H-carbazole (2.3 g), sodium-tert-butoxide (1.8 g) and bis(tri-tert-butylphosphine) palladium(0) (0.05 g) to xylene (80 ml), the mixture was stirred for 5 hours under reflux. After the reaction was finished, the result was extracted and then recrystallized to obtain Compound 62 (7.7 g, yield 84%). MS[M+H]+=1021

Synthesis Example 63. Synthesis of Compound 63

1) Synthesis of Intermediate 73

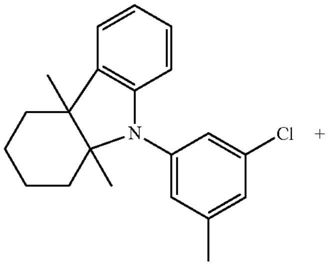

Intermediate 1

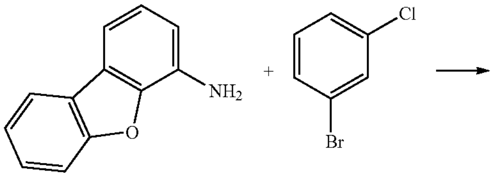

-continued

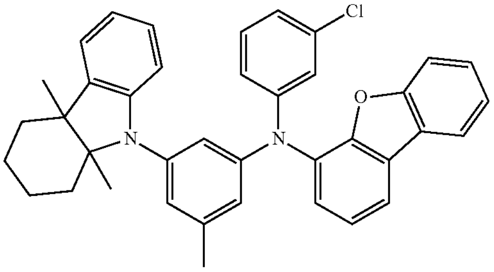

Intermediate 73

After introducing Intermediate 1 (40 g), dibenzo[b,d]furan-4-amine (22.5 g), sodium-tert-butoxide (35.4 g) and bis(tri-tert-butylphosphine)palladium(0) (0.62 g) to toluene (600 ml) under a nitrogen atmosphere, the mixture was refluxed for 1 hour, and, after checking the progress of the reaction, 1-bromo-3-chlorobenzene (23.5 g) was introduced thereto during the reflux reaction, and the result was further refluxed for 1 hour. After the reaction was finished, the result was extracted and then column purified to obtain Intermediate 73 (55 g, yield 77%). MS[M+H]+=584

2) Synthesis of Intermediate 74

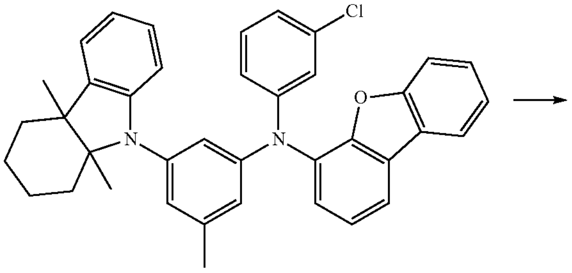

Intermediate 73

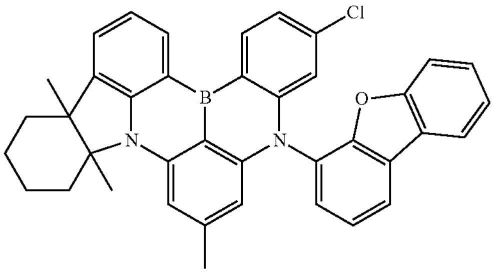

Intermediate 74

After introducing Intermediate 73 (25 g) and boron triiodide (28.5 g) to 1,2-dichlorobenzene (250 ml), the mixture was stirred for 4 hours at 160° C. After the reaction was finished, the result was extracted and then recrystallized to obtain Intermediate 74 (7.6 g, yield 30%). MS[M+H]+=592

3) Synthesis of Compound 63

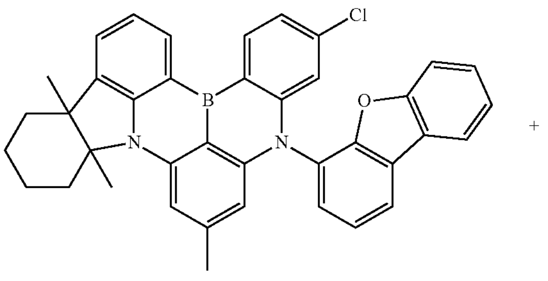

Intermediate 74

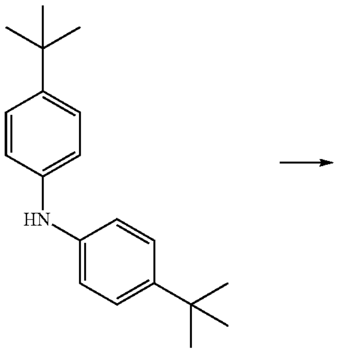

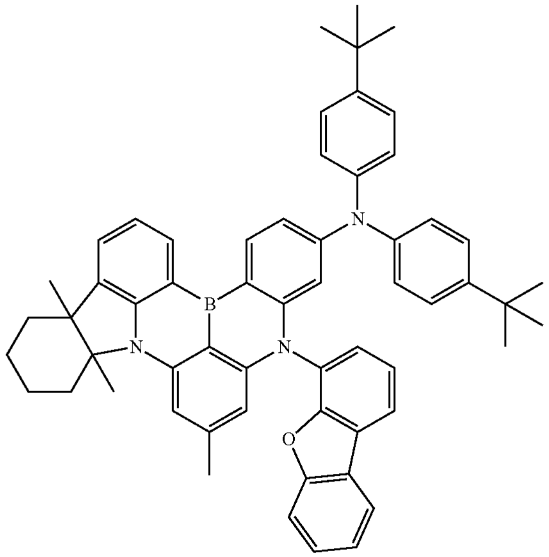

Compound 63

After introducing Intermediate 74 (7 g), bis(4-(tert-butyl)phenyl)amine (3.4 g), sodium-tert-butoxide (2.3 g) and bis(tri-tert-butylphosphine)palladium(0) (0.06 g) to xylene (80 ml), the mixture was stirred for 5 hours under reflux. After the reaction was finished, the result was extracted and then recrystallized to obtain Compound 63 (7.4 g, yield 75%). MS[M+H]+=837

Synthesis Example 64. Synthesis of Compound 64

1) Synthesis of Intermediate 75

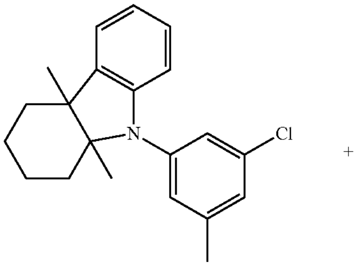

Intermediate 1

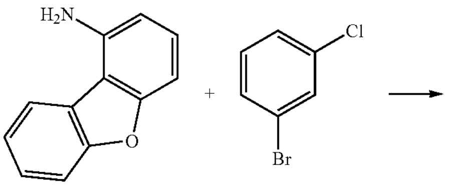

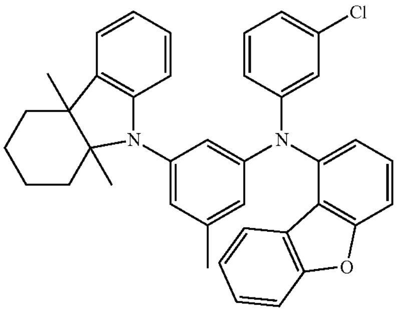

Intermediate 75

After introducing Intermediate 1 (40 g), dibenzo[b,d]furan-1-amine (22.5 g), sodium-tert-butoxide (35.4 g) and bis(tri-tert-butylphosphine)palladium(0) (0.62 g) to toluene (600 ml) under a nitrogen atmosphere, the mixture was refluxed for 1 hour, and, after checking the progress of the reaction, 1-bromo-3-chlorobenzene (23.5 g) was introduced thereto during the reflux reaction, and the result was further refluxed for 1 hour. After the reaction was finished, the result was extracted and then column purified to obtain Intermediate 75 (58 g, yield 79%). MS[M+H]+=584

2) Synthesis of Intermediate 76

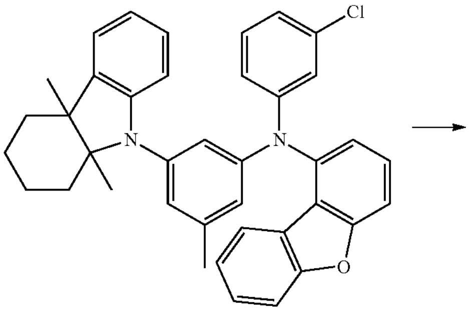

Intermediate 75

-continued

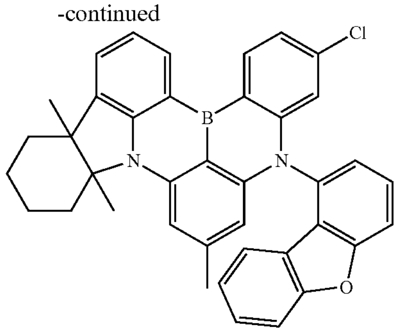

Intermediate 76

After introducing Intermediate 75 (25 g) and boron triiodide (28.5 g) to 1,2-dichlorobenzene (250 ml), the mixture was stirred for 4 hours at 160° C. After the reaction was finished, the result was extracted and then recrystallized to obtain Intermediate 76 (7.5 g, yield 29%). MS[M+H]+=592

3) Synthesis of Compound 64

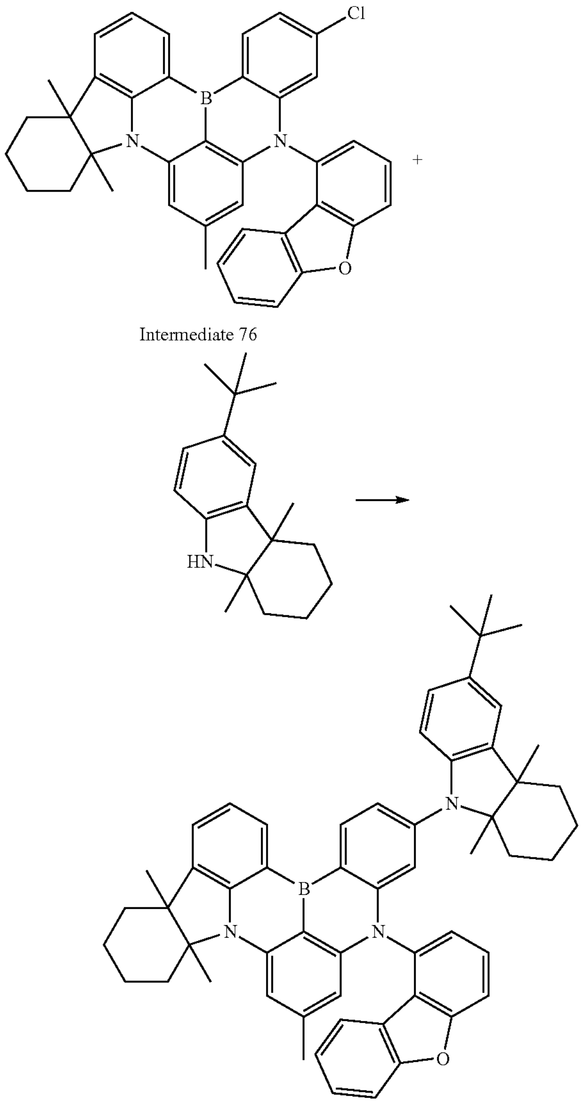

Intermediate 76

Compound 64

After introducing Intermediate 76 (7 g), 6-(tert-butyl)-4a,9a-dimethyl-2,3,4,4a,9,9a-hexahydro-1H-carbazole (3.05 g), sodium-tert-butoxide (2.3 g) and bis(tri-tert-butylphosphine)-palladium(0) (0.06 g) to xylene (80 ml), the mixture was stirred for 5 hours under reflux. After the reaction was finished, the result was extracted and then recrystallized to obtain Compound 64 (7.6 g, yield 79%). MS[M+H]+=813

Example 1

A glass substrate on which indium tin oxide (ITO) was coated as a thin film to a thickness of 1,400 Å was placed in distilled water containing dissolved detergent and ultrasonically cleaned. A product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonically cleaned with solvents of isopropyl alcohol, acetone and methanol, then dried, and then transferred to a plasma cleaner. The substrate was cleaned for 5 minutes using oxygen plasma, and then transferred to a vacuum deposition apparatus.

On the transparent ITO electrode prepared as above, the following compounds HI-A and LG-101 were thermal vacuum deposited to thicknesses of 650 Å and 50 Å, respectively, to form a hole injection layer. A hole transfer layer was formed on the hole injection layer by vacuum depositing the following compound HT-A to a thickness of 600 Å. On the hole transfer layer, an electron blocking layer was formed by vacuum depositing the following compound HT-B to a thickness of 50 Å. Subsequently, a light emitting layer was formed on the electron blocking layer by vacuum depositing the following compound BD (Compound 1) as a blue light emitting dopant in 2 parts by weight with respect to 100 parts by weight of the light emitting layer, and the following compound BH as a host to a thickness of 200 Å. Then, on the light emitting layer, the following compound ET-A was vacuum deposited to 50 Å as a first electron transfer layer, and subsequently, the following compounds ET-B and LiQ were vacuum deposited in a weight ratio of 1:1 to a thickness of 360 Å to form a second electron transfer layer. An electron injection layer was formed on the second electron transfer layer by vacuum depositing compound LiQ to a thickness of 5 Å. On the electron injection layer, a cathode was formed by depositing aluminum and silver in a weight ratio of 10:1 to a thickness of 220 Å, and then depositing aluminum thereon to a thickness of 1000 Å.

In the above-described process, the deposition rates of the organic materials were maintained at 0.4 Å/sec to 0.9 Å/sec, the deposition rate of the aluminum of the cathode was maintained at 2 Å/sec, and the degree of vacuum during the deposition was maintained at $5\times10^{-8}$ torr to $1\times10^{-7}$ torr, and as a result, an organic light emitting device was manufactured.

-continued
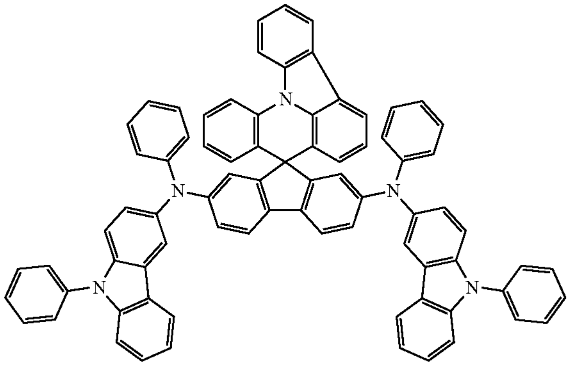
HI-A
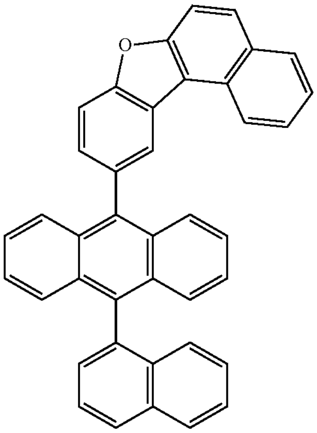
BH
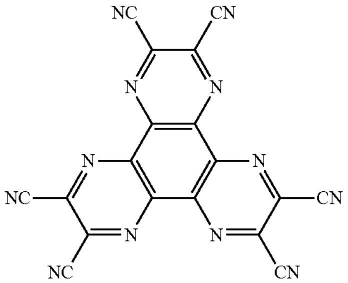
LG-101
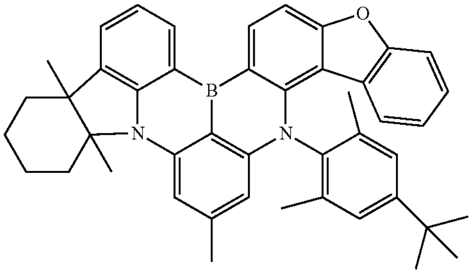
BD
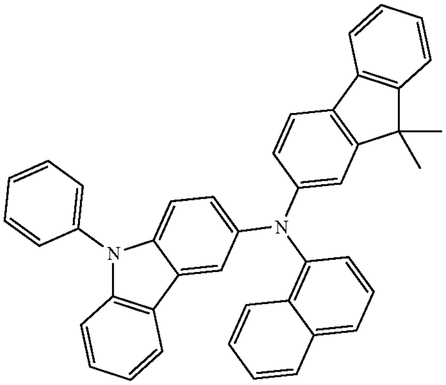
HT-A
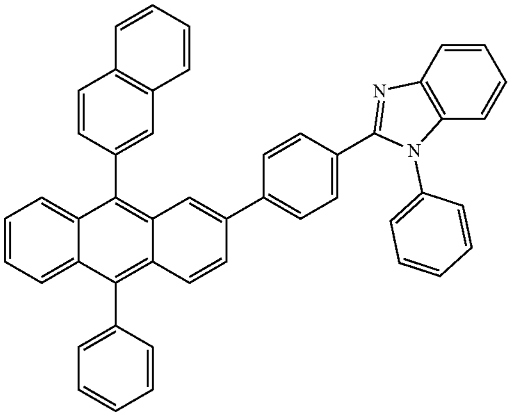
ET-A
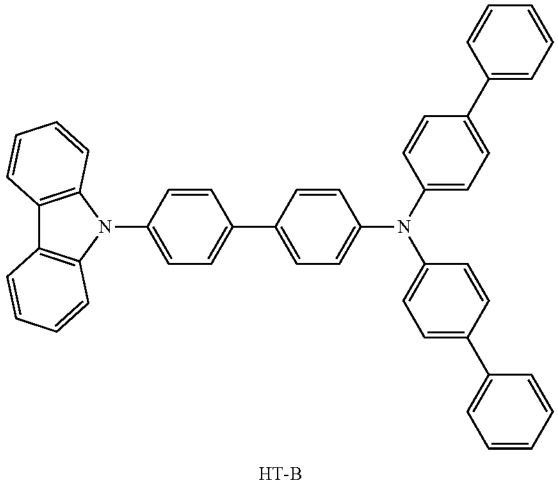
HT-B
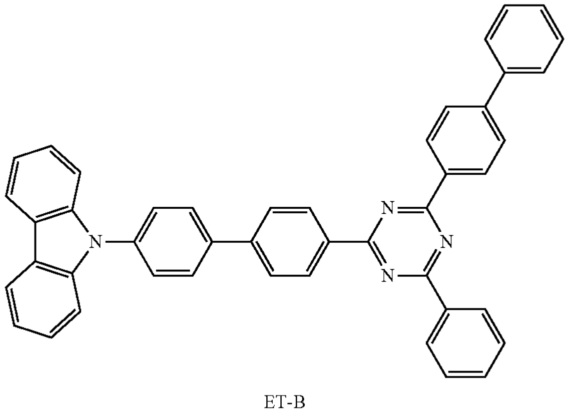
ET-B -continued

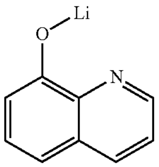

LiQ

Examples 2 to 64, and Comparative Example 1 to Comparative Example 4

Organic light emitting devices were manufactured in the same manner as in Example 1 except that compounds of the following Table 1 were used instead of Compound 1. For each of the organic light emitting devices manufactured in Examples 2 to 64, and Comparative Example 1 to Comparative Example 4, efficiency, lifetime and color coordinate (based on 1931 CIE color coordinate) at current density of 10 mA/cm$^2$ were measured, and the results are shown in the following Table 1.

[Comparative Compound 1]

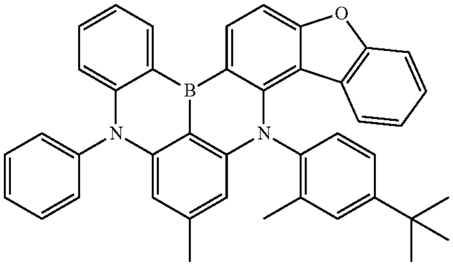

[Comparative Compound 2]

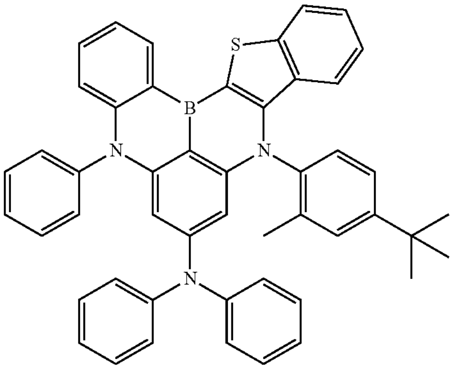

[Comparative Compound 3]

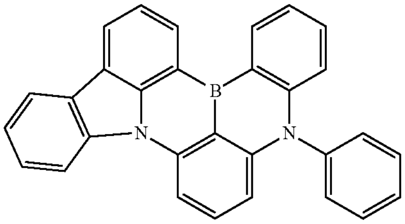

-continued

[Comparative Compound 4]

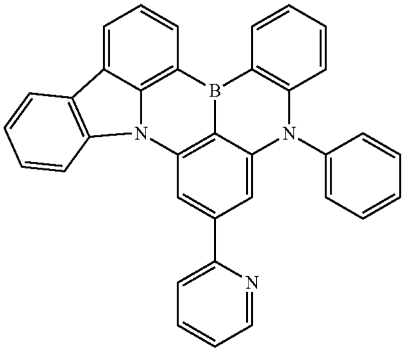

TABLE 1

| Material | Efficiency (cd/A) | Color Coordinate CIE (x) | CIE (y) | Lifetime T95 (hr) |
|---|---|---|---|---|
| Example 1 (Compound 1) | 7.52 | 0.16 | 0.04 | 215 |
| Example 2 (Compound 2) | 7.43 | 0.16 | 0.04 | 214 |
| Example 3 (Compound 3) | 7.45 | 0.16 | 0.04 | 213 |
| Example 4 (Compound 4) | 7.51 | 0.16 | 0.03 | 217 |
| Example 5 (Compound 5) | 7.53 | 0.16 | 0.03 | 218 |
| Example 6 (Compound 6) | 7.55 | 0.16 | 0.03 | 216 |
| Example 7 (Compound 7) | 7.61 | 0.16 | 0.04 | 211 |
| Example 8 (Compound 8) | 7.63 | 0.16 | 0.04 | 216 |
| Example 9 (Compound 9) | 7.67 | 0.16 | 0.04 | 217 |
| Example 10 (Compound 10) | 7.66 | 0.16 | 0.04 | 217 |
| Example 11 (Compound 11) | 7.65 | 0.15 | 0.06 | 210 |
| Example 12 (Compound 12) | 7.71 | 0.15 | 0.06 | 225 |
| Example 13 (Compound 13) | 7.76 | 0.15 | 0.06 | 221 |
| Example 14 (Compound 14) | 7.74 | 0.15 | 0.05 | 224 |
| Example 15 (Compound 15) | 7.75 | 0.15 | 0.05 | 225 |
| Example 16 (Compound 16) | 7.86 | 0.15 | 0.06 | 227 |
| Example 17 (Compound 17) | 7.83 | 0.15 | 0.06 | 225 |
| Example 18 (Compound 18) | 7.75 | 0.15 | 0.06 | 223 |
| Example 19 (Compound 19) | 7.84 | 0.15 | 0.05 | 225 |
| Example 20 (Compound 20) | 7.85 | 0.15 | 0.05 | 224 |
| Example 21 (Compound 21) | 7.81 | 0.15 | 0.06 | 225 |
| Example 22 (Compound 22) | 7.84 | 0.15 | 0.06 | 224 |
| Example 23 (Compound 23) | 7.85 | 0.15 | 0.05 | 225 |
| Example 24 (Compound 24) | 7.86 | 0.15 | 0.06 | 220 |
| Example 25 (Compound 25) | 7.91 | 0.15 | 0.06 | 225 |
| Example 26 (Compound 26) | 7.93 | 0.15 | 0.05 | 223 |
| Example 27 (Compound 27) | 7.91 | 0.15 | 0.05 | 224 |
| Example 28 (Compound 28) | 7.94 | 0.15 | 0.06 | 225 |
| Example 29 (Compound 29) | 7.96 | 0.15 | 0.06 | 224 |
| Example 30 (Compound 30) | 7.95 | 0.15 | 0.05 | 223 |
| Example 31 (Compound 31) | 8.11 | 0.14 | 0.06 | 227 |
| Example 32 (Compound 32) | 8.15 | 0.14 | 0.06 | 226 |
| Example 33 (Compound 33) | 8.14 | 0.14 | 0.05 | 227 |
| Example 34 (Compound 34) | 8.16 | 0.14 | 0.05 | 229 |
| Example 35 (Compound 35) | 8.24 | 0.14 | 0.06 | 226 |
| Example 36 (Compound 36) | 8.22 | 0.14 | 0.06 | 225 |
| Example 37 (Compound 37) | 8.24 | 0.14 | 0.05 | 226 |
| Example 38 (Compound 38) | 8.23 | 0.14 | 0.05 | 226 |
| Example 39 (Compound 39) | 8.25 | 0.14 | 0.06 | 227 |
| Example 40 (Compound 40) | 8.24 | 0.14 | 0.05 | 227 |
| Example 41 (Compound 41) | 8.24 | 0.14 | 0.06 | 226 |
| Example 42 (Compound 42) | 8.26 | 0.14 | 0.05 | 228 |
| Example 43 (Compound 43) | 8.22 | 0.14 | 0.06 | 226 |
| Example 44 (Compound 44) | 8.23 | 0.14 | 0.05 | 225 |
| Example 45 (Compound 45) | 8.33 | 0.14 | 0.06 | 226 |
| Example 46 (Compound 46) | 8.34 | 0.14 | 0.05 | 225 |
| Example 47 (Compound 47) | 8.34 | 0.14 | 0.06 | 226 |
| Example 48 (Compound 48) | 8.35 | 0.14 | 0.05 | 225 |
| Example 49 (Compound 49) | 8.05 | 0.15 | 0.05 | 225 |
| Example 50 (Compound 50) | 8.07 | 0.15 | 0.05 | 226 |
| Example 51 (Compound 51) | 8.14 | 0.14 | 0.06 | 225 |
| Example 52 (Compound 52) | 8.13 | 0.14 | 0.06 | 225 |

TABLE 1-continued

| Material | Efficiency (cd/A) | Color Coordinate CIE (x) | Color Coordinate CIE (y) | Lifetime T95 (hr) |
|---|---|---|---|---|
| Example 53 (Compound 53) | 8.15 | 0.14 | 0.06 | 226 |
| Example 54 (Compound 54) | 8.25 | 0.14 | 0.06 | 227 |
| Example 55 (Compound 55) | 8.12 | 0.15 | 0.05 | 225 |
| Example 56 (Compound 56) | 8.17 | 0.15 | 0.06 | 225 |
| Example 57 (Compound 57) | 8.25 | 0.15 | 0.06 | 227 |
| Example 58 (Compound 58) | 8.16 | 0.16 | 0.05 | 227 |
| Example 59 (Compound 59) | 7.95 | 0.15 | 0.06 | 221 |
| Example 60 (Compound 60) | 7.94 | 0.15 | 0.06 | 223 |
| Example 61 (Compound 61) | 8.25 | 0.15 | 0.06 | 228 |
| Example 62 (Compound 62) | 8.23 | 0.15 | 0.06 | 225 |
| Example 63 (Compound 63) | 8.04 | 0.15 | 0.06 | 219 |
| Example 64 (Compound 64) | 8.08 | 0.15 | 0.06 | 220 |
| Comparative Example 1 (Comparative Compound 1) | 6.8 | 0.15 | 0.04 | 180 |
| Comparative Example 2 (Comparative Compound 2) | 7.1 | 0.14 | 0.06 | 182 |
| Comparative Example 3 (Comparative Compound 3) | 6.9 | 0.18 | 0.13 | 177 |
| Comparative Example 4 (Comparative Compound 4) | 6.6 | 0.18 | 0.15 | 140 |

From Table 1, it was identified that Examples 1 to 64 using the compound of the present application including a non-aromatic pentagonal ring including N in the molecule had significantly superior efficiency and lifetime properties compared to Comparative Compounds 1 to 4.

This is considered to be maximized by the hydrocarbazole tied to the central core and the aromatic and heteroring that is another structure, and efficiency increases by planarity affecting light emission properties. Radicals formed from decomposition by light or current affect formation of other radicals affecting a lifetime, whereas the compound of the present application has smaller effects thereon, which also brings improvements in the lifetime. In addition, it was identified that the material including the aromatic heteroring made the hydrocarbazole and the amine, which primarily have high electron density, to be electron-deficient, and radicals formed by decomposition improved stability from a negative current and increased a lifetime, and efficiency was enhanced by further including a chromophore in the basic structure.

The invention claimed is:

1. A heterocyclic compound of Chemical Formula 1-1 or 1-2:

<Chemical Formula 1-1>

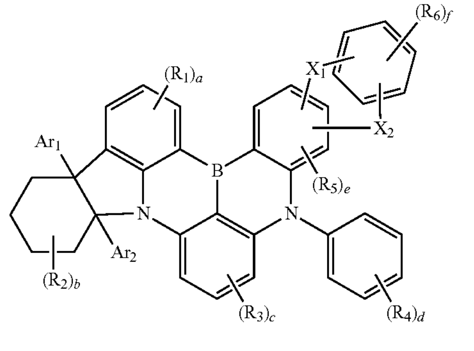

-continued

<Chemical Formula 1-2>

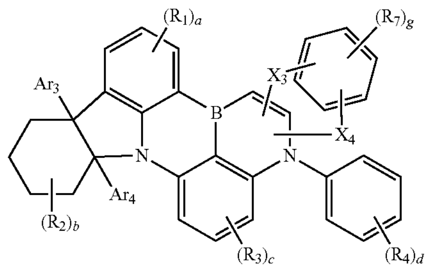

wherein in Chemical Formula 1-1 and Chemical Formula 1-2:

$Ar_1$ to $Ar_4$ are the same as or different from each other, and each independently is hydrogen, deuterium, a halogen group, a substituted or unsubstituted alkyl group, a substituted or unsubstituted cycloalkyl group, a substituted or unsubstituted aryl group, or a substituted or unsubstituted heteroring;

when $X_1$ is a direct bond, $X_2$ is O, S or CRR';

when $X_2$ is a direct bond, $X_1$ is O, S or CRR';

when $X_3$ is a direct bond, $X_4$ is O, S or CRR';

when $X_4$ is a direct bond, $X_3$ is O, S or CRR';

R, R', $R_2$, $R_5$ to $R_7$ are the same as or different from each other, and each independently is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aralkyl group, a substituted or unsubstituted aryl group, a substituted or unsubstituted amine group, or a substituted or unsubstituted heteroring, or adjacent groups bond to each other to form a substituted or unsubstituted aliphatic hydrocarbon ring, a substituted or unsubstituted aromatic ring, a substituted or unsubstituted heteroring, or a substituted or unsubstituted ring having these fused therein;

$R_1$, $R_3$ and $R_4$ are the same as or different from each other, and each independently is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aralkyl group, a substituted or unsubstituted aryl group, a substituted or unsubstituted amine group, or a substituted or unsubstituted heteroring, or adjacent groups bond to each other to form a substituted or unsubstituted ring;

a is an integer of 0 to 3, and when a is 2 or greater, the $R_1$s are the same as or different from each other;

b is an integer of 0 to 8, and when b is 2 or greater, the $R_2$s are the same as or different from each other;

c is an integer of 0 to 3, and when c is 2 or greater, the $R_3$s are the same as or different from each other;

d is an integer of 0 to 5, and when d is 2 or greater, the $R_4$s are the same as or different from each other;

e is an integer of 0 to 2, and when e is 2, the $R_5$s are the same as or different from each other; and f and g are an integer of 0 to 4, and when f is 2 or greater, the $R_6$s are the same as or different from each other, and when g is 2 or greater, the $R_7$s are the same as or different from each other.

2. A heterocyclic compound of any one of the following Chemical Formulae 2-1 to 2-8:

<Chemical Formula 2-1>

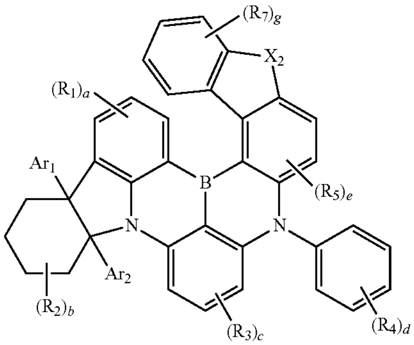

<Chemical Formula 2-2>

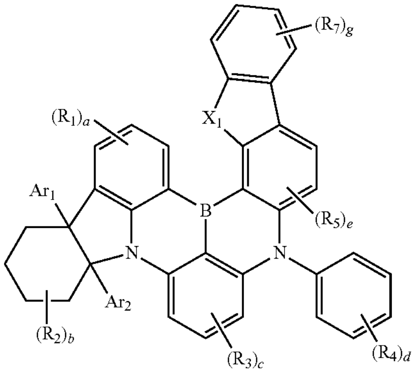

<Chemical Formula 2-3>

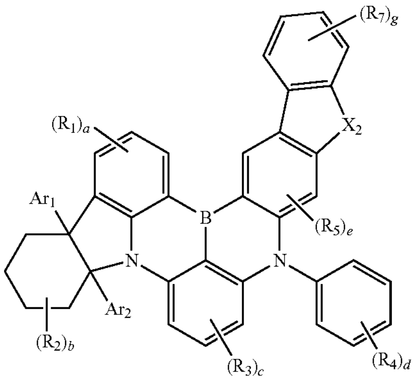

-continued

<Chemical Formula 2-4>

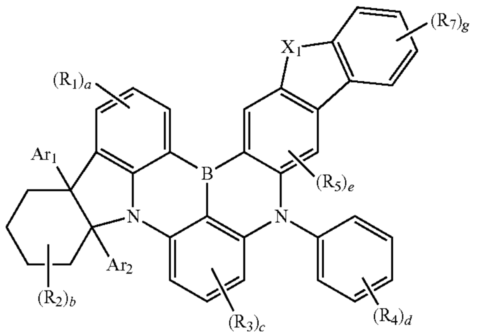

<Chemical Formula 2-5>

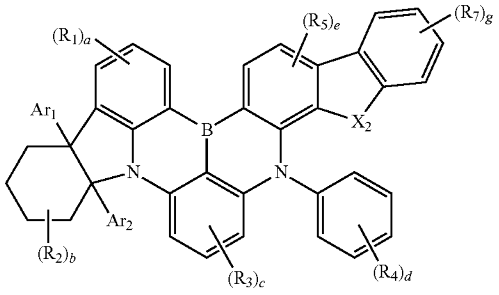

<Chemical Formula 2-6>

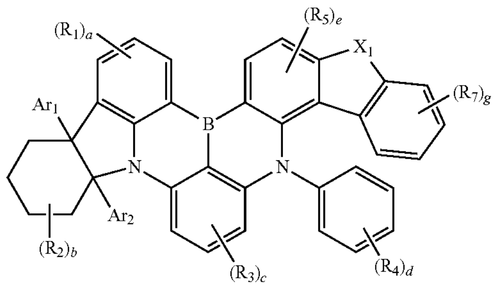

<Chemical Formula 2-7>

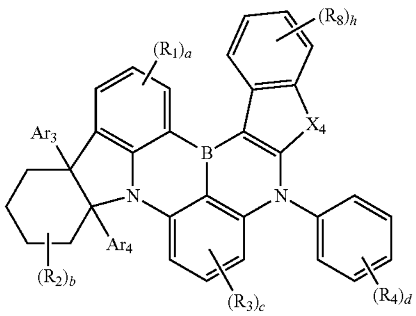

<Chemical Formula 2-8>

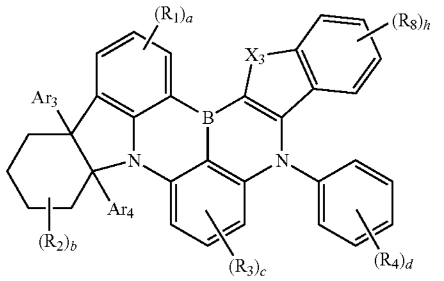

wherein in Chemical Formula 2-1 to Chemical Formula 2-8:

$Ar_1$ to $Ar_4$ are the same as or different from each other, and each independently is hydrogen, deuterium, a halogen group, a substituted or unsubstituted alkyl group, a substituted or unsubstituted cycloalkyl group, a substituted or unsubstituted aryl group, or a substituted or unsubstituted heteroring;

$X_1$ to $X_4$ are the same as or different from each other, and each independently is O, S or CRR';

R, R', $R_2$, $R_5$, $R_7$ and $R_8$ are the same as or different from each other, and each independently is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aralkyl group, a substituted or unsubstituted aryl group, a substituted or unsubstituted amine group, or a substituted or unsubstituted heteroring, or adjacent groups bond to each other to form a substituted or unsubstituted ring;

R1, R3 and R4 are the same as or different from each other, and each independently is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aralkyl group, a substituted or unsubstituted aryl group, a substituted or unsubstituted amine group, or a substituted or unsubstituted heteroring, or adjacent groups bond to each other to form a substituted or unsubstituted ring;

a is an integer of 0 to 3, and when a is 2 or greater, the R1s are the same as or different from each other;

b is an integer of 0 to 8, and when b is 2 or greater, the $R_2$s are the same as or different from each other;

c is an integer of 0 to 3, and when c is 2 or greater, the $R_3$s are the same as or different from each other;

d is an integer of 0 to 5, and when d is 2 or greater, the $R_4$s are the same as or different from each other;

e is an integer of 0 to 2, and when e is 2, the $R_5$s are the same as or different from each other;

g is an integer of 0 to 4, and when g is 2 or greater, the $R_7$s are the same as or different from each other; and h is an integer of 0 to 4, and when h is 2 or greater, the $R_8$s are the same as or different from each other.

3. The heterocyclic compound of claim 1, wherein $R_3$ is hydrogen; a substituted or unsubstituted alkyl group having 1 to 10 carbon atoms; an amine group that is unsubstituted or substituted with an aryl group or a heteroaryl group; a substituted or unsubstituted aryl group having 6 to 30 carbon atoms; or a substituted or unsubstituted heteroring having 3 to 30 carbon atoms.

4. A heterocyclic compound selected from among the following compounds:

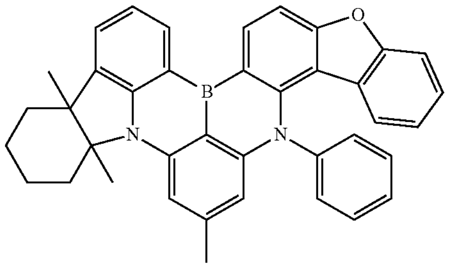

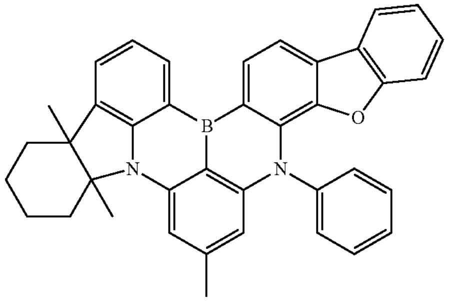

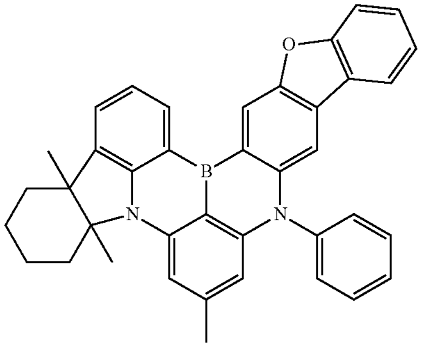

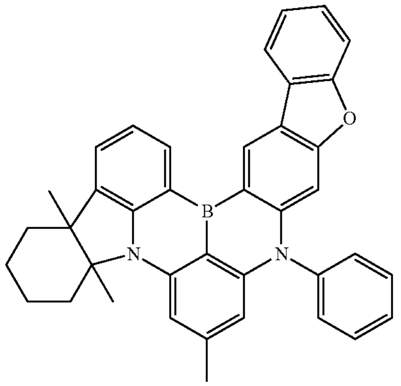

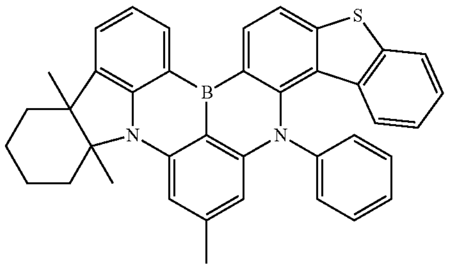

-continued
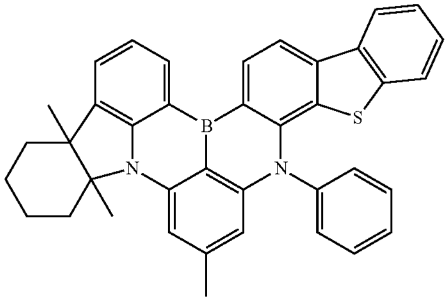
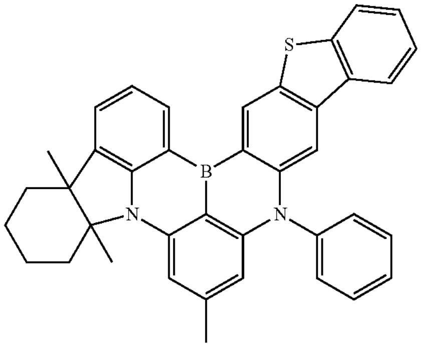
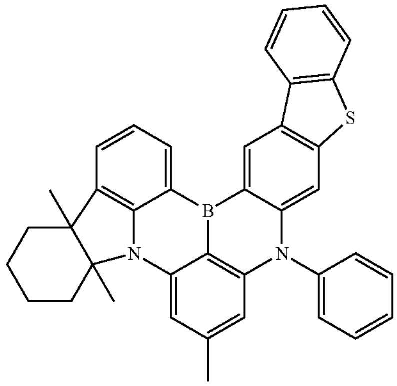
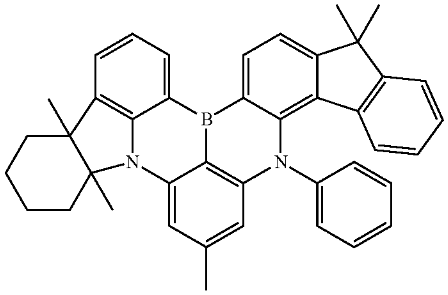
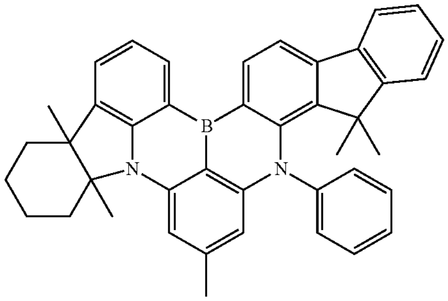
-continued
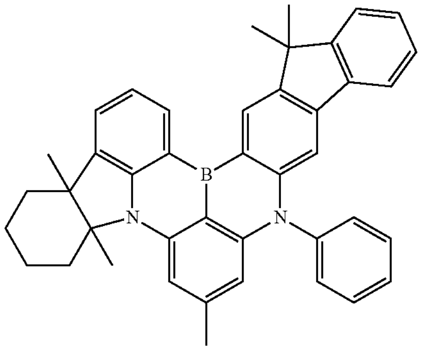
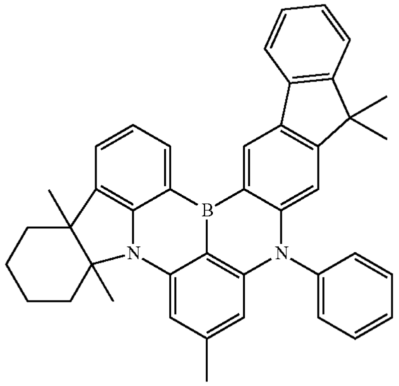
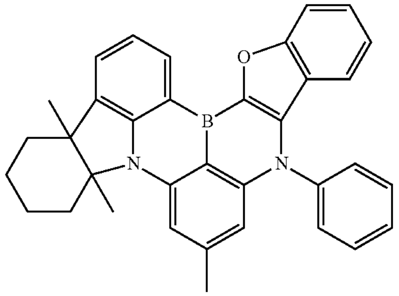
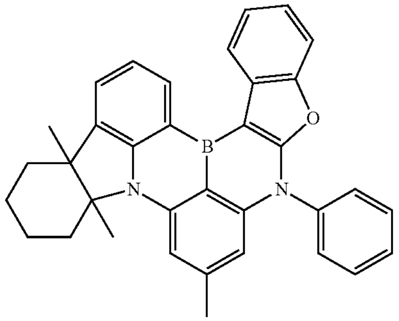

-continued
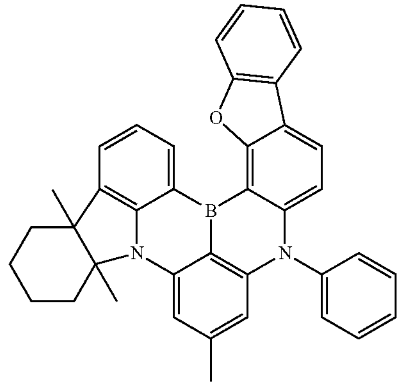
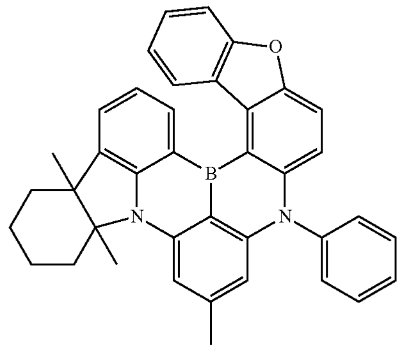
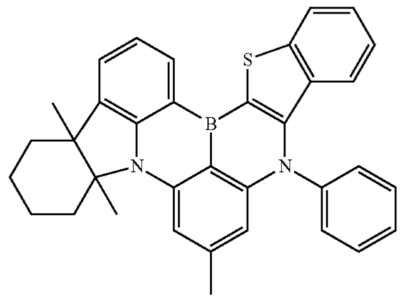
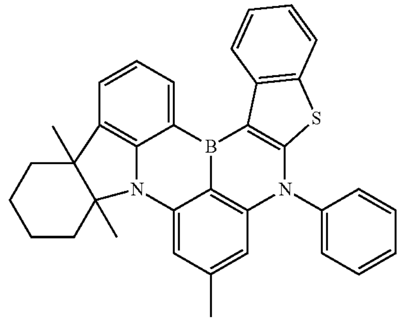
-continued
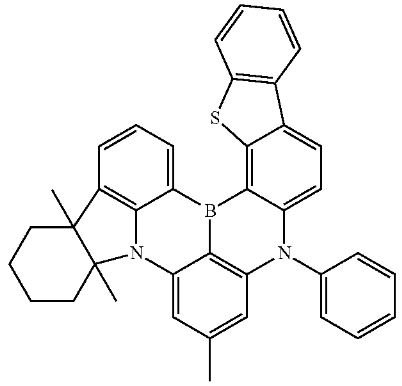
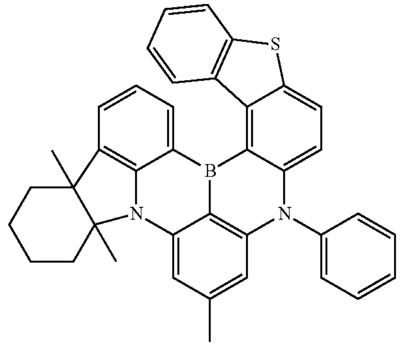
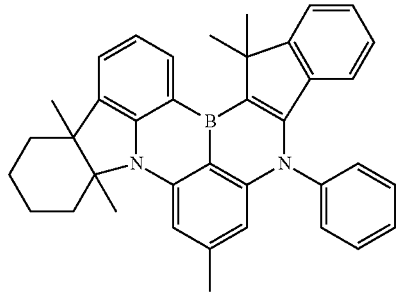
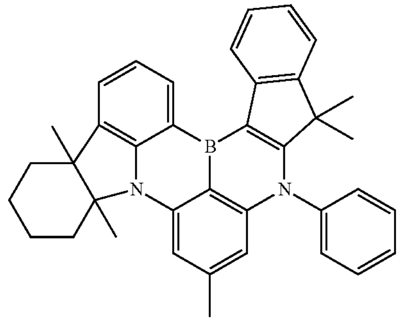

-continued
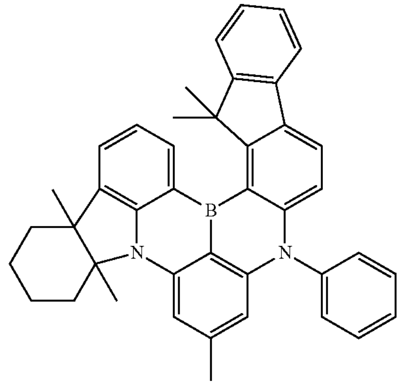
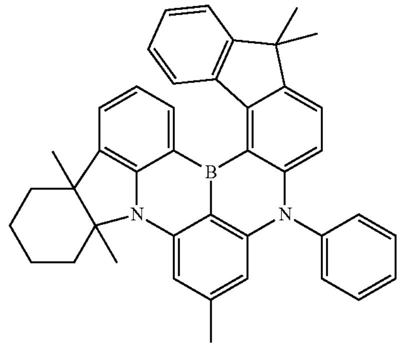
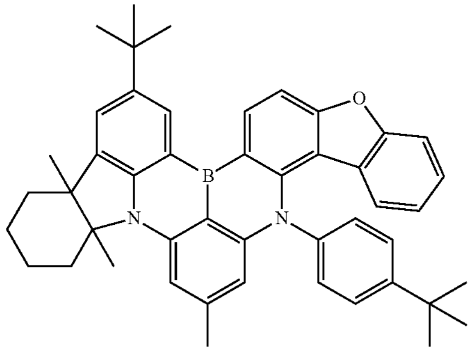
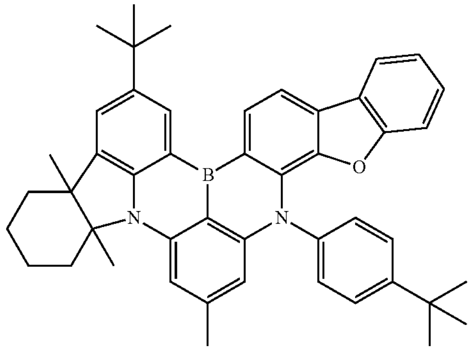
-continued
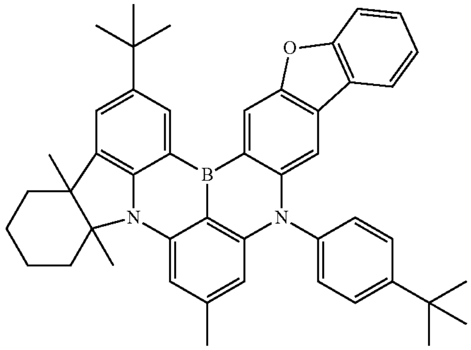
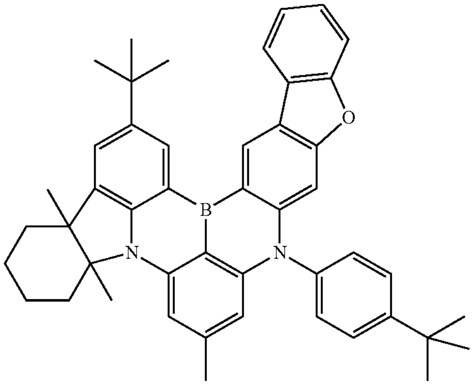
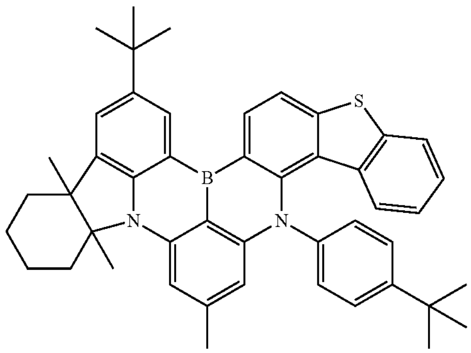
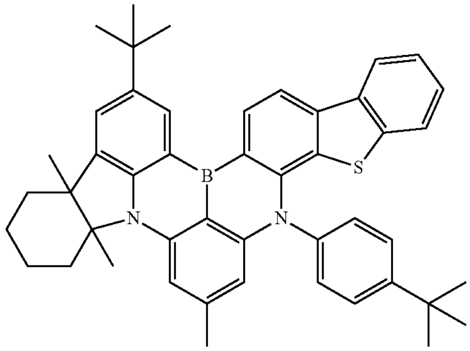

-continued
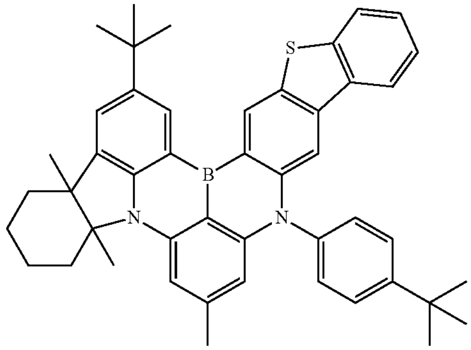
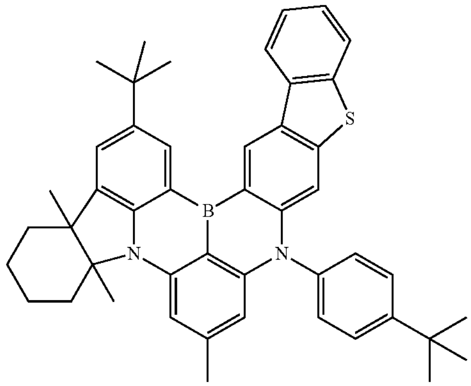
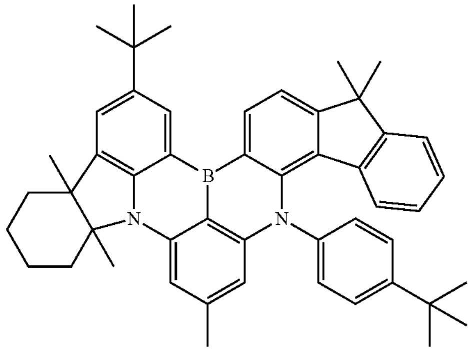
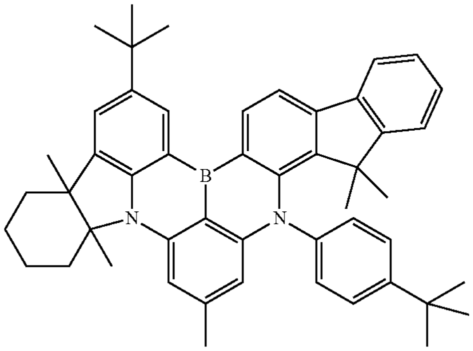
-continued
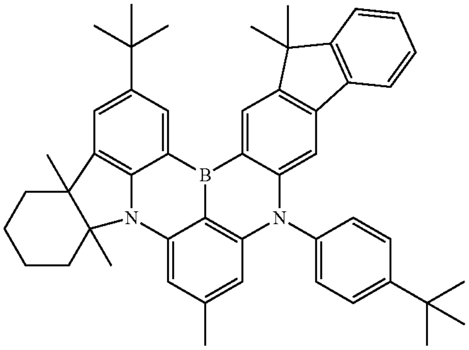
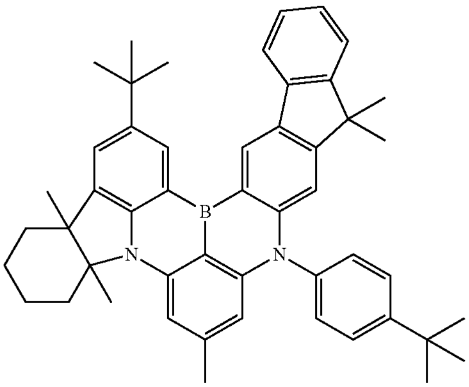
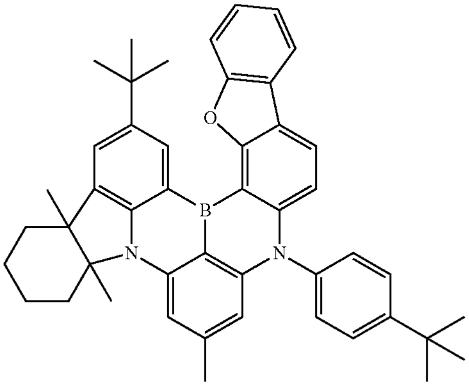
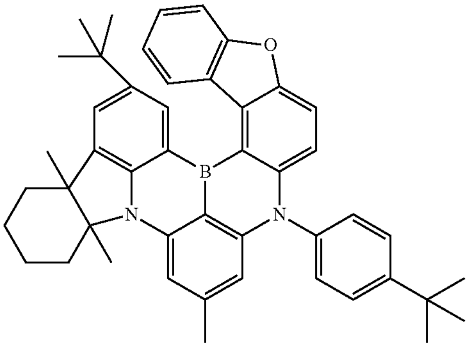

-continued
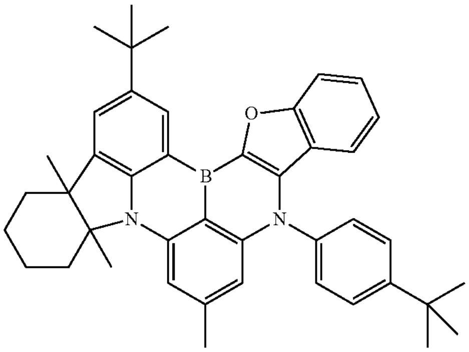
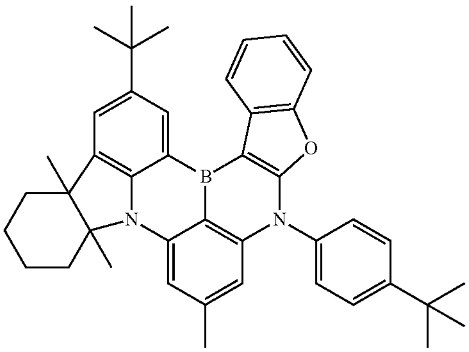
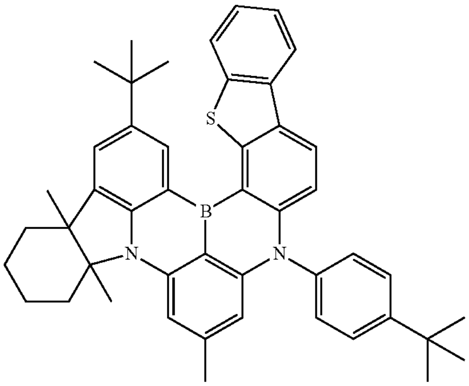
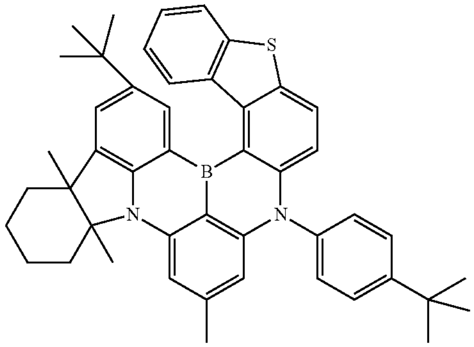
-continued
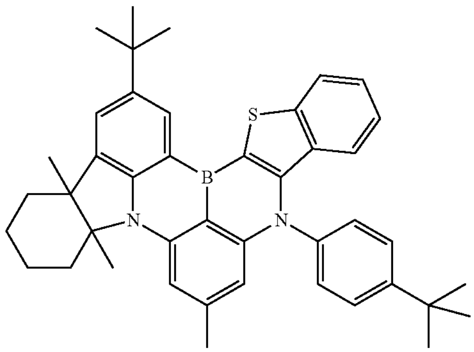
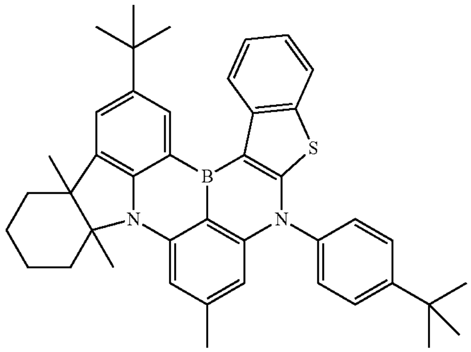
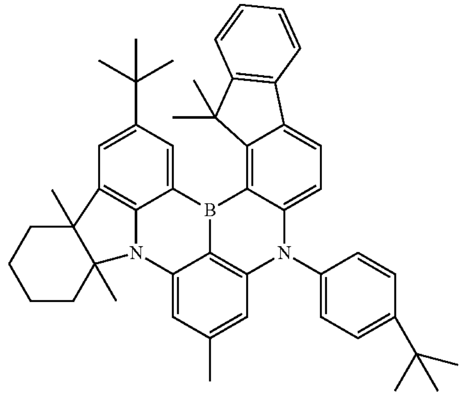
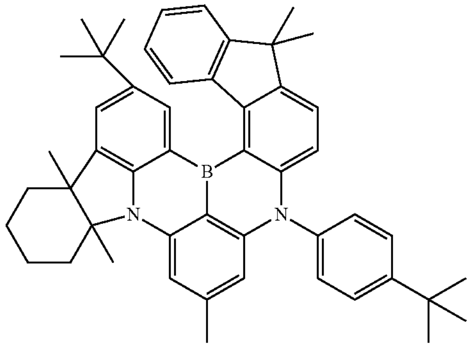

-continued
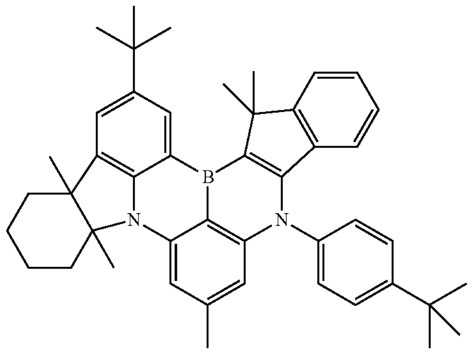
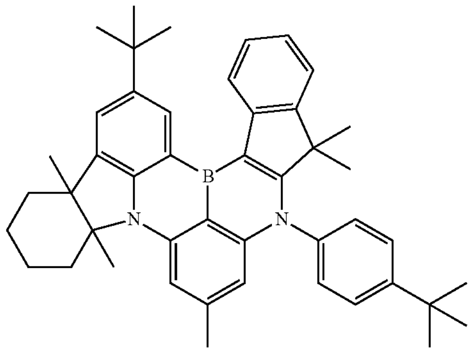
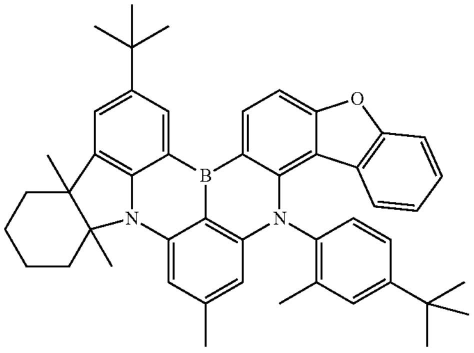
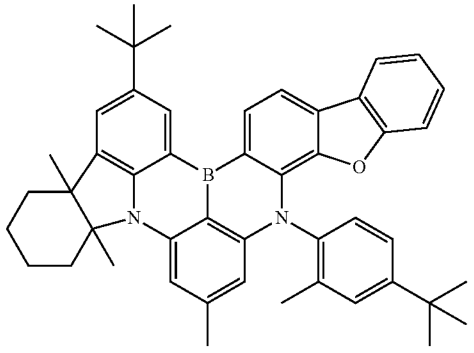
-continued
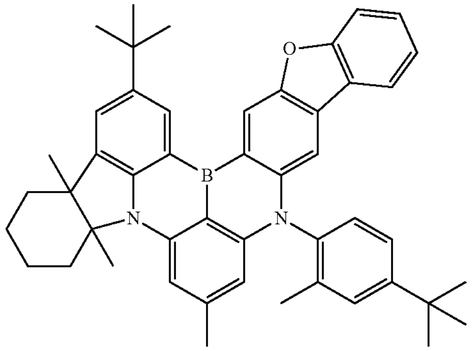
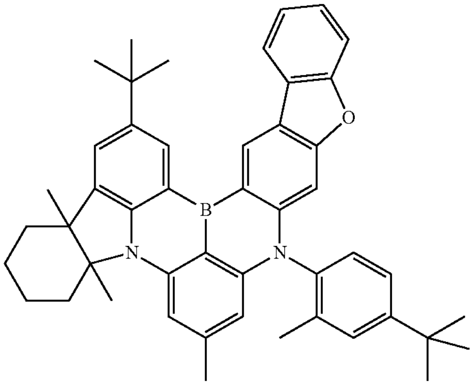
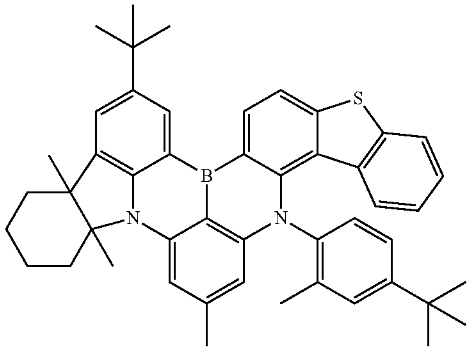
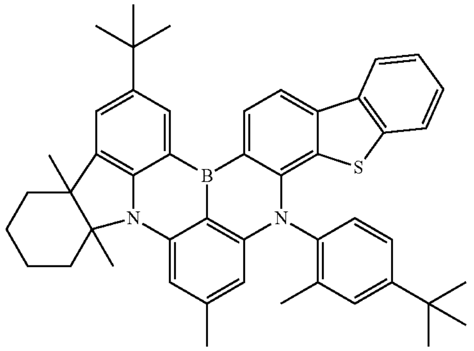

-continued
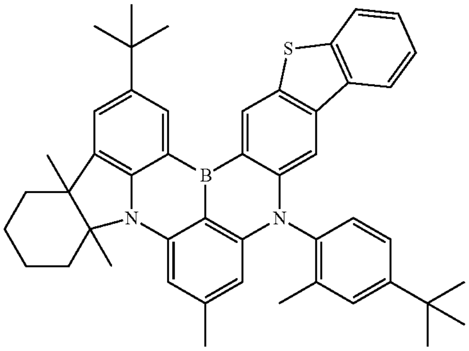
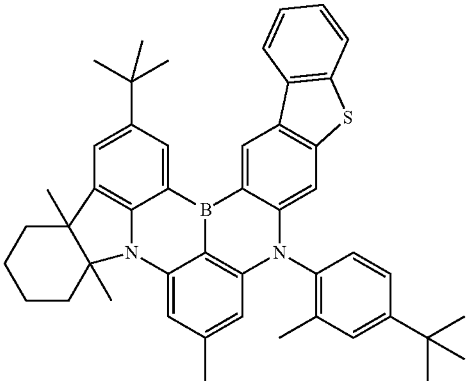
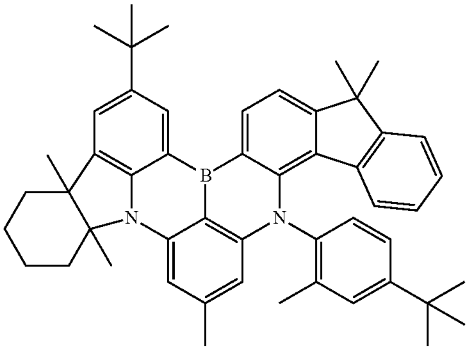
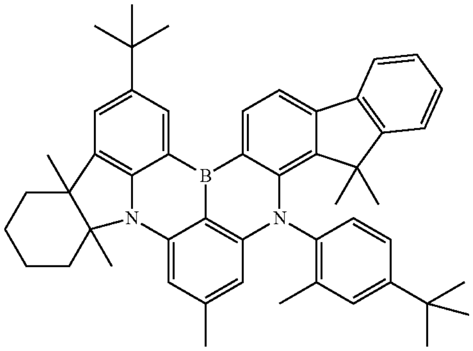
-continued
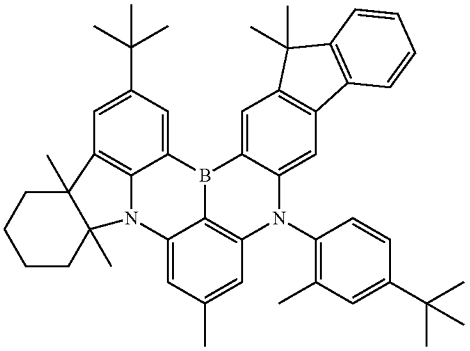
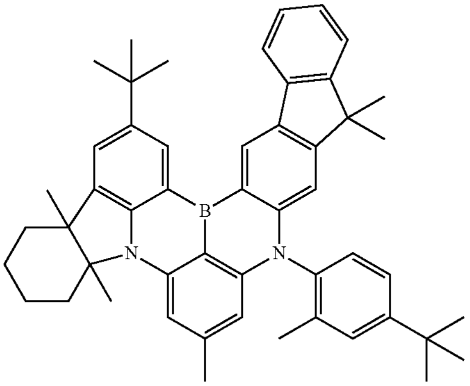
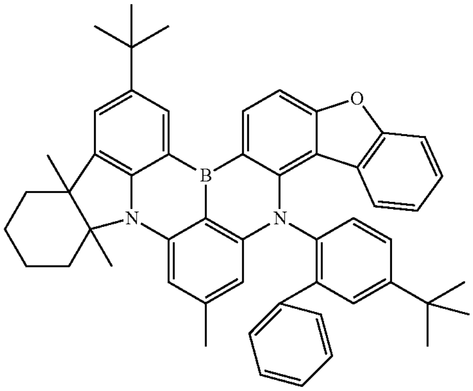
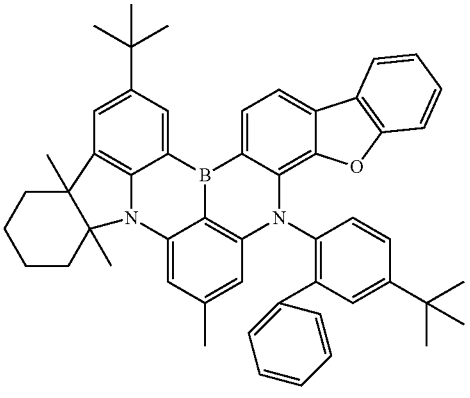

-continued
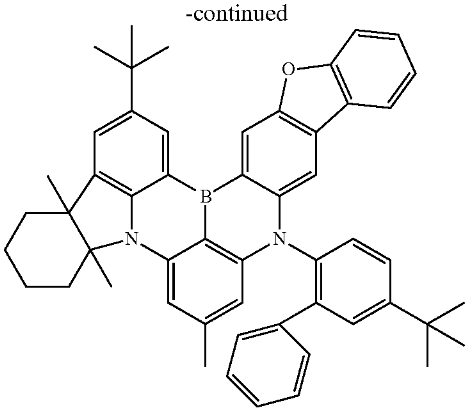
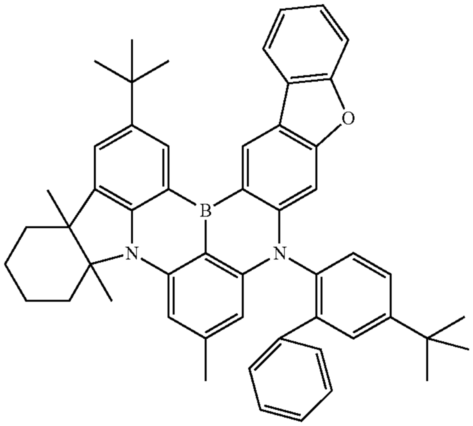
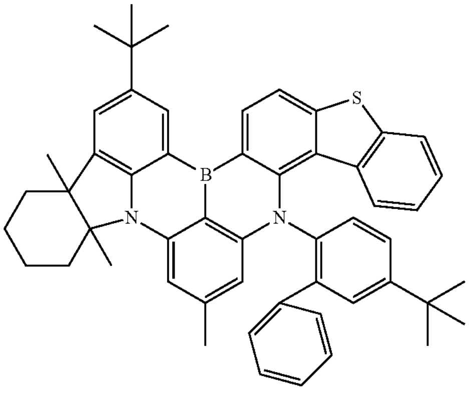
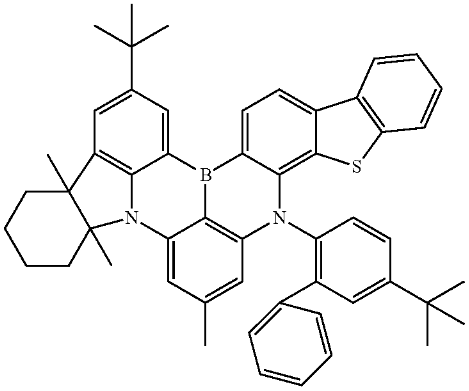
-continued
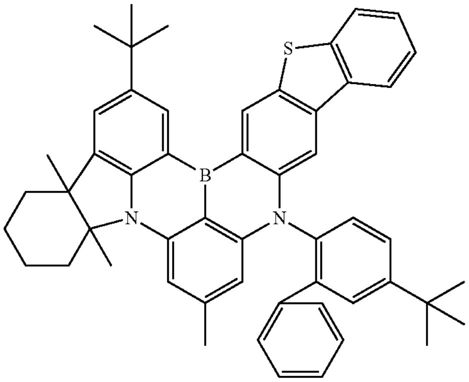
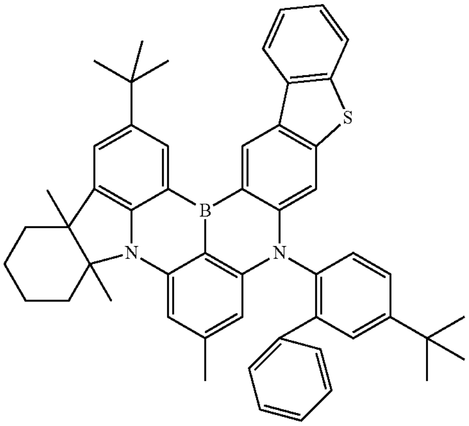
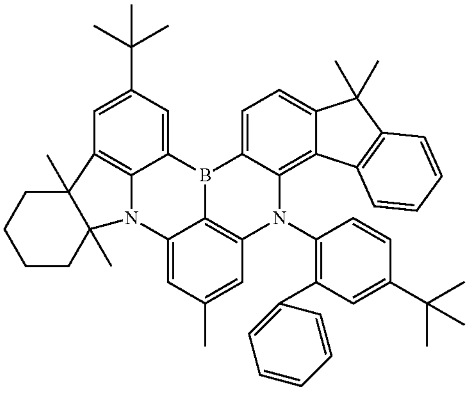
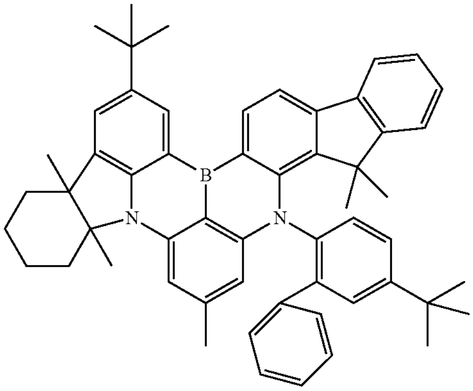

-continued
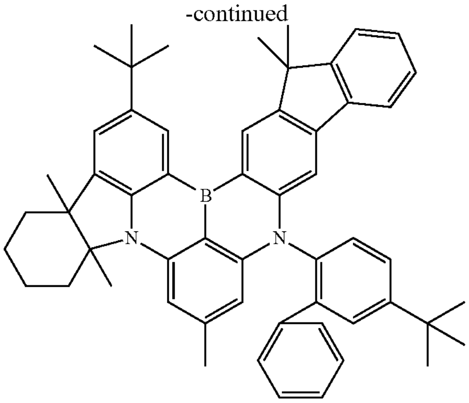
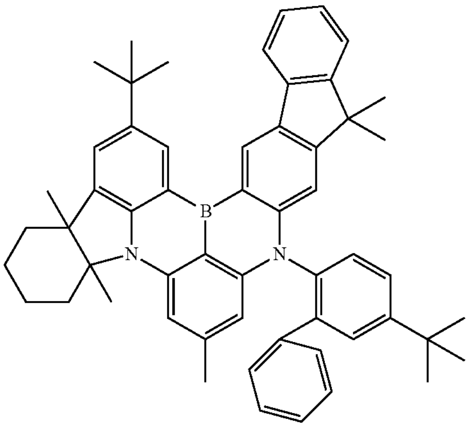
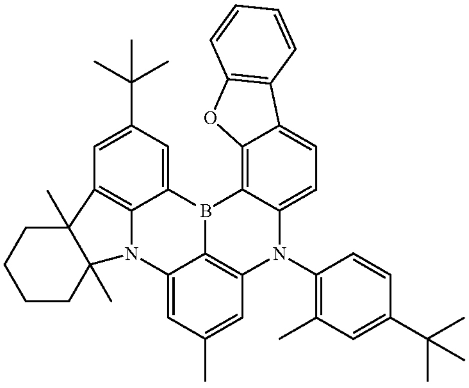
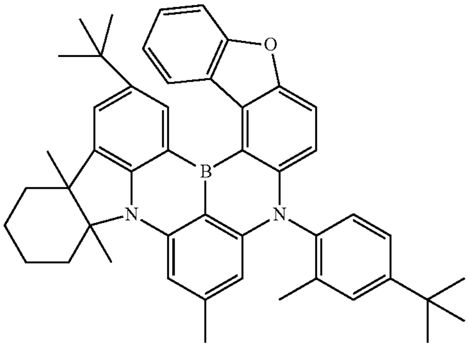
-continued
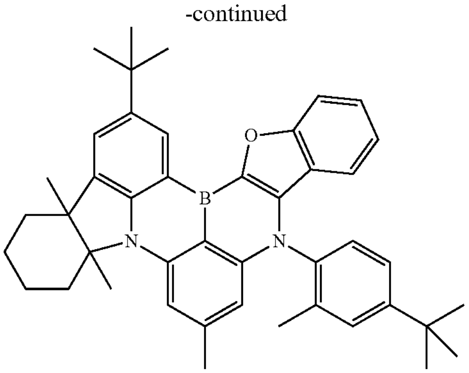
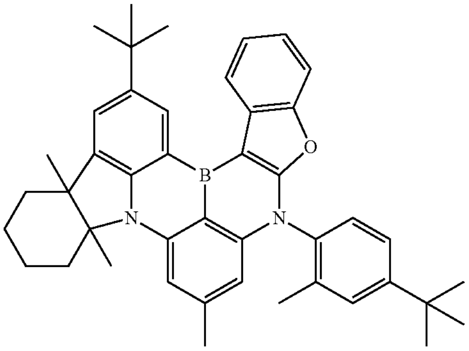
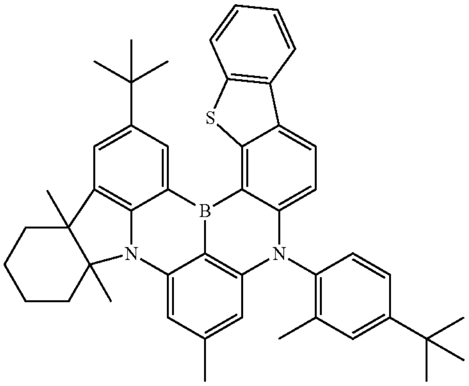
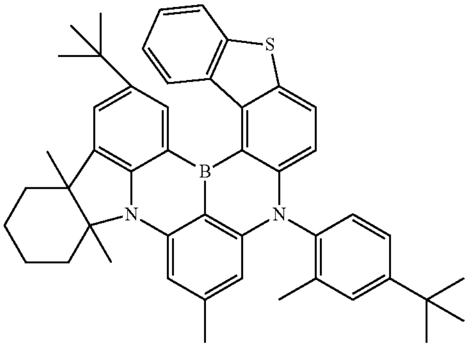

-continued
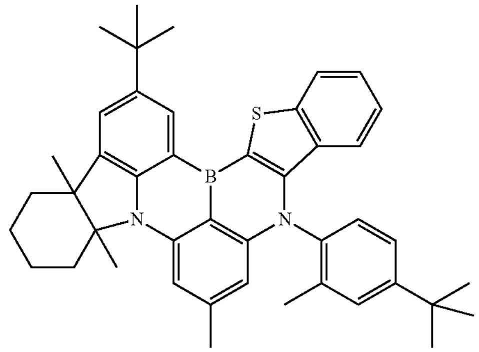
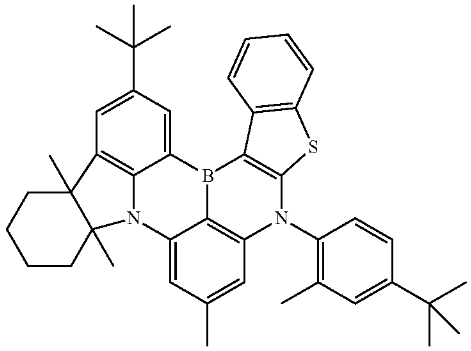
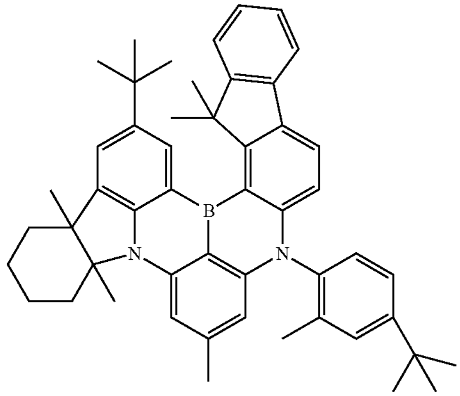
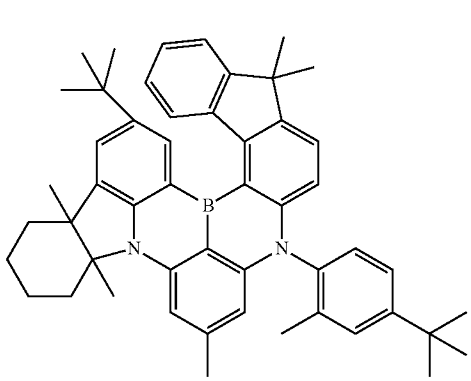
-continued
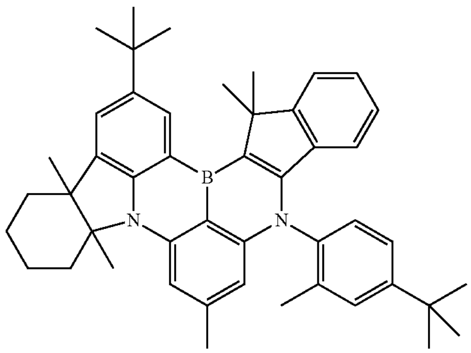
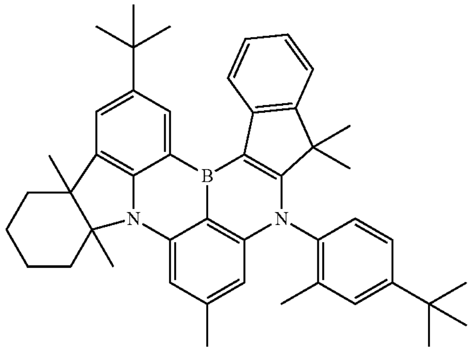
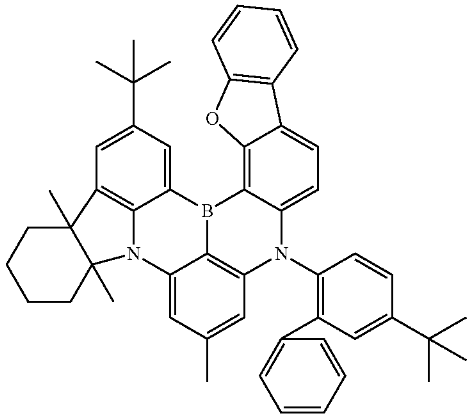
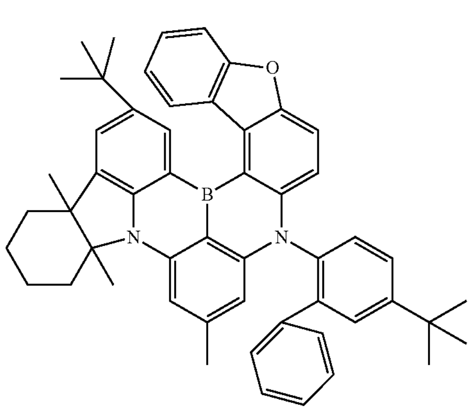

-continued
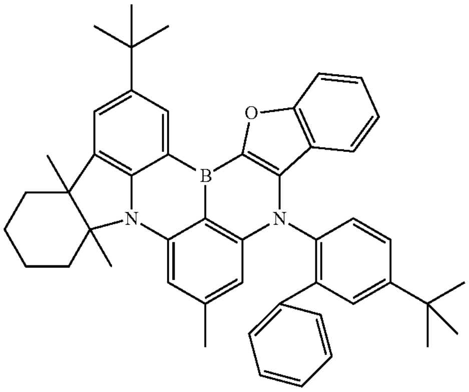
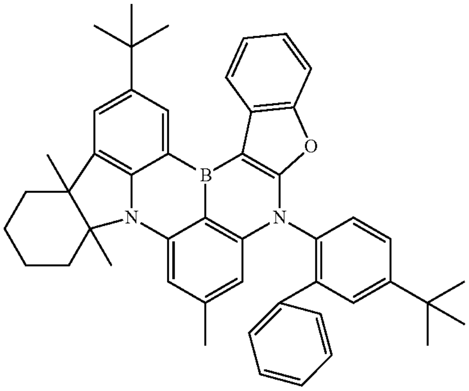
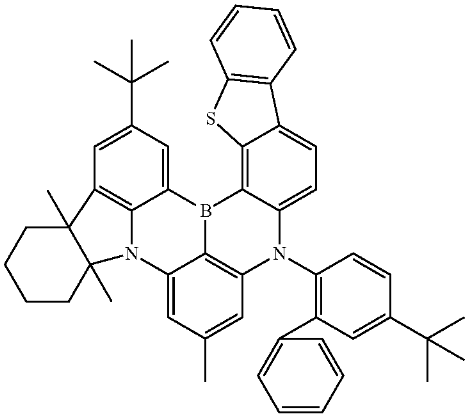
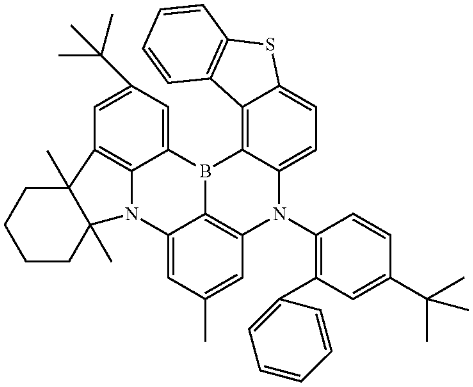
-continued
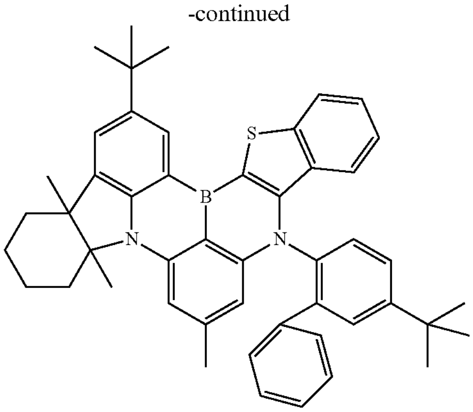
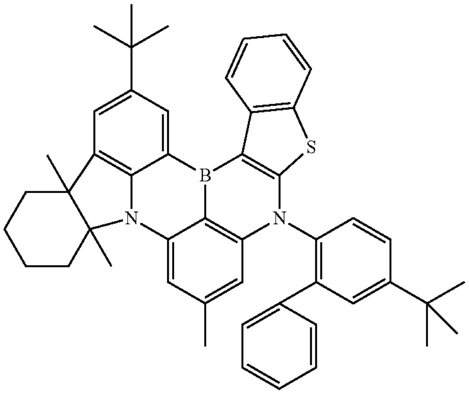
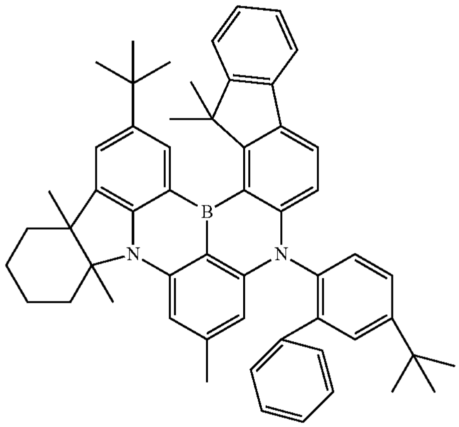
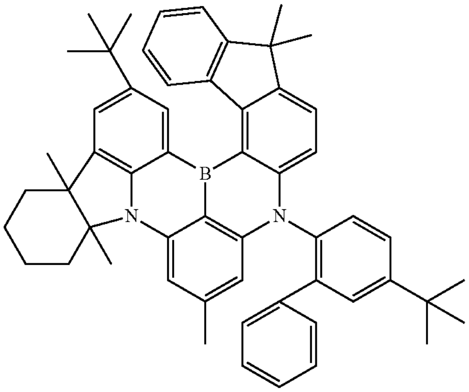

-continued
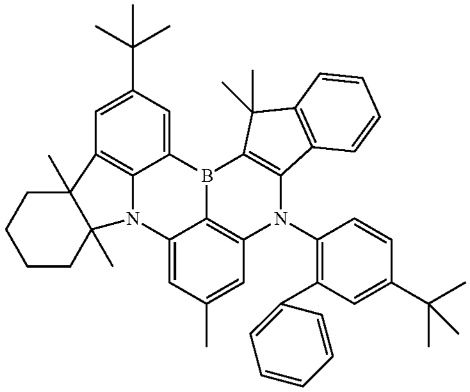
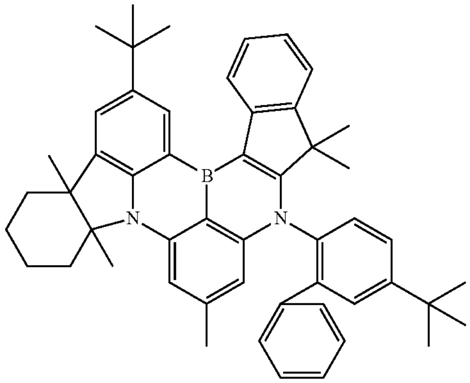
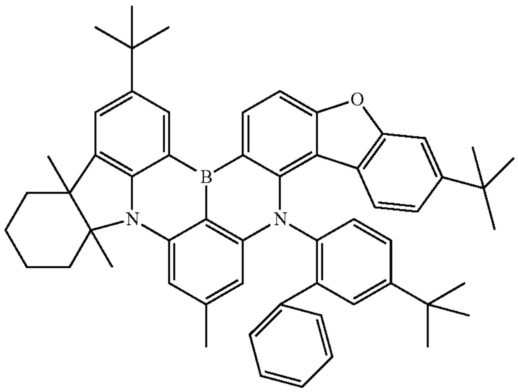
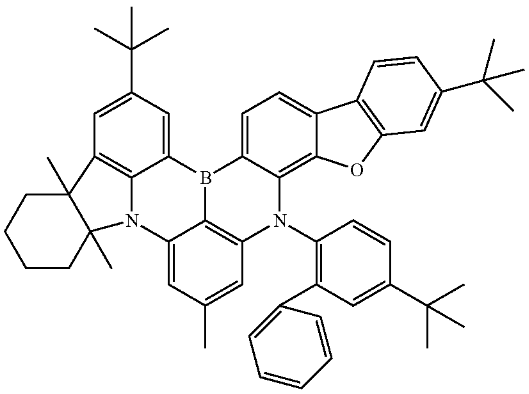
-continued
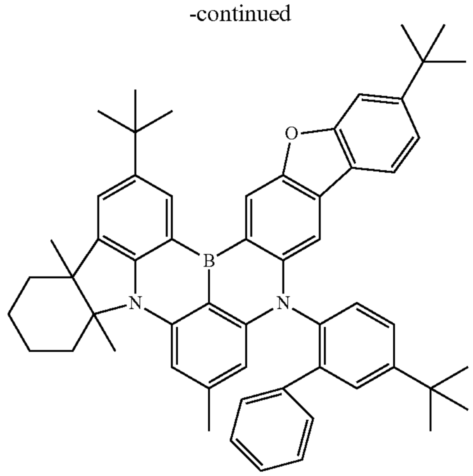
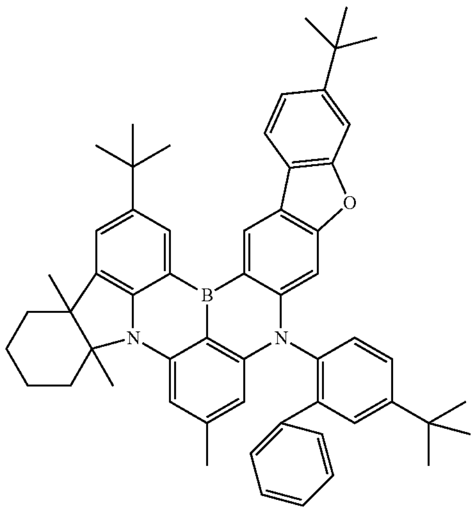
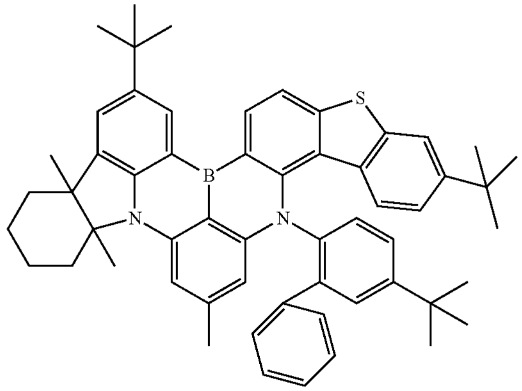

-continued
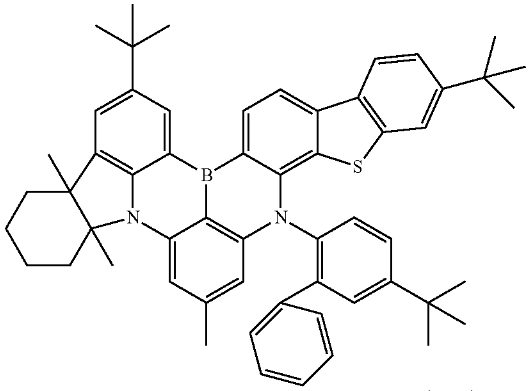
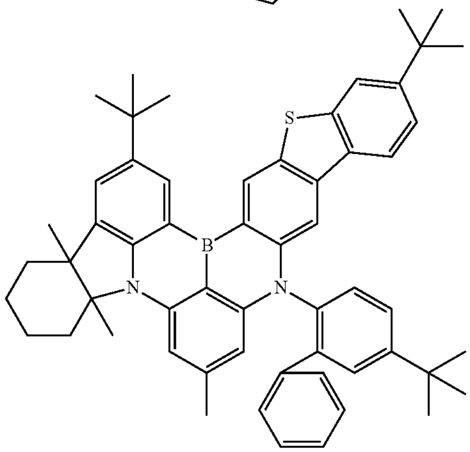
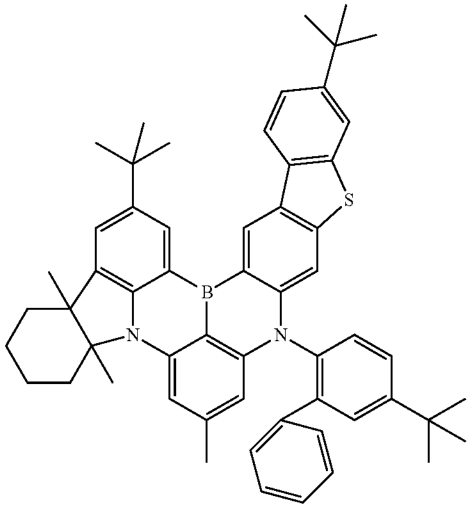
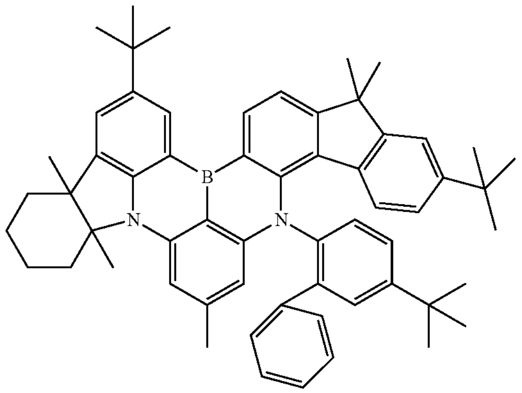
-continued
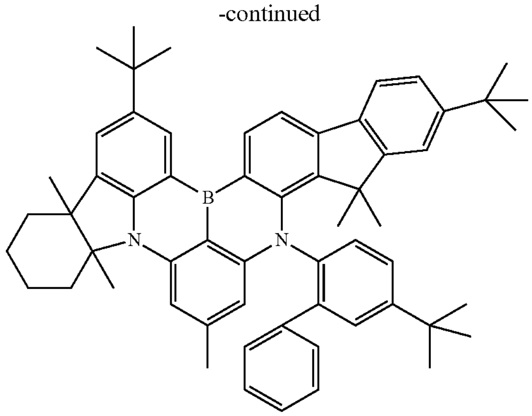
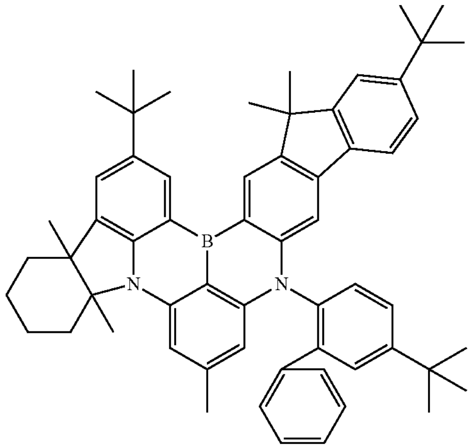
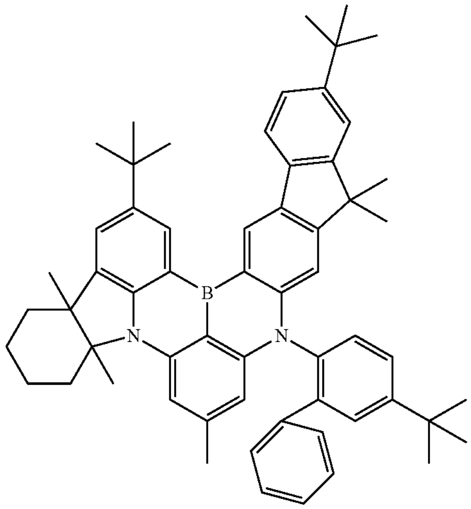

-continued
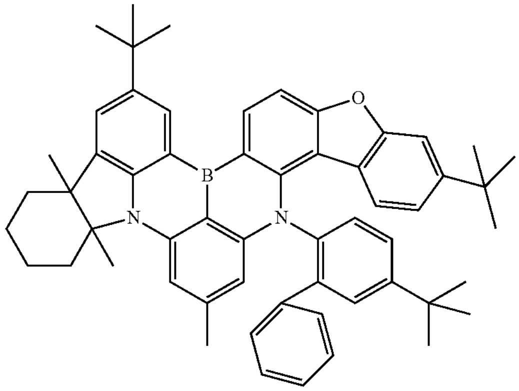
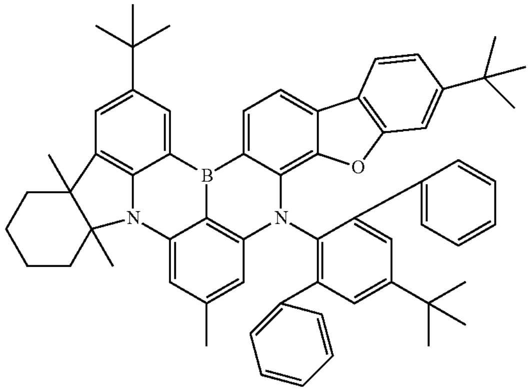
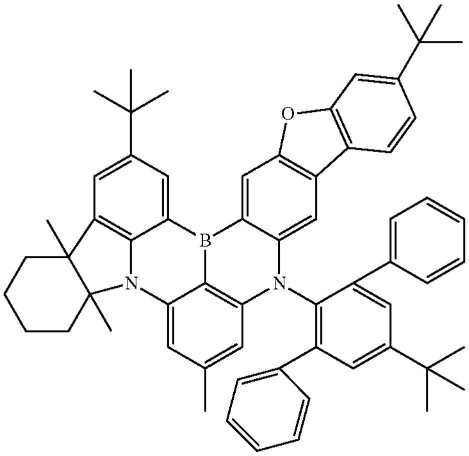
-continued
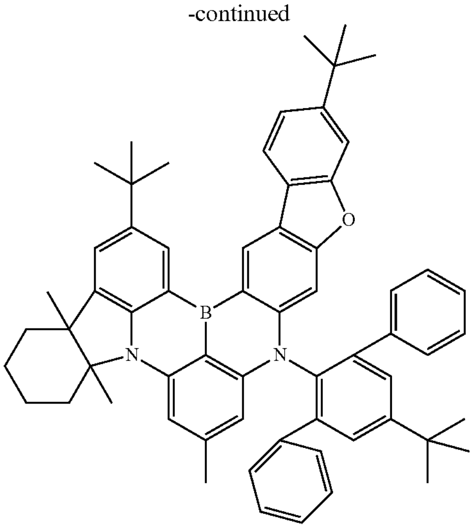
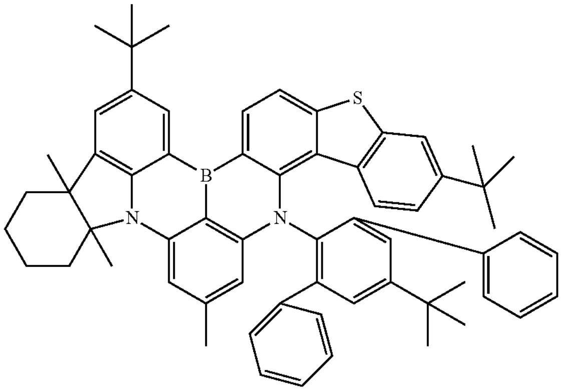
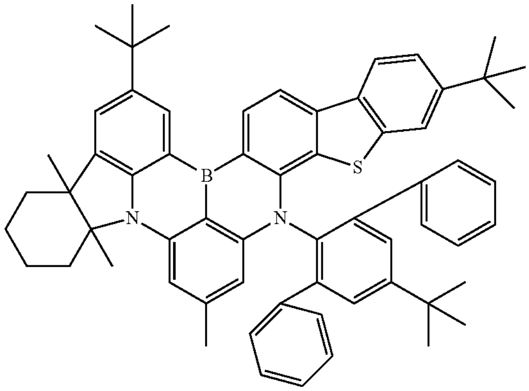
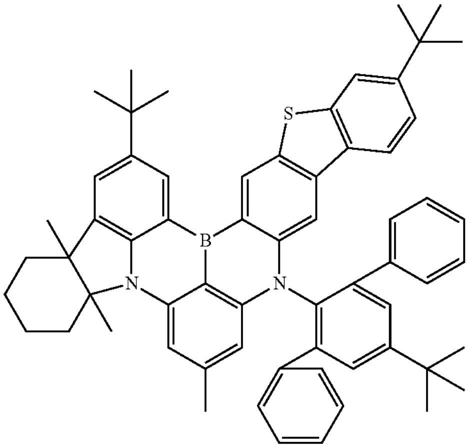

-continued
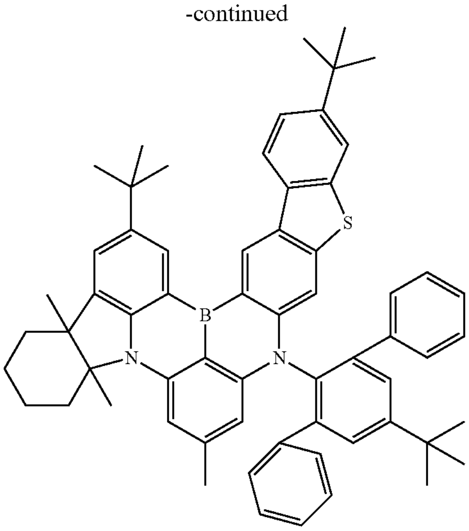
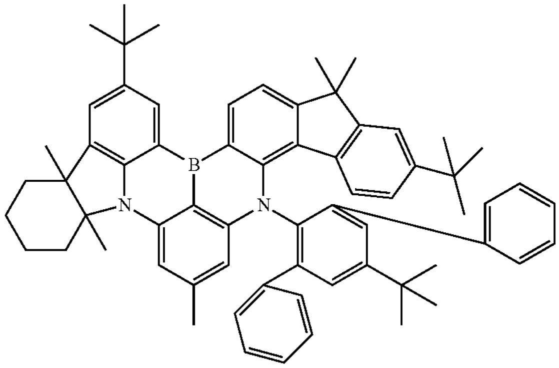
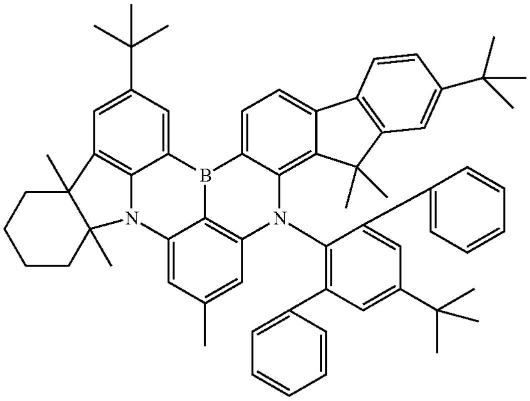
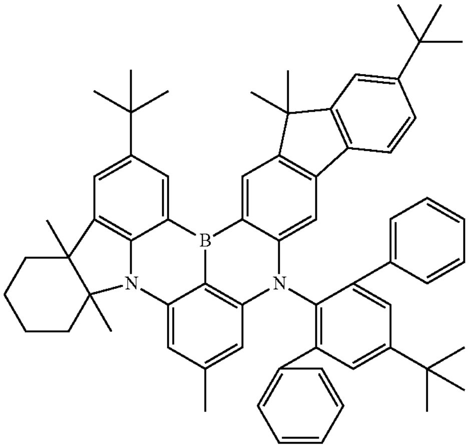
-continued
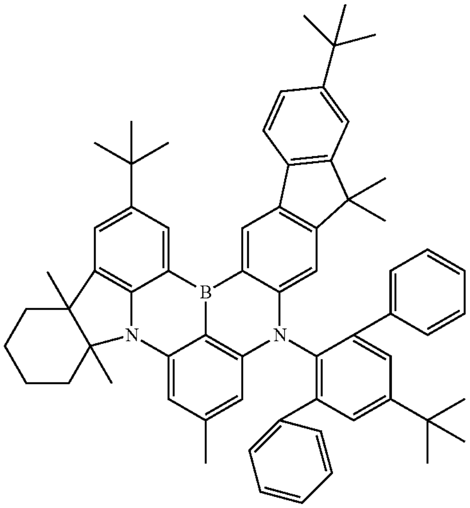
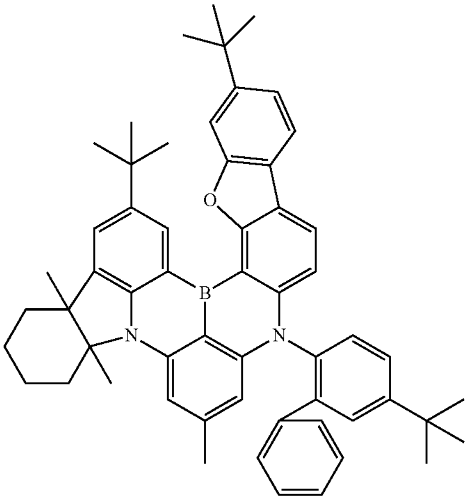
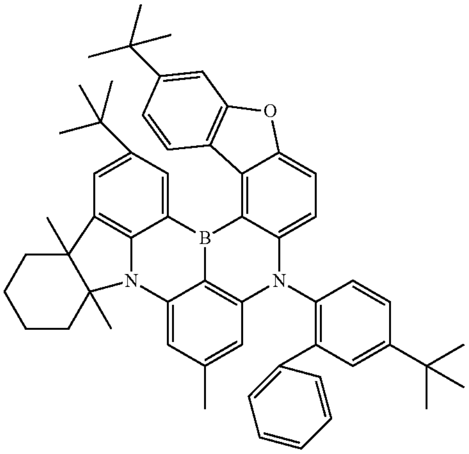

-continued
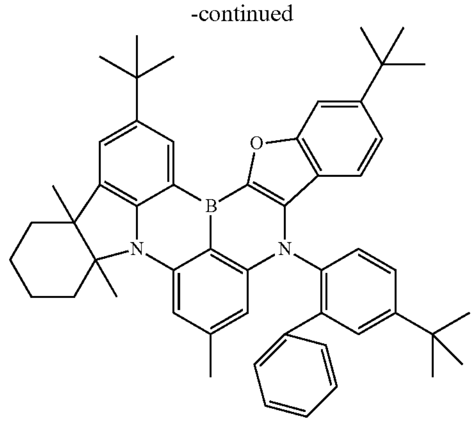
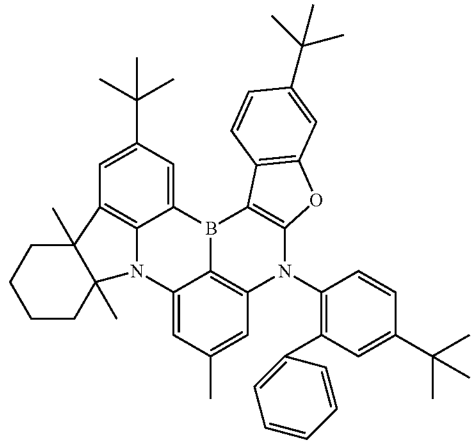
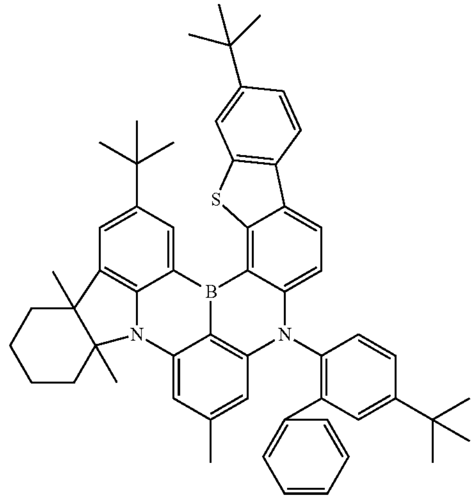
-continued
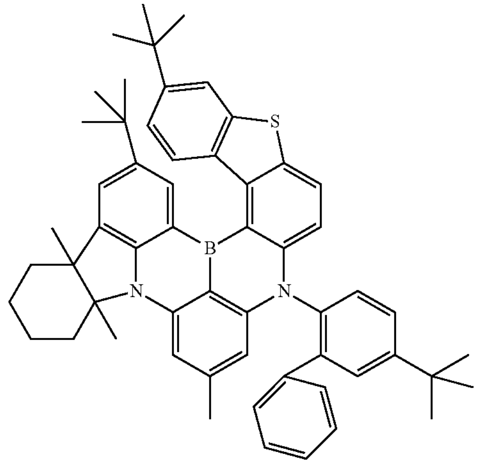
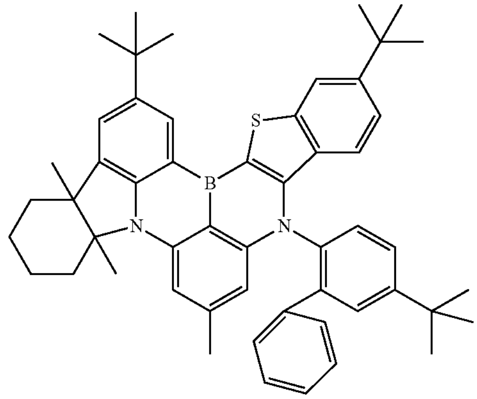
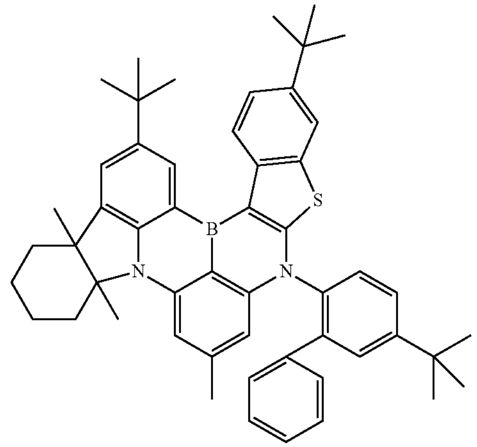

-continued
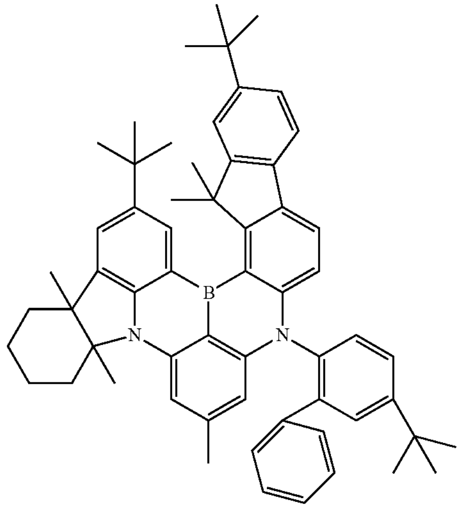
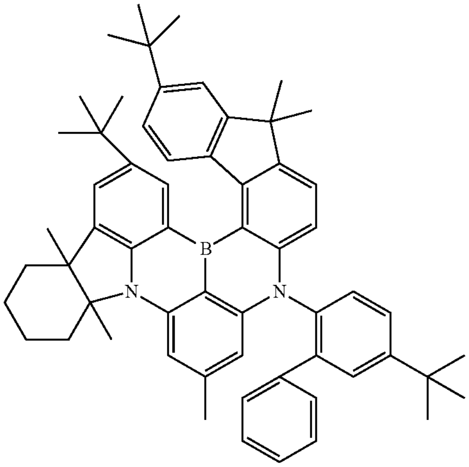
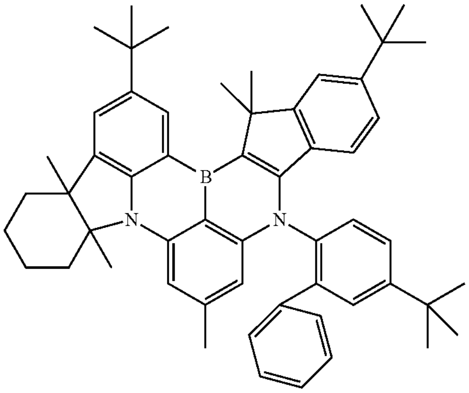
-continued
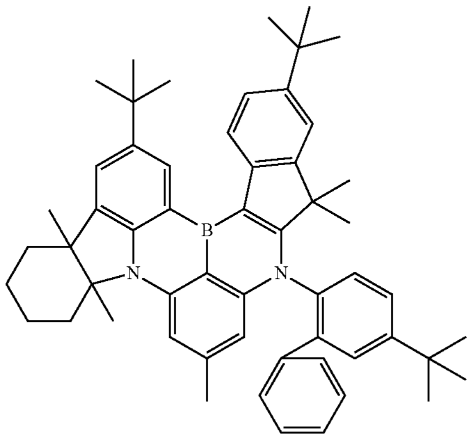
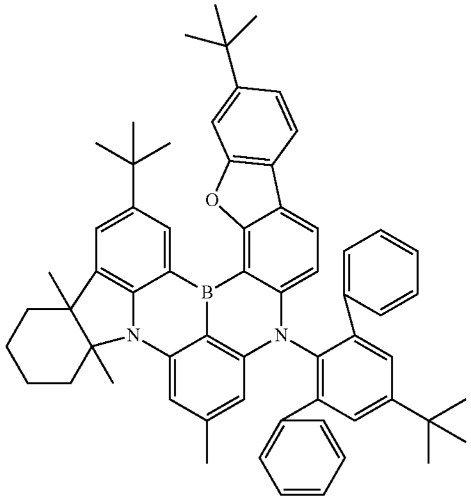
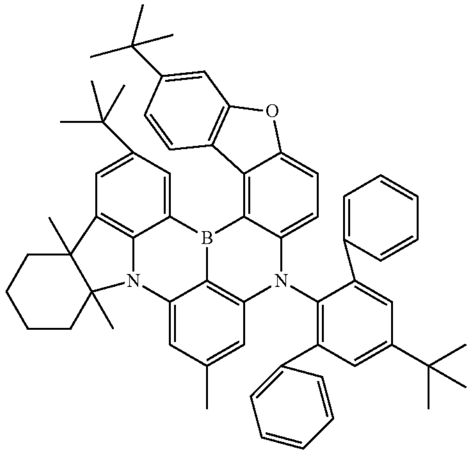

-continued
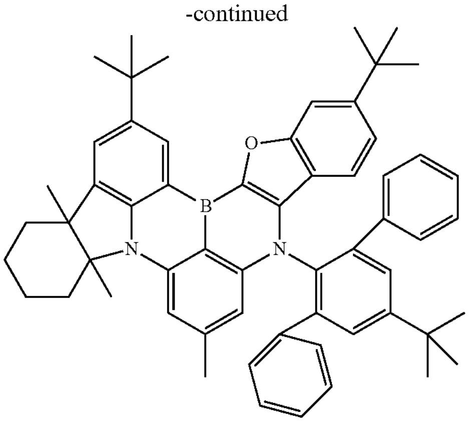
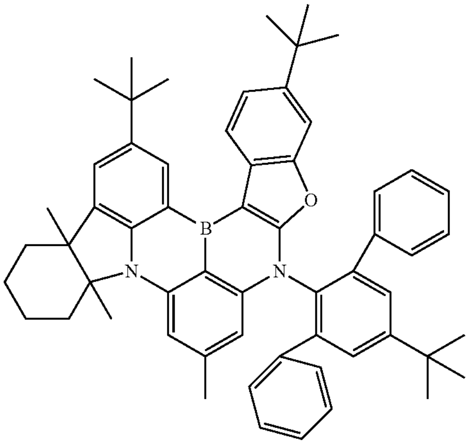
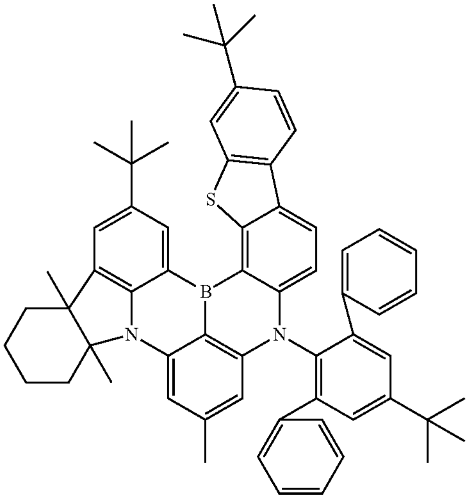
-continued
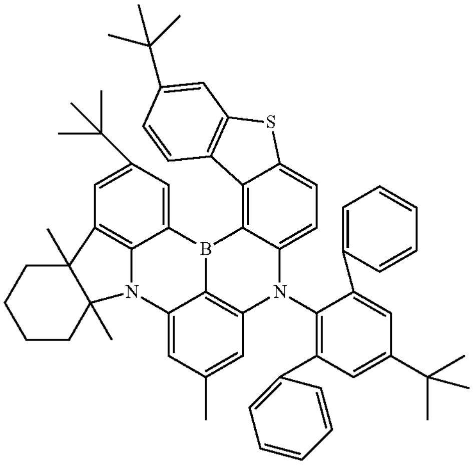
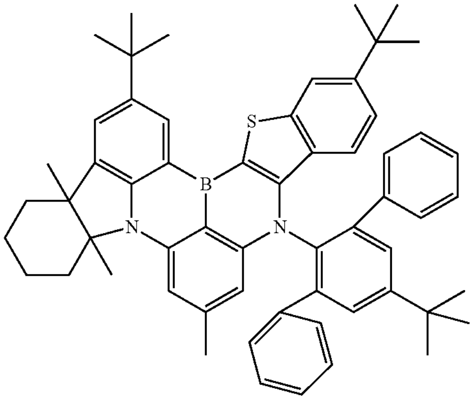
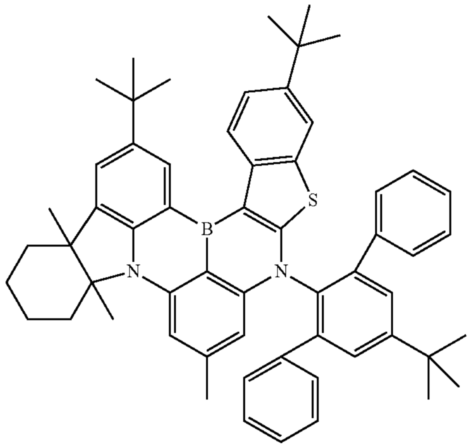

-continued
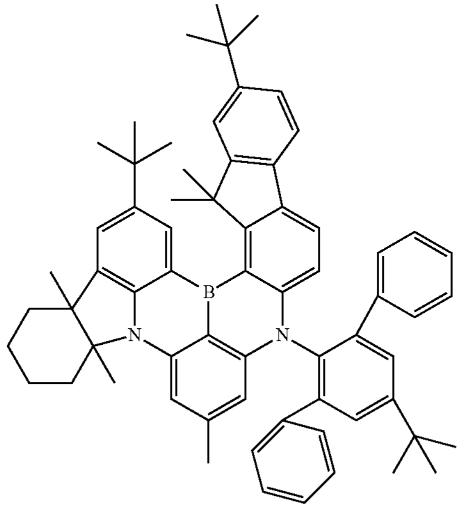
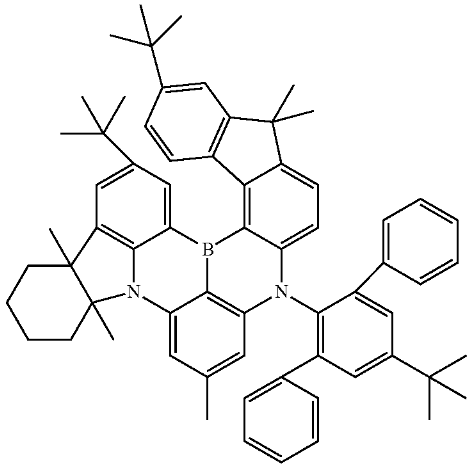
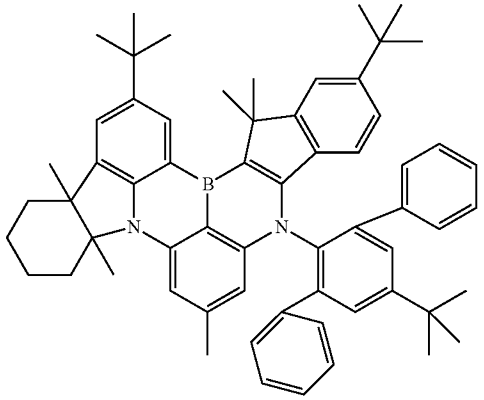
-continued
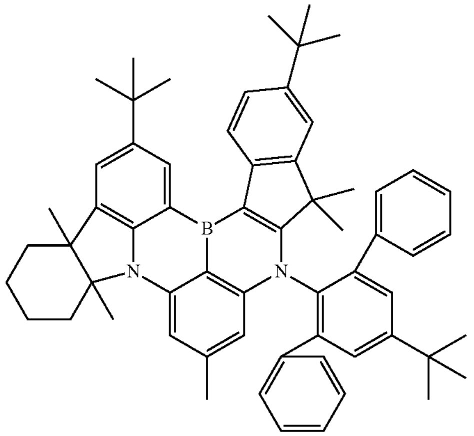
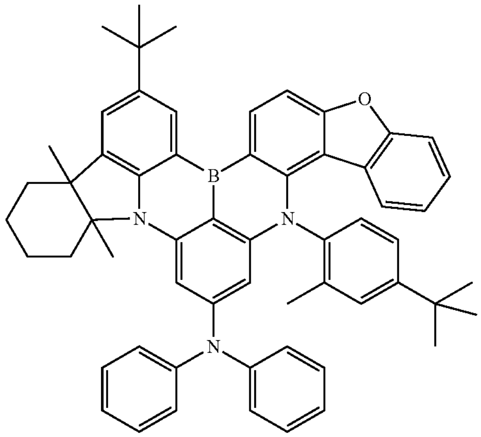
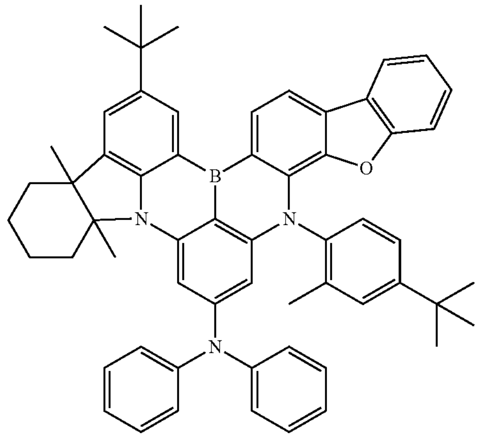

-continued
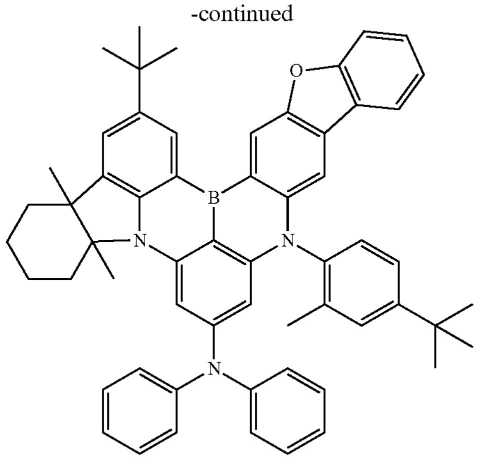
-continued
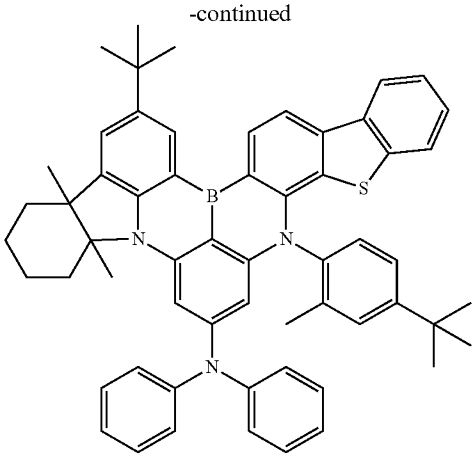
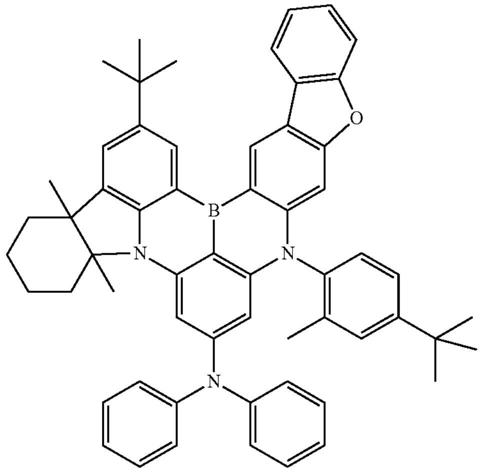
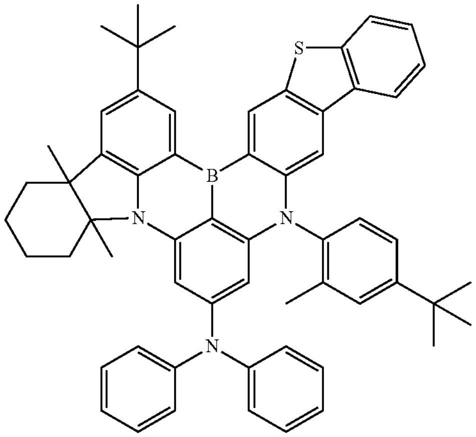
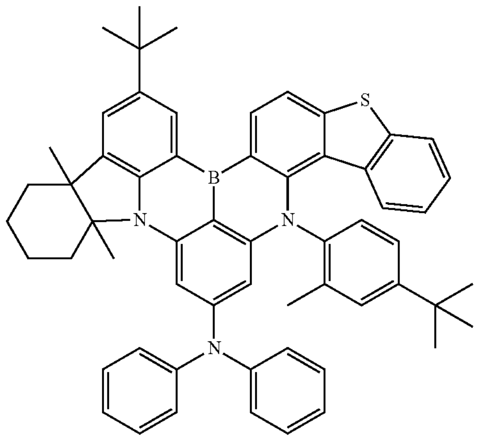
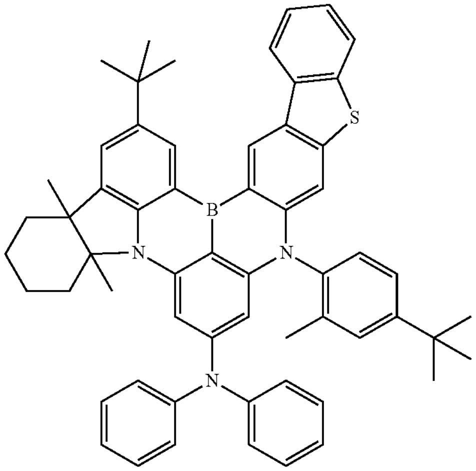

-continued
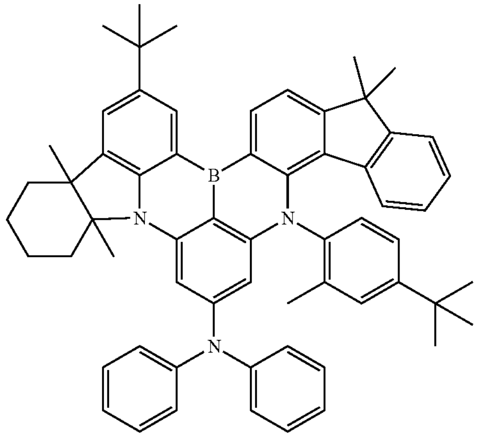
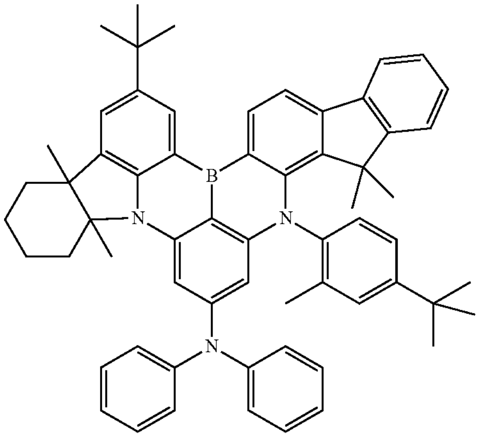
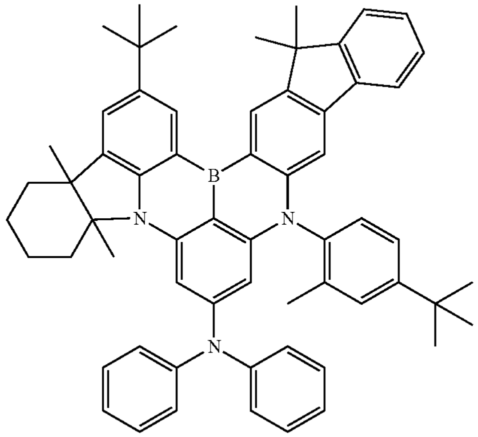
-continued
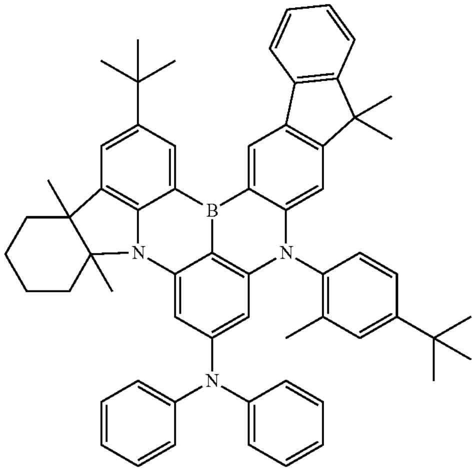
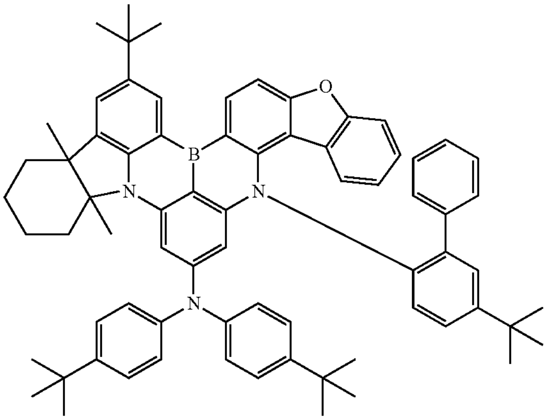
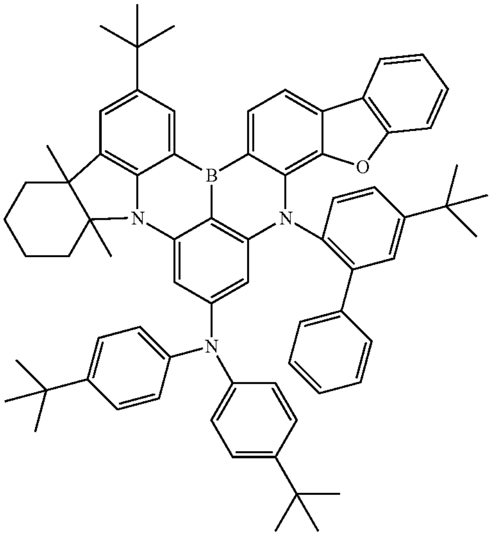

-continued
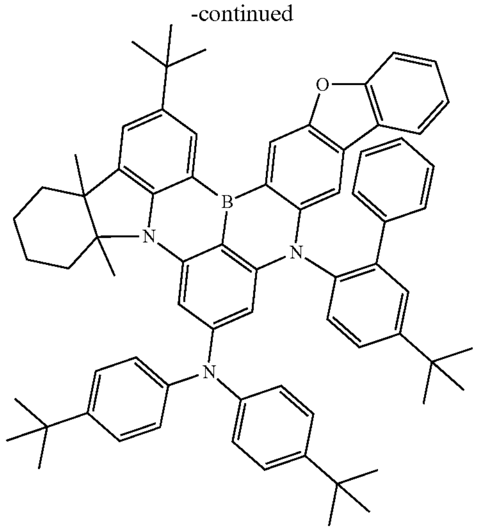
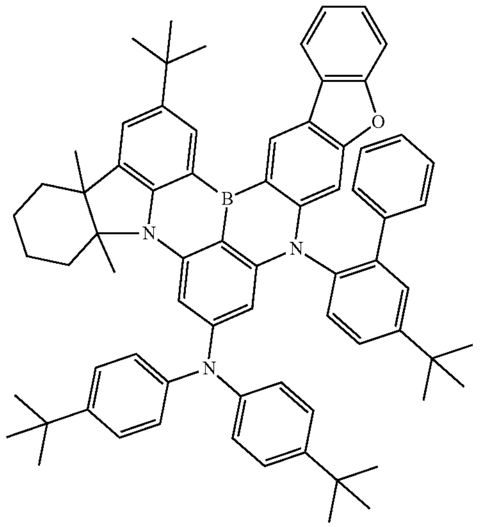
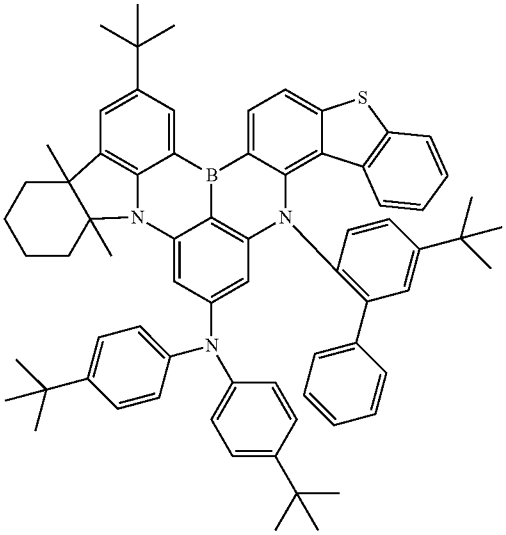
-continued
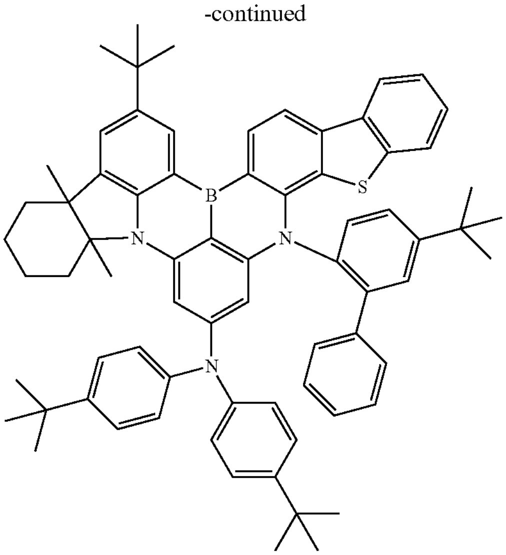
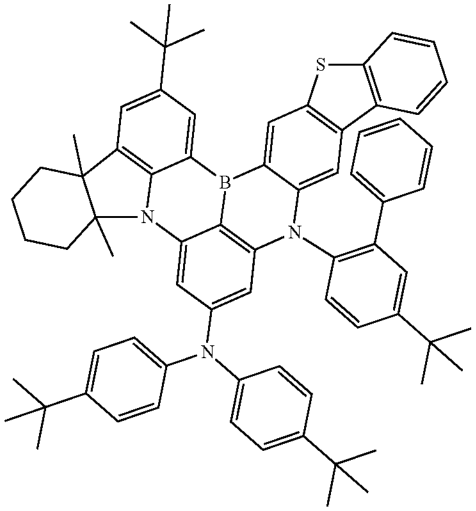
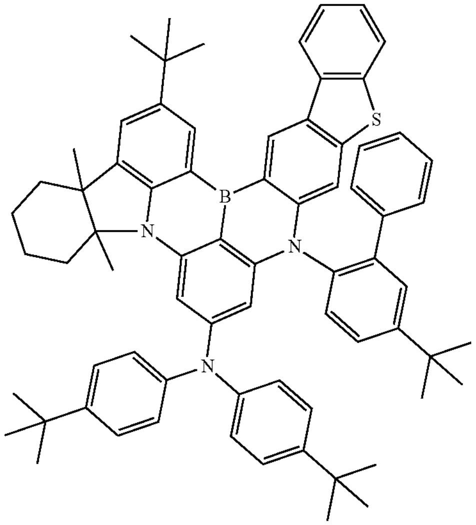

-continued
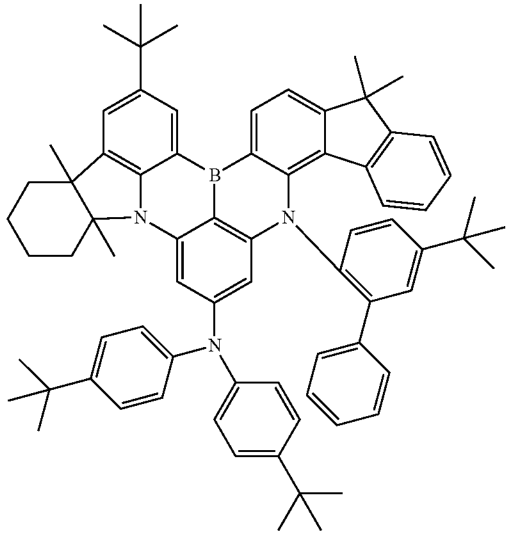
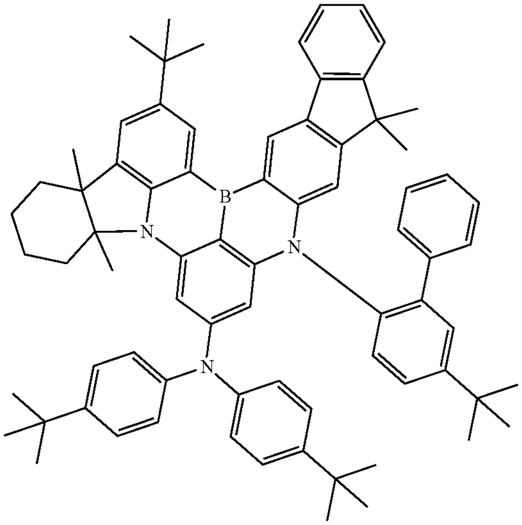
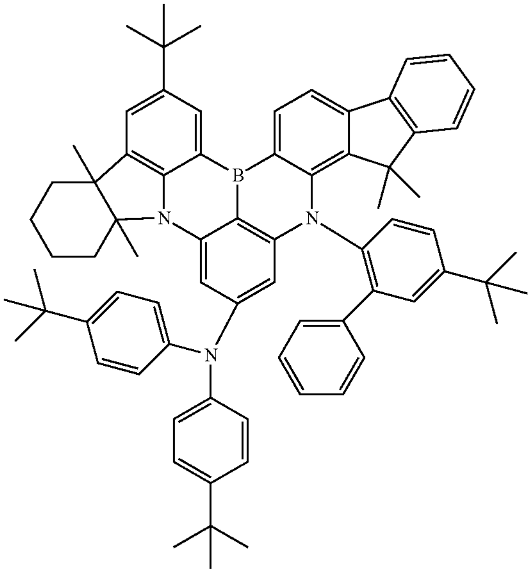
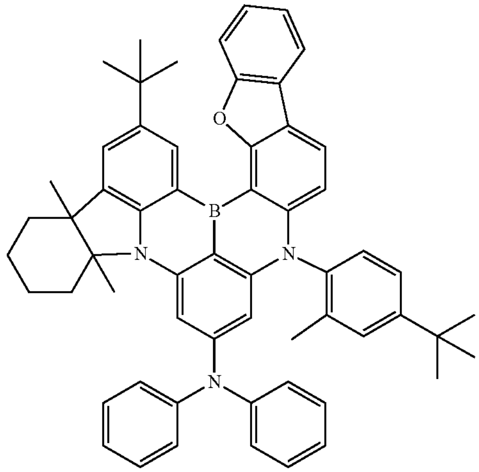
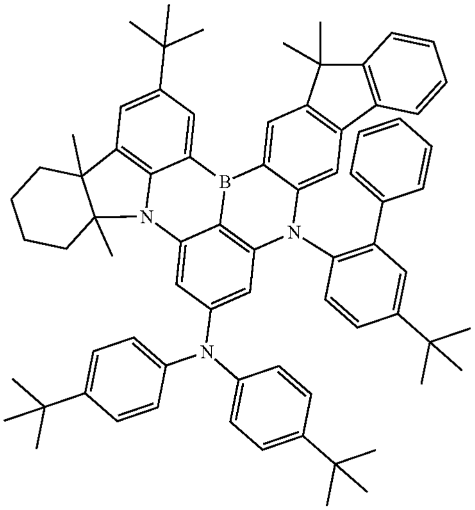
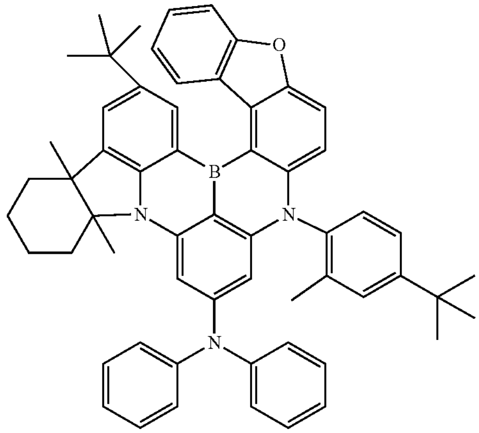
-continued -continued
-continued
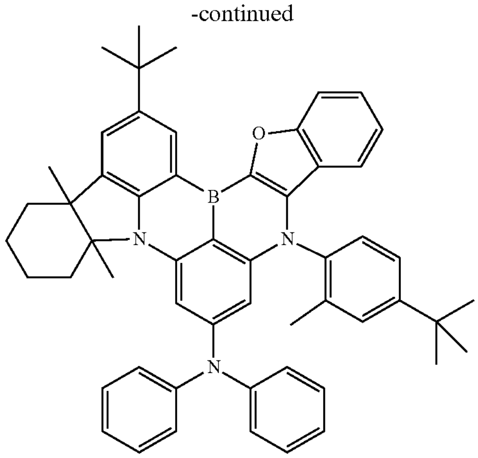
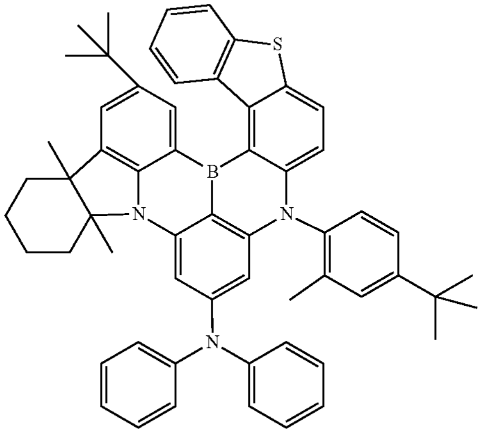
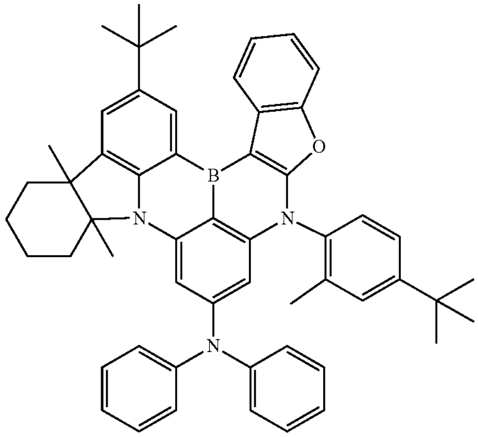
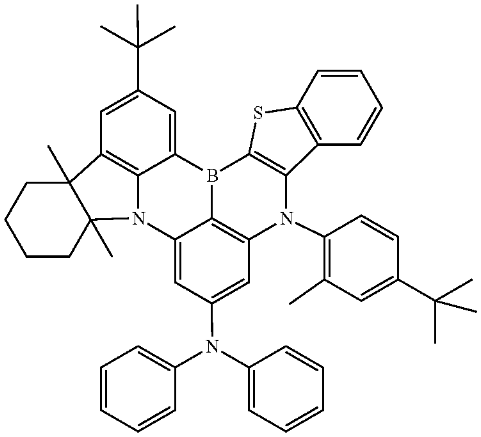
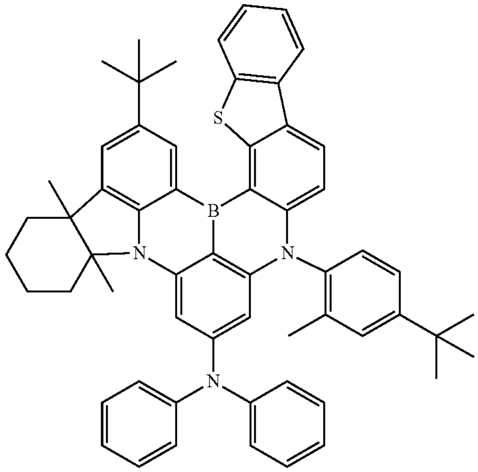
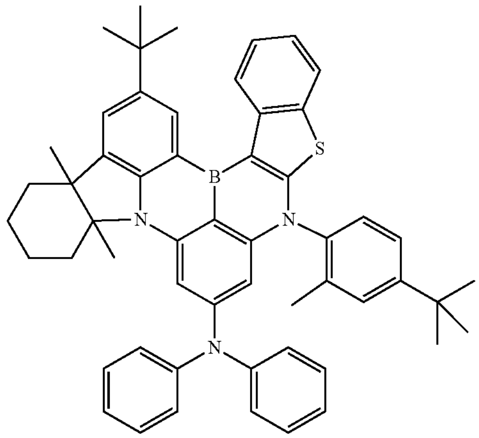

-continued
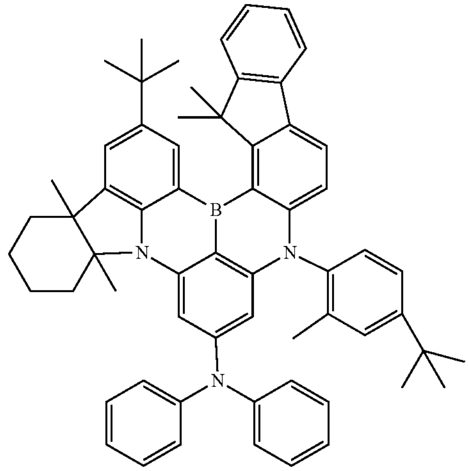
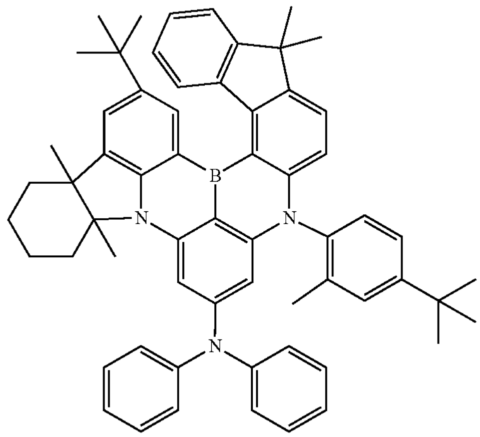
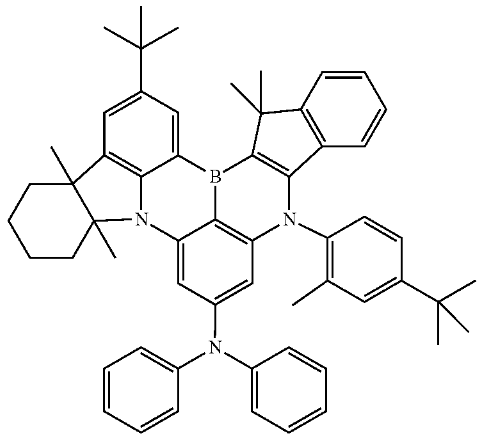
-continued
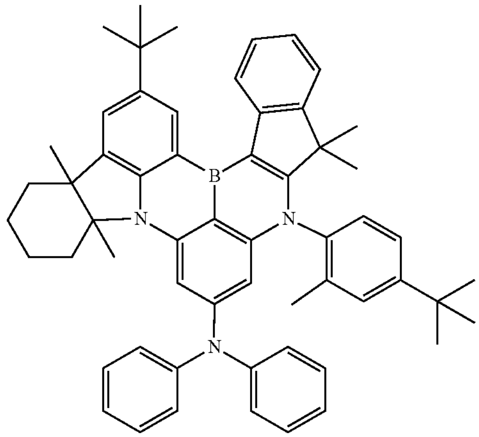
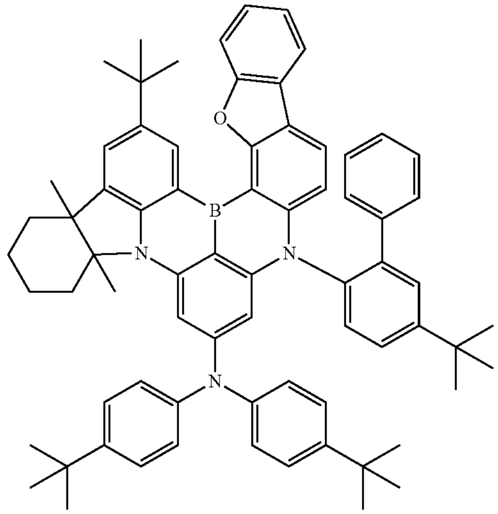
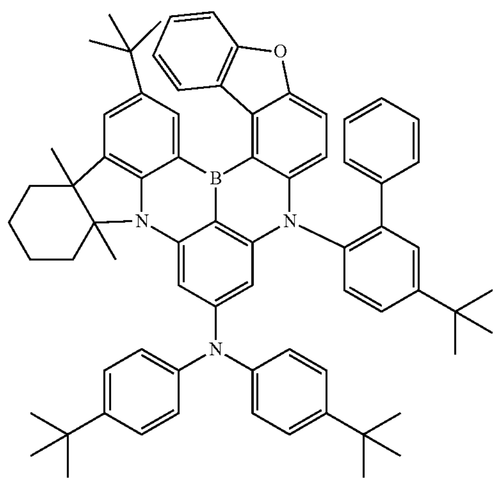

-continued
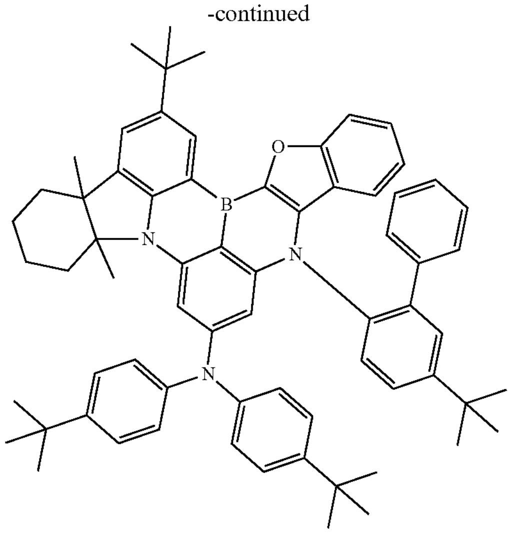
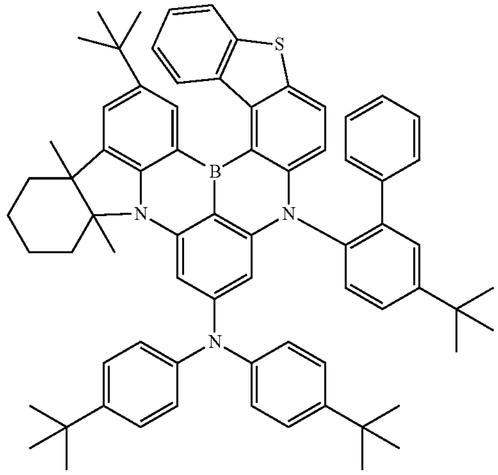
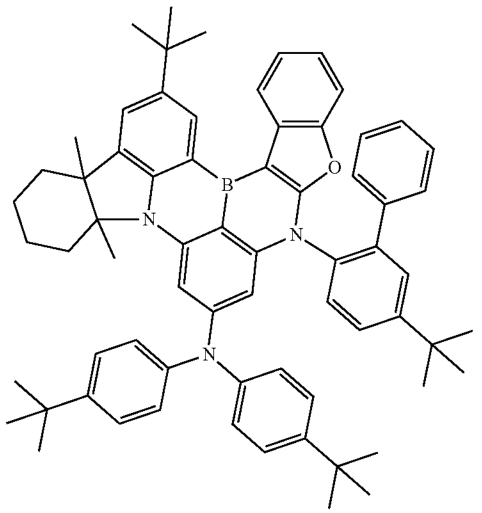
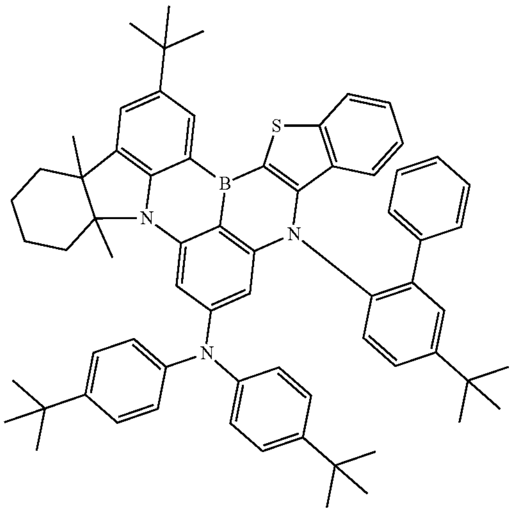
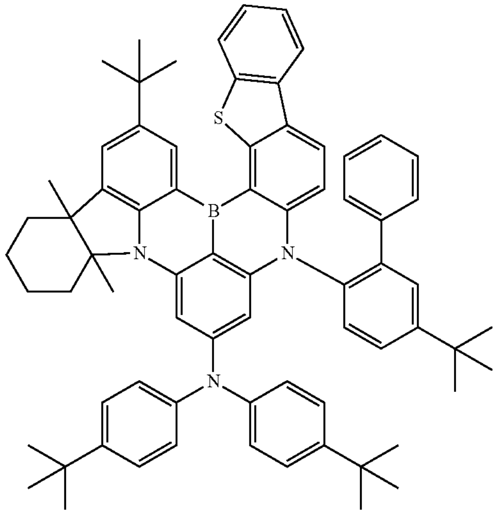
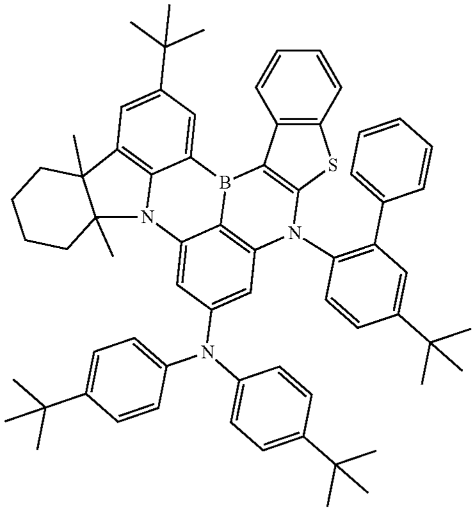
-continued -continued
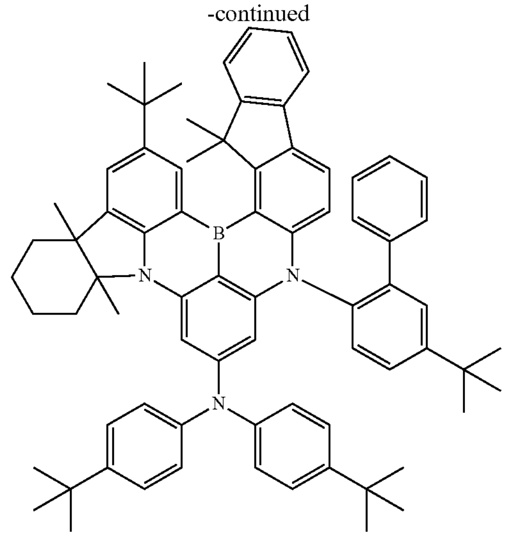
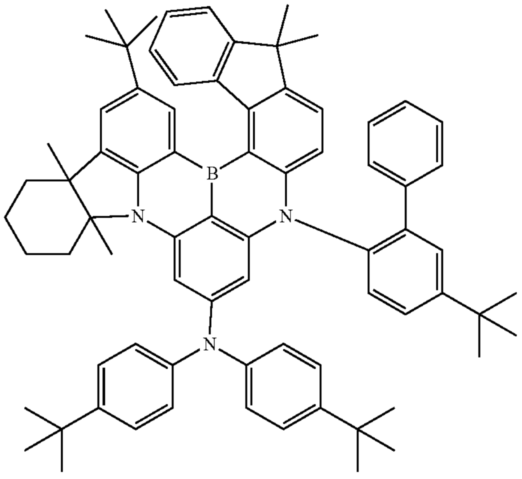
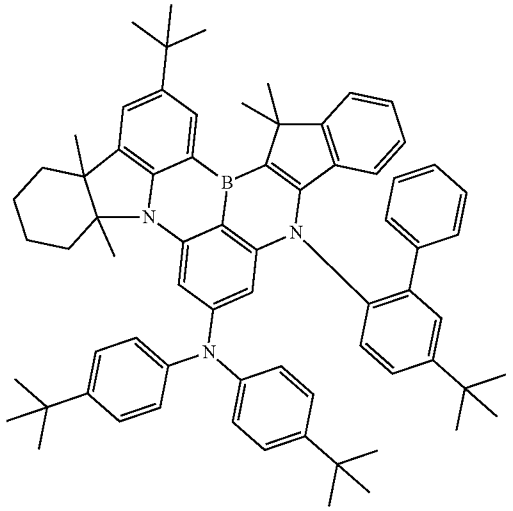
-continued
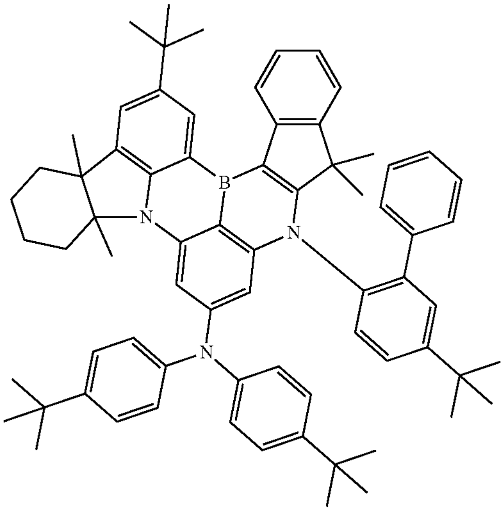
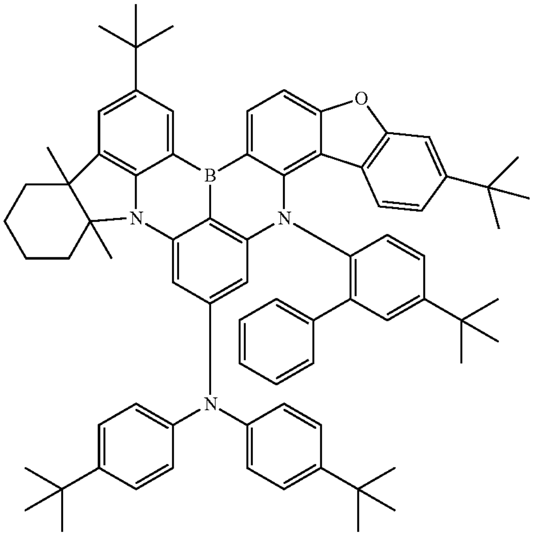
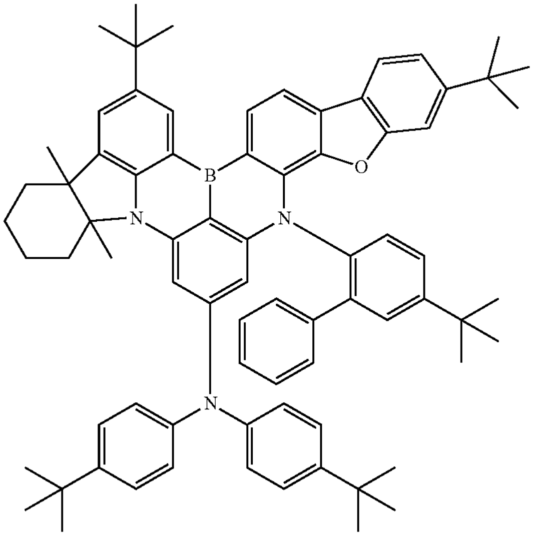

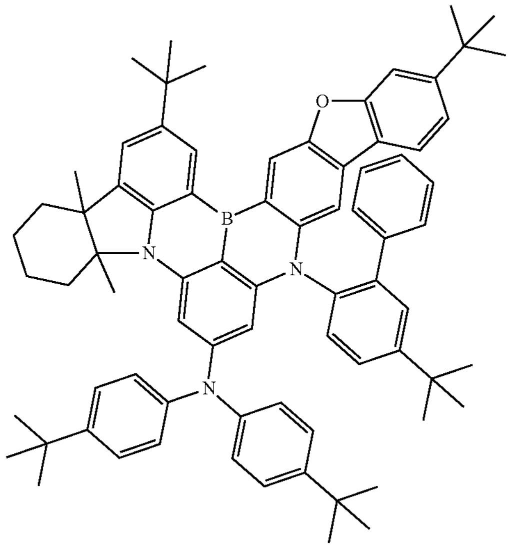
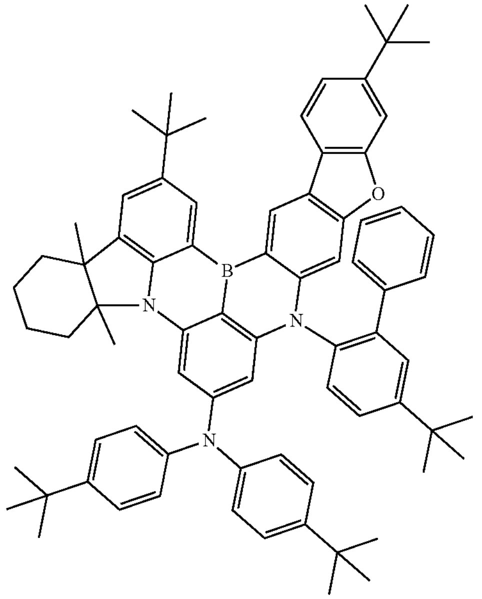
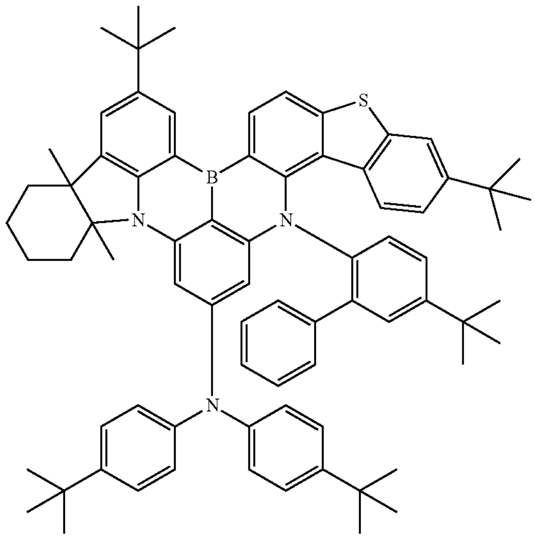
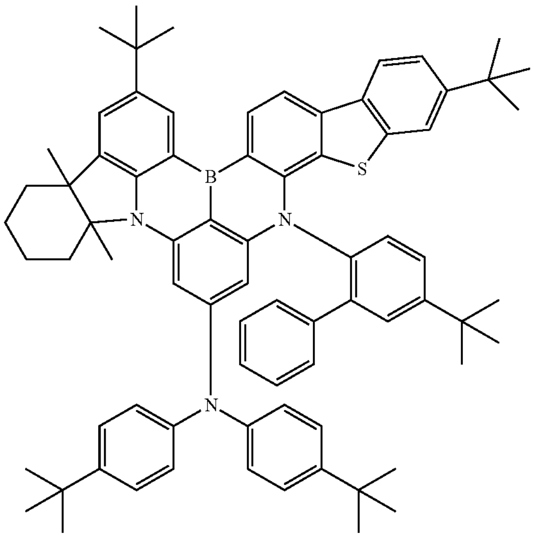
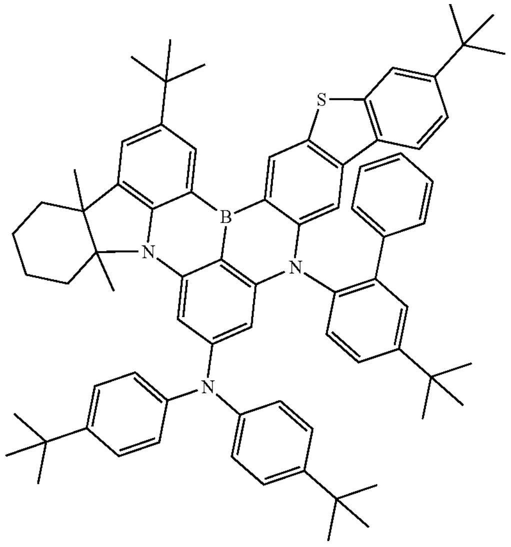
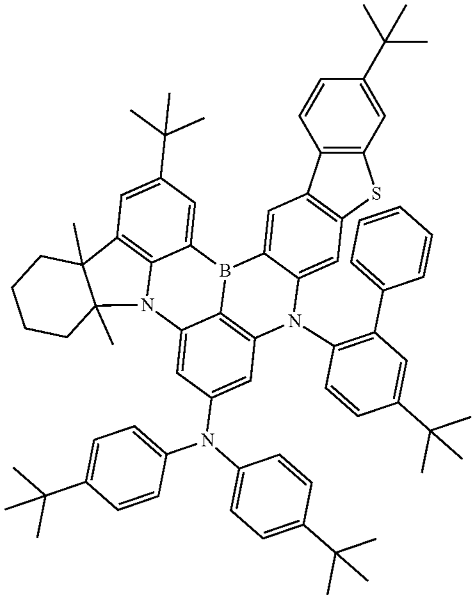

-continued
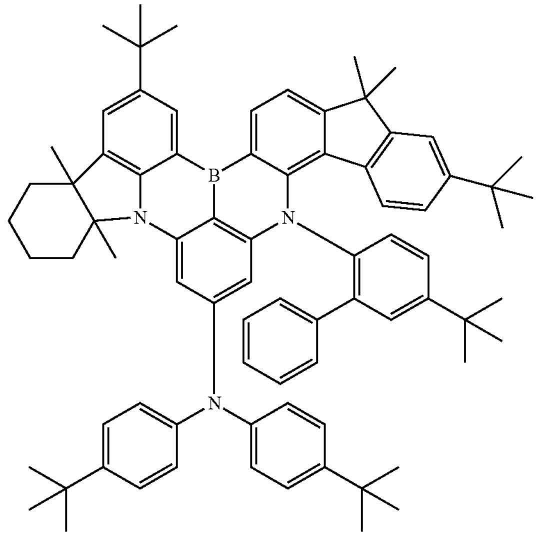
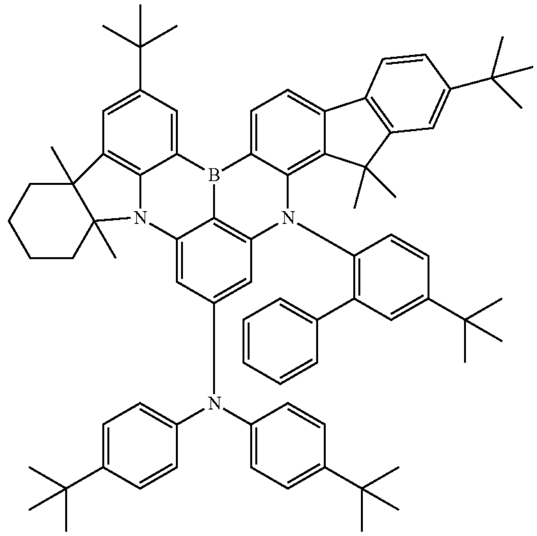
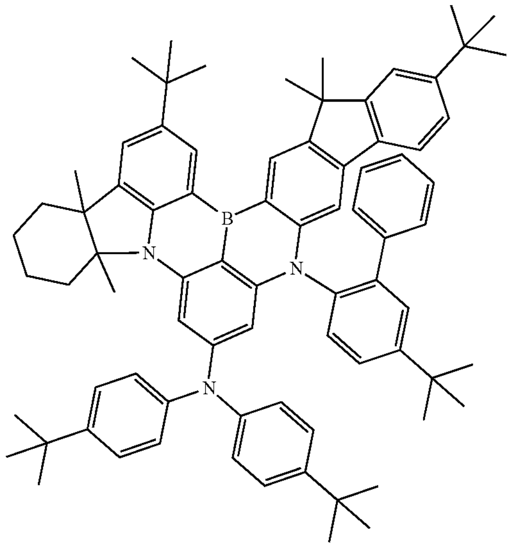
-continued
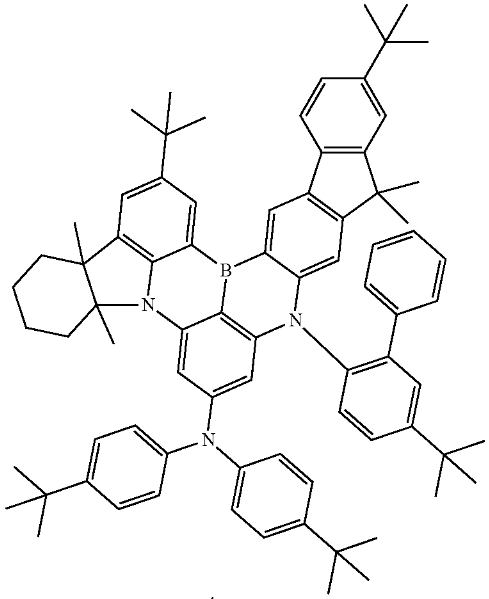
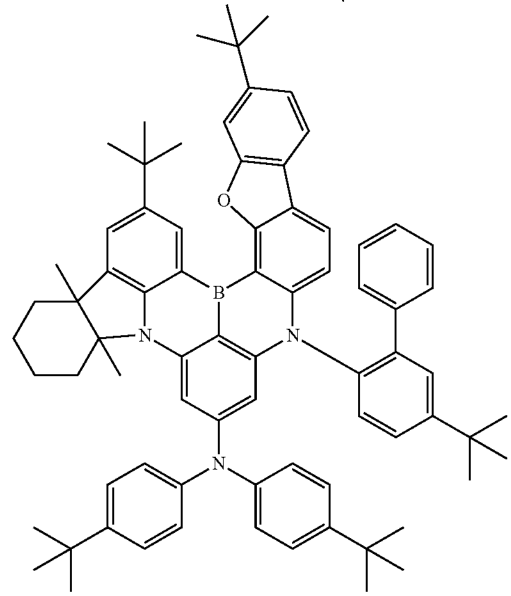
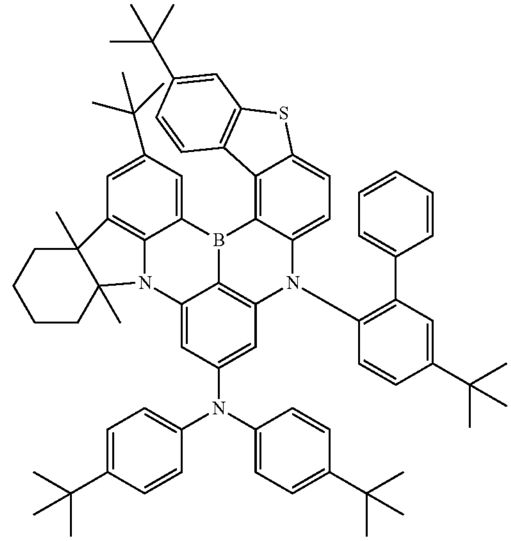

-continued
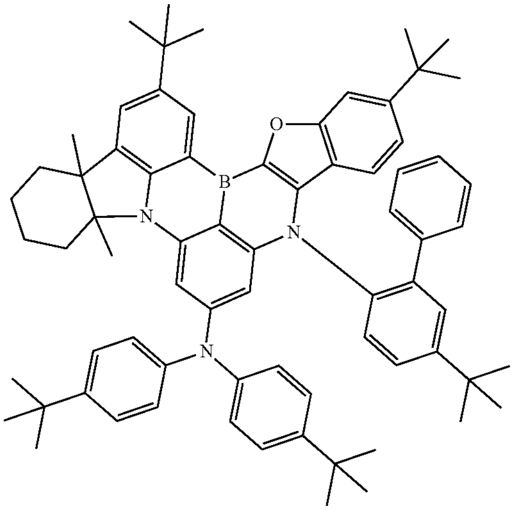
-continued
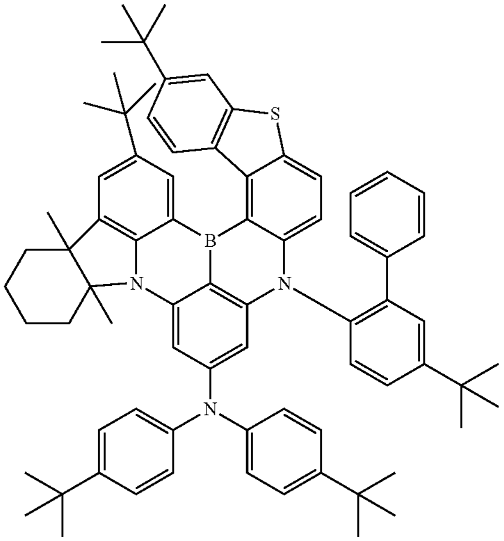
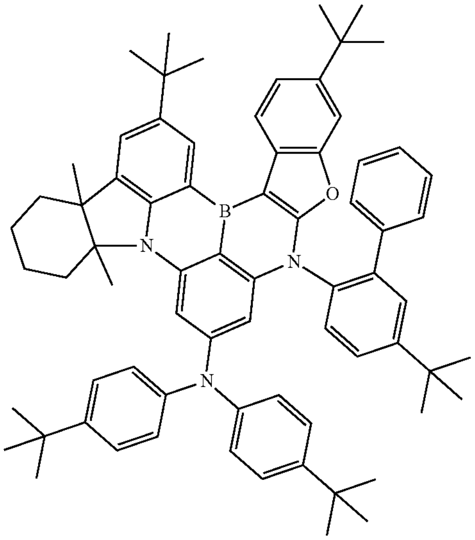
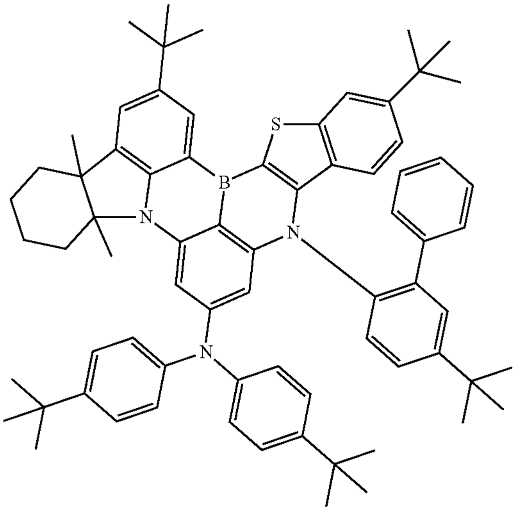
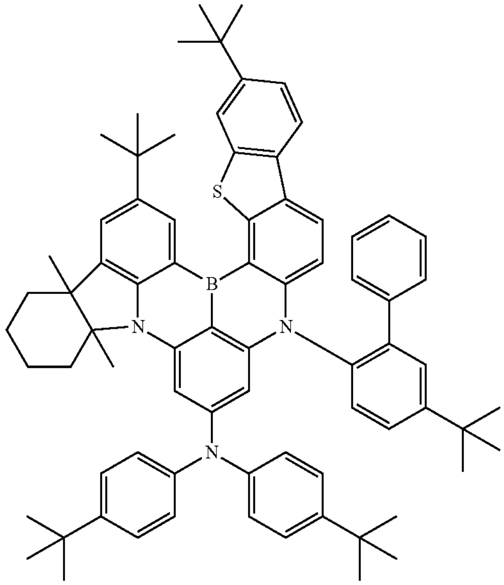
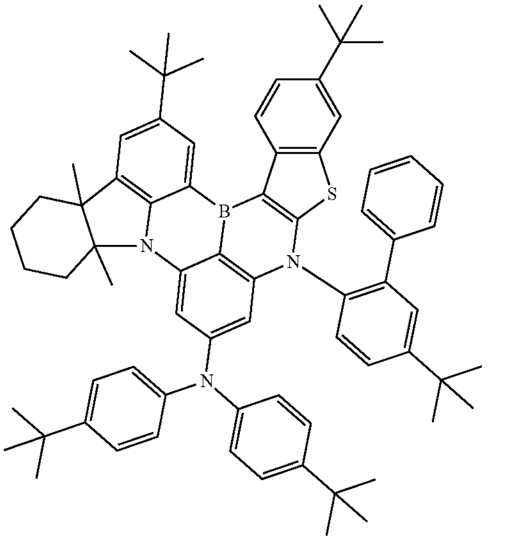

-continued
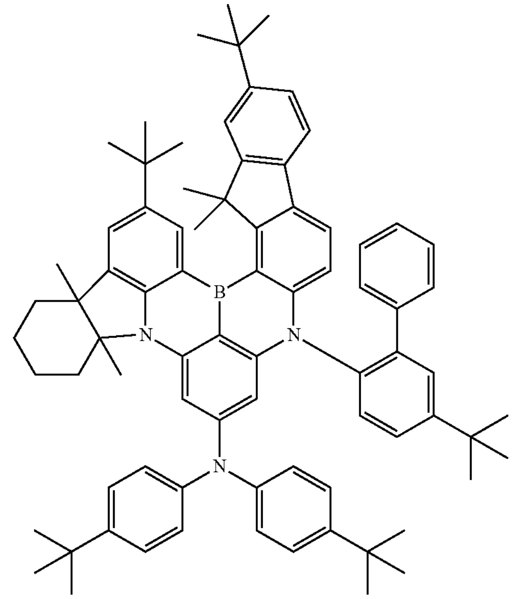
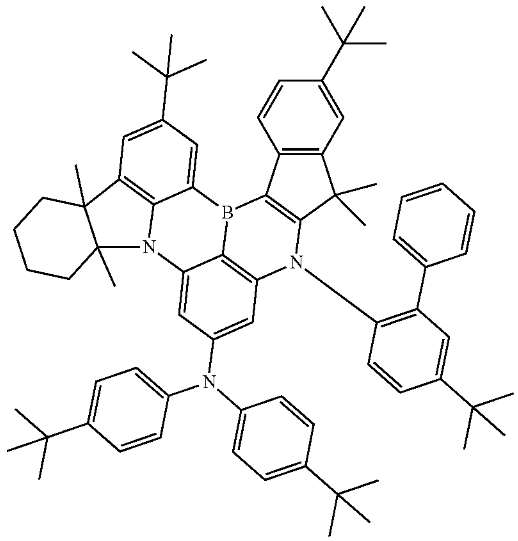
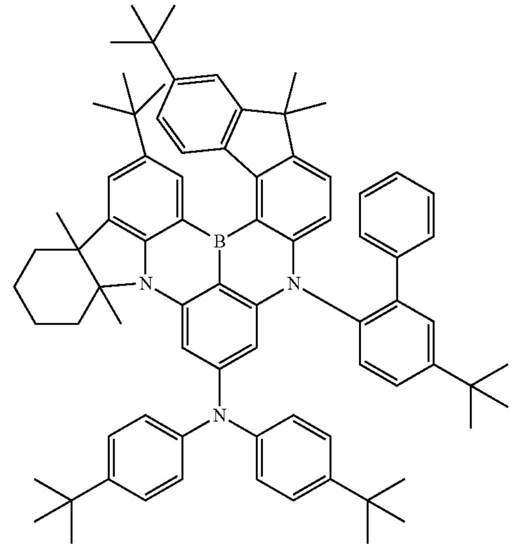
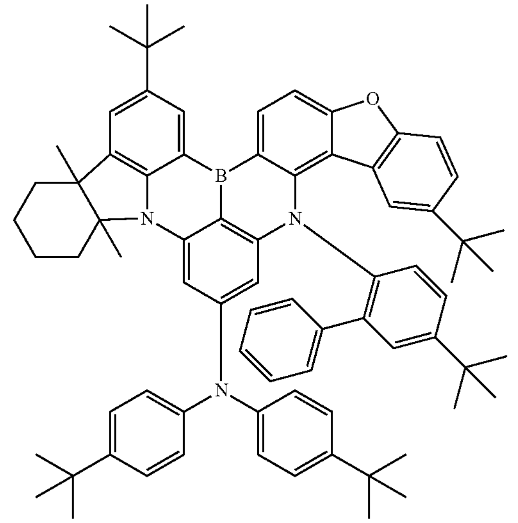
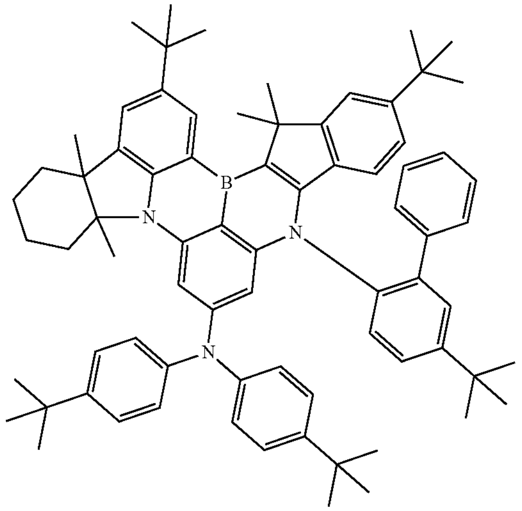
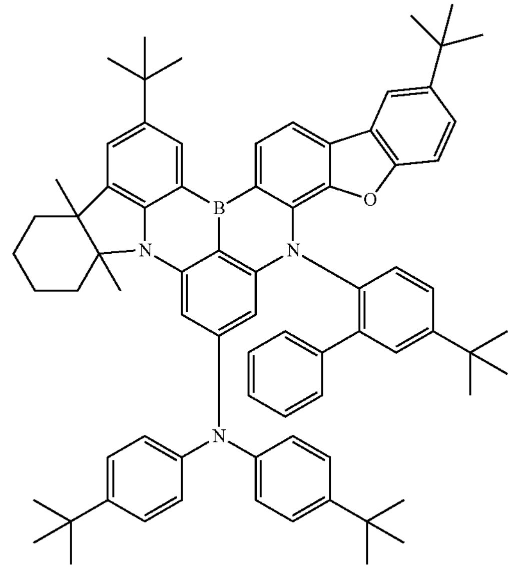
-continued -continued
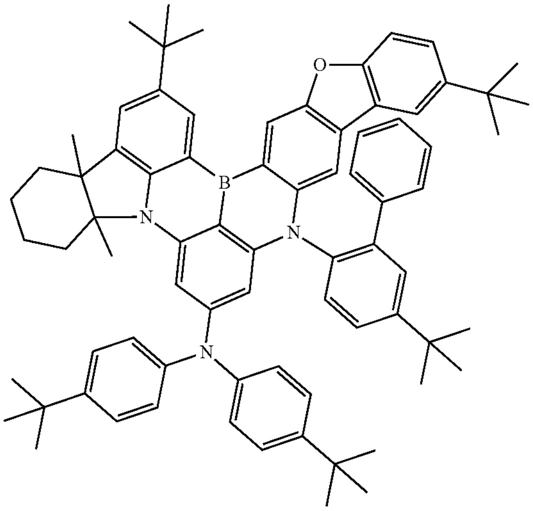
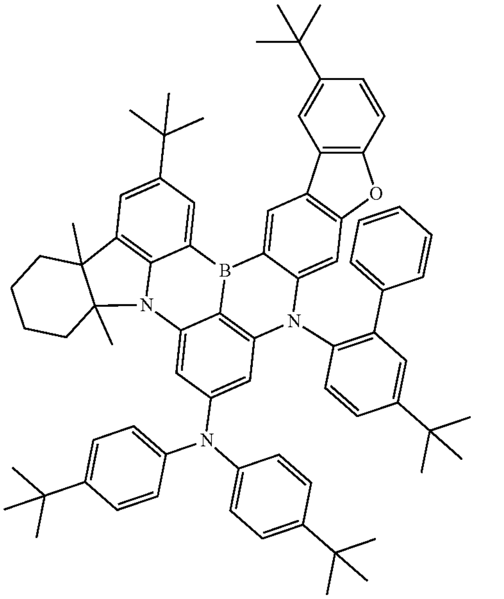
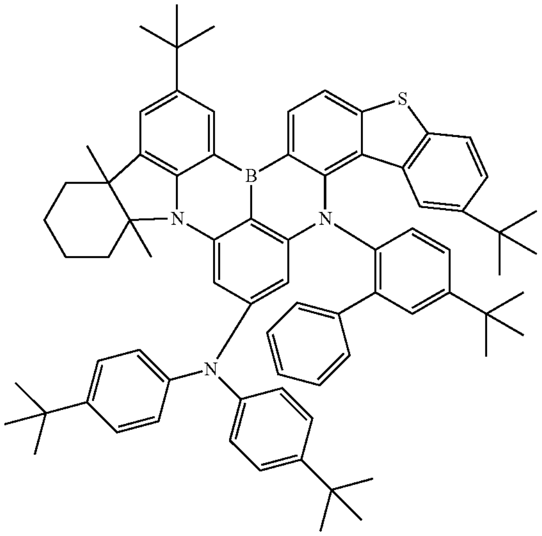
-continued
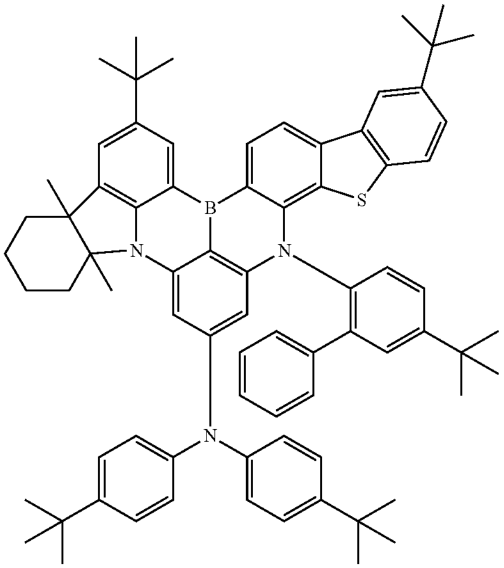
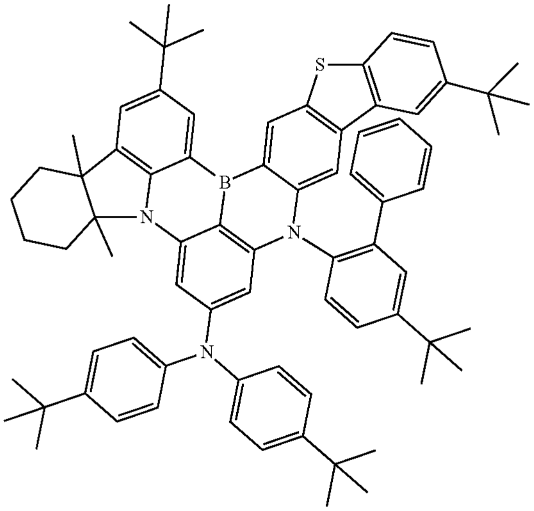
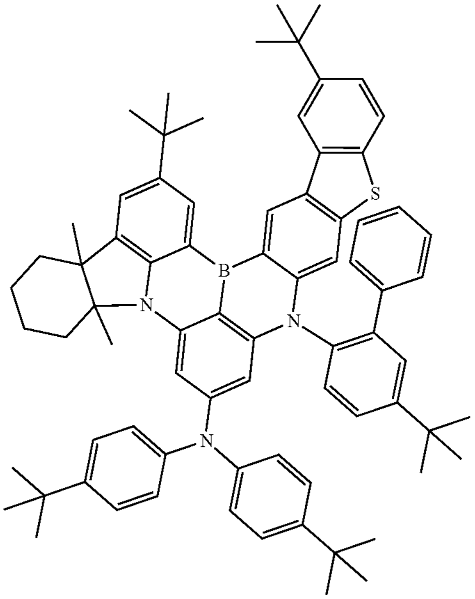

-continued
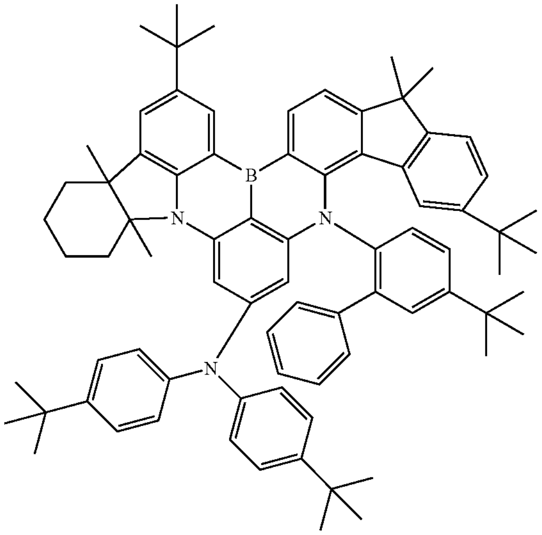
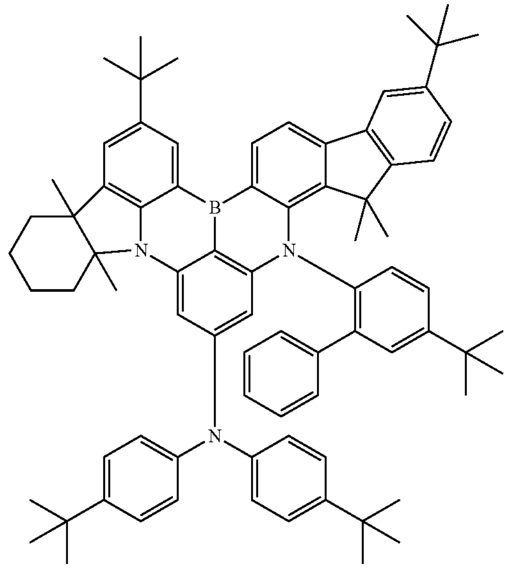
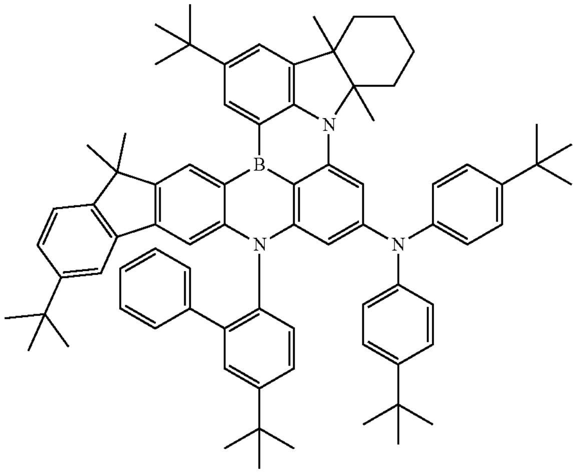
-continued
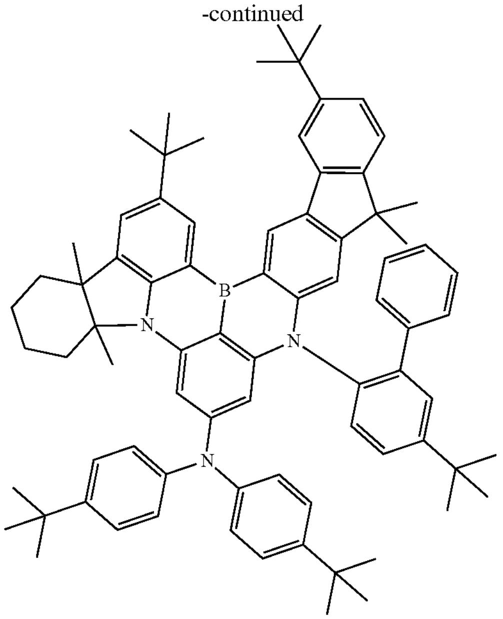
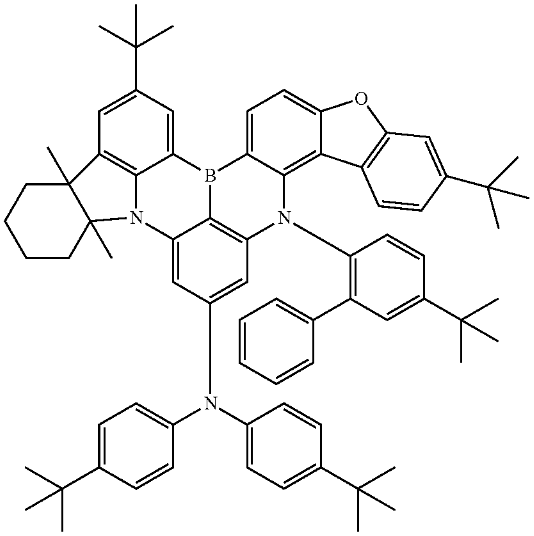
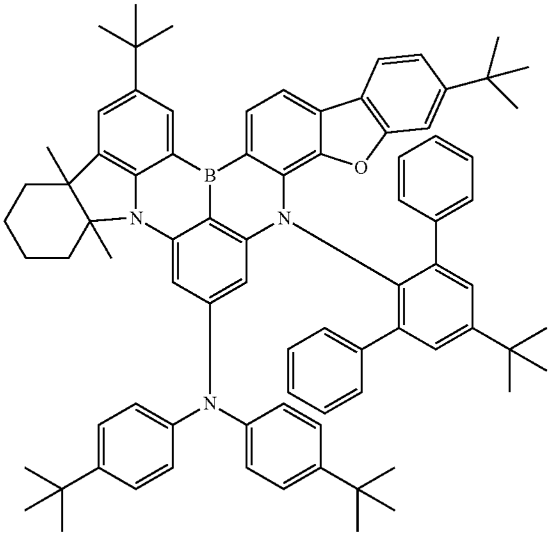

-continued
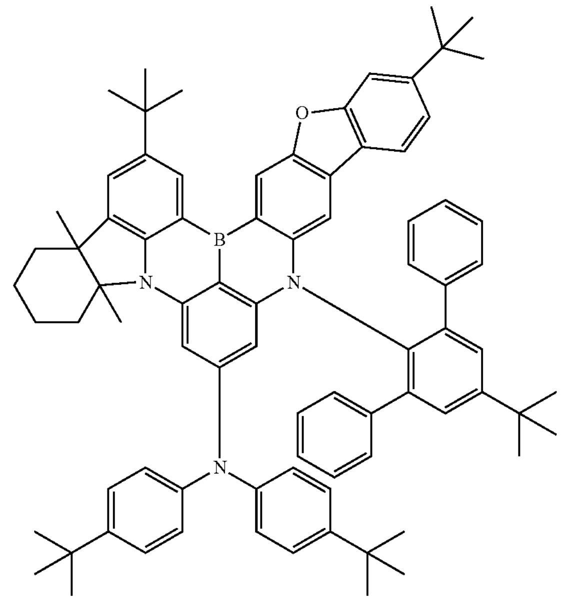
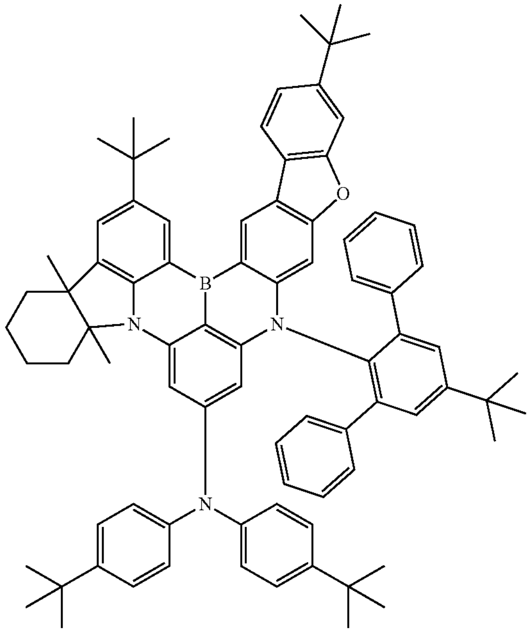
-continued
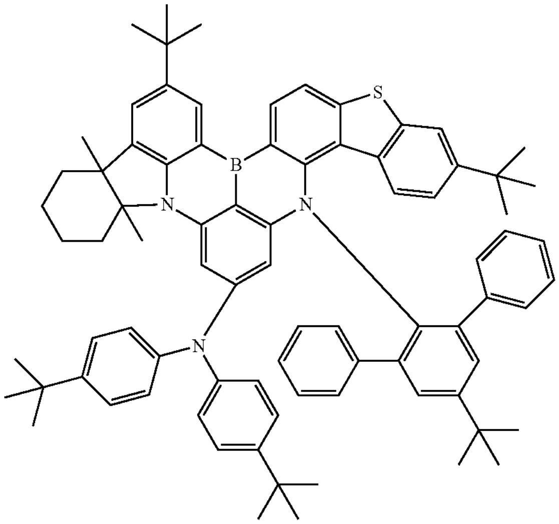
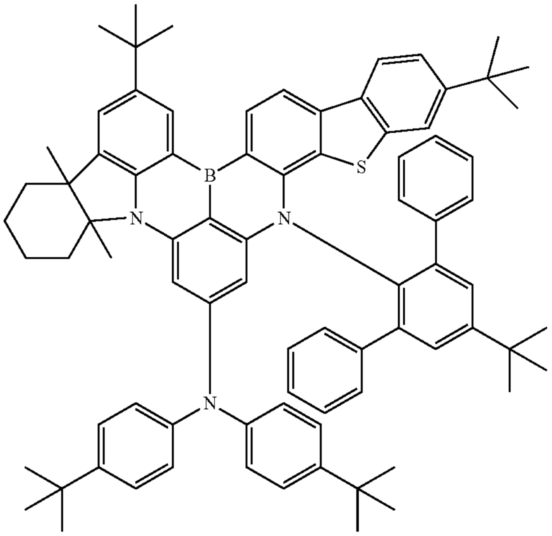
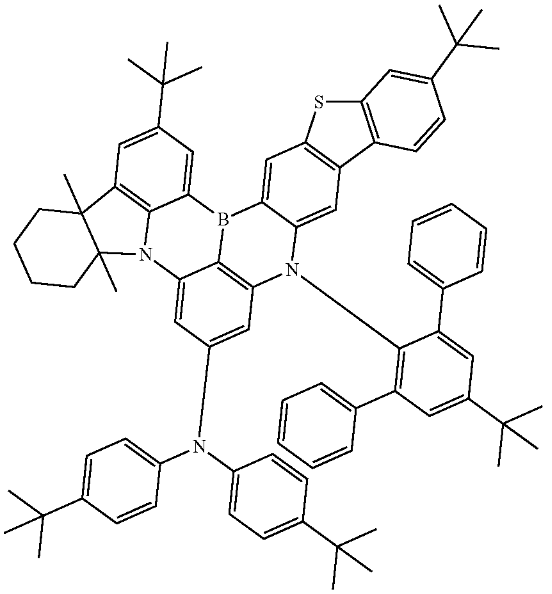

-continued
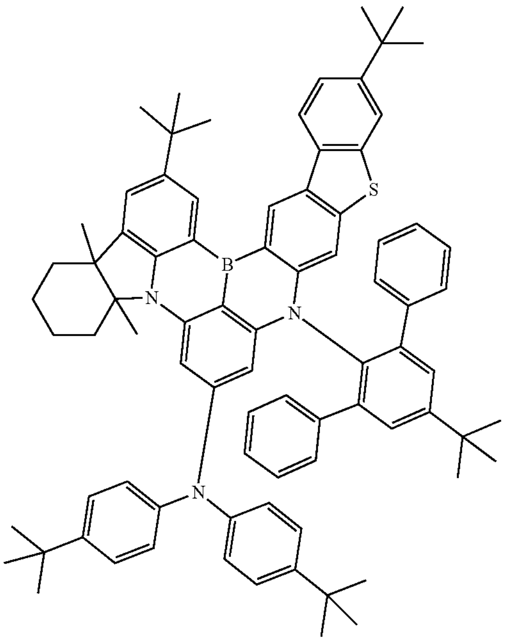
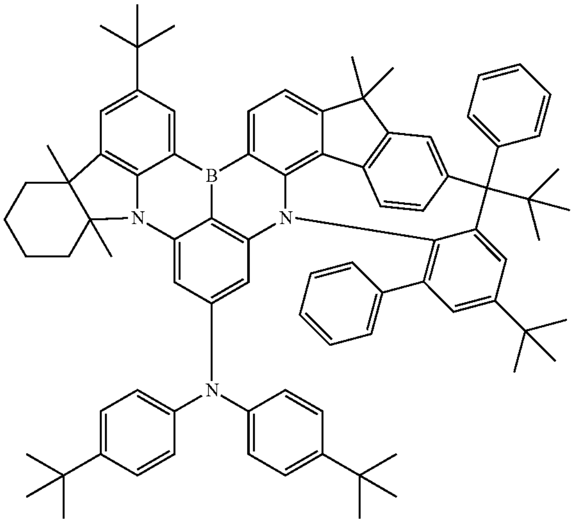
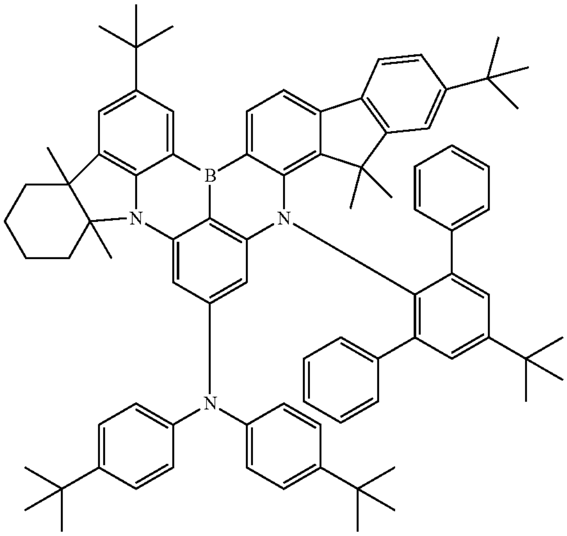
-continued
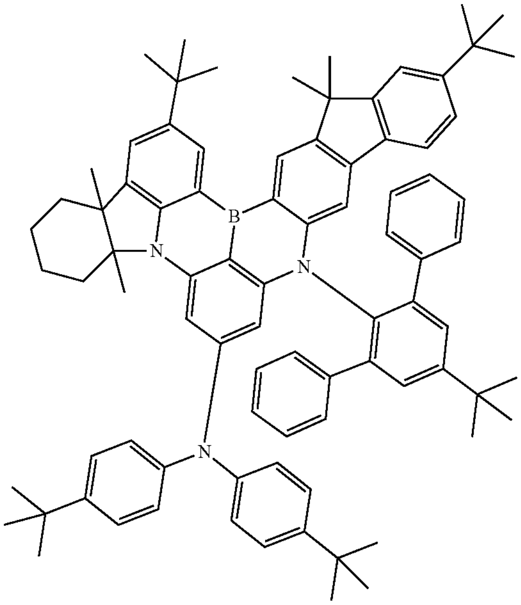
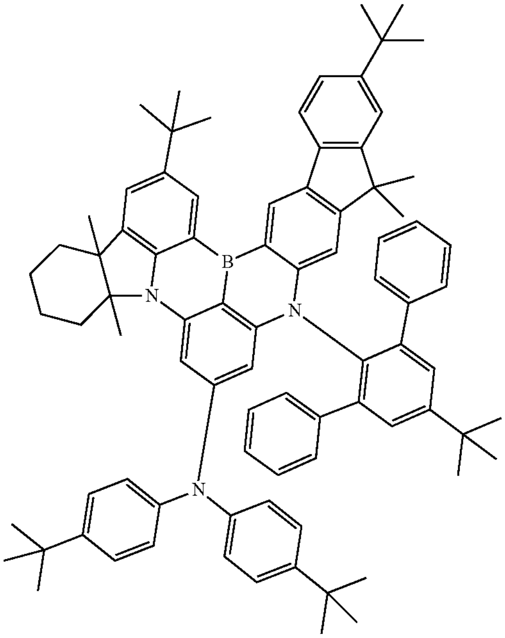

-continued
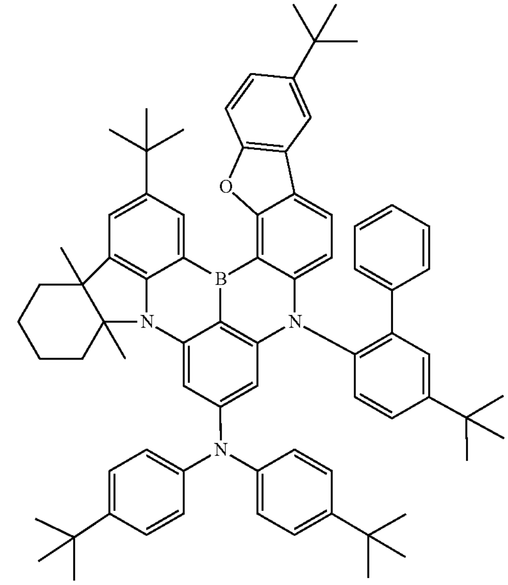
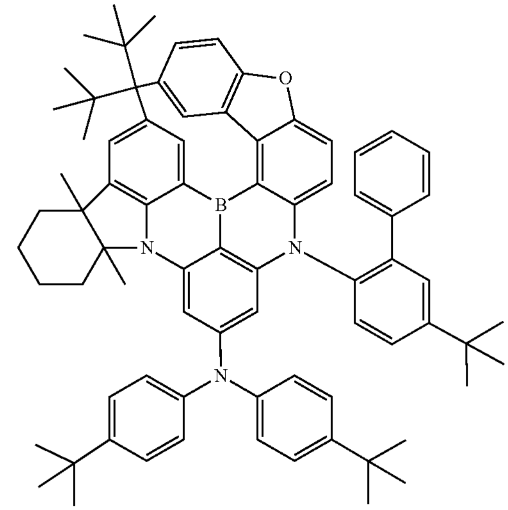
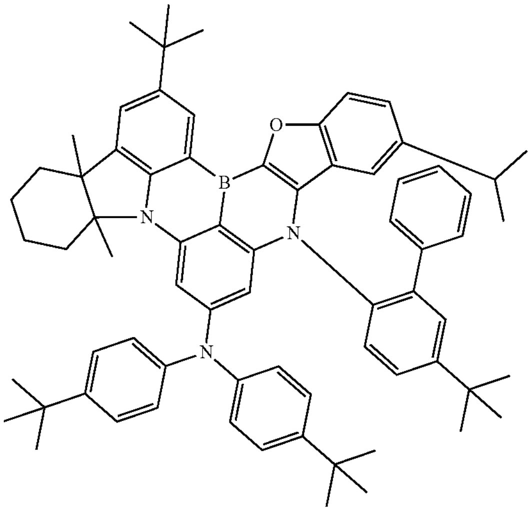
-continued
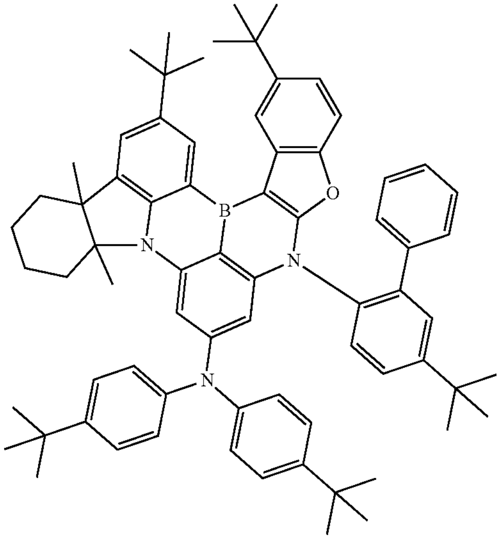
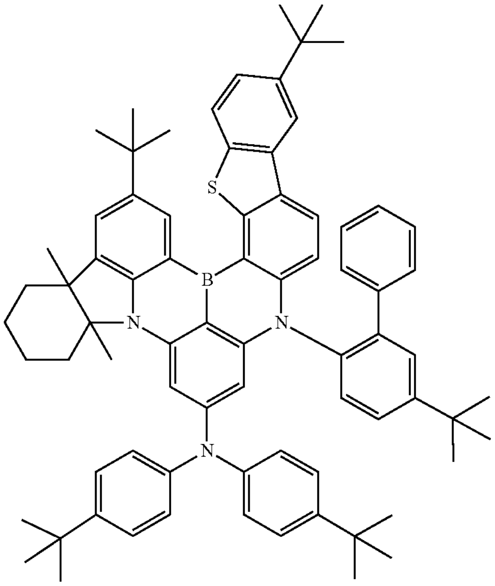
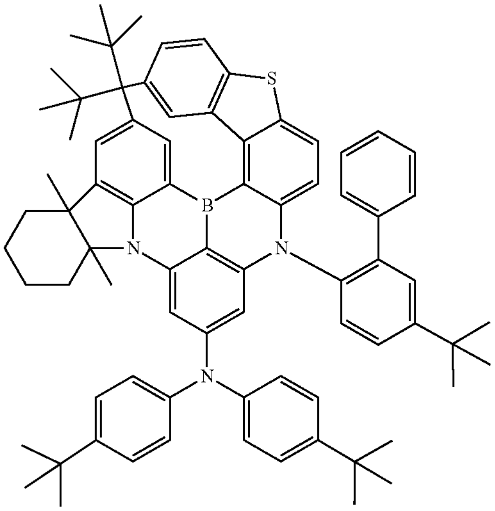

-continued
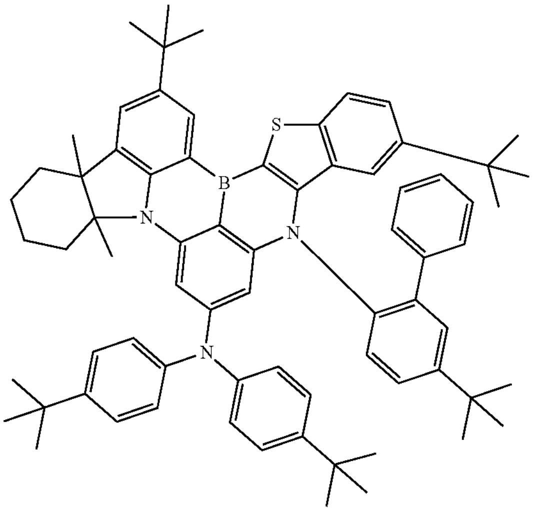
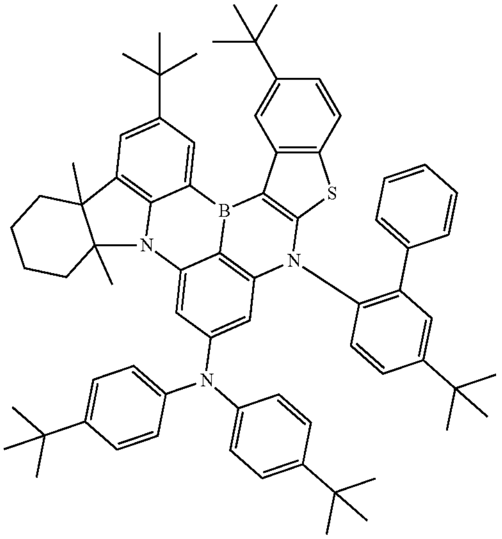
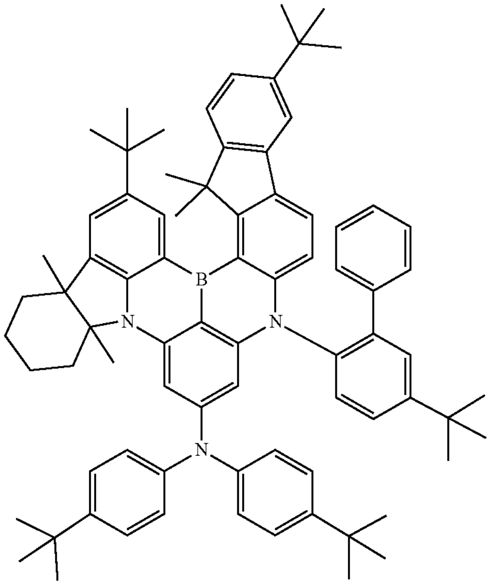
-continued
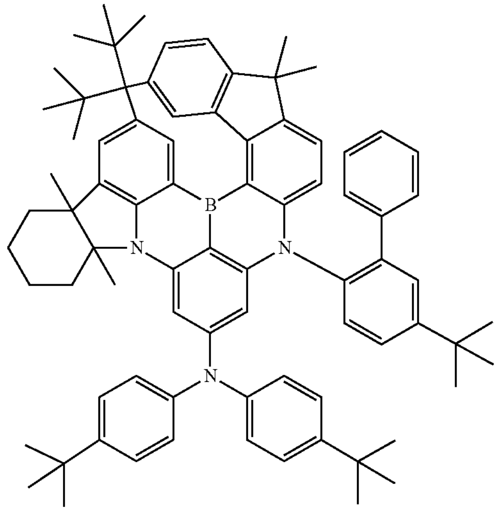
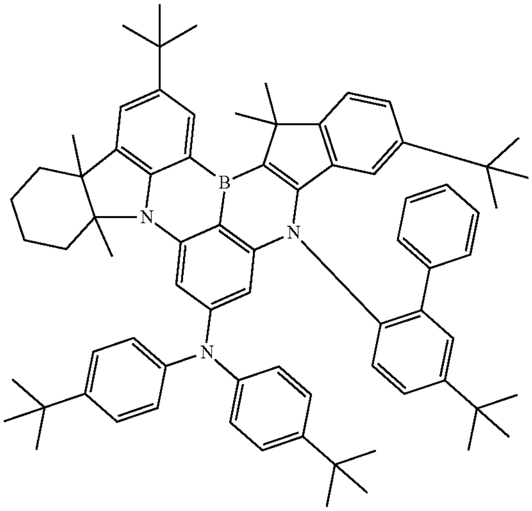
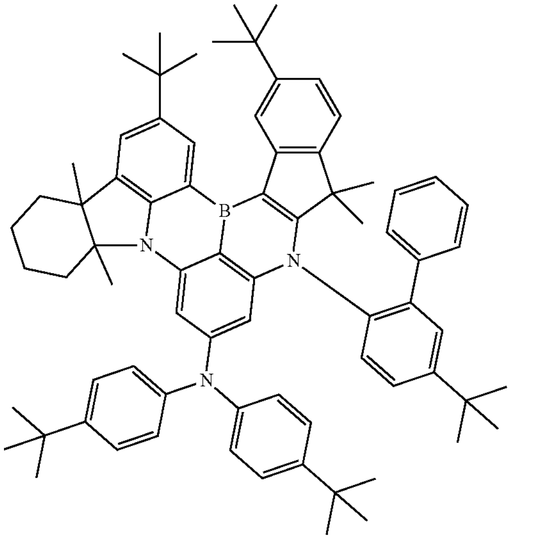

-continued
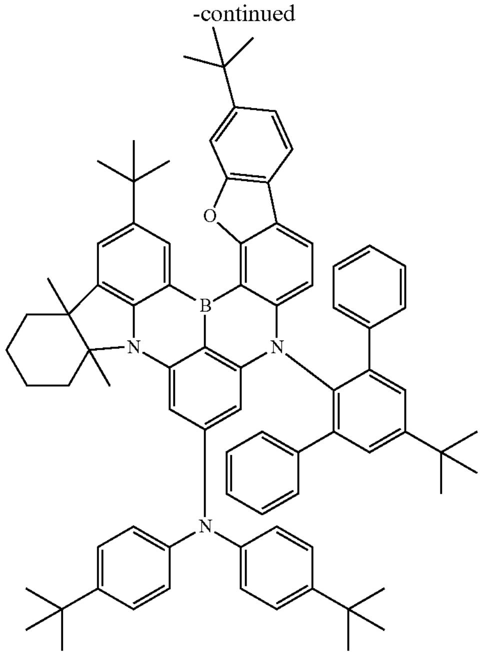
-continued
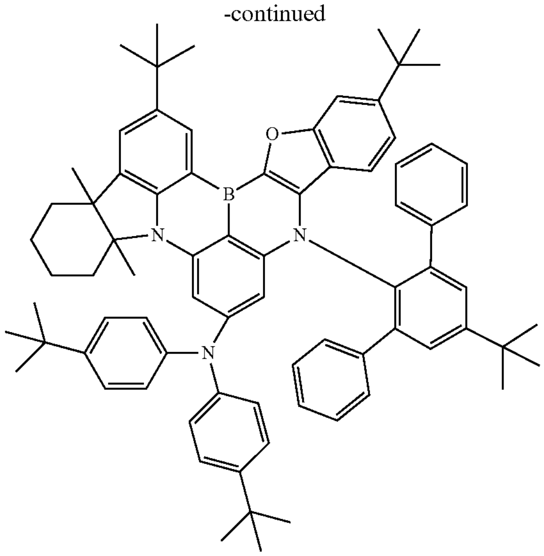
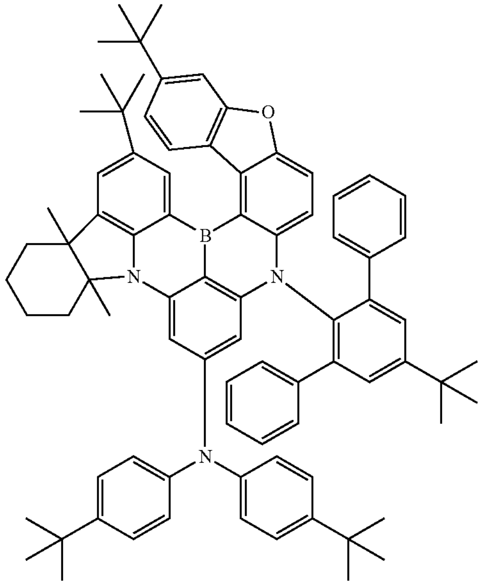
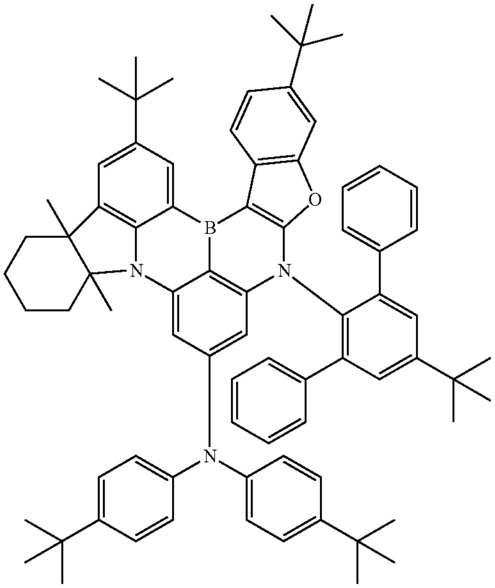

-continued
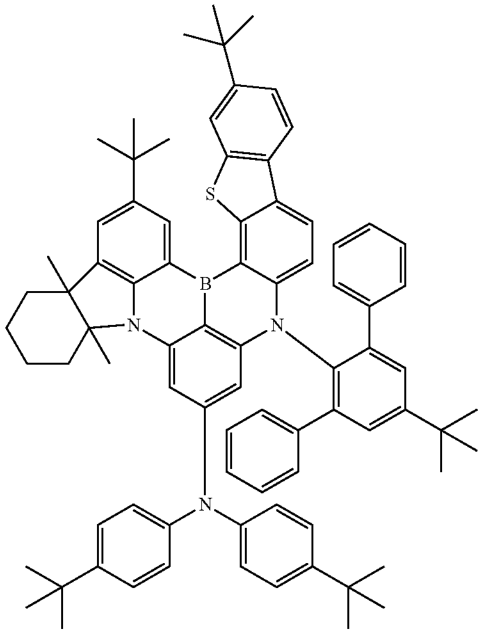
-continued
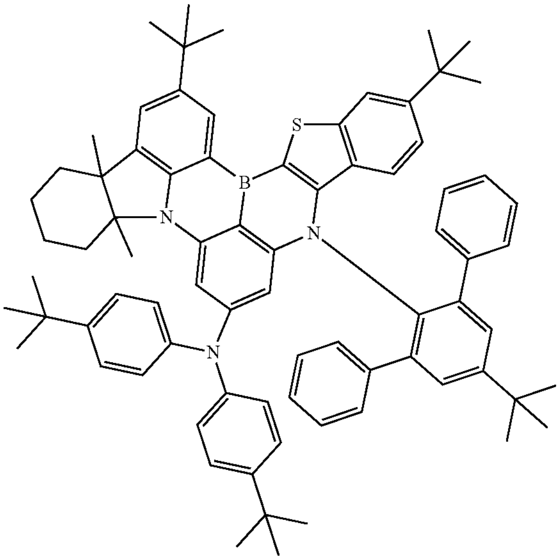
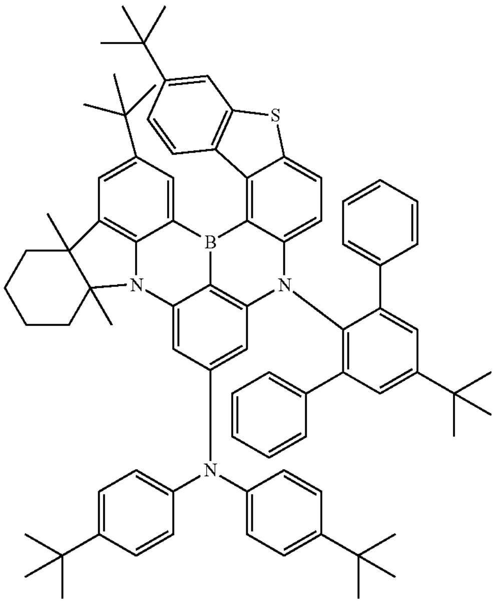
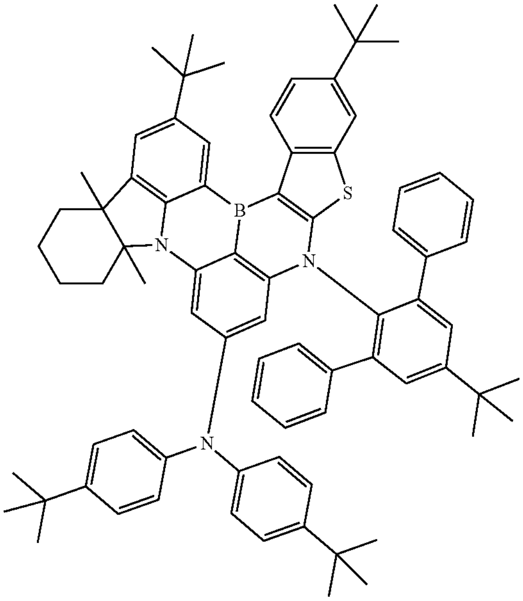

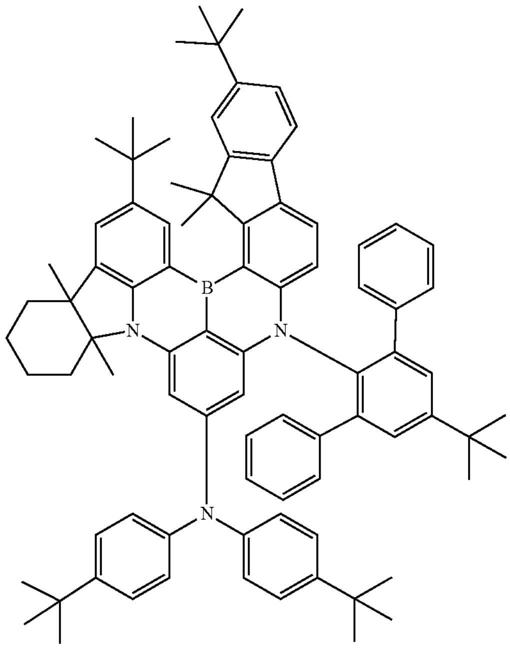
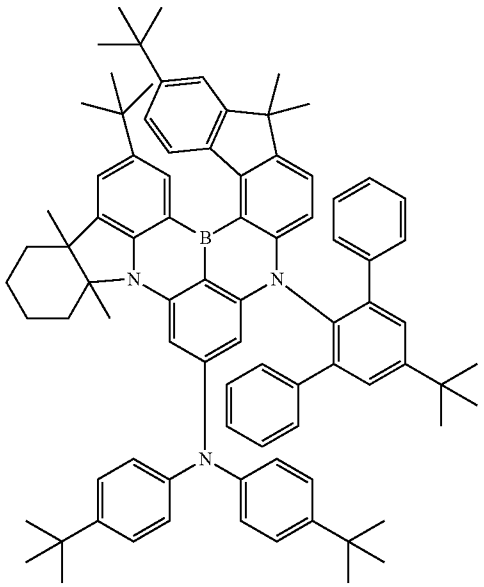
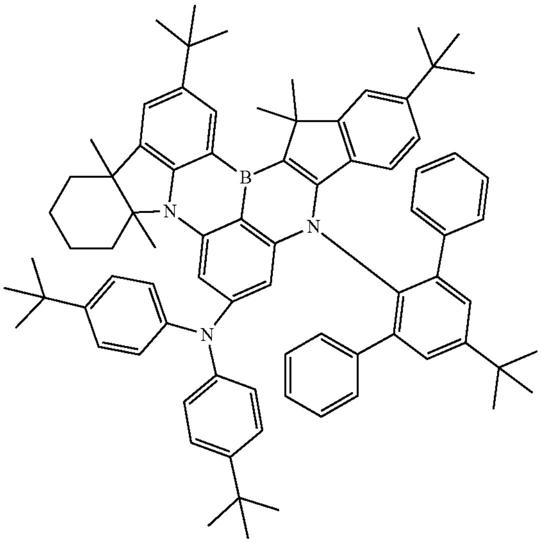
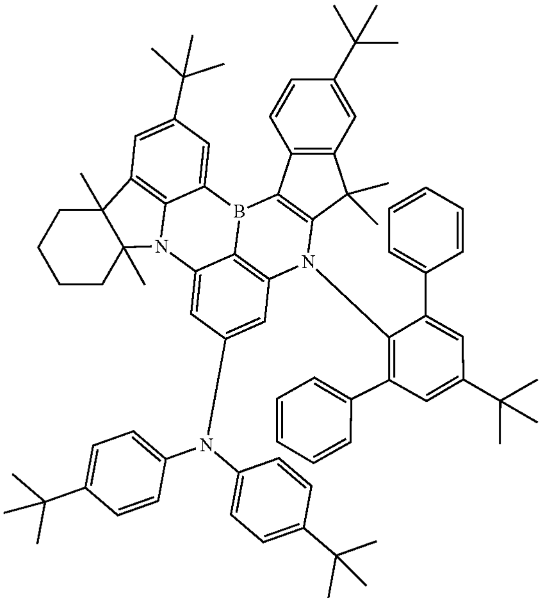
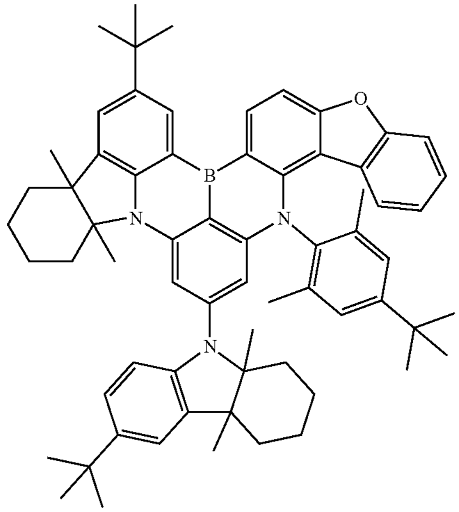

-continued
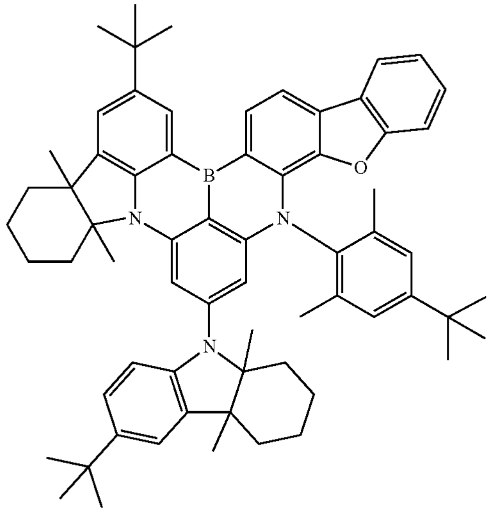
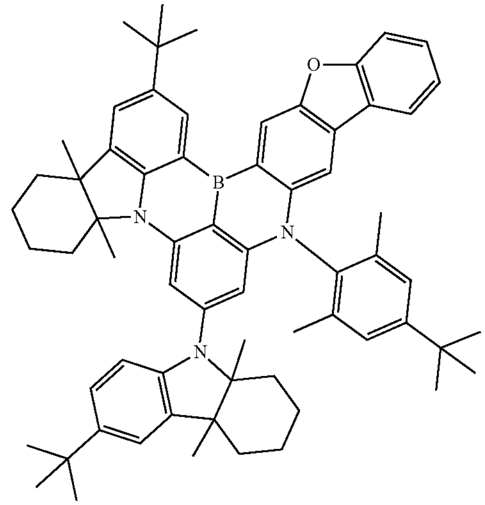
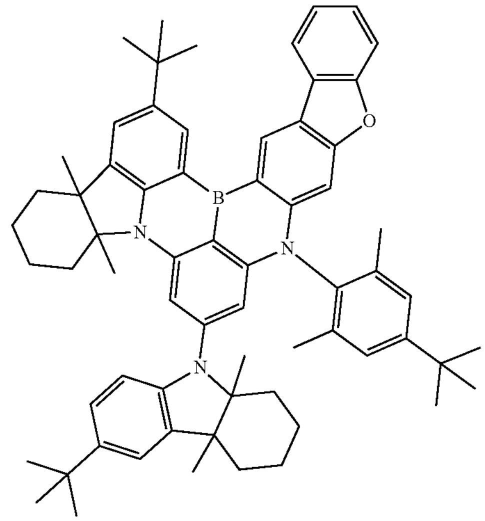
-continued
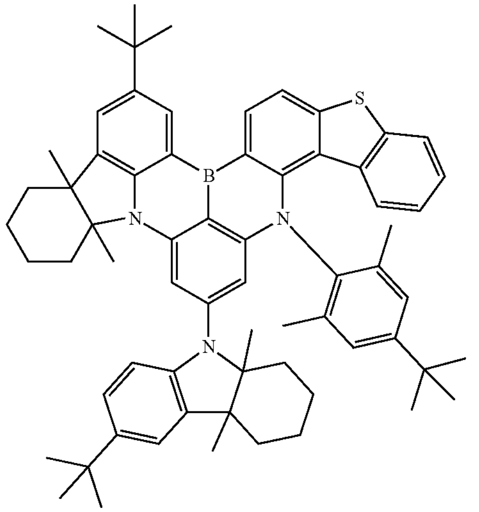
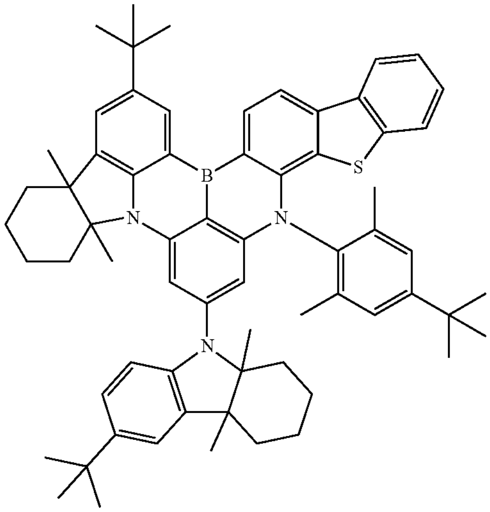
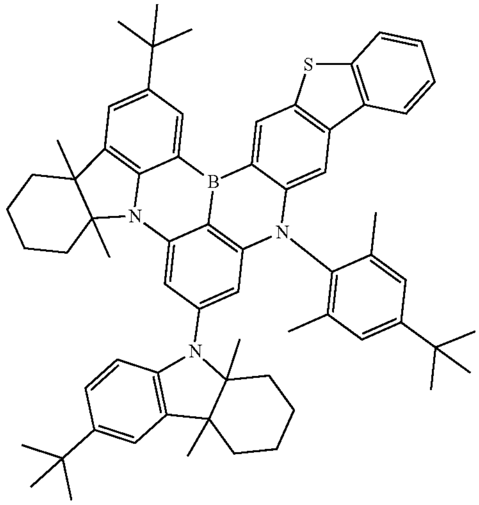

-continued
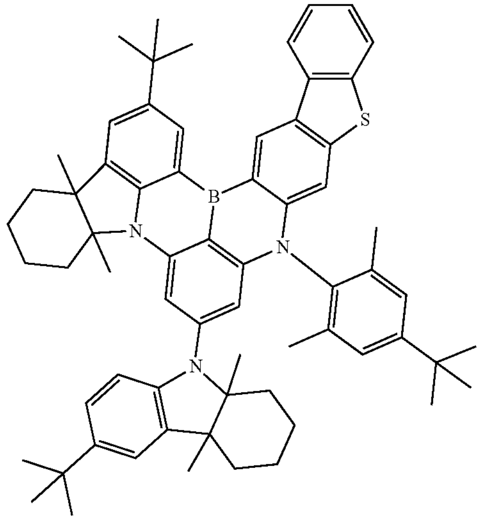
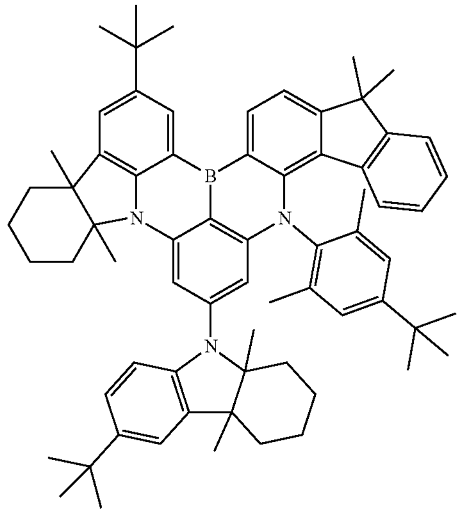
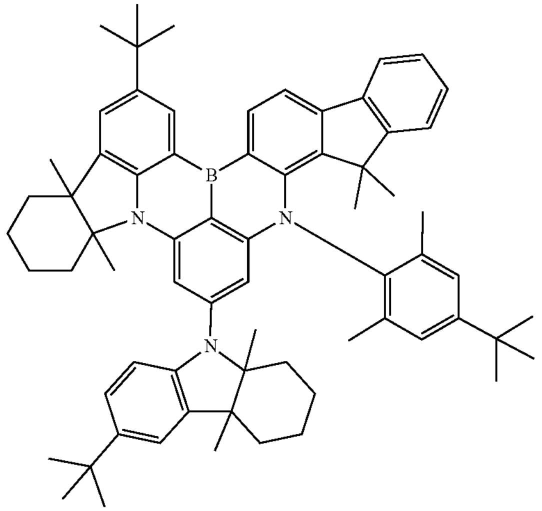
-continued
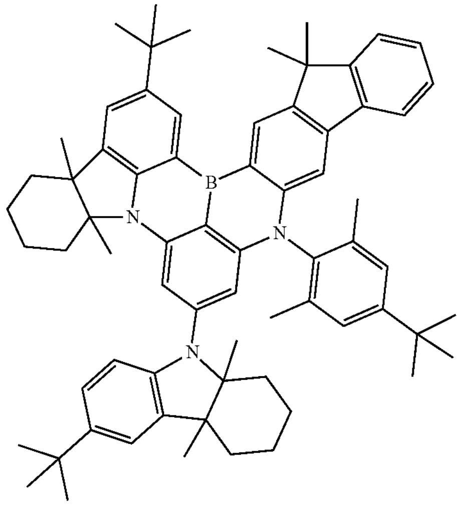
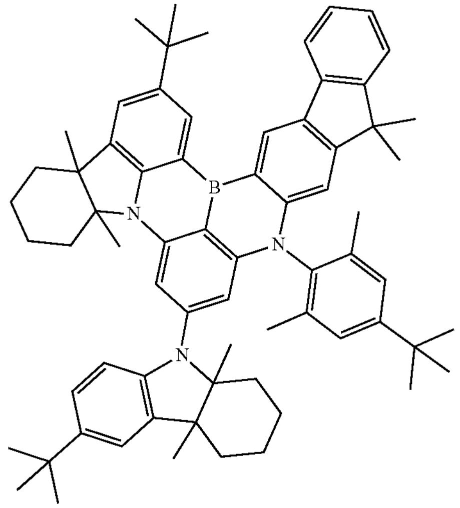
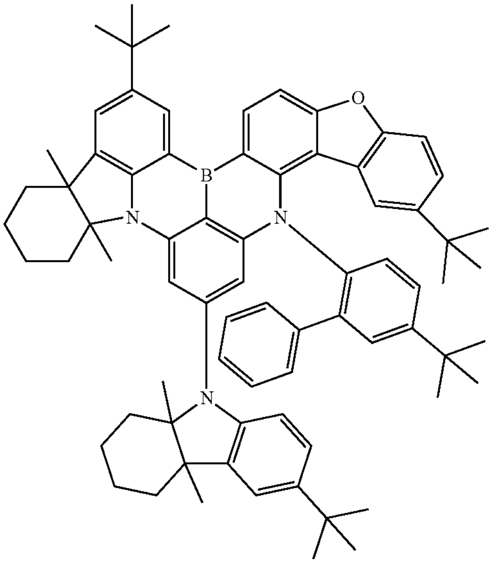

-continued
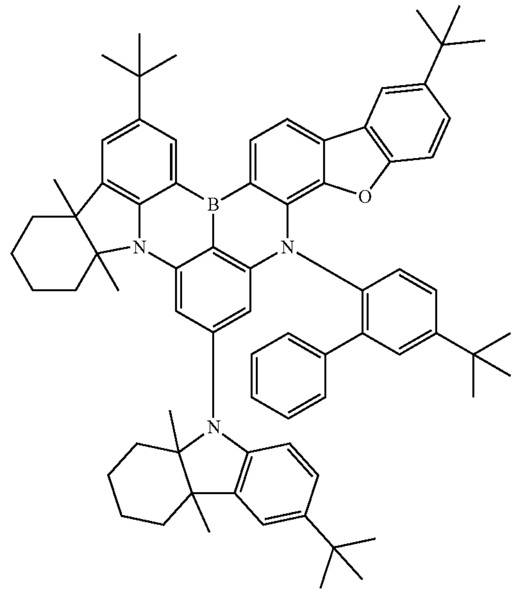
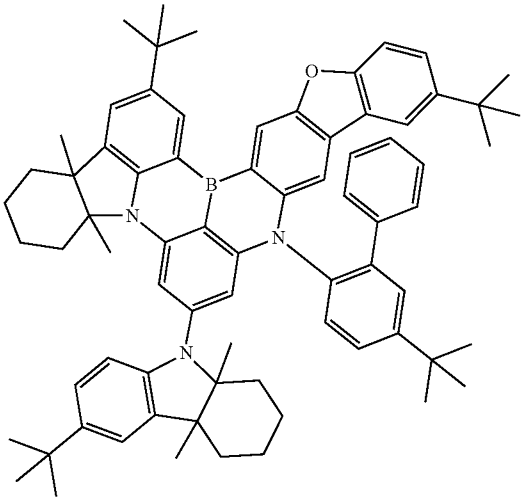
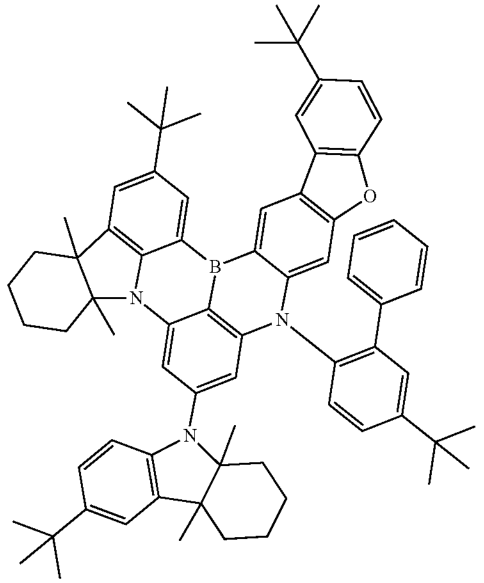
-continued
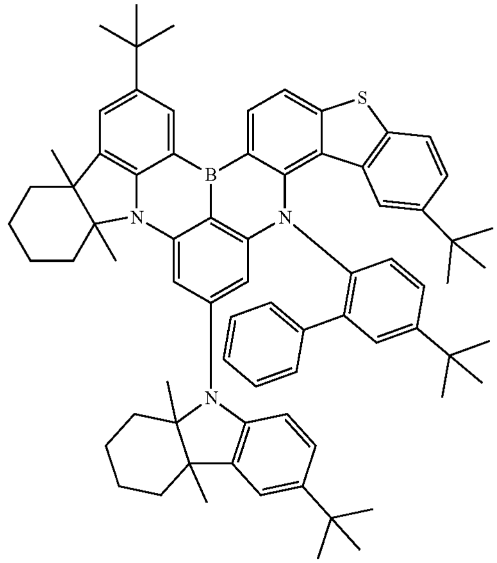
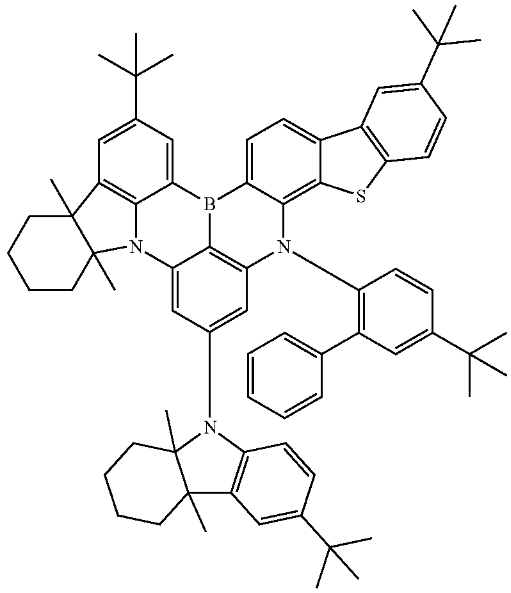
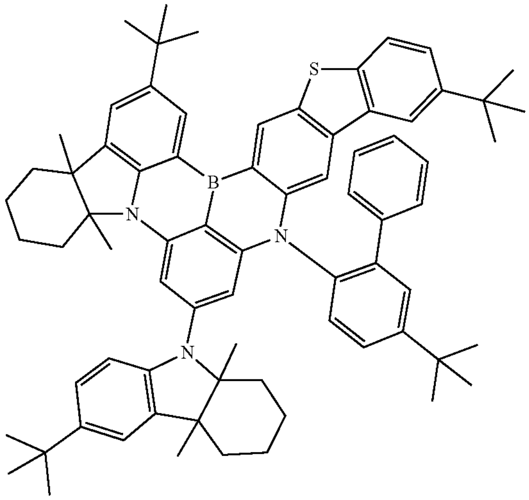

-continued
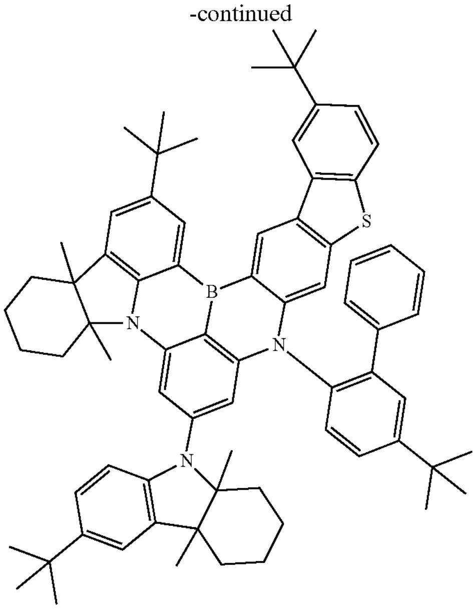
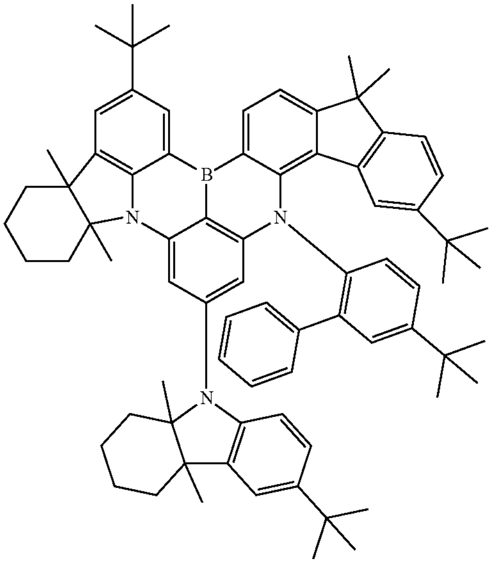
-continued
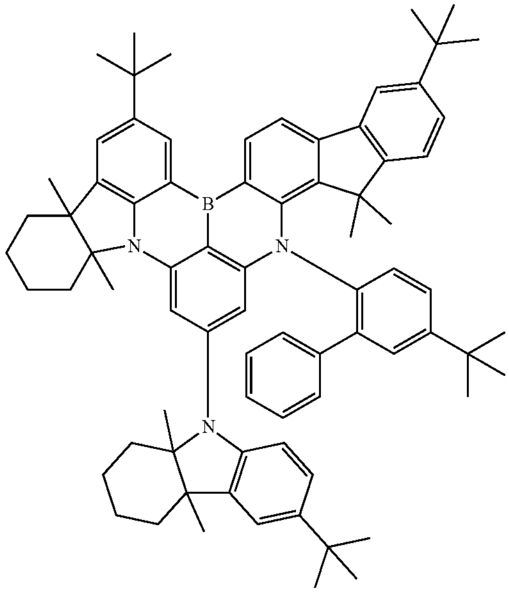
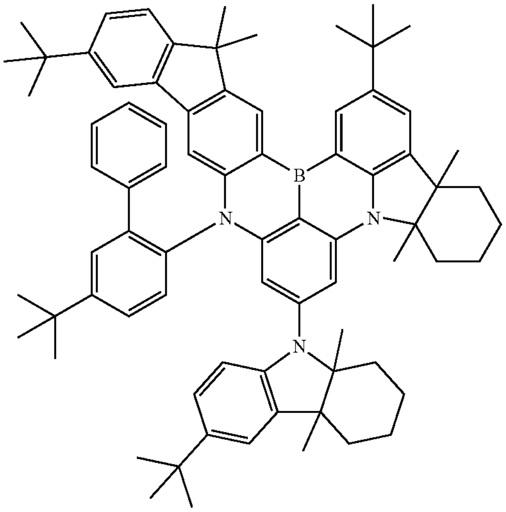
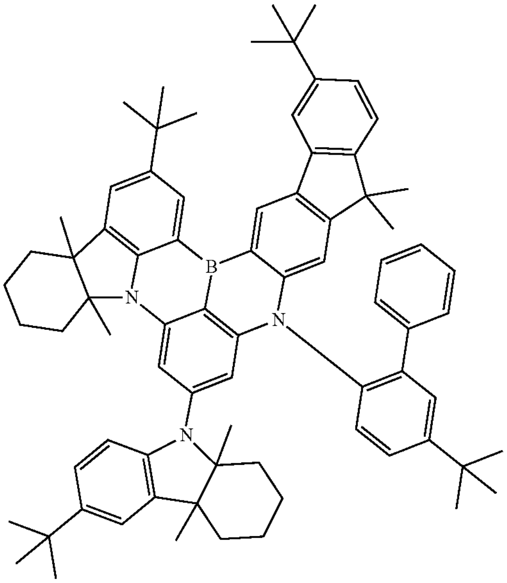

-continued
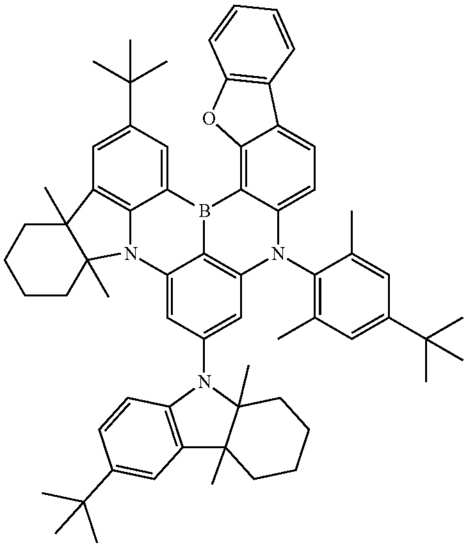
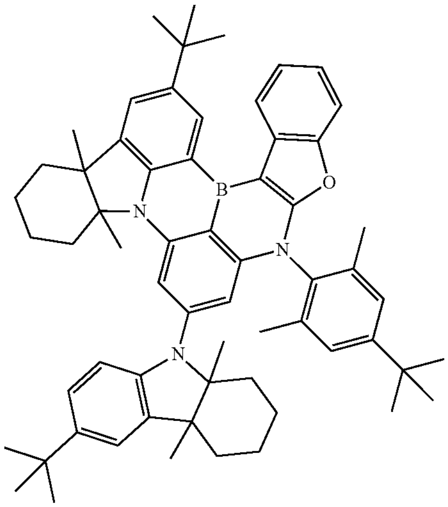
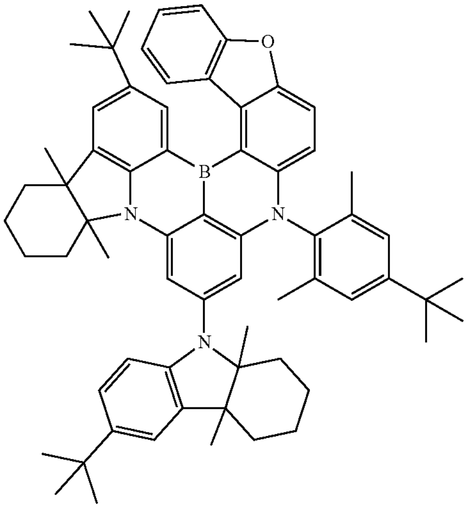
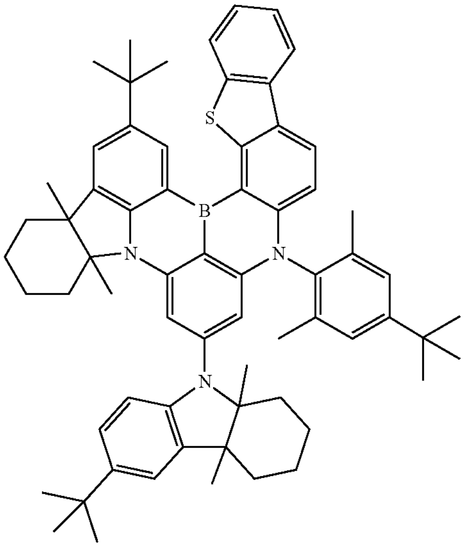
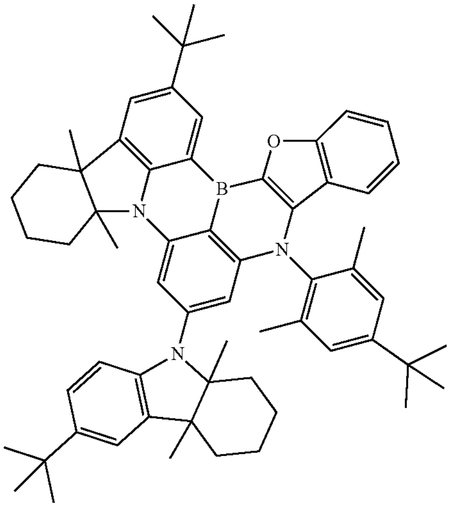
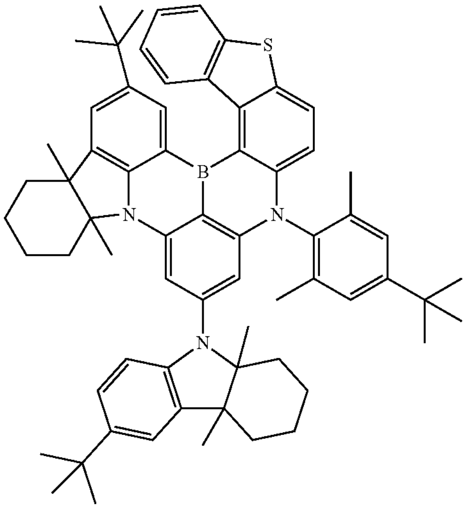

-continued
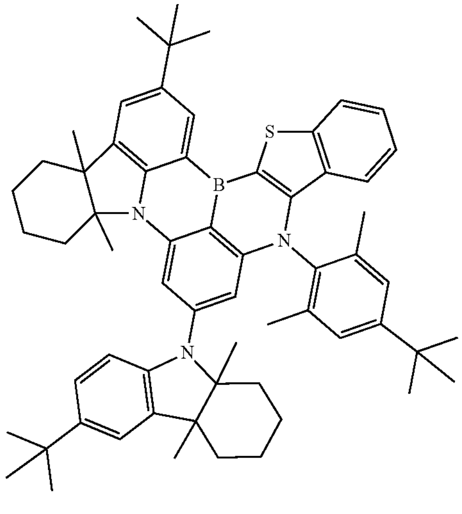
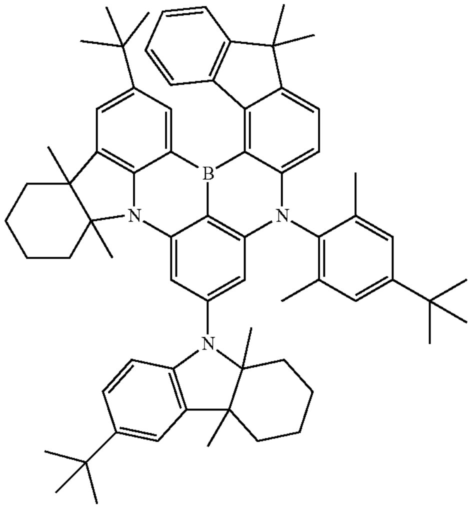
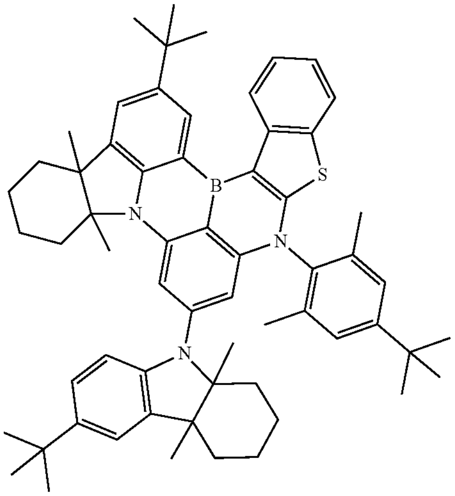
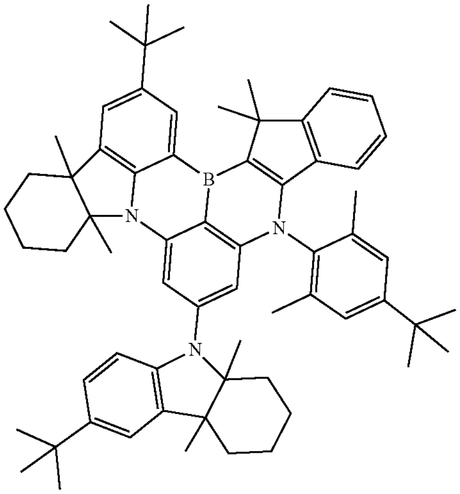
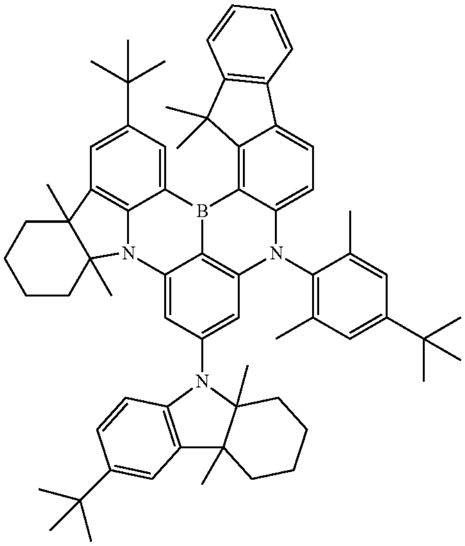
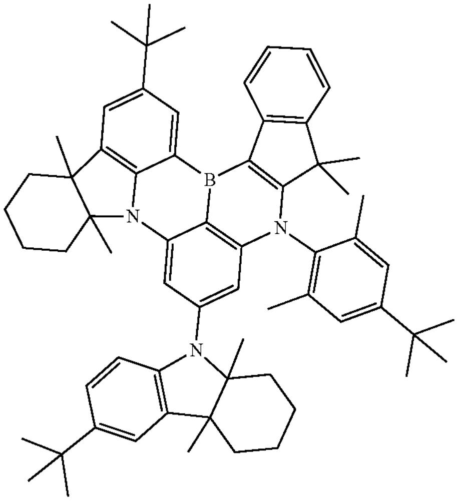

-continued
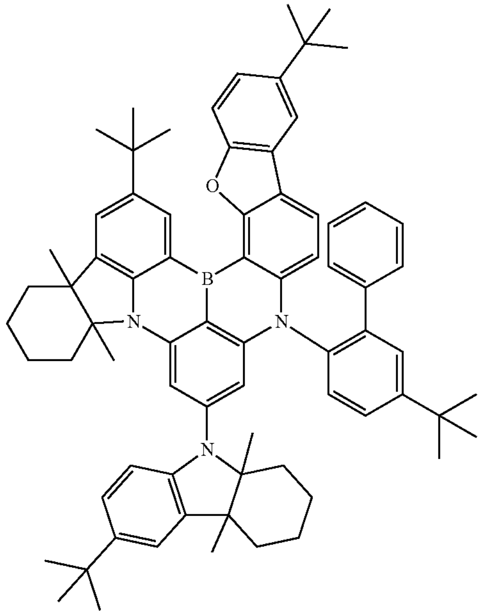
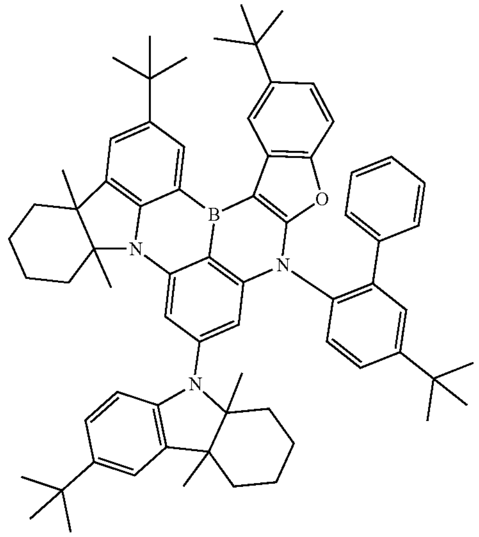
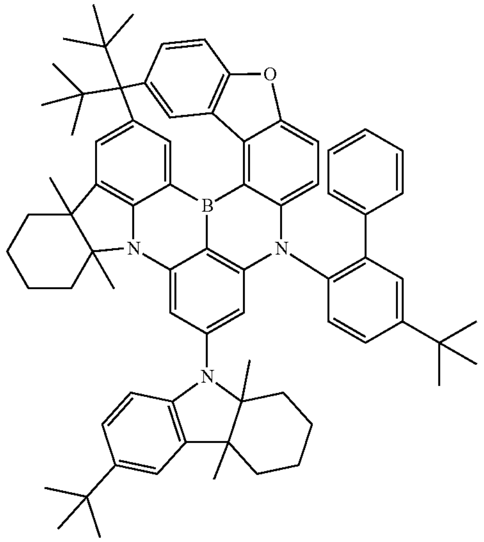
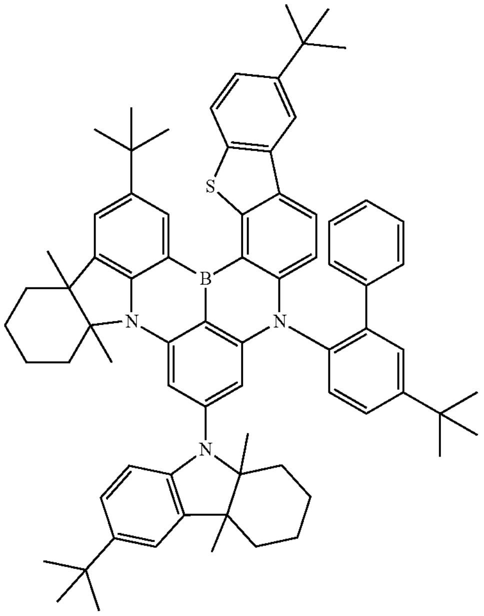
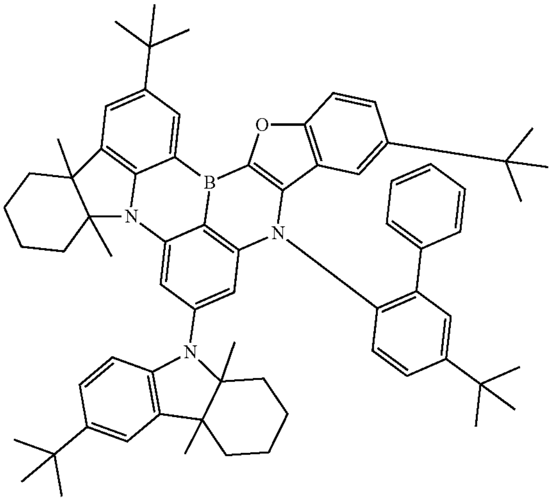
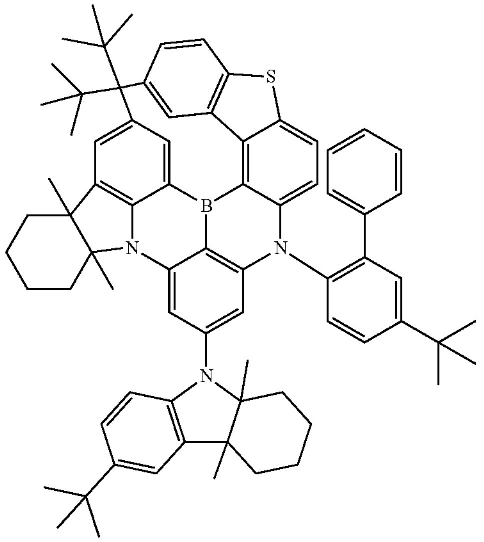
-continued -continued
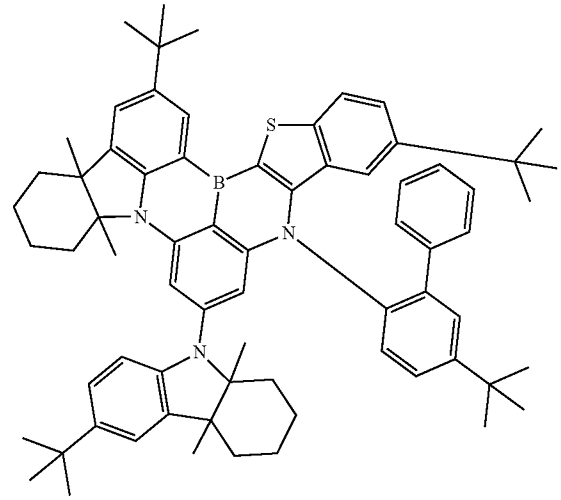
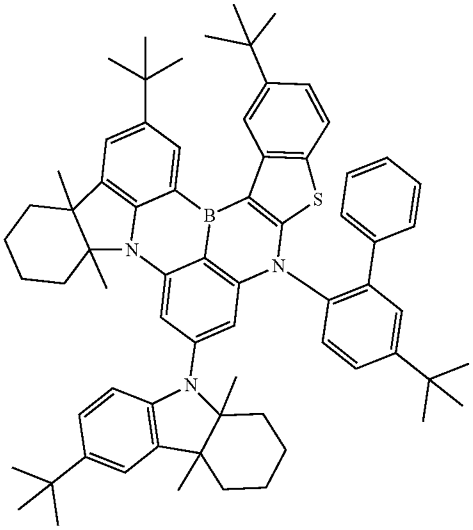
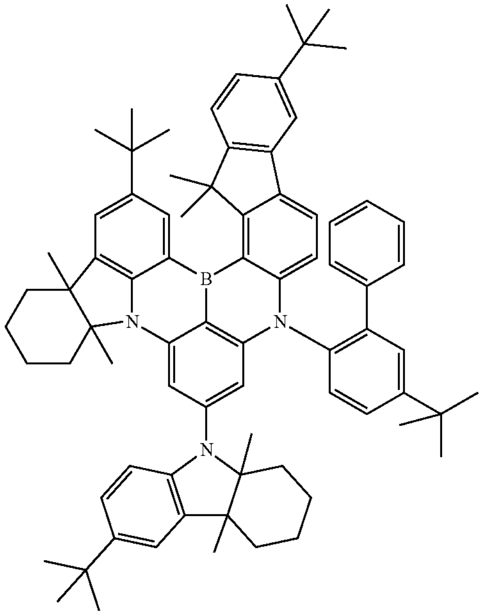
-continued
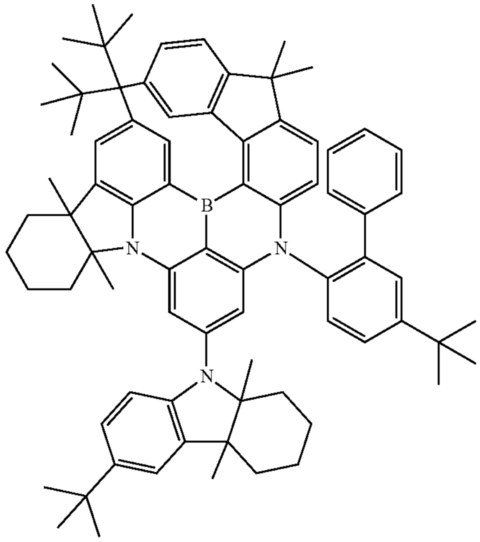
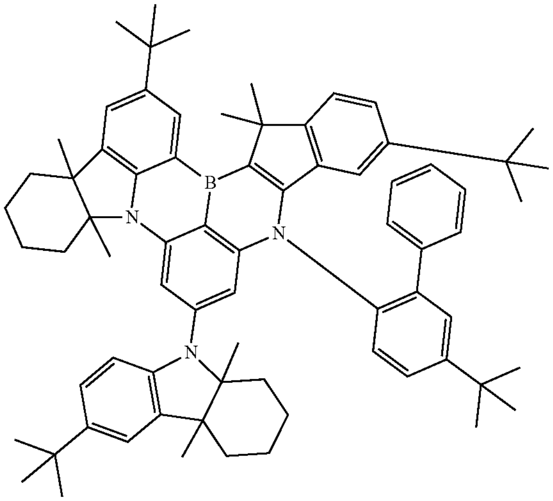
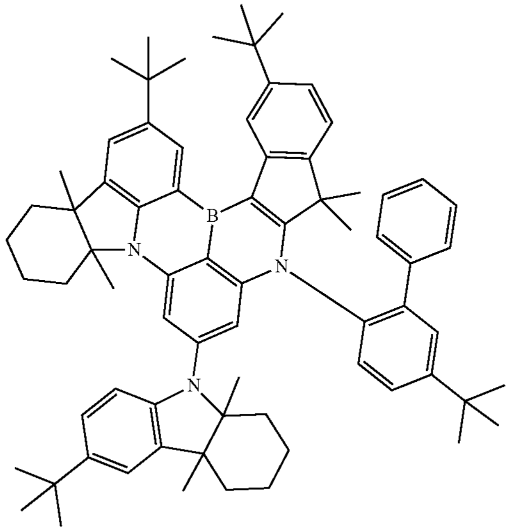

-continued
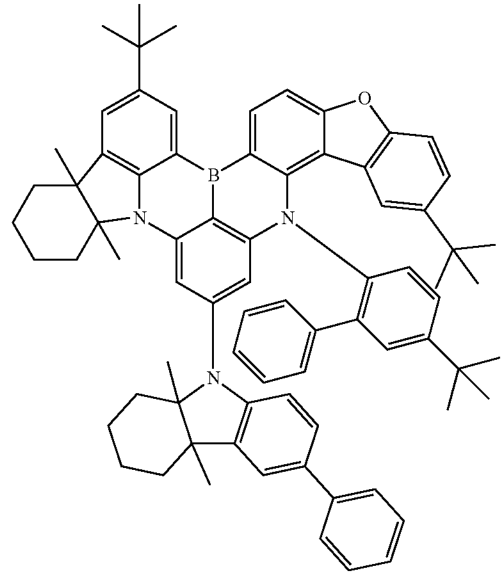
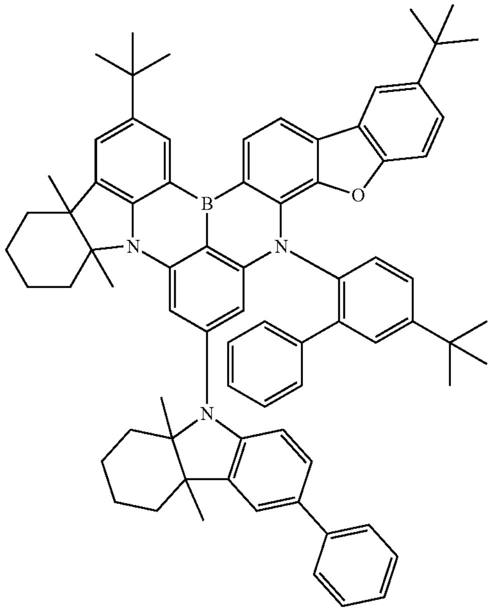
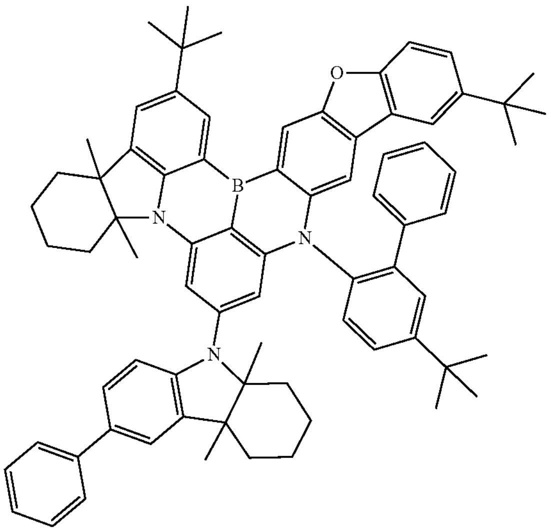
-continued
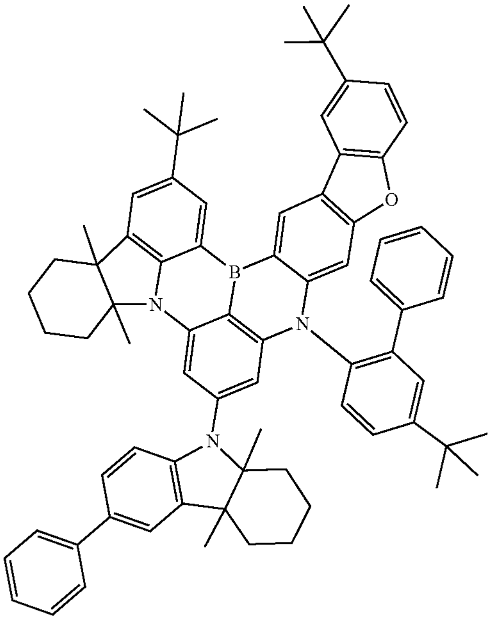
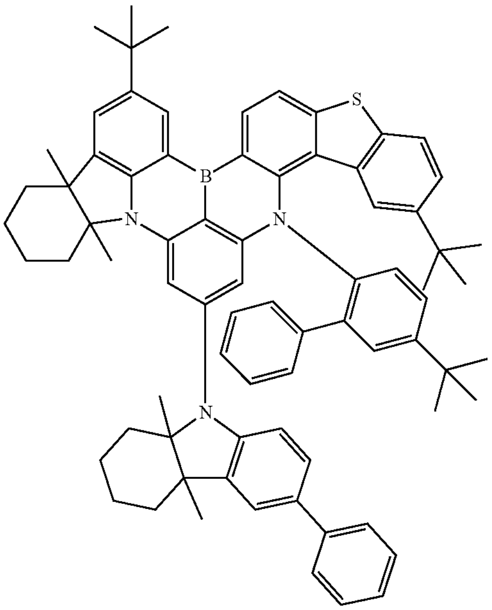

-continued
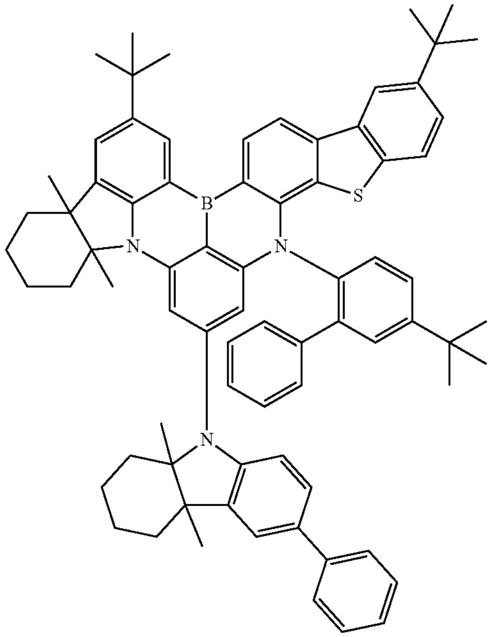
-continued
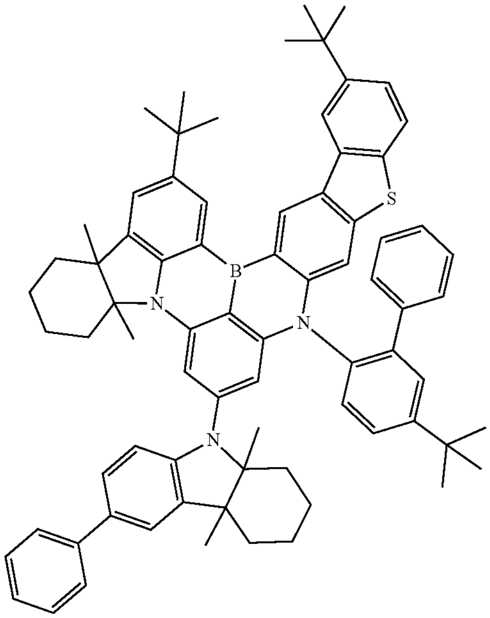
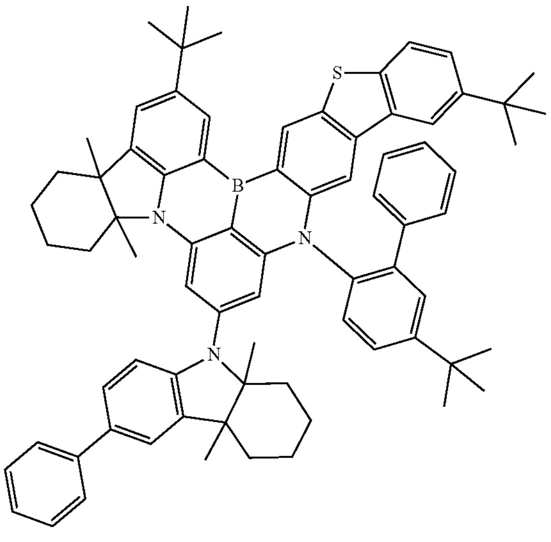
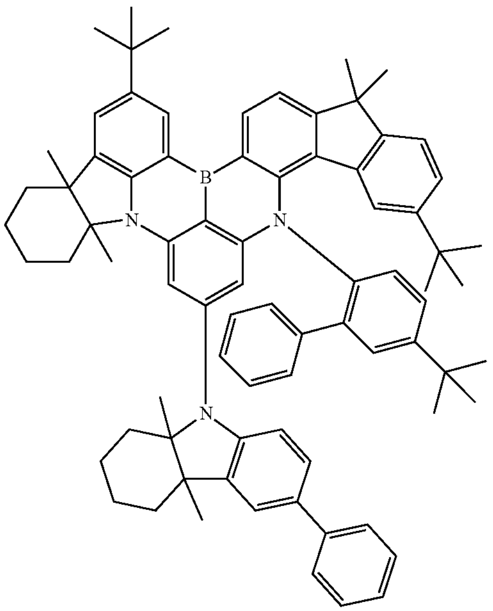

-continued
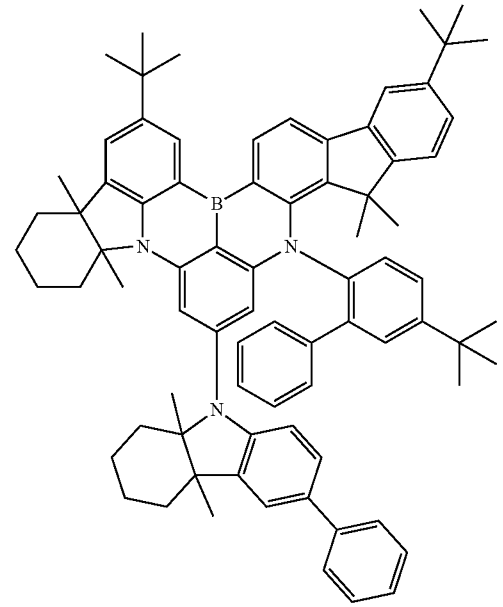
-continued
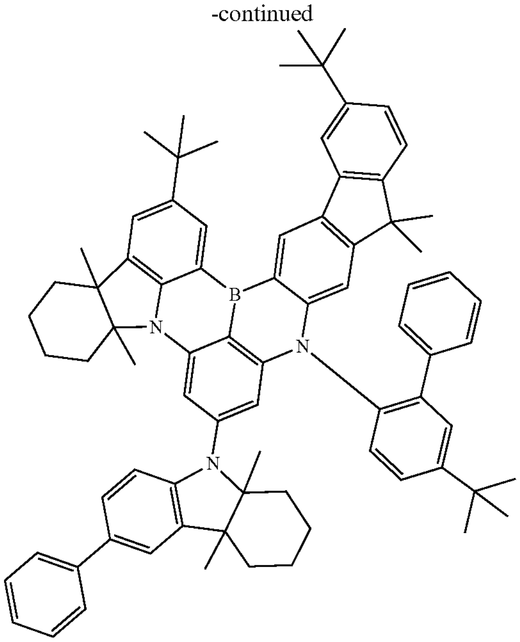
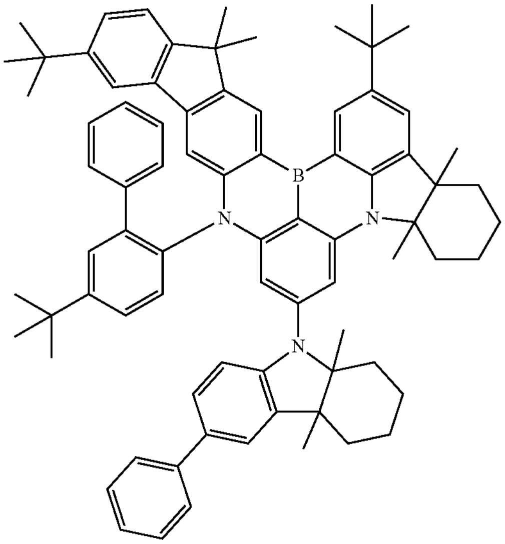
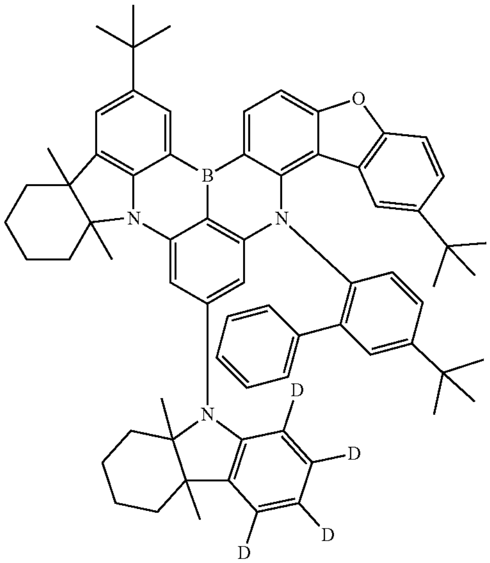

-continued
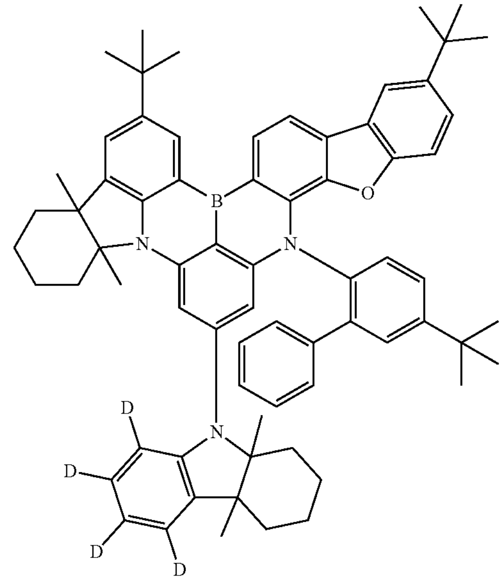
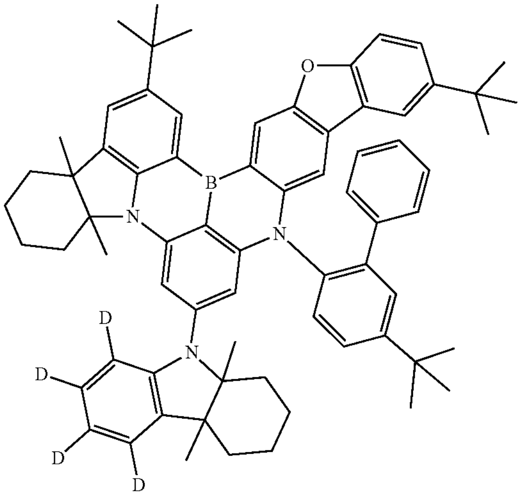
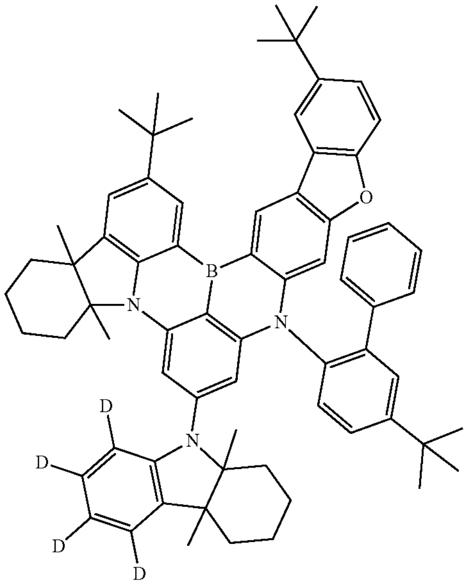
-continued
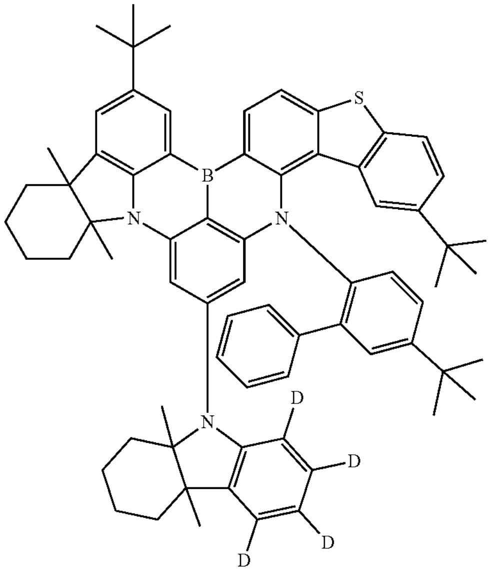
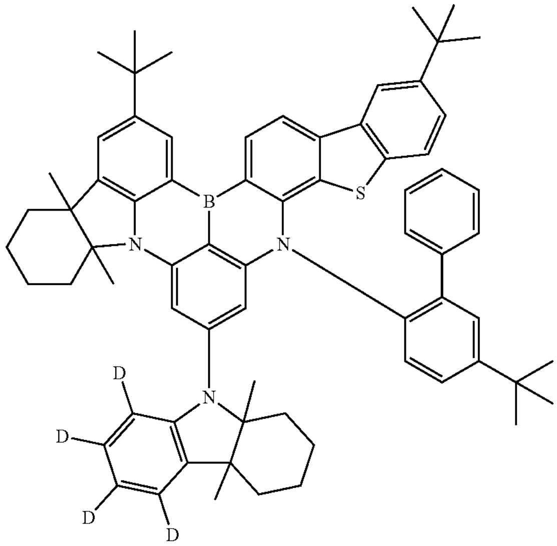
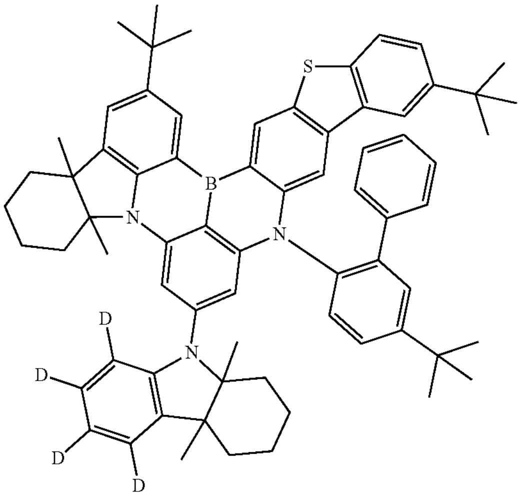

-continued
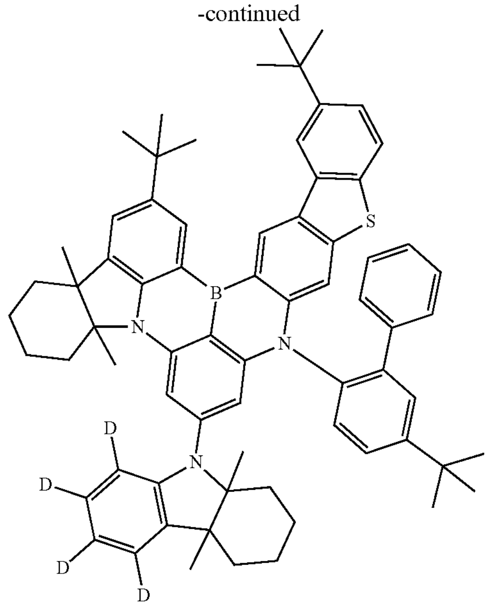
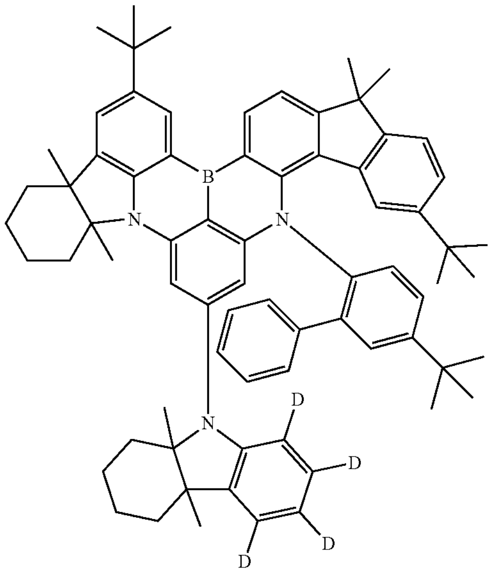
-continued
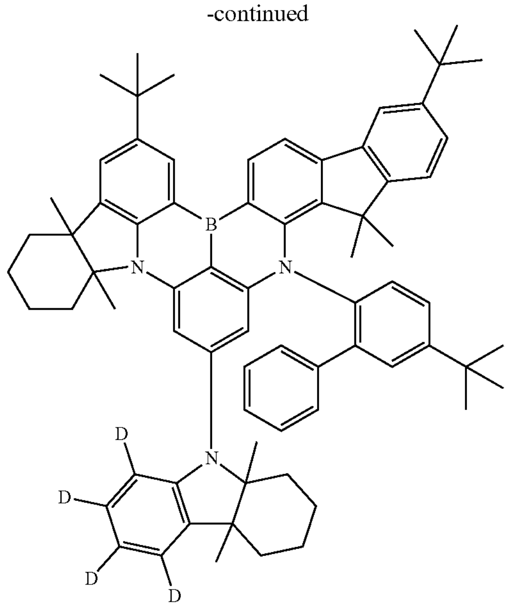
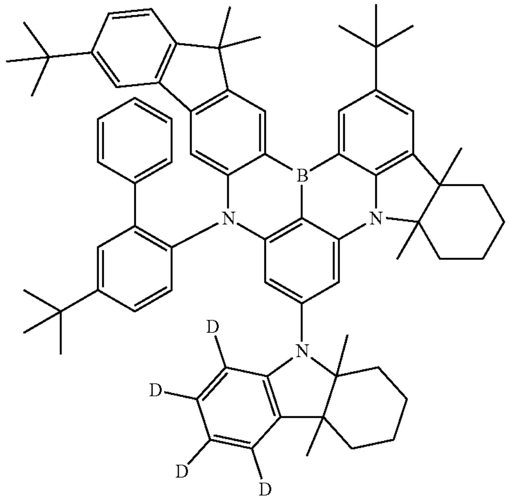
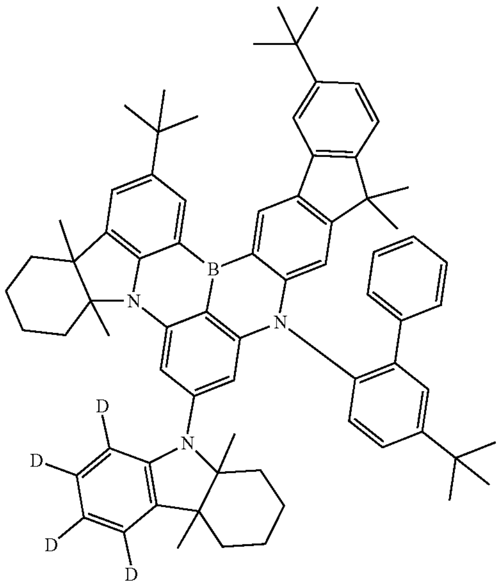

-continued
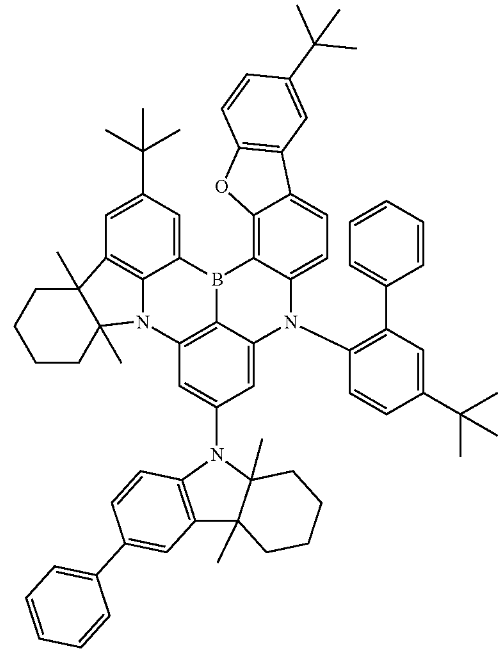
-continued
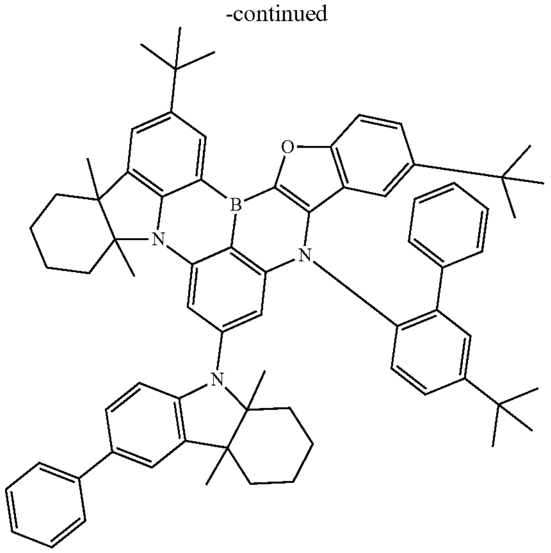
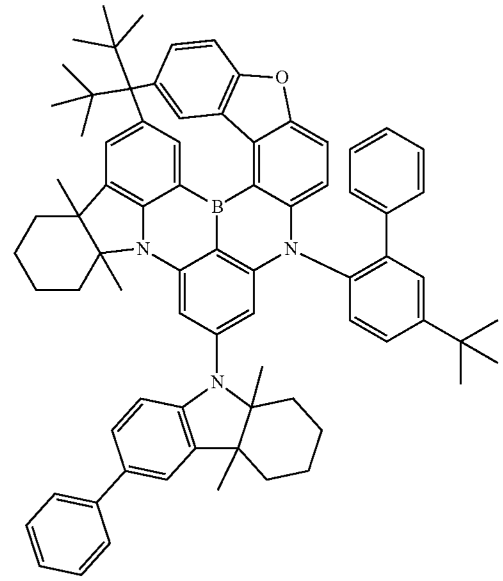
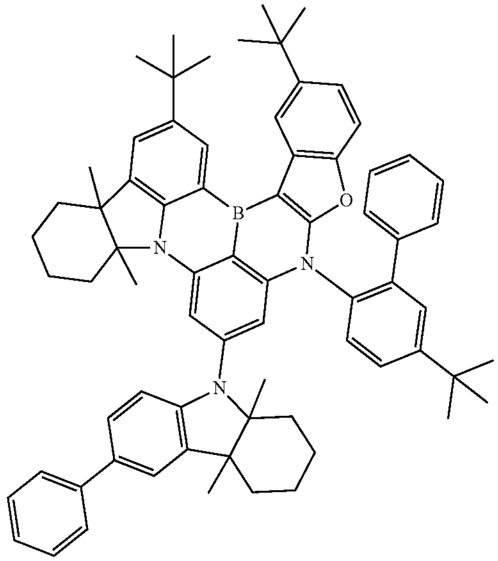

-continued
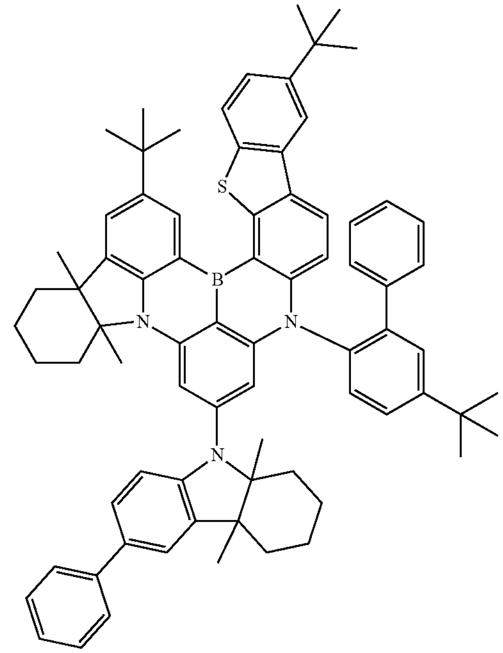
-continued
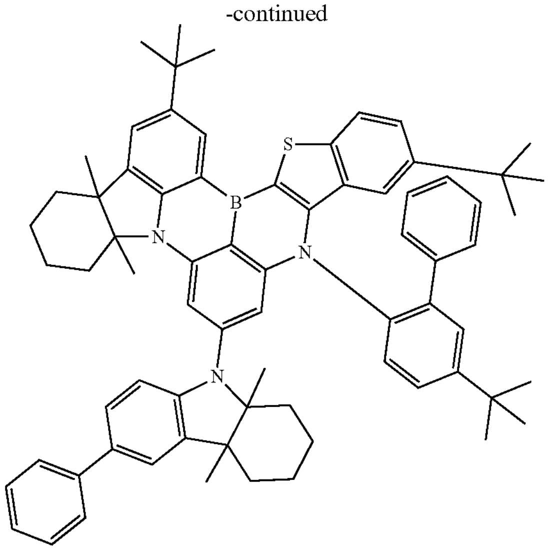
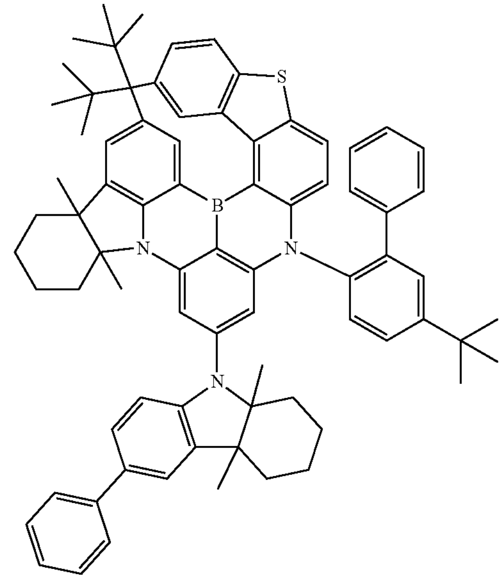
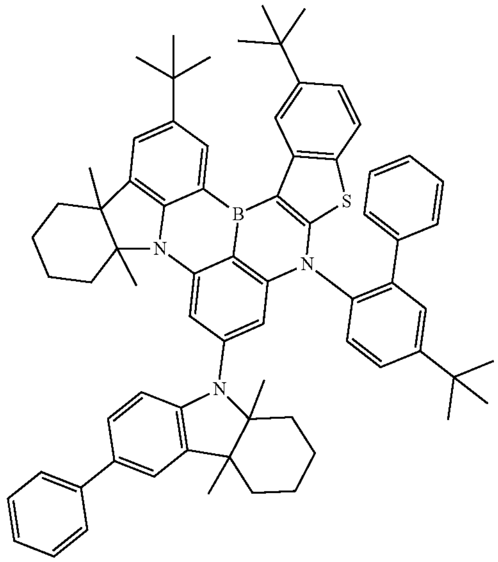

-continued
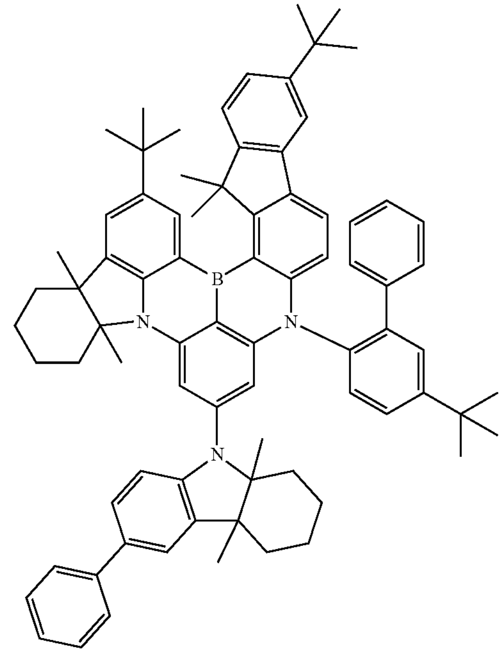
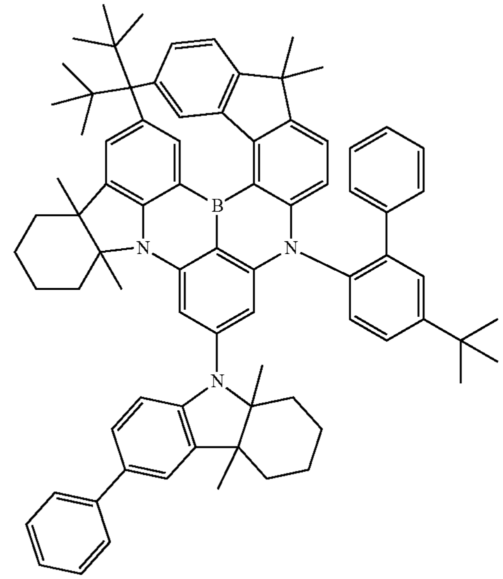
-continued
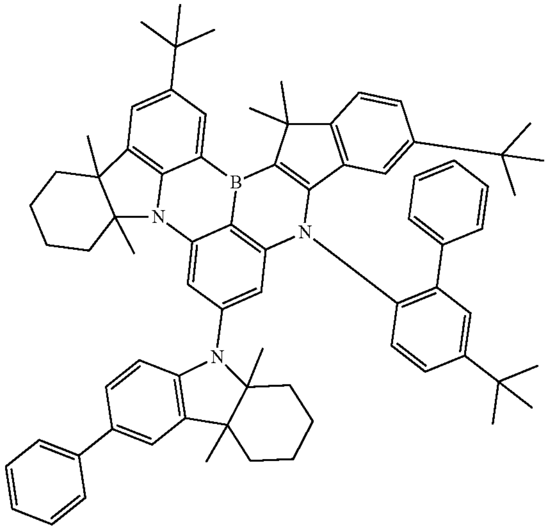
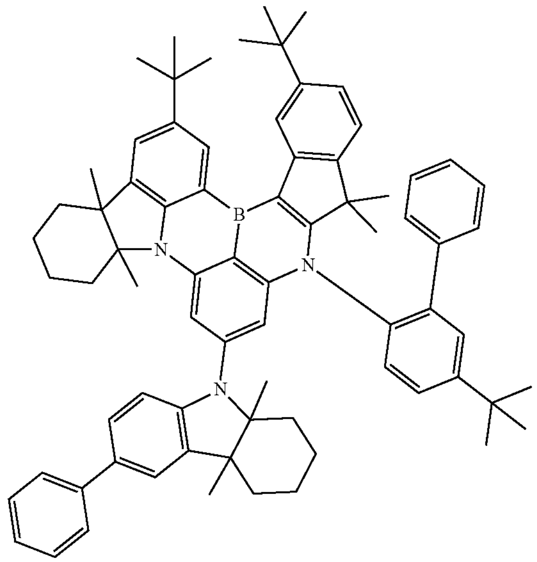
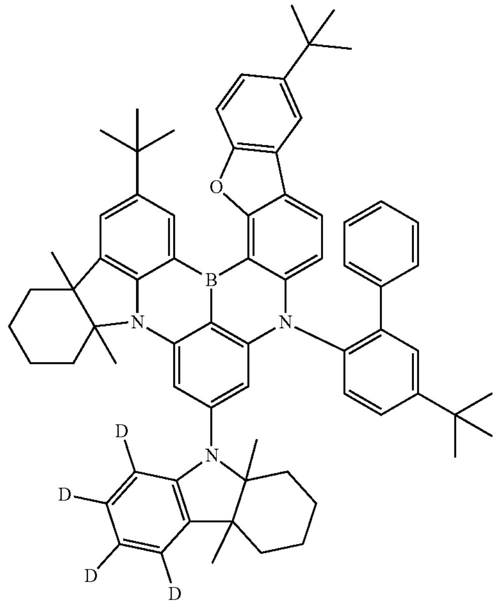

-continued
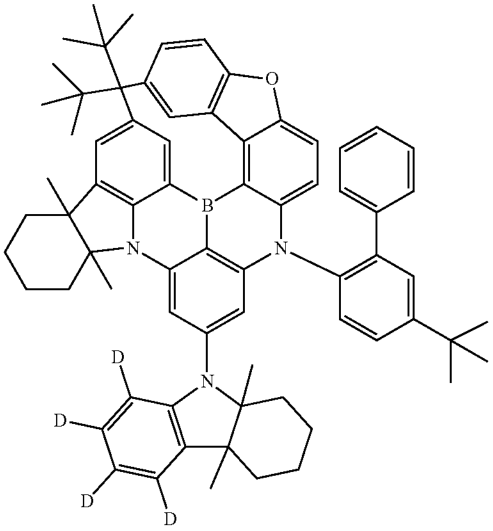
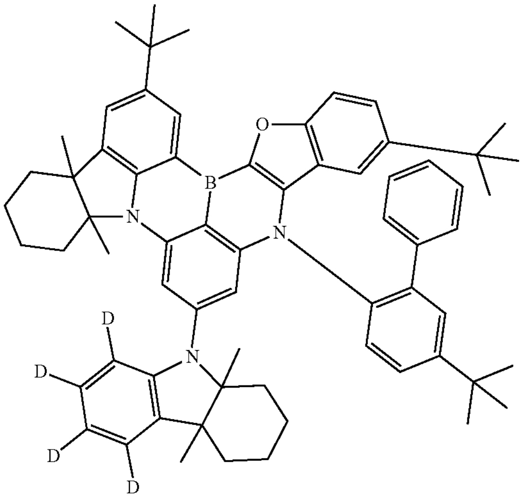
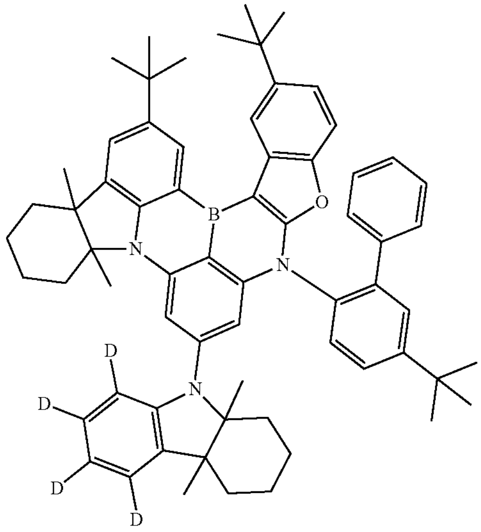
-continued
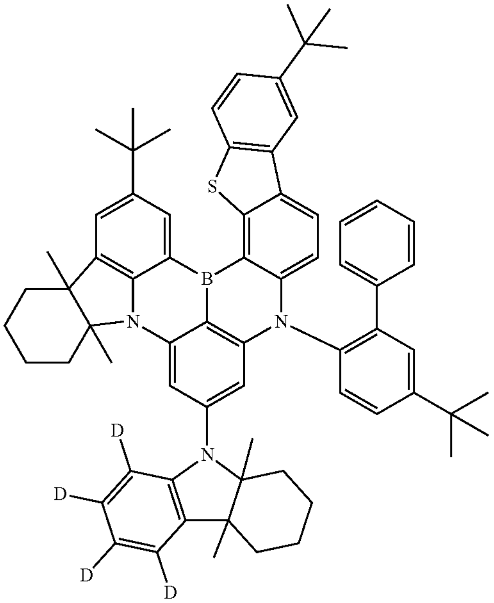
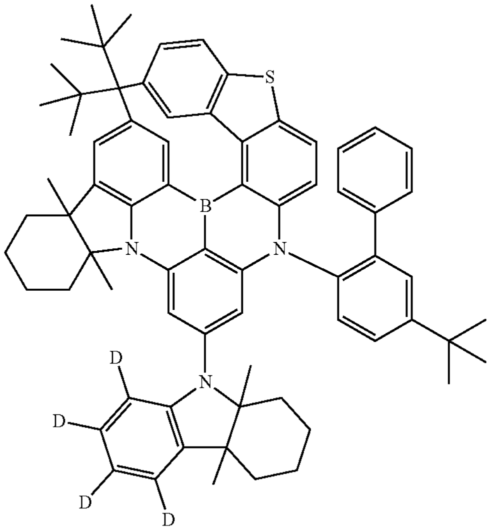
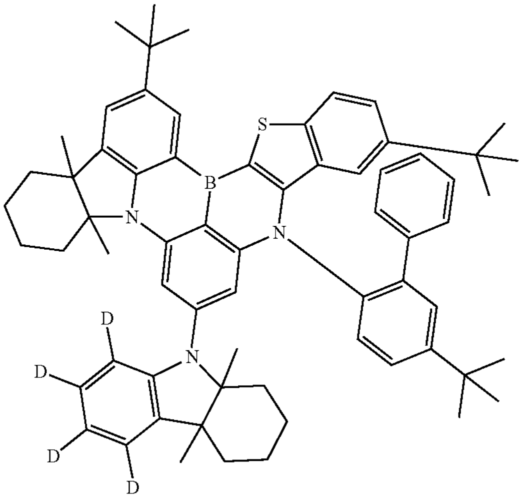

-continued
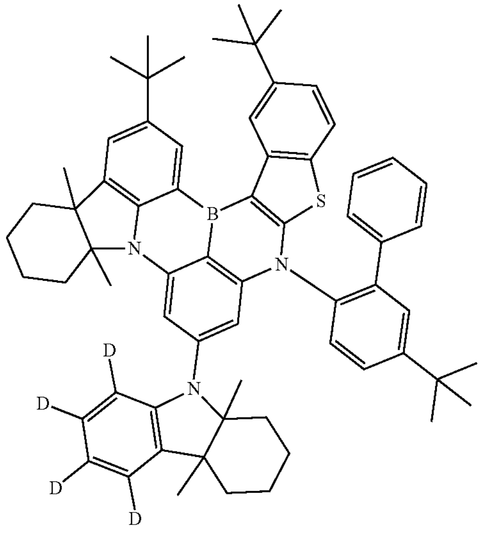
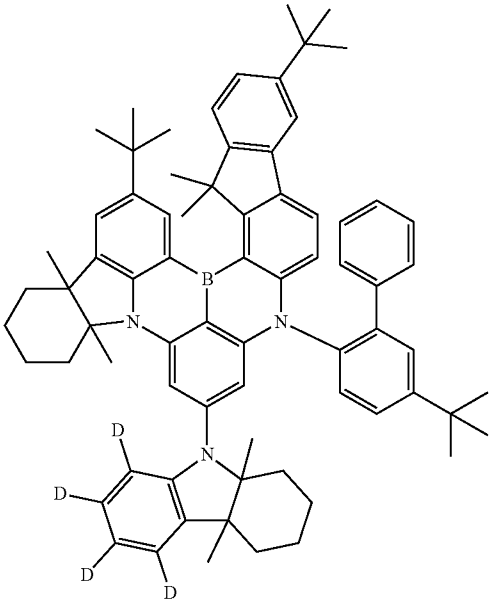
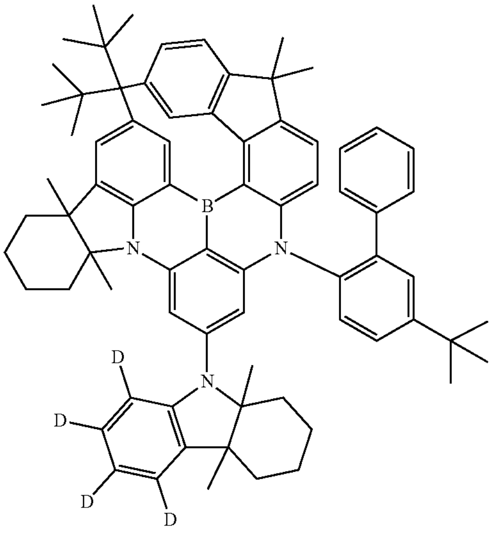
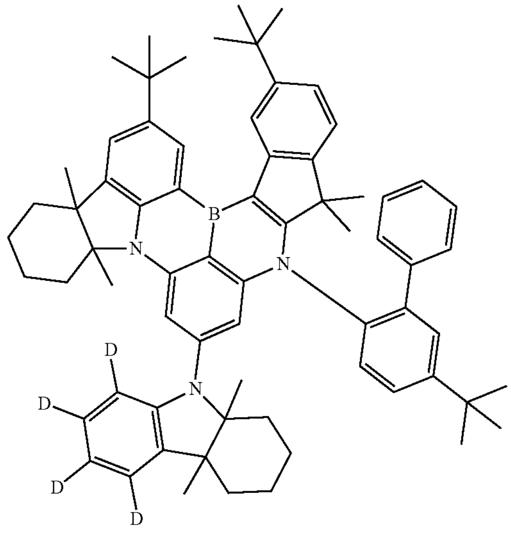
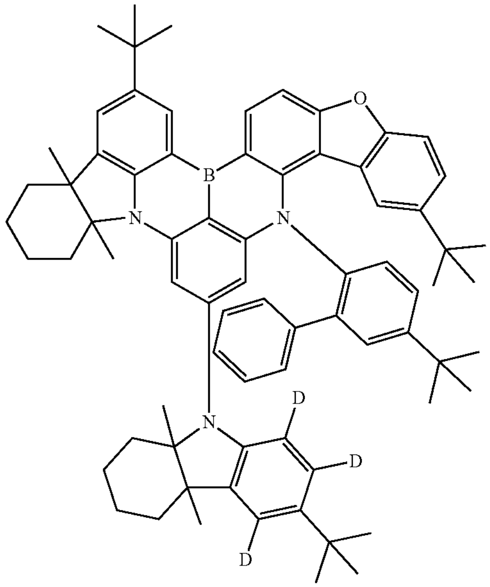
-continued
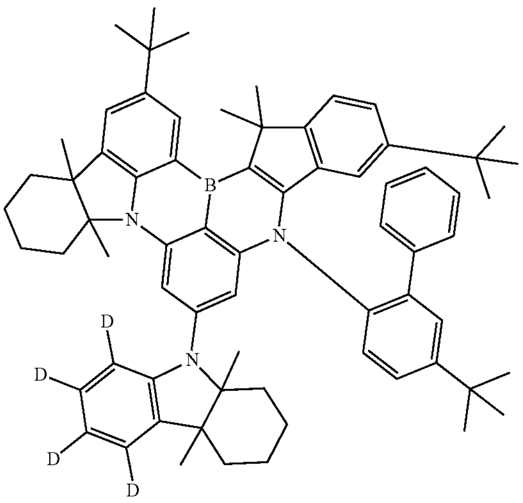

-continued
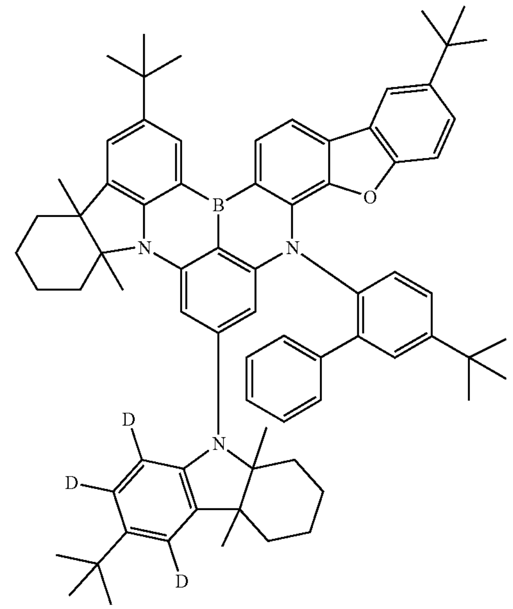
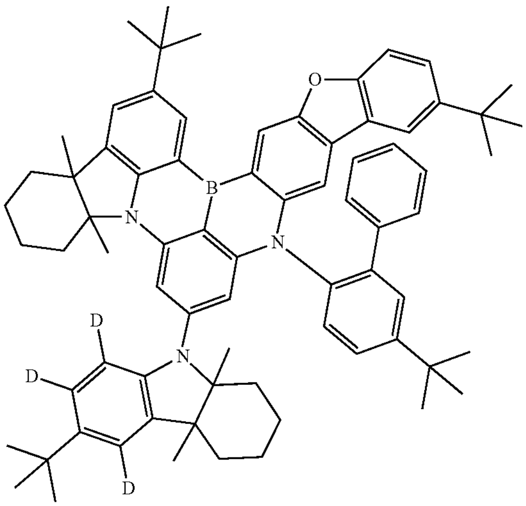
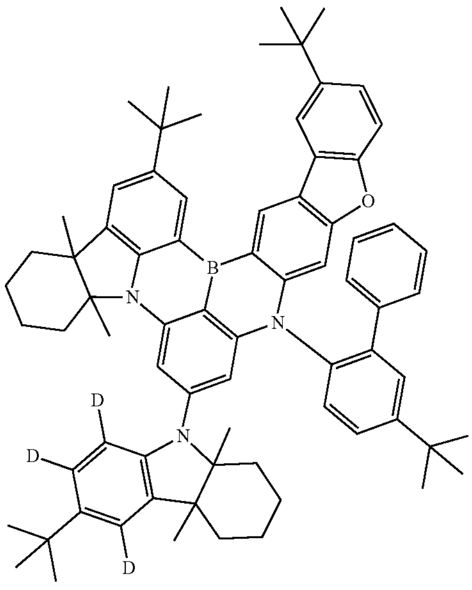
-continued
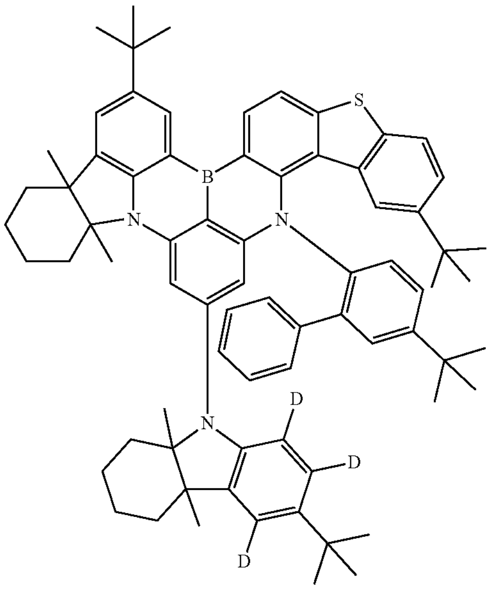
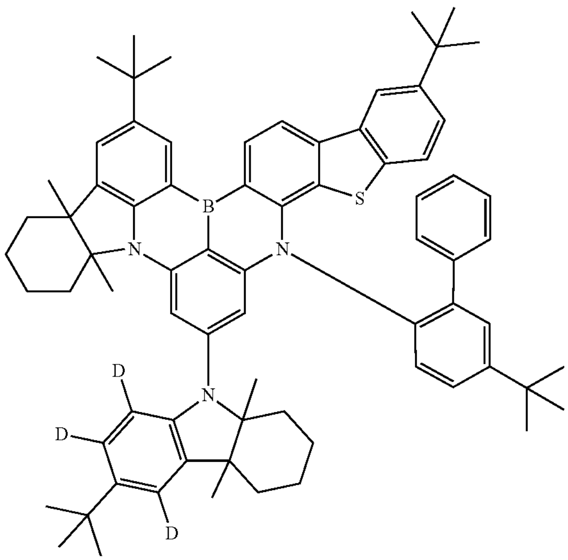
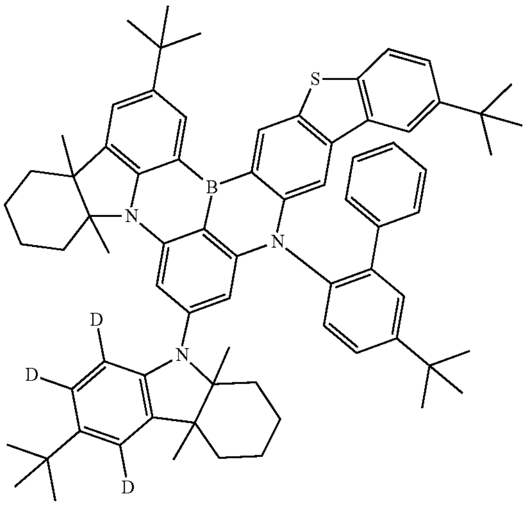

-continued
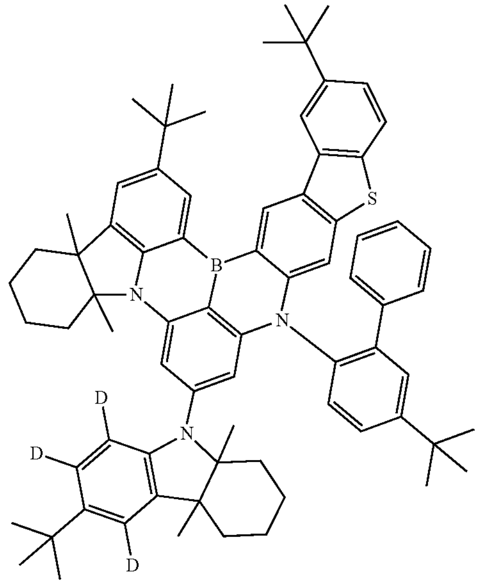
-continued
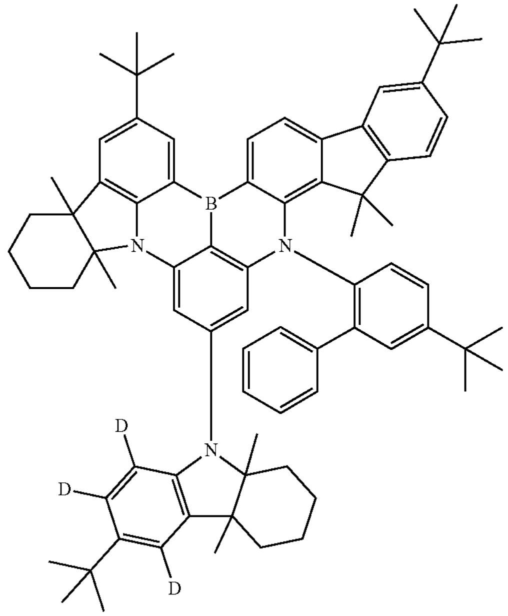
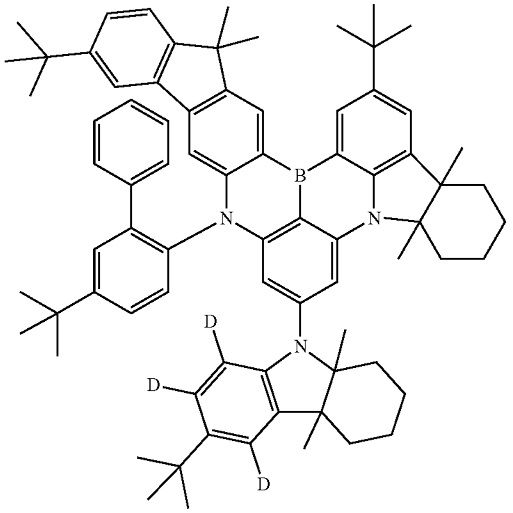
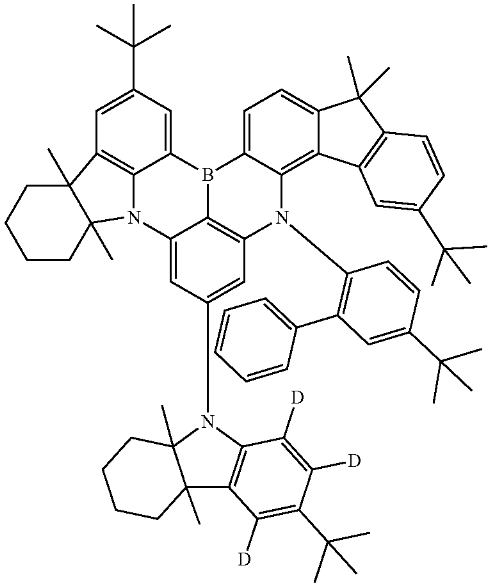
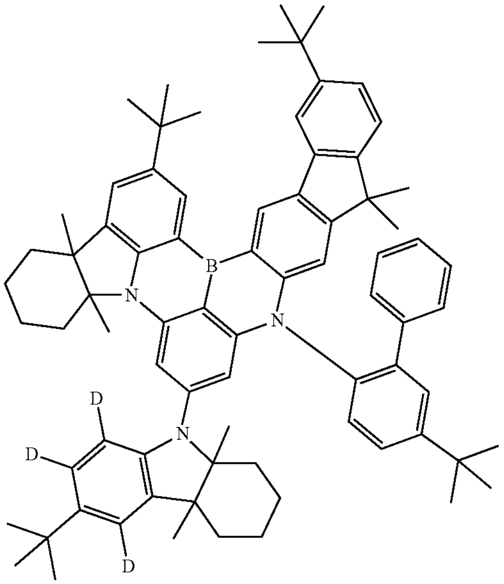

-continued
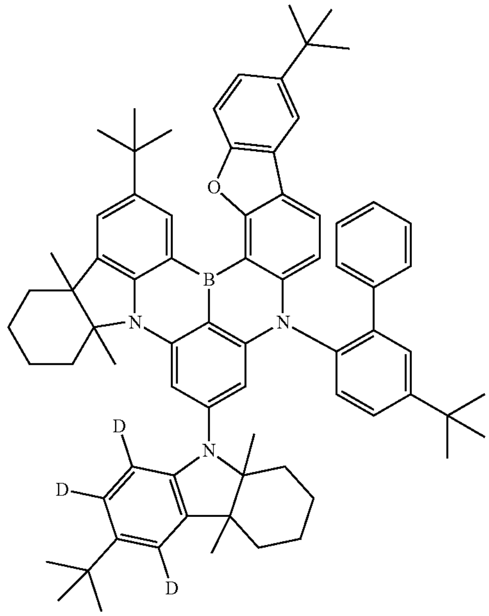
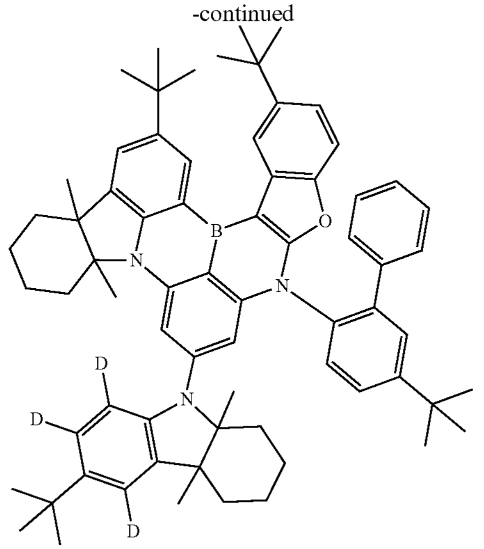
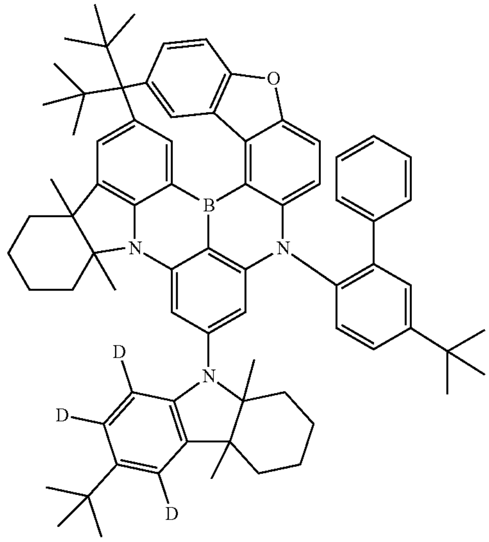
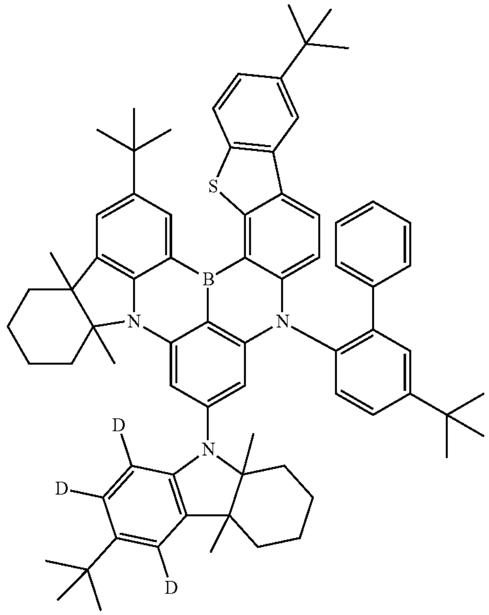
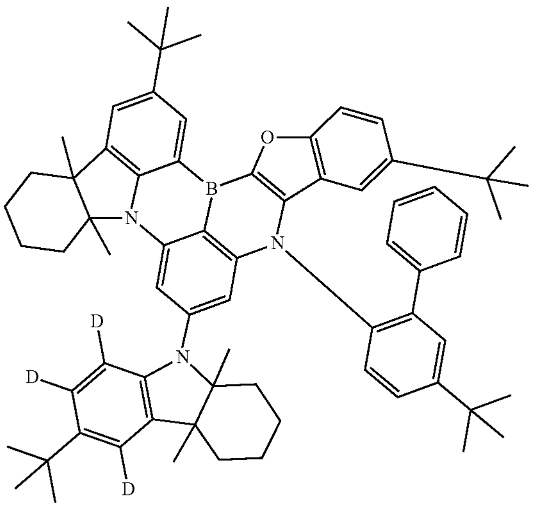
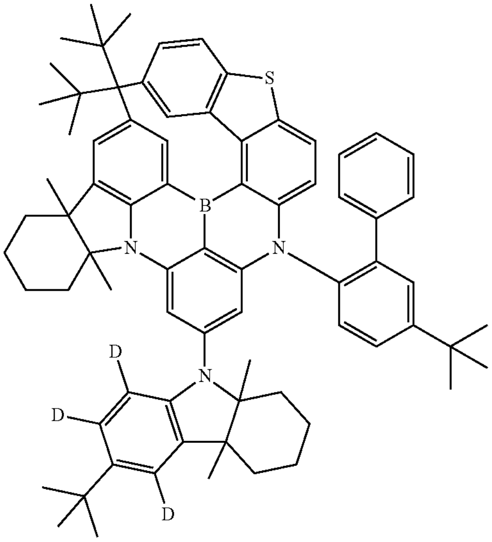

-continued
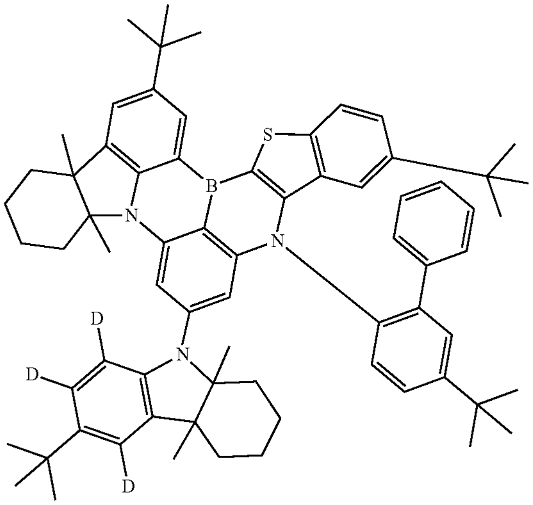
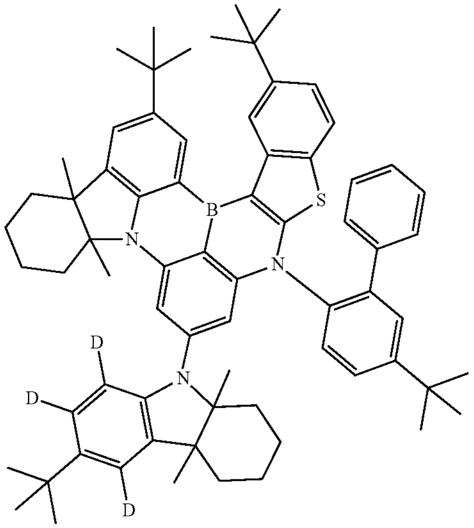
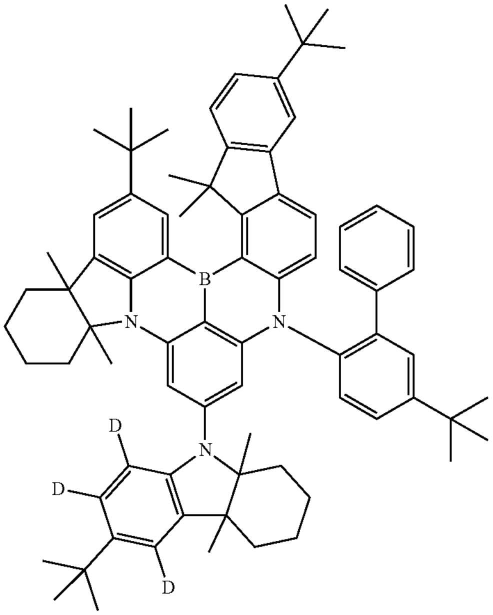
-continued
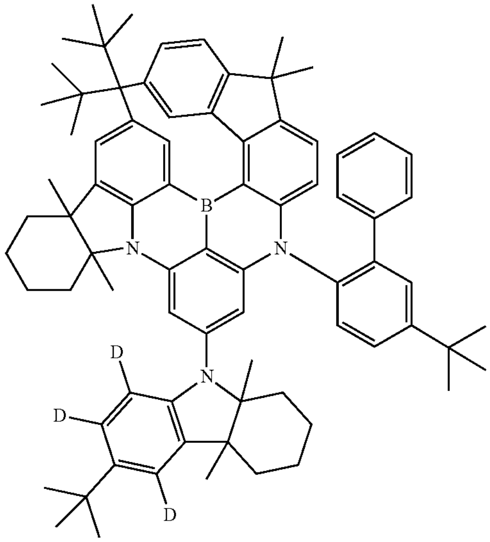
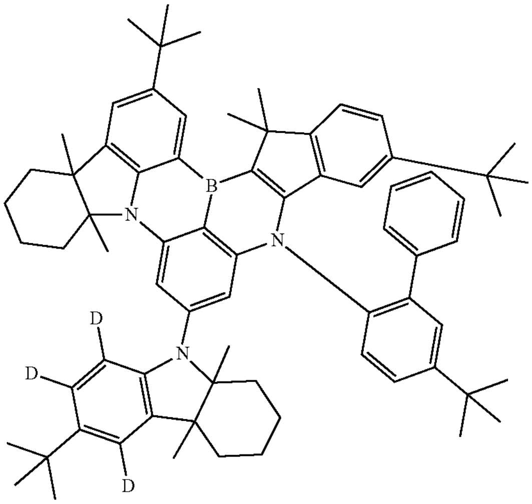
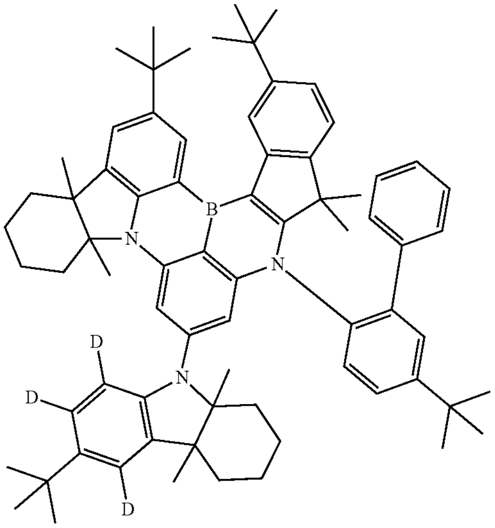

-continued
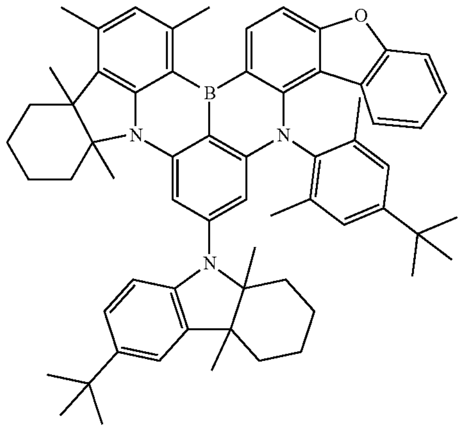
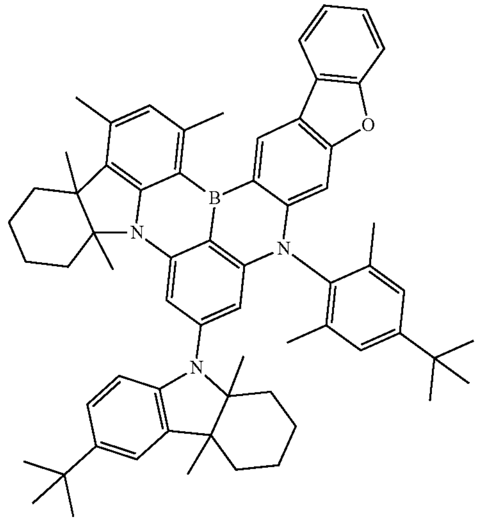
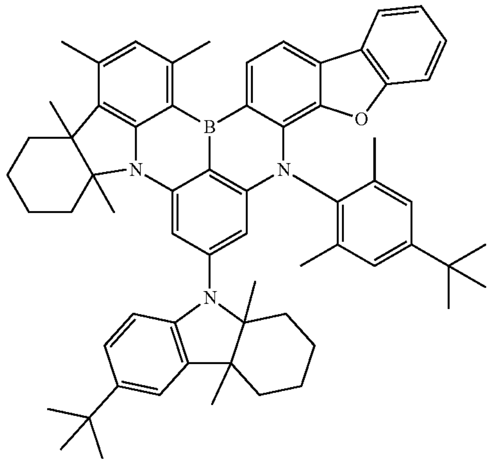
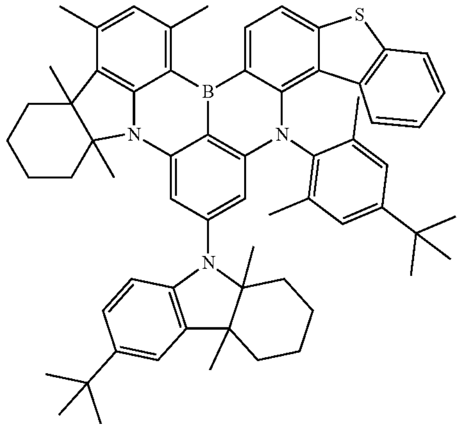
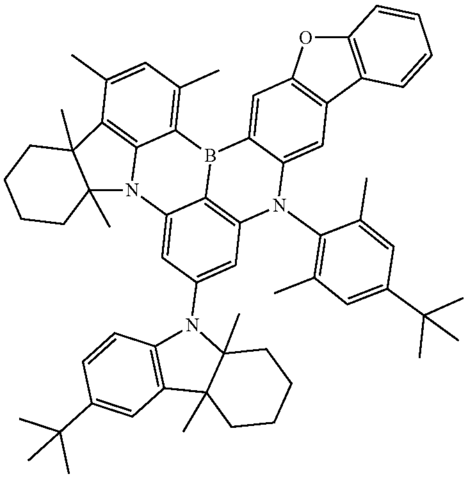
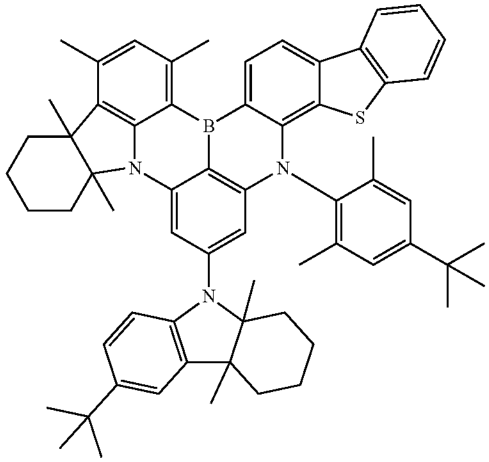
-continued -continued
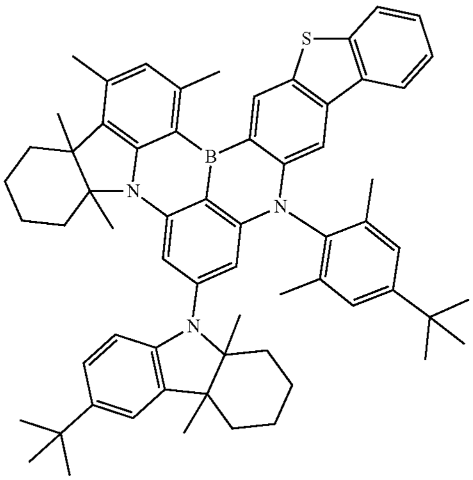
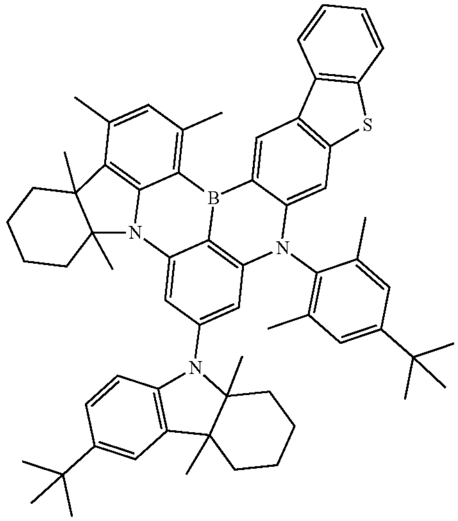
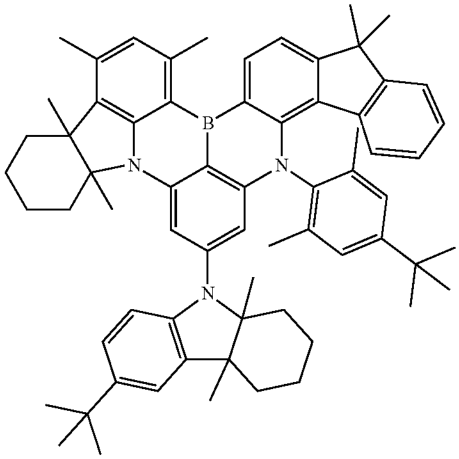
-continued
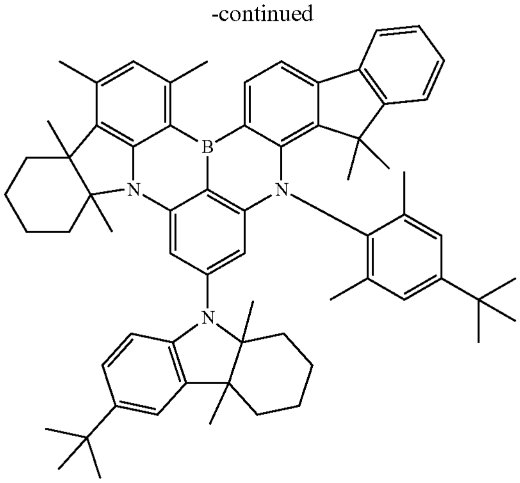
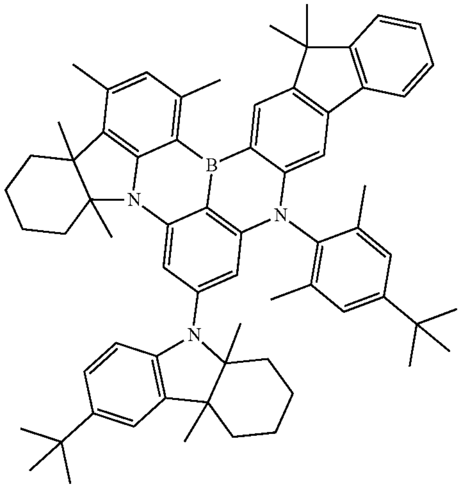
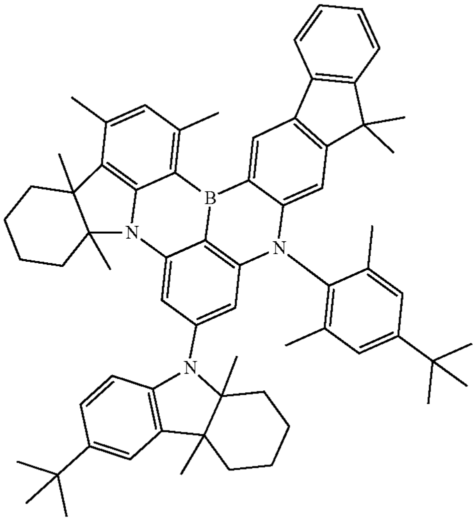

-continued
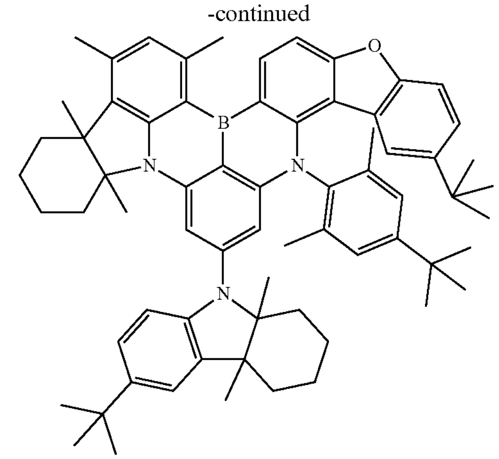
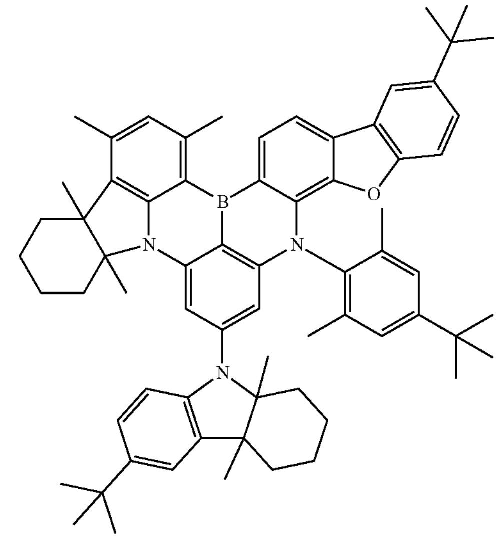
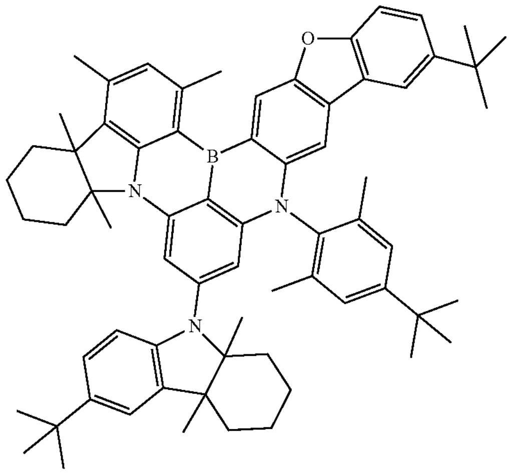
-continued
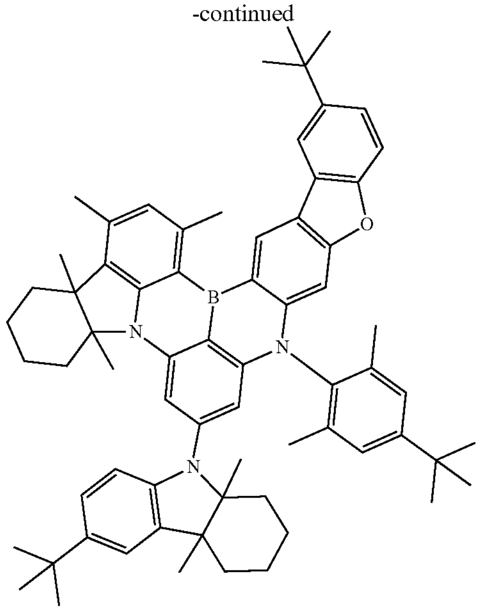
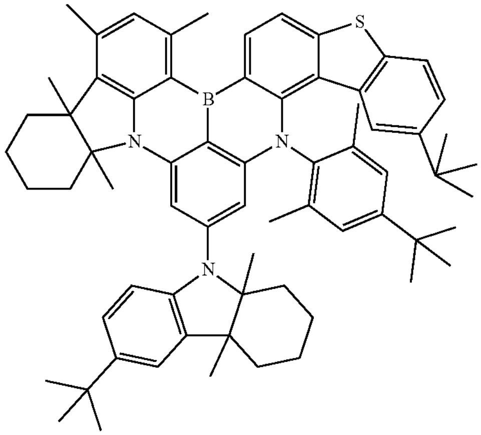
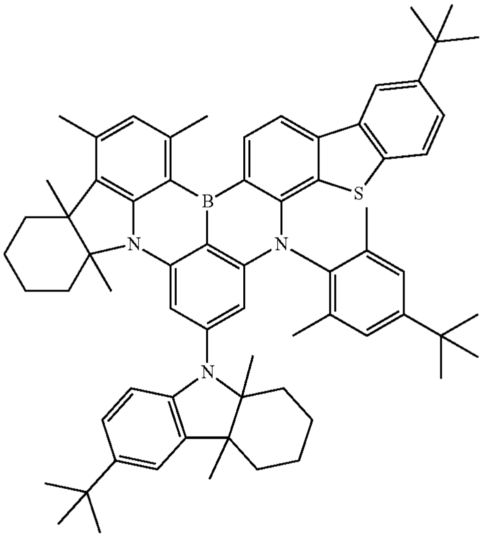

-continued
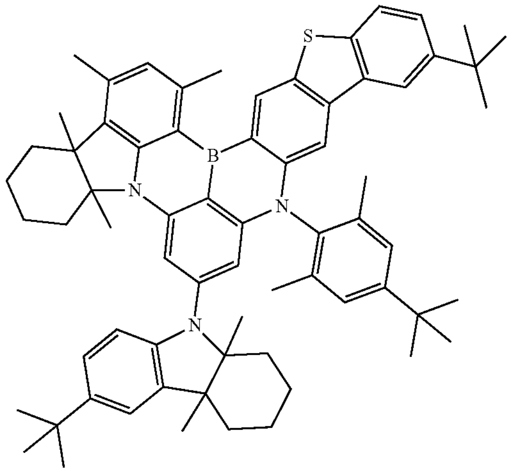
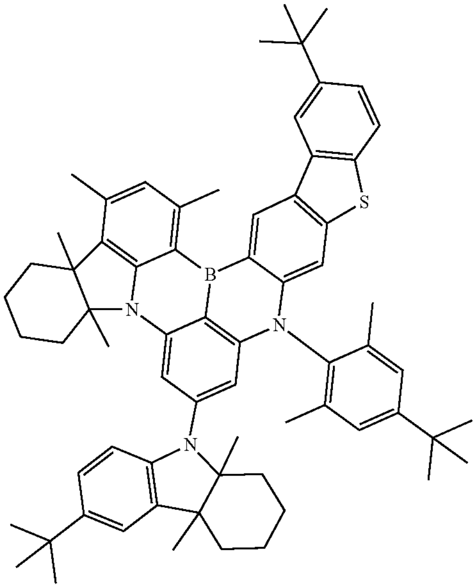
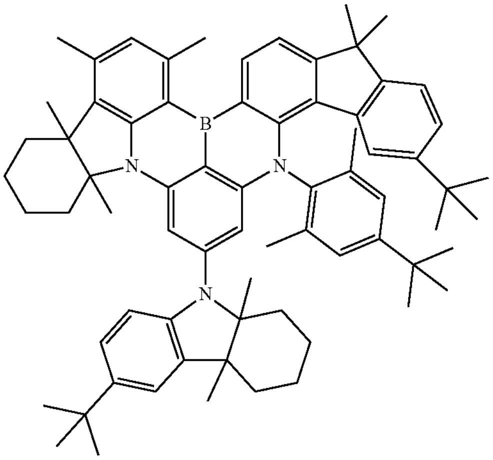
-continued
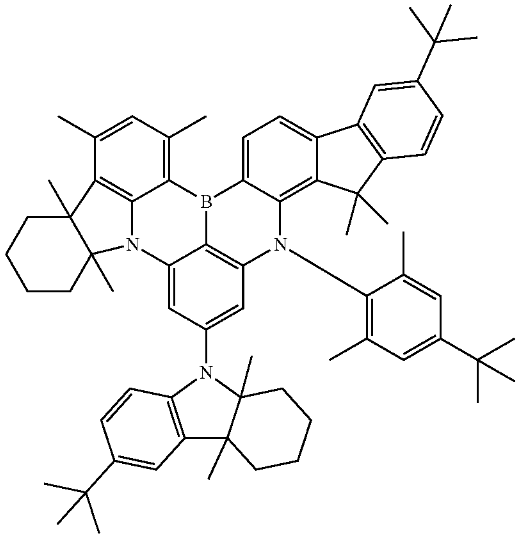
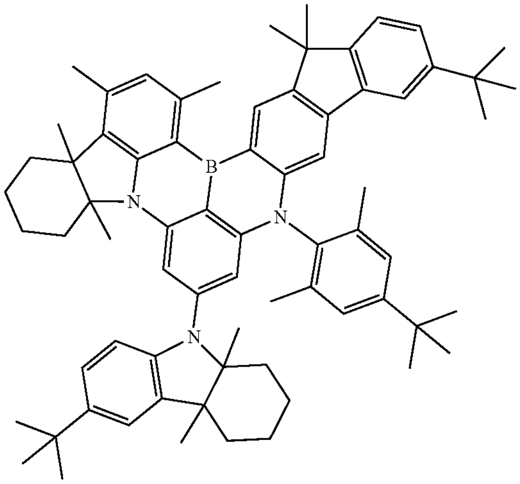
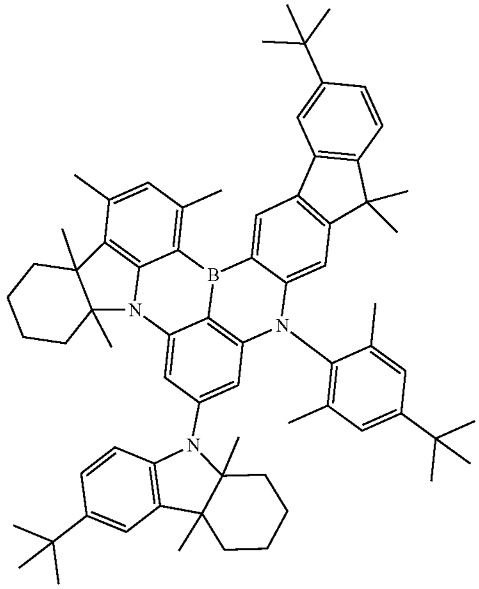

-continued
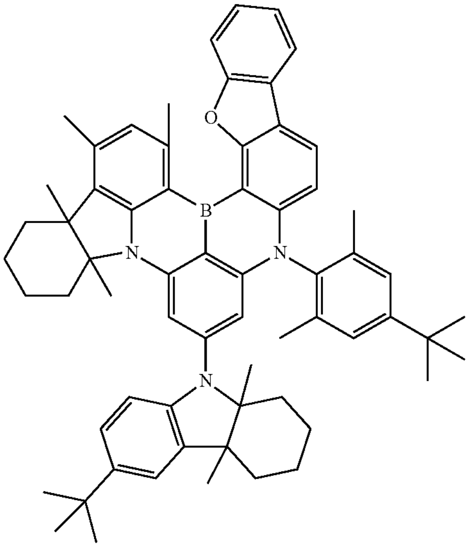
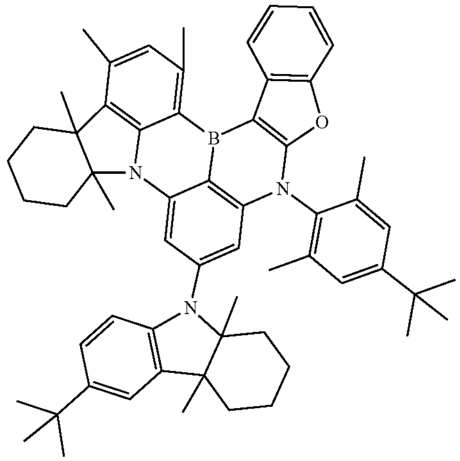
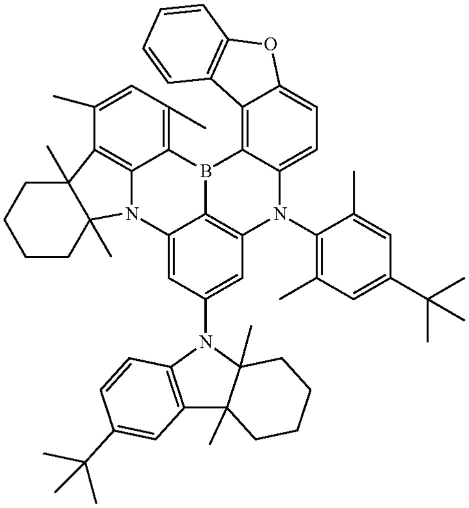
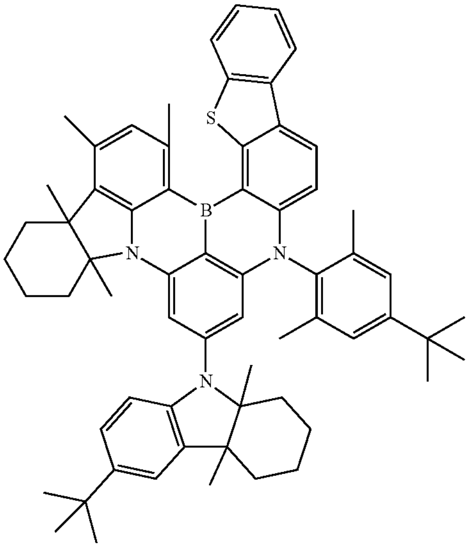
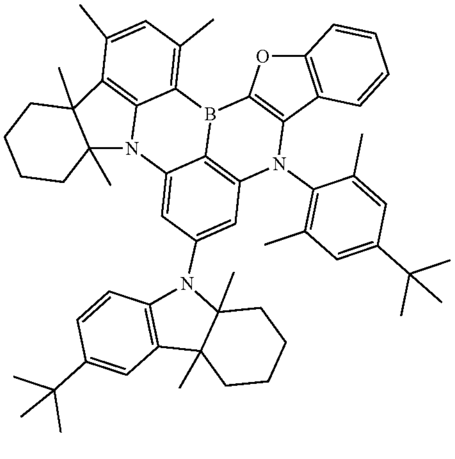
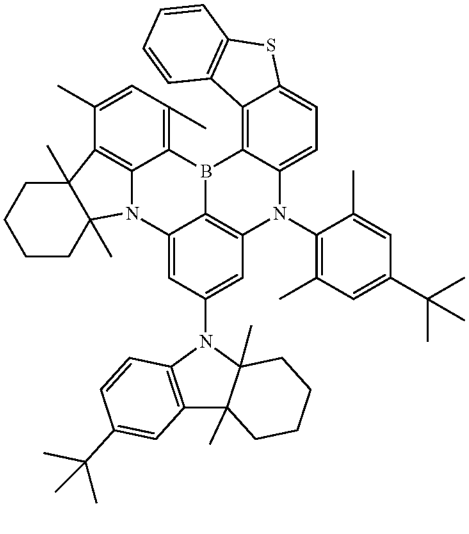

-continued
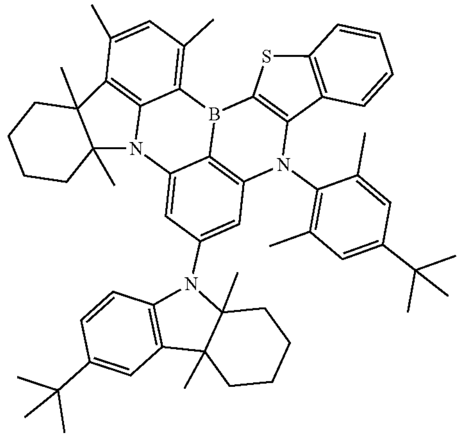
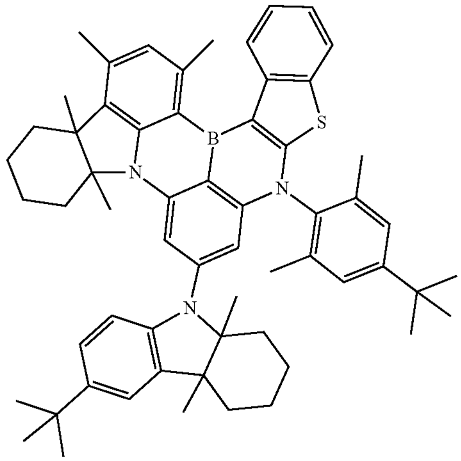
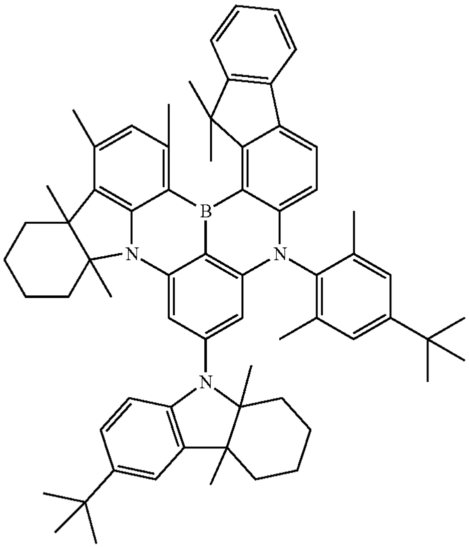
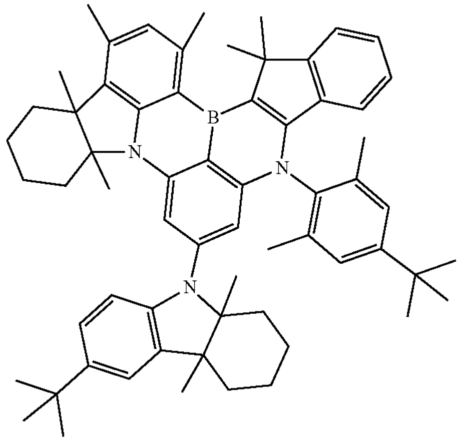
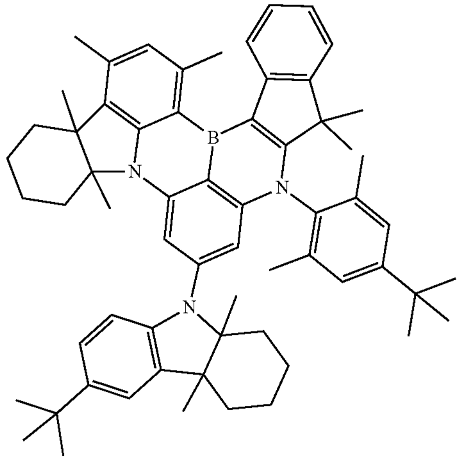
-continued
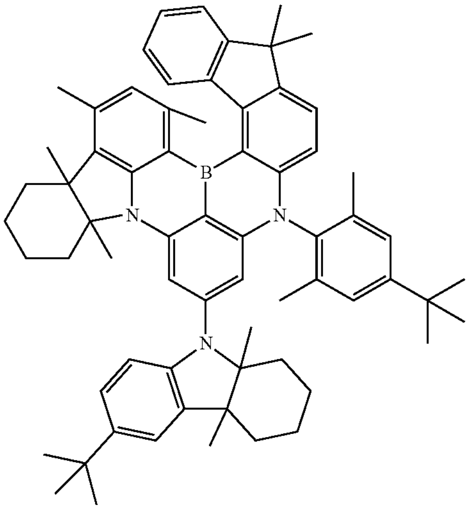

-continued
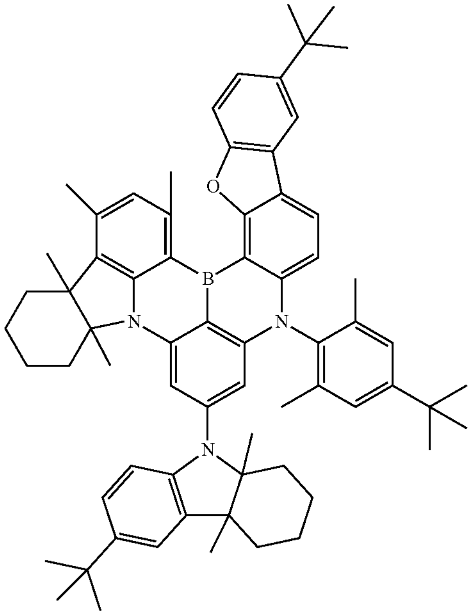
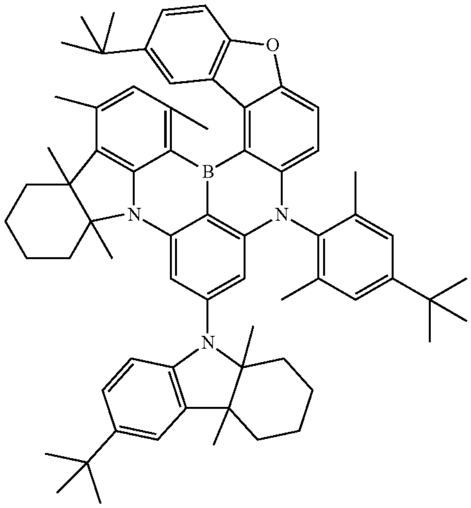
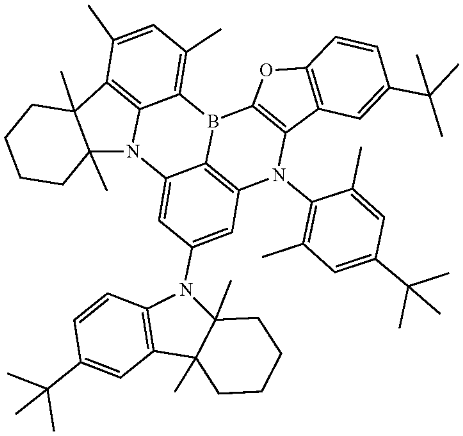
-continued
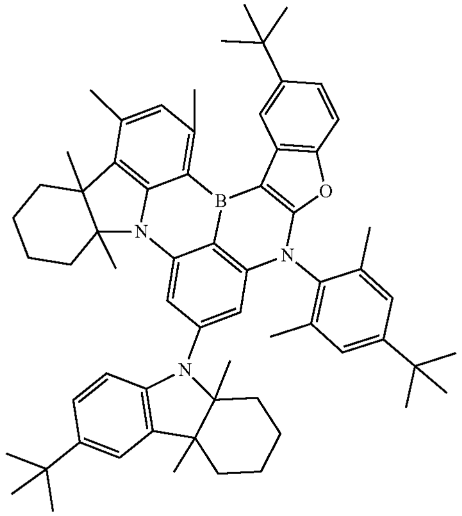
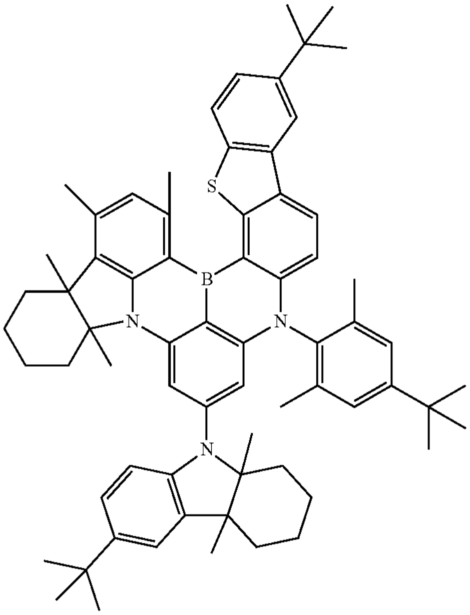
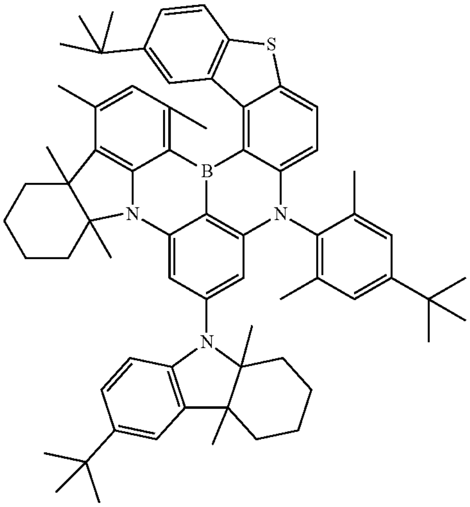

-continued
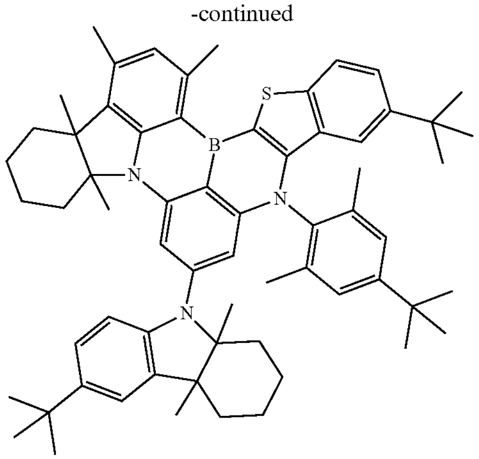
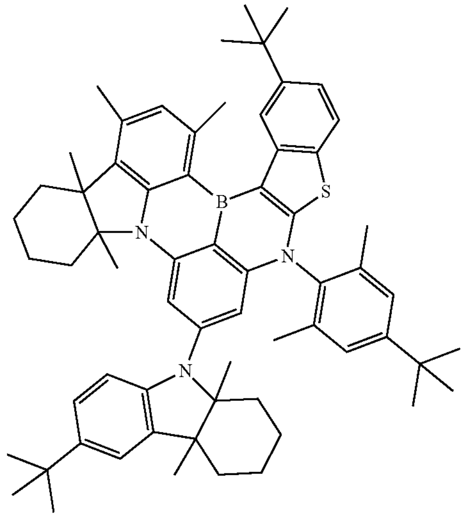
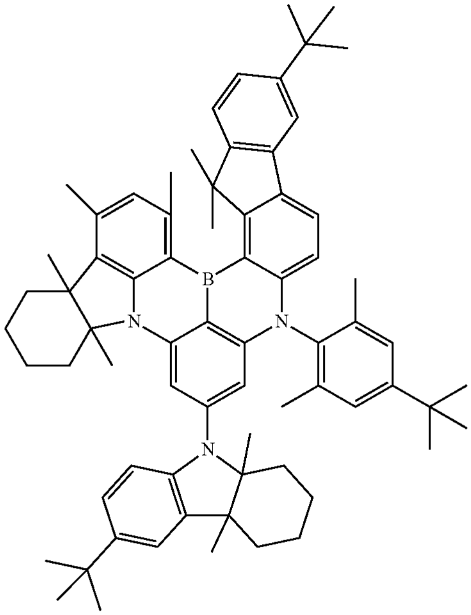
-continued
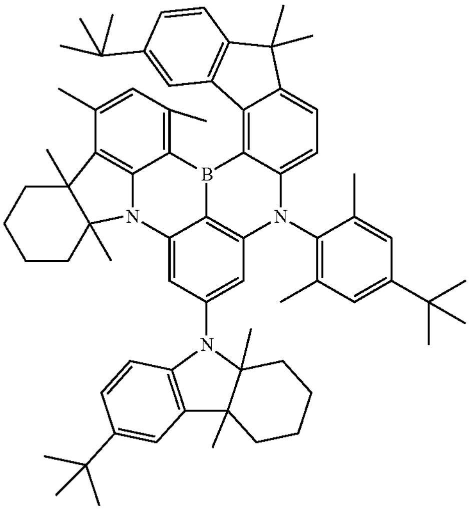
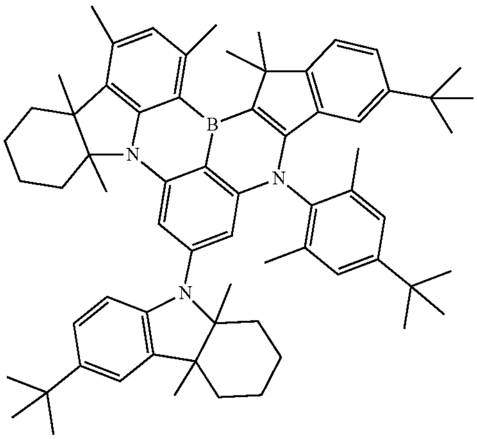
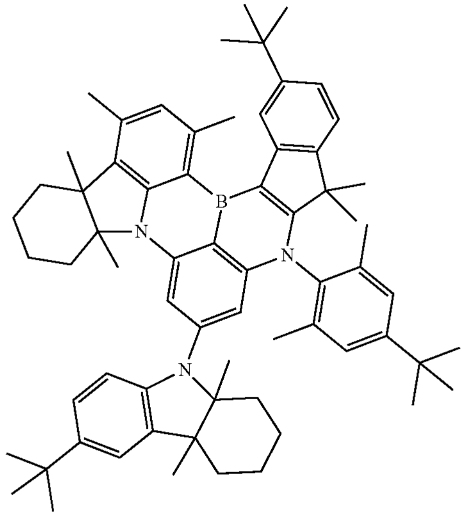

-continued
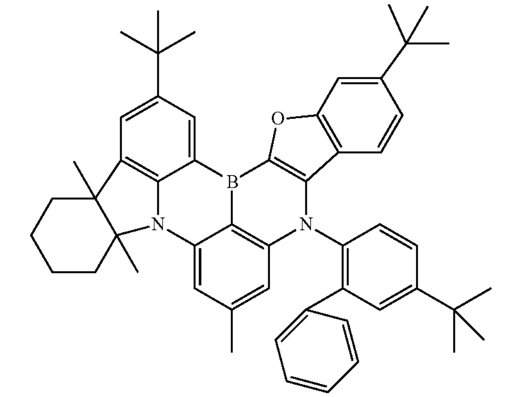
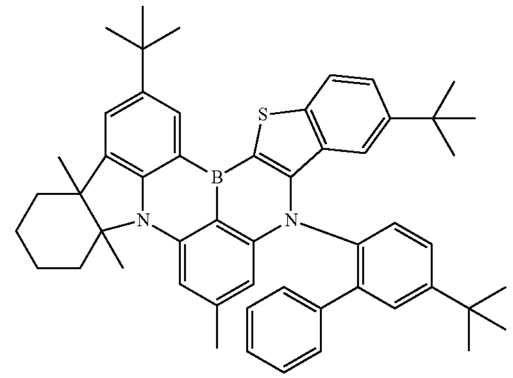
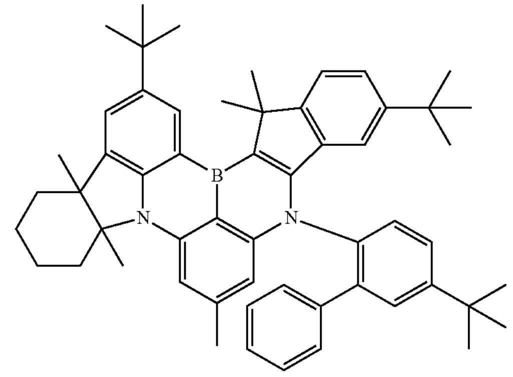
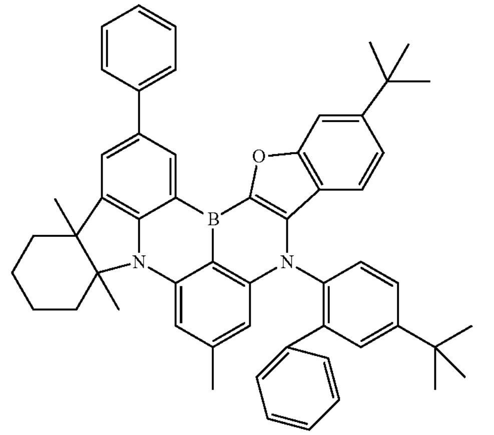
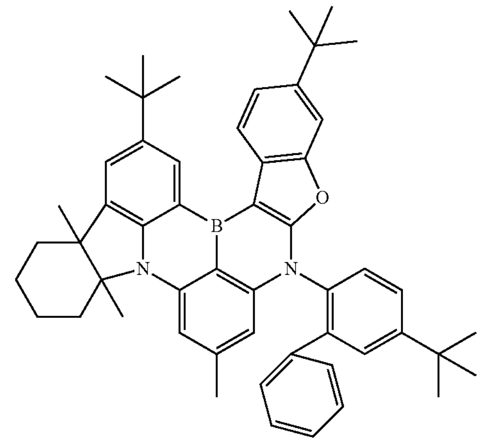
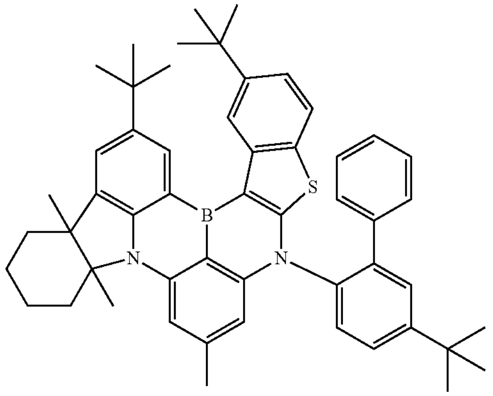
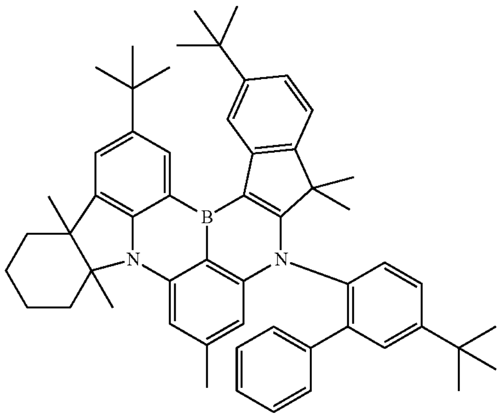
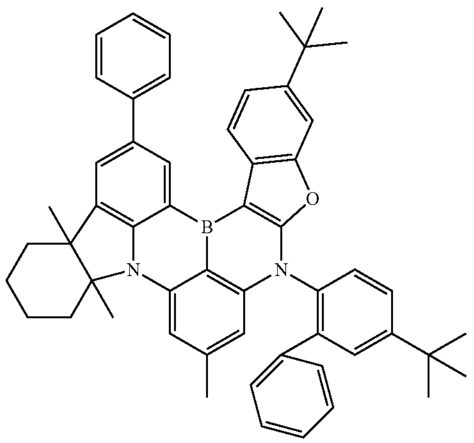

-continued
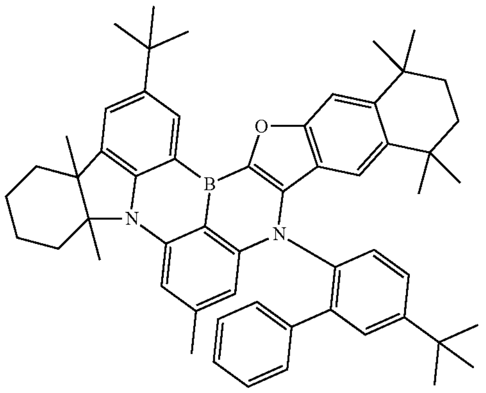
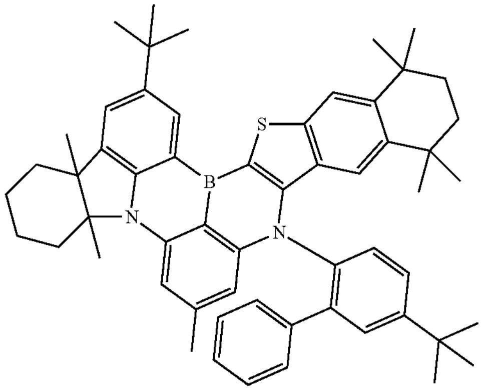
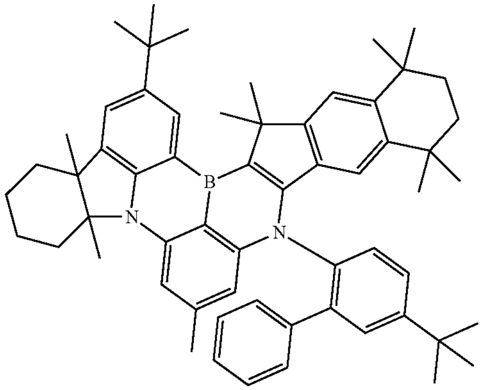
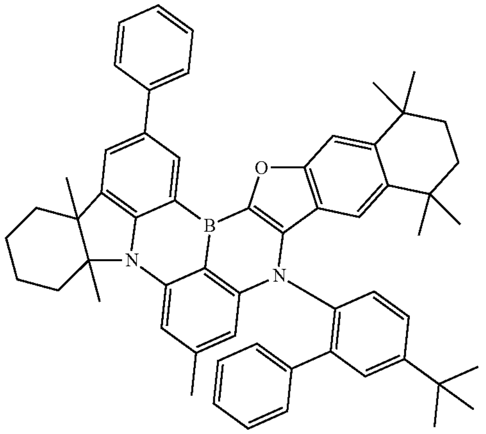
-continued
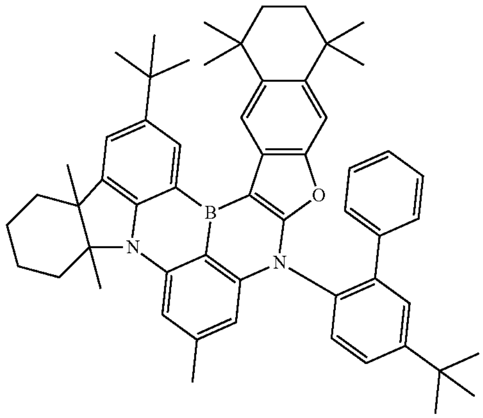
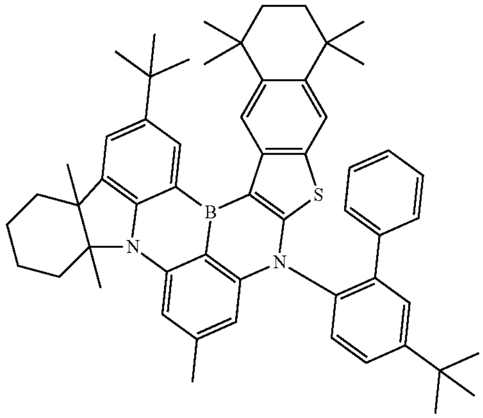
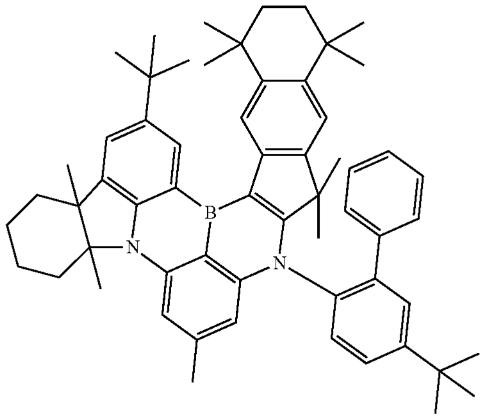
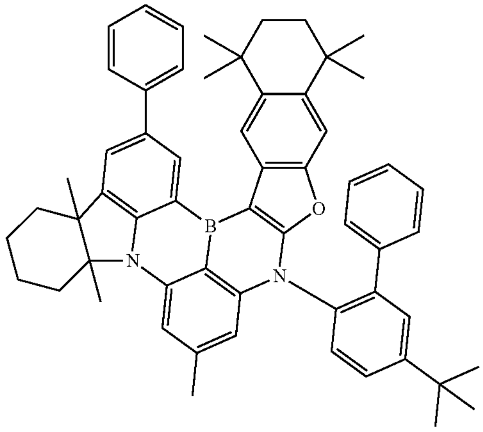

-continued
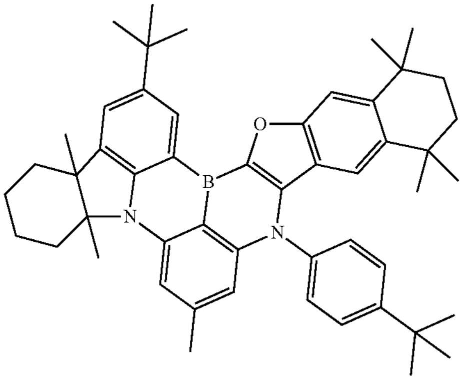
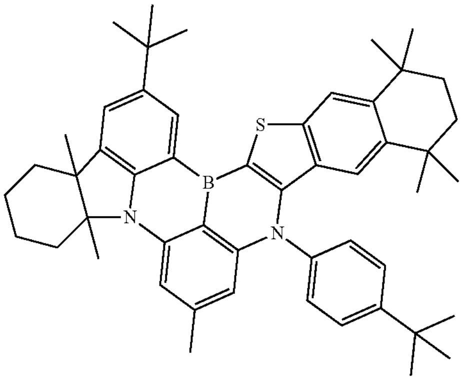
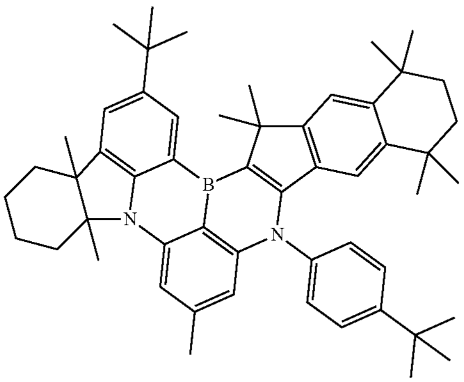
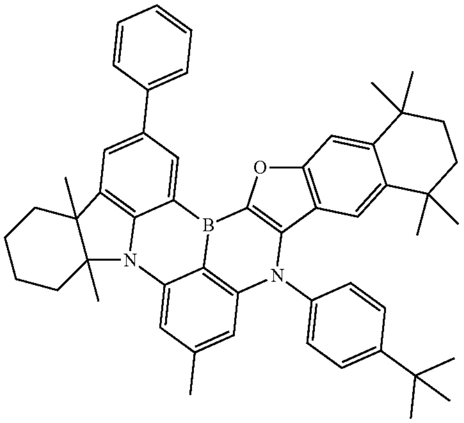
-continued
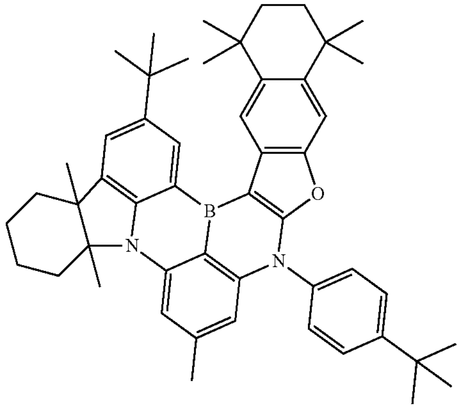
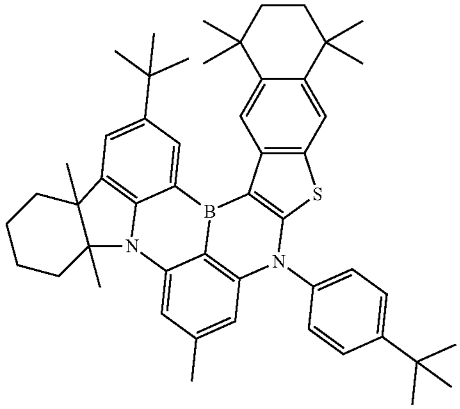
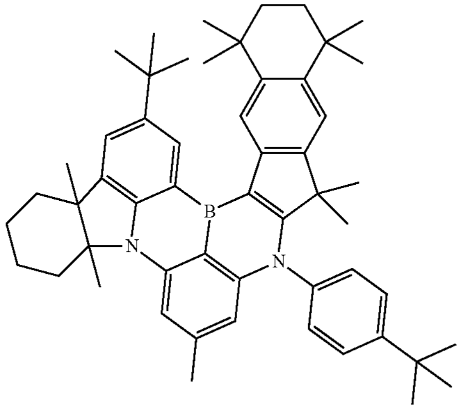
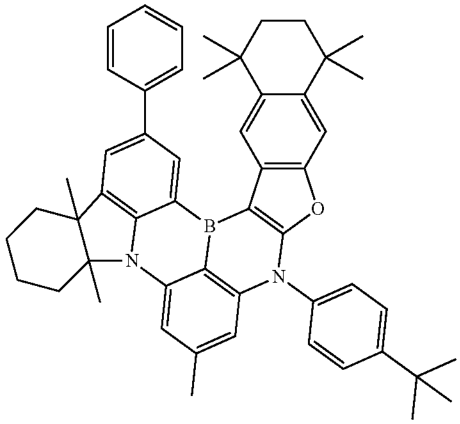

-continued
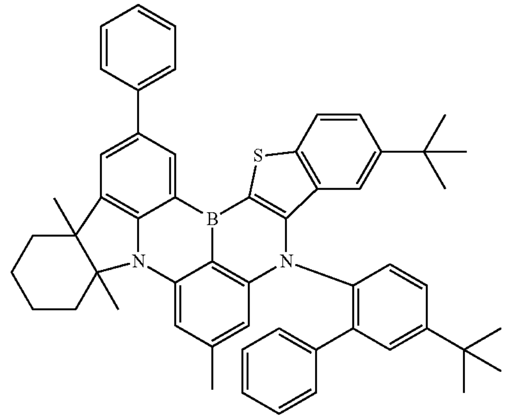
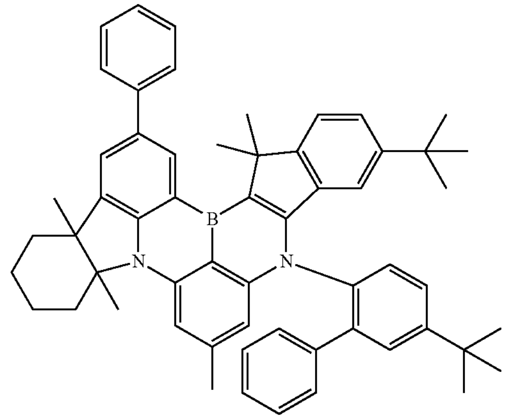
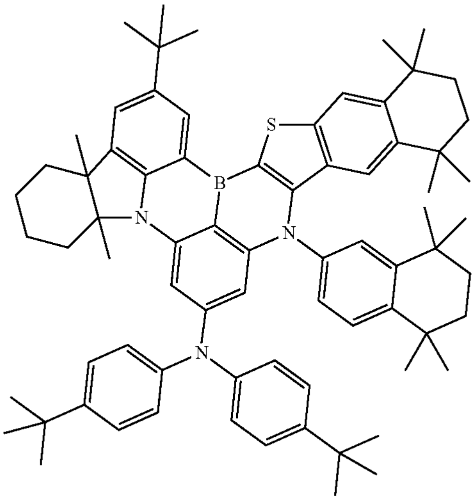
-continued
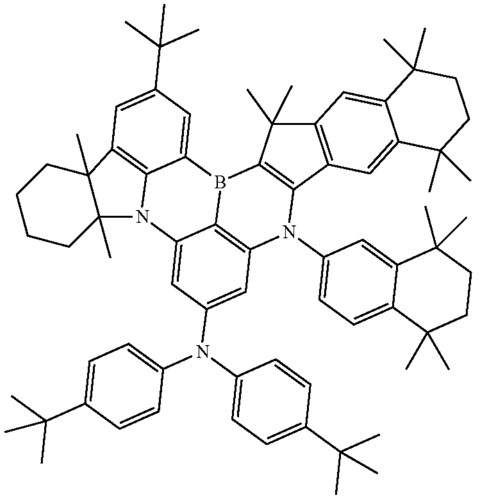
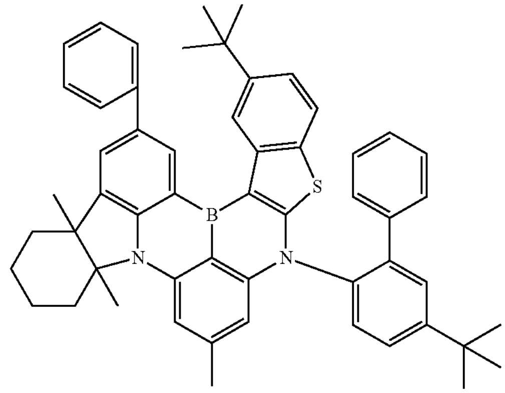
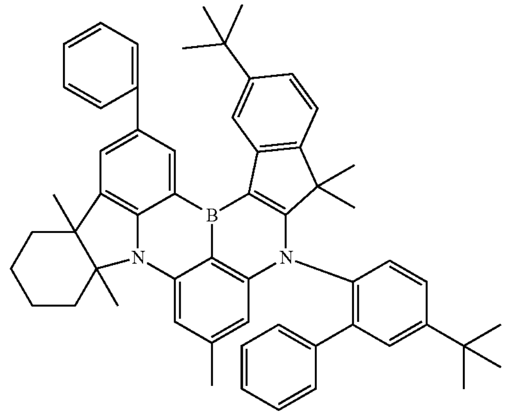

-continued
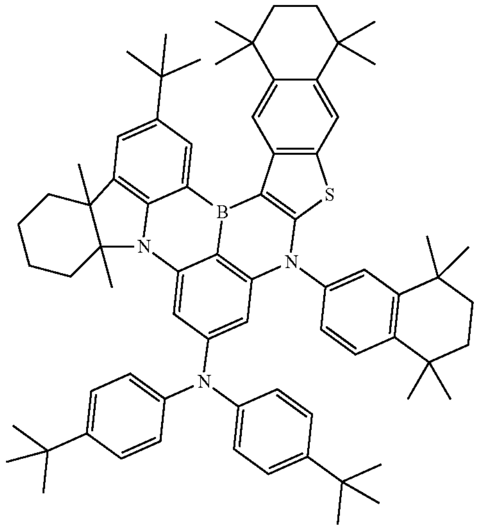
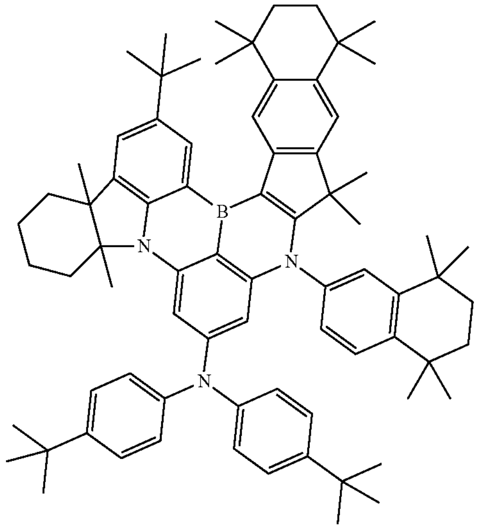
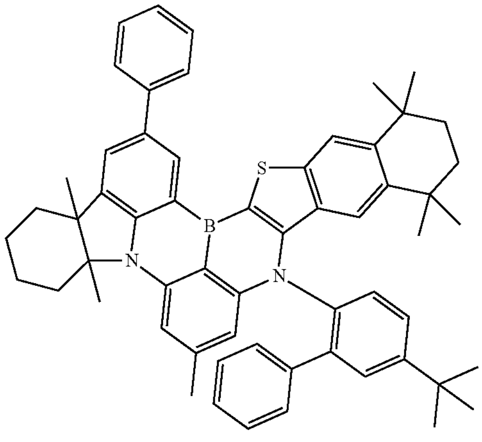
-continued
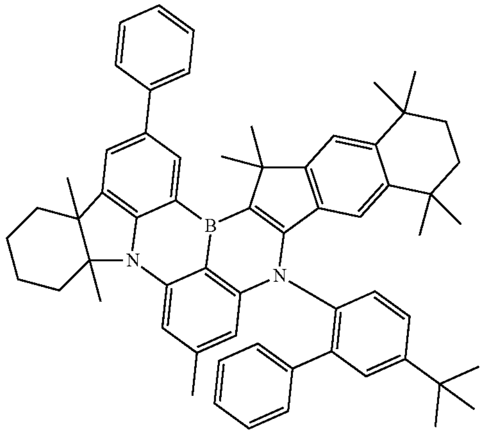
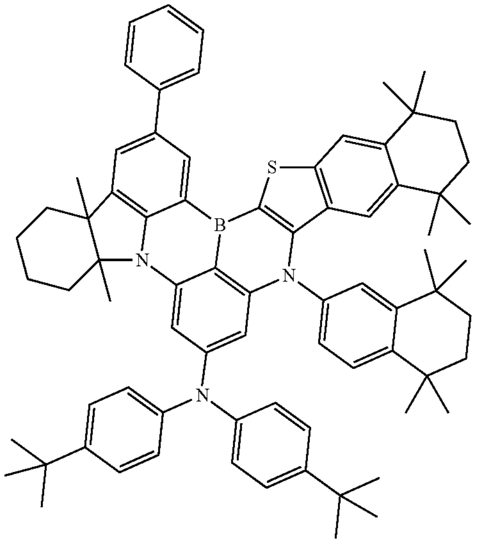
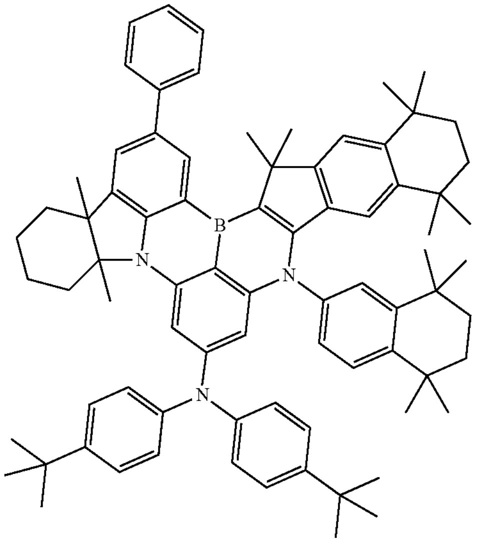

-continued
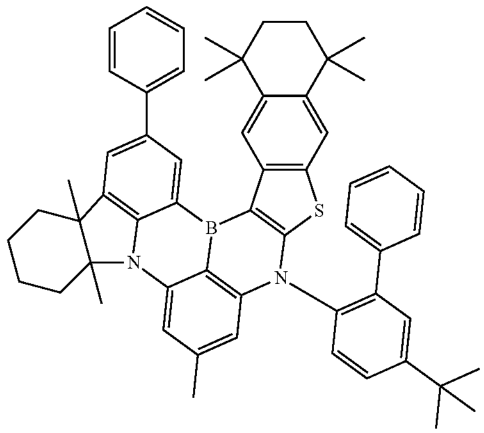
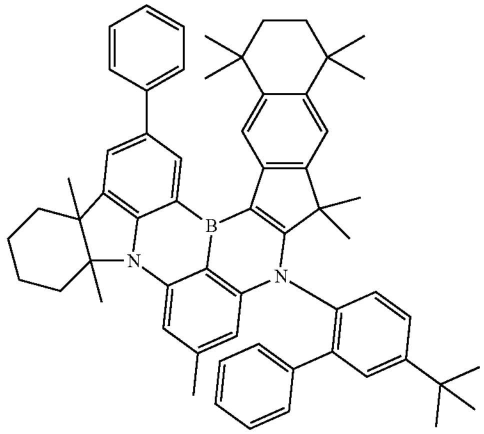
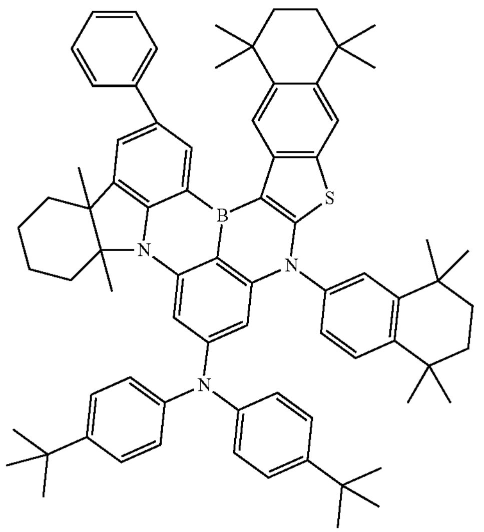
-continued
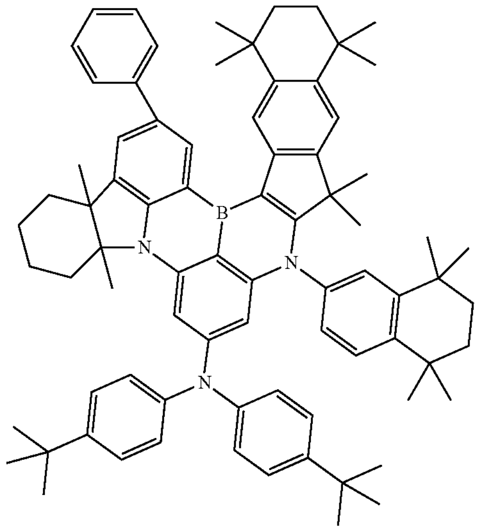
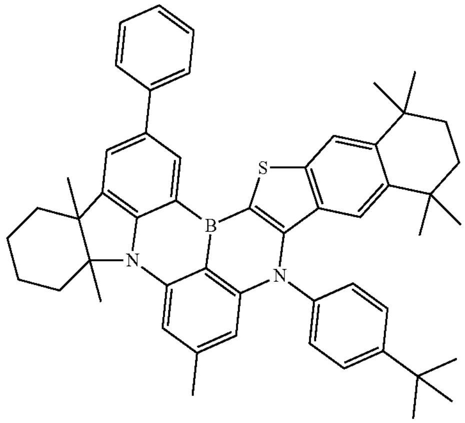
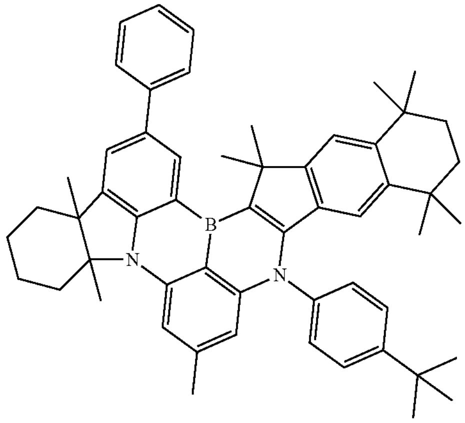

-continued
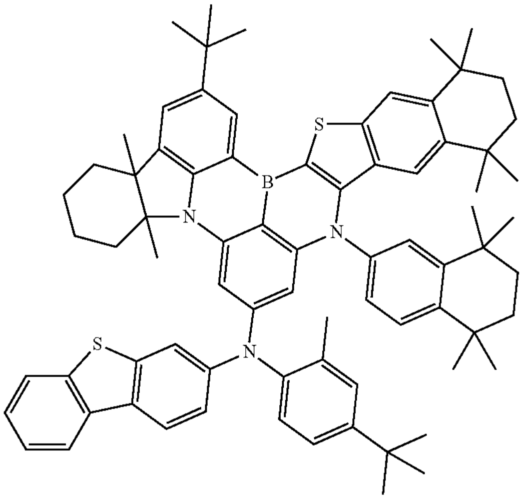
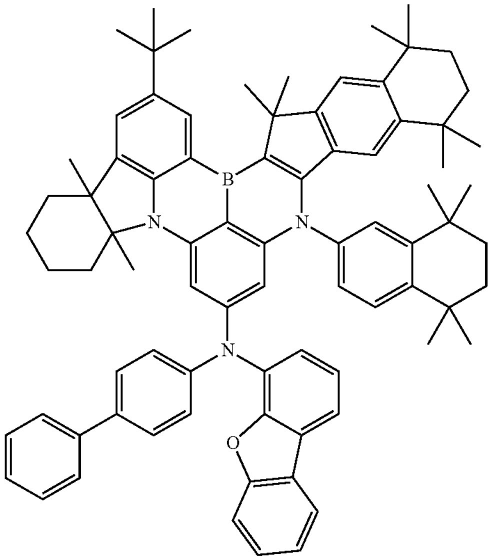
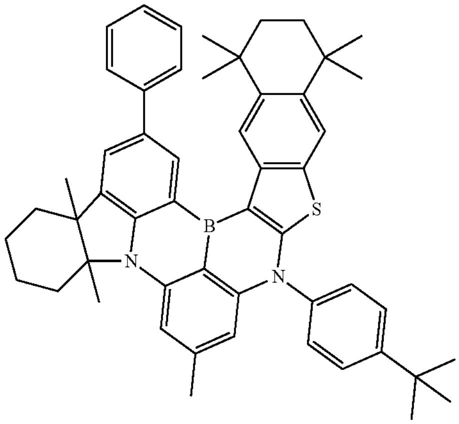
-continued
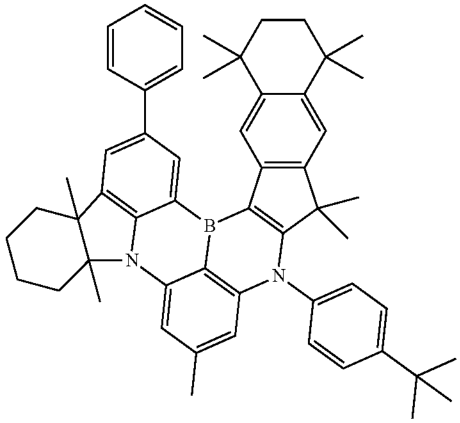
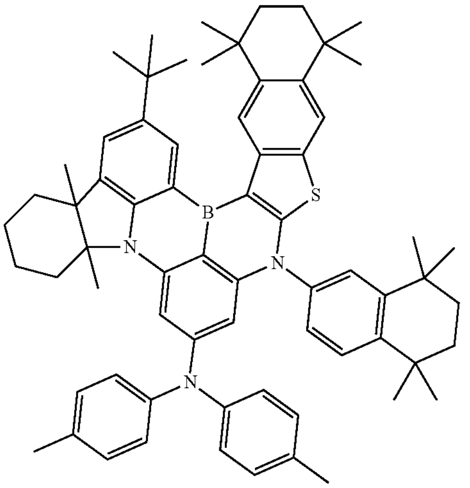
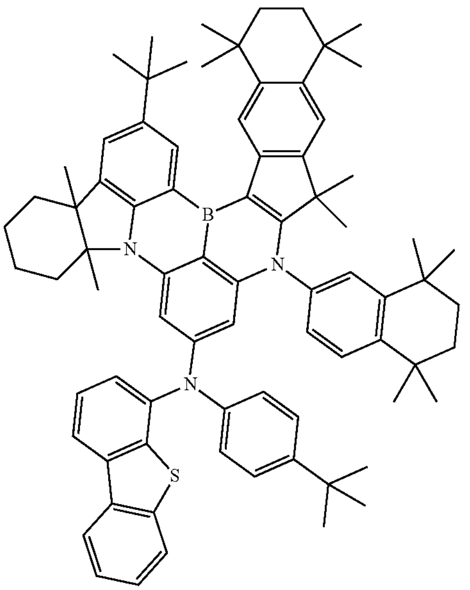

-continued
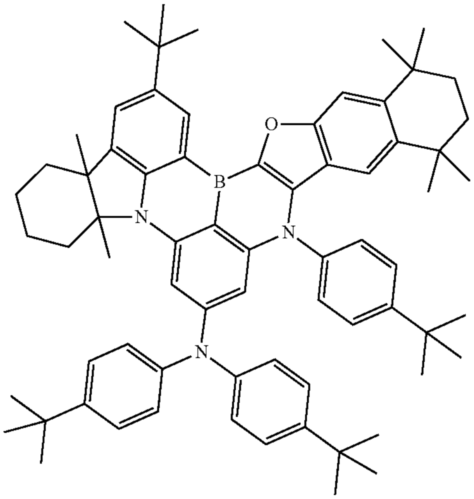
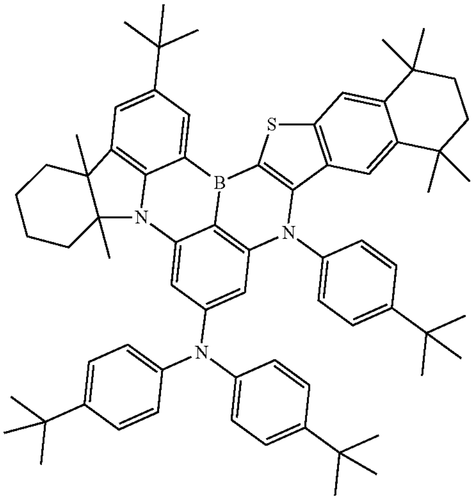
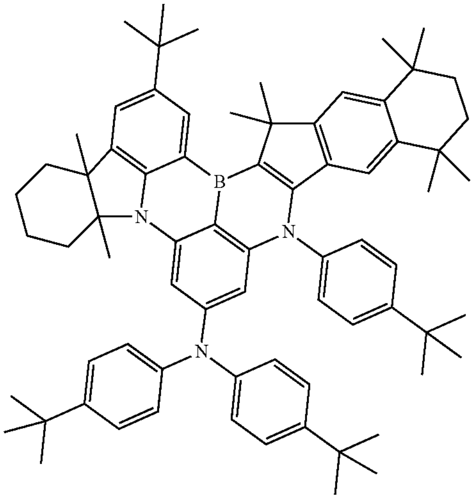
-continued
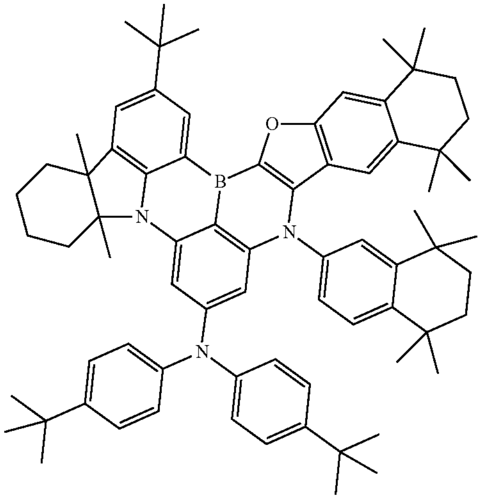
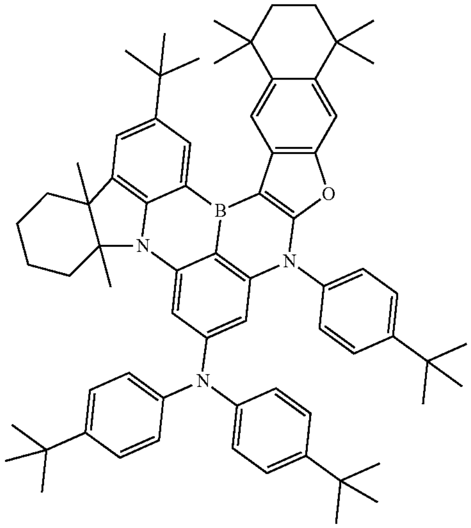
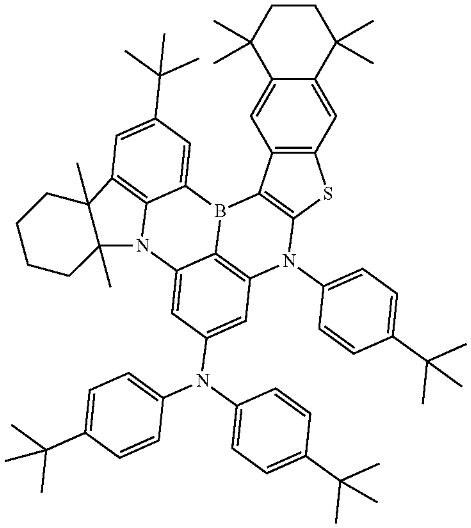

-continued
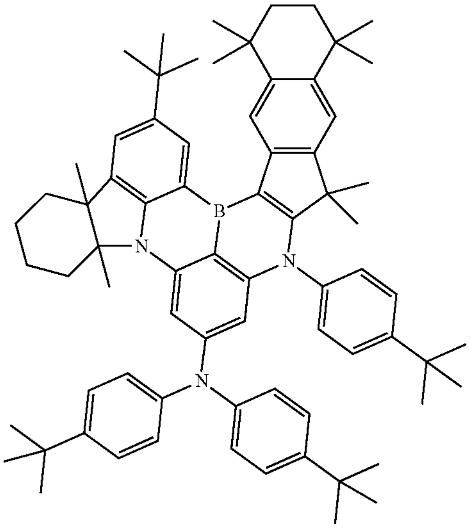
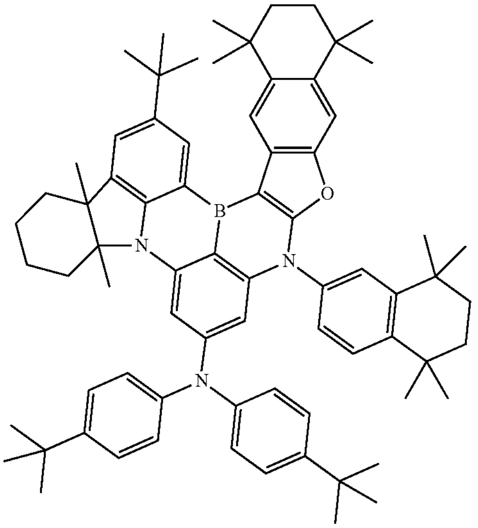
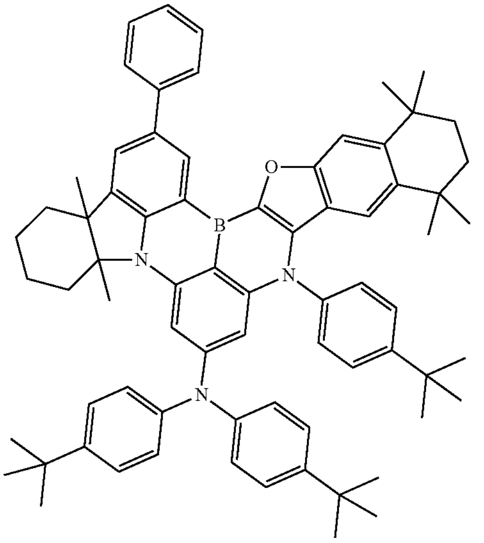
-continued
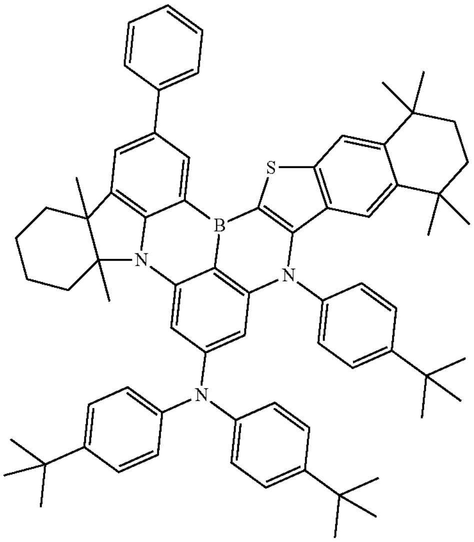
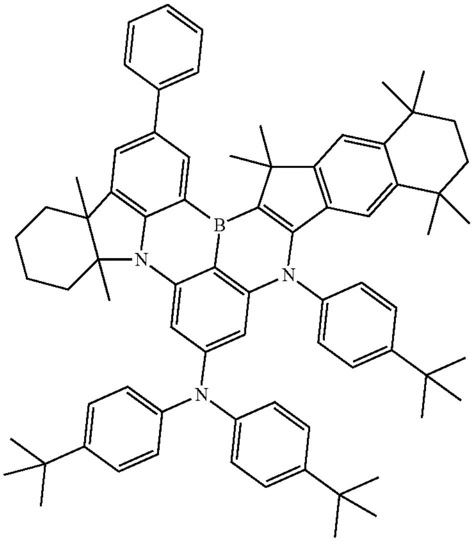
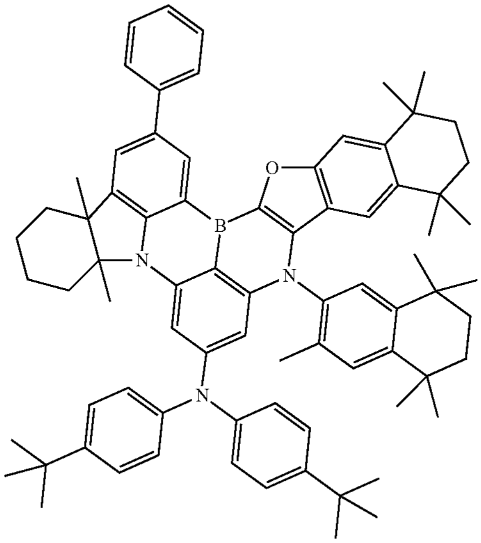

-continued
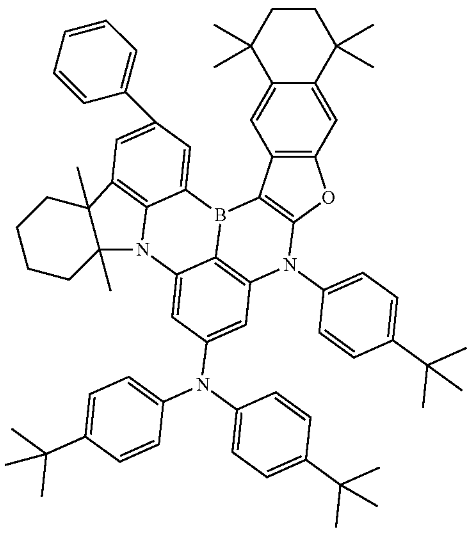
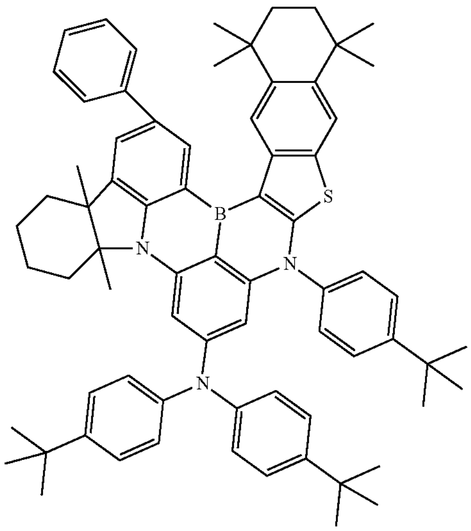
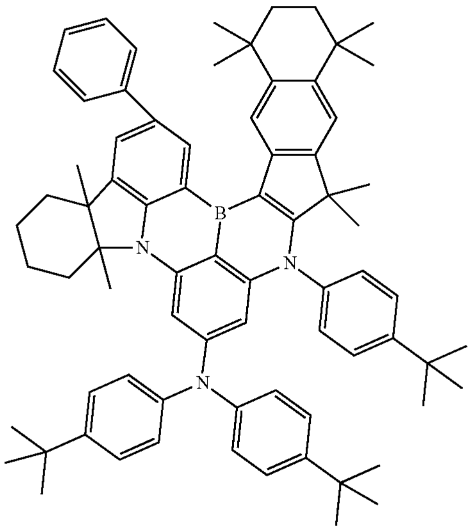
-continued
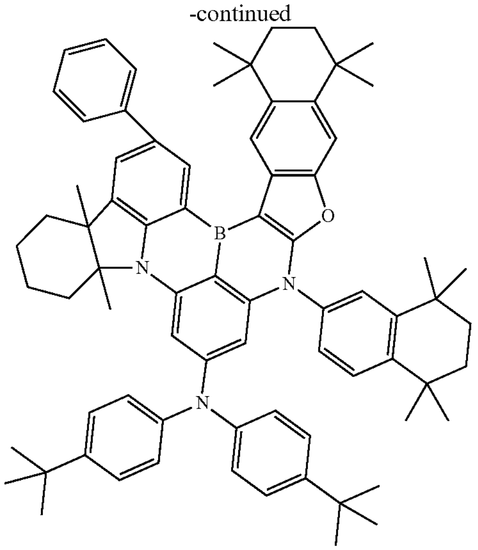
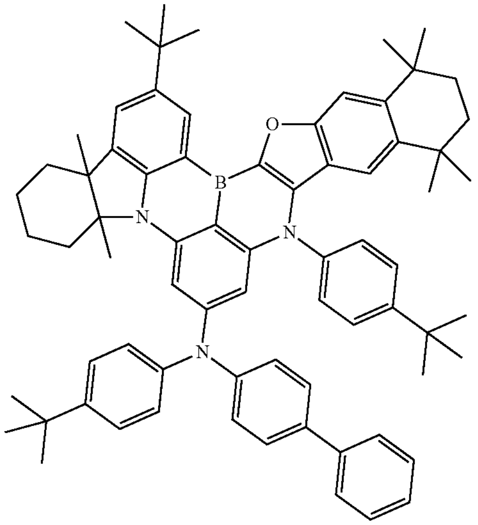
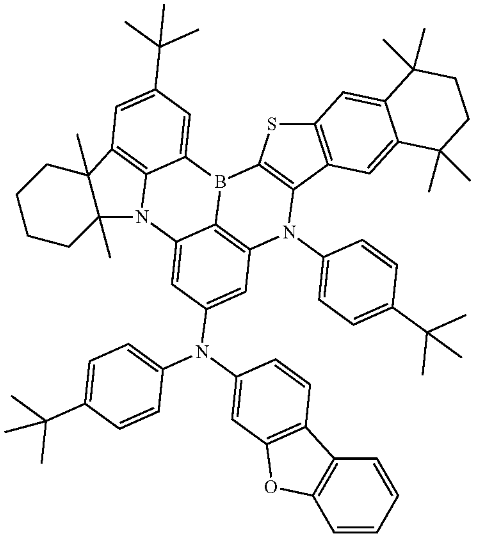

-continued
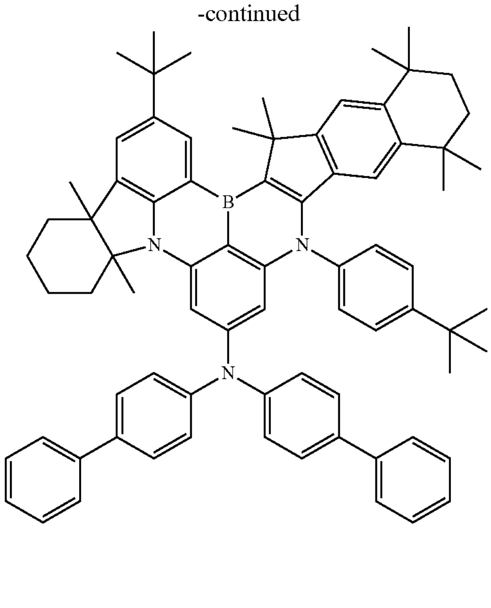
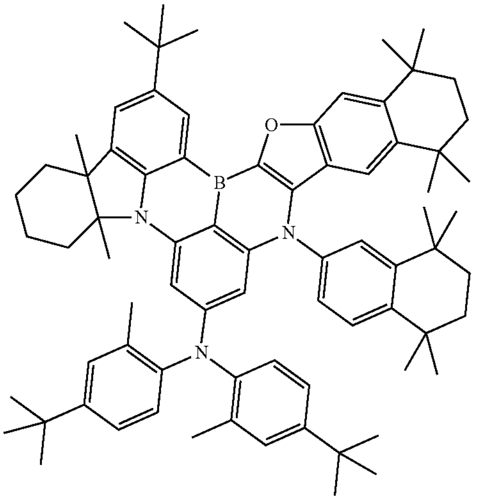
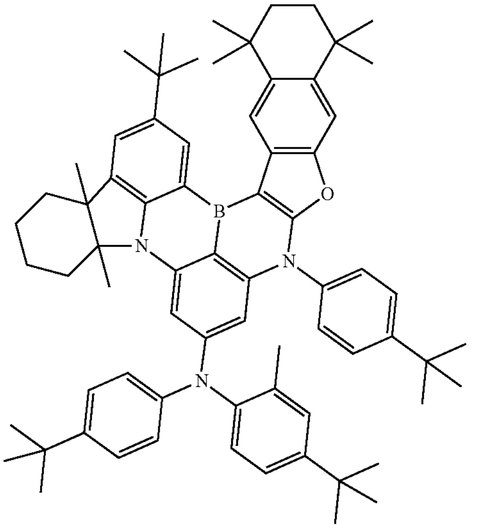
-continued
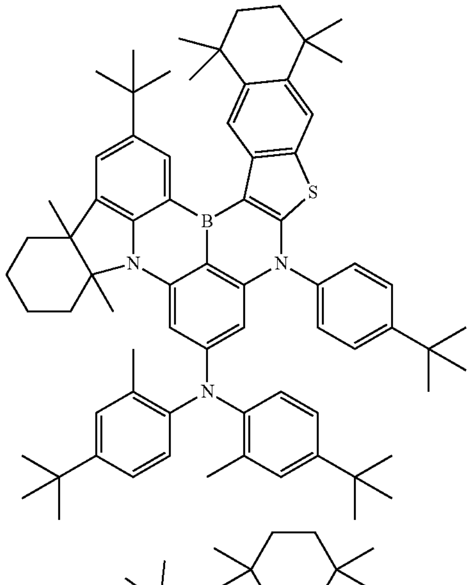
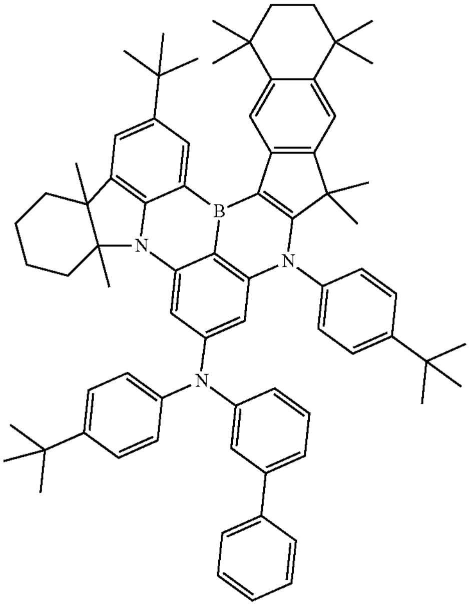
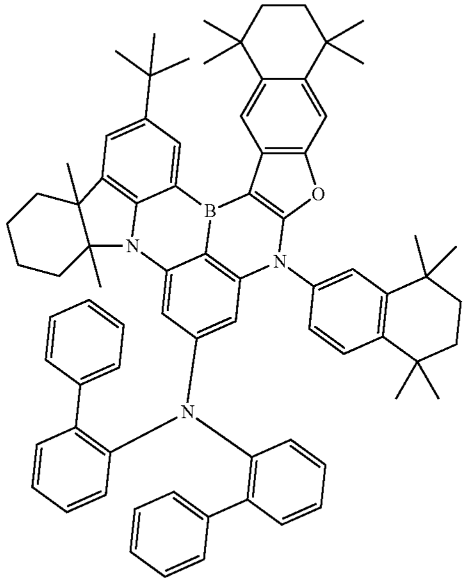

-continued
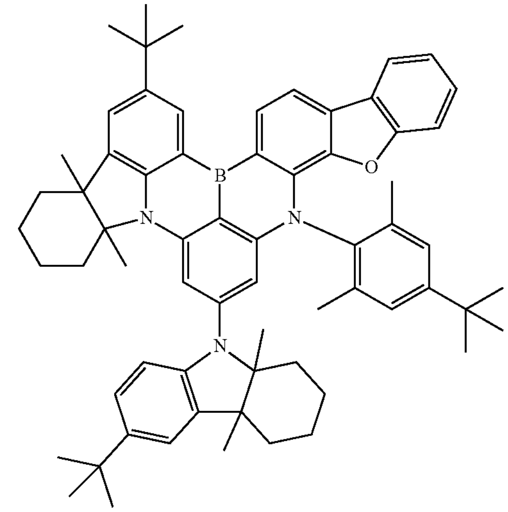
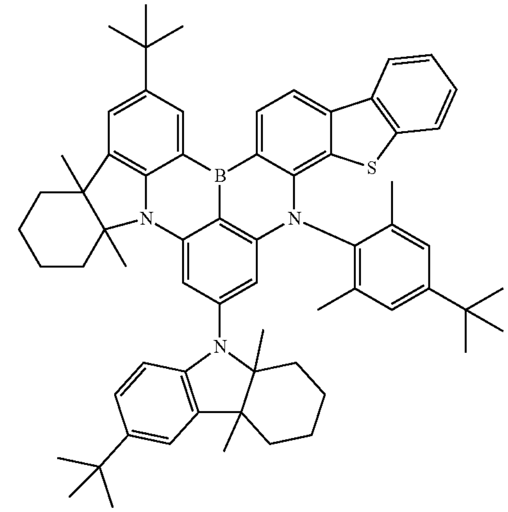
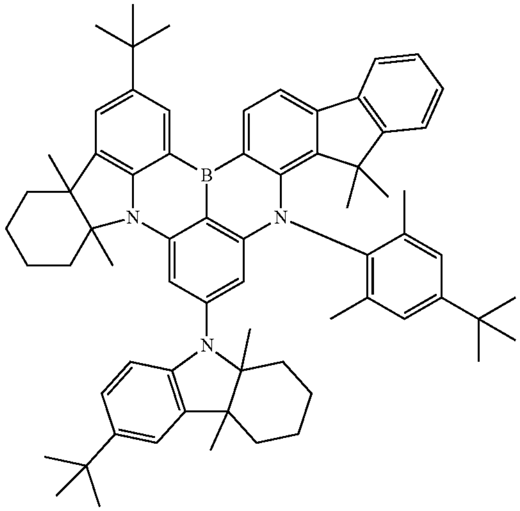
-continued
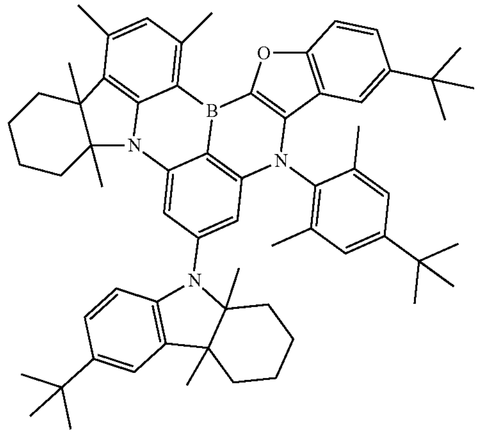
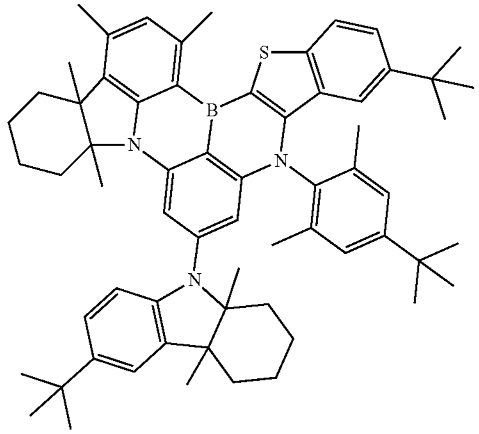
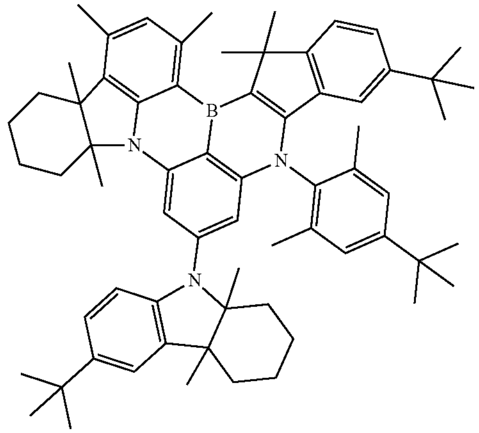

-continued
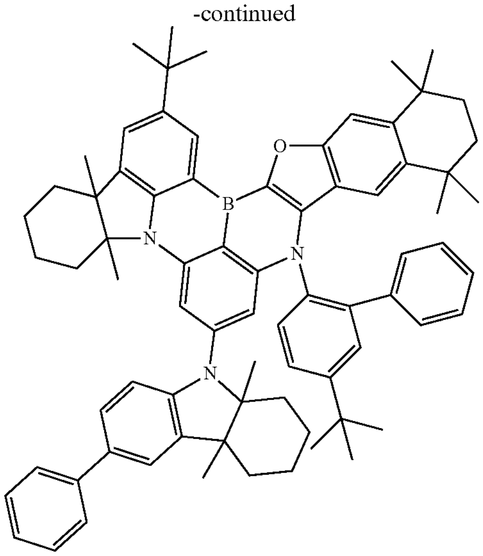
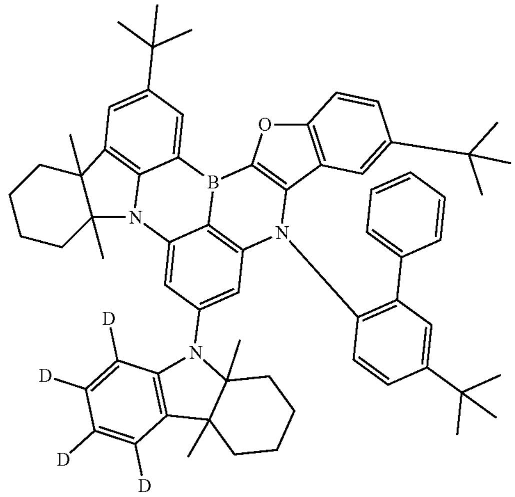
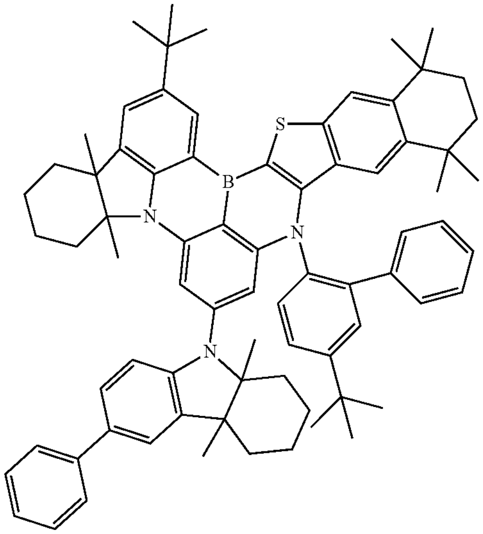
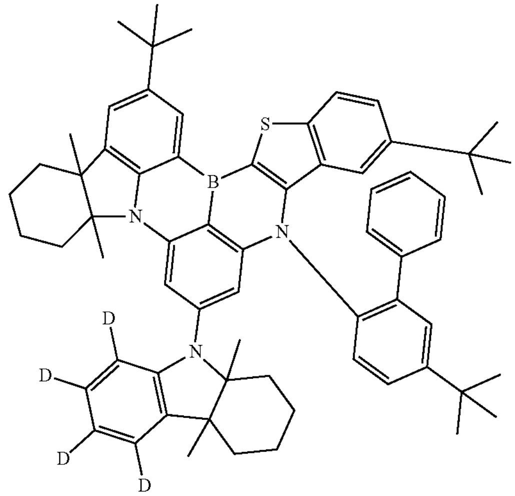
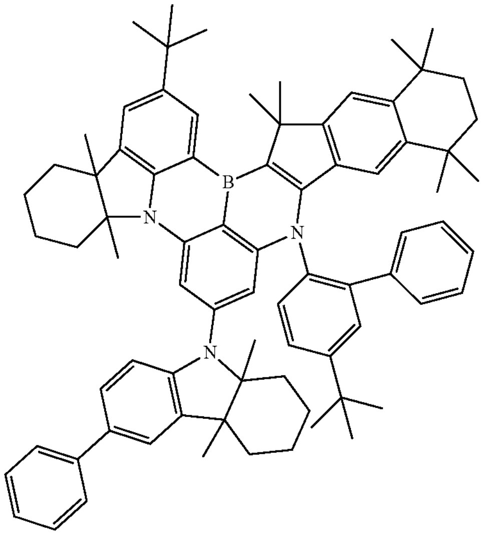
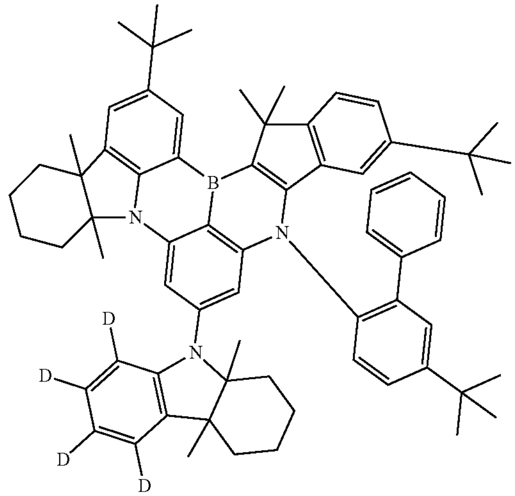

-continued
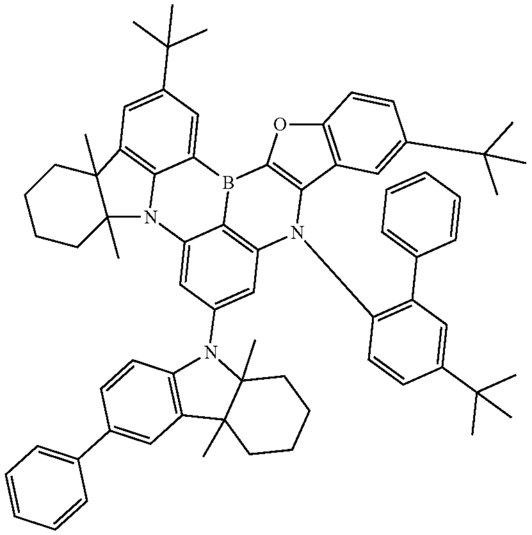
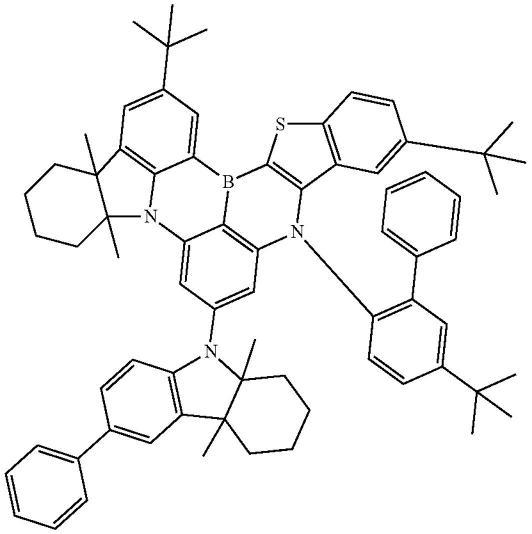
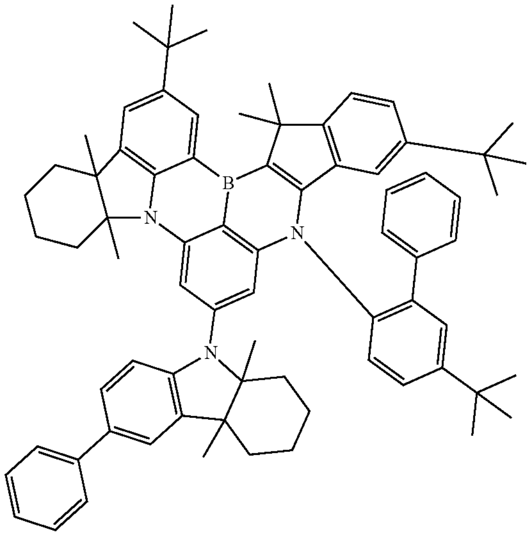
-continued
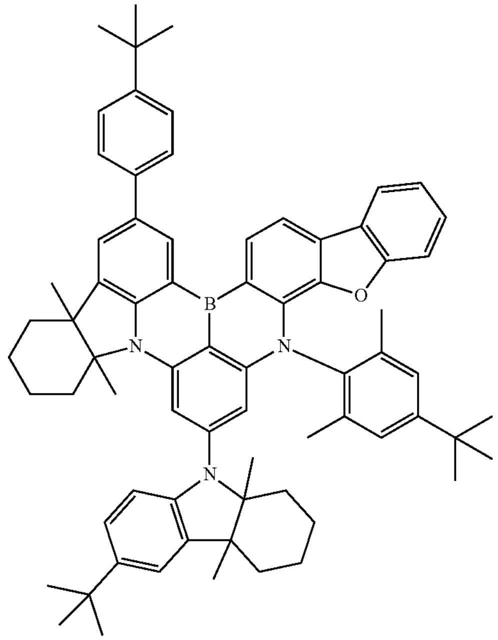
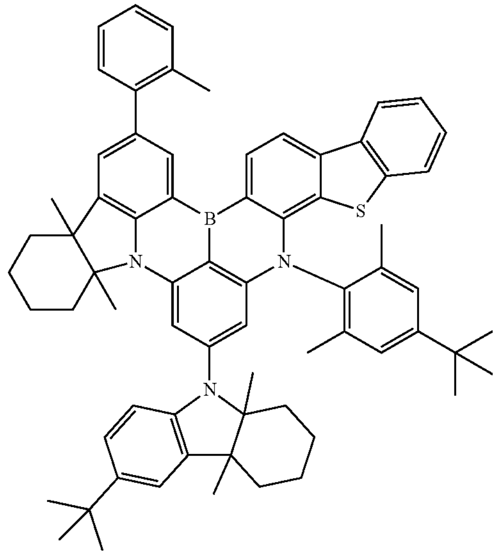

-continued
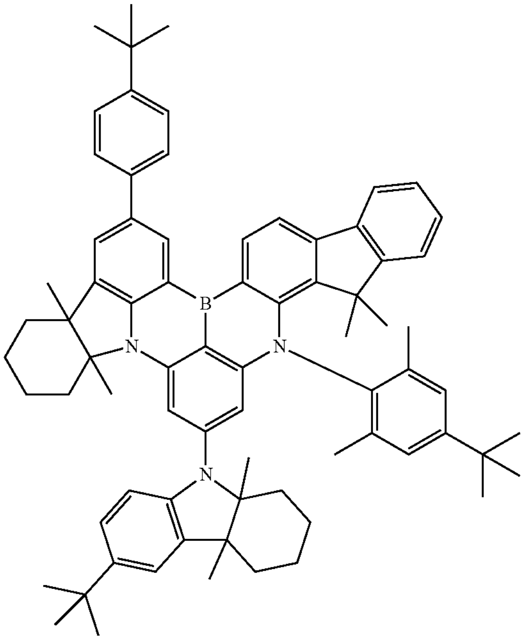
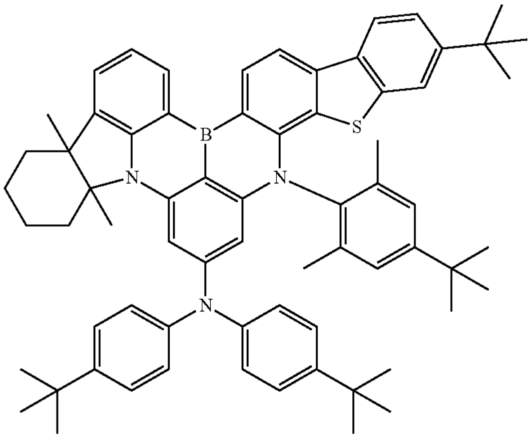
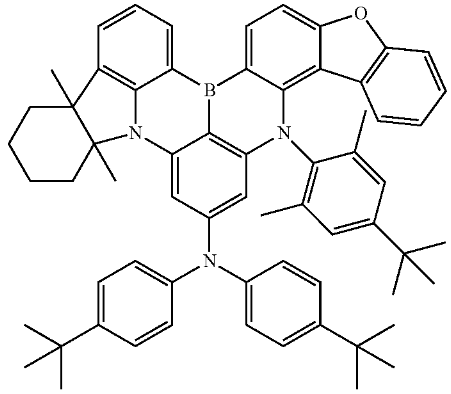
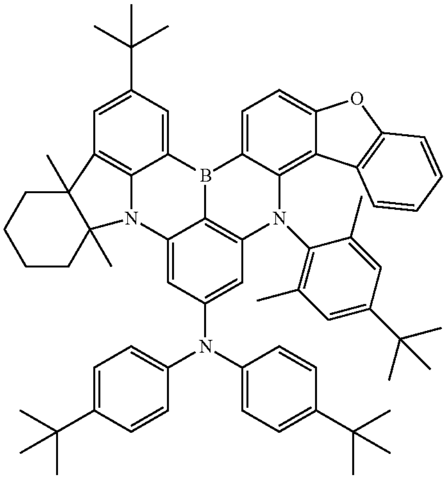
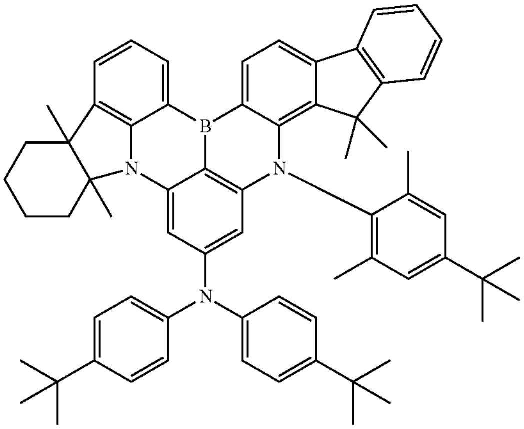
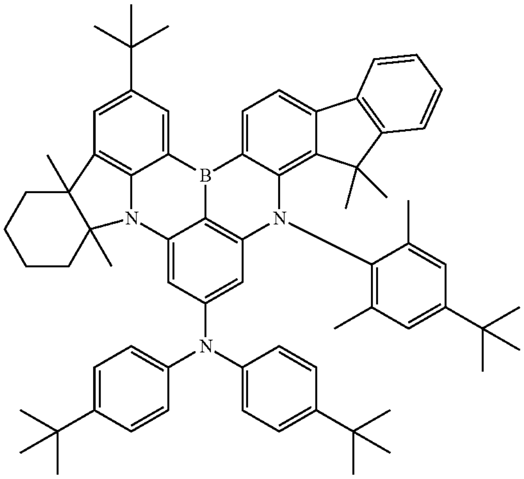
-continued -continued
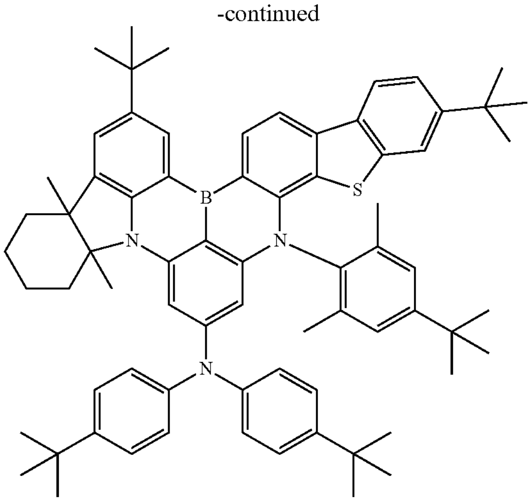
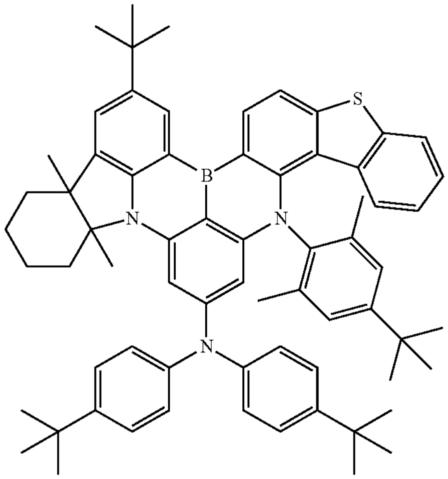
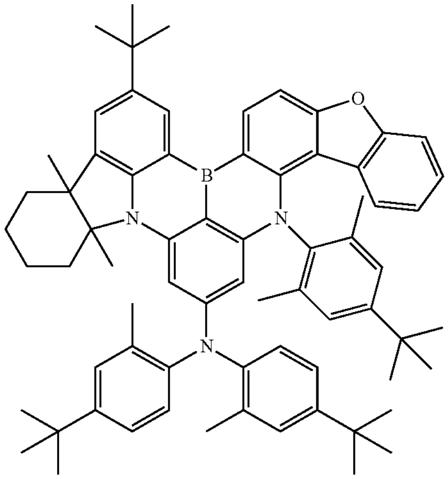
-continued
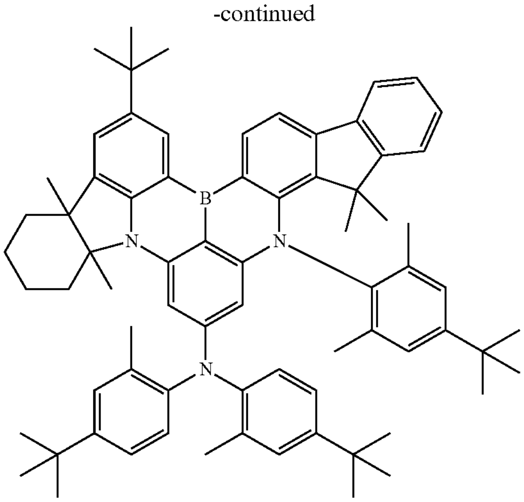
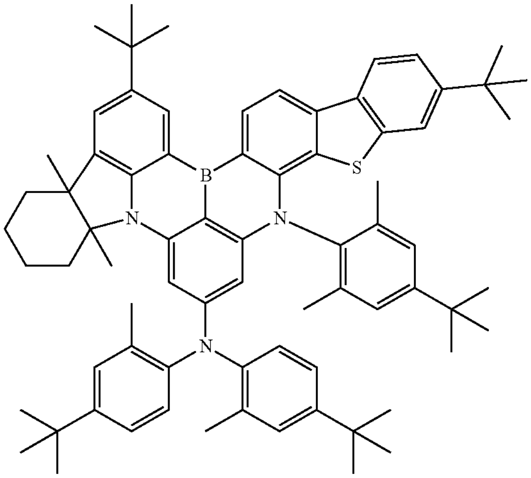
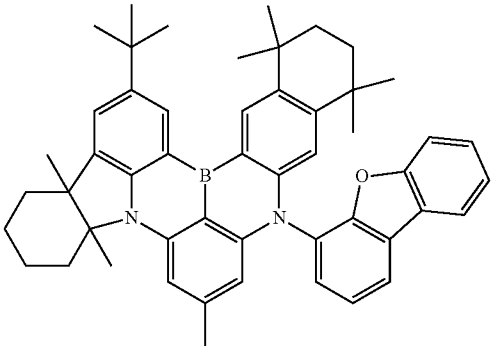

-continued
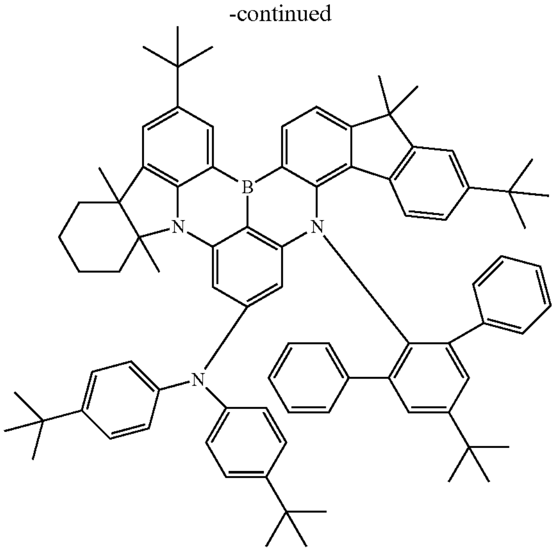
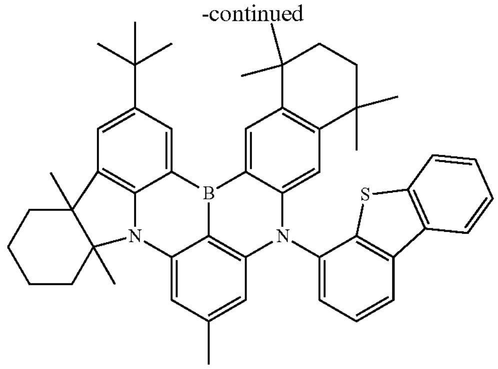
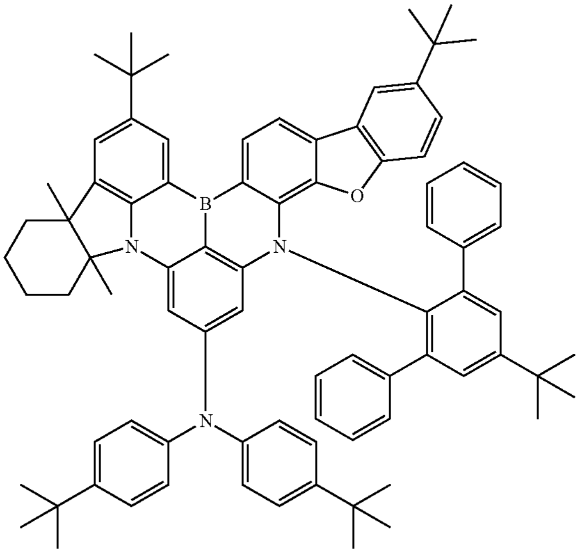
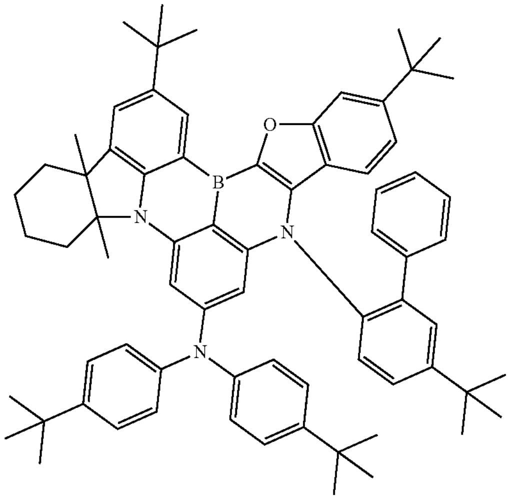
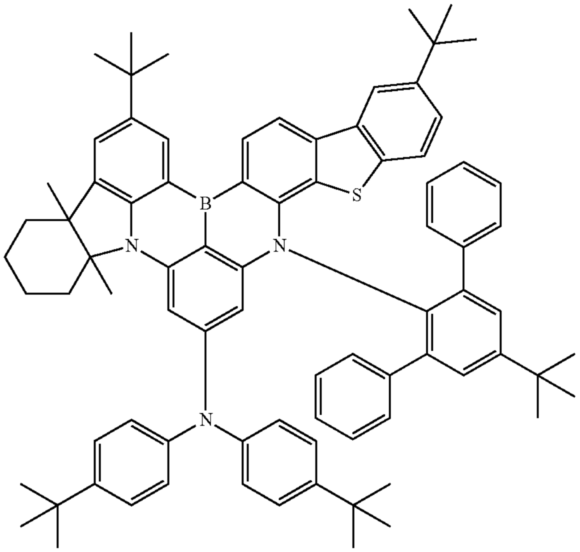
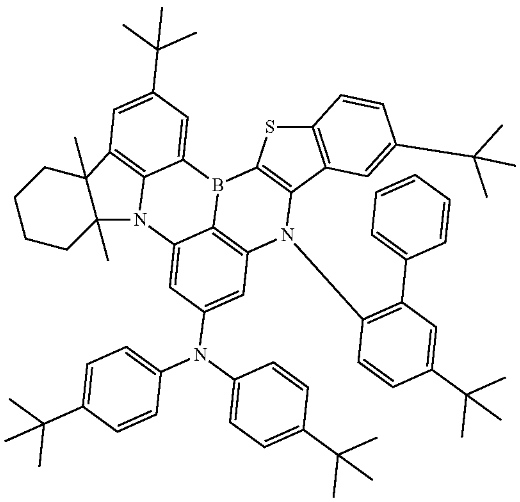

-continued
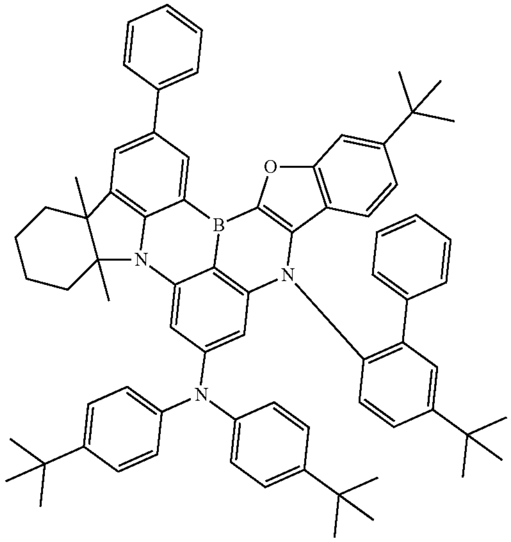
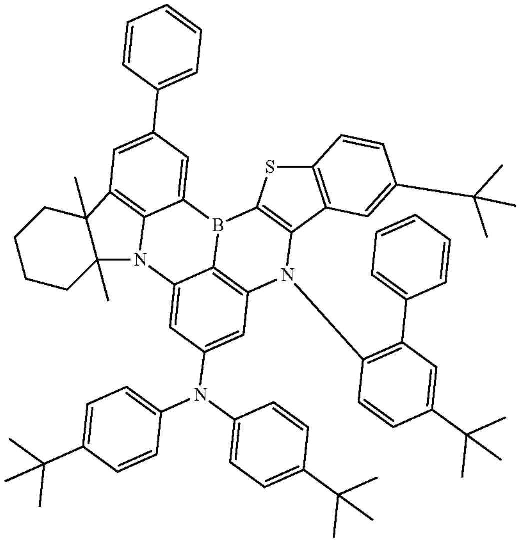
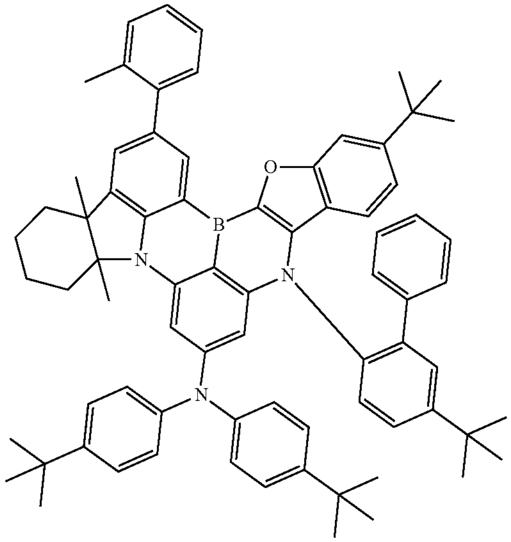
-continued
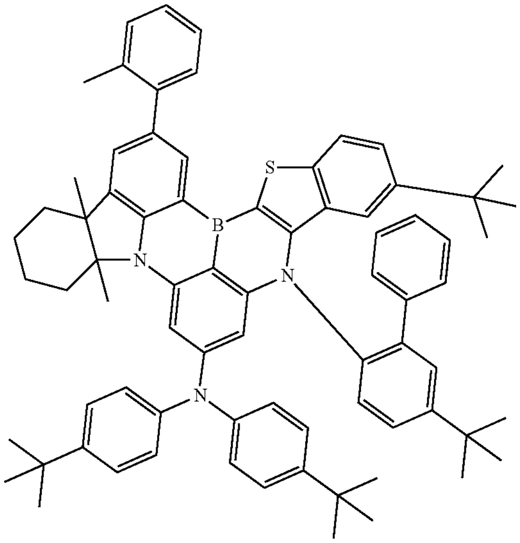
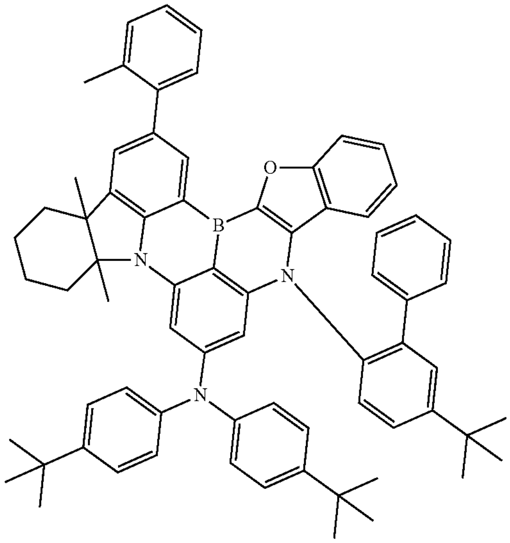
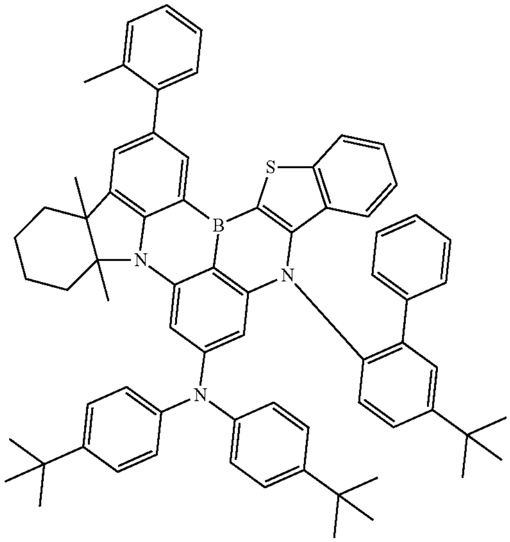

-continued
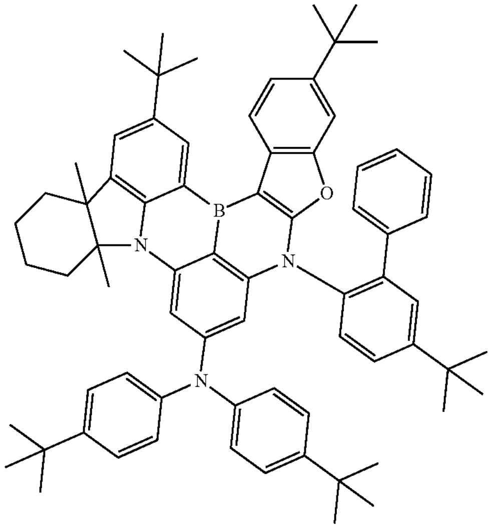
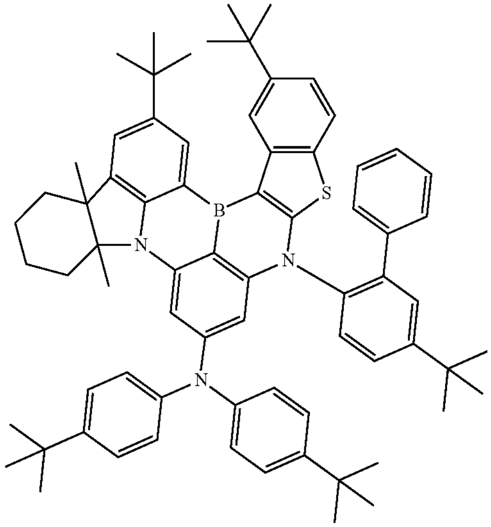
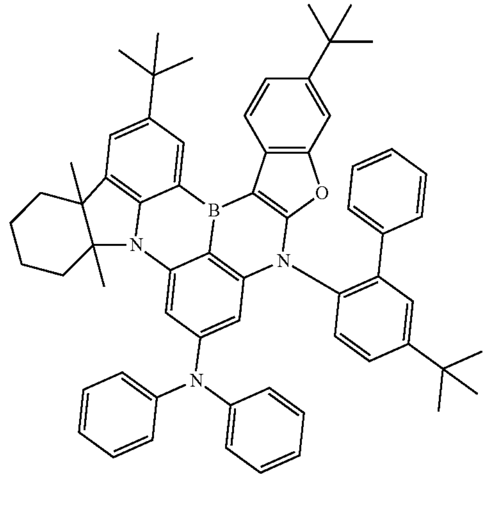
-continued
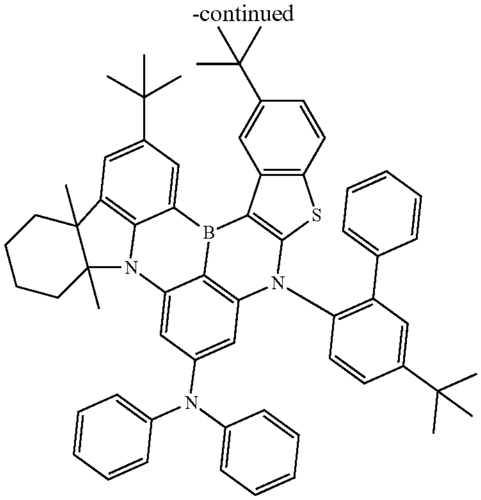
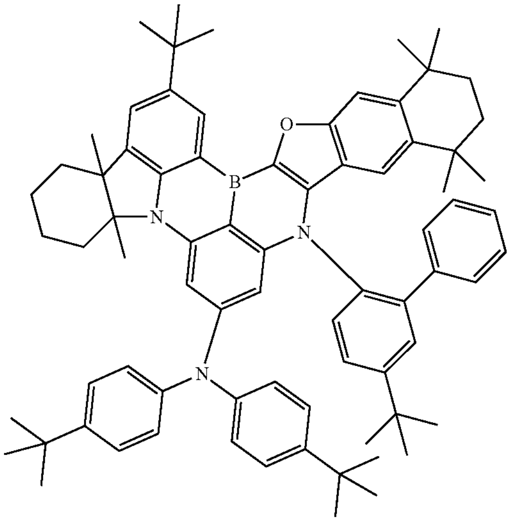
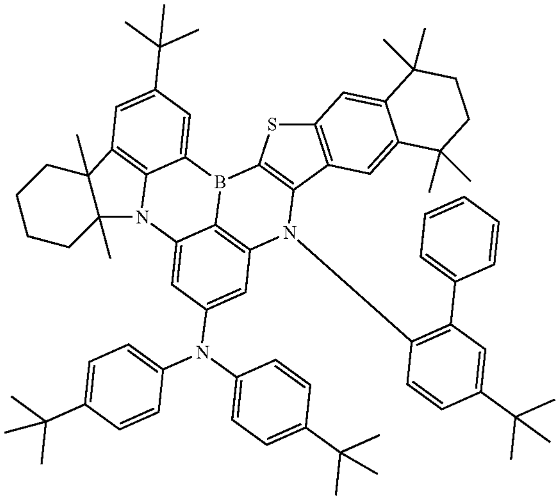

-continued
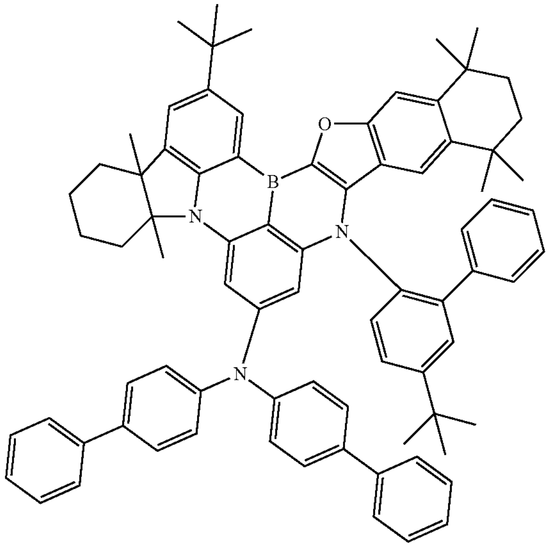
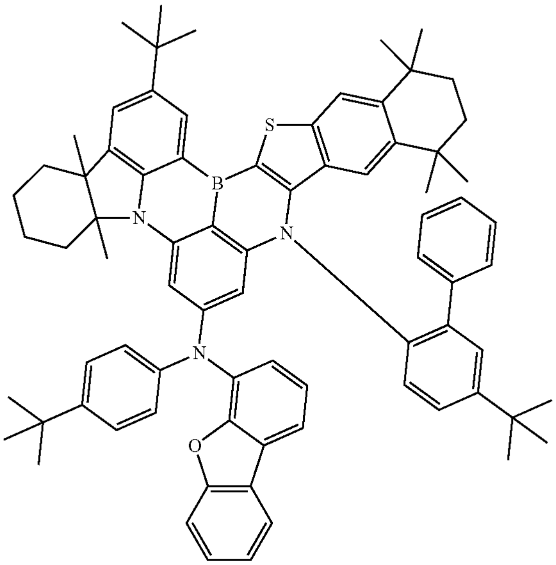
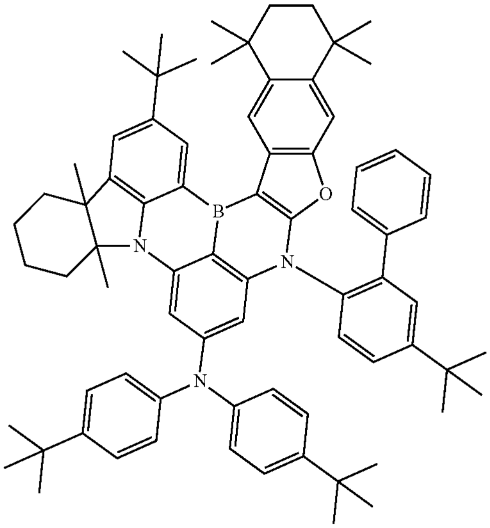
-continued
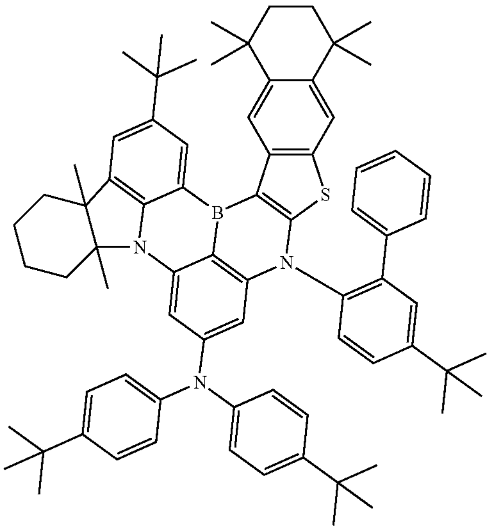
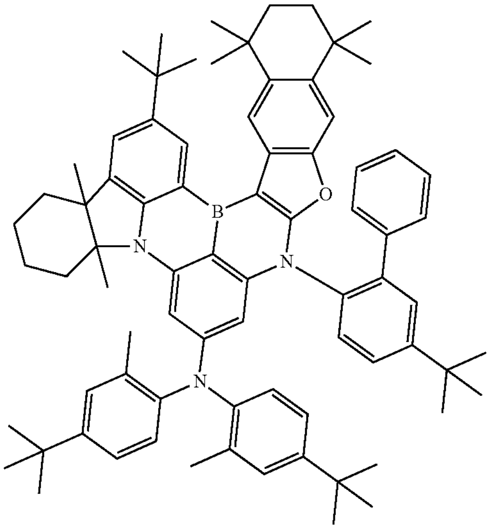
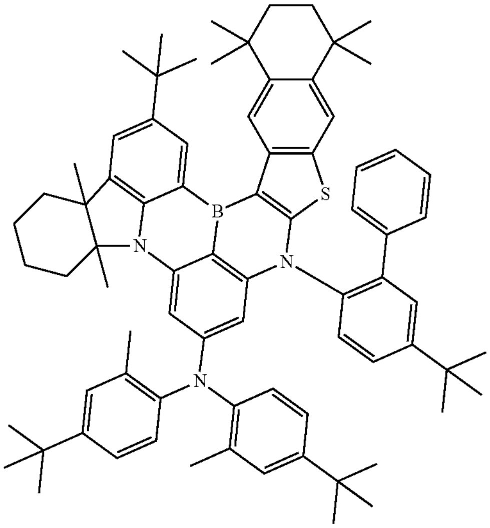

-continued
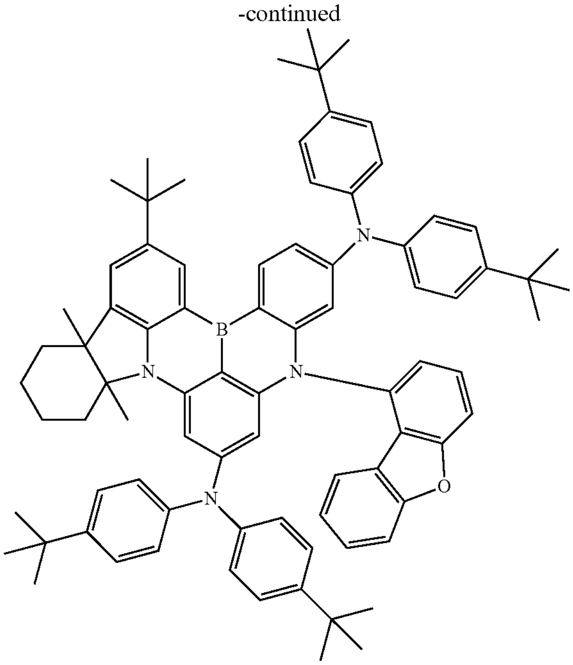
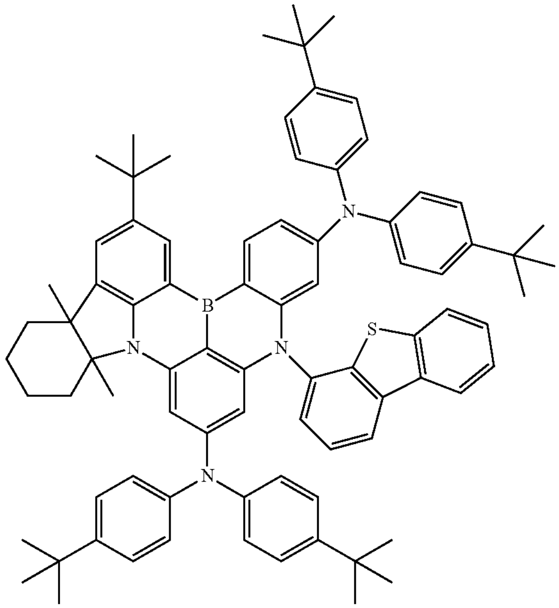
-continued
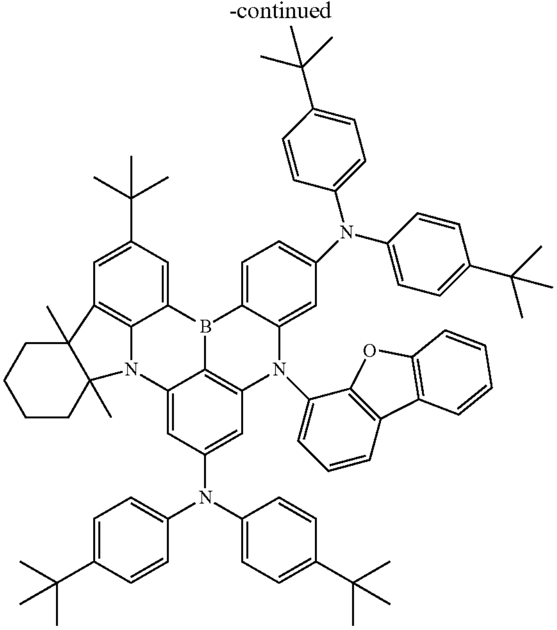
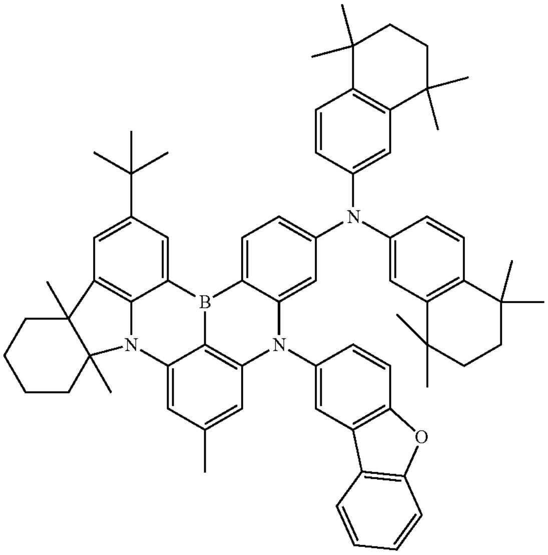
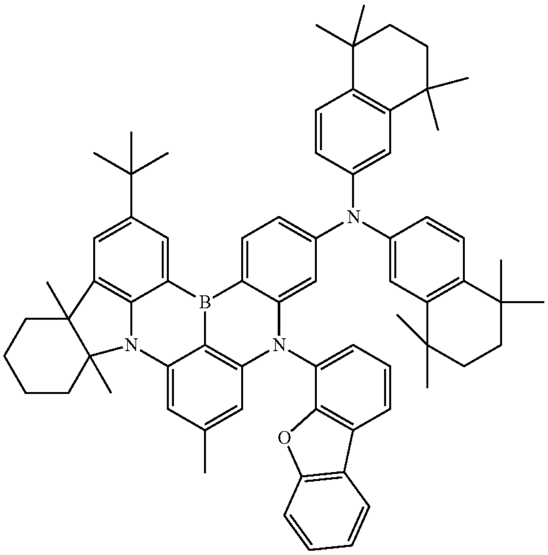

-continued
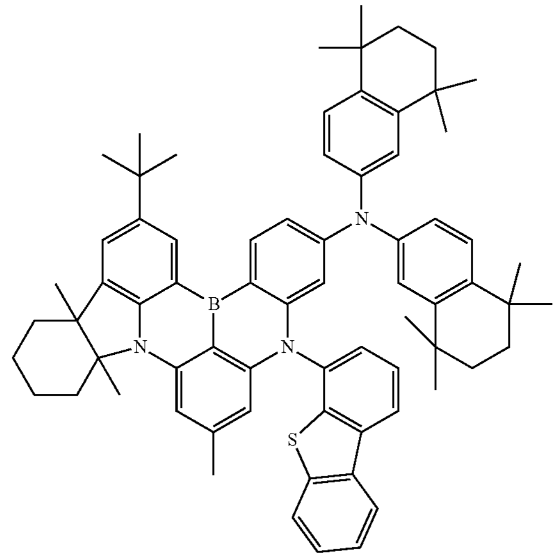
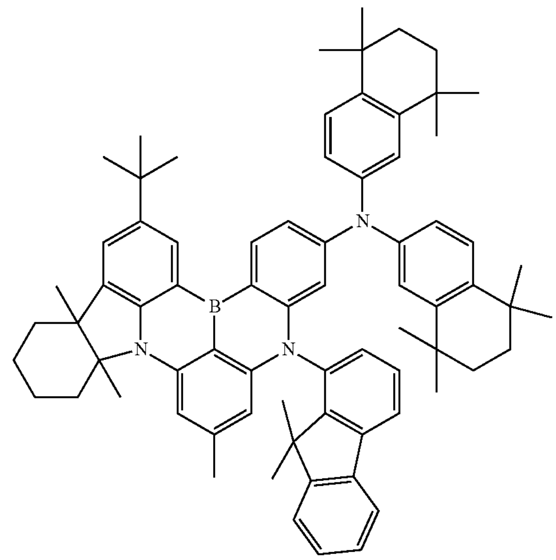
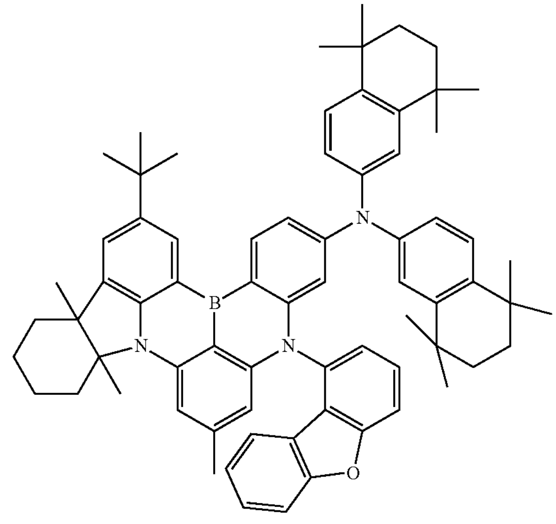
-continued
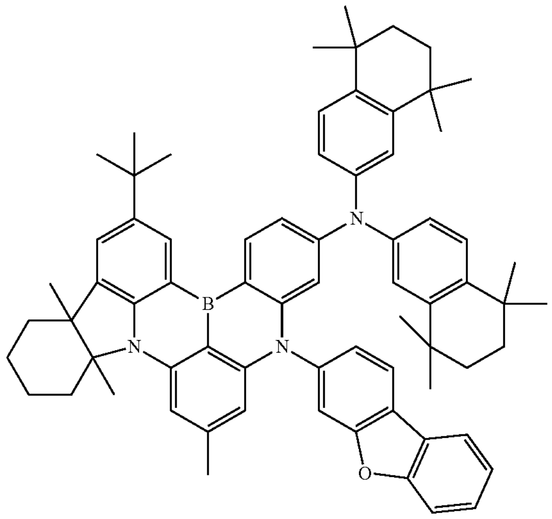
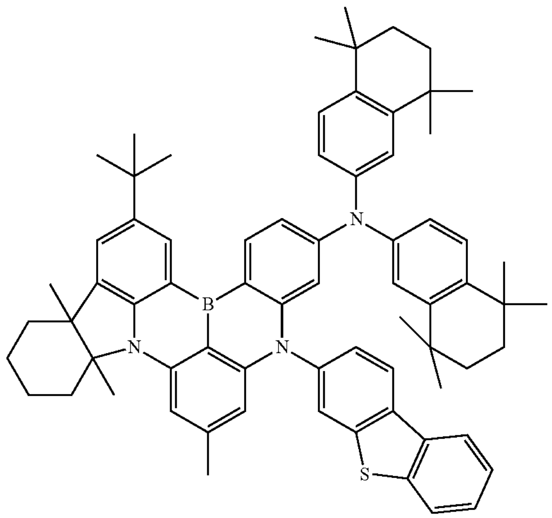
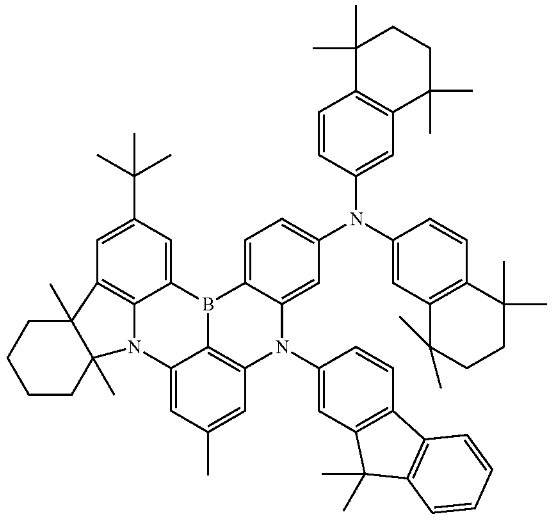

-continued
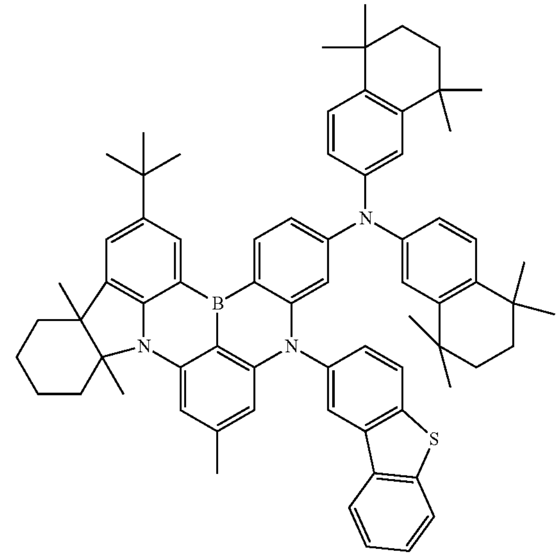
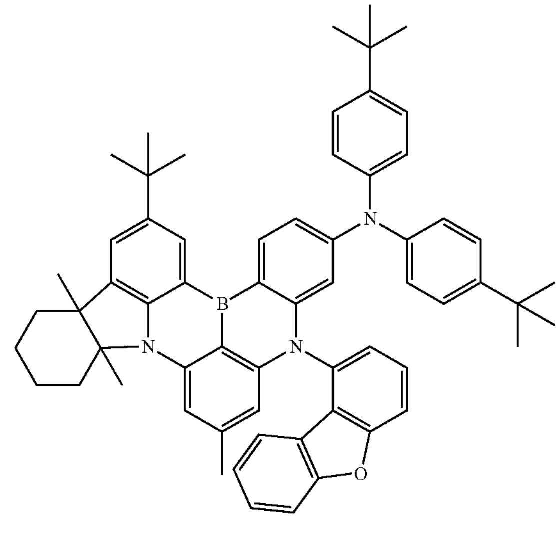
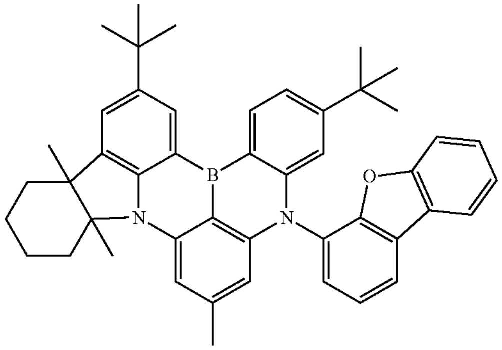
-continued
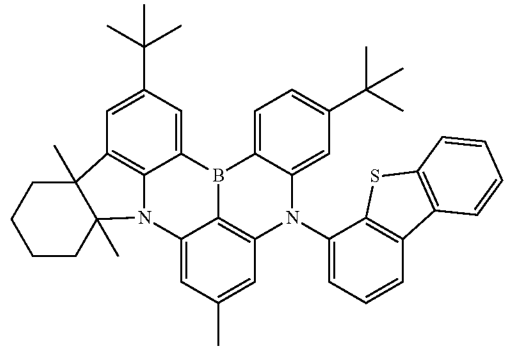
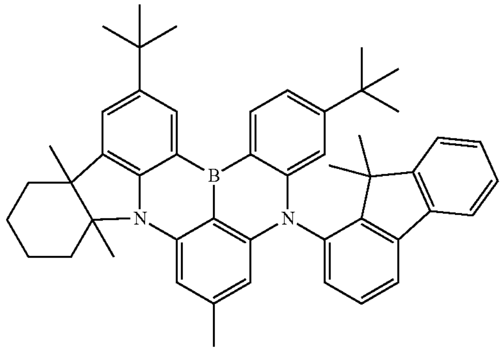
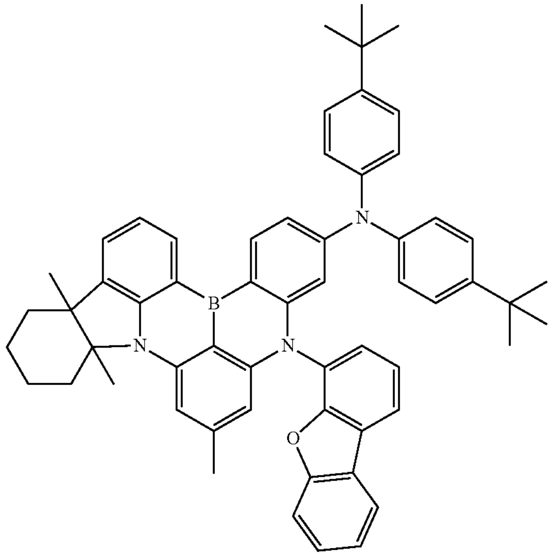
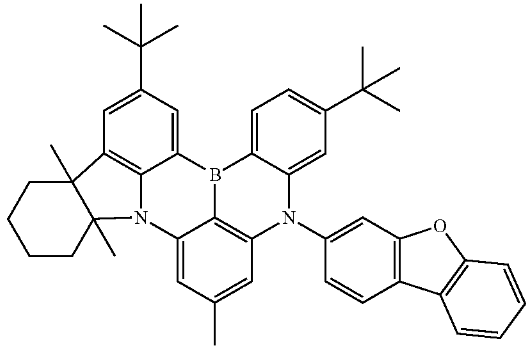

-continued
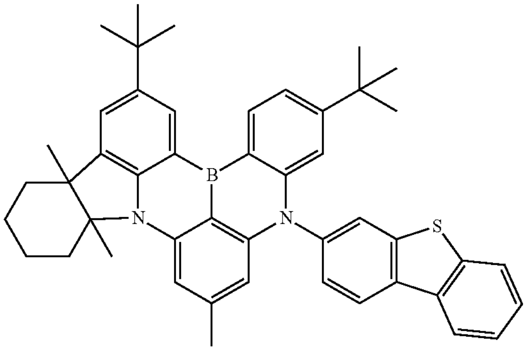
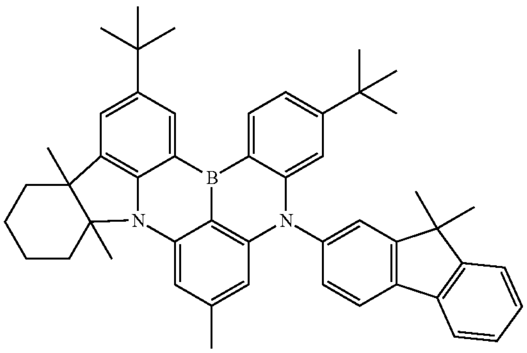
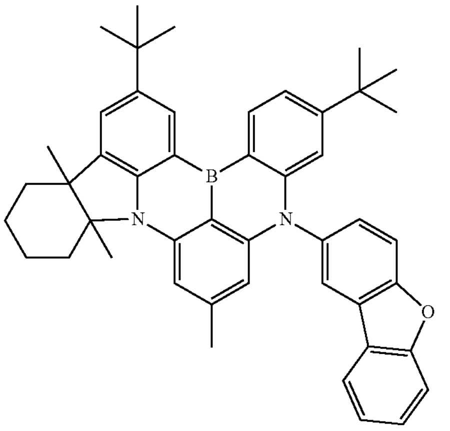
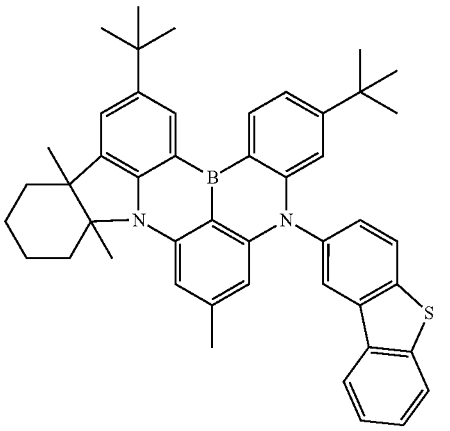
-continued
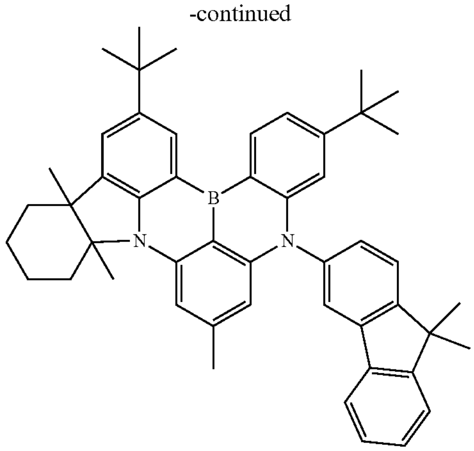
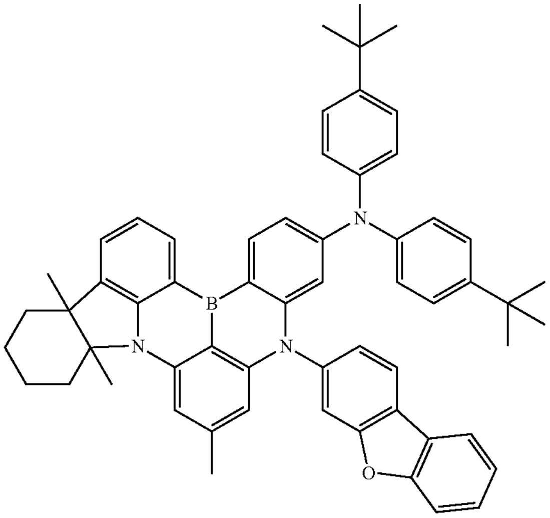
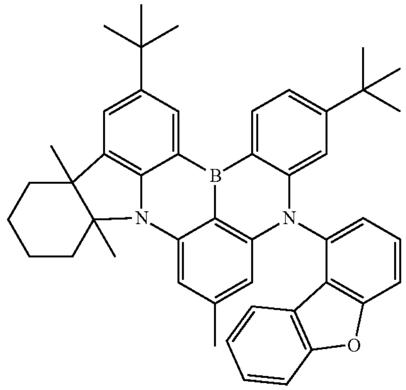
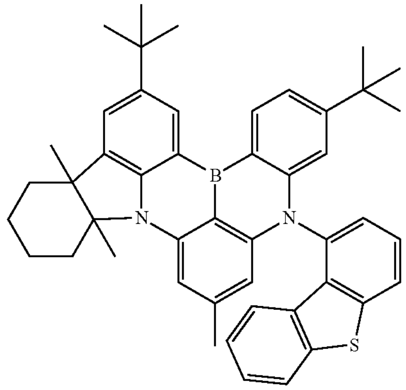

-continued
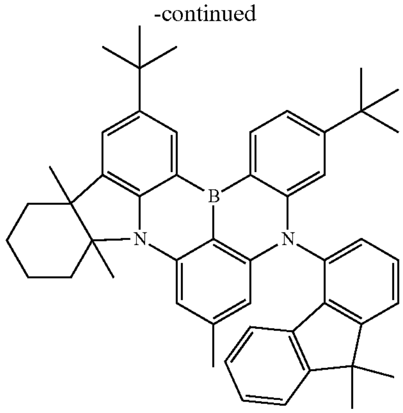
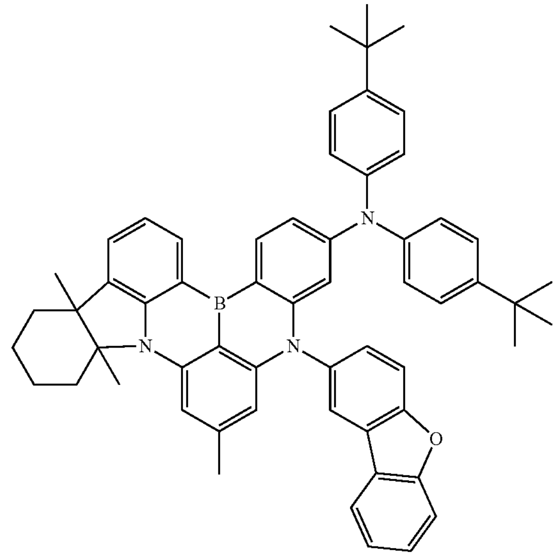
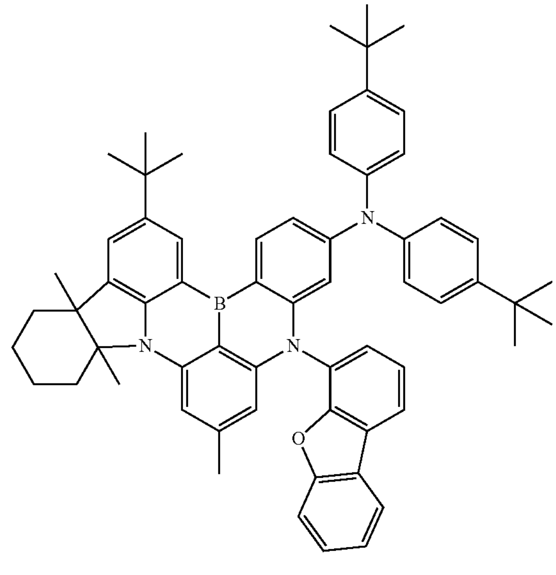
-continued
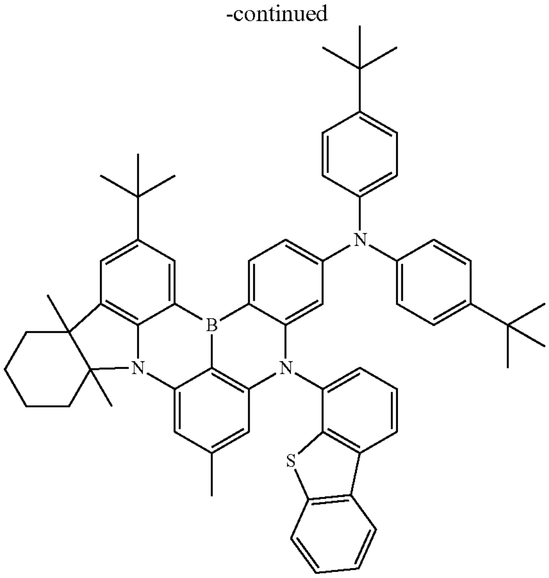
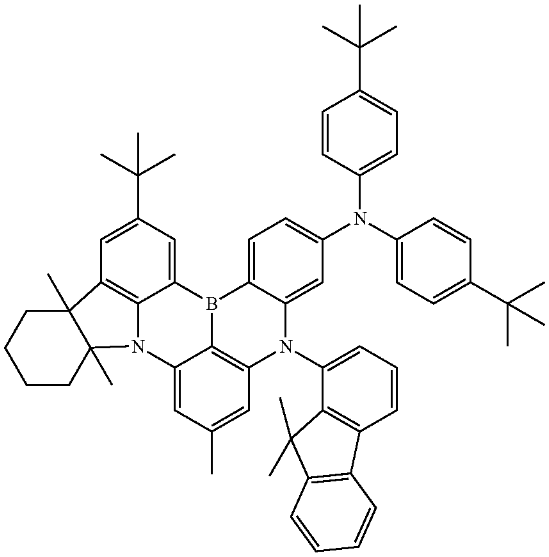
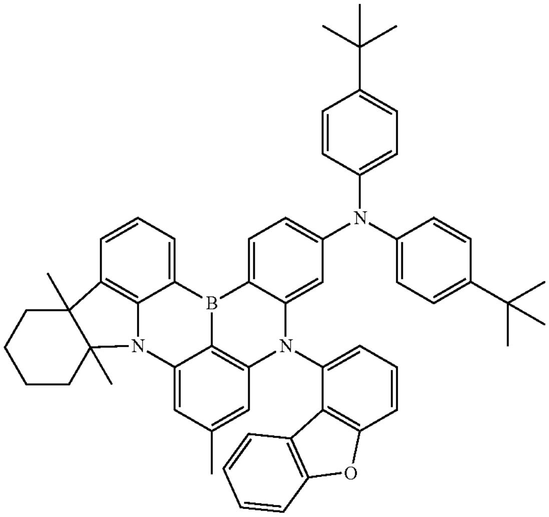

-continued
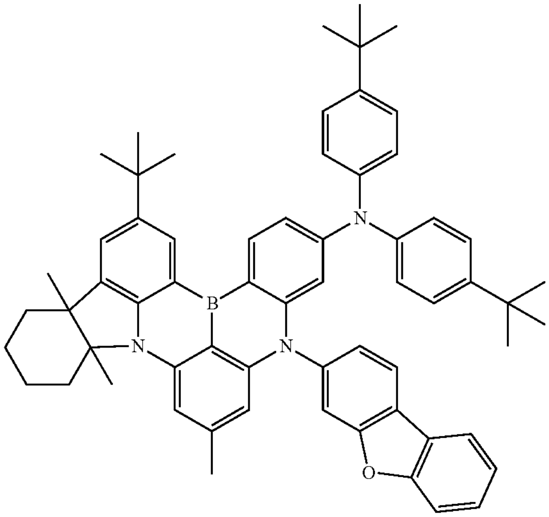
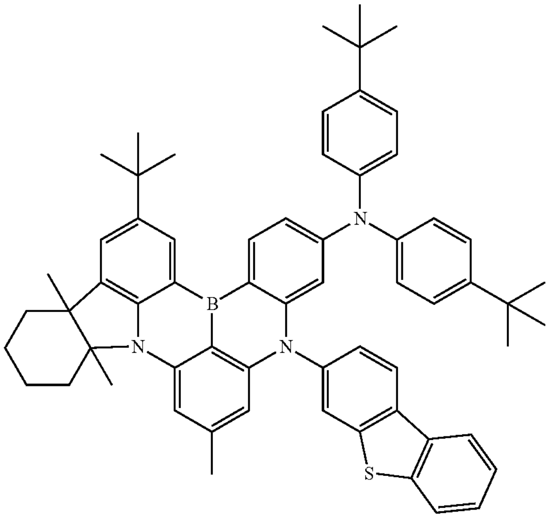
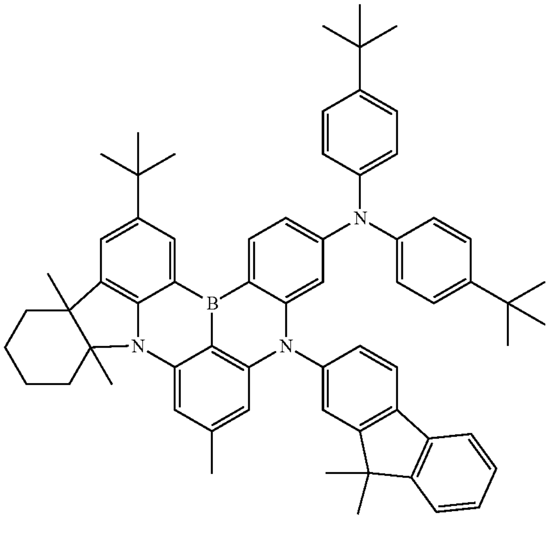
-continued
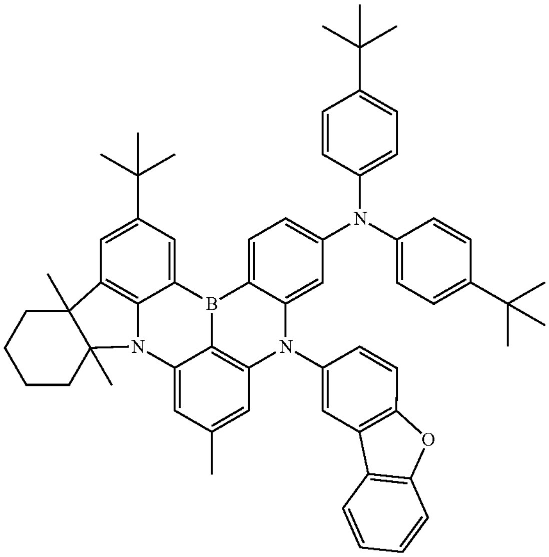
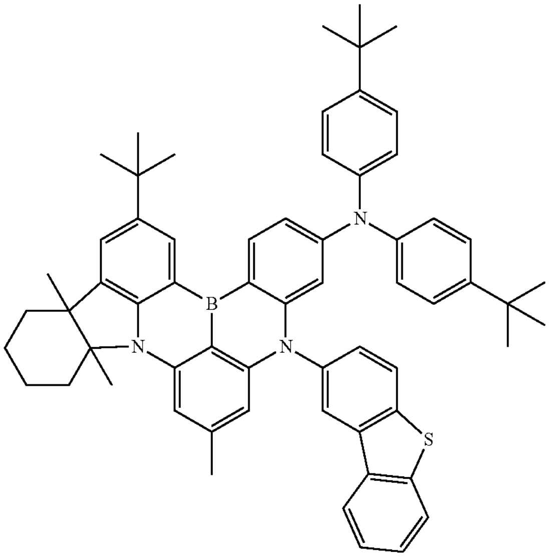
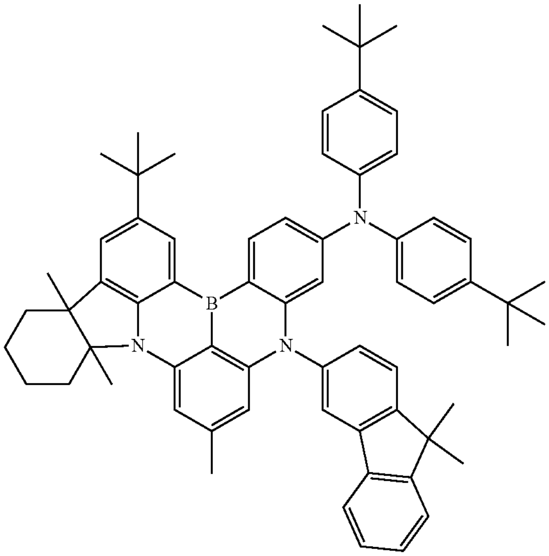

-continued
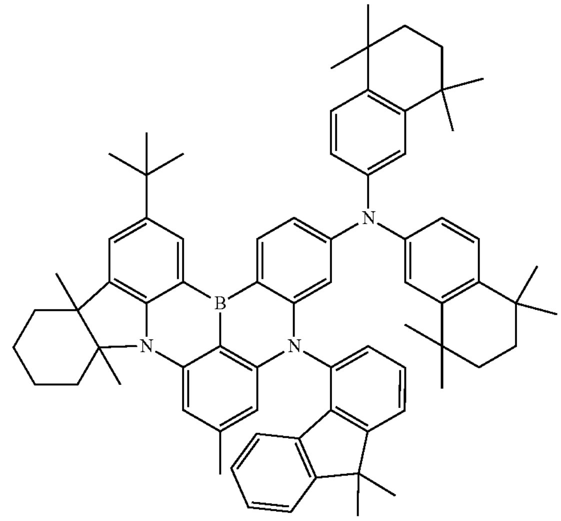
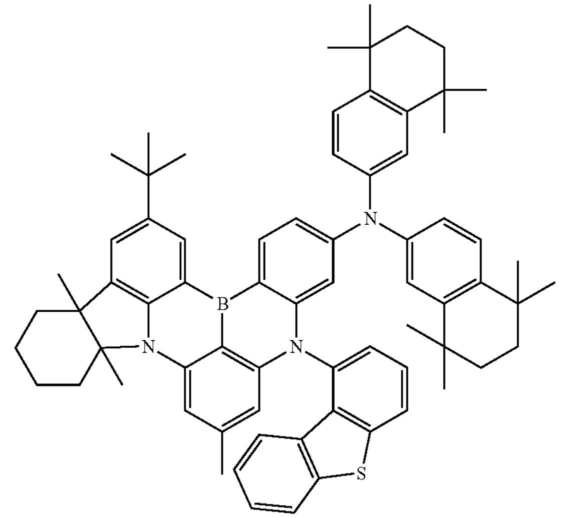
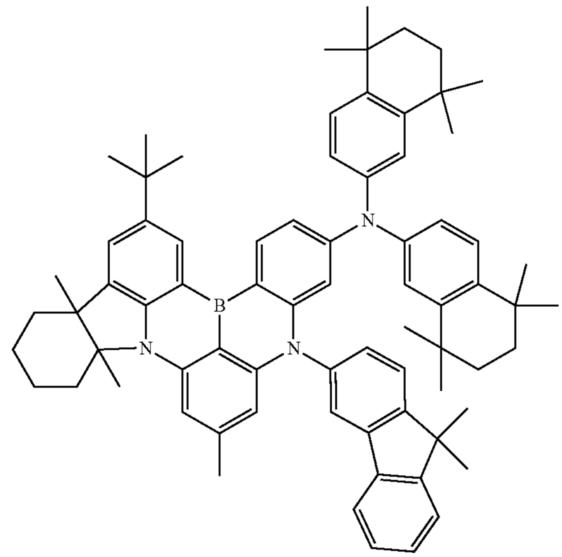
-continued
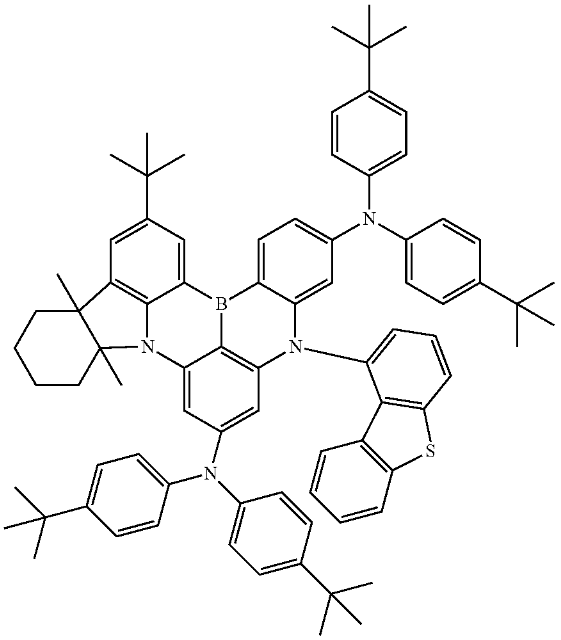
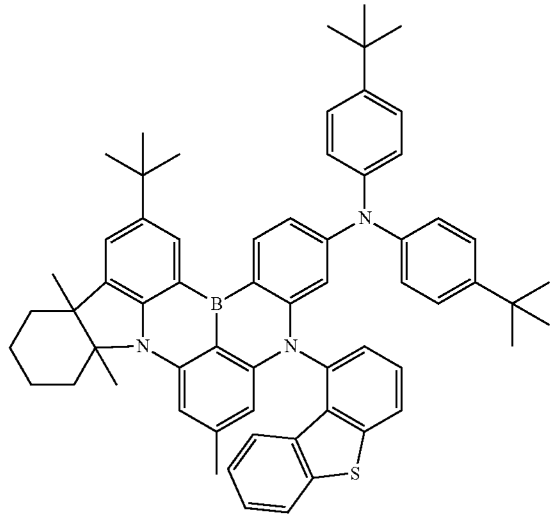
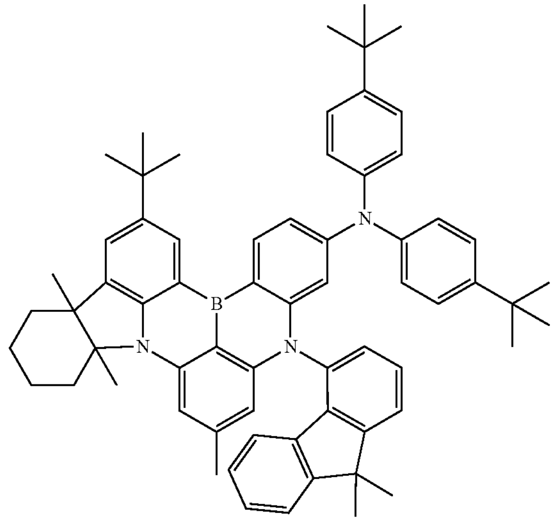

-continued
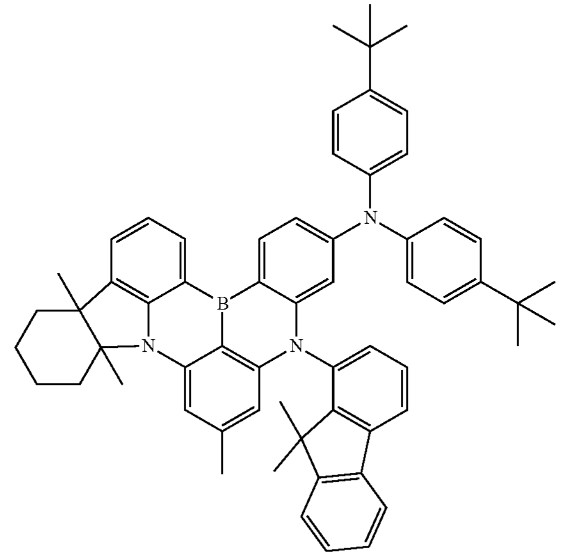
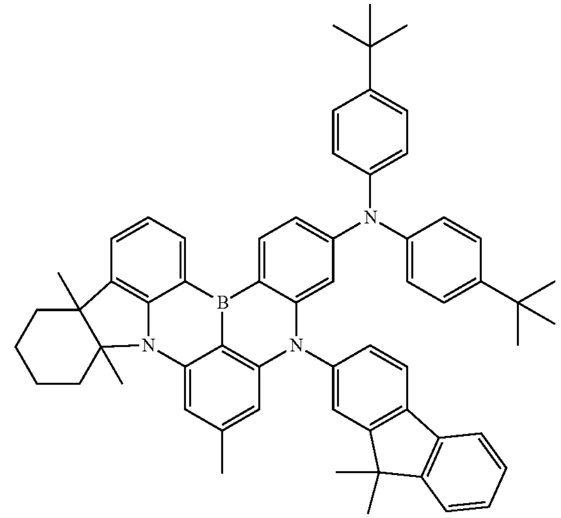
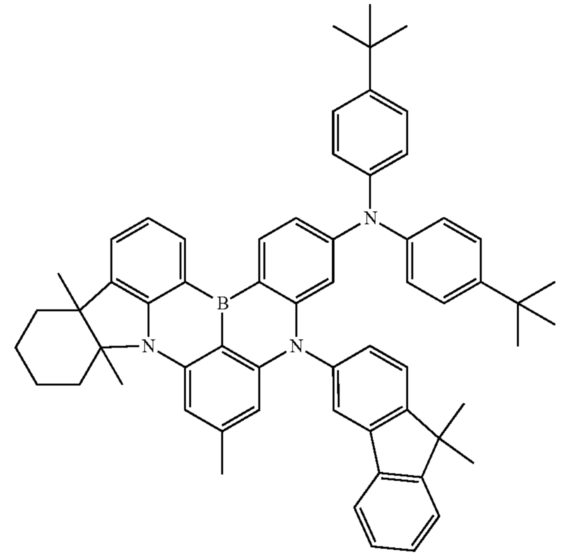
-continued
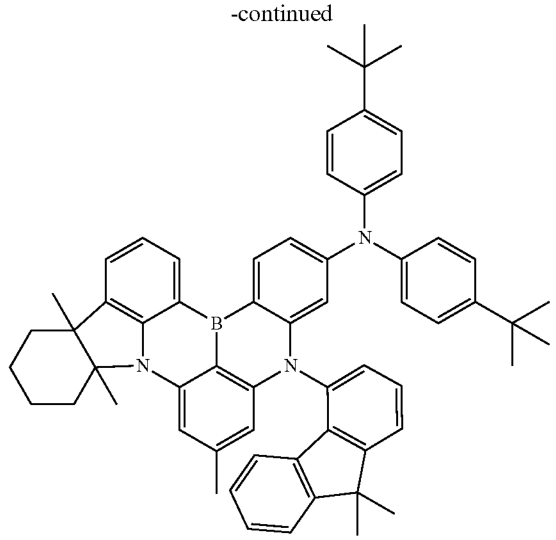
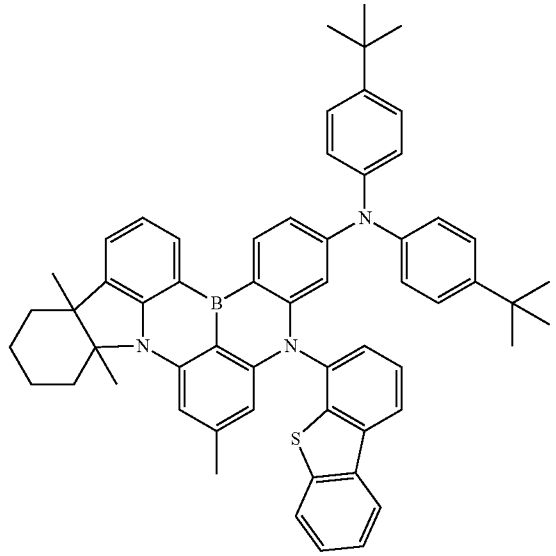
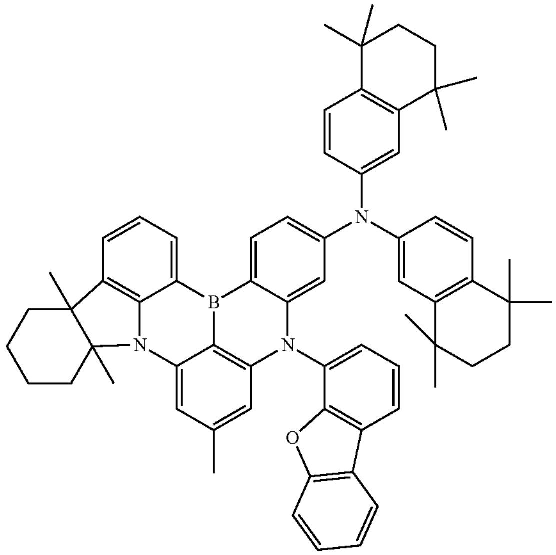

-continued
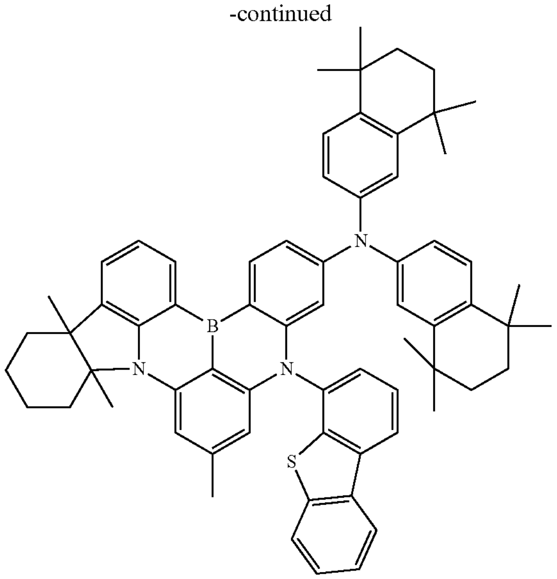
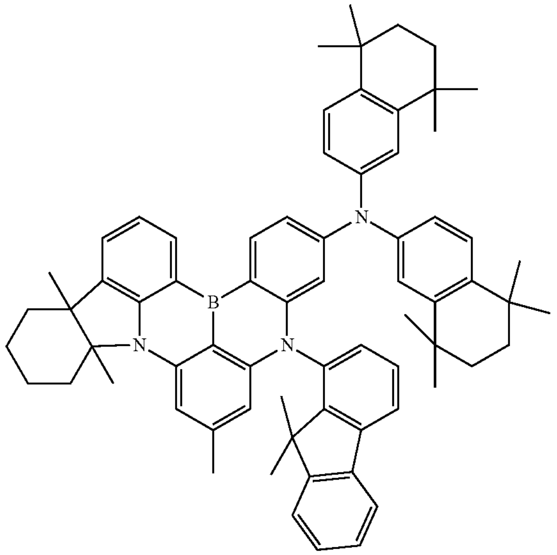
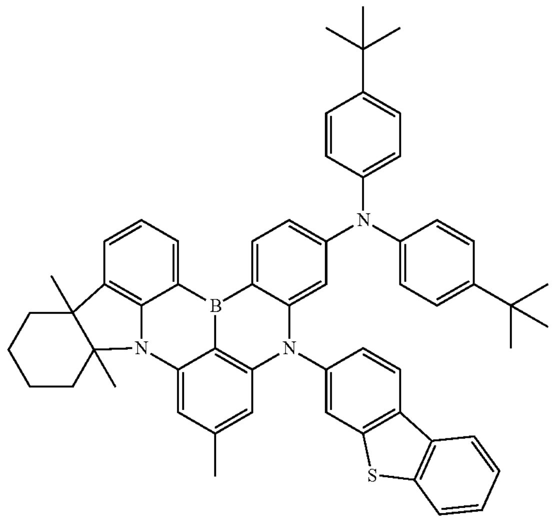
-continued
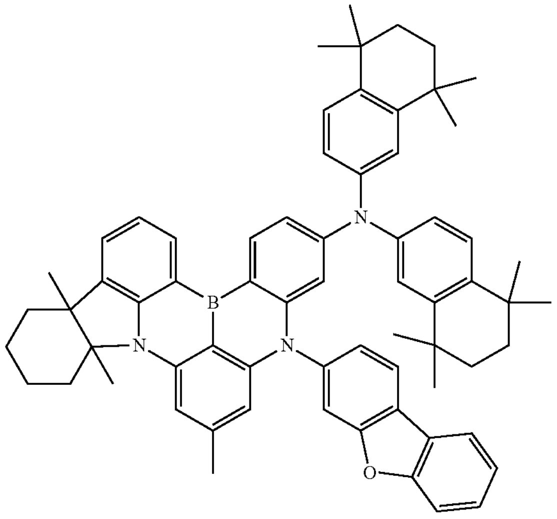
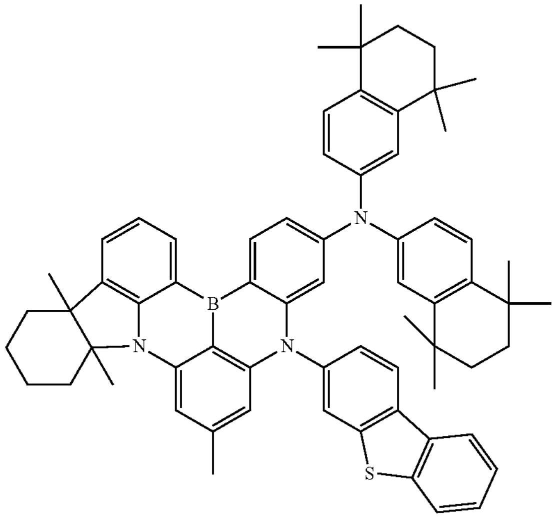
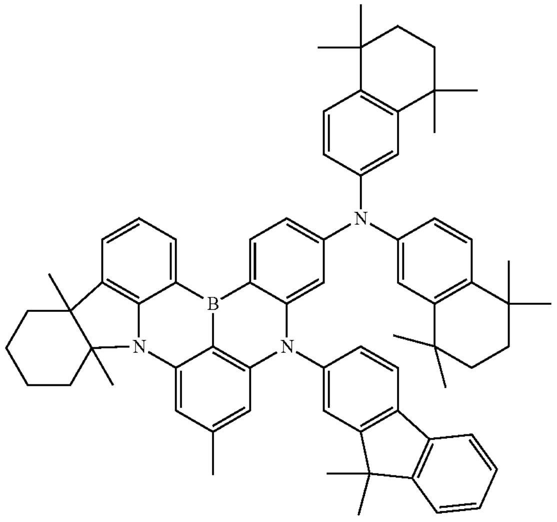

-continued
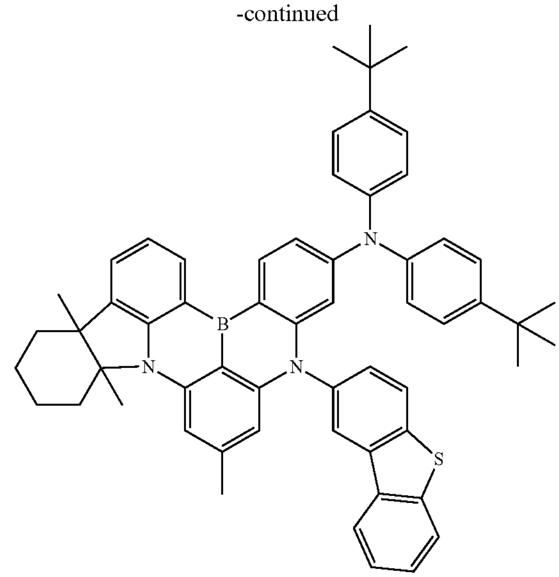
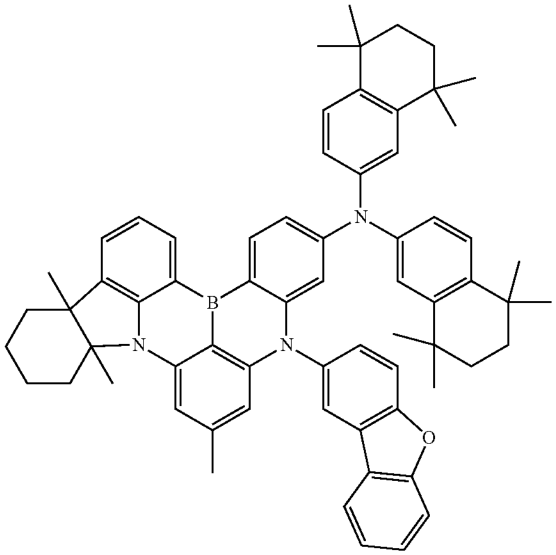
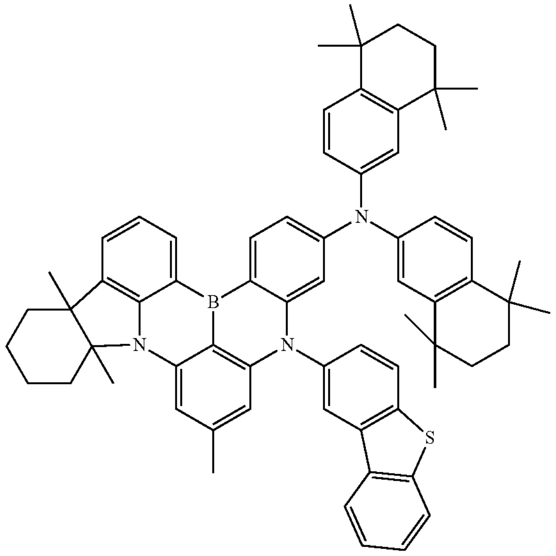
-continued
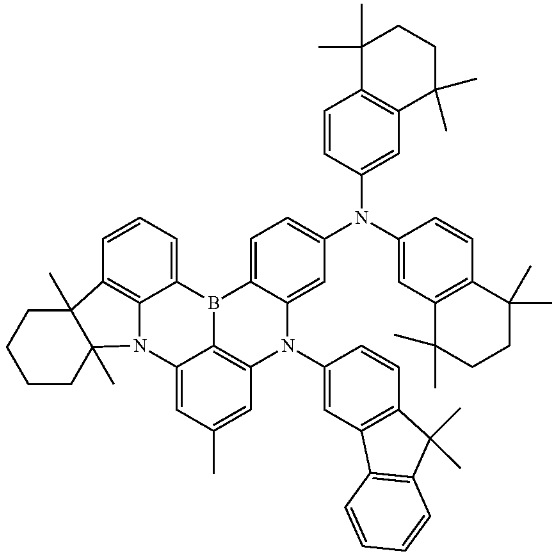
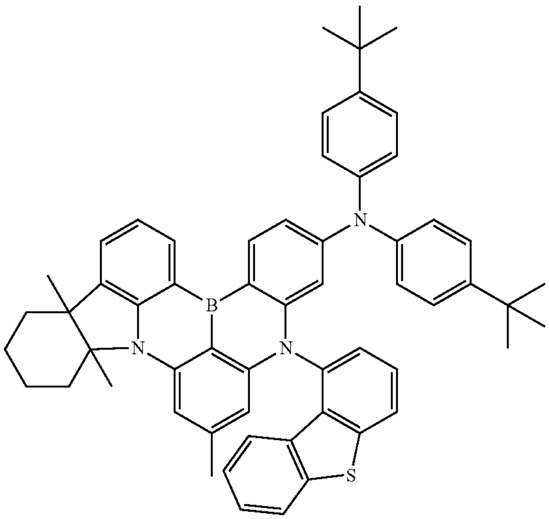
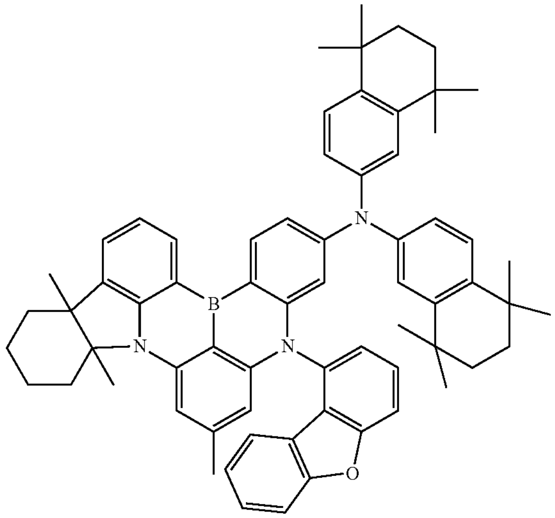

-continued
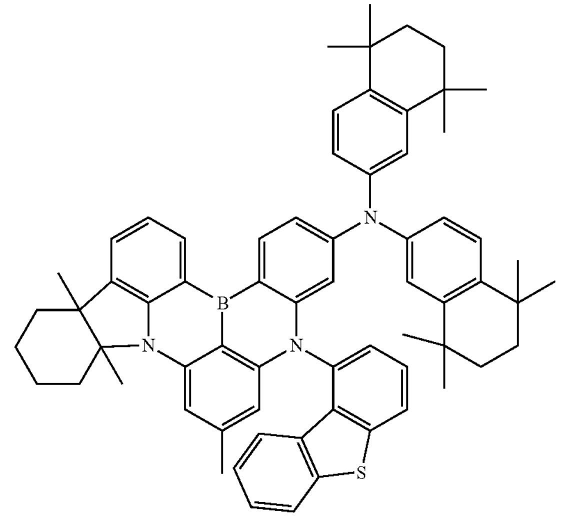
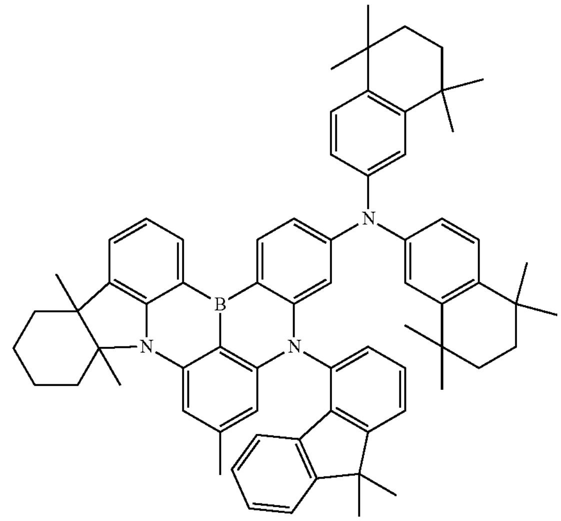
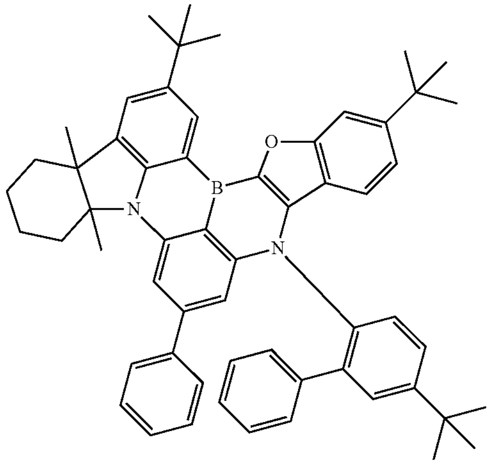
-continued
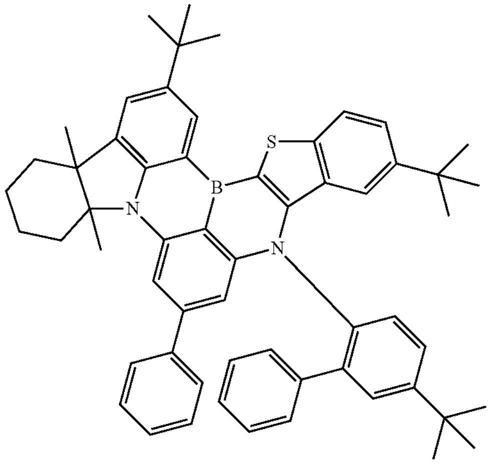
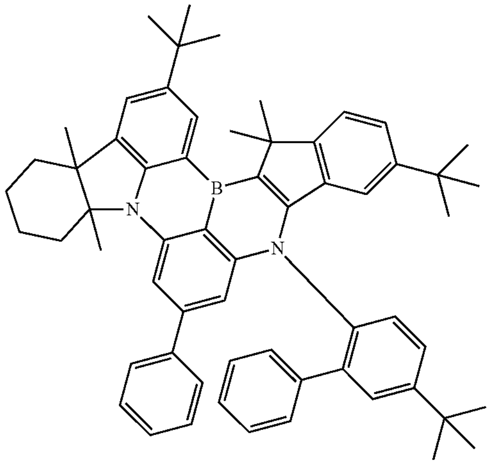
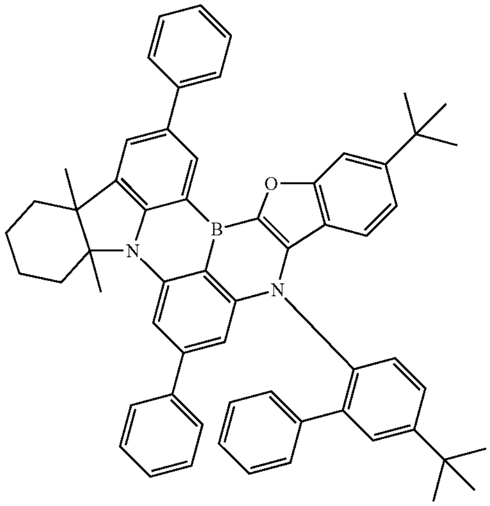

-continued
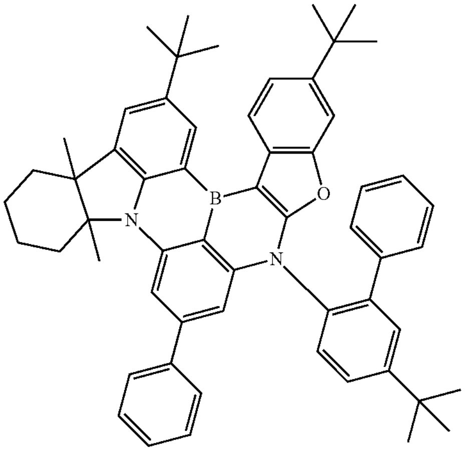
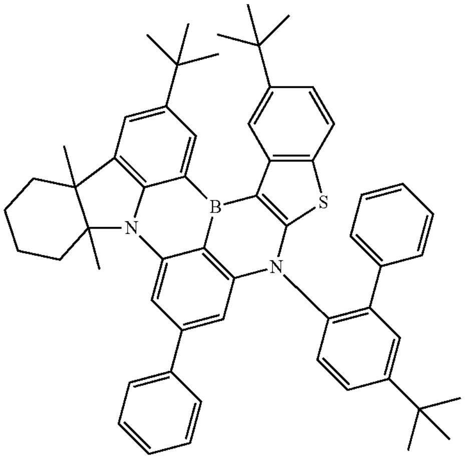
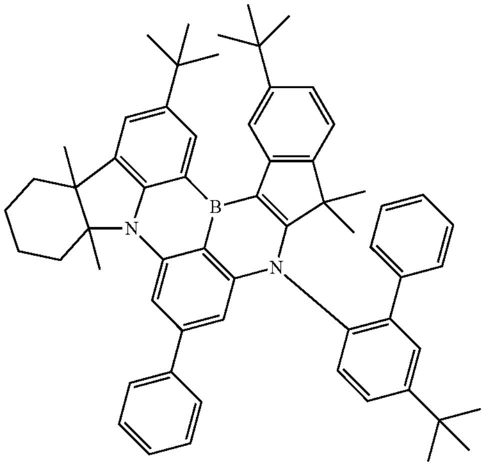
-continued
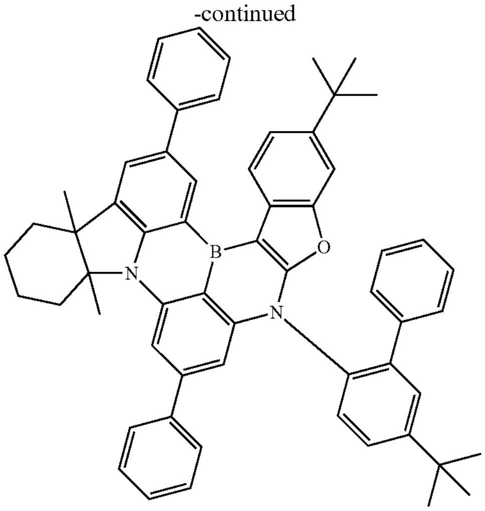
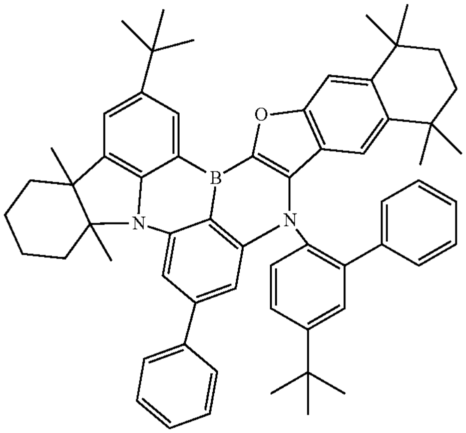
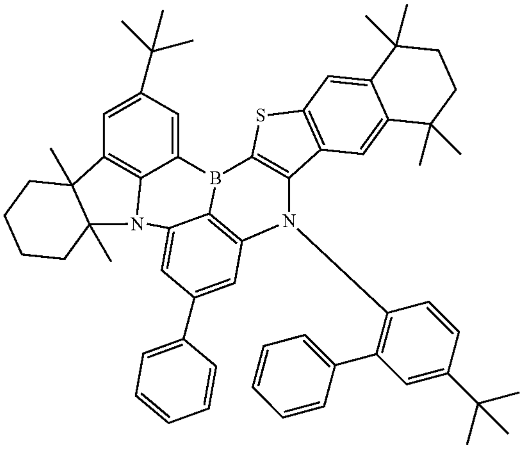

-continued
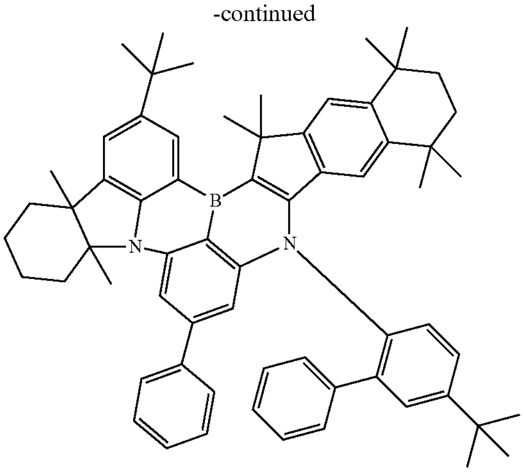
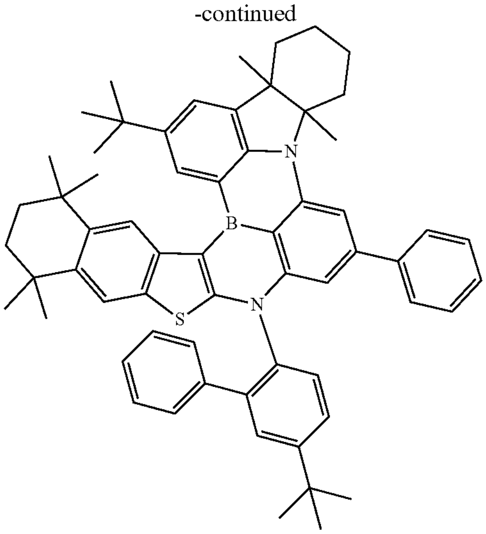
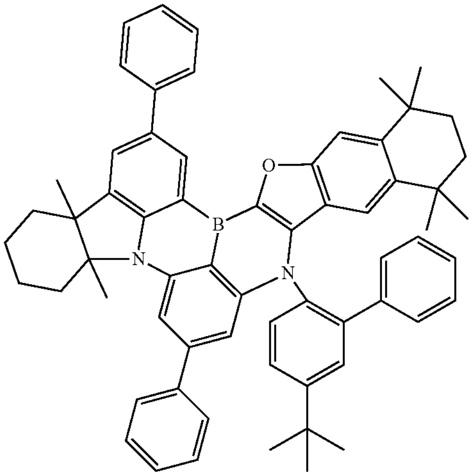
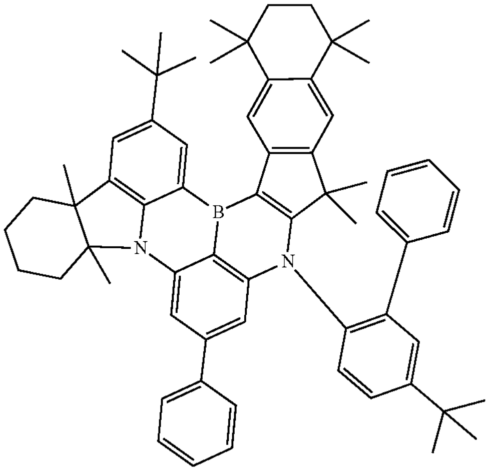
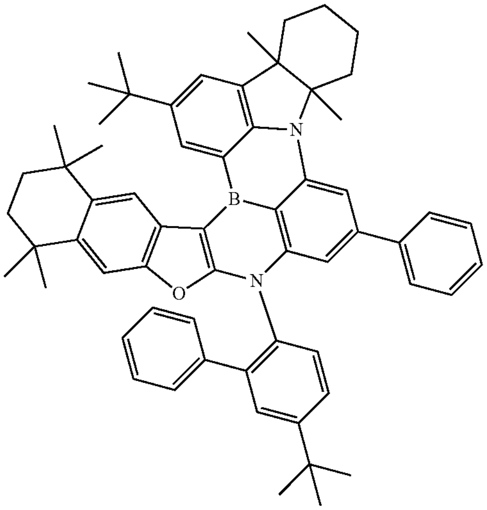
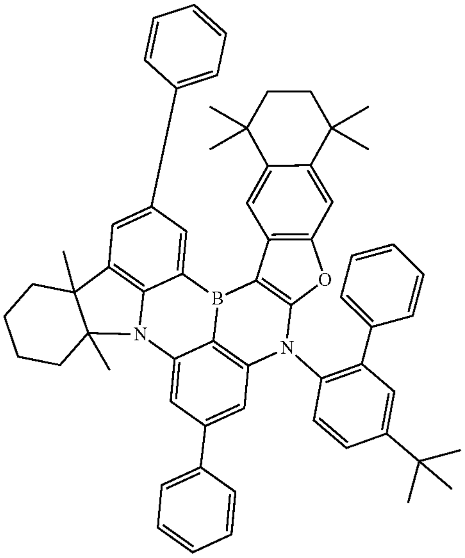

-continued
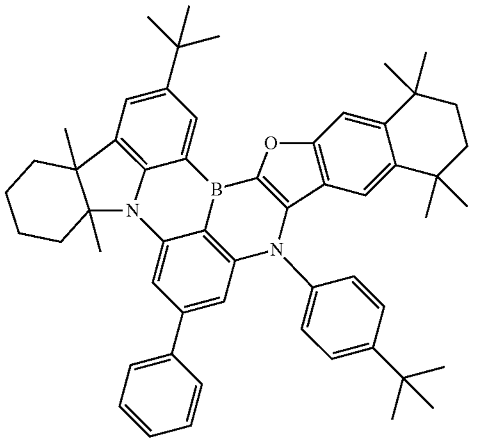
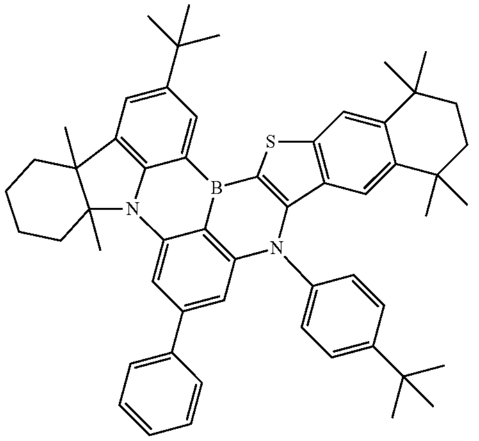
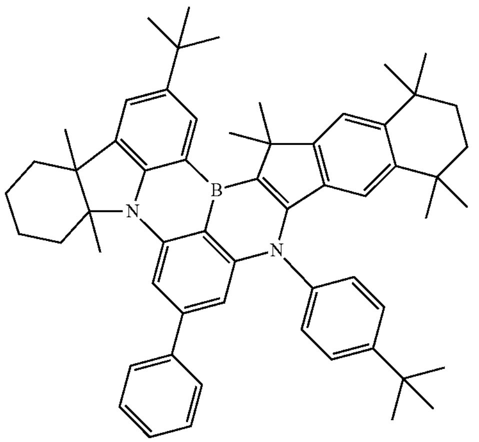
-continued
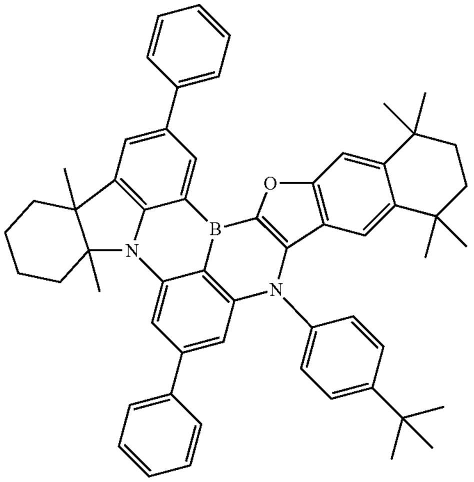
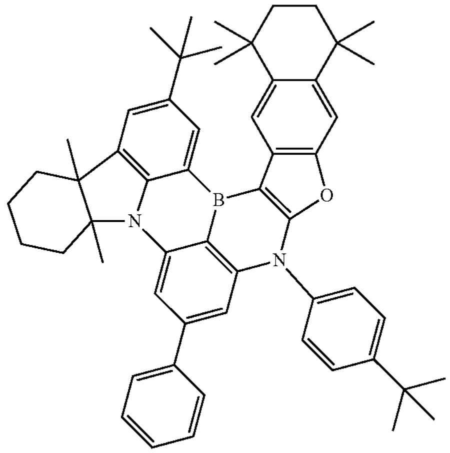
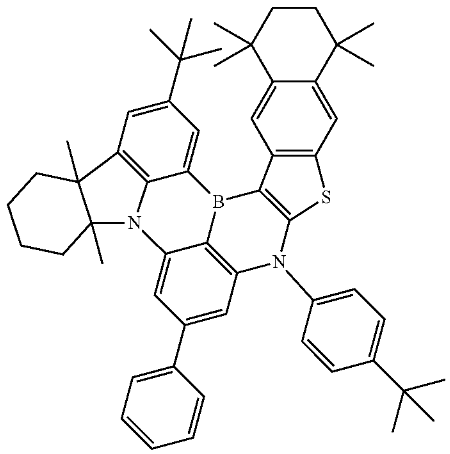

-continued
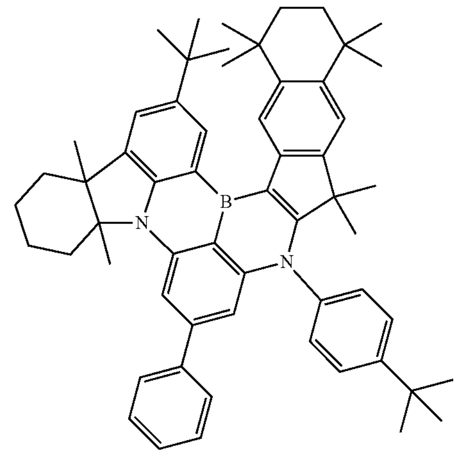
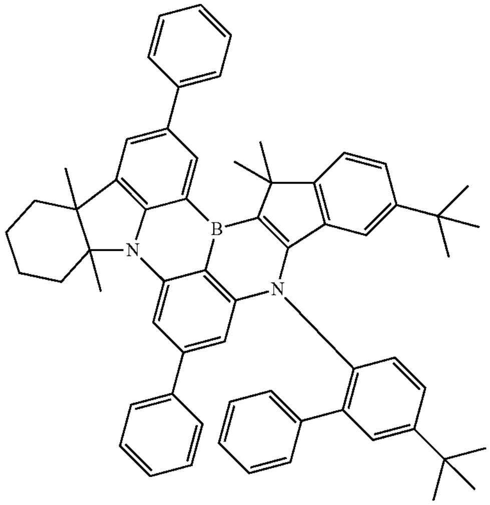
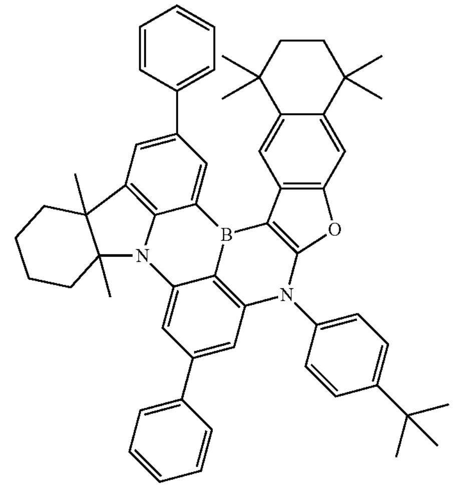
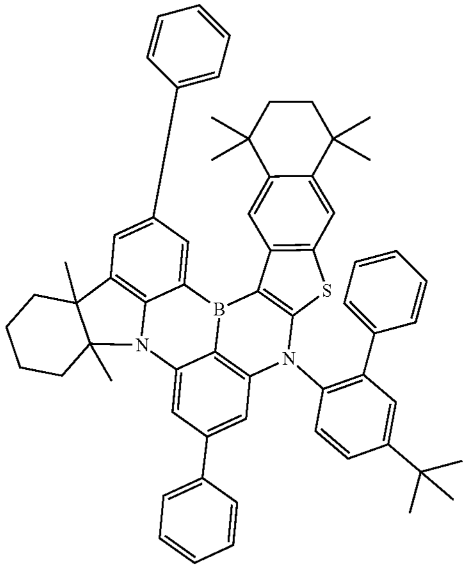
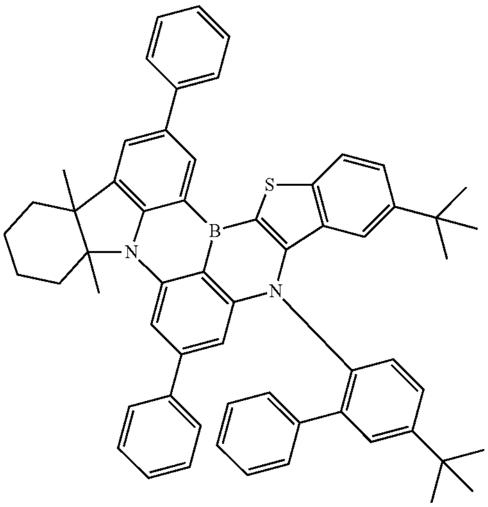
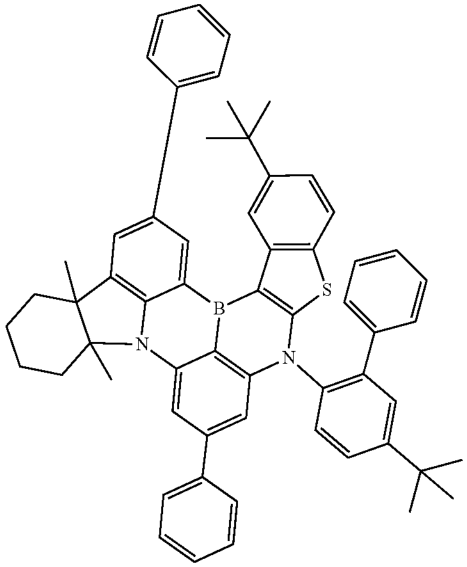

-continued
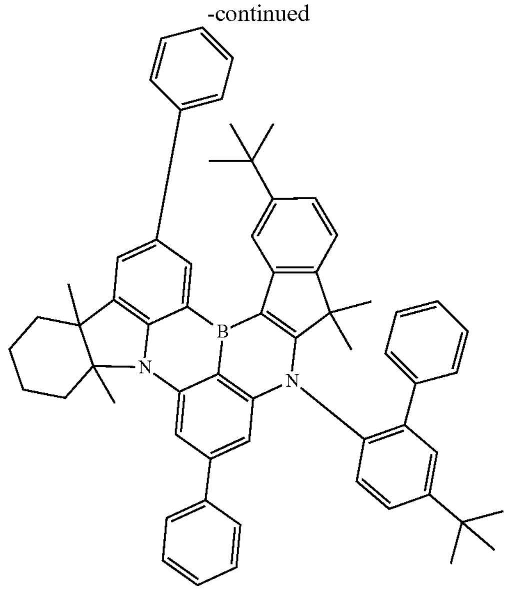
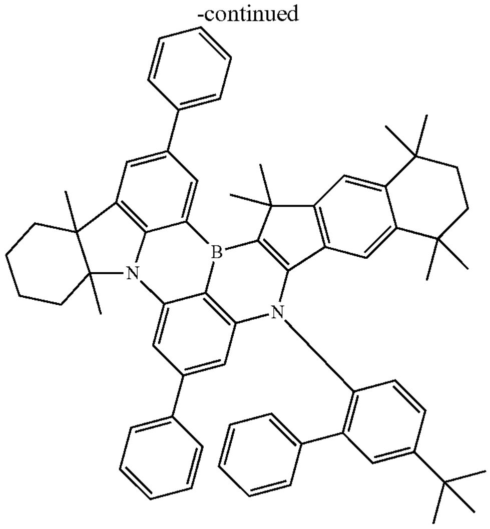
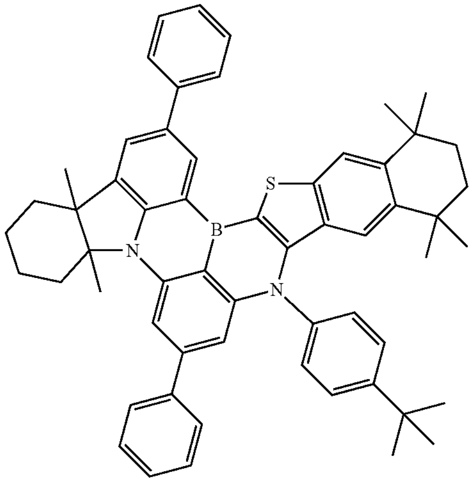
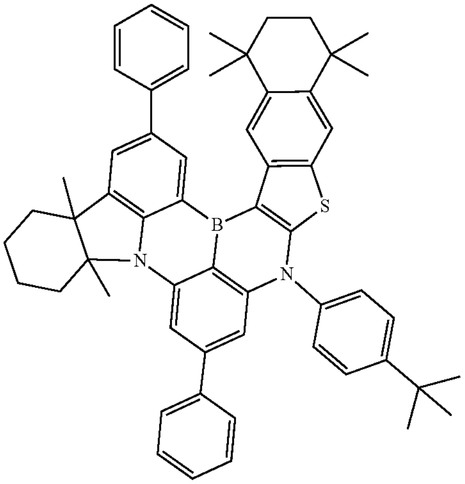
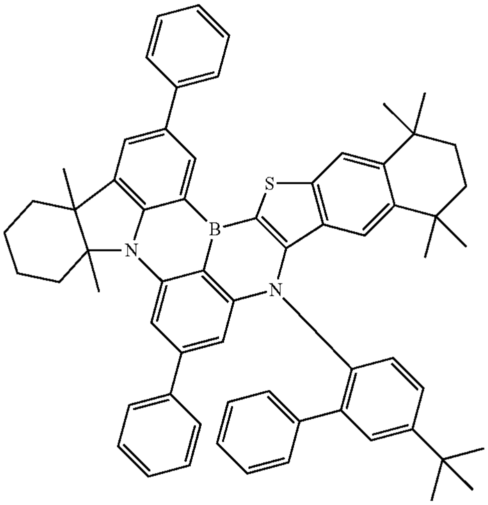
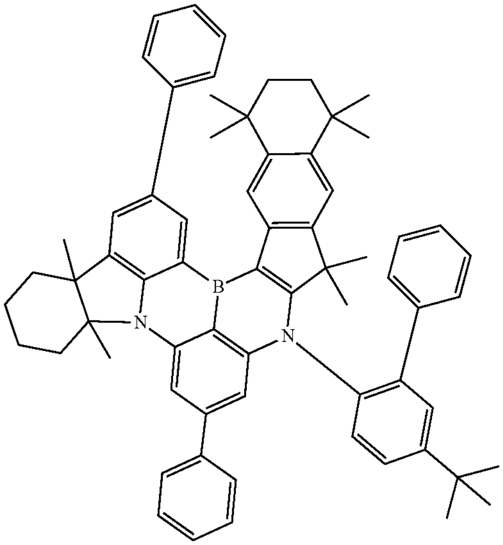
-continued -continued
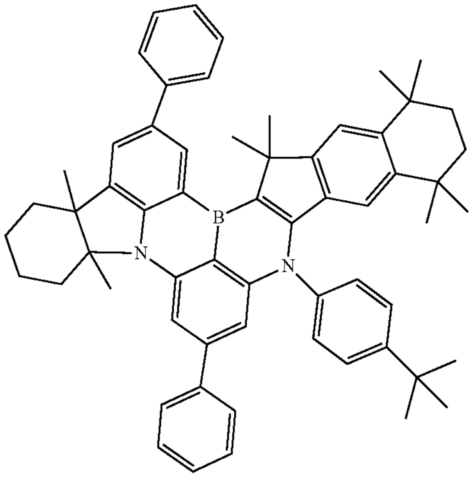
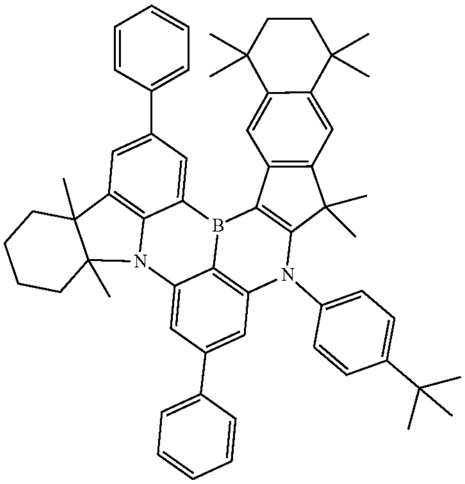
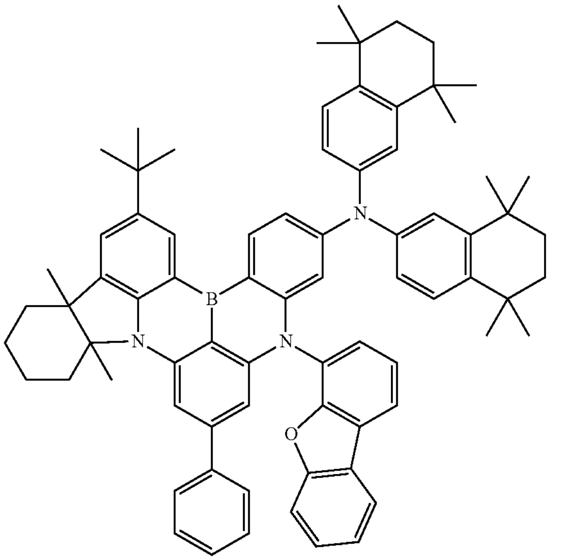
-continued
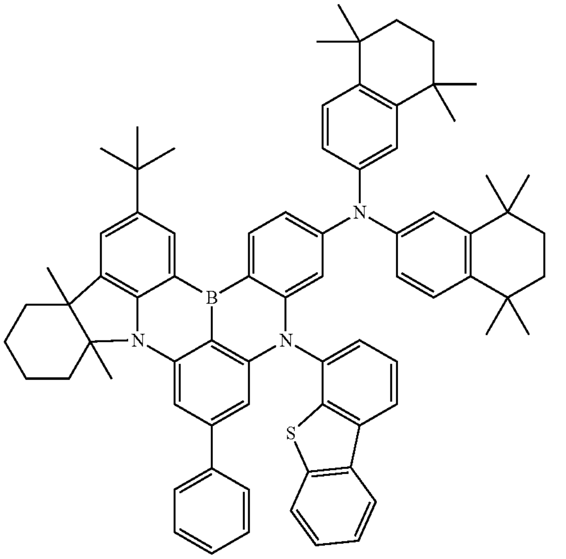
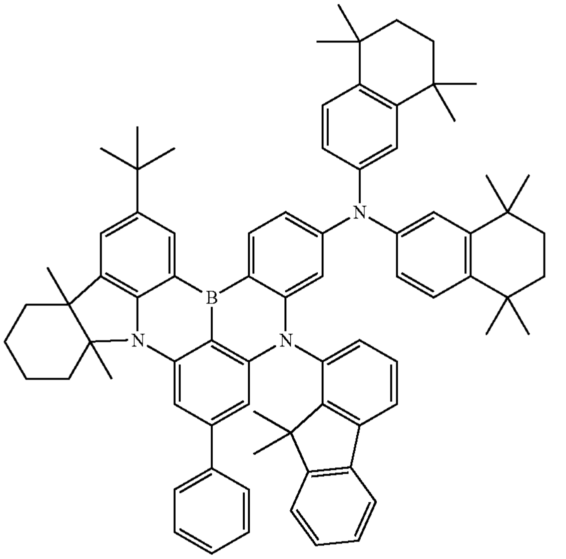
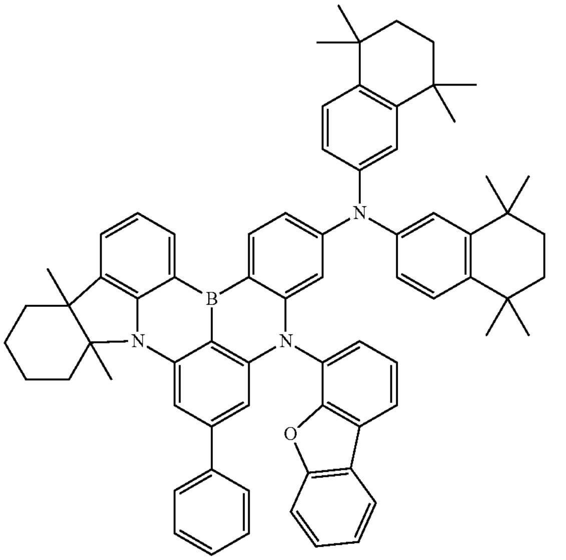

-continued
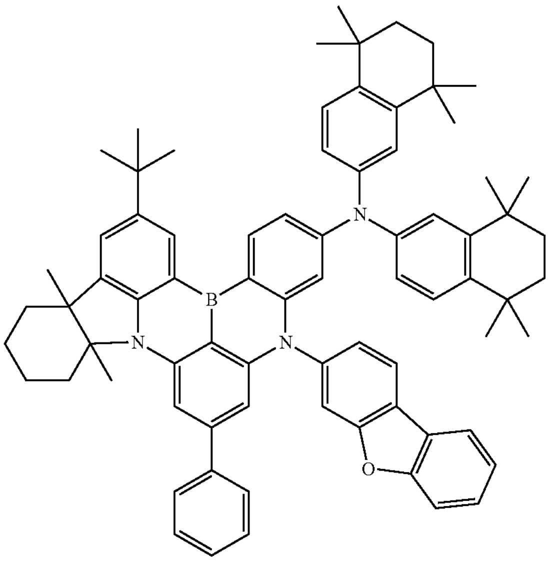
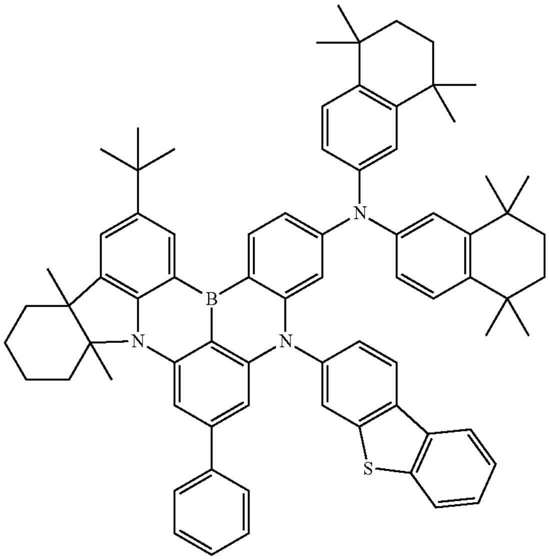
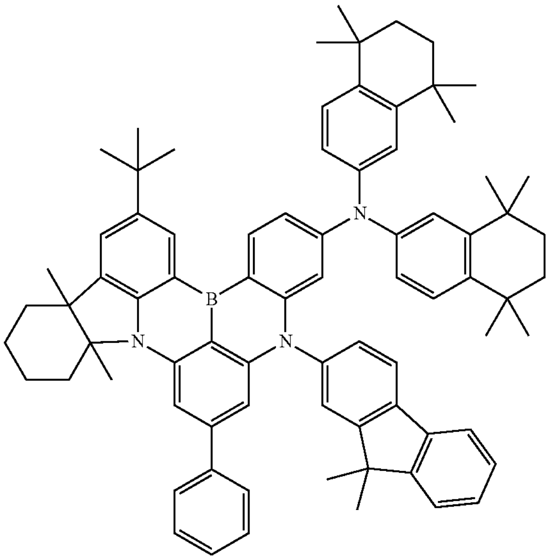
-continued
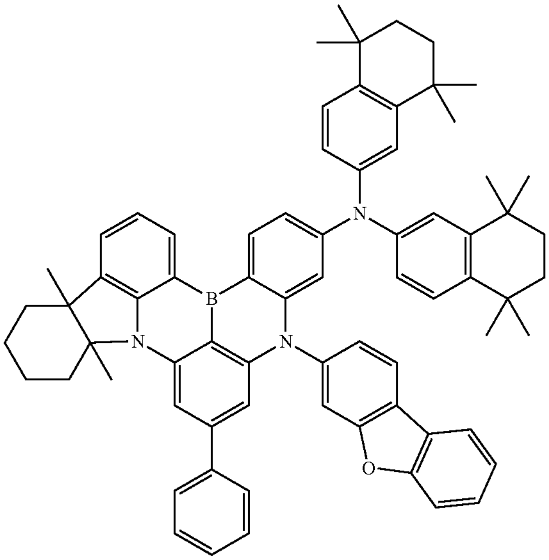
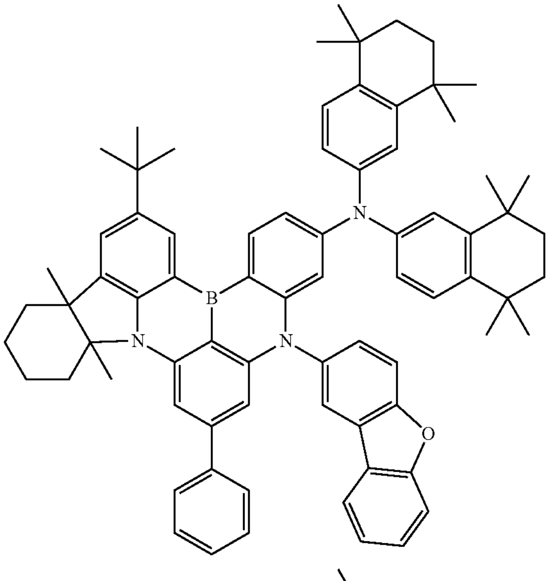
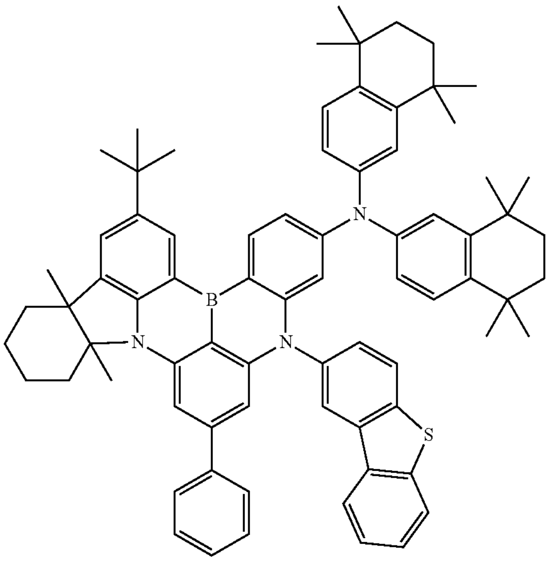

-continued
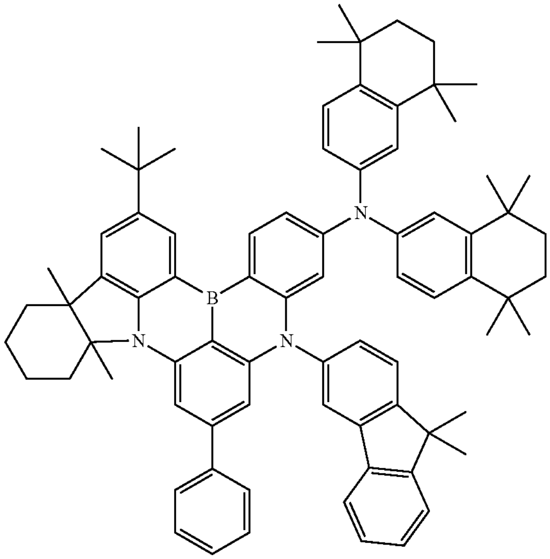
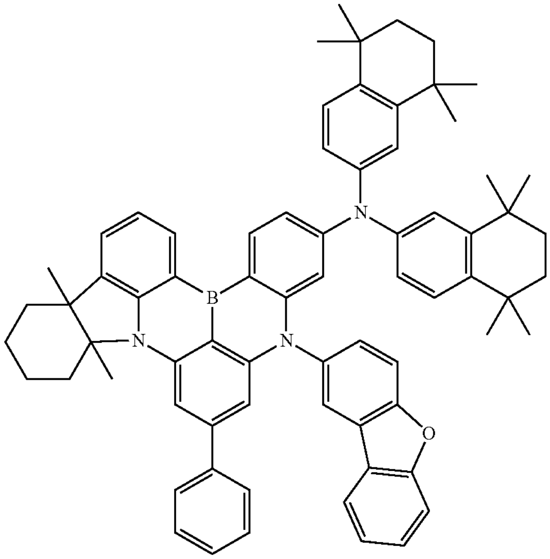
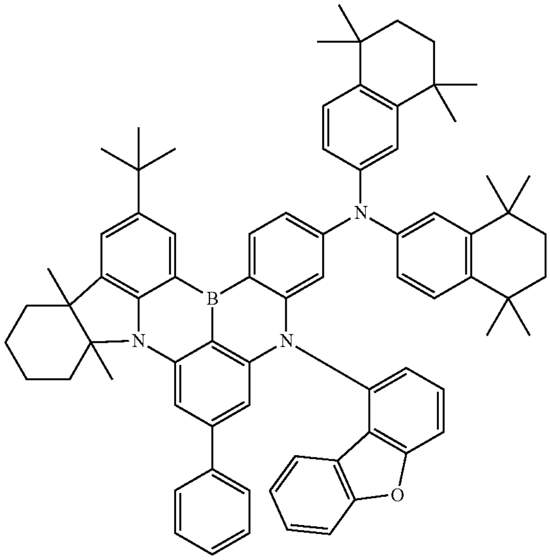
-continued
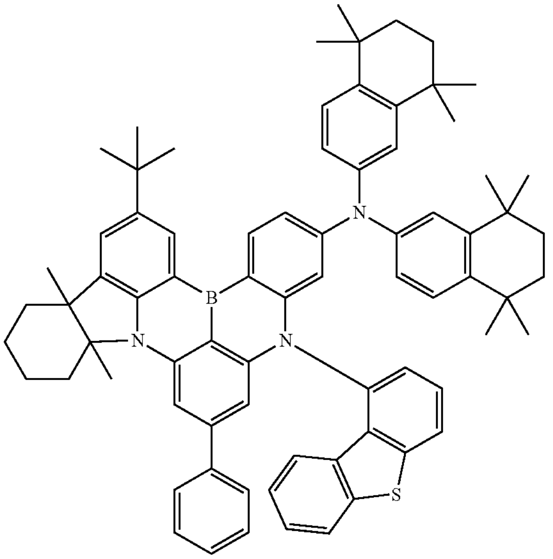
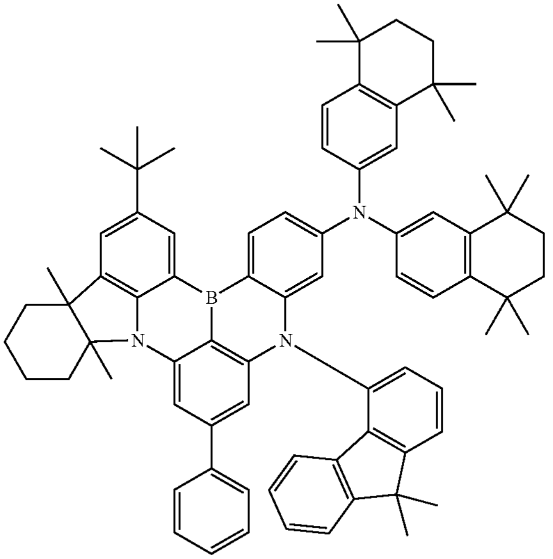
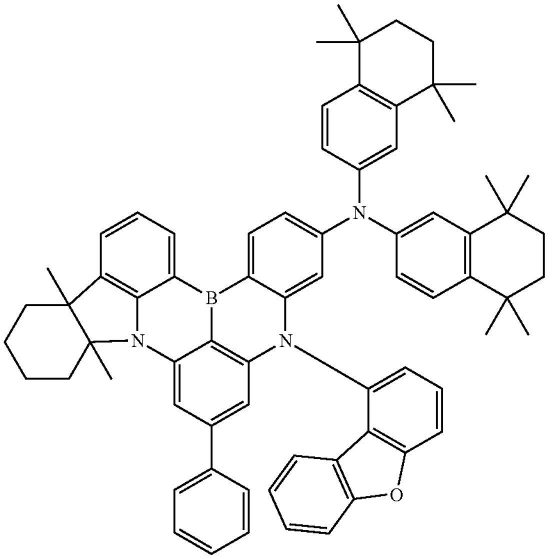

-continued
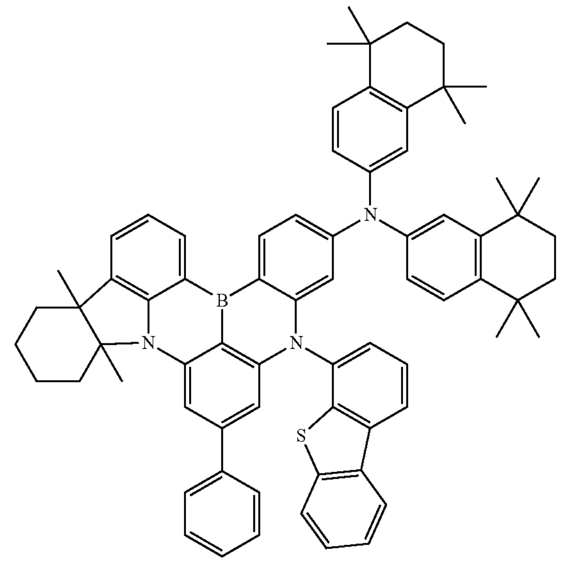
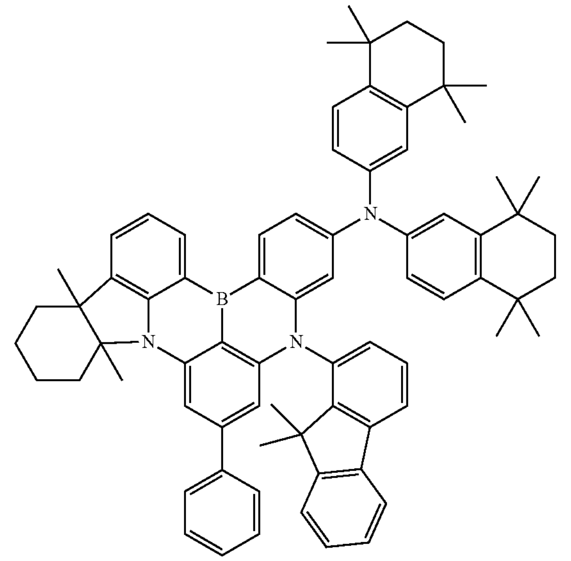
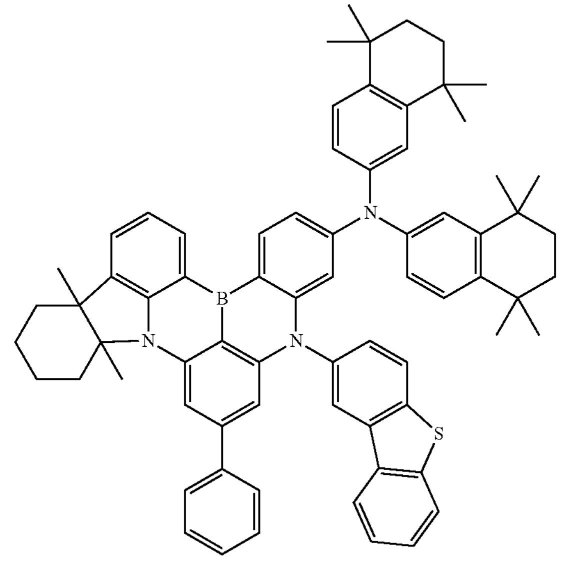
-continued
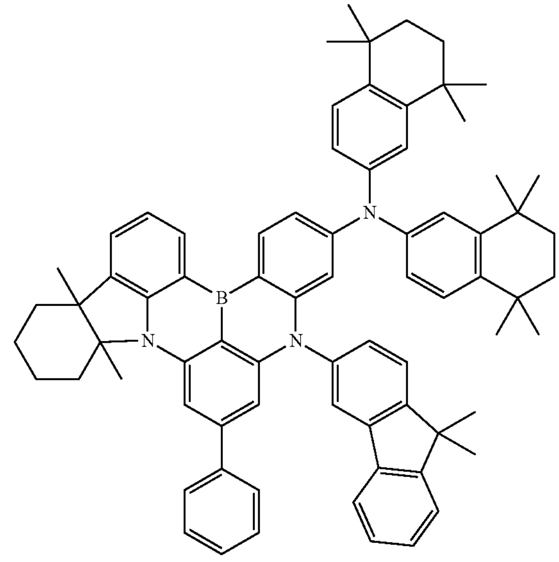
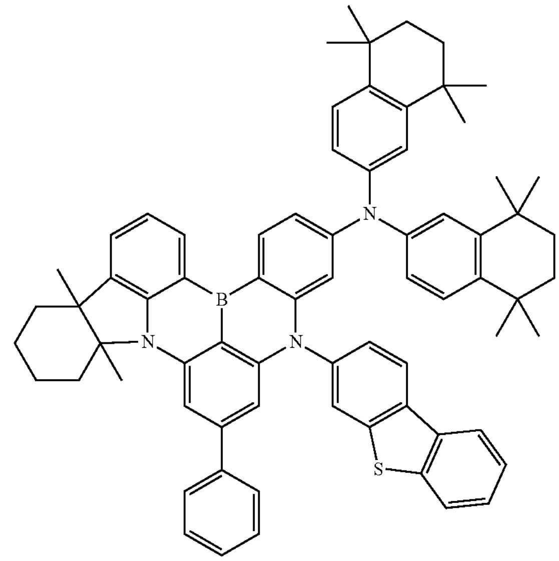
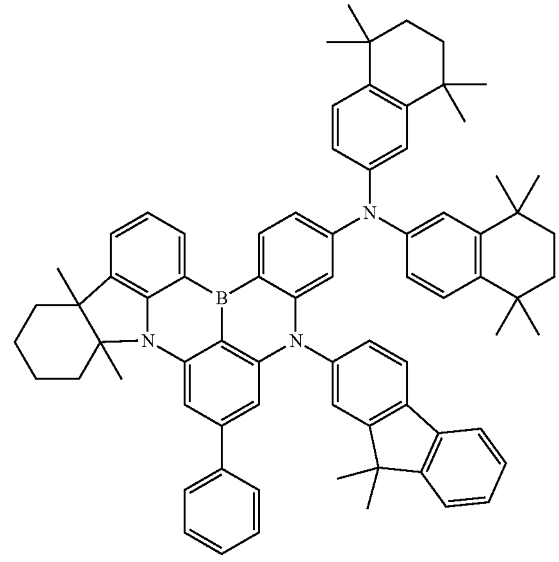

-continued
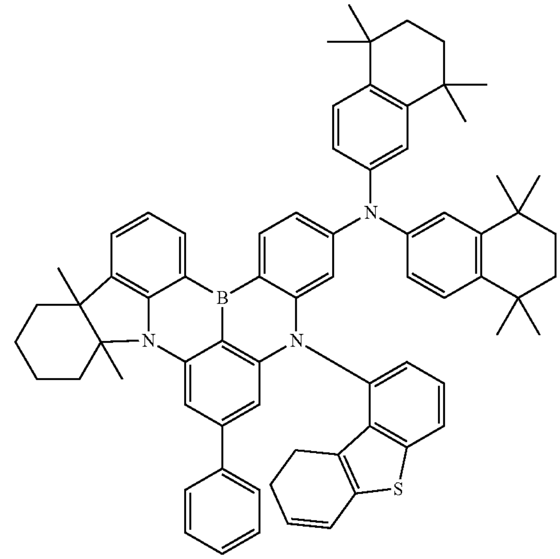
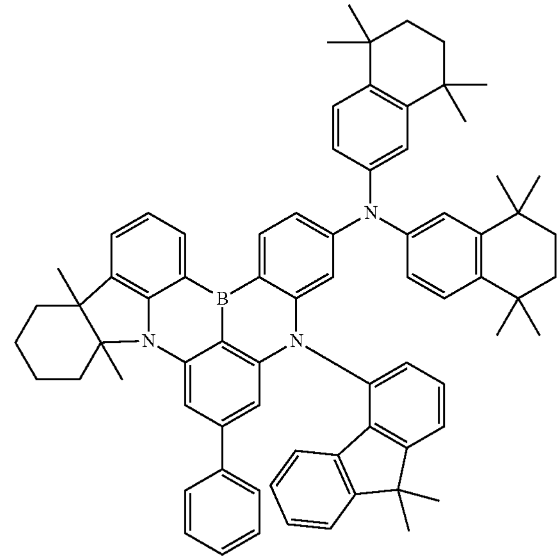
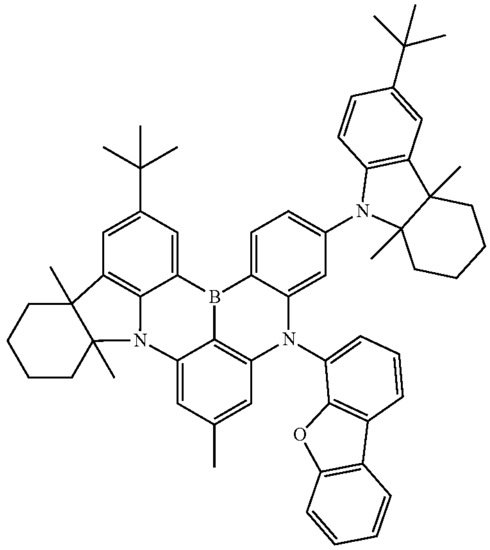
-continued
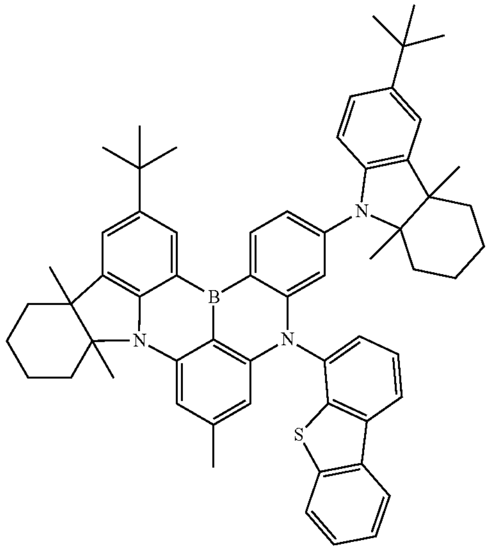
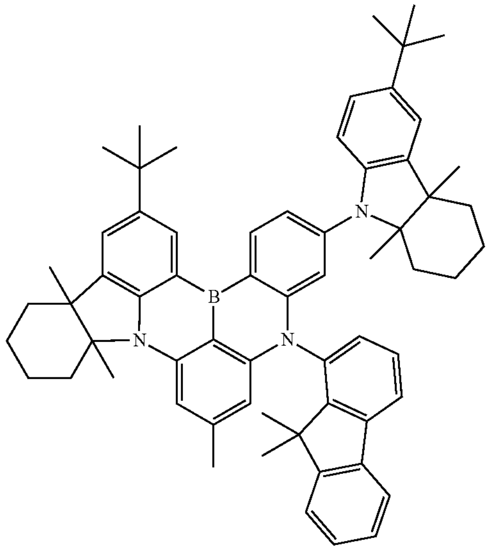
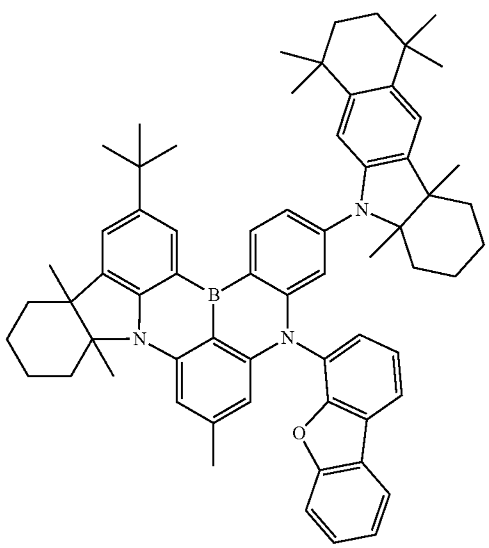

-continued
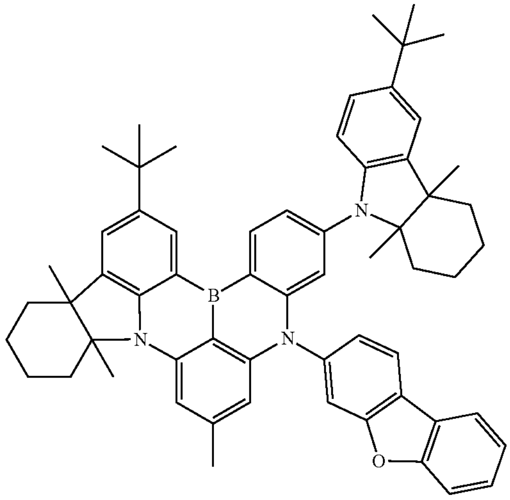
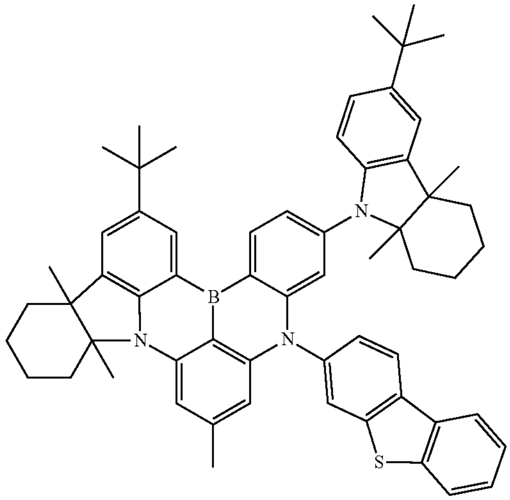
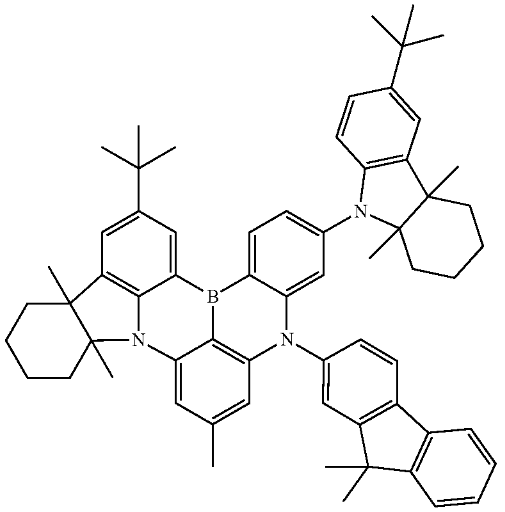
-continued
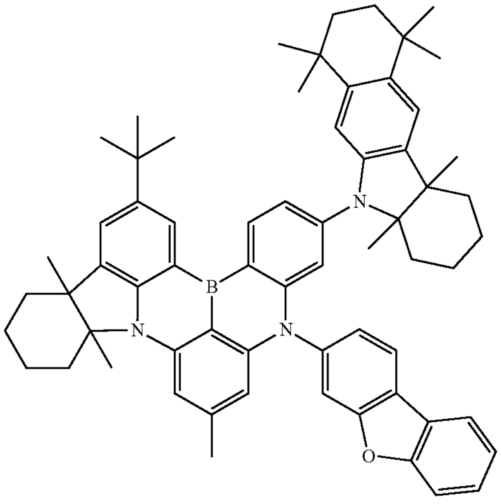
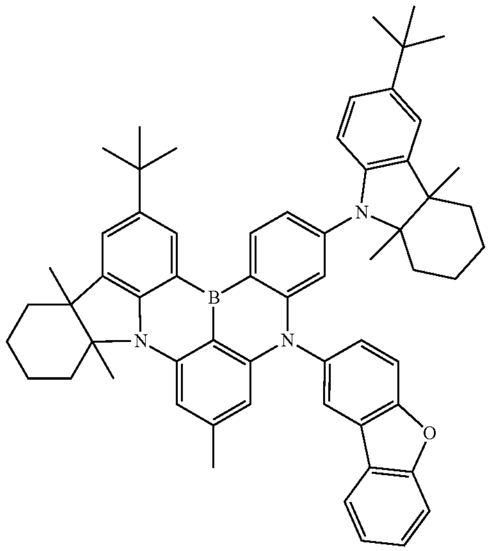
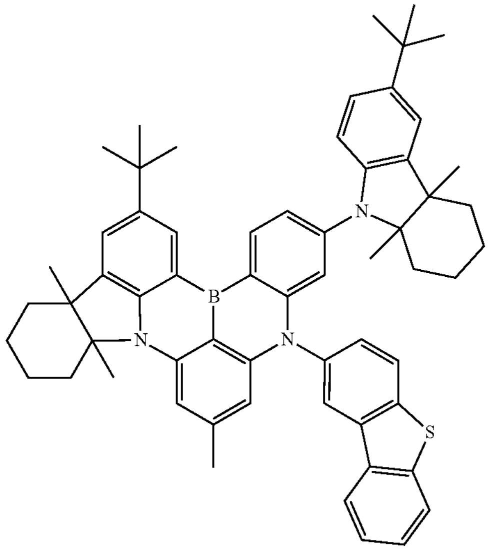

-continued
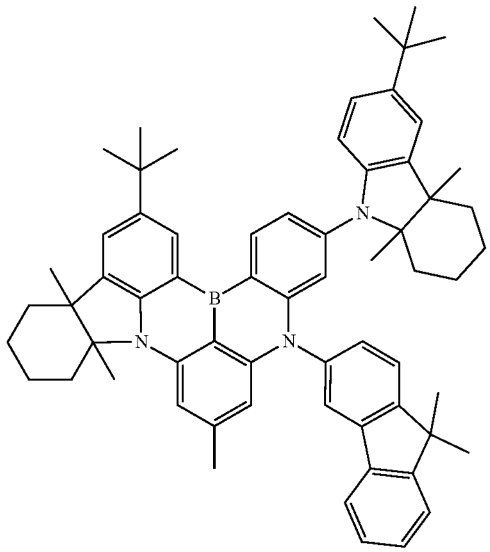
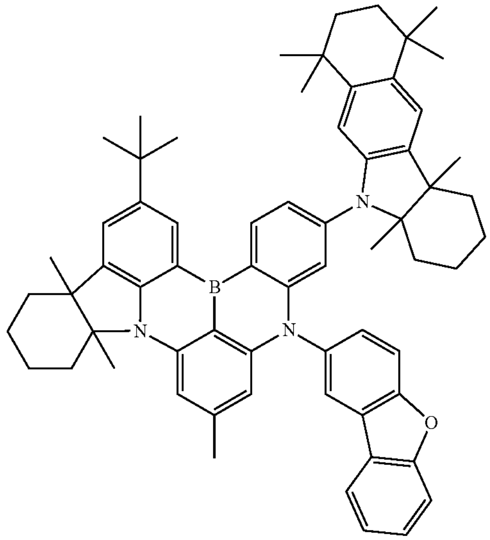
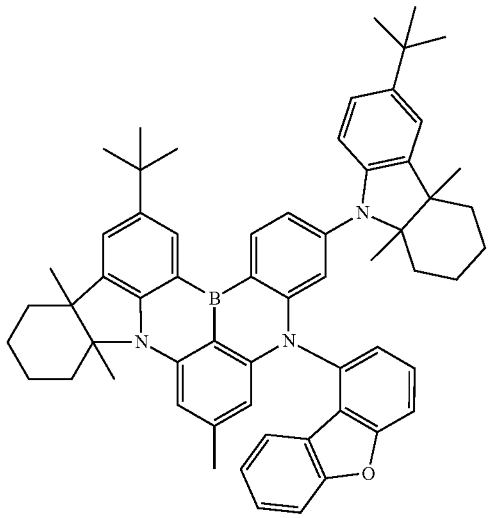
-continued
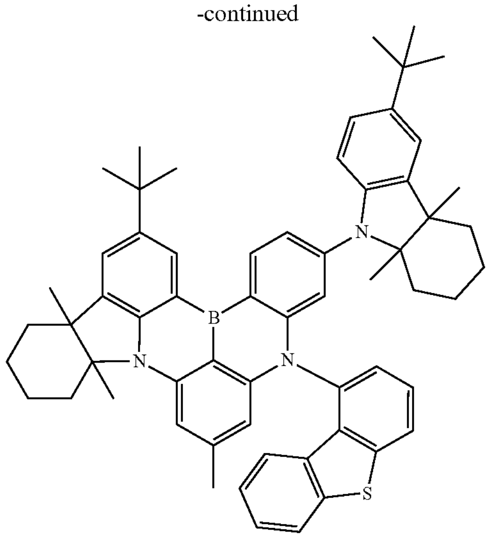
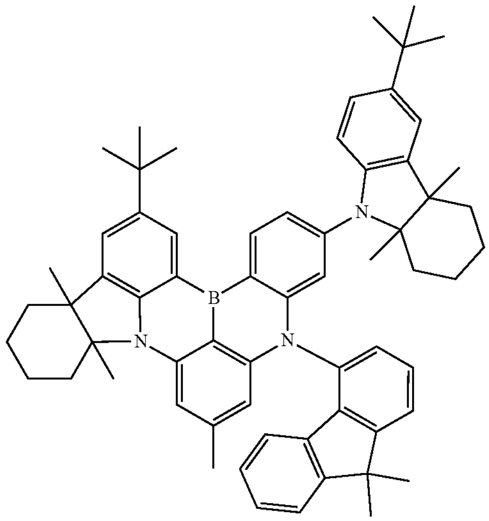
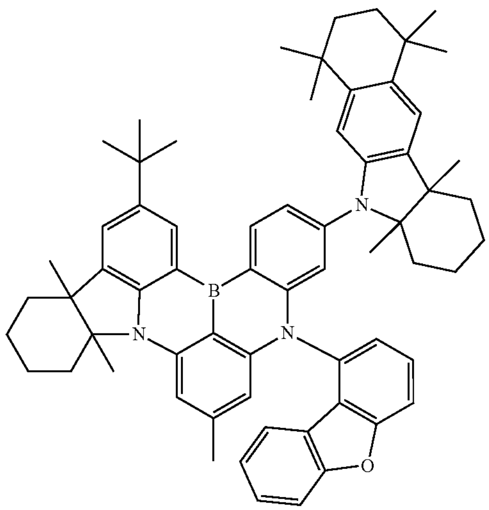

-continued
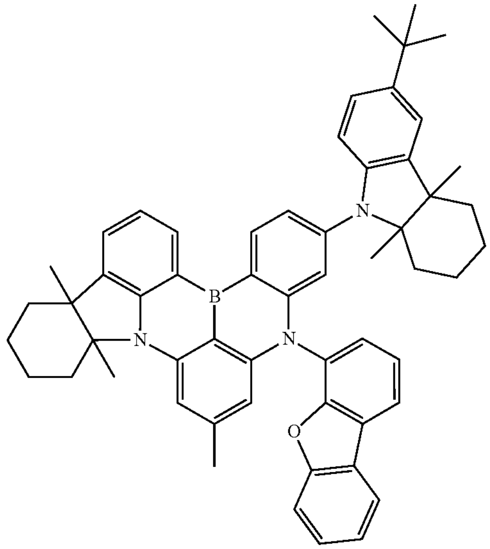
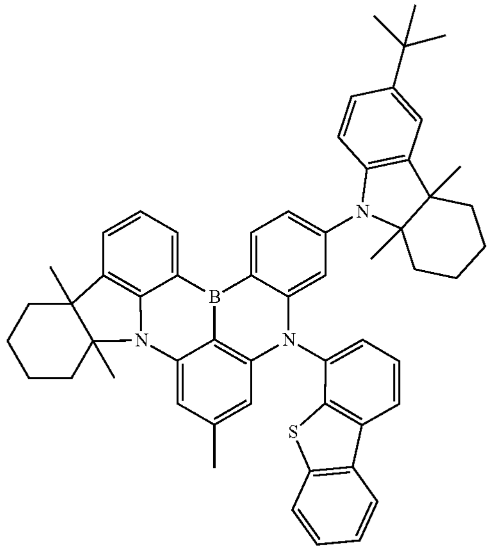
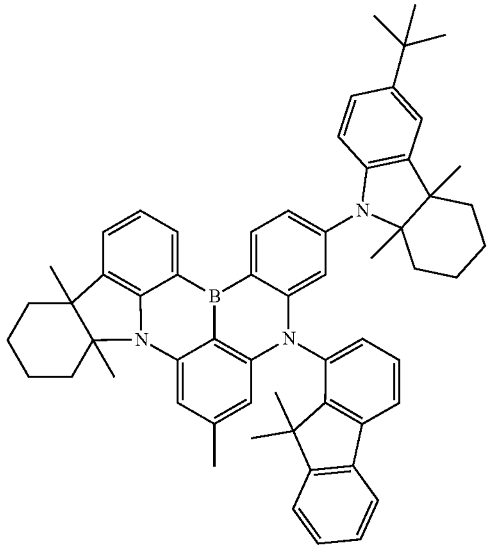
-continued
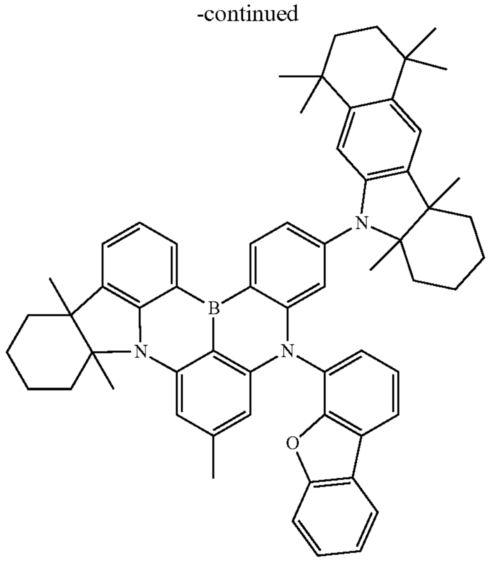
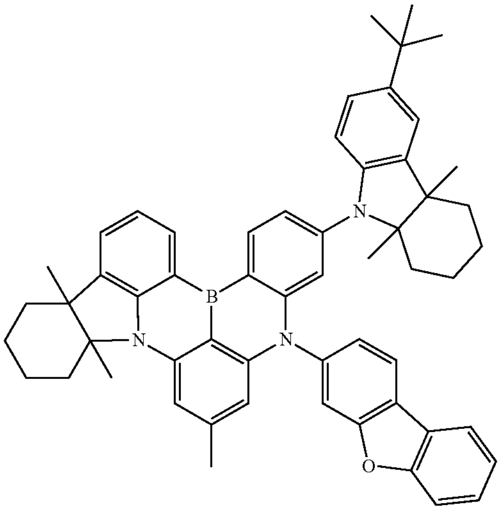
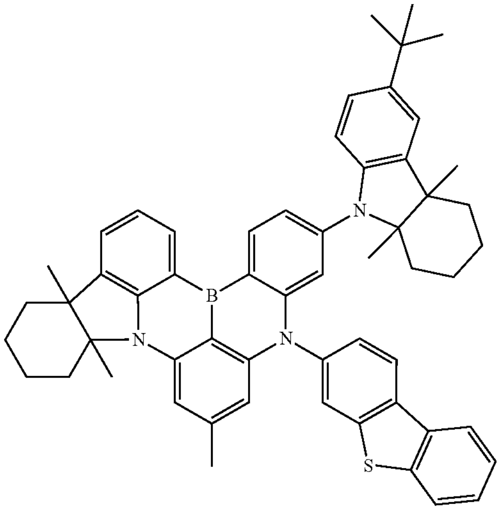

-continued
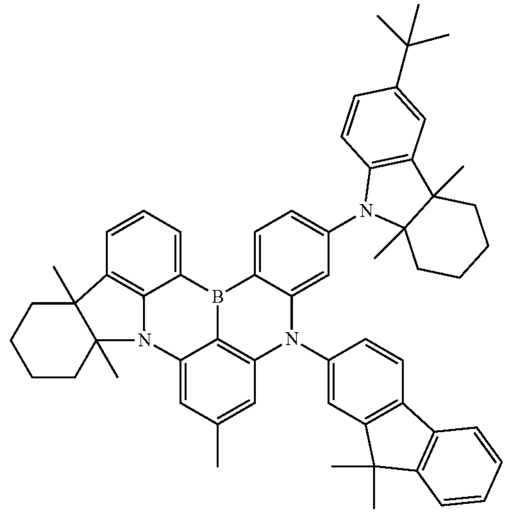
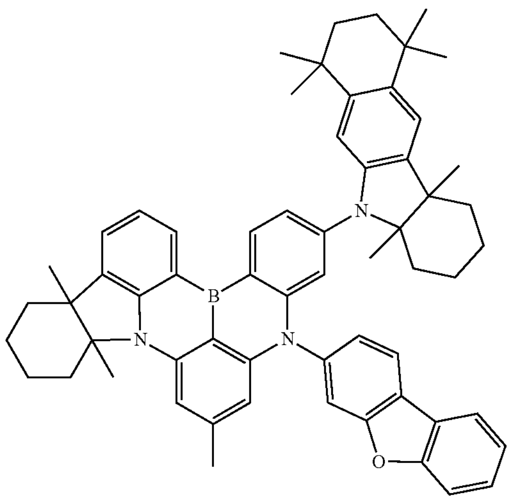
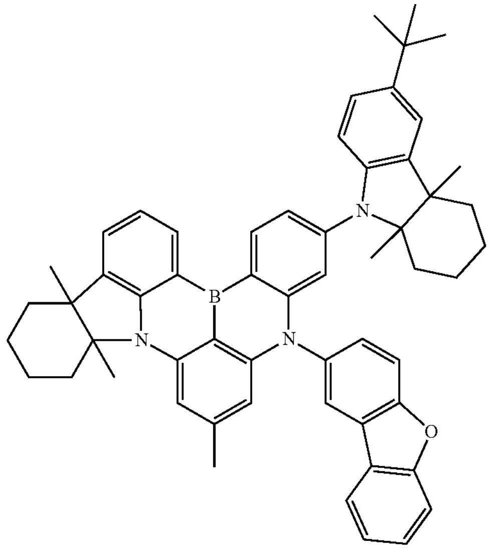
-continued
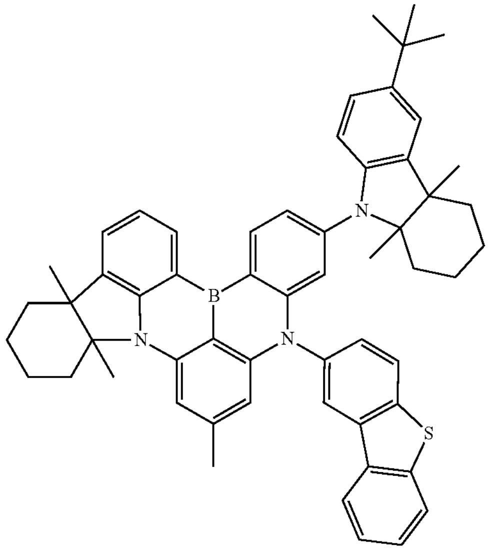
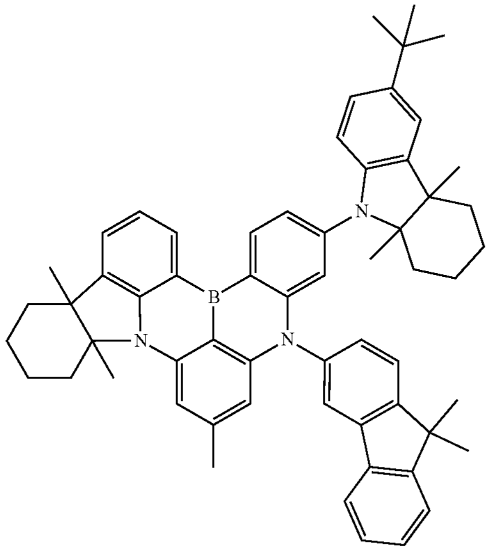
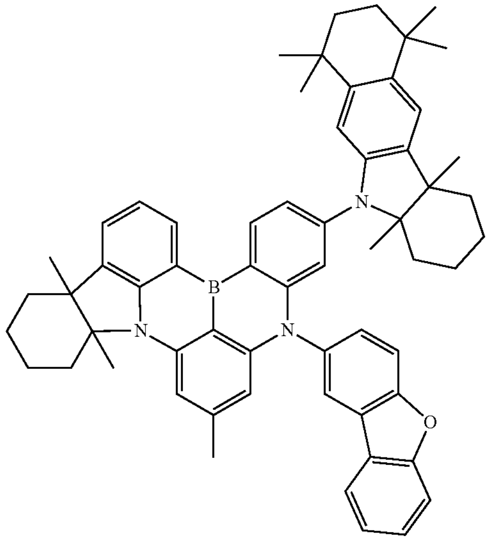

-continued
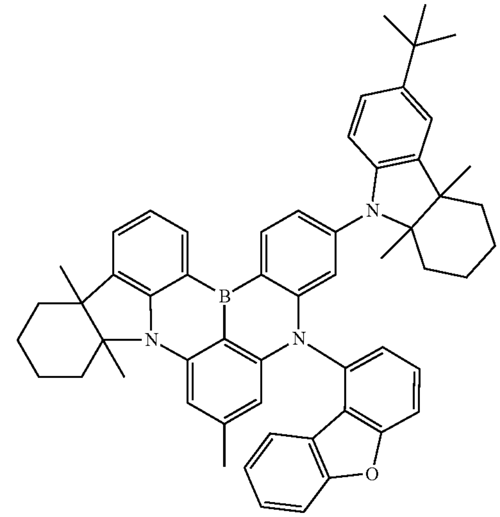
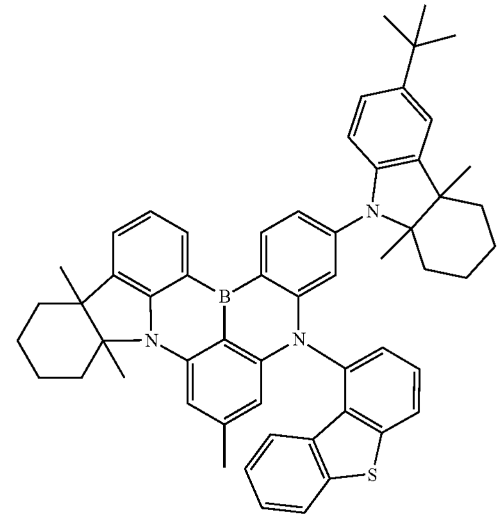
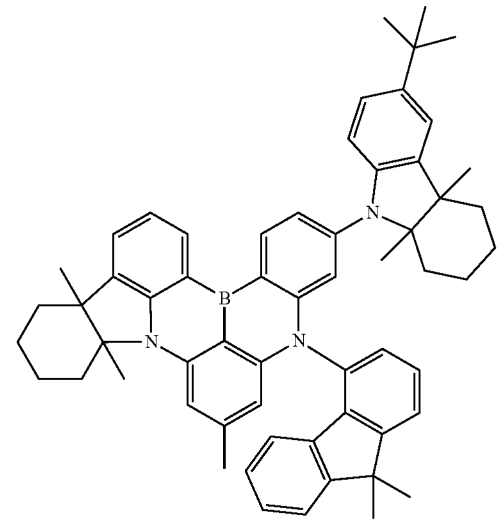
-continued
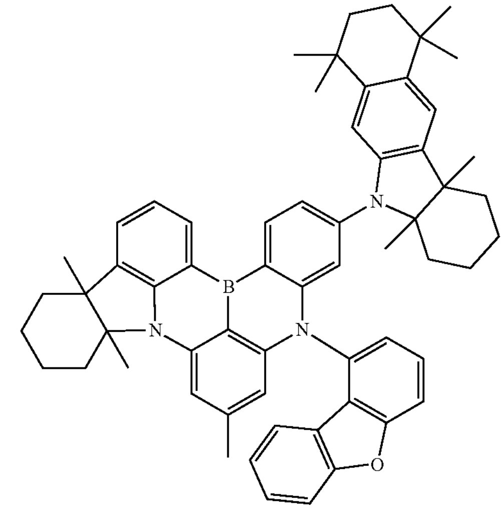
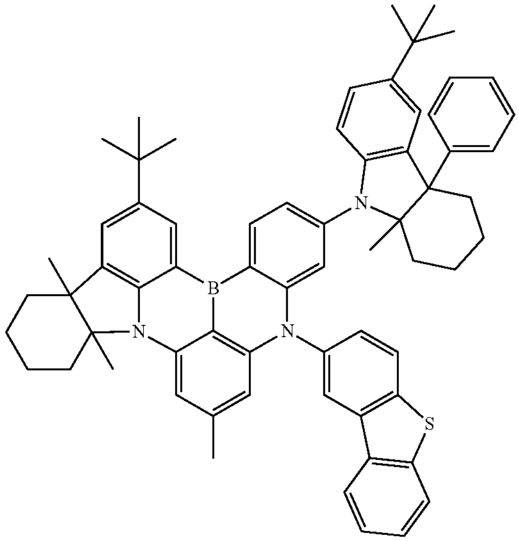
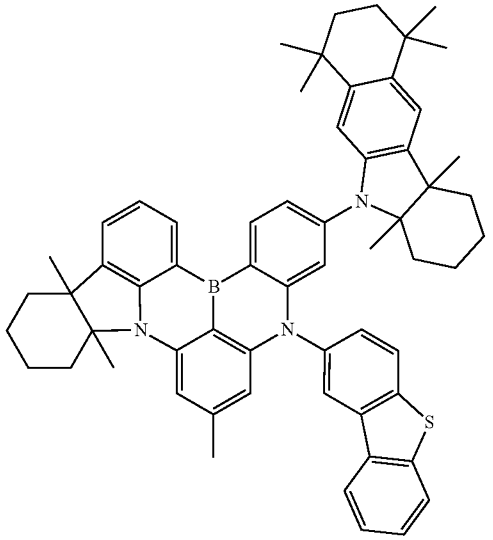

-continued
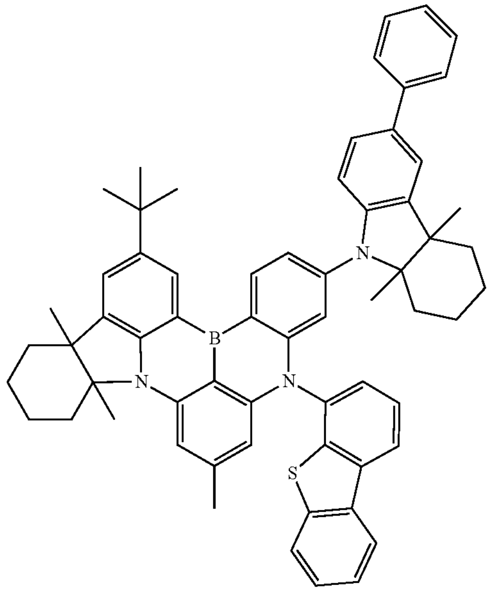
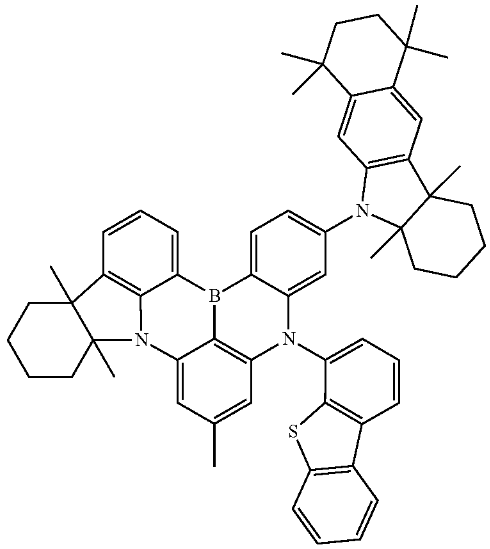
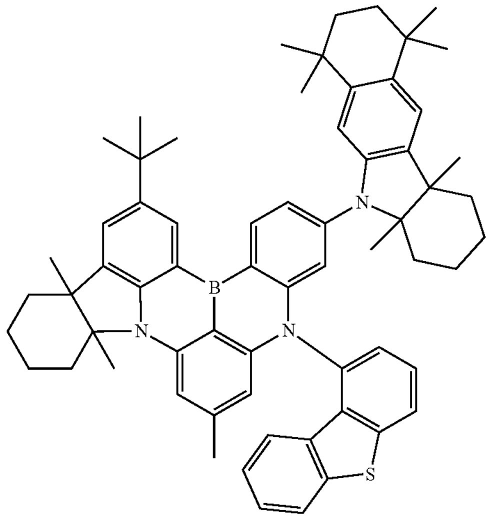
-continued
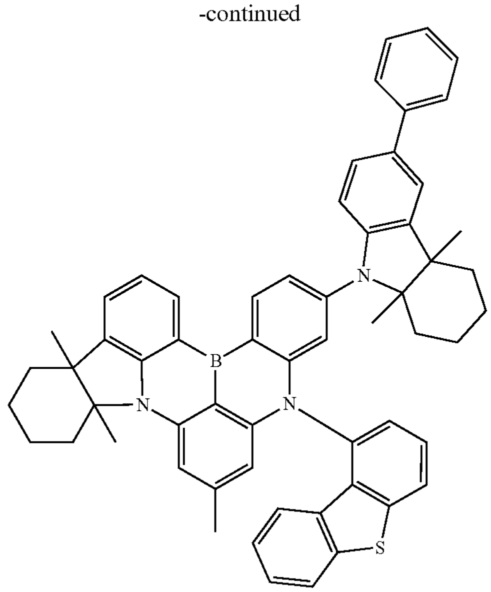
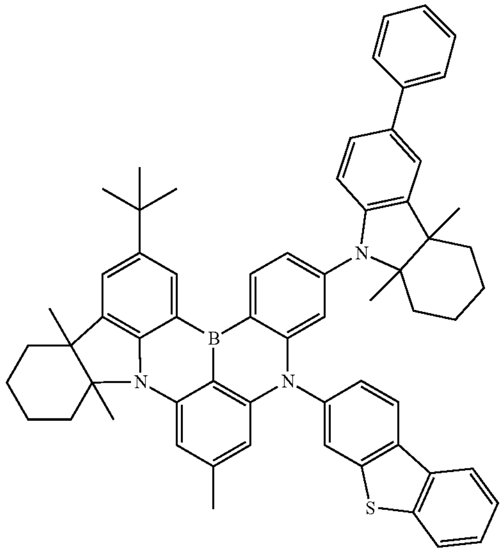
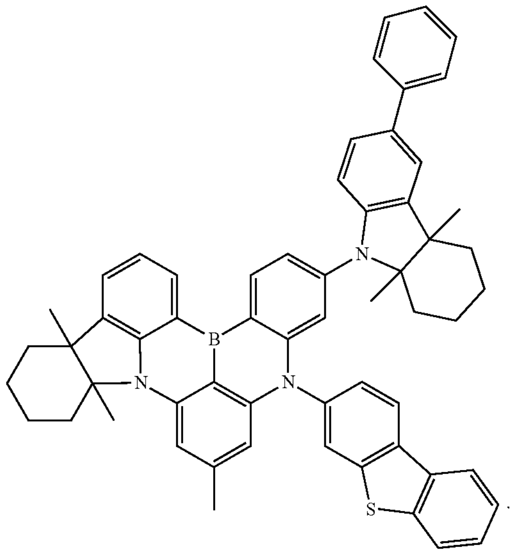

5. An organic light emitting device comprising:

a first electrode;

a second electrode provided opposite to the first electrode; and one, two or more organic material layers provided between the first electrode and the second electrode, wherein one or more layers of the organic material layers include the heterocyclic compound of claim 1.

6. The organic light emitting device of claim 5, wherein the one, two or more organic material layers includes a light emitting layer, and the light emitting layer includes the heterocyclic compound.

7. An organic light emitting device comprising:

a first electrode;

a second electrode provided opposite to the first electrode; and one, two or more organic material layers provided between the first electrode and the second electrode, wherein one or more layers of the organic material layers include the heterocyclic compound of claim 2.

8. The organic light emitting device of claim 7, wherein the one, two or more organic material layers includes a light emitting layer, and the light emitting layer includes the heterocyclic compound.

9. An organic light emitting device comprising:

a first electrode;

a second electrode provided opposite to the first electrode; and one, two or more organic material layers provided between the first electrode and the second electrode, wherein one or more layers of the organic material layers include the heterocyclic compound of claim 4.

10. The organic light emitting device of claim 9, wherein the one, two or more organic material layers includes a light emitting layer, and the light emitting layer includes the heterocyclic compound.

* * * * *